US010214933B2

(12) United States Patent
Peastrel et al.

(10) Patent No.: US 10,214,933 B2
(45) Date of Patent: Feb. 26, 2019

(54) POOL CLEANER POWER SUPPLY

(71) Applicant: Hayward Industries, Inc., Elizabeth, NJ (US)

(72) Inventors: Mark Peastrel, Jamestown, NC (US); Omar Enrique Osuna, Clemmons, NC (US); Scott Teuscher, Advance, NC (US)

(73) Assignee: Hayward Industries, Inc., Elizabeth, NJ (US)

( * ) Notice: Subject to any disclaimer, the term of this patent is extended or adjusted under 35 U.S.C. 154(b) by 0 days.

(21) Appl. No.: 15/592,352

(22) Filed: May 11, 2017

(65) Prior Publication Data

US 2018/0328064 A1 Nov. 15, 2018

(51) Int. Cl.
*H05K 1/02* (2006.01)
*E04H 4/16* (2006.01)
(Continued)

(52) U.S. Cl.
CPC ........... *E04H 4/1654* (2013.01); *H02K 11/33* (2016.01); *H05K 1/181* (2013.01); *H05K 5/0017* (2013.01);
(Continued)

(58) Field of Classification Search
CPC ........ E04H 4/1654; H02K 11/33; H05K 1/81; H05K 5/0017; H05K 5/0204; H05K 5/0213
(Continued)

(56) References Cited

U.S. PATENT DOCUMENTS 2,446,481 A 8/1948 Letterman
2,731,102 A 1/1956 James
(Continued)

FOREIGN PATENT DOCUMENTS

CN 2926588 Y 7/2007
EP 0314259 A2 5/1989
(Continued)

OTHER PUBLICATIONS

International Search Report of the International Searching Authority dated Jun. 17, 2016, issued in connection with International Application No. PCT/US16/14914 (6 pages).
(Continued)

*Primary Examiner* — Tremesha S Willis
(74) *Attorney, Agent, or Firm* — McCarter & English, LLP

(57) ABSTRACT

Exemplary embodiments are directed to pool cleaners that remove debris from water using a plurality of cyclonic flows, or that include a removable impeller subassembly, a check valve for a debris canister, a particle separator assembly having a handle that locks to the pool cleaner, a modular roller drive gear box, or a roller latch that secures a roller to the pool cleaner. Exemplary embodiments are also directed to the check valve and the roller latch themselves. Exemplary embodiments are directed to a filter medium for pool cleaners that includes embossments providing flow channels for water, and to roller assemblies for pool cleaners. Exemplary embodiments are directed to pool cleaners including alternative pump motor engagements. Exemplary embodiments are directed to pool cleaners power supplies that include a potted and contoured power board assembly, and to kickstands therefor. Exemplary embodiments are directed to a pool cleaner caddy, and removable wheels therefor.

73 Claims, 191 Drawing Sheets

(51) Int. Cl.

| | |
|---|---|
| ***H02K 11/33*** | (2016.01) |
| ***H05K 7/14*** | (2006.01) |
| ***H05K 1/18*** | (2006.01) |
| ***H05K 5/02*** | (2006.01) |
| ***H05K 5/06*** | (2006.01) |
| ***H05K 7/20*** | (2006.01) |
| ***H05K 5/00*** | (2006.01) |

(52) U.S. Cl.

CPC .......... *H05K 5/023* (2013.01); *H05K 5/0204* (2013.01); *H05K 5/0213* (2013.01); *H05K 5/0243* (2013.01); *H05K 5/0247* (2013.01); *H05K 5/065* (2013.01); *H05K 7/1427* (2013.01); *H05K 7/1439* (2013.01); *H05K 7/20172* (2013.01); *H05K 7/20209* (2013.01); *H05K 7/20436* (2013.01); *H05K 2201/10106* (2013.01); *H05K 2201/10151* (2013.01); *H05K 2201/10196* (2013.01)

(58) Field of Classification Search

USPC ................................ 174/250, 251, 255–261

See application file for complete search history.

(56) References Cited

U.S. PATENT DOCUMENTS 2,945,559 A 7/1960 Buckman
2,988,762 A 6/1961 Babcock
3,288,294 A 11/1966 Frey
3,363,762 A 1/1968 Ensign
3,472,380 A 10/1969 Rosaen
3,522,886 A 8/1970 Edmiston et al.
3,946,692 A 3/1976 Sierra et al.
4,154,680 A 5/1979 Sommer
4,306,329 A 12/1981 Yokoi
4,403,415 A 9/1983 Kufrin
5,277,157 A 1/1994 Teich
5,334,309 A 8/1994 Huggett et al.
5,337,434 A 8/1994 Erlich
5,351,355 A 10/1994 Chiniara
5,385,666 A 1/1995 Perlsweig
5,435,031 A 7/1995 Minami et al.
5,435,346 A 7/1995 Tregidgo et al.
5,450,644 A 9/1995 Berman
5,454,129 A 10/1995 Kell
5,500,113 A 3/1996 Hartley et al.
5,507,058 A 4/1996 Minami et al.
5,535,588 A 7/1996 Peterson et al.
5,569,371 A 10/1996 Perling
5,587,635 A 12/1996 Watanabe et al.
5,600,558 A 2/1997 Mearek et al.
5,617,600 A 4/1997 Frattini et al.
5,642,295 A 6/1997 Smayling
5,674,381 A 10/1997 Den Dekker
5,742,915 A 4/1998 Stafford
5,758,300 A 5/1998 Abe
5,764,139 A 6/1998 Nojima et al.
5,764,159 A 6/1998 Neftel
5,802,545 A 9/1998 Coverdill
5,805,444 A 9/1998 Seymour
5,812,055 A 9/1998 Candy et al.
5,842,532 A 12/1998 Fox et al.
5,857,159 A 1/1999 Dickrell et al.
5,862,500 A 1/1999 Goodwin
5,870,687 A 2/1999 Majstorovic
5,909,183 A 6/1999 Borgstahl et al.
5,935,179 A 8/1999 Kleiner et al.
5,936,315 A 8/1999 Lais
6,009,370 A 12/1999 Minowa et al.
6,026,333 A 2/2000 Koyabu et al.
6,073,063 A 6/2000 Leong Ong et al.
6,099,658 A 8/2000 Porat
6,112,139 A 8/2000 Schubert et al.
6,115,864 A 9/2000 Davidsson et al.
6,160,477 A 12/2000 Sandelman et al.
6,185,491 B1 2/2001 Gray et al.
6,228,256 B1 5/2001 Ekenback et al.
6,266,588 B1 7/2001 McClellan et al.
6,294,084 B1 9/2001 Henkin et al.
6,299,699 B1 10/2001 Porat et al.
6,309,468 B1 10/2001 Sommer
6,314,326 B1 11/2001 Fuchu
6,352,645 B1 3/2002 Wilfong
6,356,824 B1 3/2002 Chene et al.
6,411,858 B1 6/2002 Sakurai et al.
6,412,133 B1 7/2002 Erlich et al.
6,453,213 B1 9/2002 Hong
6,459,958 B1 10/2002 Watanabe et al.
6,470,235 B2 10/2002 Kasuga et al.
6,473,927 B1 11/2002 Sommer
6,485,638 B2 11/2002 Henkin et al.
6,502,269 B1 1/2003 Balchan et al.
6,522,937 B2 2/2003 Ette et al.
6,522,951 B2 2/2003 Born et al.
6,542,788 B2 4/2003 Hosonuma et al.
6,556,905 B1 4/2003 Mittelsteadt et al.
6,611,120 B2 8/2003 Song et al.
6,652,742 B2 11/2003 Henkin et al.
6,662,090 B2 12/2003 Toyama et al.
RE38,479 E 3/2004 Henkin et al.
6,738,697 B2 5/2004 Breed
6,742,613 B2 6/2004 Erlich et al.
6,748,305 B1 6/2004 Klausner et al.
6,758,226 B2 7/2004 Porat
RE38,640 E 10/2004 Jundt
6,815,918 B2 11/2004 Porat et al.
6,836,701 B2 12/2004 McKee
6,842,931 B2 1/2005 Porat et al.
6,886,205 B1 5/2005 Pichon
6,897,787 B2 5/2005 Colorado et al.
6,912,739 B1 7/2005 Nowell
6,965,814 B2 11/2005 Hadari
7,039,510 B2 5/2006 Gumpinger
7,069,119 B2 6/2006 Ueda et al.
7,079,923 B2 7/2006 Abramson et al.
7,099,745 B2 8/2006 Ebert
7,103,449 B2 9/2006 Woo et al.
7,117,554 B2 10/2006 Pichon
7,118,632 B2 10/2006 Sumonthee
7,127,333 B2 10/2006 Arvidsson
7,143,502 B2 12/2006 Porat et al.
7,155,309 B2 12/2006 Peless et al.
7,155,322 B2 12/2006 Nakahara et al.
7,165,284 B2 1/2007 Erlich et al.
7,167,775 B2 1/2007 Abramson et al.
7,167,780 B2 1/2007 Hattori
7,181,291 B2 2/2007 Boldt et al.
7,199,711 B2 4/2007 Field
7,213,287 B2 5/2007 Hui
7,222,019 B2 5/2007 Kido et al.
7,233,830 B1 6/2007 Callaghan et al.
7,247,069 B2 7/2007 Porat
7,317,974 B2 1/2008 Luskin et al.
7,324,870 B2 1/2008 Lee
7,363,031 B1 4/2008 Aisa
RE40,310 E 5/2008 Larkner et al.
7,436,143 B2 10/2008 Lakshmanan et al.
7,444,206 B2 10/2008 Abramson et al.
7,477,970 B2 1/2009 Bruelle-Drews
7,515,991 B2 4/2009 Egawa et al.
7,584,026 B2 9/2009 Siemer et al.
7,682,461 B2 3/2010 Sommer et al.
7,690,066 B2 4/2010 Stoltz et al.
7,715,959 B2 5/2010 Silvester
7,734,389 B2 6/2010 Shin
7,805,792 B2 10/2010 Roumagnac
7,827,643 B2 11/2010 Erlich et al.
7,831,348 B2 11/2010 Iwaki
7,857,600 B2 12/2010 Koehl
7,900,308 B2 3/2011 Erlich et al.
7,902,972 B2 3/2011 Soderkvist et al.
7,987,028 B2 7/2011 Bertosa et al.
8,007,653 B2 8/2011 Porat

(56) References Cited

U.S. PATENT DOCUMENTS

RE42,806 E 10/2011 Kamiya et al.
8,043,070 B2 10/2011 Stiles, Jr. et al.
8,145,357 B2 3/2012 Nibler et al.
8,190,274 B2 5/2012 Konieczny et al.
8,190,323 B2 5/2012 Maeda et al.
8,258,917 B2 9/2012 Cai et al.
8,307,484 B2 11/2012 Porat
8,307,485 B2 11/2012 Sumonthee
8,311,674 B2 11/2012 Abramson
8,343,339 B2 1/2013 Sumonthee
8,378,800 B2 2/2013 Mackjust et al.
8,392,036 B2 3/2013 Jacobsen et al.
8,406,951 B2 3/2013 Suganuma et al.
8,452,487 B2 5/2013 Yamaguchi et al.
8,465,262 B2 6/2013 Stiles, Jr. et al.
8,473,145 B2 6/2013 Biswas et al.
8,493,904 B2 7/2013 Kang et al.
8,527,135 B2 9/2013 Lowrey et al.
8,532,860 B2 9/2013 Daly
8,561,732 B2 10/2013 Schoon
8,600,608 B2 12/2013 Inoue et al.
8,623,201 B2 1/2014 Hui
8,649,908 B2 2/2014 Nibler et al.
8,709,243 B2 4/2014 Hui
8,751,063 B2 6/2014 Bernstein et al.
8,768,537 B2 7/2014 Kim et al.
8,793,031 B2 7/2014 Anantha et al.
8,795,510 B2 8/2014 Porat
8,818,530 B2 8/2014 Netzel, Sr. et al.
8,818,570 B2 8/2014 Johnson et al.
8,862,304 B2 10/2014 Chen et al.
8,871,030 B2 10/2014 Chen et al.
8,892,271 B2 11/2014 Breed
8,918,284 B2 12/2014 Tokashiki
8,924,042 B2 12/2014 Kim et al.
8,924,043 B2 12/2014 Maslyn et al.
8,924,067 B2 12/2014 Haider et al.
9,074,385 B2 7/2015 Hanan et al.
9,133,639 B2 9/2015 Ben-Dov et al.
9,328,525 B2 5/2016 Shlomi-Shlomi et al.
9,353,541 B2 5/2016 Porat
9,388,595 B2 7/2016 Durvasula et al.
9,388,596 B2 7/2016 Harlan et al.
9,439,547 B2 9/2016 Makarov
9,506,262 B2 11/2016 Tavor et al.
9,683,383 B2 6/2017 Shlomi-Shlomi et al.
9,790,700 B2 10/2017 Tamar et al.
9,878,739 B1 1/2018 Marciano et al.
9,885,194 B1 2/2018 Hayes et al.
9,885,195 B1 2/2018 Hayes et al.
9,885,196 B2 2/2018 Hayes et al.
9,896,856 B2 2/2018 Tavor et al.
9,896,858 B1 2/2018 Hayes et al.
9,903,130 B2 2/2018 Witelson et al.
9,903,131 B2 2/2018 Tamar et al.
9,903,132 B2 2/2018 Witelson et al.
9,909,333 B2 3/2018 Hayes
9,977,433 B1 5/2018 Teuscher
9,995,050 B2 6/2018 Durvasula et al.
9,995,051 B2 6/2018 Durvasula et al.
2003/0132152 A1 7/2003 Illingworth
2004/0021439 A1 2/2004 Porat et al.
2004/0025268 A1 2/2004 Porat et al.
2004/0025269 A1 2/2004 Pichon
2004/0074524 A1 4/2004 Horvath et al.
2005/0230324 A1 10/2005 Peet et al.
2005/0262652 A1 12/2005 Sumonthee
2006/0059637 A1 3/2006 Fridman et al.
2006/0225768 A1 10/2006 Erlich et al.
2006/0230725 A1 10/2006 Han et al.
2007/0028405 A1 2/2007 Garti
2007/0067930 A1 3/2007 Garti
2007/0094817 A1 5/2007 Stoltz et al.
2008/0087299 A1 4/2008 Erlich et al.
2008/0250580 A1 10/2008 Lavabre et al.
2008/0315678 A1 12/2008 Watarai
2009/0031524 A1 2/2009 Courtney et al.
2009/0057238 A1 3/2009 Garti
2009/0232701 A1 9/2009 Porat
2009/0255069 A1 10/2009 Hui
2009/0282627 A1 11/2009 Porat
2009/0301522 A1 12/2009 Abehasera et al.
2010/0058546 A1 3/2010 Erlich
2010/0065482 A1 3/2010 Sumonthee
2010/0307545 A1 12/2010 Osaka et al.
2011/0000033 A1 1/2011 Pichon et al.
2011/0049968 A1 3/2011 Jones et al.
2011/0131936 A1 6/2011 Chen
2011/0209447 A1 9/2011 Worker et al.
2011/0302728 A1 12/2011 Sumonthee
2012/0060307 A1 3/2012 Stoltz
2012/0081859 A1* 4/2012 Christo ................ H05K 1/0263 361/736
2012/0102664 A1 5/2012 Hui et al.
2012/0103365 A1 5/2012 Sumonthee
2012/0134076 A1* 5/2012 Gausepohl ......... H01R 13/5216 361/623
2013/0030659 A1 1/2013 Porat et al.
2013/0033818 A1* 2/2013 Hosoda .............. H05K 7/20927 361/688
2013/0076104 A1 3/2013 Hannah et al.
2013/0104321 A1 5/2013 Michelon
2013/0110319 A1 5/2013 Michelon
2013/0152970 A1 6/2013 Porat
2013/0160232 A1 6/2013 Peace
2013/0160233 A1 6/2013 Peace et al.
2013/0291334 A1 11/2013 Peng
2013/0333155 A1 12/2013 McLuckie et al.
2014/0014140 A1 1/2014 Correa
2014/0015959 A1 1/2014 Durvasula et al.
2014/0064139 A1 3/2014 Mcqueen et al.
2014/0096329 A1 4/2014 Garti et al.
2014/0105767 A1* 4/2014 Iwabuchi ................ H05K 7/00 417/410.1
2014/0250627 A1 9/2014 McKay
2014/0271175 A1 9/2014 Kumar et al.
2014/0303810 A1 10/2014 van der Meijden et al.
2015/0049750 A1 2/2015 Uy et al.
2015/0273695 A1 10/2015 Tamar et al.
2015/0286194 A1 10/2015 Michelon
2016/0145884 A1 5/2016 Erlich et al.
2016/0145885 A1 5/2016 Hui et al.
2016/0215516 A1 7/2016 Hayes
2017/0043966 A1 2/2017 Witelson
2017/0073990 A1 3/2017 Potucek et al.
2017/0088435 A1 3/2017 Schuiten
2017/0275906 A1 9/2017 Erlich et al.
2017/0277177 A1 9/2017 Witelson et al.
2017/0280641 A1 10/2017 Giménez Pallarès et al.
2017/0285602 A1 10/2017 Giménez Pallarès et al.
2017/0293481 A1 10/2017 Giménez Pallarès et al.
2017/0293490 A1 10/2017 Hanan et al.
2017/0298644 A1 10/2017 Goldenberg et al.
2017/0356212 A1 12/2017 Hanan et al.
2018/0044936 A1 2/2018 Torem et al.
2018/0069487 A1* 3/2018 Hattori .................... F04B 39/00
2018/0071908 A1 3/2018 Goldenberg et al.
2018/0073265 A1 3/2018 Goldenberg et al.
2018/0073266 A1 3/2018 Goldenberg et al.
2018/0100321 A1 4/2018 Regev et al.
2018/0135325 A1 5/2018 Schloss et al.
2018/0135326 A1 5/2018 Witelson
2018/0148947 A1 5/2018 Durvasula et al.
2018/0155946 A1 6/2018 Londono et al.
2018/0155948 A1 6/2018 Tavor et al.

FOREIGN PATENT DOCUMENTS

EP 1122382 A1 8/2001
EP 1489249 A2 12/2004
EP 1849934 A1 10/2007
EP 2163711 A2 3/2010
EP 2725169 A2 4/2014

(56) References Cited

FOREIGN PATENT DOCUMENTS

| | | | |
|---|---|---|---|
| EP | 2829937 | A1 | 1/2015 |
| EP | 2842009 | A1 | 3/2015 |
| EP | 2771525 | B1 | 7/2015 |
| EP | 2771524 | B1 | 12/2015 |
| FR | 2693499 | A1 | 1/1994 |
| FR | 2729995 | A1 | 8/1996 |
| FR | 2981970 | A1 | 5/2013 |
| FR | 2981971 | A1 | 5/2013 |
| FR | 2990032 | A1 | 11/2013 |
| FR | 2993298 | A1 | 1/2014 |
| GB | 737457 | A | 9/1955 |
| GB | 2376535 | A | 12/2002 |
| WO | 2005/118984 | A2 | 12/2005 |
| WO | 2007/055960 | A2 | 5/2007 |
| WO | 2009/031136 | A2 | 3/2009 |
| WO | 2009/104959 | A1 | 8/2009 |
| WO | 2012/104596 | A1 | 8/2012 |
| WO | 2013/171462 | A2 | 11/2013 |
| WO | 2014/150506 | A1 | 9/2014 |
| WO | 2014168918 | A1 | 10/2014 |
| WO | 2016/123098 | A1 | 8/2016 |

OTHER PUBLICATIONS

Written Opinion of the International Searching Authority dated Jun. 17, 2016, issued in connection with International Application No. PCT/US16/14914 (7 pages).
Extended European Search Report dated Aug. 24, 2018, issued in connection with European Patent Application No. 16743956.1 (8 pages).
Invitation to Pay Additional Fees and, Where Applicable, Protest Fee dated Jul. 24, 2017, issued by the International Searching Authority in connection with International Application No. PCT/US17/32131 (4 pages).
International Search Report and Written Opinion of the International Searching Authority dated Sep. 28, 2017, issued in connection with International Application No. PCT/US17/32131 (20 pages).
Office Action dated Apr. 6, 2017, issued in connection with U.S. Appl. No. 15/006,869 (14 pages).
Notice of Allowance dated Aug. 18, 2017, issued in connection with U.S. Appl. No. 15/006,869 (7 pages).
Notice of Allowance dated Sep. 5, 2017, issued in connection with U.S. Appl. No. 15/006,869 (7 pages).
Notice of Allowance dated Jan. 17, 2018, issued in connection with U.S. Appl. No. 15/006,869 (7 pages).
Notice of Allowance dated Jul. 21, 2017, issued in connection with U.S. Appl. No. 15/592,364 (8 pages).
Notice of Allowance dated Nov. 6, 2017, issued in connection with U.S. Appl. No. 15/592,364 (5 pages).
Office Action dated Jun. 7, 2017, issued in connection with U.S. Appl. No. 15/592,398 (8 pages).
Notice of Allowance dated Oct. 17, 2017, issued in connection with U.S. Appl. No. 15/592,398 (9 pages).
Notice of Allowance dated Jun. 13, 2018, issued in connection with U.S. Appl. No. 15/592,244 (10 pages).
Office Action dated Aug. 8, 2017, issued in connection with U.S. Appl. No. 15/592,377 (8 pages).
Notice of Allowance dated Dec. 1, 2017, issued in connection with U.S. Appl. No. 15/592,377 (7 pages).
Office Action dated Jun. 11, 2018, issued in connection with U.S. Appl. No. 15/592,254 (11 pages).
Office Action dated May 24, 2018, issued in connection with U.S. Appl. No. 15/592,266 (8 pages).
Office Action (Restriction Requirement) dated May 21, 2018, issued in connection with U.S. Appl. No. 15/592,285 (5 pages).
Office Action dated Jul. 6, 2017, issued in connection with U.S. Appl. No. 15/592,384 (9 pages).
Notice of Allowance dated Oct. 17, 2017, issued in connection with U.S. Appl. No. 15/592,384 (5 pages).
Office Action dated Aug. 14, 2018, issued in connection with U.S. Appl. No. 15/592,307 (8 pages).
Notice of Allowance dated Oct. 24, 2017, issued in connection with U.S. Appl. No. 15/592,392 (10 pages).
Notice of Allowance dated Jun. 4, 2018, issued in connection with U.S. Appl. No. 15/592,371 (9 pages).
Notice of Allowance dated Sep. 11, 2018, issued in connection with U.S. Appl. No. 15/592,371 (9 pages).
Office Action dated Mar. 19, 2018, issued in connection with U.S. Appl. No. 15/886,556 (8 pages).
Notice of Allowance dated Jul. 31, 2018, issued in connection with U.S. Appl. No. 15/886,556 (7 pages).
Office Action dated Apr. 9, 2018, issued in connection with U.S. Appl. No. 15/882,508 (9 pages).
Notice of Allowance dated Aug. 14, 2018, issued in connection with U.S. Appl. No. 15/882,508 (5 pages).
Notice of Allowance dated Apr. 30, 2018, issued in connection with U.S. Appl. No. 15/887,549 (8 pages).
Notice of Allowance dated Aug. 6, 2018, issued in connection with U.S. Appl. No. 15/887,549 (5 pages).
Hayes, et al., U.S. Appl. No. 15/592,244 entitled "Pool Cleaner Canister Handle" filed with the United States Patent and Trademark Office on May 11, 2017 (445 pages).
Hayes, et al., U.S. Appl. No. 151592,254 entitled "Pool Cleaner Check Valve" filed with the United States Patent and Trademark Office on May 11, 2017 (443 pages).
Ortiz, et al., U.S. Appl. No. 15/592,266 entitled "Pool Cleaner Filter Medium" filed with the United States Patent and Trademark Office on May 11, 2017 (442 pages).
Ferrell, et al., U.S. Appl. No. 15/592,285 entitled "Pool Cleaner Caddy with Retention Mechanism" filed with the United States Patent and Trademark Office on May 11, 2017 (449 pages).
Osuna, et al., U.S. Appl. No. 15/592,277 entitled "Pool Cleaner Power Supply with Kickstand" filed with the United States Patent and Trademark Office on May 11, 2017 (445 pages).
Ortiz, et al., U.S. Appl. No. 15/592,307 entitled "Pool Cleaner Power Coupling"filed with the United States Patent and Trademark Office on May 11, 2017 (444 pages).
Teuscher, et al., U.S. Appl. No. 15/592,335 entitled "Pool Cleaner Roller Latch" filed with the United States Patent and Trademark Office on May 11, 2017 (443 pages).
Ferrell, et al., U.S. Appl. No. 15/592,371 entitled "Pool Cleaner Caddy With Removable Wheel Assemblies" filed with the United States Patent and Trademark Office on May 11, 2017 (445 pages).
Hayward Industries, Inc., International Patent Application No. PCT/US17/32131 entitled "Swimming Pool Cleaner and Associated Components" filed with the United States Patent and Trademark Office on May 11, 2017 (440 pages).
Hayes, et al., U.S. Appl. No. 15/886,508 entitled "Pool Cleaner With Cyclonic Flow," filed with the United States Patent and Trademark Office on Feb. 1, 2018 (442 pages).
Hayes, et al., U.S. Appl. No. 15/886,556 entitled "Pool Cleaner Impeller Subassembly," filed with the United States Patent and Trademark Office on Feb. 1, 2018 (446 pages).
Marciano, et al., U.S. Appl. No. 15/882,508 entitled "Pool Cleaner Modular Drivetrain," filed with the United States Patent and Trademark Office on Jan. 29, 2018 (444 pages).
Hayes, et al., U.S. Appl. No. 15/887,549 entitled "Hydrocyclonic Pool Cleaner," filed with the United States Patent and Trademark Office on Feb. 2, 2018 (445 pages).
Brock Catalog (dated 2005) (8 pages and coversheet).
Caratti Catalog (dated 2007) (8 pages and coversheet).
Digital Image of Aquabot Cleaner (more than one year prior to Sep. 16, 2008) (1 page and coversheet).
Digital Image of Dolphin Cleaner (more than one year prior to Sep. 16, 2008) (1 page and coversheet).
Digital Image of Merlin Cleaner (more than one year prior to Sep. 16, 2008) (1 page and coversheet).
Digital Image of Pool Rover Cleaner (more than one year prior to Sep. 16, 2008) (1 page and coversheet).
Digital Image of Squirrel Cleaner (more than one year prior to Sep. 16, 2008) (1 page and coversheet).

(56) References Cited

OTHER PUBLICATIONS

Dolphin 2x2 Robot Pool Cleaner Operating Instructions (more than one year prior to Sep. 16, 2008) (8 pages and coversheet).
Dolphin Cleaner photos and Information sheet (Cleaner seen at a show circa Oct. 2009) (5 pages and coversheet).
DX3 and DX4 Cleaners and Related Manuals (more than one year prior to Sep. 16, 2008) (17 pages and coversheet).
Hayward Tiger Shark Series Owner's Manual (more than one year prior to Nov. 2, 2009) (16 pages and coversheet).
Hexagone Cleaners (more than one year prior to Sep. 16, 2008) (8 pages and coversheet).
Picture Sheet Showing Multiple Commercial Cleaners (more than one year prior to Sep. 16, 2008) (1 page and coversheet).
Polaris 9300 and Vortex 3 Cleaners (manuals dated Copyright 2010 and V3 cleaner seen at a show circa Oct. 2009) 125 pages and coversheet).
Smartpool Nitro Cleaner Manual (more than one year prior to Sep. 16, 2008) (56 pages and coversheet).
Tiger Shark Owner's Manual (Mar. 2007) (16 pages and coversheet).
Wave Cleaner and related manuals (cleaner seen at show circa Oct./Nov. 2008) (25 pages and coversheet).
YouTube Video of Mopper Cleaner, http://www.youtube.com/watch?v=d8NAUWHOQCk&feature=BFa&list=ULopZlix71W4Po, e.g., attached screen shots (45 pages and coversheet).
Zodiac Baracuda MX 8 Pool Cleaner Owner's Manual (2011) (32 pages).
Zodiac Cybemaut Manual (dated Sep. 3, 2006) (6 pages and coversheet).
Notice of Allowance dated Sep. 28, 2018, issued in connection with U.S. Appl. No. 15/592,307 (7 pages).
Office Action dated Oct. 3, 2018, issued in connection with U.S. Appl. No. 15/592,277 (17 pages).
Notice of Allowance dated Oct. 19, 2018, issued in connection with U.S. Appl. No. 15/592,244 (7 pages).
Supplemental Notice of Allowance dated Nov. 9, 2018, issued in connection with U.S. Appl. No. 15/887,549 (5 pages).
Notice of Allowance dated Nov. 14, 2018, issued in connection with U.S. Appl. No. 15/592,285 (10 pages).
Notice of Abandonment dated Dec. 10, 2018, issued in connection with U.S. Appl. No. 15/592,266 (2 pages).
Office Action dated Dec. 10, 2018, issued in connection with U.S. Appl. No. 15/886,556 (5 pages).

* cited by examiner

POOL CLEANER POWER SUPPLY

FIELD OF THE PRESENT DISCLOSURE

Embodiments of the present disclosure relate to swimming pool cleaners and, more particularly, to automatic swimming pool cleaners movable along all pool surfaces including a pool waterline or water surface for purposes of cleaning debris therefrom, associated apparatus for separating debris from a fluid stream traveling through the swimming pool cleaner, and apparatus for facilitating maintenance of a swimming pool cleaner and associated apparatus.

BACKGROUND OF THE PRESENT DISCLOSURE

Swimming pools commonly require a significant amount of maintenance. Beyond the treatment and filtration of pool water, the bottom wall (the "floor") and side walls of a pool (the floor and the side walls collectively, the "walls" of the pool) are scrubbed regularly. Additionally, leaves and other debris often times elude a pool filtration system and settle on the bottom of the pool, get stuck at the pool waterline, or float on the pool water surface.

Automated pool cleaning devices, e.g., swimming pool cleaners, have been developed to routinely navigate about the pool walls, cleaning as they go. A rotating cylindrical roller (formed of foam and/or provided with a brush) can be included on the bottom of the pool cleaner to scrub the pool walls, while a pump system continuously circulates water through a filter assembly of the pool cleaner capturing debris and any suspended particulate therein. The pool cleaner lengthens the life of the main pool filter (e.g., a sand, diatomaceous earth (D.E.), or cartridge filter) in fluid communication with the fluid circulation line of the swimming pool, and reduces the time between changes or backwash cycles of the main filter.

The pool cleaner's filter assembly often includes traditional filter elements, such as bags, mesh, baskets, etc., that are utilized to trap any debris and particulate removed from a pool surface by the cleaner. These traditional filter elements generally have limited surface area that can quickly become clogged or occluded by the debris and particulate that they are utilized to contain. As the filter elements become clogged the cleaner can start to operate improperly, for example, the cleaner may lose suction performance. Once the filter elements have become sufficiently clogged, or have been occluded to a point that cleaner performance has been reduced below a desired level, the filter elements have to be cleaned or replaced. This can often occur prior to the debris retention area of a pool cleaner being completely full. That is, the surface of the bag, mesh, or basket can become clogged prior to the debris retention volume thereof being filled to capacity. Further, to rinse or replace the filter elements, or empty the basket, a user will often have to directly handle the filter element and subsequently debris, and in the case of a basket, will have to open a lid of the cleaner to retrieve the basket from within the unit and spray the basket with water which may result in debris and water getting on them.

During cleaning, the pool cleaner will traverse the pool surfaces brushing or scrubbing the debris therefrom, often encountering obstacles, such as lights, drains, etc., along the way. These obstacles can cause the cleaner to get stuck for the duration of a cleaning period, resulting in the pool being only partially cleaned.

What is needed in the art is an automatic swimming pool cleaner that debris is easily cleaned from, enhances filtering operation, and/or traversal through the pool. These and other needs are addressed by the swimming pool cleaner of the present disclosure.

SUMMARY OF THE DISCLOSURE

Example embodiments of the present disclosure relate to swimming pool cleaners having improved filters and drive systems.

More particularly, an improved swimming pool cleaner is provided according to embodiments of the present disclosure. In some example embodiments, the swimming pool cleaner includes a hydrocyclonic particle separator assembly and/or a drive assembly having six driven brushed rollers.

In some example embodiments, the hydrocyclonic particle separator assembly is interconnected with an intake of the pool cleaner and generally includes a fluid turbine subassembly and a canister subassembly. For example, the canister subassembly is connectable with the intake of the pool cleaner and includes a canister body having a tangential outlet to an inner chamber thereof, a filtering medium (which can be, for example, a coarsely perforated surface or mesh), a fine debris container, one or more cyclone containers, and a central outlet in fluidic communication with the tangential outlet. Continuing with discussion of example embodiments, the filtering medium is positioned within the canister, the one or more cyclone containers are positioned within the filtering medium, and the fine debris container is positioned below the one or more cyclone containers. The cyclone containers each include a body having a tangential inlet, a fine debris underflow nozzle, and an overflow opening. The fluid turbine subassembly is positioned within the canister subassembly and configured to permit acceleration of fluid through the central outlet of the canister subassembly and pulling of fluid through the entirety of the canister subassembly and the intake. A motor housing includes a pump motor operatively connected to an impeller for same. Fluid being pulled through the canister subassembly and intake enters the canister body at the tangential inlet forming a cyclonic flow (e.g., a first cyclonic flow) about a first axis within the canister body and between the canister body and the filtering medium. The example first cyclonic flow includes debris-laden fluid having small and large debris, with the large debris being separated from the flow through cyclonic action and contact with the canister body and the filtering medium. The separated large debris falls to a lower portion of the canister body where it is retained. A portion of the first cyclonic flow is pulled across the filtering medium and into one or more cyclones containers. Continuing with discussions of some example embodiments, the fluid (e.g., the now once-filtered debris-laden fluid) enters the one or more cyclone containers at the respective tangential inlet, forming a cyclonic flow (e.g., a second cyclonic flow) about a second axis within each cyclone container. The second cyclonic flow includes once-filtered debris laden fluid having small debris that is separated from the fluid through contact with the cyclone container body. The debris separated in the cyclone container body falls through the underflow nozzle of each cyclone container where it is captured by the fine debris container. The fluid is then pulled out from the overflow opening of the one or more cyclone containers and ejected from the canister subassembly through the central outlet by the fluid turbine subassembly.

In some aspects of the present disclosure, the canister subassembly can include a vortex finder positioned within the overflow opening of each of the one or more cyclone containers that focuses slow-moving fluid so that it can be evacuated from each cyclone container.

In some aspects of the present disclosure, the cyclone container body can be tapered or include a tapered end that reduces the radius of the second cyclonic flow to separate decreasingly smaller particles therefrom.

The swimming pool cleaner can include a latch for removably retaining the hydrocyclonic particle separator in connection with the motor housing, and the hydrocyclonic particle separator can include a quick-release latch for allowing easy opening of the canister subassembly. The canister body can include a lower portion and an upper portion engaged by a hinge. The latch includes a resiliently-flexible body and a slanted head having an engagement surface, while the hydrocyclonic particle separator includes a locking interface configured to be engaged by the engagement surface of the latch. The quick-release latch can include a body having a shaped head including a latching surface at one end, a user-engageable tab at an opposite end of the shaped head, a spring, and a pivot positioned between the shaped head and the user-engageable tab. The quick-release latch is mounted to a bracket on the upper portion of the canister body by the pivot, with the spring between the user-engageable tab and the canister body. The spring biases the quick-release latch into a first latched position where the latching surface of the shaped head is adjacent and in engagement with a ridge that extends radially from the lower portion of the canister body, preventing the upper and lower portions of the canister body from being separated. Pressing the user-engageable tab compresses the spring and moves the quick-release latch into a second released position where there is clearance between the latching surface of the shaped head and the ridge, allowing the upper and lower portions of the canister body to be separated through rotation about the hinge.

In some embodiments of the present disclosure, a pool cleaner is provided with six rollers for enhanced control when driven over surfaces, such as convex or concave surfaces with high local curvature, such as step edges, main drain covers, walls, and surfaces with low friction coefficients, for example. In preferred embodiments of the present disclosure, the motor housing, which can house a pump motor, houses a first drive motor and a second drive motor. In some embodiments, a first gear train operatively connects the first drive motor with a first roller set of three rollers, such that each one of the three rollers of the first roller set turn at the same rate as each other one thereof (first rate), and a second gear train operatively connects the second drive motor with a second set of three rollers, such that each one of the three rollers of the second roller set turn at the same rate as each other one thereof (the second rate). Depending upon the desired navigational outcome, for example, the first rate can be less than, greater than, and/or substantially equal to the second rate. Additionally and/or alternatively, the first set of rollers can rotate in a first direction, while the second roller set can rotate in a second direction opposite the first direction.

In accordance with embodiments of the present disclosure, an exemplary pool cleaner is provided that includes a canister body, a filtering medium assembly and a cyclone block. The canister body includes an inner chamber within inner walls of the canister body. The filtering medium assembly can be disposed within the inner chamber of the canister body. The cyclone block can be disposed within the inner chamber of the canister body. In some embodiments, the cyclone block can be at least partially surrounded by the filtering medium assembly. The cyclone block includes a plurality of cyclone containers. A first cyclonic flow can be generated between the inner walls of the canister body and the filtering medium assembly. A second cyclonic flow can be generated within each of the plurality of cyclone containers.

In some embodiments, the canister body can define a cylindrical configuration. The canister body includes a tangential inlet. The filtering medium assembly includes a filtering medium support and a filtering medium. The filtering medium assembly can be configured and dimensioned to separate large debris particles from a fluid flow during the first cyclonic flow.

Each of the cyclone containers includes a cylindrical cyclone chamber with a tangential inlet and a debris underflow nozzle. The cyclone containers can be radially disposed around a central axis. In some embodiments, each of the cyclone containers includes a cylindrical top portion, a frustoconical bottom portion and a debris underflow nozzle at a distal end of the cyclone container. In some embodiments, the plurality of cyclone containers can include a first set of radially disposed cyclone containers and a second set of radially disposed cyclone containers positioned around the first set of radially disposed cyclone containers. Each of the plurality of cyclone containers can be configured and dimensioned to separate small debris particles from a fluid flow during the second cyclonic flow.

The pool cleaner includes a large debris container hingedly connected to a bottom edge of the canister body. The large debris container can include a dish including upwardly angled side walls. The pool cleaner includes a debris separator ring disposed between the filtering medium assembly and the large debris container. The debris separator ring includes a mesh ring configured and dimensioned to maintain large debris particles within the large debris container.

The pool cleaner includes a fine debris container disposed within the inner chamber of the canister body. In some embodiments, the fine debris container can include a rounded dish including a central hub. In some embodiments, the fine debris container includes a dish and a central radial extension protruding from a bottom surface of the fine debris container. The central radial extension can define an inner chamber configured and dimensioned to maintain small debris particles separated from a fluid flow during the second cyclonic flow. The central radial extension can be disposed against the dish of the large debris container. The central radial extension can maintain a separation between the small debris particles within the inner chamber and large debris particles collected in the large debris container. The pool cleaner can include a gasket disposed between the dish of the large debris container and the central radial extension. The gasket can maintain separation between the small debris particles within the inner chamber and the large debris particles collected in the large debris container. Positioning the large debris container in an open position relative to the canister body simultaneously empties the large debris container and the inner chamber of the fine debris container, thereby simultaneously removing the large and small debris particles from the pool cleaner.

The pool cleaner can include a ring of vortex finders. Each of the vortex finders can be positioned within respective cyclone containers of the plurality of cyclone containers. The ring of vortex finders can include a central portion and a plurality of perimeter flaps Each of the perimeter flaps can include a vortex finder. In some embodiments, a top surface of the central portion can be recessed relative to surfaces of the plurality of perimeter flaps. Each of the plurality of perimeter flaps can be hingedly connected to a polygonal perimeter of the central portion.

The pool cleaner includes a top cap disposed over the canister body. In some embodiments, the top cap includes a plurality of radially arched tubes defining a chamber extending to an outlet of the pool cleaner. In some embodiments, the top cap includes a plurality of rounded lobes defining a chamber extending to an outlet of the pool cleaner.

In some embodiments, the pool cleaner includes a drive assembly including one front roller, one rear roller, and two middle rollers. In some embodiments, the pool cleaner includes a drive assembly including two front rollers, two middle rollers, and two rear rollers.

In accordance with embodiments of the present disclosure, an exemplary pool cleaner is provided that includes a drive assembly, a motor housing and a hydrocyclonic particle separator assembly. In some embodiments, the drive assembly can include one single front roller, one single rear roller, a first middle roller and a second middle roller. The first and second middle rollers can be disposed adjacent to each other. The motor housing can be mounted relative to the drive assembly. The motor housing includes a first drive motor and a second drive motor. The hydrocyclonic particle separator assembly can be mounted to the motor housing. The first drive motor can drive rotation of the one single front roller and the first middle roller. The second drive motor can drive rotation of the one single rear roller and the second middle roller. The first drive motor can drive the one single front roller and the first middle roller at the same rate. The second drive motor can drive the one single rear roller and the second middle roller at the same rate.

In accordance with embodiments of the present disclosure, an exemplary pool cleaner is provided that includes a drive assembly, a motor housing and a hydrocyclonic particle separator. The drive assembly includes a first front roller, a second front roller, a first middle roller, a second middle roller, a first rear roller, and a second rear roller. The first and second front rollers can be disposed adjacent to each other. The first and second middle rollers can be disposed adjacent to each other. The first and second rear rollers can be disposed adjacent to each other. The motor housing can be mounted relative to the drive assembly. The motor housing includes a first drive motor and a second drive motor. The hydrocyclonic particle separator assembly can be mounted to the motor housing. The first drive motor can drive rotation of the first front roller, the first middle roller and the first rear roller. The second drive motor can drive rotation of the second front roller, the second middle roller and the second rear roller. The first drive motor can drive the first front roller, the first middle roller and the first rear roller at the same rate. The second drive motor can drive the second front roller, the second middle roller and the second rear roller at the same rate.

In accordance with embodiments of the present disclosure, an exemplary pool cleaner is provided that includes a canister body, a filter medium, a cyclone block, a sleeve, a shaft, an impeller, a top cap, and a guard (e.g., diffuser). The canister body can include an inlet, a top, and a bottom that has a central opening. The canister body can also define an inner chamber that the filter medium and cyclone block can be disposed within. The cyclone block can include a plurality of cyclone containers and a central opening. In some embodiments, the canister body can be at least partially surrounded by the filter medium. The sleeve can have a first end and a second end, and can extend through the central opening of the cyclone block and be positioned within the cyclone block such that the second end of the sleeve is adjacent the central opening of the canister body. The shaft can include a first end and a second end, and extend through the sleeve with the first end of the shaft extending from the first end of the sleeve. The impeller can be engaged with the first end of the shaft. The top cap can include an outlet and can cover the cyclone block. The guard can be engaged with the top cap and cover the top cap outlet. A first cyclonic flow can be generated between the canister body and the filtering medium assembly. A second cyclonic flow can be generated within each of the plurality of cyclone containers.

In some embodiments of the disclosure, the canister body can defines a cylindrical configuration, while the inlet of the canister body can be a tangential inlet. The filter medium can include a plurality of embossments that form a plurality of pockets in the filter medium, and can be configured to separate large debris particles from a fluid flow during the first cyclonic flow.

Each of the cyclone containers can include a cylindrical cyclone chamber with a first tangential inlet and a debris underflow nozzle. In some embodiments of the disclosure, each of the cyclone containers include a second tangential inlet. The cyclone containers can be radially disposed around a central axis. Additionally, the cyclone containers can each include a cylindrical top portion, a frustoconical bottom portion, and a debris underflow nozzle at a distal end of the cyclone container.

In some embodiments of the disclosure, the plurality of cyclone containers can include a first set of radially disposed cyclone containers and a second set of radially disposed cyclone containers that are positioned around the first set of radially disposed cyclone containers. The cyclone containers can also be radially disposed around a first central axis with the cyclone containers of the second set of radially disposed cyclone containers each having a second central axis such that the central axis of each cyclone container of the second set of radially disposed cyclone containers is at an angle with respect to the first central axis. Each of the plurality of cyclone containers can be configured to separate small debris particles from a fluid flow during the second cyclonic flow.

The pool cleaner can include a large debris container hingedly connected to a bottom edge of the canister body. The pool cleaner can also includes a fine debris subassembly disposed within the inner chamber of the canister body. The fine debris subassembly can include a fine debris container having a dish and a central tubular extension. In some embodiments of the disclosure, the fine debris subassembly can also include a fine debris container top having a top circular plate and a central tubular extension extending from the top circular plate that is positioned within the central tubular extension of the fine debris container. An inner chamber can be defined between the central tubular extension of the fine debris container top and the central tubular extension of the fine debris container. The inner chamber can be configured and dimensioned to maintain small debris particles separated from a fluid flow during the second cyclonic flow.

The pool cleaner can include a gasket positioned within the inner chamber and engaged with the central tubular extension of the fine debris container top and the central tubular extension of the fine debris container. The gasket can maintain separation between the small debris particles within the inner chamber and the large debris particles collected in the large debris container. In some embodiments of the disclosure, the large debris container can be positioned in an open position to simultaneously empty the large debris container and the inner chamber of the fine debris container.

The pool cleaner can also include a ring of vortex finders with each of the vortex finders positioned within respective cyclone containers of the plurality of cyclone containers. The ring of vortex finders can include a central portion and a plurality of curved protrusions that each include a vortex finder. The central portion can be recessed relative to surfaces of the plurality of curved protrusions, and each of the plurality of curved protrusions can be hingedly connected to a polygonal perimeter of the central portion.

In some embodiments of the disclosure, the top cap can include a plurality of rounded lobes that define a chamber extending to the outlet. The top cap can also include a plurality of channels extending into the chamber that provide a fluid path into the chamber. In some embodiments of the disclosure, the guard (e.g., diffuser) is removably connected to the top cap.

In some embodiments of the disclosure, the shaft can be rotatably engaged with the sleeve while the sleeve can be engaged with the guard. The guard, sleeve, shaft, and impeller can be removable as a single unit.

The pool cleaner can also include a beauty cap that has a top opening. The beauty cap can be removably positioned over the top cap and the guard with the guard extending through the top opening of the beauty cap.

In accordance with embodiments of the present disclosure, an exemplary pool cleaner is provided that includes a canister body, a filter medium, a cyclone block, a top cap, and an impeller subassembly. The canister body can include an inlet, a top, and a bottom that has a central opening. The canister body can also define an inner chamber that the filter medium and the cyclone block can be disposed within. The cyclone block can include a plurality of cyclone containers and a central opening. In some embodiments, the canister body can be at least partially surrounded by the filter medium. The top cap can include an outlet and can cover the cyclone block. The impeller subassembly can include a sleeve, a shaft, a retention ring, an impeller, and a guard. The sleeve can have a first end and a second end. The shaft can include a first end and a second end, and extend through the sleeve with the first end of the shaft extending from the first end of the sleeve. The shaft can be rotatable within the sleeve. The retention ring can be connected to the shaft to prevent the shaft from being removed through the central opening of the bottom of the canister body. The impeller can be engaged with the first end of the shaft. The guard can be secured to the sleeve and the top cap at the top cap outlet. A portion of the impeller subassembly can be positioned within the inner chamber of the canister body with the sleeve and shaft extending through the central opening of the cyclone block. A portion of the sleeve and shaft can be positioned within the cyclone block such that the second end of the sleeve is adjacent the central opening of the canister body. The guard can be disengaged from the top cap so that the impeller subassembly can be removed from the inner chamber of the canister body and the cyclone block as a single unit. A first cyclonic flow can be generated between the canister body and the filtering medium assembly. A second cyclonic flow can be generated within each of the plurality of cyclone containers.

In some embodiments of the disclosure, the guard can be a diffuser that includes a shroud that defines an inner chamber and the impeller can be positioned within the inner chamber and radially spaced from the shroud. The shroud can include an open end having a plurality of fins, and the impeller can be axially spaced from the fins.

The pool cleaner can include at least one bearing positioned about the shaft and between the shaft and the sleeve. In some embodiments of the disclosure, the shaft can slide axially within the at least one bearing. The shaft can include a first coupling member configured to engage a second coupling member of a motor, and can slide axially within the at least one bearing when it engages the second coupling member and absorb any impact forces. In some embodiments of the disclosure, the sleeve can include a plurality of mounting bosses and the guard can include a plurality of mounting protrusions that can be secured with the plurality of mounting bosses in order to secure the guard to the sleeve.

In some embodiments of the disclosure, the filter medium can be configured to separate large debris particles from a fluid flow during the first cyclonic flow, and each of the plurality of cyclone containers can be configured to separate small debris particles from a fluid flow during the second cyclonic flow.

Each of the cyclone containers can include a cylindrical cyclone chamber with a first tangential inlet and a debris underflow nozzle. In some embodiments of the disclosure, each of the cyclone containers include a second tangential inlet. The cyclone containers can be radially disposed around a central axis.

In some embodiments of the disclosure, the plurality of cyclone containers can include a first set of radially disposed cyclone containers and a second set of radially disposed cyclone containers that are positioned around the first set of radially disposed cyclone containers. The cyclone containers can also be radially disposed around a first central axis with the cyclone containers of the second set of radially disposed cyclone containers each having a second central axis such that the central axis of each cyclone container of the second set of radially disposed cyclone containers is at an angle with respect to the first central axis.

The pool cleaner can include a large debris container hingedly connected to a bottom edge of the canister body. The pool cleaner can also includes a fine debris subassembly disposed within the inner chamber of the canister body. The fine debris subassembly can include a fine debris container having a dish and a central tubular extension. In some embodiments of the disclosure, the fine debris subassembly can also include a fine debris container top having a top circular plate and a central tubular extension extending from the top circular plate that is positioned within the central tubular extension of the fine debris container. An inner chamber can be defined between the central tubular extension of the fine debris container top and the central tubular extension of the fine debris container. The inner chamber can be configured and dimensioned to maintain small debris particles separated from a fluid flow during the second cyclonic flow.

The pool cleaner can include a gasket positioned within the inner chamber and engaged with the central tubular extension of the fine debris container top and the central tubular extension of the fine debris container. The gasket can maintain separation between the small debris particles within the inner chamber and the large debris particles collected in the large debris container. In some embodiments of the disclosure, the large debris container can be positioned in an open position to simultaneously empty the large debris container and the inner chamber of the fine debris container.

The pool cleaner can also include a ring of vortex finders with each of the vortex finders positioned within respective cyclone containers of the plurality of cyclone containers.

In some embodiments of the disclosure, the top cap can include a plurality of rounded lobes that define a chamber extending to the outlet. The top cap can also include a plurality of channels extending into the chamber that provide a fluid path into the chamber. In some embodiments of the disclosure, the guard is removably connected to the top cap.

The pool cleaner can also include a beauty cap that has a central opening. The beauty cap can be removably positioned over the top cap and the guard with the guard extending through the central opening of the beauty cap.

In accordance with embodiments of the present disclosure, an exemplary impeller subassembly for a pool cleaner is provided that includes a sleeve, a shaft, a retention ring, an impeller, and a guard. The sleeve can have a first end and a second end. The shaft can include a first end and a second end, and can be positioned within the sleeve with the first end of the shaft extending from the first end of the sleeve. The shaft can be rotatable within the sleeve. The impeller can be engaged with the first end of the shaft. The guard can be secured to the sleeve. The impeller subassembly can be removably engaged with debris container of a pool cleaner and can be removed from the debris container of the pool cleaner as a single unit.

In some embodiments of the disclosure, the guard is a diffuser that includes a shroud that defines an inner chamber and the impeller can be positioned within the inner chamber and radially spaced from the shroud. The shroud can include an open end having a plurality of ribs, and the impeller can be axially spaced from the fins.

The impeller subassembly can include at least one bearing positioned about the shaft and between the shaft and the sleeve. In some embodiments of the disclosure, the shaft can slide axially within the at least one bearing. The shaft can include a first coupling member configured to engage a second coupling member of a motor, and can slide axially within the at least one bearing when it engages the second coupling member and absorb any impact forces. In some embodiments of the disclosure, the sleeve can include a plurality of mounting bosses and the guard can include a plurality of mounting protrusions that can be secured with the plurality of mounting bosses in order to secure the guard to the sleeve.

In some embodiment of the disclosure, the impeller subassembly can be in combination with the pool cleaner.

In accordance with embodiments of the present disclosure, an exemplary pool cleaner is provided that includes a canister body, a filter medium, a cyclone block, and a check valve. The canister body can include an inlet and define an inner chamber that the filter medium and the cyclone block can be disposed within. The cyclone block can include a plurality of cyclone containers. In some embodiments, the canister body can be at least partially surrounded by the filter medium. The check valve can be secured within the inlet and can include a frame, a medium, and a rigid rod. The medium can have a proximal end, a distal end, a body that extends between the proximal end and the distal end, and a pocket in the body that extends from the proximal end to the distal end. The proximal end of the medium can be secured to the frame. The rigid rod can be positioned within the pocket of the medium. The check valve can be positioned in two different positions, a first position and a second position. The check valve is positioned in the first position when fluid is flowing through the check valve in a first direction, and positioned in the second position when fluid is flowing through the check valve in a second direction. When in the first position, debris can flow through the check valve. When in the second position, debris is prevented from flowing through the check valve. A first cyclonic flow can be generated between the canister body and the filtering medium assembly. A second cyclonic flow can be generated within each of the plurality of cyclone containers.

In some embodiments of the present disclosure, the inlet of the canister body can include an inner latching shoulder and the frame can include a flexible locking tab. In such embodiments, the check valve can be removably secured within the inlet through engagement of the flexible locking tab with the inner latching shoulder and can be removed from the inlet by flexing the flexible locking tab to disengage the flexible locking tab and the inner latching shoulder.

In some embodiments of the present disclosure, when the check valve is in the first position the rigid rod is substantially horizontal and does not obstruct the frame with the medium, while when the check valve is in the second position the rigid rod is substantially vertical adjacent the frame and obstructs the frame with the medium. The medium can be constructed of a flexible mesh material, and can be sewn around the frame or overmolded to the frame.

In accordance with embodiments of the present disclosure, an exemplary check valve is provided that includes a frame, a medium, and a rigid rod. The medium can have a proximal end, a distal end, a body that extends between the proximal end and the distal end, and a pocket in the body that extends from the proximal end to the distal end. The proximal end of the medium can be secured to the frame. The rigid rod can be positioned within the pocket of the medium. The check valve can be positioned in two different positions, a first position and a second position. The check valve is positioned in the first position when fluid is flowing through the check valve in a first direction, and positioned in the second position when fluid is flowing through the check valve in a second direction. When in the first position, debris can flow through the check valve. When in the second position, debris is prevented from flowing through the check valve.

In some embodiments of the present disclosure, the check valve can include a flexible locking tab that is configured to releasably secure the check valve within an inlet of a hydrocyclonic particle separator assembly.

In some embodiments of the present disclosure, when the check valve is in the first position the rigid rod is substantially horizontal and does not obstruct the frame with the medium, while when the check valve is in the second position the rigid rod is substantially vertical adjacent the frame and obstructs the frame with the medium. The medium can be constructed of a flexible mesh material, and can be sewn around the frame or overmolded to the frame.

In some embodiment of the disclosure, the check valve can be in combination with the pool cleaner.

In accordance with embodiments of the present disclosure, an exemplary filter medium is provided that includes a body and a first plurality of embossments formed in the body. The body can have a first side and a second side, and be formed of a filter material. The first plurality of embossments can form a first plurality of convexities extending from the first side of the body and a first plurality of concavities extending into the second side of the body. The first plurality of concavities and the first plurality of convexities can provide flow channels for water to flow through when debris is attached to the body.

The filter medium can include a second set of embossments formed in the body. The second set of embossments can form a second plurality of convexities extending from the second side of the body and a second plurality of concavities extending into the first side of the body. The first and second plurality of concavities and the first and second plurality of convexities can provide flow channels for water to flow through when debris is attached to the body. In some embodiments of the disclosure, the first and second plurality of embossments can be formed in the body such that the convexities of the first plurality of convexities of the first plurality of embossments are adjacent to the concavities of the second plurality of concavities of the second plurality of embossments, and the convexities of the second plurality of convexities of the second plurality of embossments are adjacent the concavities of the first plurality of concavities of the first plurality of embossments.

In some embodiments of the present disclosure the filter medium can be a fabric mesh, a plastic mesh, a molded mesh, a foam, or a coarse screening media. Additionally, the filter medium body can have an arcuate shape and can be configured to be connected to a support structure. The filter medium can also be in combination with the pool cleaner.

In accordance with embodiments of the present disclosure, an exemplary pool cleaner is provided that includes a body, a hydrocyclonic particle separator assembly, and a handle. The body includes a chassis that has a first catch and a second catch. The hydrocyclonic particle separator assembly can be positioned on the chassis between the first catch and the second catch. The handle has a body, a first locking hook, and a second locking hook. The body of the handle can have a first end and a second end, with the first locking hook extending from the first end and the second locking hook extending from the second end. The handle can be rotatably engaged with the hydrocyclonic particle separator assembly such that it can be rotated between an unlocked position and a locked position. When in the unlocked position, the first and second locking hooks are disengaged from the first and second catches and the hydrocyclonic particle separator assembly can be removed from the chassis. When in the locked position the first and second locking hooks are engaged with the first and second catches and the hydrocyclonic particle separator assembly is secured to the chassis.

In some embodiments of the present disclosure, the first and second locking hooks can include a recess and an engagement surface, and a portion of the first and second catches can be positioned within the recesses and engage the engagement surfaces of the first and second locking hooks when the handle is positioned in the locked position. In other embodiments of the present disclosure, the first and second catches can include a recess and an engagement surface, and a portion of the first and second locking hooks can be positioned within the recesses and engage the engagement surfaces of the first and second catches when the handle is positioned in the locked position.

The hydrocyclonic particle separator assembly can include a first engagement tab and a second engagement tab, and the handle can be rotatably engaged with the first and second engagement tabs. Additionally, the handle can include a first mounting boss and a second mounting boss, such that the first mounting boss can be rotatably engaged with the first engagement tab while the second mounting boss can be rotatably engaged with the second engagement tab. The first mounting boss can include a first channel, the second mounting boss can include a second channel, the first engagement tab can include a first protrusion, and the second engagement tab can include a second protrusion. When the handle is in the unlocked position the first protrusion can be positioned within the first channel and the second protrusion can be positioned within the second channel.

In some embodiments of the present disclosure, the handle can include a plurality of locking tabs and the hydrocylonic particle separator assembly can include a plurality of notches. The plurality of flexible locking tabs can be engaged with the plurality of notches when the handle is in the locked position.

The hydrocyclonic particle separator assembly can include a first pair of guide vanes separated by a first channel and a second pair of guide vanes separated by a second channel. The first channel can receive the first catch or the second catch and the second channel can receive the other of the first catch or the second catch in order to position the hydrocyclonic particle separator assembly on the chassis.

In accordance with embodiments of the present disclosure, an exemplary pool cleaner is provided that includes a body and a hydrocyclonic particle separator assembly. The body includes a chassis that has a first catch and a second catch. The hydrocyclonic particle separator assembly includes a canister body, a filter medium, a cyclone block, a first engagement tab, a second engagement tab, and a handle. The hydrocyclonic particle separator assembly can be positioned on the chassis. The canister body can include an inlet and define an inner chamber that the filter medium and the cyclone block can be disposed within. The cyclone block can include a plurality of cyclone containers. In some embodiments, the canister body can be at least partially surrounded by the filter medium. The handle has a body, a first locking hook, and a second locking hook. The body of the handle can have a first end and a second end, with the first locking hook extending from the first end and the second locking hook extending from the second end. The handle can be rotatably engaged with the first and second engagement tabs of the hydrocyclonic particle separator assembly such that it can be rotated between an unlocked position and a locked position. When in the unlocked position, the first and second locking hooks are disengaged from the first and second catches and the hydrocyclonic particle separator assembly can be removed from the chassis. When in the locked position the first and second locking hooks are engaged with the first and second catches and the hydrocyclonic particle separator assembly is secured to the chassis.

In some embodiments of the present disclosure, the first and second locking hooks can include a recess and an engagement surface, and a portion of the first and second catches can be positioned within the recesses and engage the engagement surfaces of the first and second locking hooks when the handle is positioned in the locked position. In other embodiments of the present disclosure, the first and second catches can include a recess and an engagement surface, and a portion of the first and second locking hooks can be positioned within the recesses and engage the engagement surfaces of the first and second catches when the handle is positioned in the locked position.

In some embodiments of the present disclosure, the handle can include a first mounting boss and a second mounting boss, such that the first mounting boss can be rotatably engaged with the first engagement tab while the second mounting boss can be rotatably engaged with the second engagement tab. The first mounting boss can include a first channel, the second mounting boss can include a second channel, the first engagement tab can include a first protrusion, and the second engagement tab can include a second protrusion. When the handle is in the unlocked position the first protrusion can be positioned within the first channel and the second protrusion can be positioned within the second channel.

In some embodiments of the present disclosure, the handle can include a plurality of locking tabs and the hydrocylonic particle separator assembly can include a plurality of notches. The plurality of flexible locking tabs can be engaged with the plurality of notches when the handle is in the locked position.

The hydrocyclonic particle separator assembly can include a first pair of guide vanes separated by a first channel and a second pair of guide vanes separated by a second channel. The first channel can receive the first catch or the second catch and the second channel can receive the other of the first catch or the second catch in order to position the hydrocyclonic particle separator assembly on the chassis.

In accordance with embodiments of the present disclosure, an exemplary pool cleaner is provided that includes a chassis, a hydrocyclonic particle separator assembly mounted to the chassis, a first roller set, a second roller set, a first roller drive gear train, a second roller drive gear train, a first roller drive gear box, a second roller drive gear box, and a motor box. The chassis can have a motor box housing, a first drive gear box housing, and a second drive gear box housing. The first roller drive gear train can be in mechanical communication with the first roller set, and the second roller drive gear train can be in mechanical communication with the second roller set. The first roller drive gear box can include a housing and a first gear stack secured within the housing. The first roller drive gear box can also be removably mounted within the first drive gear box housing and in mechanical communication with the first roller drive gear train. The second roller drive gear box can include a housing and a second gear stack secured within the housing. The second roller drive gear box can be removably mounted within the second drive gear box housing and in mechanical communication with the second roller drive gear train. The motor box can include a first drive motor and a second drive motor. The motor box can be mounted within the motor box housing with the first drive motor in mechanical communication with the first gear stack and the second drive motor in mechanical communication with the second gear stack.

In some embodiments of the present disclosure, the first and second drive gear box housings can include sidewalls, and the first and second first and second roller drive gear boxes can include sidewalls that match the sidewalls of the first and second drive gear box housings in order to align the first and second roller drive gear boxes when they are positioned within the first and second drive gear box housings. The first and second drive gear box housings can also include a plurality of mounts, while the first and second first and second roller drive gear boxes include a plurality of mounting tabs that align with the mounts, which positions the first and second roller drive gear boxes within the first and second drive gear box housings.

In some embodiments of the present disclosure, the first and second roller drive gear boxes can include a removable lid that is secured to the housing, and the first and gear stacks are accessible when the lid is removed from the housing.

In some embodiments of the present disclosure, the housing can include an opening and the first roller drive gear train can include a first drive gear. In such embodiments, a gear of the first gear stack can extend out from the opening in the housing and drive rotation of the first drive gear of the first roller drive gear train, and a gear of the second gear stack can extend out from the opening in the housing and drive rotation of a second drive gear of the second roller drive gear train.

The pool cleaner can include a first axle and a second axle. The first axle can be engaged and rotate with the first drive gear and the gear of the first gear stack, which drive rotation of the first axle. The second axle can be engaged and rotate with the second drive gear and the gear of the second gear stack, which drives rotation of the second axle.

In some embodiments of the present disclosure, the first roller set can include a first front roller, a first middle roller, and a first rear roller. The first drive motor can drive the first front roller, the first middle roller, and the first rear roller at the same rate. In some embodiments of the present disclosure, the second roller set includes a second front roller, a second middle roller, and a second rear roller. The second drive motor can drive the second front roller, the second middle roller, and the second rear roller at the same rate.

In other embodiments of the present disclosure, first roller set includes a first front roller, a first middle roller, and a first rear roller, while the second roller set includes a second front roller, a second middle roller, and a second rear roller; and the first and second front rollers are disposed adjacent to each other, the first and second middle rollers are disposed adjacent to each other, and the first and second rear rollers are disposed adjacent to each other.

In some embodiments of the present disclosure, the first drive motor drives the first front roller, the first middle roller, and the first rear roller at a first rate, and the second drive motor drives the second front roller, the second middle roller, and the second rear roller at a second rate that is different than the first rate to cause the pool cleaner to turn. In other embodiments of the present disclosure, the first drive motor drives the first front roller, the first middle roller, and the first rear roller in a first rotational direction, and the second drive motor drives the second front roller, the second middle roller, and the second rear roller in a second rotational direction that is different than the first rotational direction to cause the pool cleaner to turn.

In accordance with embodiments of the present disclosure, an exemplary pool cleaner is provided that includes a chassis, a first roller, and a roller latch. The chassis has an enclosure wall that defines a roller housing, and at least one latch receiver that includes an arcuate slot having an opening and a track. The first roller has a first side including a mounting boss, and a second side. The first roller is positioned within the roller housing and is rotatably mounted to the chassis at the second side. The roller latch has a body, at least one mounting protrusion, and a rider. The body of the roller latch includes a first side, a second side, and an arcuate transverse surface extending between the first side and the second side. The mounting protrusion extends laterally from one of the first and second sides of the body and includes a rotational axis. The rider includes a neck and a head, and extends from the arcuate transverse surface of the body. The rider can be generally arcuate in shape. The mounting boss can be rotatably engaged with the mounting protrusion so that the roller latch can be rotated about the rotational axis into a latched position where the neck is positioned within the track and the roller latch is secured to the at least one latch receiver. In some embodiments of the present disclosure, when the roller latch is rotated into the latched position the head passes through the opening and the neck passes through the track.

The pool cleaner can also include a fastener, while the roller latch can include a locking tab and the latch receiver can include a mounting boss. When the roller latch is in the latched position the fastener can engage the locking tab and the mounting boss to secure the roller latch in the latched position.

The pool cleaner can also include a second roller that has a first side including a mounting boss, and a second side. The first roller is positioned within the roller housing and is rotatably mounted to the chassis at the second side. The roller latch can include a second mounting protrusion that extends laterally from one of the first and second sides of the body, and the mounting boss of the second roller can be rotatably engaged with the second mounting protrusion. The second roller can be positioned adjacent the first roller in the roller housing.

In some embodiments of the present disclosure, the roller latch can include a second mounting protrusion extending laterally from one of the first and second sides of the body, and the latch receiver can include a mount. The second mounting protrusion can be positioned within the mount.

In accordance with embodiments of the present disclosure, an exemplary roller latch for a pool cleaner is provided that includes a body, at least one mounting protrusion, and a rider. The body of the roller latch includes a first side, a second side, and an arcuate transverse surface extending between the first side and the second side. The mounting protrusion extends laterally from one of the first and second sides of the body and includes a rotational axis. The rider includes a neck and a head, and extends from the arcuate transverse surface of the body. The rider can be generally arcuate in shape. The mounting protrusion can be rotatably engaged with a mounting boss of roller so that the roller latch can be rotated about the rotational axis into a latched position. The rider can engage a slot of a latch receiver as the body is rotated about the rotational axis to secure the roller latch to the latch receiver in a latched position. In some embodiments of the present disclosure, when the roller latch is rotated into the latched position the head passes through an opening and the neck passes through a track.

The roller latch can include a locking tab that can be engaged with a mounting boss of the latch receiver by a fastener.

The roller latch can include a second mounting protrusion that extends laterally from one of the first and second sides of the body. The second mounting protrusion can be engaged with a mounting boss of a second roller mount of the latch receiver.

In some embodiment of the disclosure, the roller latch can be in combination with the pool cleaner.

In accordance with embodiments of the present disclosure, an exemplary roller assembly for a pool cleaner is provided that includes a first cage half and a second cage half. The first cage half includes a bottom portion defining a first mating surface. The bottom portion includes a first tab including a distal end and a proximal end, the distal end including a snap engaging end. The bottom portion includes a protrusion extending from an inner surface of the first cage half. The second cage half includes a bottom portion defining a second mating surface configured to mate against the first mating surface. The bottom portion includes a second tab including a distal end and a proximal end, the distal end including a snap engaging end. During assembly, the snap engaging end of the first tab interlocks against the proximal end of the second tab, the snap engaging end of the second tab interlocks against the proximal end of the first tab, and the protrusion engages an inner surface of the second cage half. Engagement of the protrusion with the inner surface of the second cage half limits disengagement of the first and second tabs during impact to the roller assembly.

The first cage half and the second cage half each include a top portion defining a substantially curved surface. The top portions can include a plurality of openings extending therethrough. In some embodiments, the snap engaging end of the first tab can be oriented substantially inwardly towards a central longitudinal axis of the first cage half. In some embodiments, the snap engaging end of the second tab can be oriented substantially outwardly away from a central longitudinal axis of the second cage half. During assembly, the first tab can be positioned over and mates against the second tab.

The first tab and the protrusion can be disposed on a first connecting edge of the bottom portion of the first cage half. The second tab can be disposed on a complementary first connecting edge of the bottom portion of the second cage half. The first cage half includes a second connecting edge and the second cage half includes a complementary second connecting edge. The second connecting edge of the first cage half includes two spaced protrusions extending from the inner surface of the first cage half. The complementary second connecting edge of the second cage half includes a protrusion extending from the inner surface of the second cage half. During assembly, the protrusion of the second cage half is received between the two spaced protrusions of the first cage half, the protrusion of the second cage half engages the inner surface of the first cage half, and the two spaced protrusions of the first cage half engage the inner surface of the second cage half.

The first cage half and the second cage half each include first and second side surfaces. The first side surface of the second cage half includes a third tab with a snap engaging end. The first side surface of the first cage half includes a slot configured to receive at least a portion of the third tab of the second cage half. The snap engaging end of the third tab can interlock against an edge of the slot. The first side surfaces of the first and second cage halves mate to form a mounting boss. The second side surfaces of the first and second cage halves mate such that the second side surfaces are configured to receive a roller mount (e.g., a gear).

In some embodiment of the disclosure, the roller assembly can be in combination with the pool cleaner.

In accordance with embodiments of the present disclosure, an exemplary method of assembling a roller is provided. The method includes providing a first cage half including a bottom portion defining a first mating surface. The bottom portion includes a first tab including a distal end and a proximal end, the distal end including a snap engaging end, and a protrusion extending from an inner surface of the first cage half. The method includes providing a second cage half including a bottom portion defining a second mating surface configured to mate against the first mating surface. The bottom portion includes a second tab including a distal end and a proximal end, the distal end including a snap engaging end. The method includes interlocking the snap engaging end of the first tab against the proximal end of the second tab. The method includes interlocking the snap engaging end of the second tab against the proximal end of the first tab. The method includes engaging an inner surface of the second cage half with the protrusion of the first cage half.

The method includes positioning and mating the first tab against the second tab. The first tab and the protrusion are disposed on a first connecting edge of the bottom portion of the first cage half, and the second tab is disposed on a complementary first connecting edge of the bottom portion of the second cage half. The first cage half includes a second connecting edge and the second cage half includes a complementary second connecting edge. The second connecting edge of the first cage half includes two spaced protrusions extending from the inner surface of the first cage half. The complementary second connecting edge of the second cage half includes a protrusion extending from the inner surface of the second cage half. The method includes positioning the protrusion of the second cage half between the two spaced protrusions of the first cage half. The method includes engaging the inner surface of the first cage half with the protrusion of the second cage half. The method includes comprising engaging the inner surface of the second cage half with the two spaced protrusions of the first cage half.

The first cage half and the second cage half each include first and second side surfaces. The first side surface of the second cage half includes a third tab with a snap engaging end, and the first side surface of the first cage half includes a slot configured to receive at least a portion of the third tab of the second cage half. The method includes interlocking the snap engaging end of the third tab against an edge of the slot. The method includes mating the first side surfaces of the first and second cage halves to form a mounting boss.

The method includes providing a roller cover including a first end and a second end. The first end includes one or more openings configured to receive the first tab and the protrusion of the first cage half, and the second end includes one or more openings configured to receive the second tab of the second cage half. The method includes passing the first tab and the protrusion of the first cage half through the one or more openings of the first end of the roller cover. The method includes passing the second tab of the second cage half through the one or more openings of the second end of the roller cover. The method includes rolling the first and second halves toward each other such that top surfaces of the first and second cage halves mate with the roller cover.

In accordance with embodiments of the present disclosure, an exemplary roller assembly for a pool cleaner is provided that includes a first cage half, a second cage half, and a roller cover. The first cage half includes a bottom portion defining a first mating surface. The bottom portion includes a first tab including a distal end and a proximal end, the distal end including a snap engaging end, and a protrusion extending from an inner surface of the first cage half. The second cage half includes a bottom portion defining a second mating surface configured to mate against the first mating surface. The bottom portion includes a second tab including a distal end and a proximal end, the distal end including a snap engaging end. The roller cover includes a first end and a second end. The first end includes one or more openings configured to receive the first tab and the protrusion of the first cage half, and the second end includes one or more openings configured to receive the second tab of the second cage half.

During assembly, the first tab and the protrusion of the first cage half are passed through the one or more openings of the first end of the roller cover, the second tab of the second cage half is passed through the one or more openings of the second end of the roller cover, and the first and second cage halves are rolled toward each other such that top surfaces of the first and second cage halves mate with the roller cover. Further, during assembly, the snap engaging end of the first tab interlocks against the proximal end of the second tab, the snap engaging end of the second tab interlocks against the proximal end of the first tab, and the protrusion engages an inner surface of the second cage half.

In some embodiments, the roller cover can define a planar, flexible body extending between the first and second ends. The roller cover includes an outer surface and an inner surface. The inner surface is configured to mate against the top surfaces of the first and second cage halves. The outer surface includes a plurality of traction elements (e.g., flaps, or the like) extending therefrom.

In some embodiment of the disclosure, the roller assembly can be in combination with the pool cleaner.

In accordance with embodiments of the present disclosure, an exemplary roller assembly is provided that includes a first cage half and a second cage half. The first cage half includes a first connecting edge and a second connecting edge having two spaced protrusions extending from an inner surface of the first cage half. The second cage half includes a first connecting edge and a second connecting edge having a protrusion extending from an inner surface of the second cage half. During assembly, the protrusion of the second cage half is received between the two spaced protrusions of the first cage half, the protrusion of the second cage half engages the inner surface of the first cage half, the two spaced protrusions of the first cage half engage the inner surface of the second cage half, and the first connecting edge is secured to the second connecting edge.

In accordance with embodiments of the present disclosure, an exemplary pool cleaner is provided that includes a chassis, a motor box, a pump motor, and a debris container. The chassis has a motor box housing, and the motor box is mounted within the motor box housing. The pump motor, which can be a brushless DC outer rotor motor, is positioned within the motor box and has a rotor including a first coupling member that extends out from the motor box. The debris container has a rotatable shaft that has a first end and a second end, and an impeller mounted to the first end of the rotatable shaft. The second end of the rotatable shaft can include a second coupling member that can receive the first coupling member of the pump motor. The debris container is mounted on the chassis with the first coupling member engaged with the second coupling member, and the pump motor drives rotation of the rotatable shaft through engagement of the first coupling member with the second member.

In some embodiments of the present disclosure the first coupling member is an external spline member and the second coupling member is an internal spline member, while in other embodiments, the first coupling member is a first blender coupler and the second coupling member is a second blender coupler. The debris container can also include a sleeve that surrounds the rotatable shaft, and the pump motor can include a guide fillet. The sleeve can engage the guide fillet to center the rotatable shaft with the pump motor.

In accordance with embodiments of the present disclosure, an exemplary pool cleaner is provided that includes a chassis, a motor box, a pump motor, and a debris container. The chassis has a motor box housing, and the motor box is mounted within the motor box housing. The pump motor, which can be a brushless DC outer rotor motor, is positioned within the motor box and has a rotor including a first magnetic member that extends out from the motor box. The debris container has a rotatable shaft that has a first end and a second end, and an impeller mounted to the first end of the rotatable shaft. The second end of the rotatable shaft can include a second magnetic member that can magnetically couple to the first magnetic member of the pump motor. The debris container is mounted on the chassis with the first magnetic member engaged with the second magnetic member, and the pump motor drives rotation of the rotatable shaft through engagement of the first magnetic member with the second magnetic member.

The debris container can also includes a sleeve that surrounds the rotatable shaft, and the pump motor can include a guide fillet. The sleeve can engage the guide fillet to center the rotatable shaft with the pump motor.

In accordance with embodiments of the present disclosure, an exemplary pool cleaner is provided that includes a chassis, a motor box, a stator, and a debris container. The chassis has a motor box housing, and the motor box is mounted within the motor box housing. The stator is positioned within the motor box and includes a plurality of electromagnets. The debris container has a rotatable shaft that has a first end and a second end, and an impeller mounted to the first end of the rotatable shaft. The second end of the rotatable shaft can include a casing having a plurality of permanent magnets. The casing can be placed over or inside the stator. The debris container is mounted on the chassis with the stator positioned within the casing of the rotatable shaft, and the stator drives rotation of the rotatable shaft through electromechanical interaction between the plurality of electromagnets of the stator with the plurality of permanent magnets of the casing. In some embodiments of the present disclosure, the casing can extend from a bottom of the debris container and can be positioned within the motor box when the debris container is mounted on the chassis.

In accordance with embodiments of the present disclosure, an exemplary pool cleaner is provided that includes a chassis, a motor box, an inductive coupling transmitter circuit, and a debris container. The chassis has a motor box housing, and the motor box is mounted within the motor box housing. The inductive coupling transmitter circuit is positioned within the motor box. The debris container has a pump motor, a rotatable shaft that has a first end and a second end, and an impeller mounted to the first end of the rotatable shaft. The pump motor, which can be a brushless DC outer rotor motor, has an inductive coupling receiver circuit and rotatably drives the rotatable shaft. The debris container is mounted on the chassis with the inductive coupling receiver circuit positioned adjacent the inductive coupling transmitter circuit. The inductive coupling receiver circuit receives electrical power from the inductive coupling transmitter circuit and provides the pump motor with electrical power to drive rotation of the rotatable shaft. The debris container can also include a sleeve that the pump motor and rotatable shaft can be positioned within.

In accordance with embodiments of the present disclosure, an exemplary pool cleaner is provided that includes a chassis, a motor box, a power circuit, and debris container. The chassis has a motor box housing, and the motor box is mounted within the motor box housing. The power circuit is positioned within the motor box and includes a plurality of pins, e.g., spring-loaded pogo pins, that extend out from the motor box. The debris container has a pump motor, a rotatable shaft that has a first end and a second end, and an impeller mounted to the first end of the rotatable shaft. The pump motor, which can be a brushless DC outer rotor motor, has a contact plate and rotatably drives the rotatable shaft. The debris container is mounted on the chassis with the contact plate engaging the pins. The contact plate receives electrical power from the pins and provides the pump motor with electrical power to drive rotation of the rotatable shaft. The debris container can also include a sleeve that the pump motor and rotatable shaft can be positioned within.

In accordance with embodiments of the present disclosure, a power supply for a pool cleaner is provided that includes a housing, a user interface, a low-power user interface printed circuit board, and a potted power converter board assembly. The low-power user interface printed circuit board is in electrical communication with the user interface. The potted power converter board assembly includes a tray, a high-power printed circuit board, an AC power input connector, a female power and communication output port, and a potting compound. The high-power printed circuit board is positioned within the tray and includes a plurality of electrical components and low-power user interface wires. The AC power input connector is in electrical communication with the high-power printed circuit board and provides a power input to the high-power printed circuit board. The female power and communication output port is in electrical communication with the high-power printed circuit board and provides power output from the high-power printed circuit board. The potting compound is positioned within the tray and surrounds the high-power circuit board and the electrical components, thus isolating the high-power circuit board and the electrical components. The low-power user interface wires extend out from the potting compound and are connected to the low-power user interface printed circuit board. The low-power user interface wires provide power to the low-power user interface printed circuit board.

In some embodiments of the present disclosure, the housing can include a front housing and a rear housing, and the low-power user interface printed circuit board and the potted power converter board assembly can be positioned between the front housing and the rear housing. The low-power user interface printed circuit board can be mounted to the front housing, and the potted power converter board assembly can include a plurality of stops extending between the tray and the front housing that restrict flexion of the low-power user interface printed circuit board. Furthermore, the potted power converter board assembly can include a plurality of mounting brackets while the rear housing can include a plurality of mounting bosses. The potted power converter board assembly can be retained by the rear housing through engagement of the plurality of mounting brackets with the plurality of mounting bosses of the rear housing.

In some embodiments of the present disclosure, the high-power printed circuit board can include a first side, a second side, and a heat sink, which can be a folded sheet metal heat sink. The plurality of electrical components can be mounted to the first side while the heat sink can be mounted to the second side.

The user interface can be mounted to the housing with the connector extending through a connector opening in the housing so that it can connect to the low-power user interface printed circuit board. A graphic overlay including a plurality of semi-transparent indicia can be positioned over the user interface.

The power supply can include low-power fan wires and a fan. The low-power fan wires can be connected to the high-power printed circuit board, extend out from the potting compound, and be connected to the fan in order to provide low-power to the fan. The fan is positioned adjacent the potting compound and cools the potted power converter board assembly through forced convection. The housing can include a fan opening with the fan positioned within the fan opening. The fan can be secured in place by a fan cover that is removably connected to the housing and covers the fan opening.

The tray can include a port opening while the female power and communication output port includes a barrier that can be positioned within the port opening to prevent potting compound from leaking out from the tray.

The user interface printed circuit board can include a plurality of light-emitting diodes, and the housing can include a plurality of openings that allow the light-emitting diodes to be viewed from the exterior of the housing. The power supply can also include a light baffle that includes a plurality of apertures. The light baffle can be positioned over the user interface printed circuit board with the light-emitting diodes positioned within the apertures, such that the light baffle prevents cross-talk between the light-emitting diodes.

The housing can include, among other things, a recessed handle and a plurality of vents on the sides of the housing that are positioned to vent hot air away from the handle.

In some embodiments of the present disclosure, the electrical components of the high-power printed circuit board can form a contoured landscape, and the contoured tray can include a plurality of contours that define a plurality of interior recesses. The contours of the tray can match the contoured landscape formed by the electrical components of the high-power printed circuit board, so that when the high-power printed circuit board is positioned within the tray the electrical components are positioned within the interior recesses of the contoured tray. A substantially uniform space, which is filled with potting compound, can be formed between the plurality of electrical components and the plurality of contours of the tray. The substantially uniform space can provide substantially unified strain during thermal expansion of the potting compound.

In some embodiments of the present disclosure, the high-power printed circuit board limits the power provided to the low-power printed circuit board. For example, the high-power printed circuit board can include a positive temperature coefficient thermistor can limit the power provided to the low-power printed circuit board to less than or equal to a predefined wattage.

The power supply can also include a control cable that extends from a pool cleaner and is connected to the female power and communication output port, and which provides power and control commands to the pool cleaner. The high-power printed circuit board can also include a thermistor that provides a measurement of the temperature of the high-power printed circuit board, and the pool cleaner can adjust its operation based on the temperature of the high-power printed circuit board. For example, the pool cleaner can reduce the power drawn from the power supply if the temperature monitored by the thermistor is greater than a threshold, or disable operating modes thereof if the temperature monitored by the thermistor is greater than a threshold.

The user interface can include a first button, a second button, and a third button. The first button can be a power button, the second button can be a schedule select button, and the third button can be a mode select button. A factory reset can be performed by pressing and holding the first button, the second button, and the third button for a predetermined period of time. A WiFi connection of the power supply can be reset by pressing and holding at least two of the first, second, and third buttons simultaneously for a predetermined period of time. The power button of the user interface can be pressed to toggle the power supply between a power state and a standby state. The power button can also be pressed and held for a predetermined period of time to start or shut-down a pool cleaner connected to the power supply. The schedule select button of the user interface can be pressed to scroll through schedule settings. The schedule select button can also be pressed and held for a predetermined period of time to dim the user interface. The mode select button of the user interface can be pressed to scroll through a plurality of pool cleaner modes. The mode select button can also be pressed and held for a predetermined period of time to brighten the user interface.

In some embodiment of the disclosure, the power supply can be in combination with the pool cleaner.

In accordance with embodiments of the present disclosure, a power supply for a pool cleaner is provided that includes a housing, a user interface including a connector, a low-power user interface printed circuit board, and a potted power converter board assembly. The low-power user interface printed circuit board has a microprocessor, a power converter board connector, and a user interface port. The user interface connector of the user interface is connected to the user interface port of the low-power user interface printed circuit board to communicate therewith. The potted power converter board assembly includes a high-power printed circuit board, a contoured tray, an AC power input connector, a female power and communication output port, and a potting compound. The high-power printed circuit board is positioned within the contoured tray and includes a plurality of electrical components that form a contoured landscape, and low-power user interface wires. The contoured tray includes a plurality of contours that define a plurality of interior recesses. The contours of the contoured tray match the contoured landscape formed by the electrical components of the high-power printed circuit board, so that when the high-power printed circuit board is positioned within the tray the electrical components are positioned within the interior recesses of the contoured tray. The AC power input connector is in electrical communication with the high-power printed circuit board and provides a power input to the high-power printed circuit board. The female power and communication output port is in electrical communication with the high-power printed circuit board and provides power output from the high-power printed circuit board and control from the low power user interface printed circuit board. The potting compound is positioned within the tray and surrounds the high-power circuit board and the electrical components, thus isolating the high-power circuit board and the electrical components. The low-power user interface wires extend out from the potting compound and can be connected to the power converter board connector. The low-power user interface printed circuit board and the potted power converter board assembly are positioned within the housing.

A substantially uniform space, which is filled with potting compound, can be formed between the plurality of electrical components and the plurality of contours of the contoured tray. The substantially uniform space can provide substantially unified strain during thermal expansion of the potting compound.

In some embodiments of the present disclosure, the housing can include a front housing and a rear housing, and the low-power user interface printed circuit board and the potted power converter board assembly can be positioned between the front housing and the rear housing. The low-power user interface printed circuit board can be mounted to the front housing, and the potted power converter board assembly can include a plurality of stops extending between the tray and the front housing that restriction flexion of the low-power user interface printed circuit board. Furthermore, the potted power converter board assembly can include a plurality of mounting brackets while the rear housing can include a plurality of mounting bosses. The potted power converter board assembly can be retained by the rear housing through engagement of the plurality of mounting brackets with the plurality of mounting bosses of the rear housing.

In some embodiments of the present disclosure, the high-power printed circuit board can include a first side, a second side, and a heat sink, which can be a folded sheet metal heat sink. The plurality of electrical components can be mounted to the first side while the heat sink can be mounted to the second side.

The user interface can be mounted to the housing with the connector extending through a connector opening in the housing so that it can connect to the user interface port of the low-power user interface printed circuit board. A graphic overlay including a plurality of semi-transparent indicia can be positioned over the user interface.

The power supply can include low-power fan wires and a fan. The low-power fan wires can be connected to the high-power printed circuit board, extend out from the potting compound, and be connected to the fan in order to provide low-power to the fan. The fan is positioned adjacent the potting compound and cools the potted power converter board assembly through forced convection. The housing can include a fan opening with the fan positioned within the fan opening. The fan can be secured in place by a fan cover that is removably connected to the housing and covers the fan opening.

The tray can include a port opening while the female power and communication output port includes a barrier that can be positioned within the port opening to prevent potting compound from leaking out from the tray.

The user interface printed circuit board can include a plurality of light-emitting diodes, and the housing can include a plurality of openings that allow the light-emitting diodes to be viewed from the exterior of the housing. The power supply can also include a light baffle that includes a plurality of apertures. The light baffle can be positioned over the user interface printed circuit board with the light-emitting diodes positioned within the apertures, such that the light baffle prevents cross-talk between the light-emitting diodes.

The housing can include, among other things, a recessed handle and a plurality of vents on sides of the housing that are positioned to vent hot air away from the handle.

In some embodiments of the present disclosure, the high-power printed circuit board limits the power provided to the low-power printed circuit board. For example, the high-power printed circuit board can include a positive temperature coefficient thermistor can limit the power provided to the low-power printed circuit board to less than or equal to a predefined wattage.

The power supply can also include a control cable that extends from a pool cleaner and is connected to the female power and communication output port, and which provides power and control commands to the pool cleaner. The high-power printed circuit board can also include a thermistor that provides a measurement of the temperature of the high-power printed circuit board, and the pool cleaner can adjust its operation based on the temperature of the high-power printed circuit board. For example, the pool cleaner can draw less power if the temperature monitored by the thermistor is greater than a threshold, or disable operating modes thereof if the temperature monitored by the thermistor is greater than a threshold.

The user interface can include a first button, a second button, and a third button. The first button can be a power button, the second button can be a schedule select button, and the third button can be a mode select button. A factory reset can be performed by pressing and holding the first button, the second button, and the third button for a predetermined period of time. A WiFi connection of the power supply can be reset by pressing and holding at least two of the first, second, and third buttons simultaneously for a predetermined period of time. The power button of the user interface can be pressed to toggle the power supply between a power state and a standby state. The power button can also be pressed and held for a predetermined period of time to start or shut-down a pool cleaner connected to the power supply. The schedule select button of the user interface can be pressed to scroll through schedule settings. The schedule select button can also be pressed and held for a predetermined period of time to dim the user interface. The mode select button of the user interface can be pressed to scroll through a plurality of pool cleaner modes. The mode select button can also be pressed and held for a predetermined period of time to brighten the user interface.

In some embodiment of the disclosure, the power supply can be in combination with the pool cleaner.

In accordance with embodiments of the present disclosure, a power supply for a pool cleaner is provided that includes a housing, a high-power printed circuit board positioned within the housing, and a kickstand. The housing defines an internal chamber, and includes a rear wall that has at least one kickstand engagement. The at least one kickstand engagement includes a lower abutment and an upper abutment, with the lower abutment having a stop. The kickstand includes at least one leg having a first end and a second end. An engagement surface is positioned at the second end of the leg, and a locking protrusion extends from the leg at a position between the first end and the second end. The locking protrusion includes a body and an extension extending from the body. The locking protrusion is removably positioned within the lower abutment and can rotate within the lower abutment in order to rotatably secure the kickstand to the housing. The kickstand is rotatable between a closed position and an open position. When the kickstand is in the open position the extension engages the stop and the engagement surface engages the upper abutment to prevent further rotation of the kickstand.

In some embodiments of the present disclosure, the lower abutment includes a first curved support, a second curved support, and a channel between the first and second curved supports. The locking protrusion can be positioned between the first and second curved supports with the extension positioned within the channel. When the kickstand is rotated from the closed position to the open position the extension is rotated across the channel to engage the stop. Additionally, the first and second curved supports can each include a sidewall and the locking protrusion can be positioned between the sidewalls with the sidewalls preventing lateral movement of the kickstand.

In some embodiments of the present disclosure, the lower abutment includes a protrusion that engages the body of the locking protrusion in order to secure the locking protrusion within the lower abutment. The rear wall of the housing can include a window and the at least one kickstand engagement can extend into the internal chamber of the housing. The window can be positioned adjacent the at least one kickstand engagement and provide access to the at least one kickstand engagement. The upper abutment can include a curved body that has an attachment end and an open end, and defines an engagement chamber. The curved body can be connected to the rear wall at the attachment end. In such embodiments, when the kickstand is in the open position the engagement surface is positioned within the engagement chamber and engages the curved body of the upper abutment. The curved body can also engage the locking protrusion body in order to further secure the locking protrusion within the lower abutment. The curved body can include an angled stop positioned within the engagement chamber. The engagement surface can engage the angled stop when the kickstand is in the open position.

In some embodiment of the disclosure, the power supply can be in combination with the pool cleaner.

In accordance with embodiments of the present disclosure, a power supply for a pool cleaner is provided that includes a housing and a kickstand. The housing defines an internal chamber, and includes a rear wall that has at least one kickstand engagement. The at least one kickstand engagement includes a lower abutment and an upper abutment, with the lower abutment having a stop. The kickstand includes at least one leg having a first end and a second end. An engagement surface is positioned at the second end of the leg, and a locking protrusion extends from the leg at a position between the first end and the second end. The locking protrusion includes a body and an extension extending from the body. The locking protrusion is removably positioned within the lower abutment and can rotate within the lower abutment in order to rotatably secure the kickstand to the housing. The kickstand is rotatable between a closed position and an open position. When the kickstand is in the open position the extension engages the stop and the engagement surface engages the upper abutment to prevent further rotation of the kickstand.

In some embodiments of the present disclosure, the lower abutment includes a first curved support, a second curved support, and a channel between the first and second curved supports. The locking protrusion can be positioned between the first and second curved supports with the extension positioned within the channel. When the kickstand is rotated from the closed position to the open position the extension is rotated across the channel to engage the stop. Additionally, the first and second curved supports can each include a sidewall and the locking protrusion can be positioned between the sidewalls with the sidewalls preventing lateral movement of the kickstand.

In some embodiments of the present disclosure, the lower abutment includes a protrusion that engages the body of the locking protrusion in order to secure the locking protrusion within the lower abutment. The rear wall of the housing can include a window and the at least one kickstand engagement can extend into the internal chamber of the housing. The window can be positioned adjacent the at least one kickstand engagement and provide access to the at least one kickstand engagement. The upper abutment can include a curved body that has an attachment end and an open end, and defines an engagement chamber. The curved body can be connected to the rear wall at the attachment end. In such embodiments, when the kickstand is in the open position the engagement surface is positioned within the engagement chamber and engages the curved body of the upper abutment. The curved body can also engage the locking protrusion body in order to further secure the locking protrusion within the lower abutment. The curved body can include an angled stop positioned within the engagement chamber. The engagement surface can engage the angled stop when the kickstand is in the open position.

In accordance with embodiments of the present disclosure, a pool cleaner caddy for supporting a pool cleaner and a power supply is provided that includes a base, first and second wheel assemblies connected to the base, a stem, and a handle assembly. The base has a front cleaner support, a center cleaner support, a stem locking bracket, and a channel that includes first and second angled locking tabs. The front cleaner support and the center cleaner support engage and support a pool cleaner with wheels of the pool cleaner not in engagement with the base. The stem is removably mounted to the base with a first portion secured within the channel by the first and second locking tabs, and a second portion secured to the stem locking bracket by a first releasable mounting means. The handle assembly includes a mount, and is removably secured to the stem such that the mount is engaged with the stem by a second releasable mounting means. The first and second releasable mounting means can be depressible. For example, the first and second releasable mounting means can be a button-snap connector. The stem can be snapped into the channel and the stem locking bracket.

In some embodiments of the present disclosure, the stem can include a lower stem portion and an upper stem portion. The upper stem portion can be removably secured to the lower stem portion by a third releasable mounting means. The lower stem portion can be secured to the stem locking bracket and the handle assembly mount can be secured to the upper stem portion.

In some embodiments of the present disclosure, the first, second, and third releasable mounting means can be depressed to disengage the lower section of the lower stem portion from the stem locking bracket, the lower section of the upper stem portion from the upper section of the lower stem portion, and the mount from the upper section of the upper stem portion.

The pool cleaner caddy can also include a fastener, e.g., a ribbed fastener, while the stem portion can include a through-hole and the base can include a transverse opening. The fastener can extend through the through-hole and the transverse opening to secure the stem to the base.

In some embodiments of the present disclosure, the first and second wheel assemblies can be removable from the base. The base can include a first outer wall, a first inner wall, a first wheel chamber between the first outer wall and the first inner wall, a second outer wall, a second inner wall, and a second wheel chamber between the second outer wall and the second inner wall. The first wheel assembly can be secured to the first inner wall and the first outer wall, and the second wheel assembly can be secured to the second inner wall and the second outer wall. Additionally, the first wheel assembly can include a first wheel, a first axle, a first axle receiver, and a first screw, and the second wheel assembly can include a second wheel, a second axle, a second axle receiver, and a second screw. The first wheel can be positioned within the first wheel chamber, the first axle can be secured to the first outer wall and engage the first wheel, the first axle receiver can be secured to the first inner wall, and the first screw can secure the first axle receiver to the first axle. The second wheel can be positioned within the second wheel chamber, the second axle can be secured to the second outer wall and engage the second wheel, the second axle receiver can be secured to the second inner wall, and the second screw can secure the second axle receiver to the second axle.

In some embodiments of the present disclosure, the first outer wall includes a first outer mounting boss that has at least one angled channel while the first axle includes at least one angled thread. The first axle can extend through the first outer mounting boss with the at least one angled thread engaged the at least one angled channel. Similarly, the second outer wall can include a second outer mounting boss that has at least one angled channel while the second axle can include at least one angled thread. The second axle can extend through the second outer mounting boss with the at least one angled thread engaged with the at least one angled channel.

In some embodiments of the present disclosure, the first inner wall can include a first keyed opening that has at least one inward extension, the first axle receiver can include at least one radial extension, the second inner wall can include a second keyed opening having at least one inward extension, and the second axle receiver can include at least one radial extension. The first axle receiver can be positioned within the first keyed opening with at least one radial extension overlapping the at least one inward extension to secure the first axle receiver to the first inner wall. The second axle receiver can be positioned within the second keyed opening with at least one radial extension overlapping the at least one inward extension to secure the second axle receiver to the second inner wall.

The base can also include a catch that can engage a pool cleaner wheel and prevent the pool cleaner from falling off of the caddy.

In some embodiments of the present disclosure, the handle assembly defines a power supply housing that can house a power supply. The handle assembly can include a front shell and a rear shell that can be mated to form the handle assembly. The front shell can include a front tray and the rear shell can include a recess that receives the front tray. The handle assembly can also include a rear support wall that, along with the front tray, secures a power supply to the handle assembly. The rear support wall can include at least one flexible locking tab that can engage the power supply and retain the power supply with the handle assembly. The handle assembly can also include a cable housing that can receive and support a power supply cable.

In some embodiments of the present disclosure, handle assembly mount includes an internal key and the stem includes a key-slot. The internal key can engage the key-slot to position the handle assembly on the stem.

In some embodiment of the disclosure, the pool cleaner caddy can be in combination with the pool cleaner.

In accordance with embodiments of the present disclosure, a kit for a pool cleaner caddy used to support a pool cleaner is provided that includes a base, first and second wheel assemblies that are removably securable to the base, a stem, and a handle assembly. The base has a front cleaner support, a center cleaner support, a stem locking bracket, and a channel that includes first and second angled locking tabs. The front cleaner support and the center cleaner support can engage and support a pool cleaner with wheels of the pool cleaner not in engagement with the base. The stem can be removably mountable to the base with a first portion being removably securable within the channel by the first and second locking tabs, and a second portion being removably securable to the stem locking bracket by a first releasable mounting means. The handle assembly includes a mount, and can be removably securable to the stem such that the mount is engaged with the stem by a second releasable mounting means. The first and second releasable mounting means can be depressible. For example, the first and second releasable mounting means can be button-snap connector. In some aspects, the stem can be snapped into the channel and the stem locking bracket.

The kit for a pool cleaner caddy can also include a fastener, e.g., a ribbed fastener, while the stem can include a through-hole and the base can include a transverse opening. The fastener can be positioned in the through-hole and the transverse opening to secure the stem to the base.

In some embodiments of the present disclosure, the stem can include a lower stem portion and an upper stem portion. The upper stem portion can be removably securable to the lower stem portion by a third releasable mounting means. The lower stem portion can be securable to the stem locking bracket and the handle assembly mount can be securable to the upper stem portion.

In some embodiments of the present disclosure, the base can include a first outer wall, a first inner wall, a first wheel chamber between the first outer wall and the first inner wall, a second outer wall, a second inner wall, and a second wheel chamber between the second outer wall and the second inner wall. The first wheel assembly can be securable to the first inner wall and the first outer wall, and the second wheel assembly can be securable to the second inner wall and the second outer wall. Additionally, the first wheel assembly can include a first wheel, a first axle, a first axle receiver, and a first screw, and the second wheel assembly can include a second wheel, a second axle, a second axle receiver, and a second screw. The first wheel can be positionable within the first wheel chamber, the first axle can be securable to the first outer wall and engage the wheel, the first axle receiver can be securable to the first inner wall, and the first screw can be utilized to secure the first axle receiver to the first axle. The second wheel can be positionable within the second wheel chamber, the second axle can be securable to the second outer wall and engage the second wheel, the second axle receiver can be securable to the second inner wall, and the second screw can be utilized to secure the second axle receiver to the second axle.

In some embodiments of the present disclosure, the first outer wall includes a first outer mounting boss that has at least one angled channel while the first axle includes at least one angled thread. The at least one angled thread of the first axle can be engageable with the at least one angled channel of the first outer mounting boss. Similarly, the second outer wall can include a second outer mounting boss that has at least one angled channel while the second axle can include at least one angled thread. The at least one angled thread of the second axle can be engageable with the at least one angled channel of the second outer mounting boss.

In some embodiments of the present disclosure, the first inner wall can include a first keyed opening that has at least one inward extension, the first axle receiver can include at least one radial extension, the second inner wall can include a second keyed opening having at least one inward extension, and the second axle receiver can include at least one radial extension. The first axle receiver can be positionable within the first keyed opening with at least one radial extension overlapping the at least one inward extension to secure the first axle receiver to the first inner wall. The second axle receiver can be positionable within the second keyed opening with at least one radial extension overlapping the at least one inward extension to secure the second axle receiver to the second inner wall.

The base can also include a catch that can engage a pool cleaner wheel and prevent the pool cleaner from falling off of the caddy.

In some embodiments of the present disclosure, the handle assembly defines a power supply housing that can house a power supply. The handle assembly can include a front shell and a rear shell that can be mated to form the handle assembly. The front shell can include a front tray and the rear shell can include a recess that can receive the front tray. The handle assembly can also include a rear support wall that, along with the front tray, can secure a power supply to the handle assembly. The rear support wall can include at least one flexible locking tab that can engage the power supply and retain the power supply with the handle assembly. The handle assembly can also include a cable housing that can receive and support a power supply cable.

In some embodiments of the present disclosure, handle assembly mount includes an internal key and the stem includes a key-slot. The internal key can engage the key-slot to position the handle assembly on the stem.

In some embodiment of the disclosure, the kit for a pool cleaner can be in combination with the pool cleaner.

In accordance with embodiments of the present disclosure, a pool cleaner caddy is provided that includes a base, a first wheel assembly, and a second wheel assembly. The base has a first outer mounting boss and a second outer mounting boss. Each of the first and second outer mounting bosses have at least one angled channel. The first wheel assembly includes a first wheel, a first axle that has at least one left-handed angled thread, a first axle receiver, and a first screw. The second wheel assembly includes a second wheel, a second axle that has at least one left-handed angled thread, a second axle receiver, and a second screw. The first axle extends through the first outer mounting boss and the first wheel with the at least one left-handed angled thread engaged with the at least one angled channel of the first outer mounting boss. The first axle receiver is secured to the base and at least partially receives the first axle. The first screw secures the first axle receiver to the first axle. The second axle extends through the second outer mounting boss and the second wheel with the at least one left-handed angled thread engaged with the at least one angled channel of the second outer mounting boss. The second axle receiver is secured to the base and at least partially receives the second axle. The second screw secures the second axle receiver to the second axle.

The first screw can extend through the first axle receiver and threadedly engage a distal end of the first axle to cause the at least one left-handed angled thread of the first axle to further engage the at least one angled channel of the first outer mounting boss. Similarly, the second screw can extend through the second axle receiver and threadedly engage a distal end of the second axle to cause the at least one left-handed angled thread of the second axle to further engage the at least one angled channel of the second outer mounting boss.

In some embodiments of the present disclosure, the base includes a first keyed opening that has at least one inward extension and a second keyed opening that has at least one inward extension. The first axle receiver can include at least one radial extension and the second axle receiver can also include at least one radial extension. The first axle receiver can be positioned within the first keyed opening with at least one radial extension overlapping the at least one inward extension to further secure the first axle receiver to the base, and the second axle receiver can be positioned within the second keyed opening with at least one radial extension overlapping the at least one inward extension to further secure the second axle receiver to the base.

In some embodiments of the present disclosure, the first axle can include a distal end having a notch, the second axle can include a distal end having a notch, the first axle receiver can include a locking assembly, and the second axle receiver can include a locking assembly. The notch of the first axle receiver can lock with the locking assembly of the first axle receiver to secure the first axle to the first axle receiver, and the notch of the second axle receiver can lock with the locking assembly of the second axle receiver to secure the second axle to the second axle receiver. The locking assemblies can include a ramped protrusion, a block protrusion, and an indentation between the ramped protrusion and the block protrusion. The first and second axle receivers can each include an inner chamber and the locking assemblies can be positioned within the inner chambers.

In some embodiments of the present disclosure, the base can additionally includes a first outer wall having the first outer mounting boss, a first inner wall, a first wheel chamber between the first outer wall and the first inner wall, a second outer wall having the second outer mounting boss, a second inner wall, and a second wheel chamber between the second outer wall and the second inner wall. The first wheel can be positioned within the first wheel chamber, the first axle receiver can be secured to the first inner wall, the second wheel can be positioned within the second wheel chamber, and the second axle receiver can be secured to the second inner wall.

In some embodiment of the disclosure, the pool cleaner caddy can be in combination with the pool cleaner.

In accordance with embodiments of the present disclosure, a caddy is provided that includes a base and at least one wheel assembly. The base has an outer mounting boss that has at least one angled channel. The wheel assembly includes a wheel, an axle that has at least one left-handed angled thread, an axle receiver, and a screw. The axle extends through the outer mounting boss and the wheel with the at least one left-handed angled thread engaged with the at least one angled channel of the outer mounting boss. The axle receiver is secured to the base and at least partially receives the axle. The screw secures the axle receiver to the axle.

The screw can extend through the axle receiver and threadedly engage a distal end of the axle to cause the at least one left-handed angled thread of the axle to further engage the at least one angled channel of the outer mounting boss.

In some embodiments of the present disclosure, the base includes a keyed opening that has at least one inward extension, and the axle receiver can include at least one radial extension. The axle receiver can be positioned within the keyed opening with at least one radial extension overlapping the at least one inward extension to further secure the axle receiver to the base.

In some embodiments of the present disclosure, the axle can include a distal end having a notch and the first axle receiver can include a locking assembly. The notch of the axle receiver can lock with the locking assembly of the axle receiver to secure the axle to the first axle receiver. The locking assembly can include a ramped protrusion, a block protrusion, and an indentation between the ramped protrusion and the block protrusion. The axle receivers can include an inner chamber and the locking assembly can be positioned within the inner chamber.

In some embodiments of the present disclosure, the base can additionally include an outer wall having the outer mounting boss, an inner wall, and a wheel chamber between the outer wall and the inner wall. The wheel can be positioned within the wheel chamber and the axle receiver can be secured to the inner wall. In some embodiment of the disclosure, the pool cleaner caddy can be in combination with the pool cleaner.

Additional features, functions and benefits of the disclosed swimming pool cleaner and methods in connection therewith will be apparent from the detailed description which follows, particularly when read in conjunction with the accompanying figures.

BRIEF DESCRIPTION OF THE DRAWINGS

For a more complete understanding of the present disclosure, reference is made to the following detailed description of an exemplary embodiment considered in conjunction with the accompanying drawings, in which:

FIG. 106 is an exploded view of the exemplary roller assembly of FIG. 105;

FIG. 107 is a perspective view of a first cage half of the exemplary roller assembly of FIG. 105;

FIG. 108 is a bottom view of the first cage half of FIG. 107;

FIG. 109 is a right side view of the first cage half of FIG. 107;

FIG. 110 is a left side view of the first cage half of FIG. 107;

FIG. 111 is a top view of the first cage half of FIG. 107;

FIG. 112 is a perspective view of a second cage half of the exemplary roller assembly of FIG. 105;

FIG. 113 is a bottom view of the second cage half of FIG. 112;

FIG. 114 is a top view of the second cage half of FIG. 112;

FIG. 115 is a left side view of the second cage half of FIG. 112;

FIG. 116 is a right side view of the second cage half of FIG. 112;

FIG. 117 is a perspective view of a cage assembly of the exemplary roller assembly of FIG. 105, including the first and second cage halves interlocked;

Figure 56:
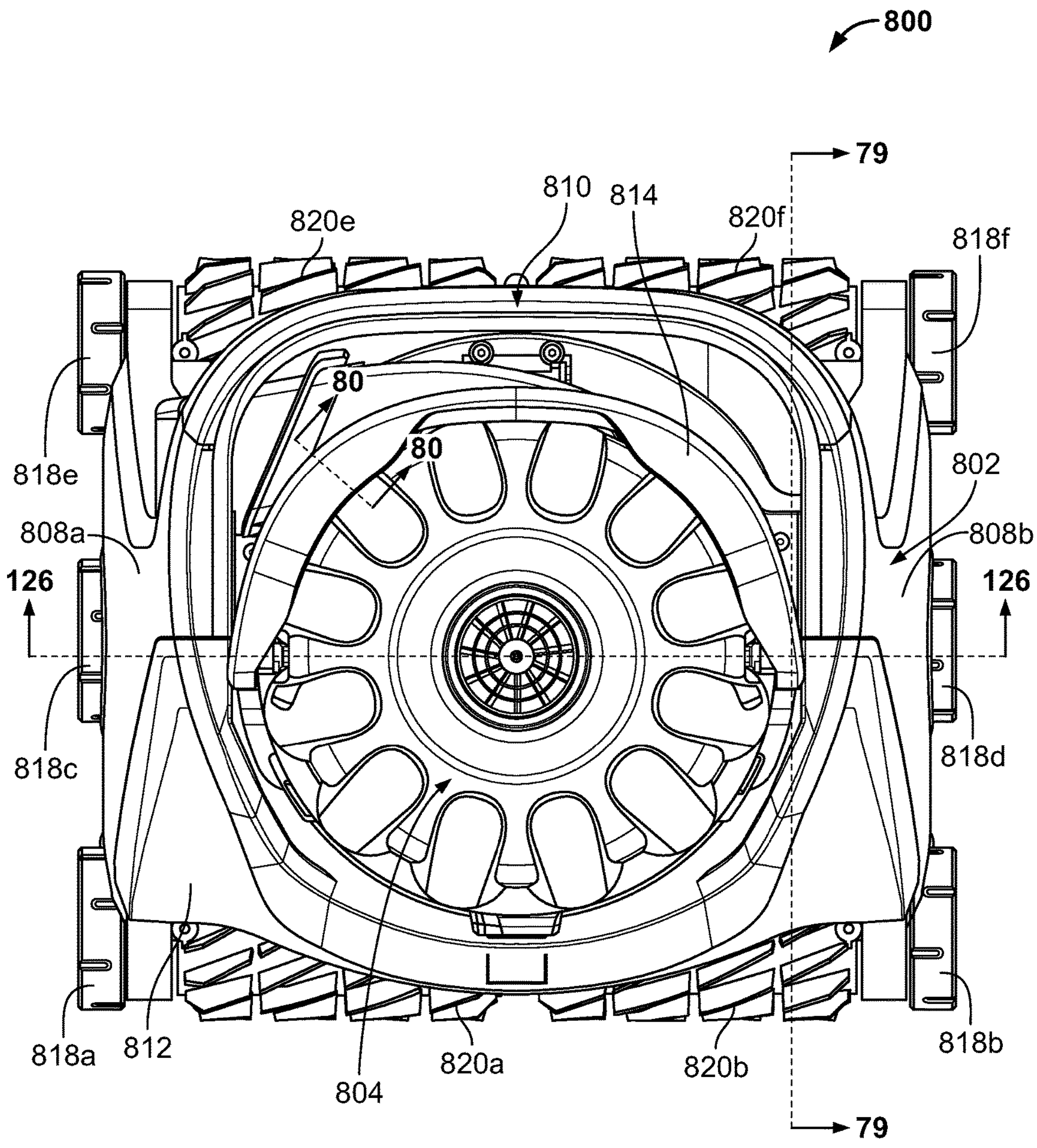
FIG. 56 is a top view of the fourth embodiment pool cleaner of FIG. 51.
Figure 105:
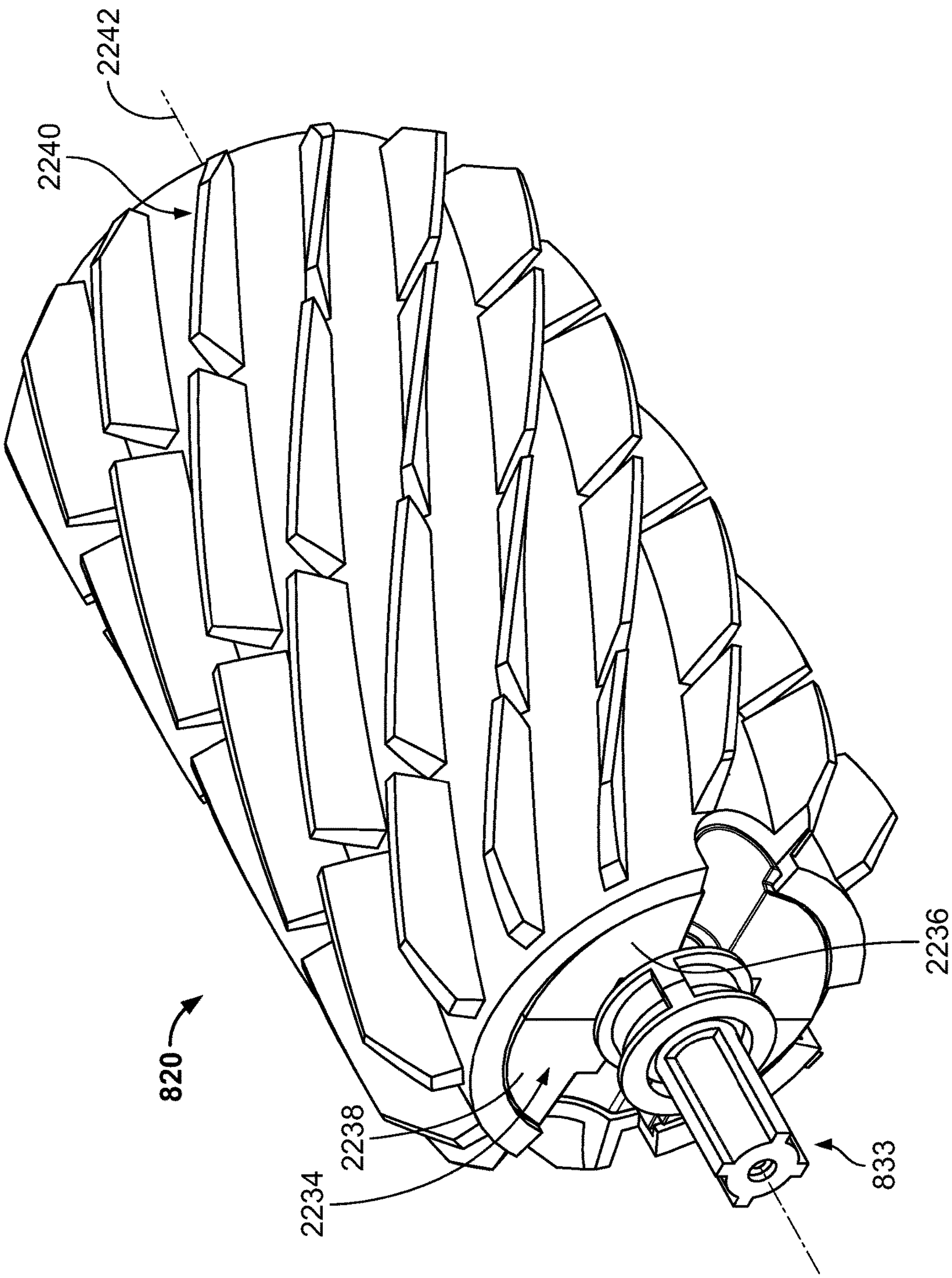
FIG. 105 is a perspective view of an exemplary roller assembly including a first cage half, a second cage half, a roller cover, and a roller mount in accordance with embodiments of the present disclosure.
Figure 117:
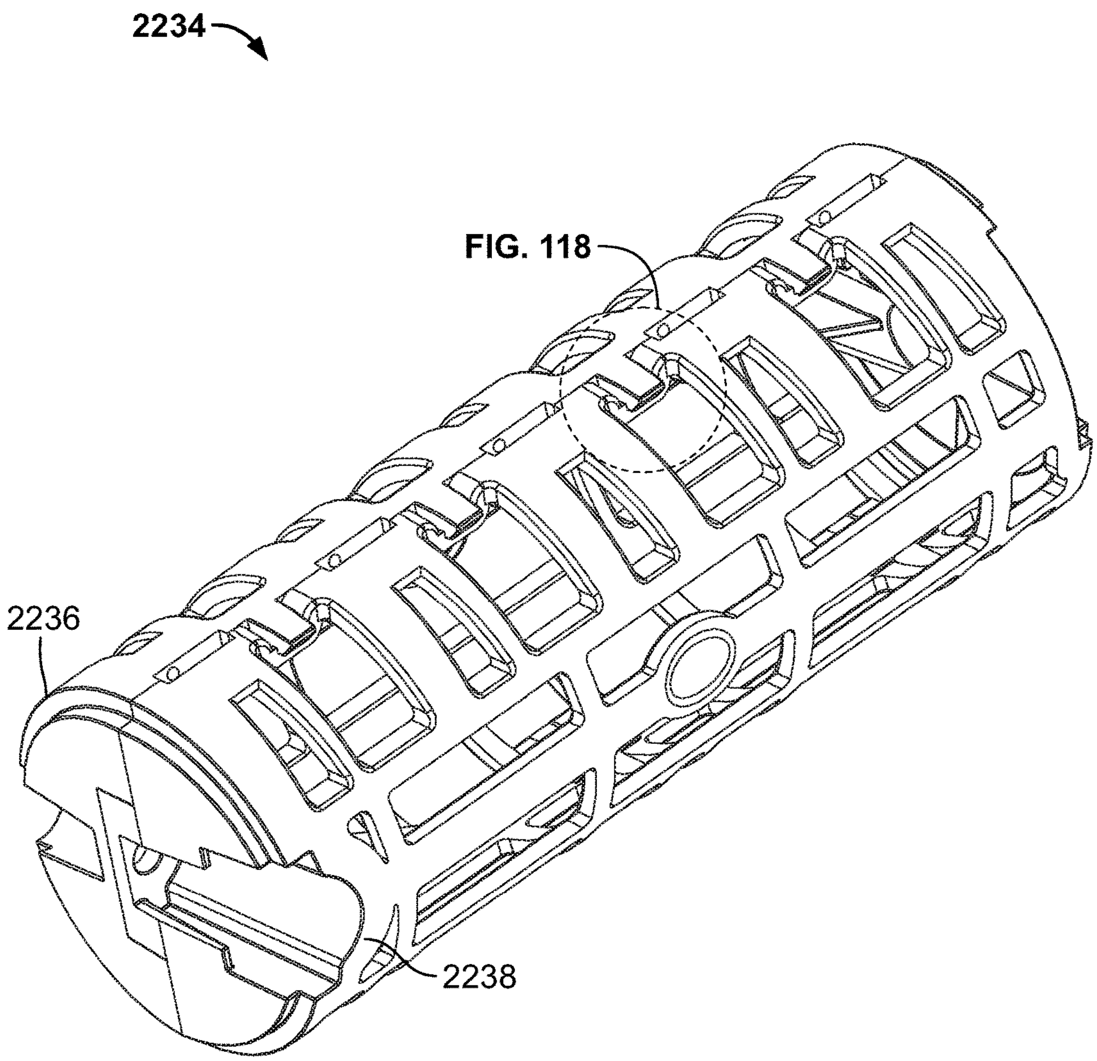
Figure 118:
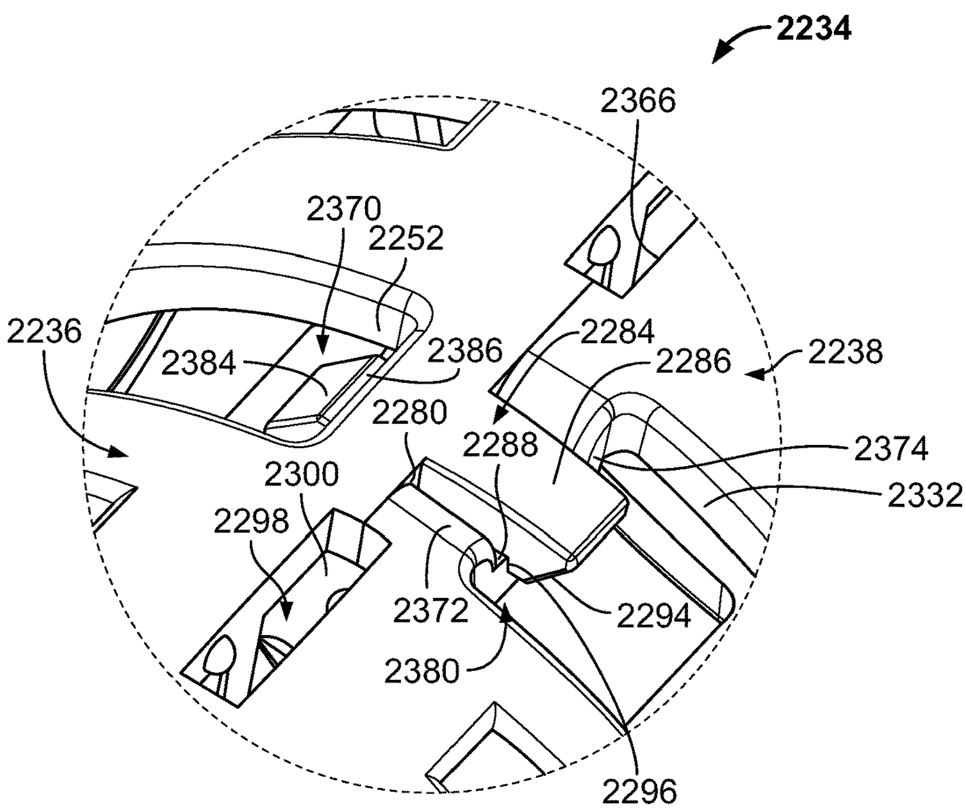
Figure 119:
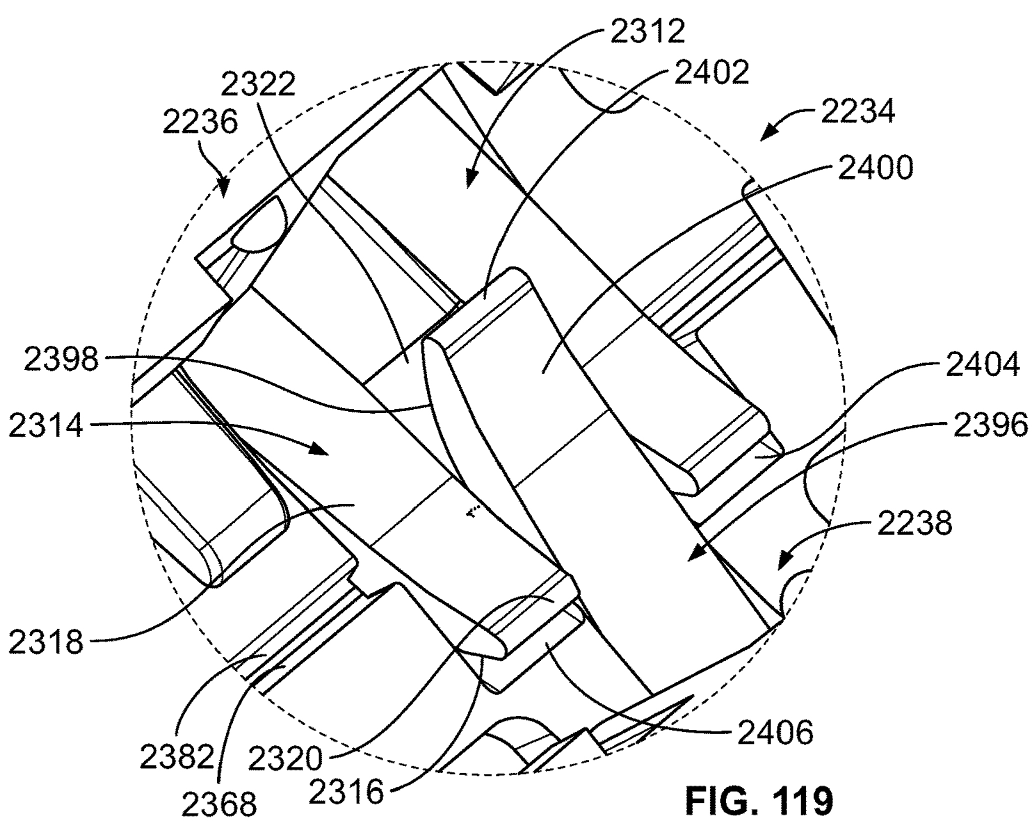
Figure 120:
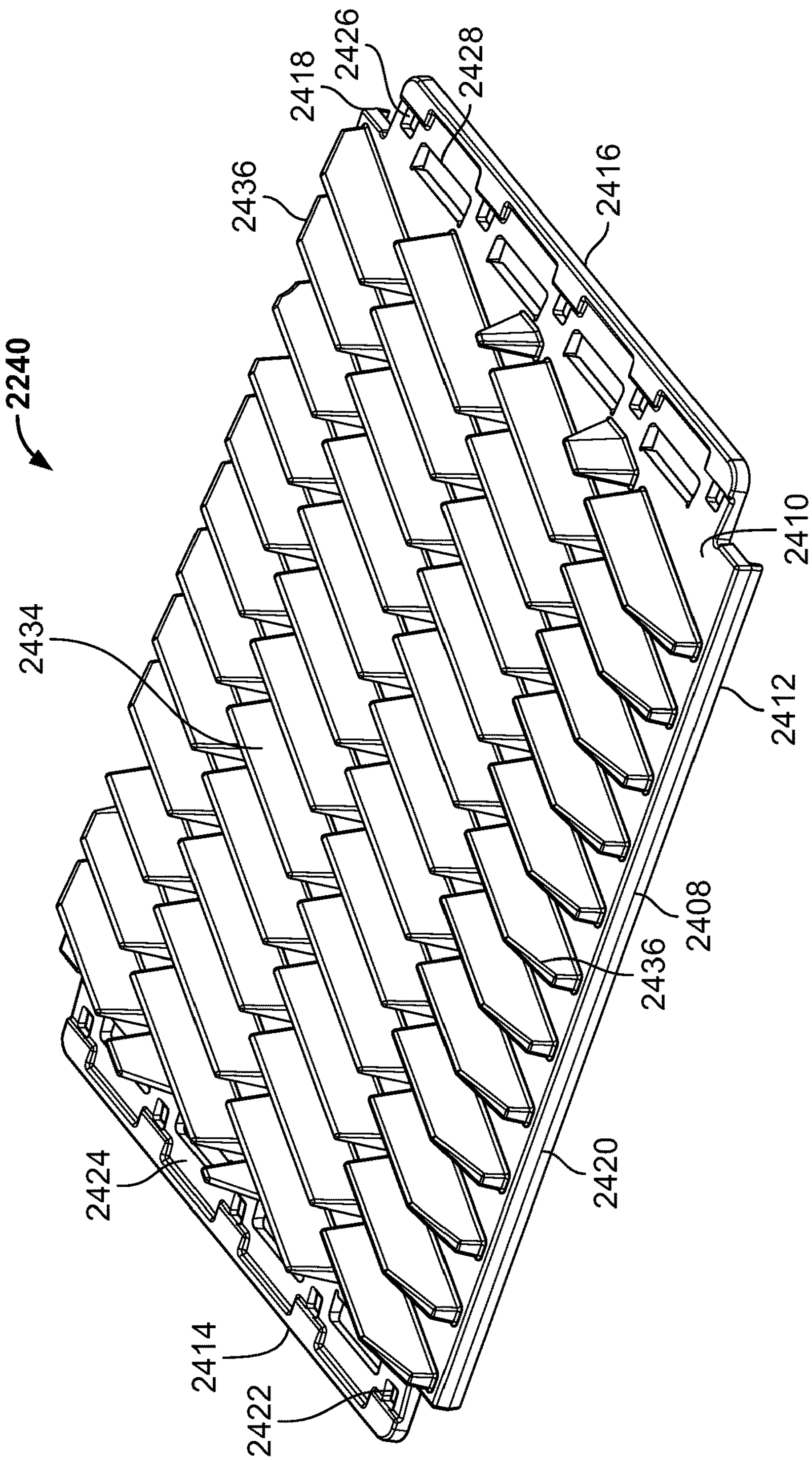
Figure 121:
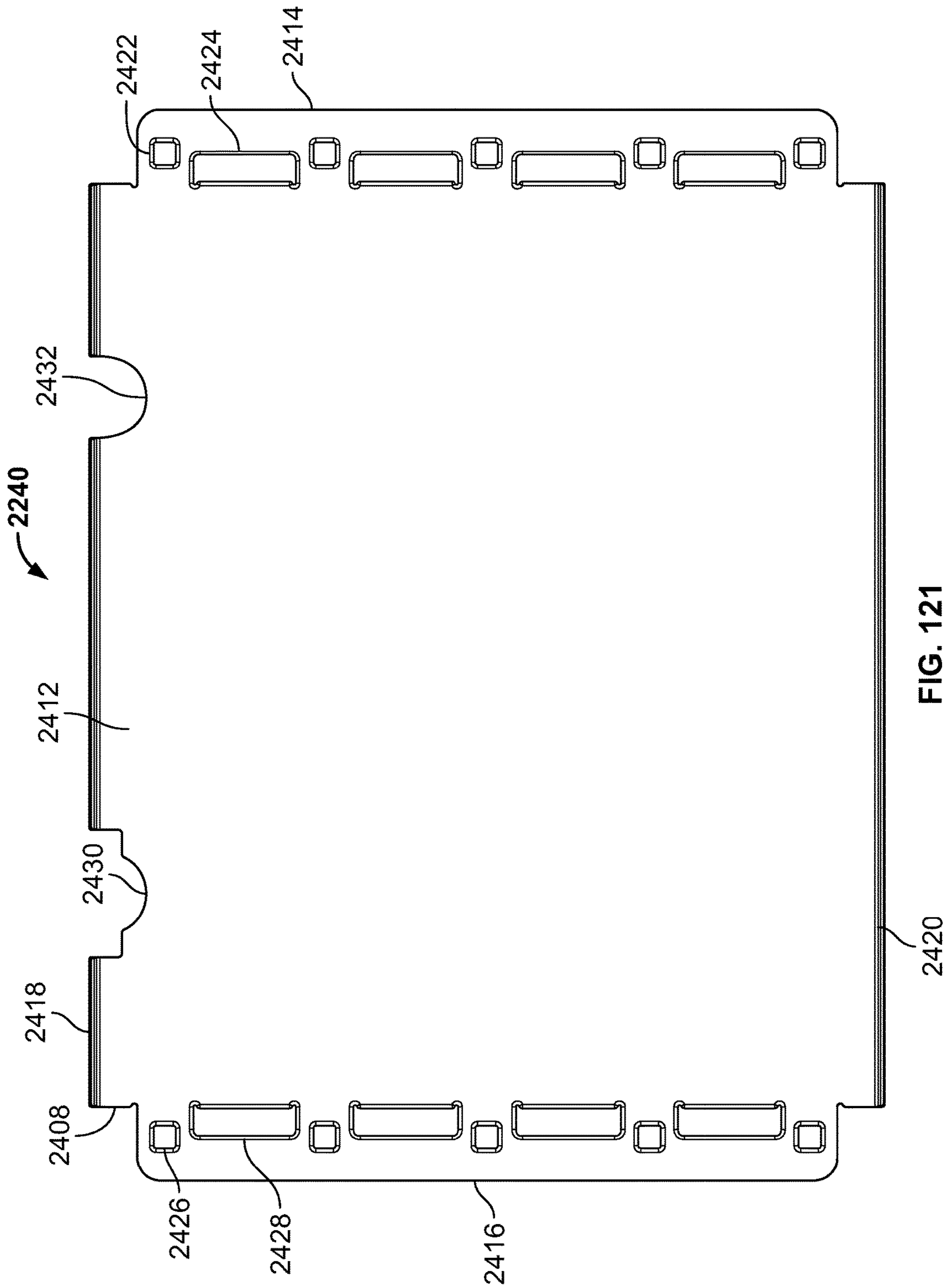
Figure 122:
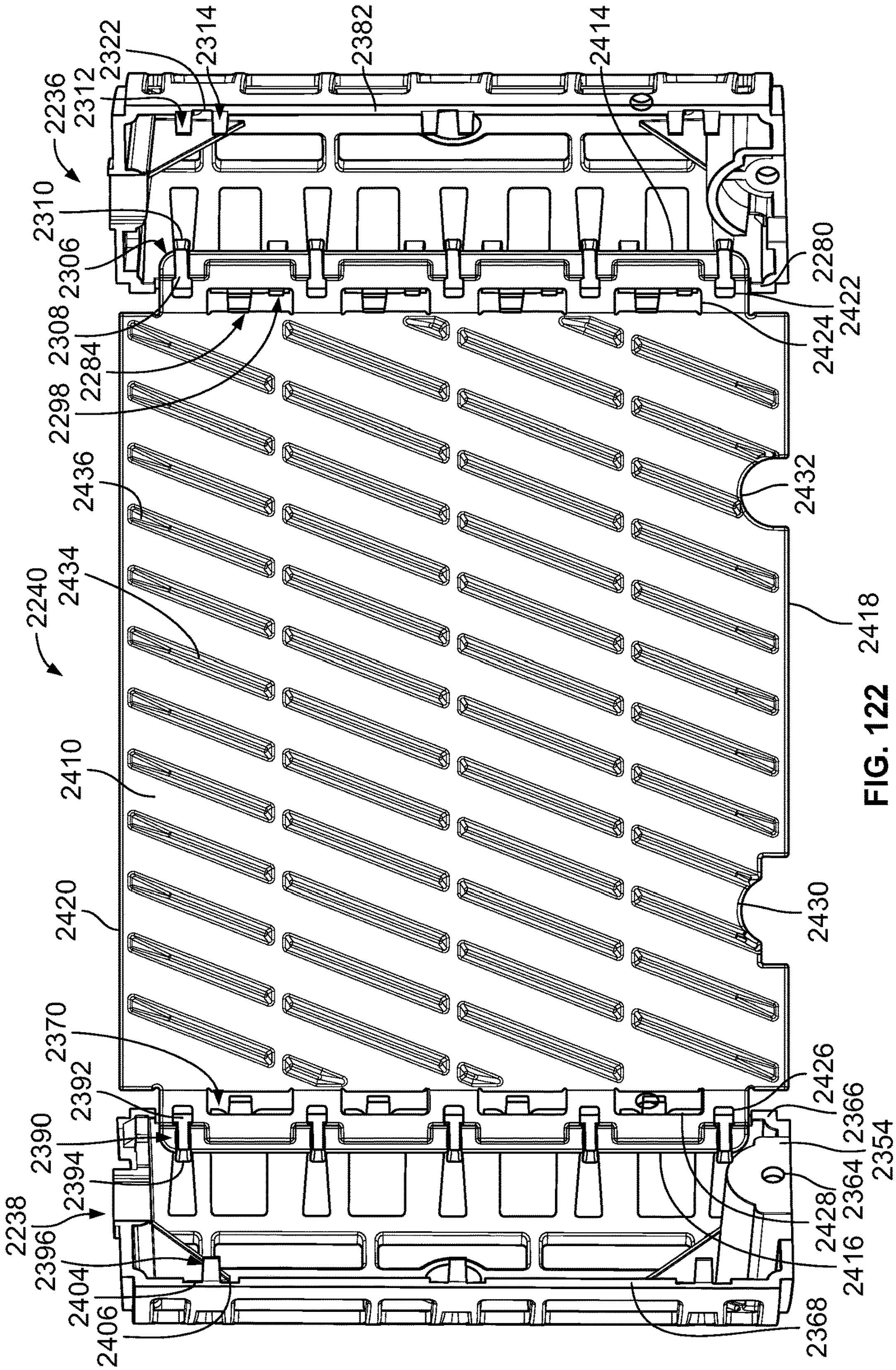
Figure 123:
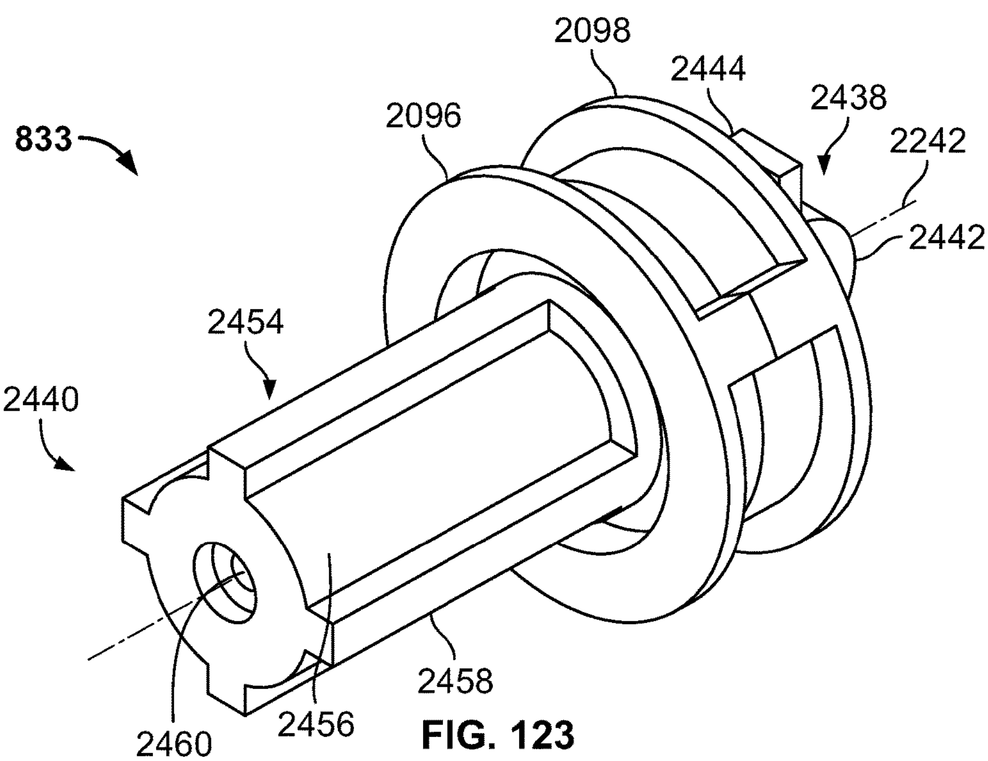
Figure 124:
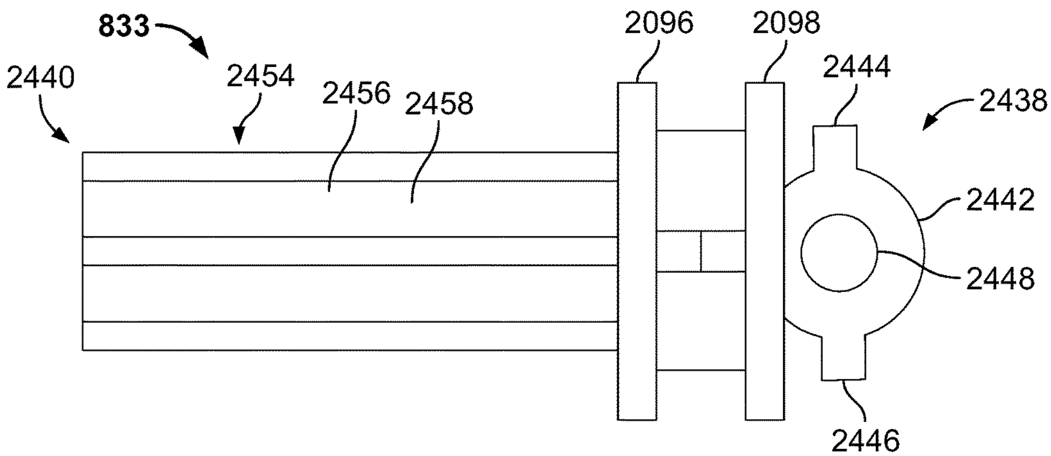
Figure 125:
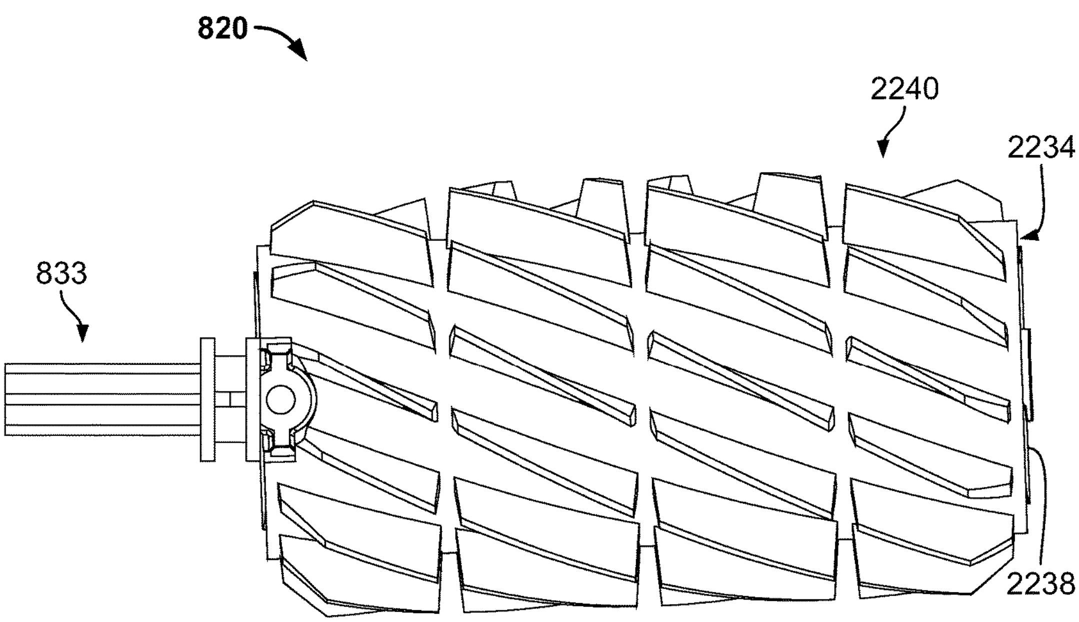
Figure 126:
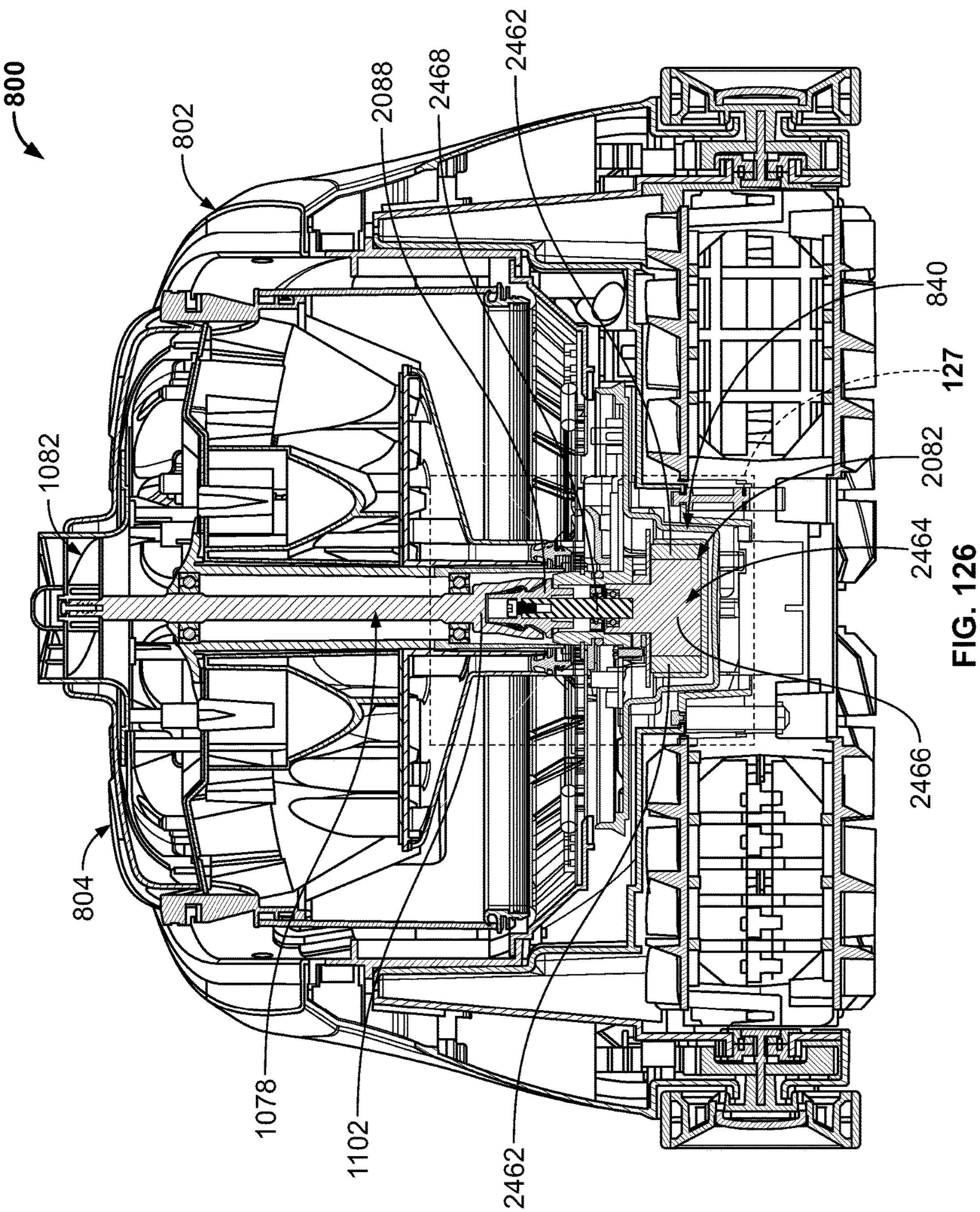
Figure 127:
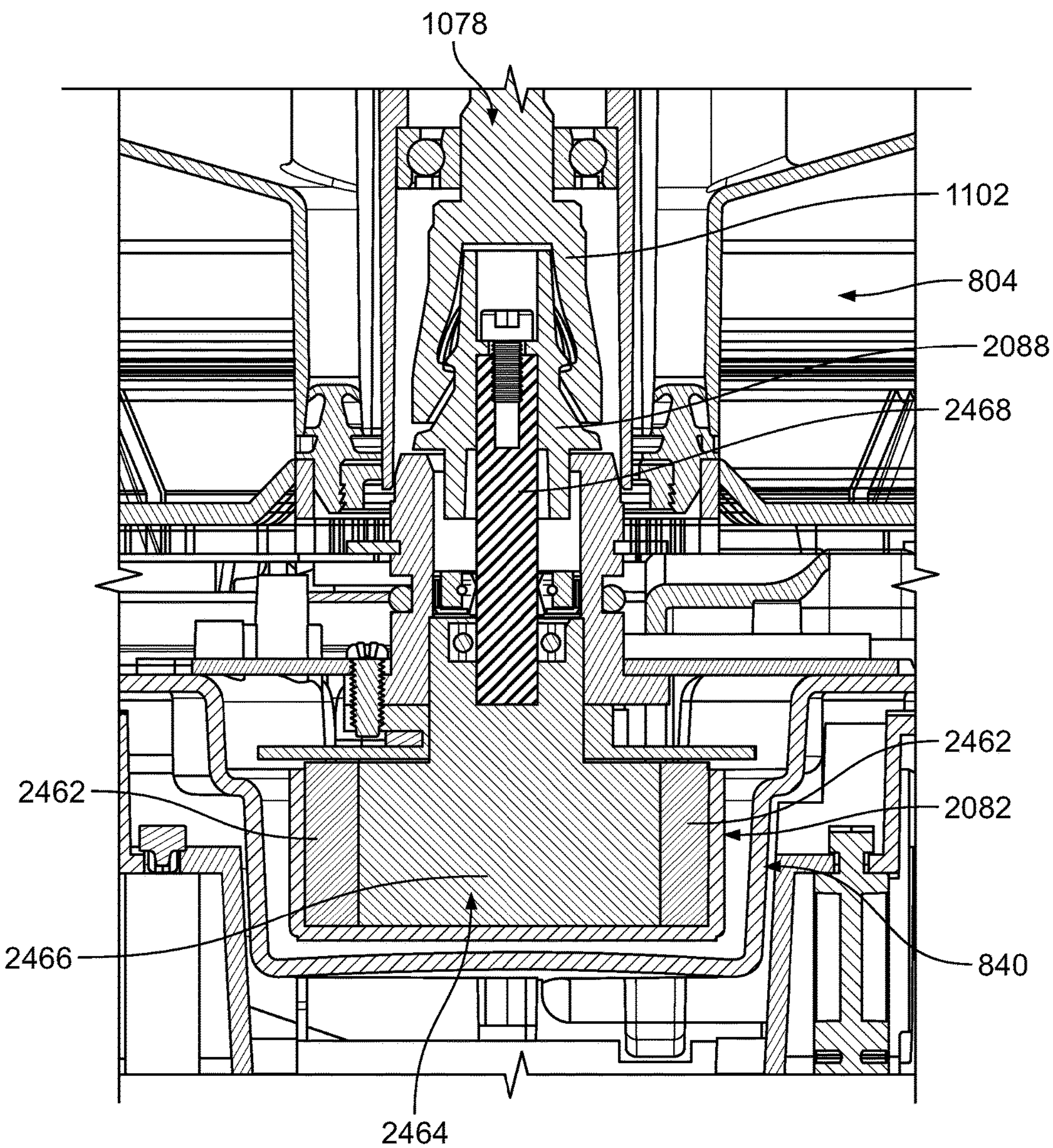
Figure 128:
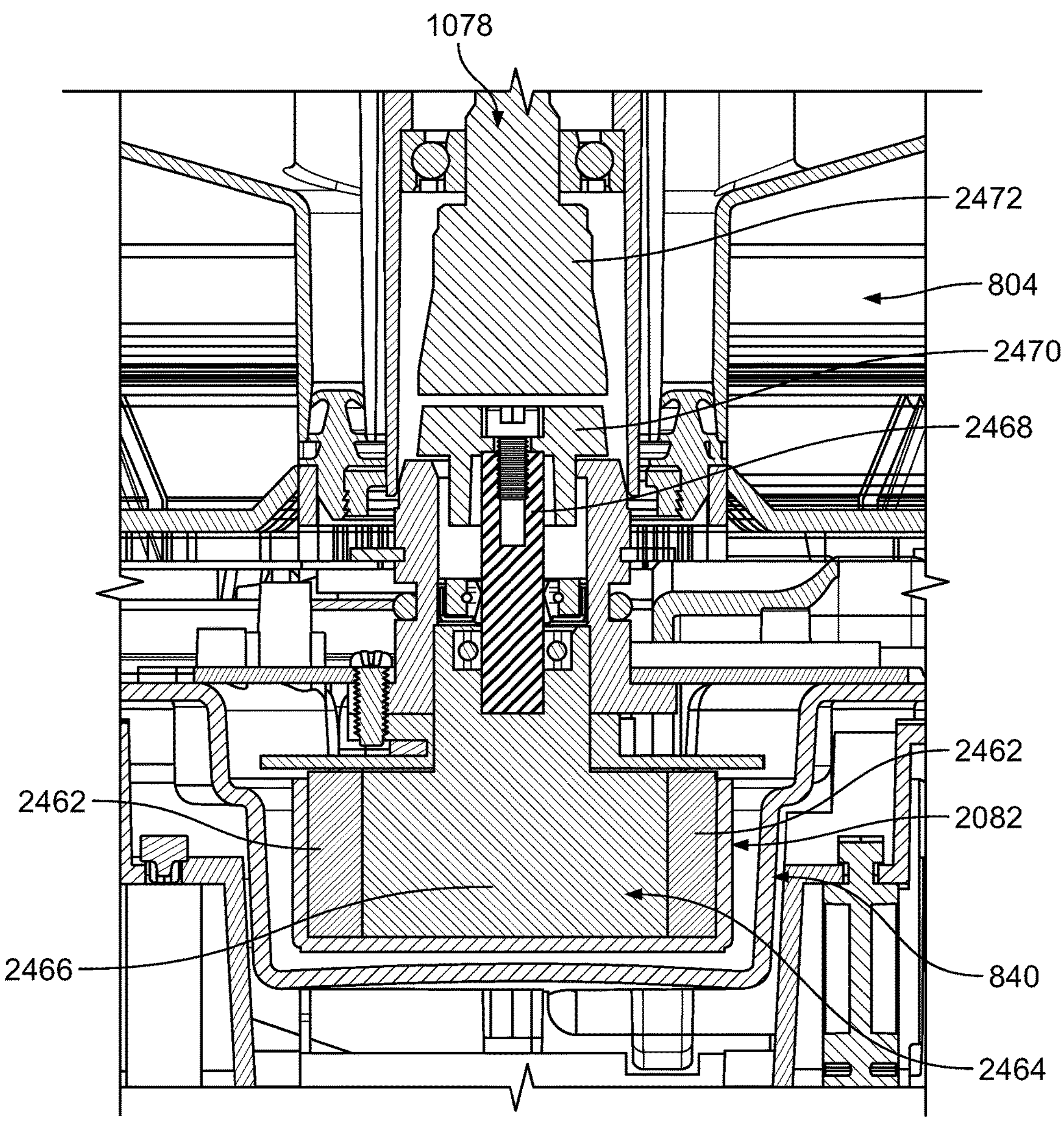
Figure 129:
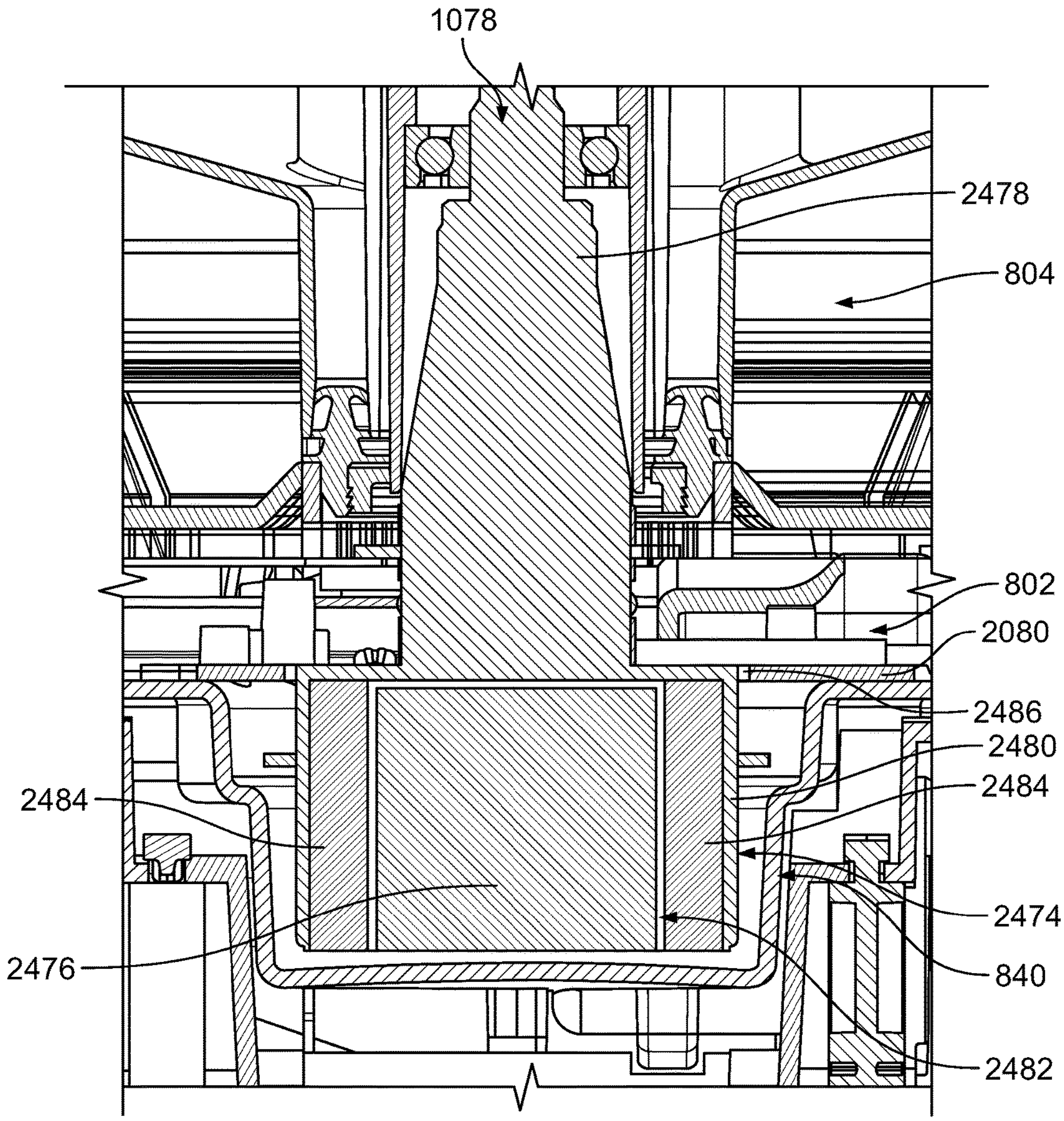
Figure 130:
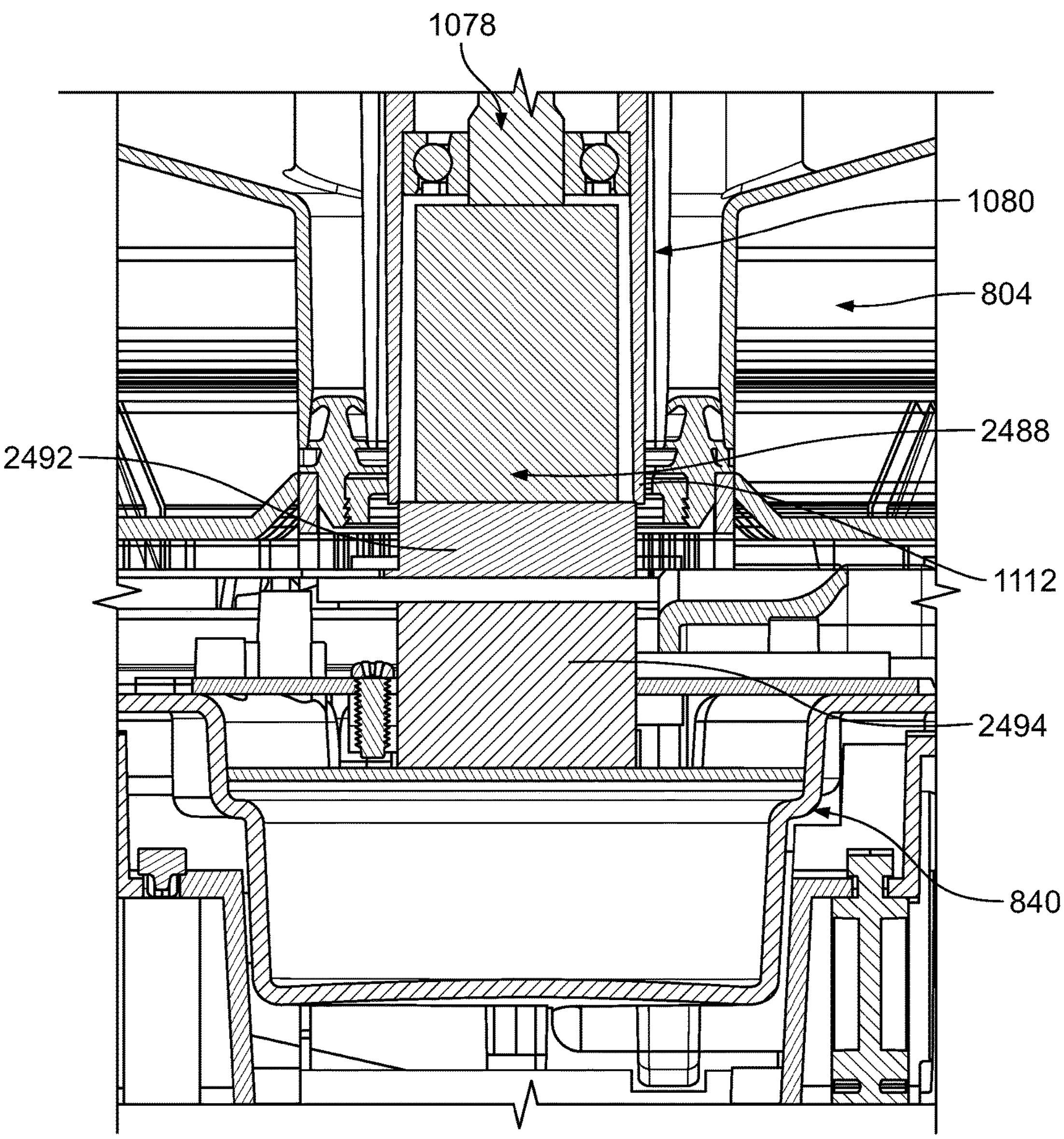
Figure 131:
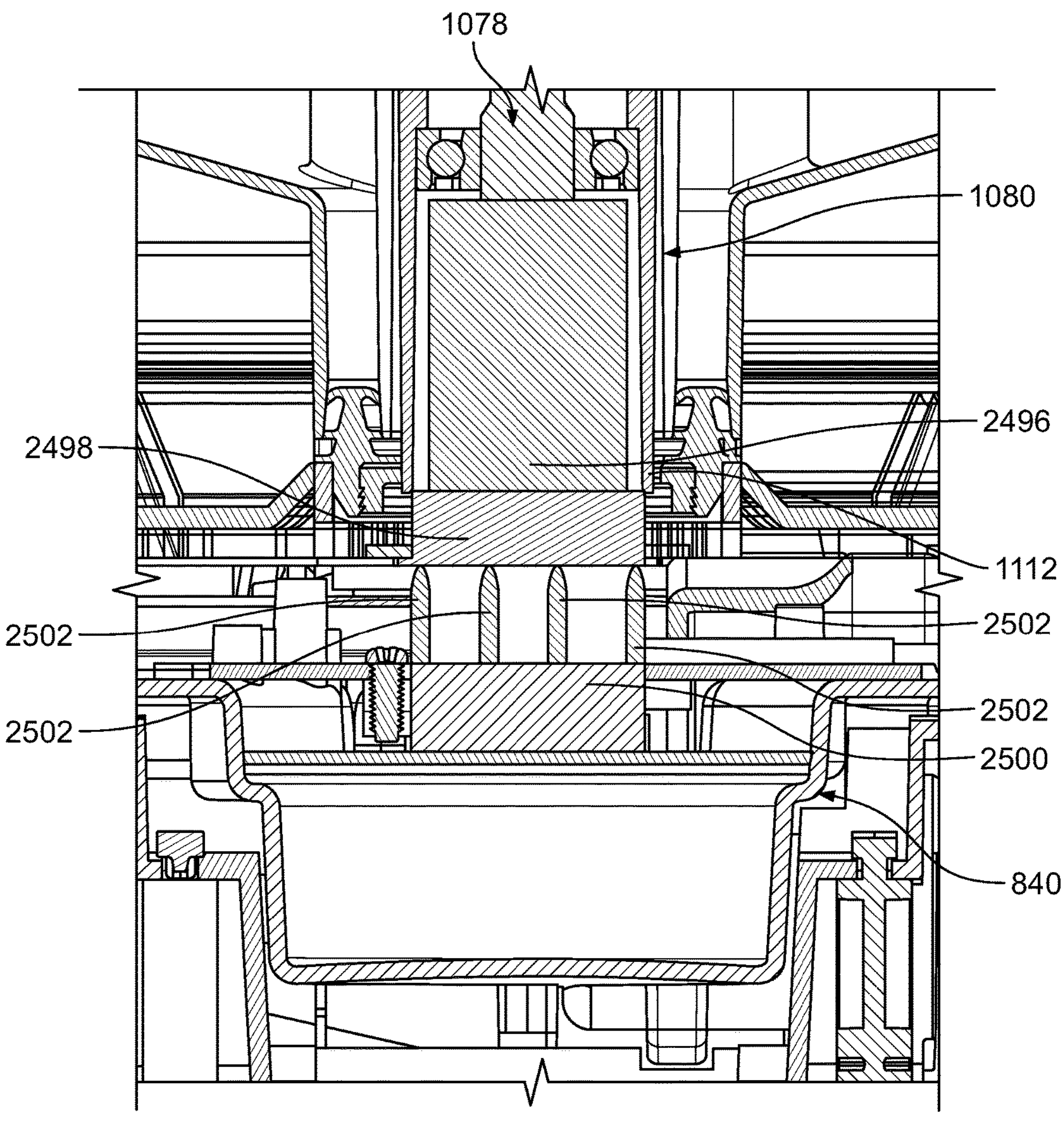
Figure 132:
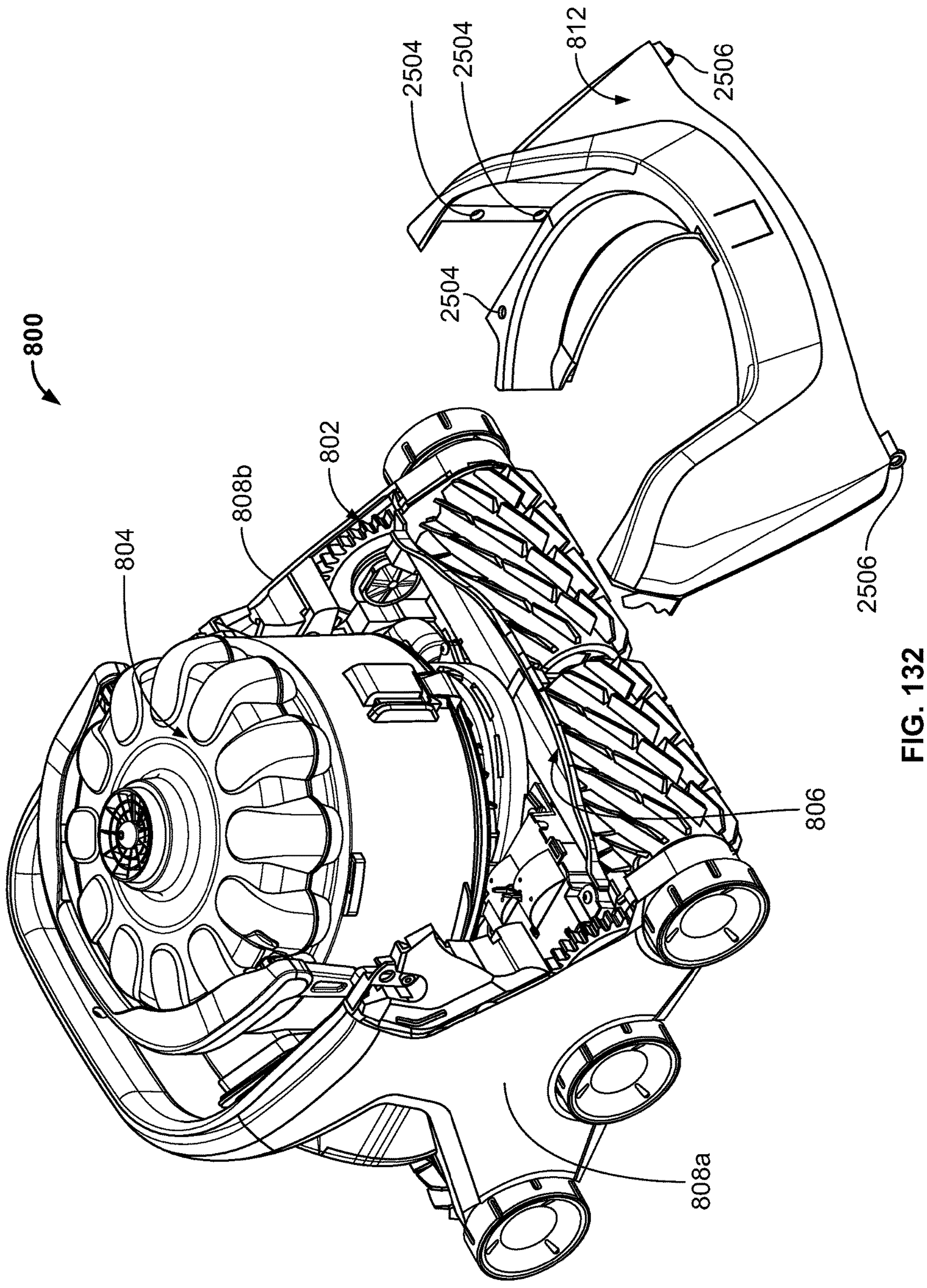
Figure 133:
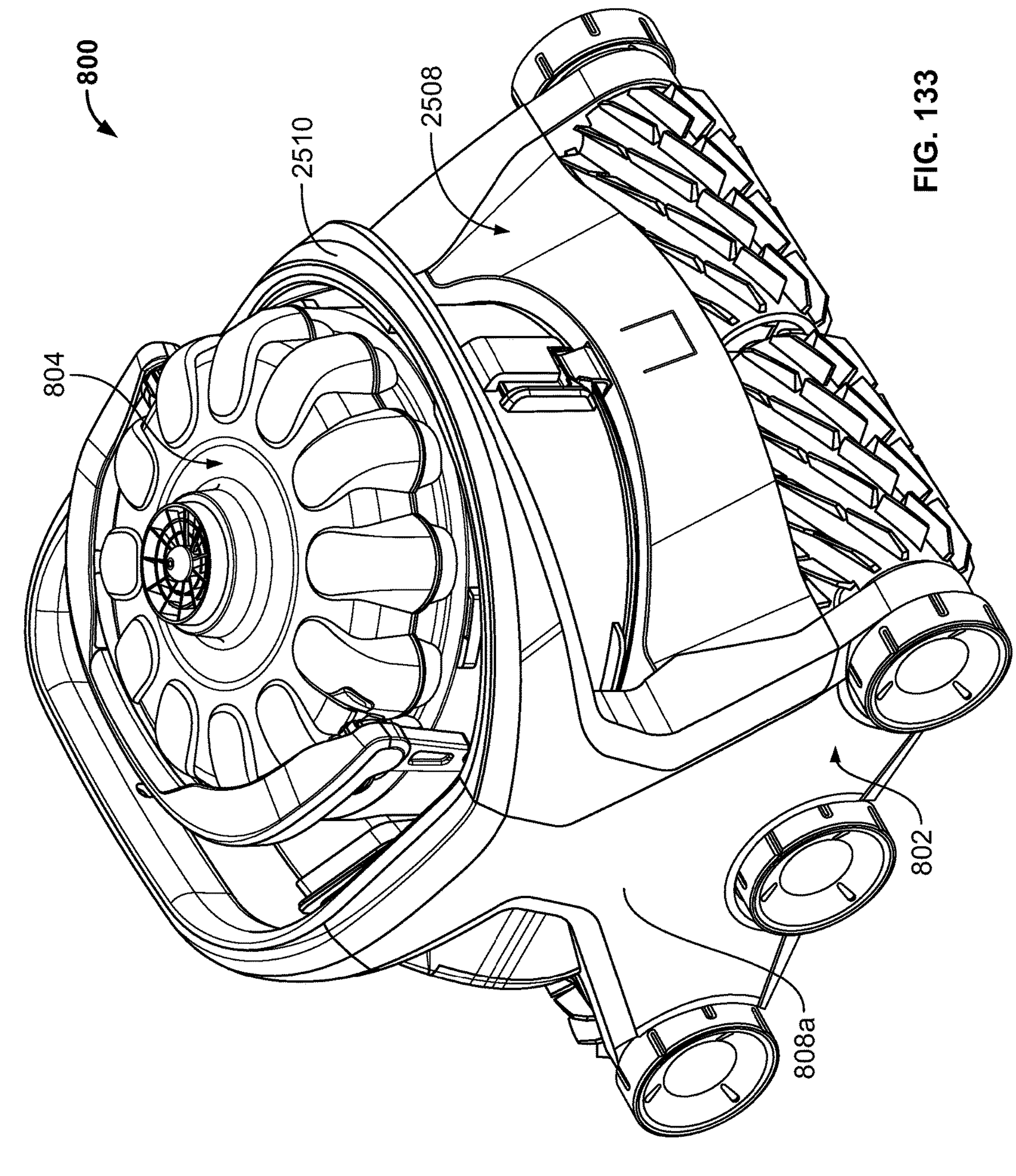
Figure 134:
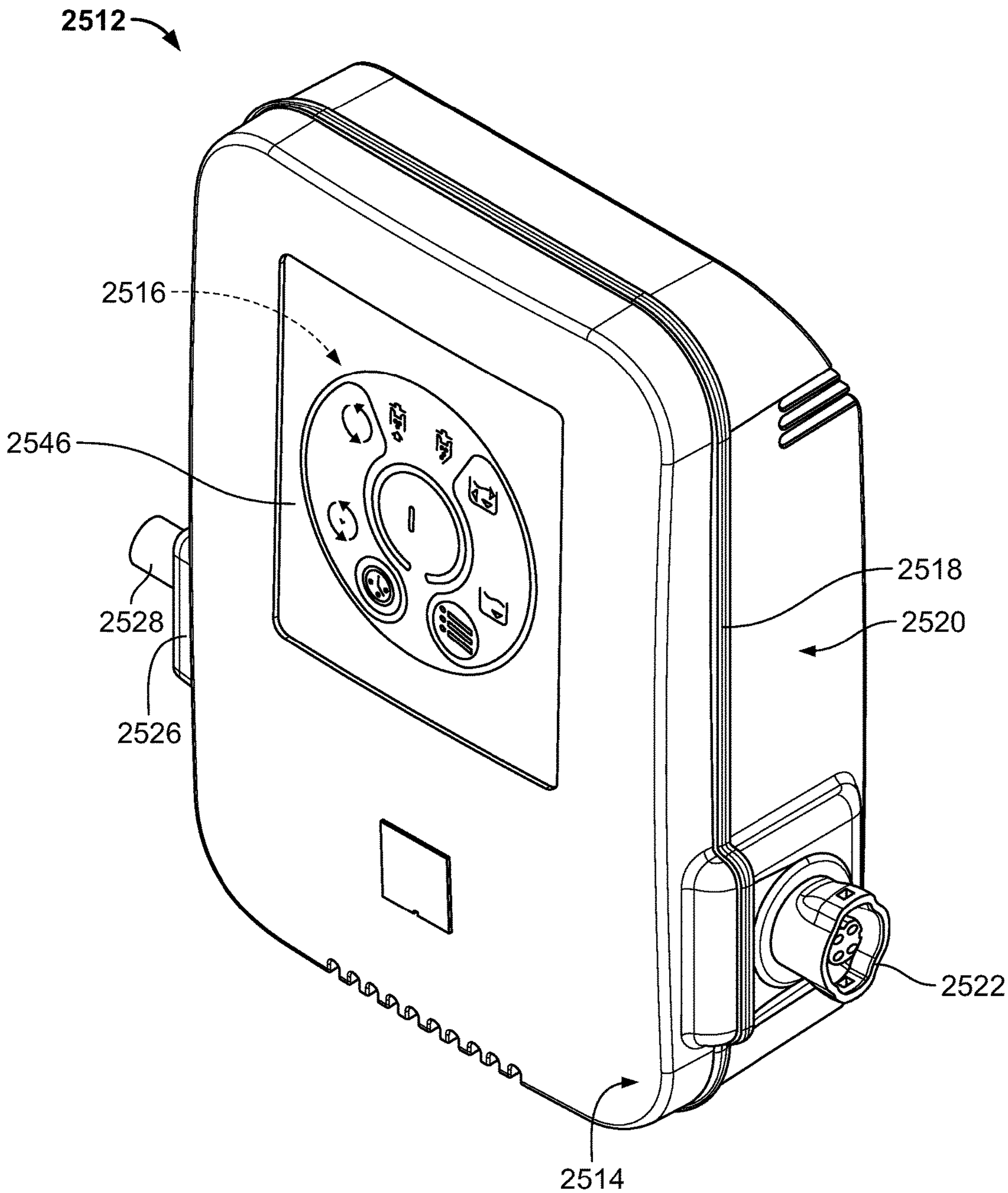
Figure 135:
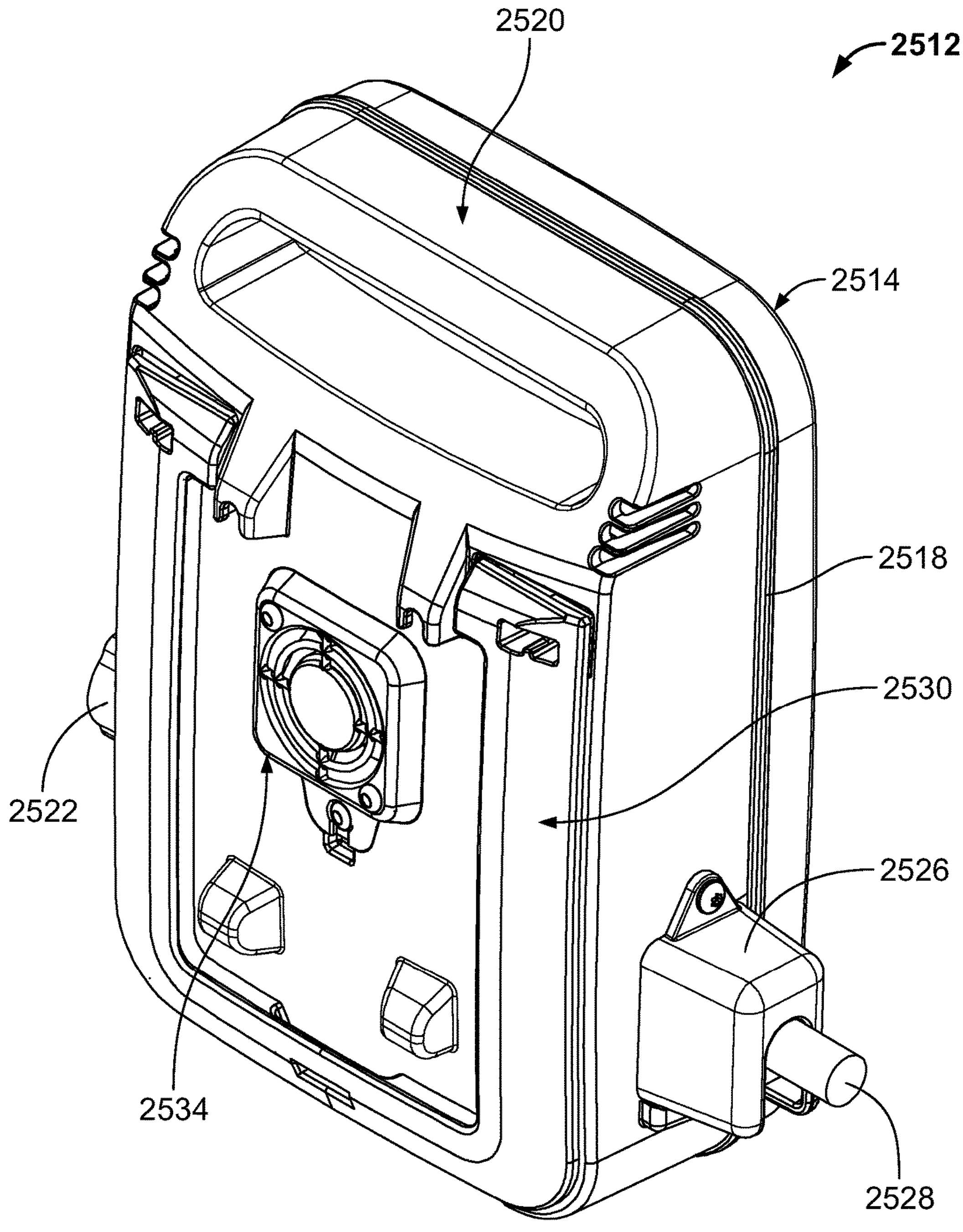
Figure 136:
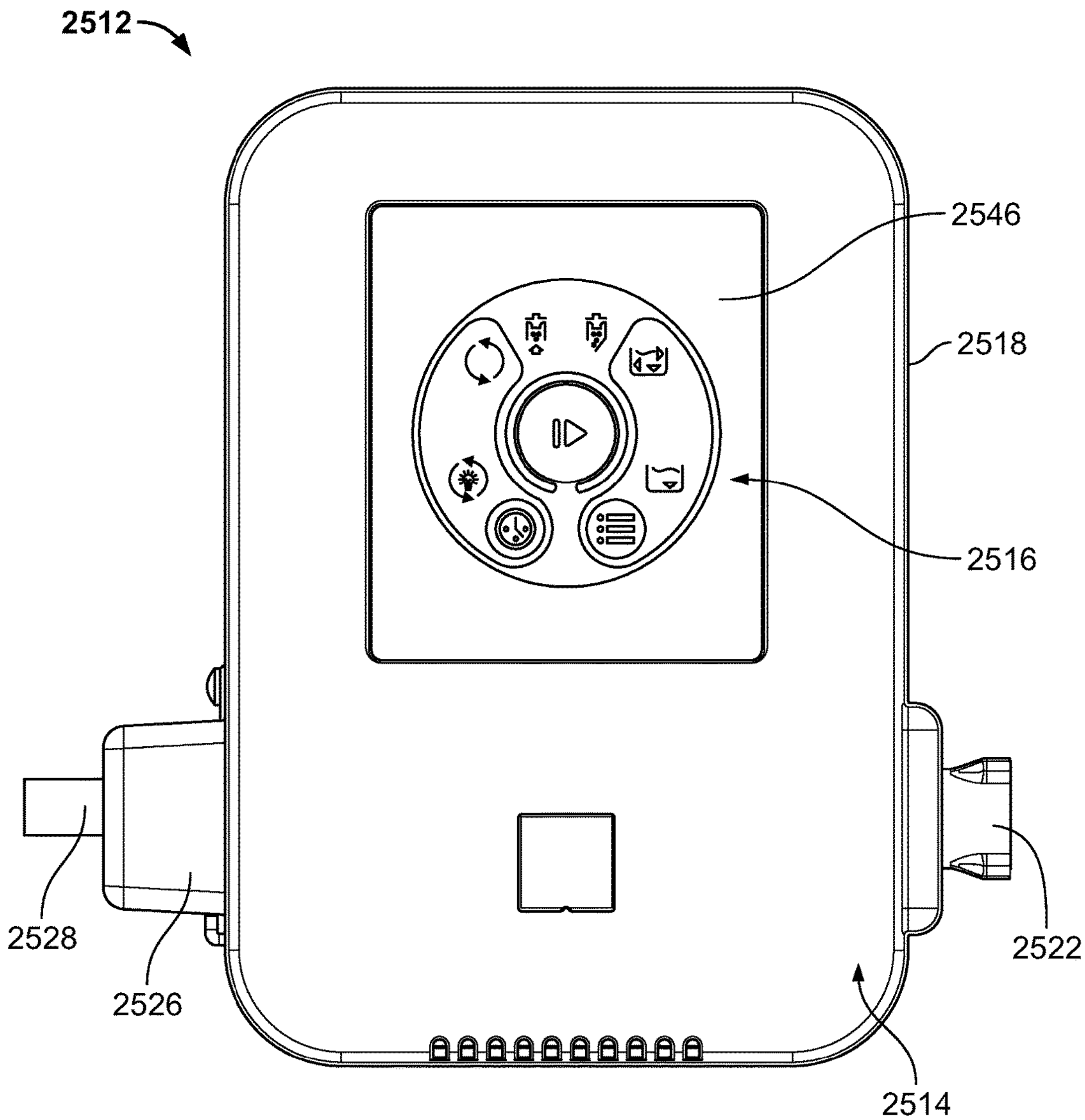
Figure 137:
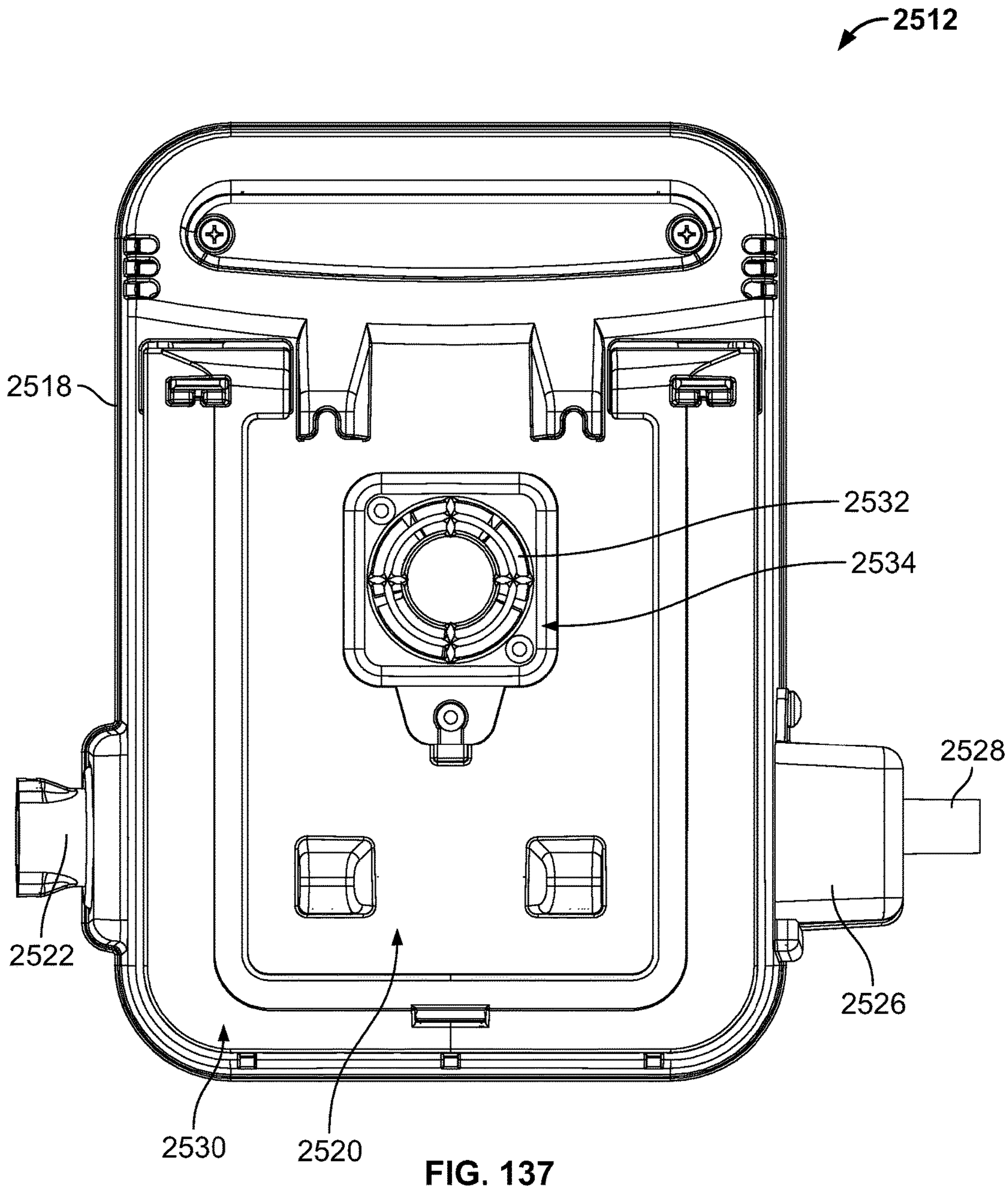
Figure 138:
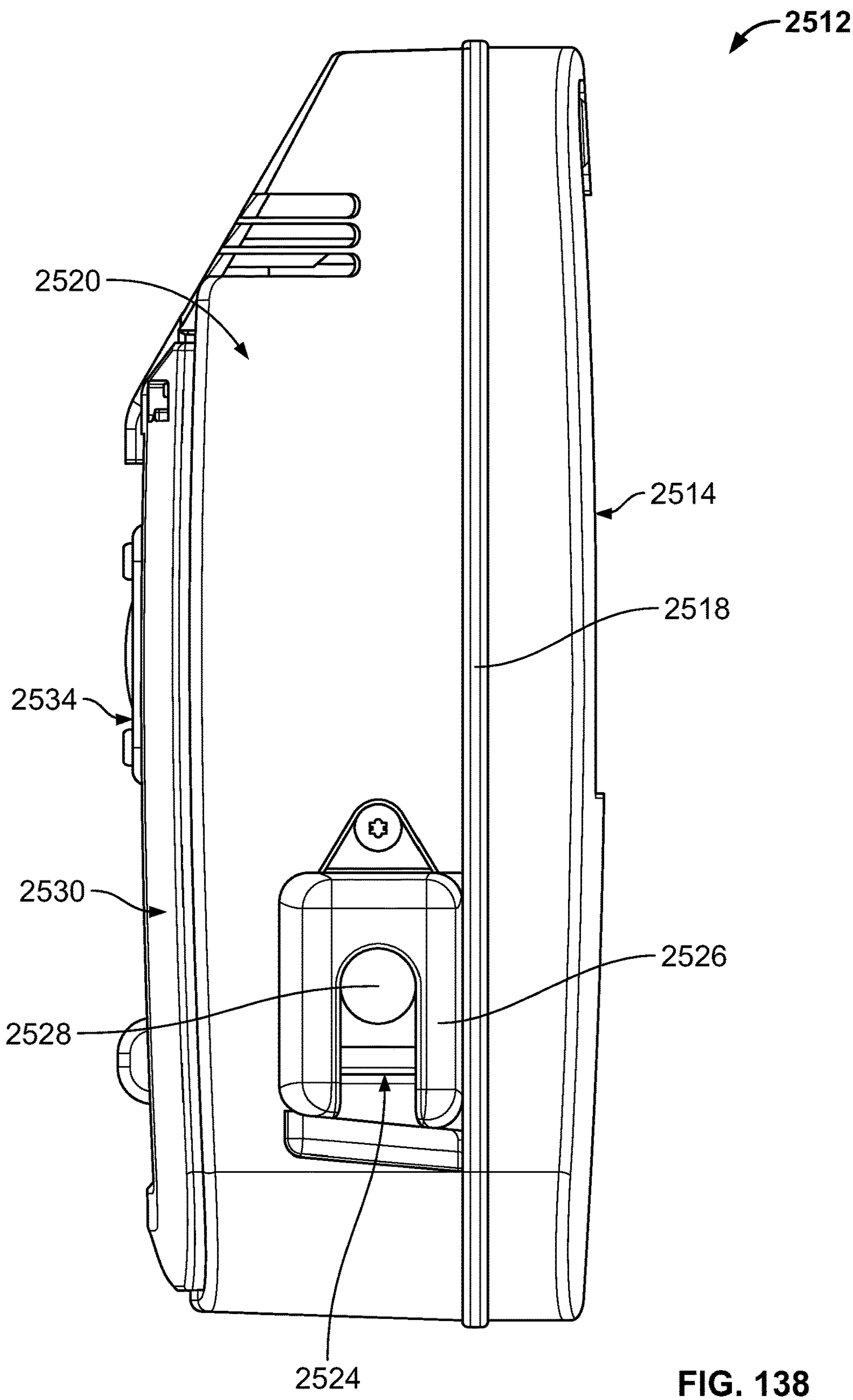
Figure 139:
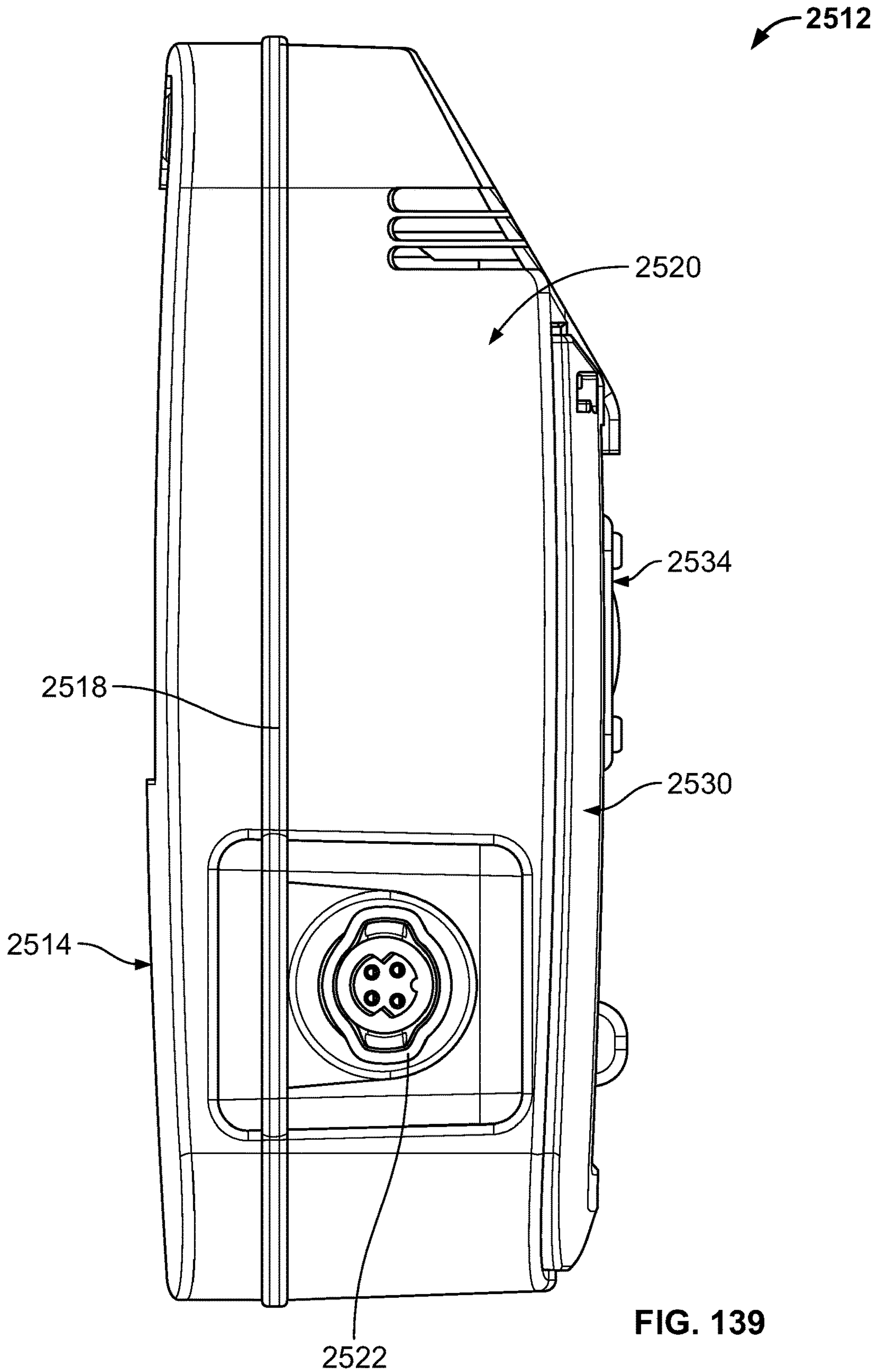
Figure 140:
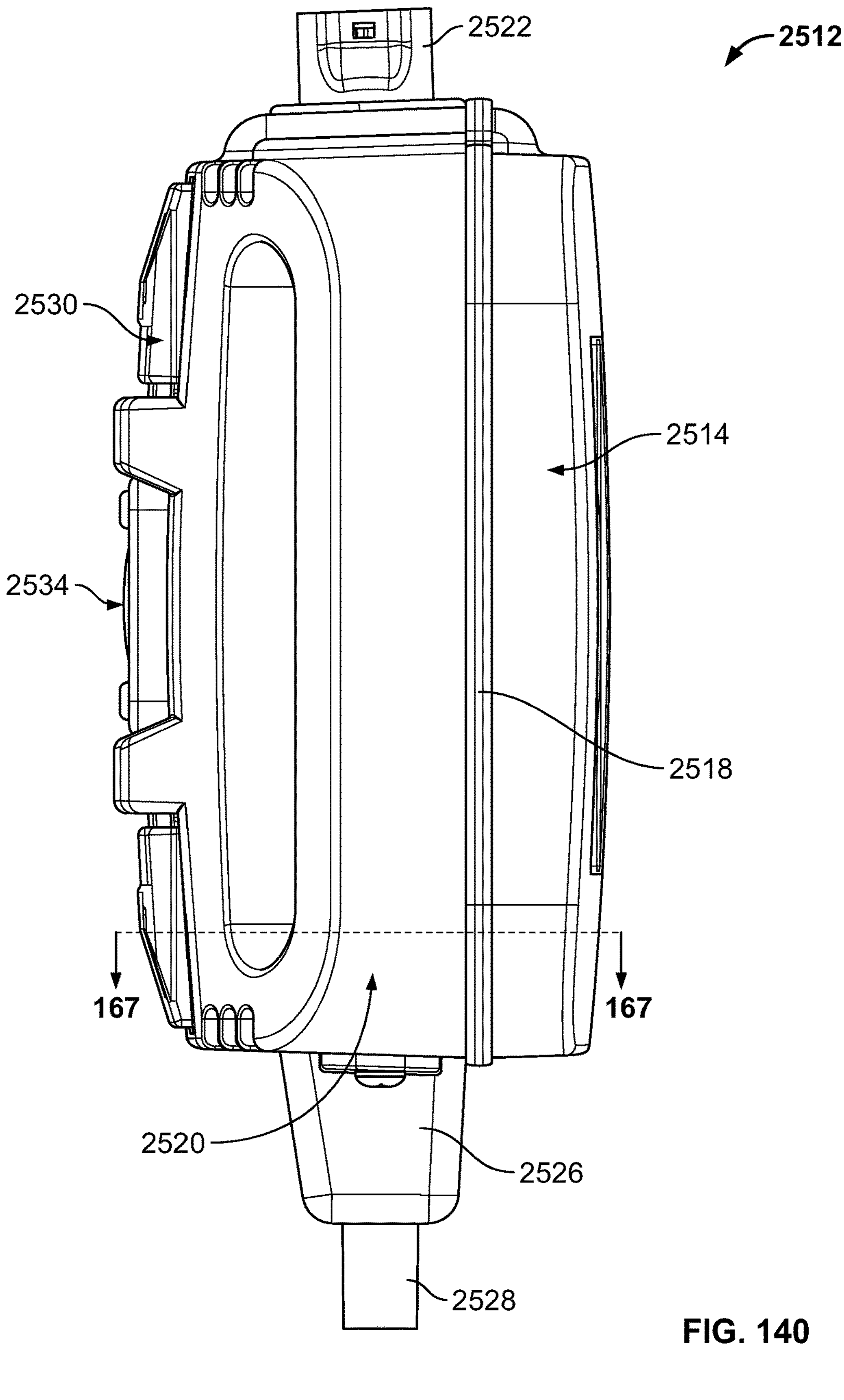
Figure 141:
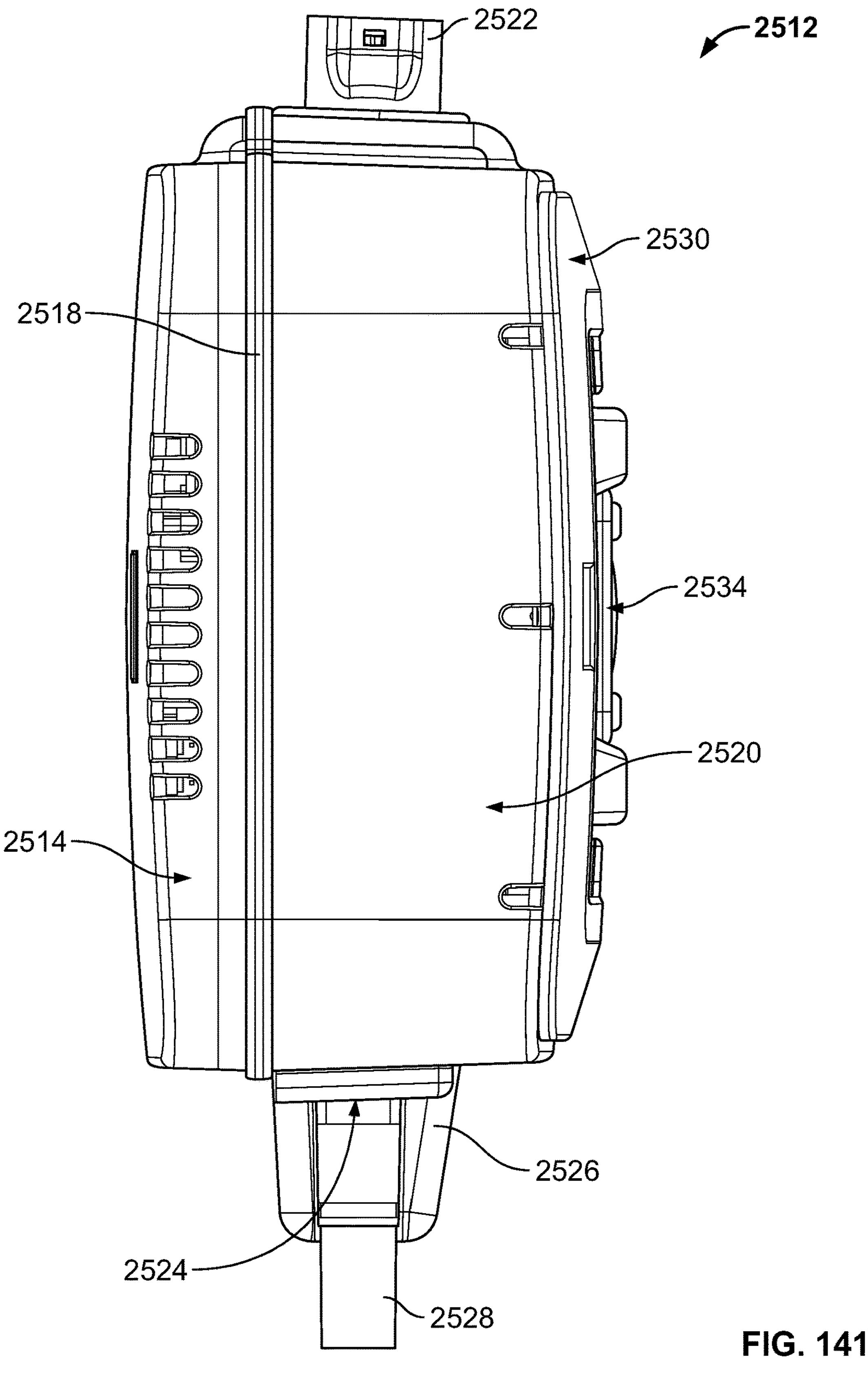
Figure 142:
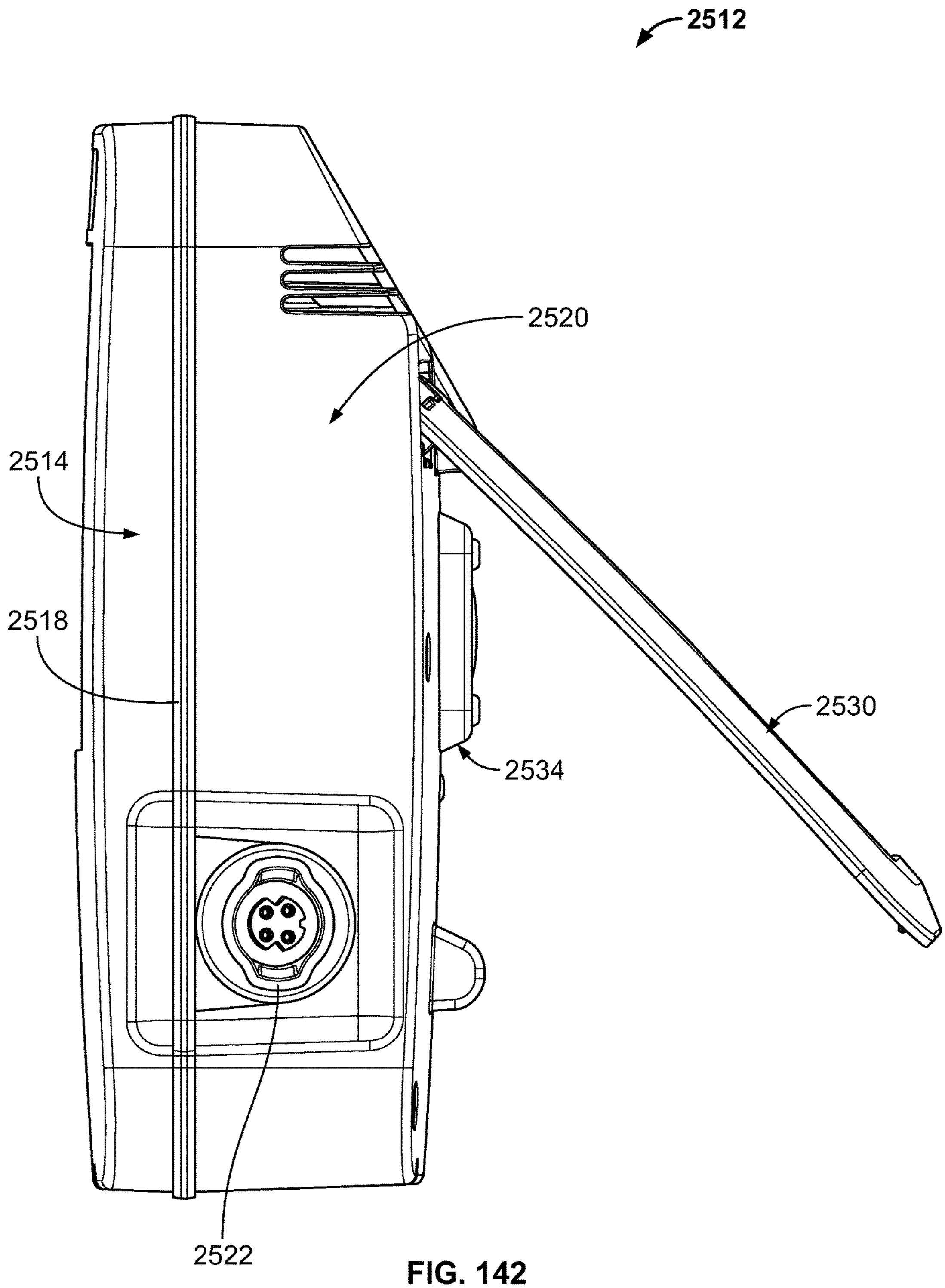
Figure 143:
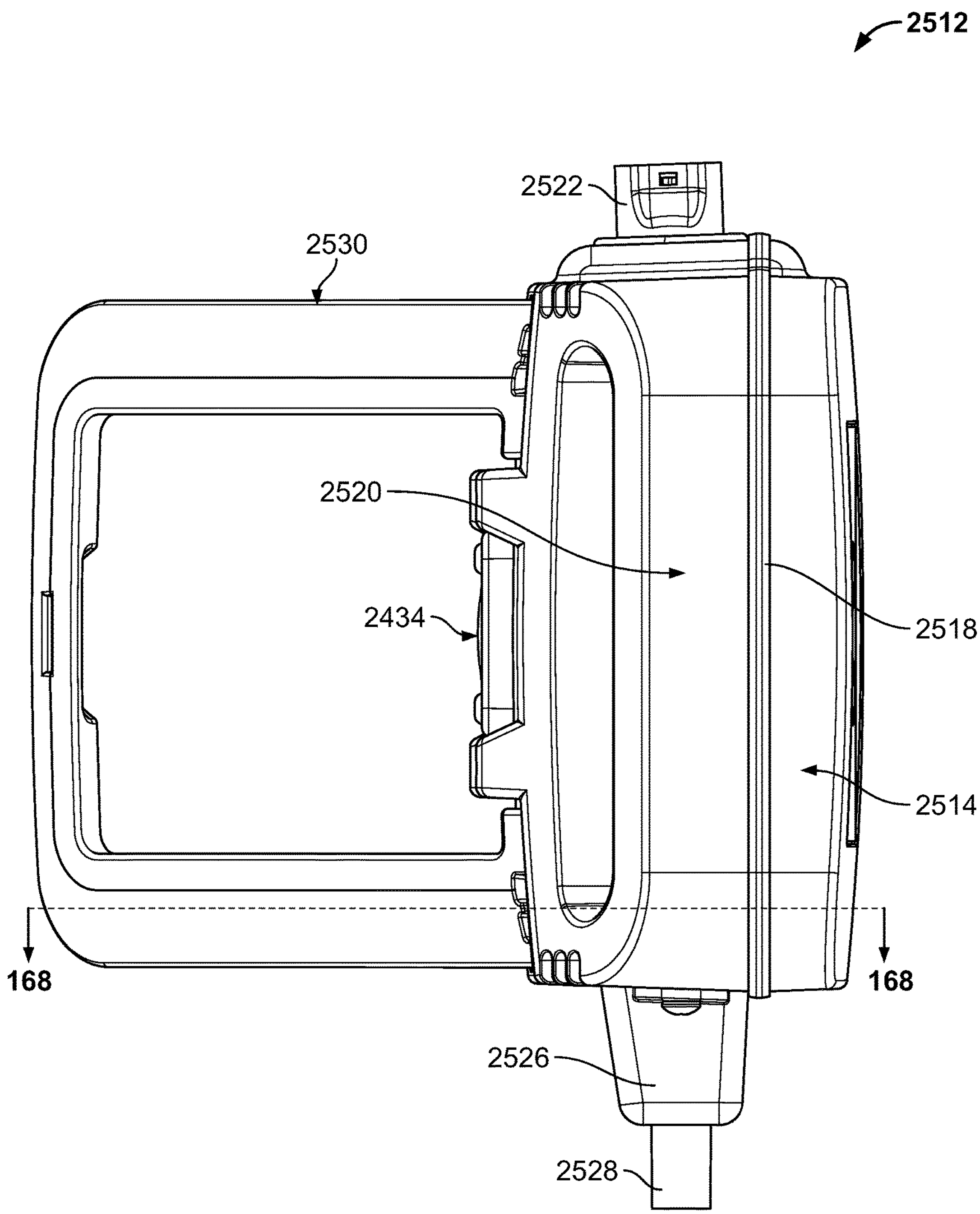
Figure 144:
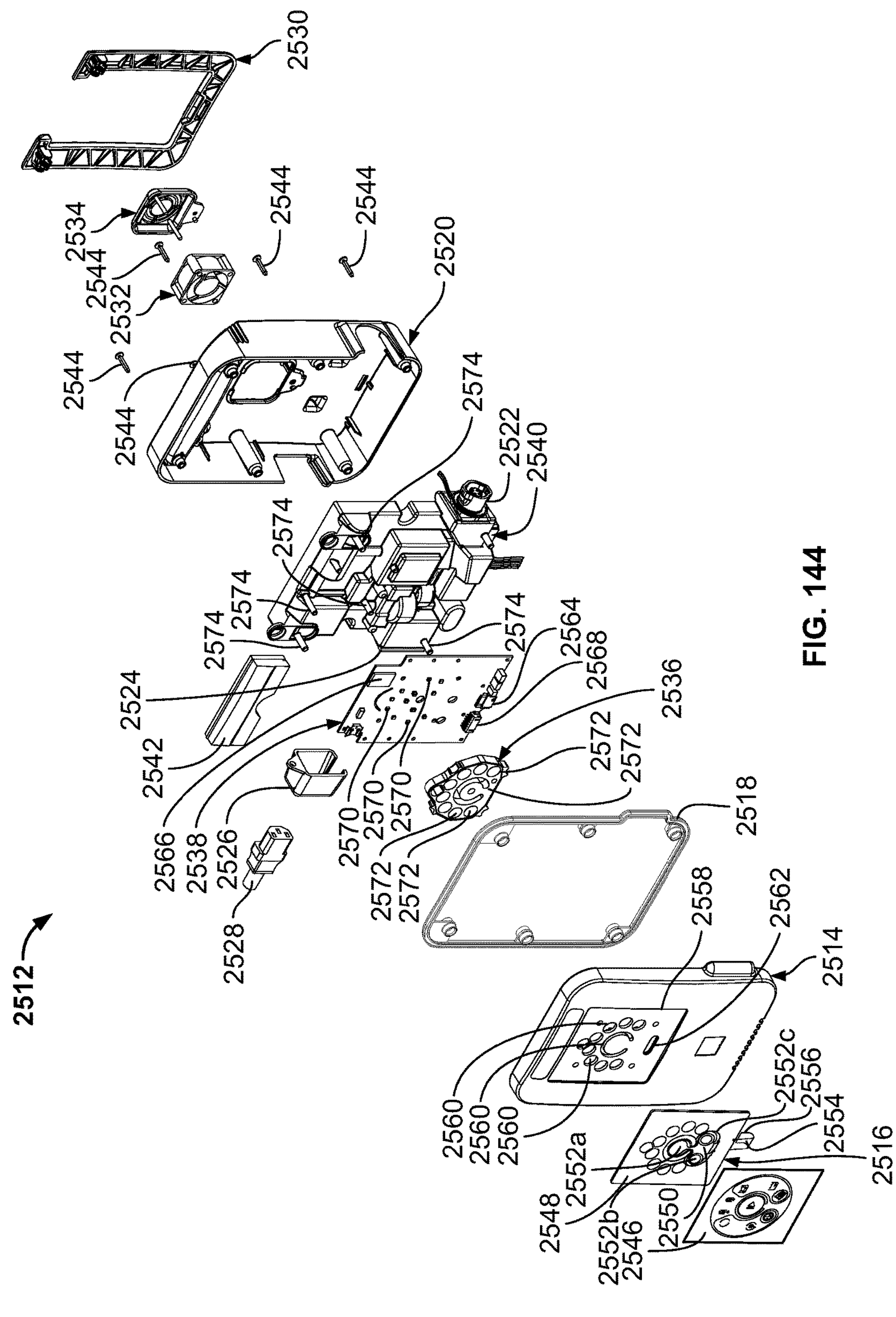
Figure 145:
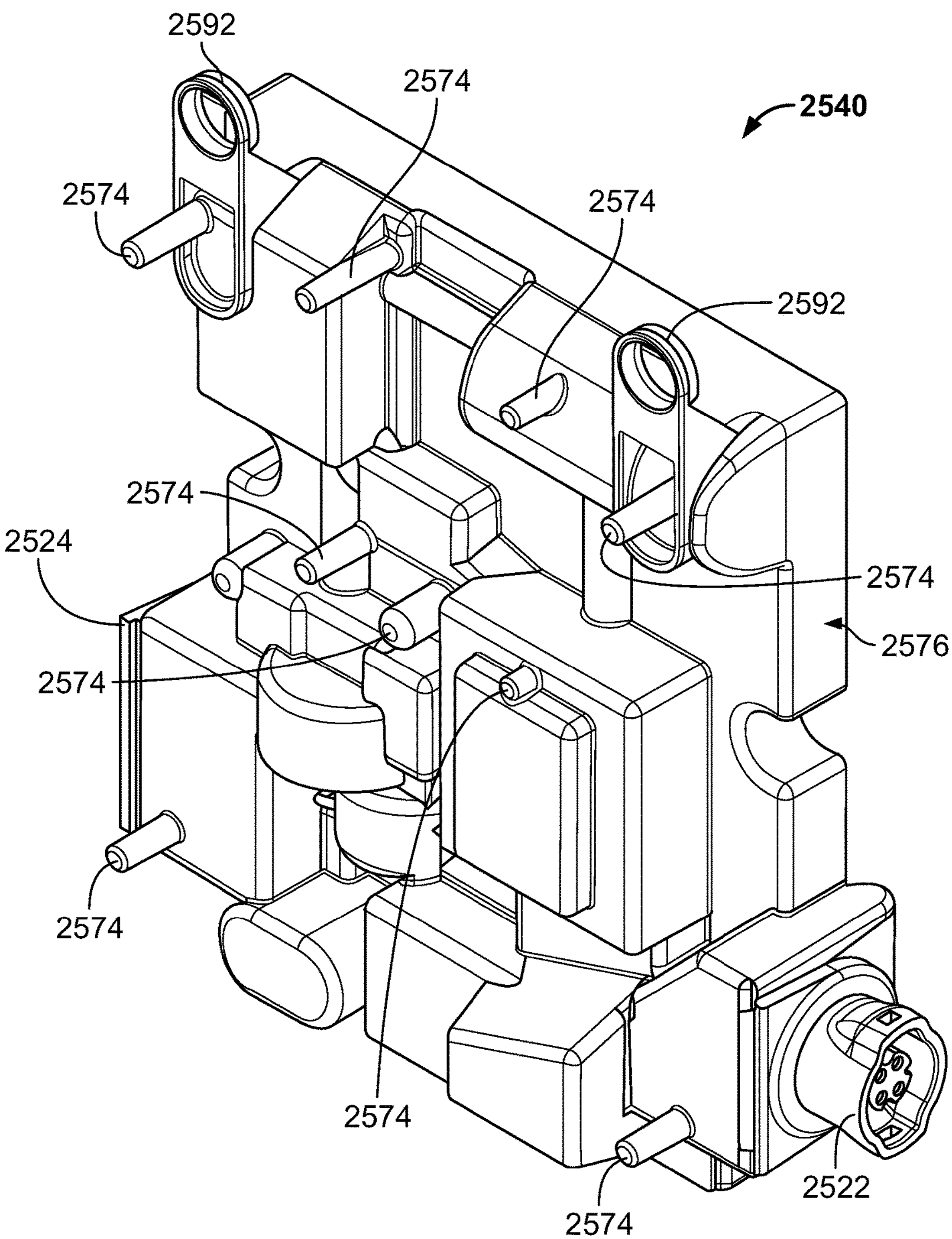
Figure 146:
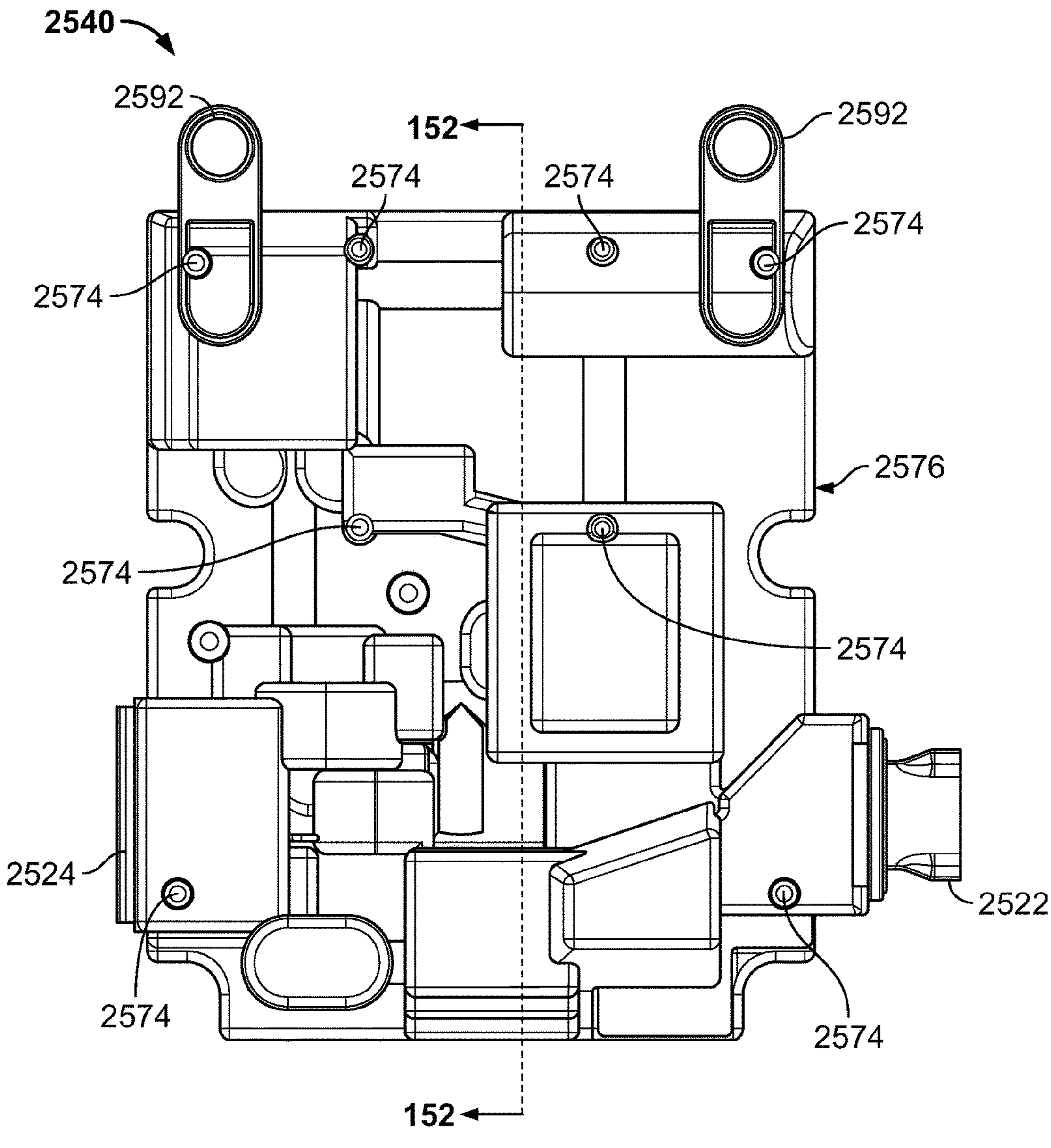
Figure 147A:
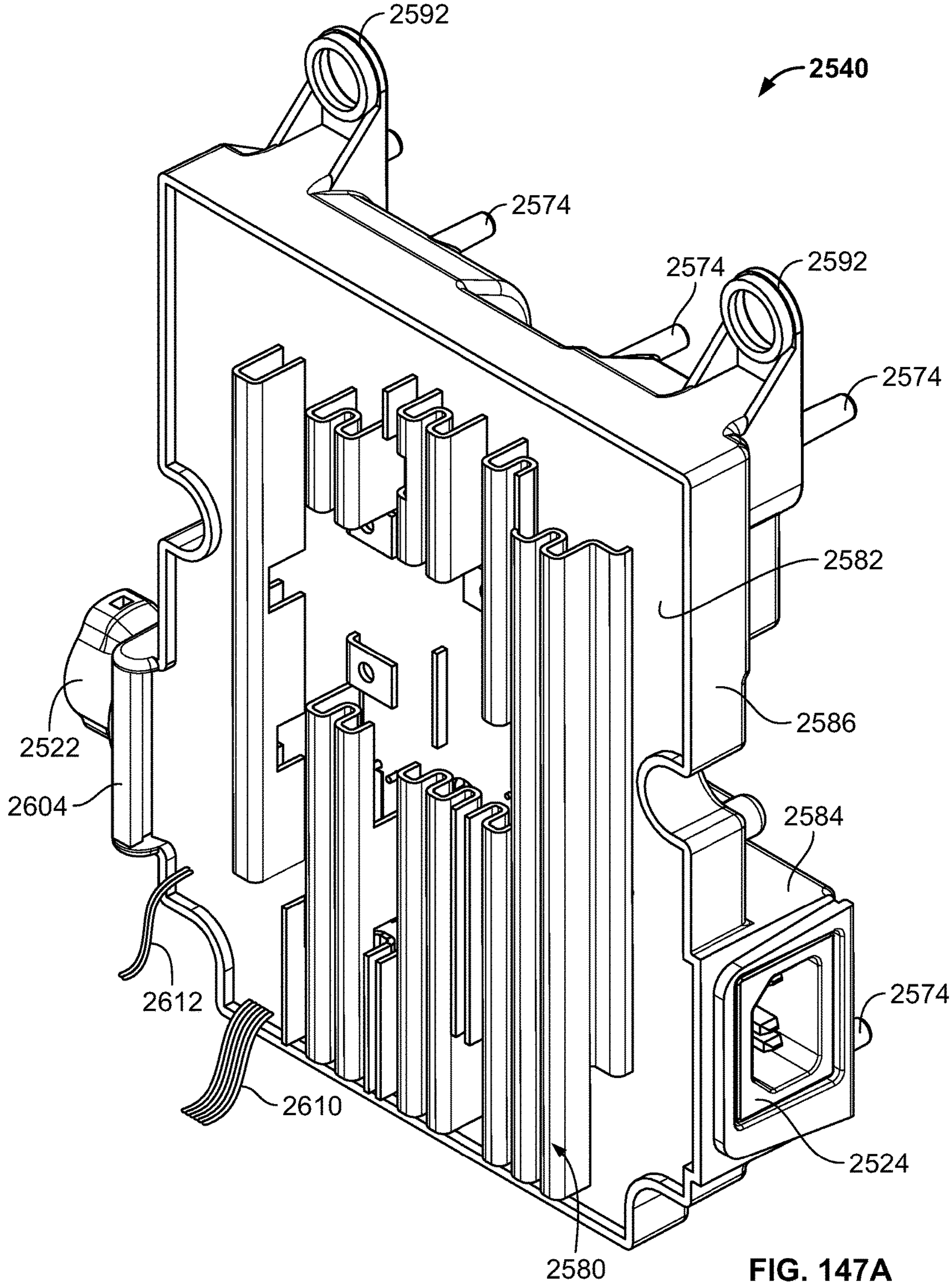
Figure 147B:
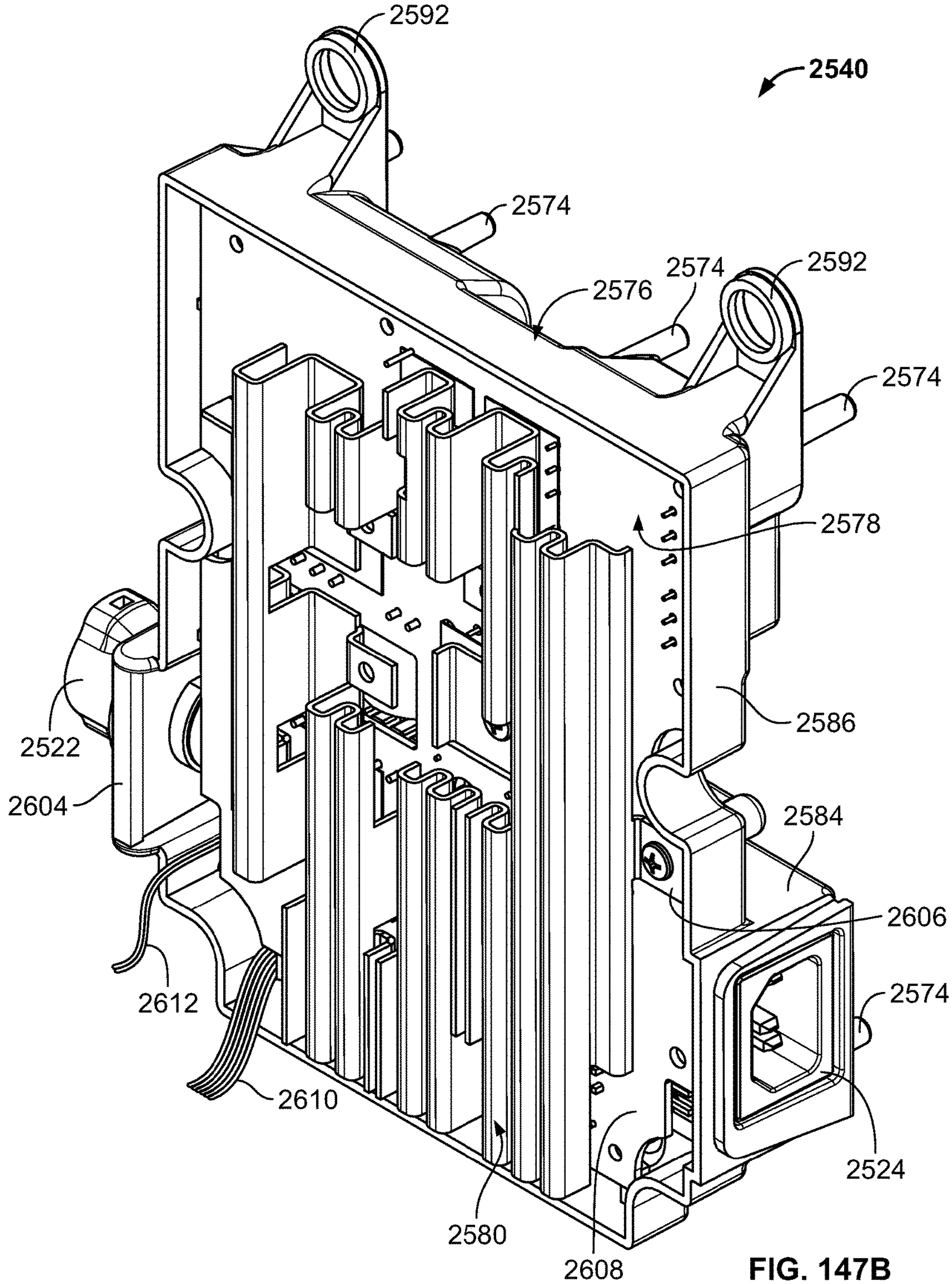
Figure 148A:
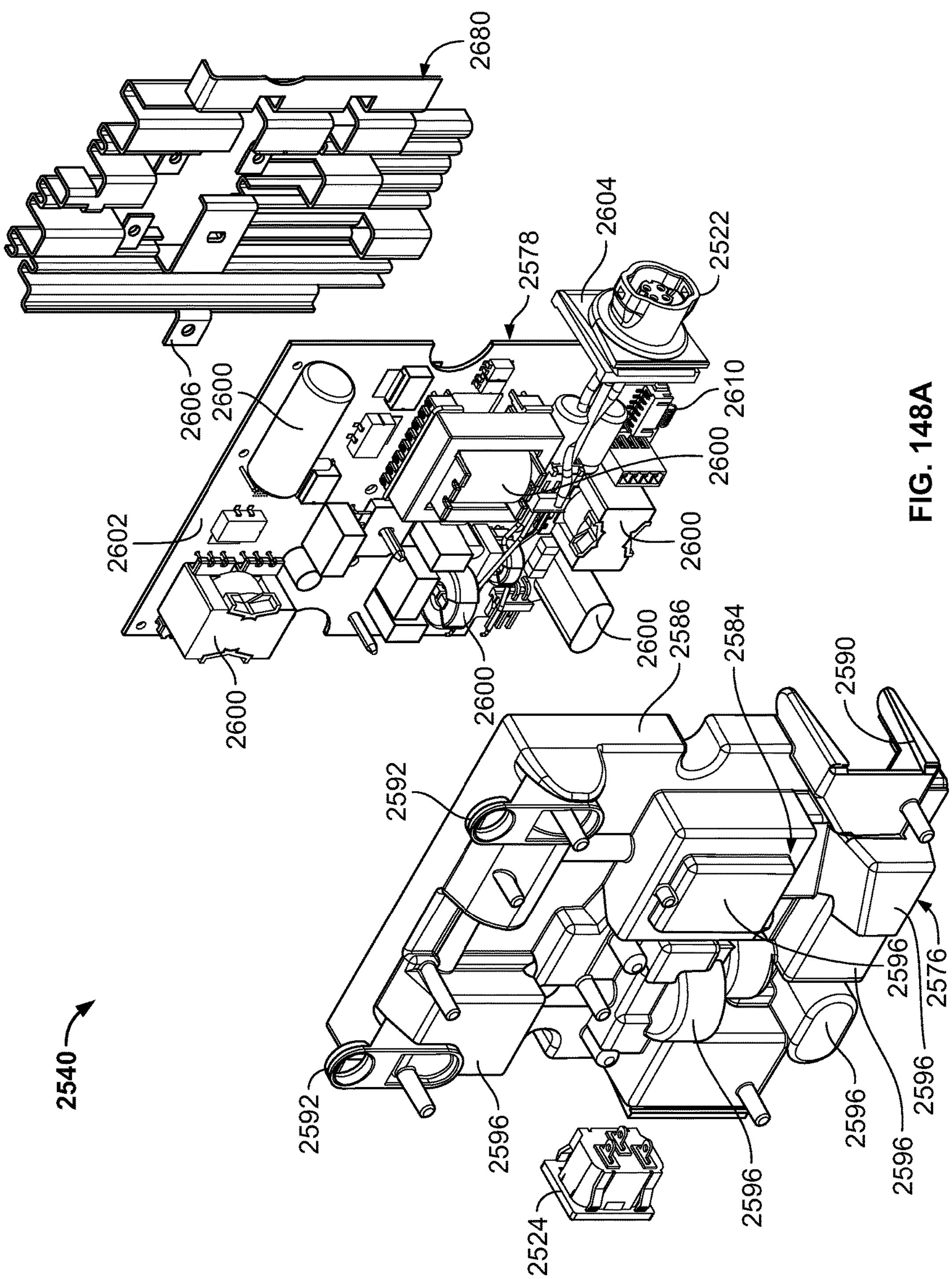
Figure 148B:
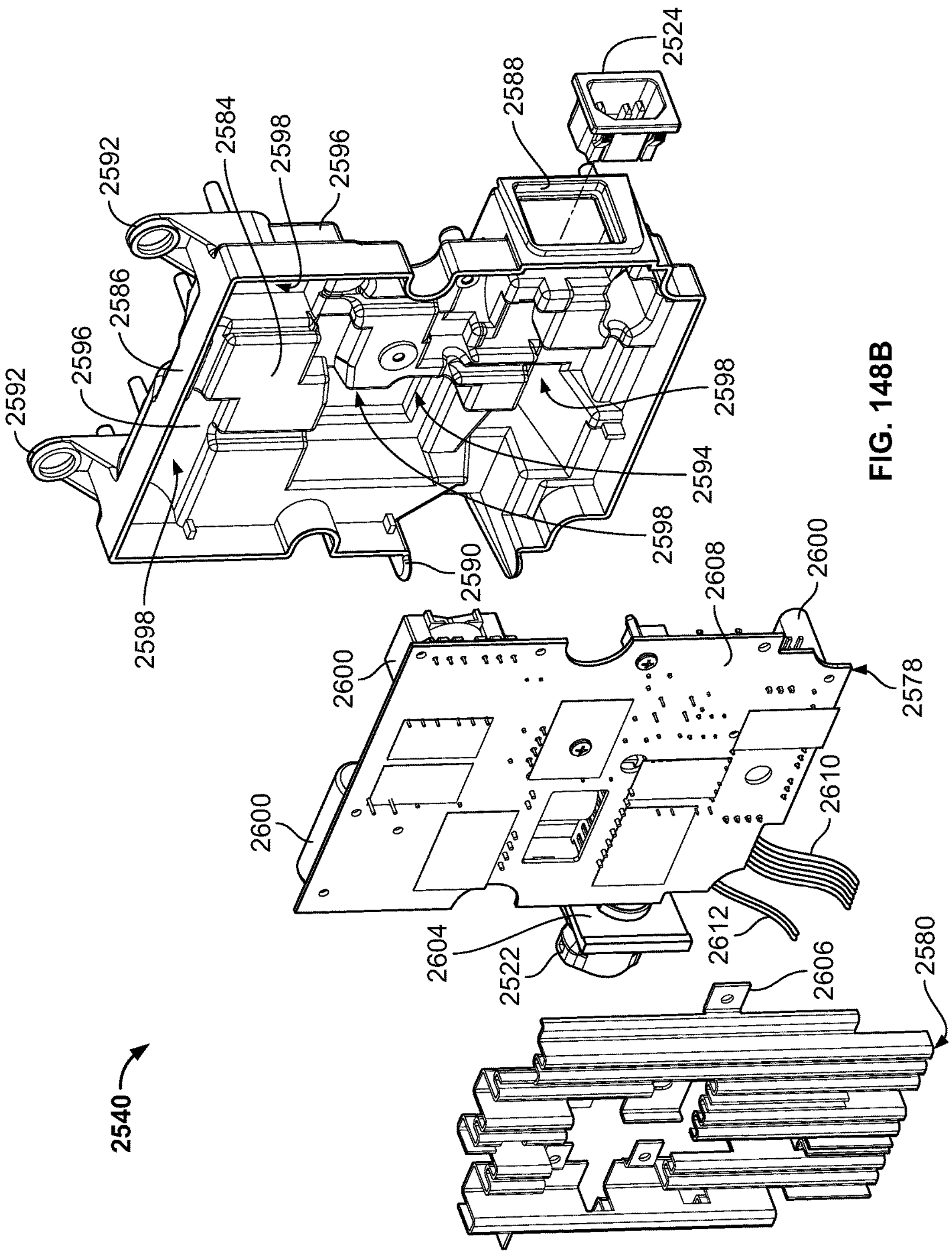
Figure 149:
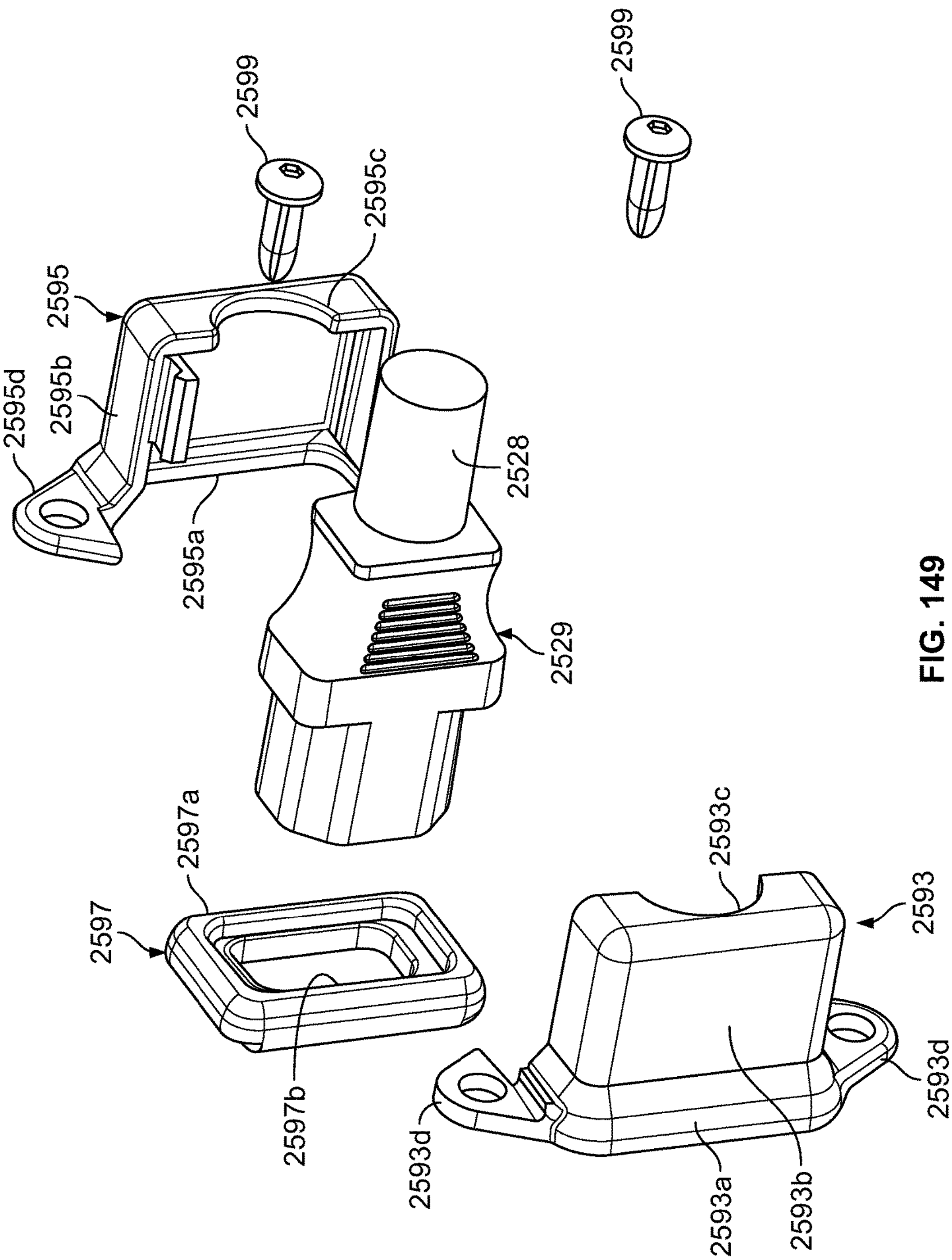
Figure 150:
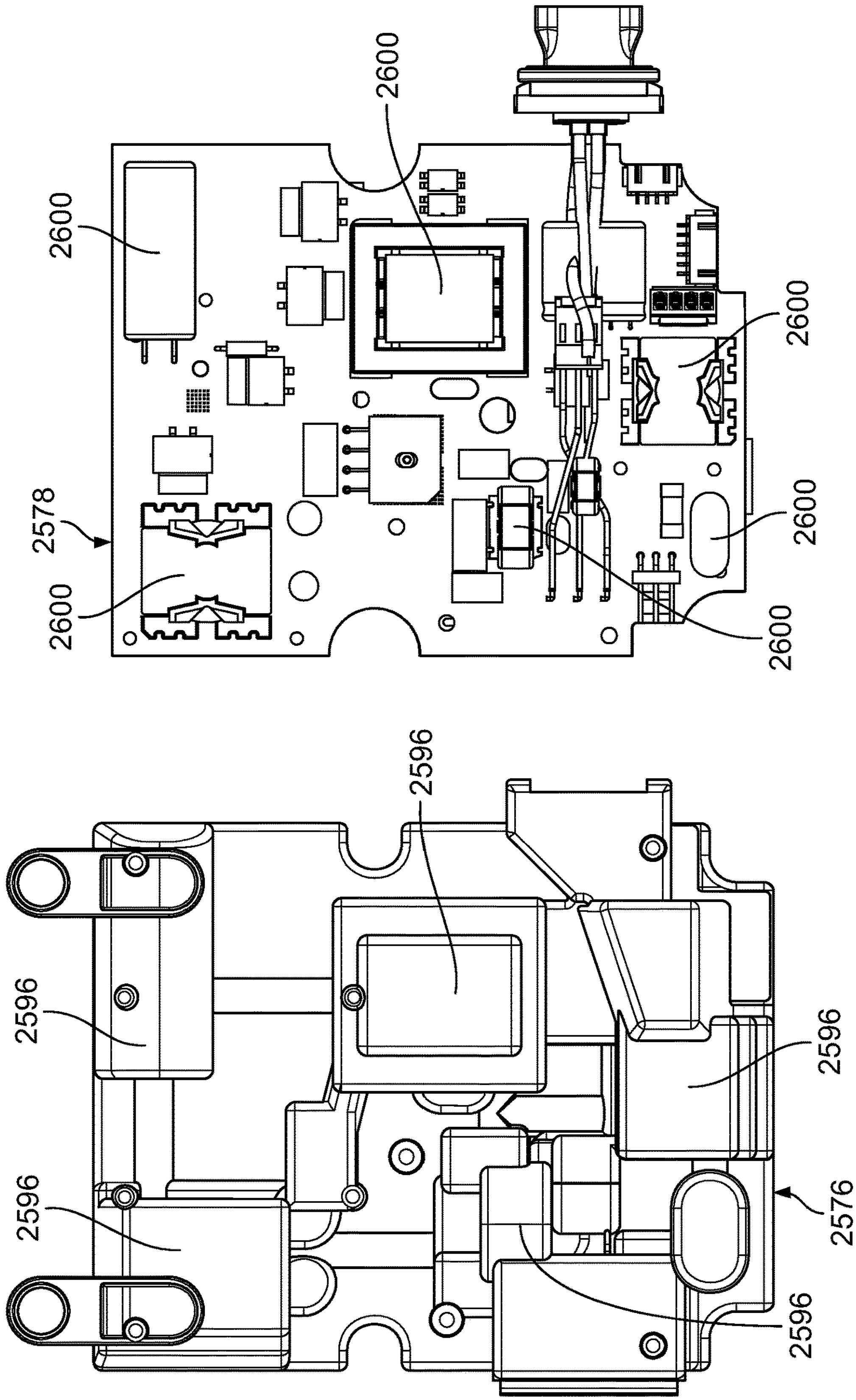
Figure 151:
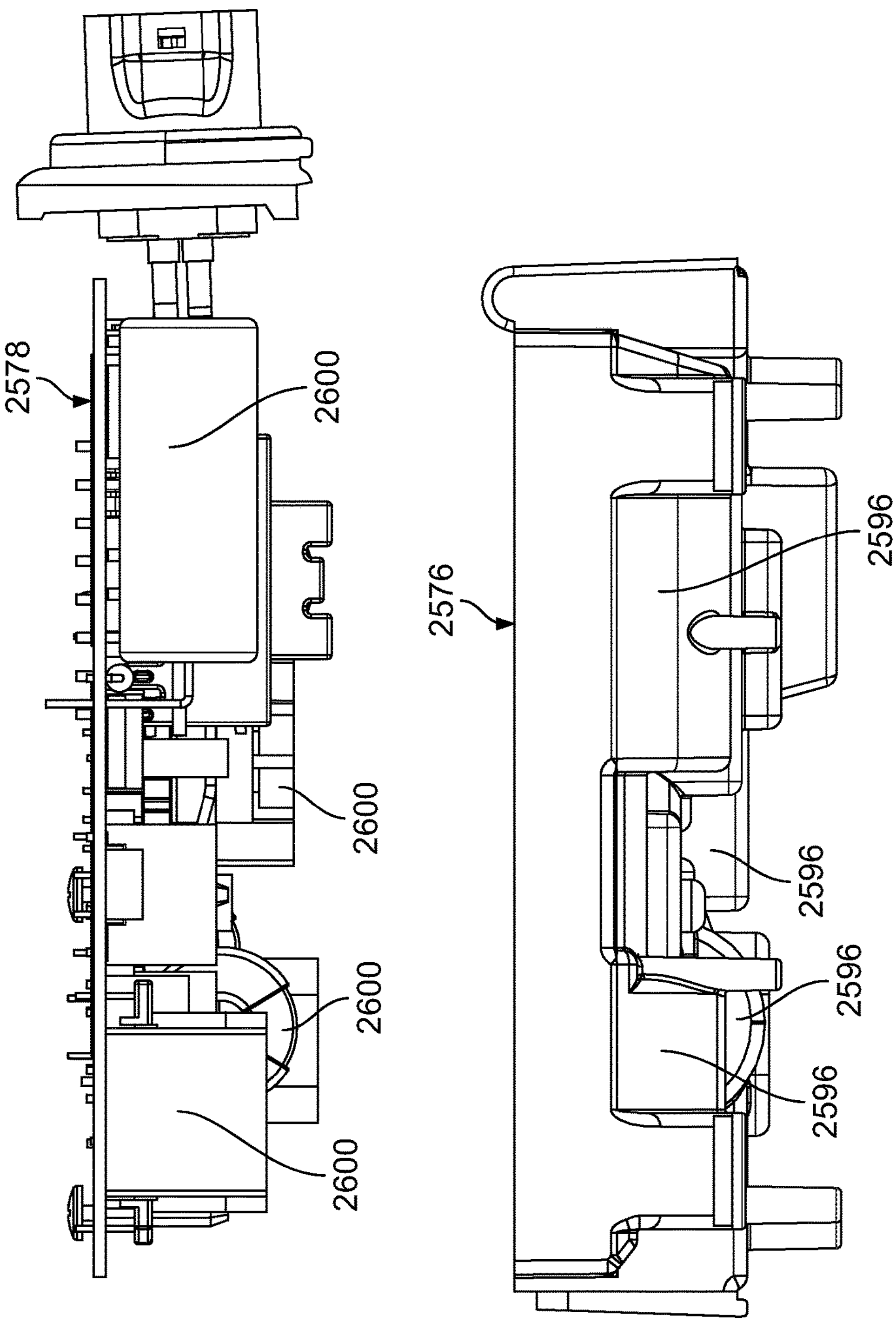
Figure 152:
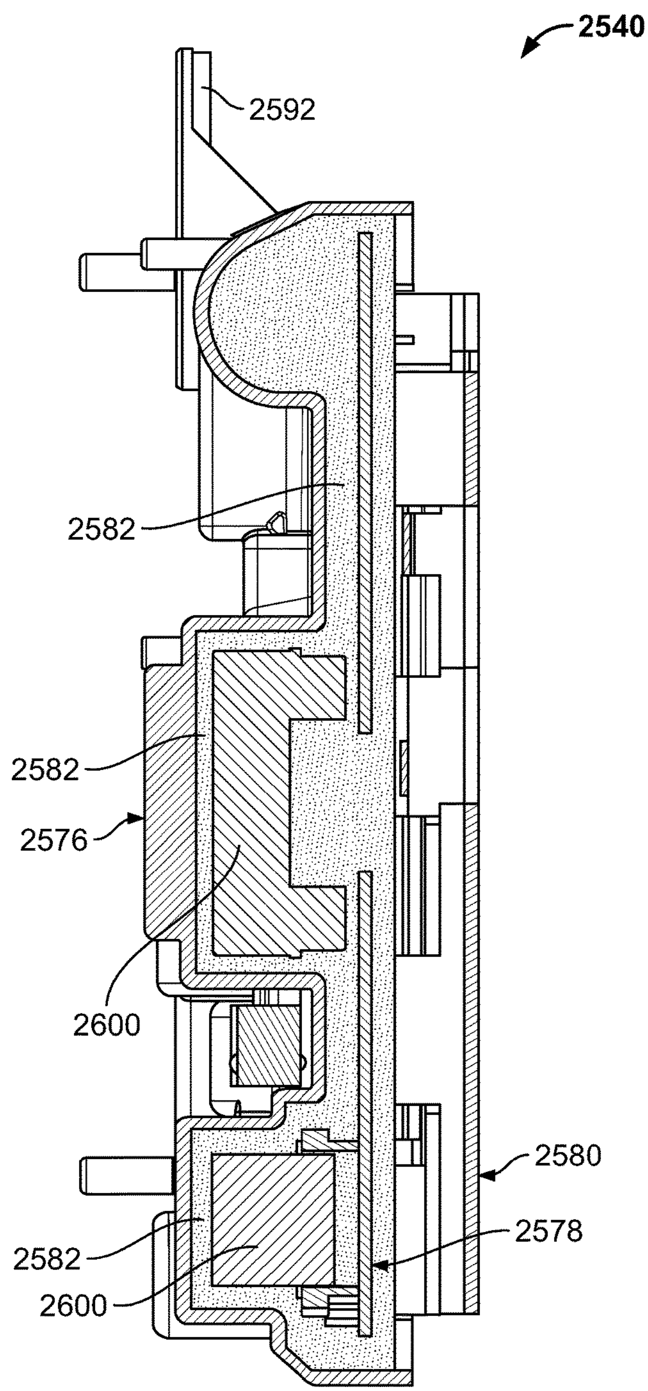
Figure 153:
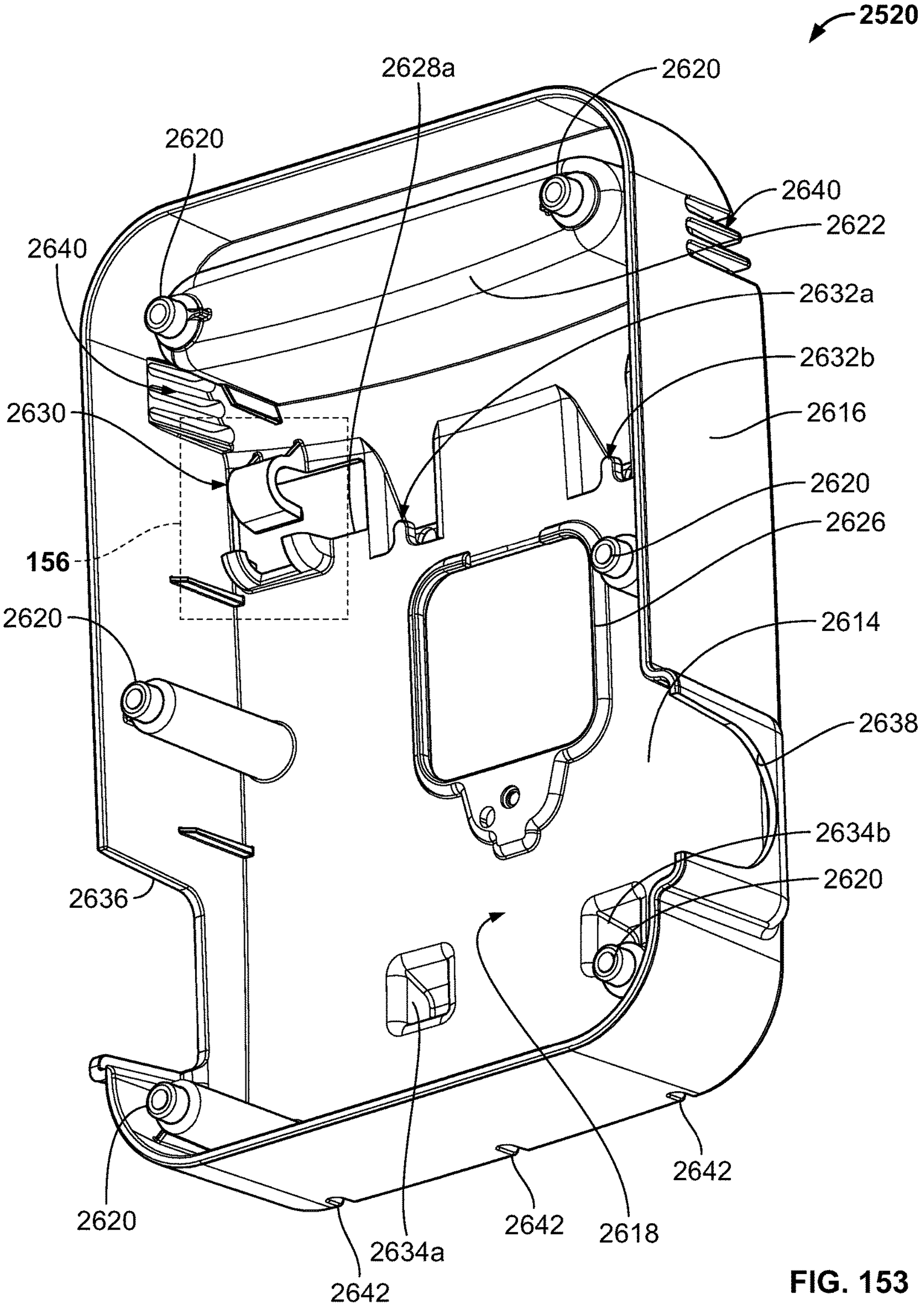
Figure 154:
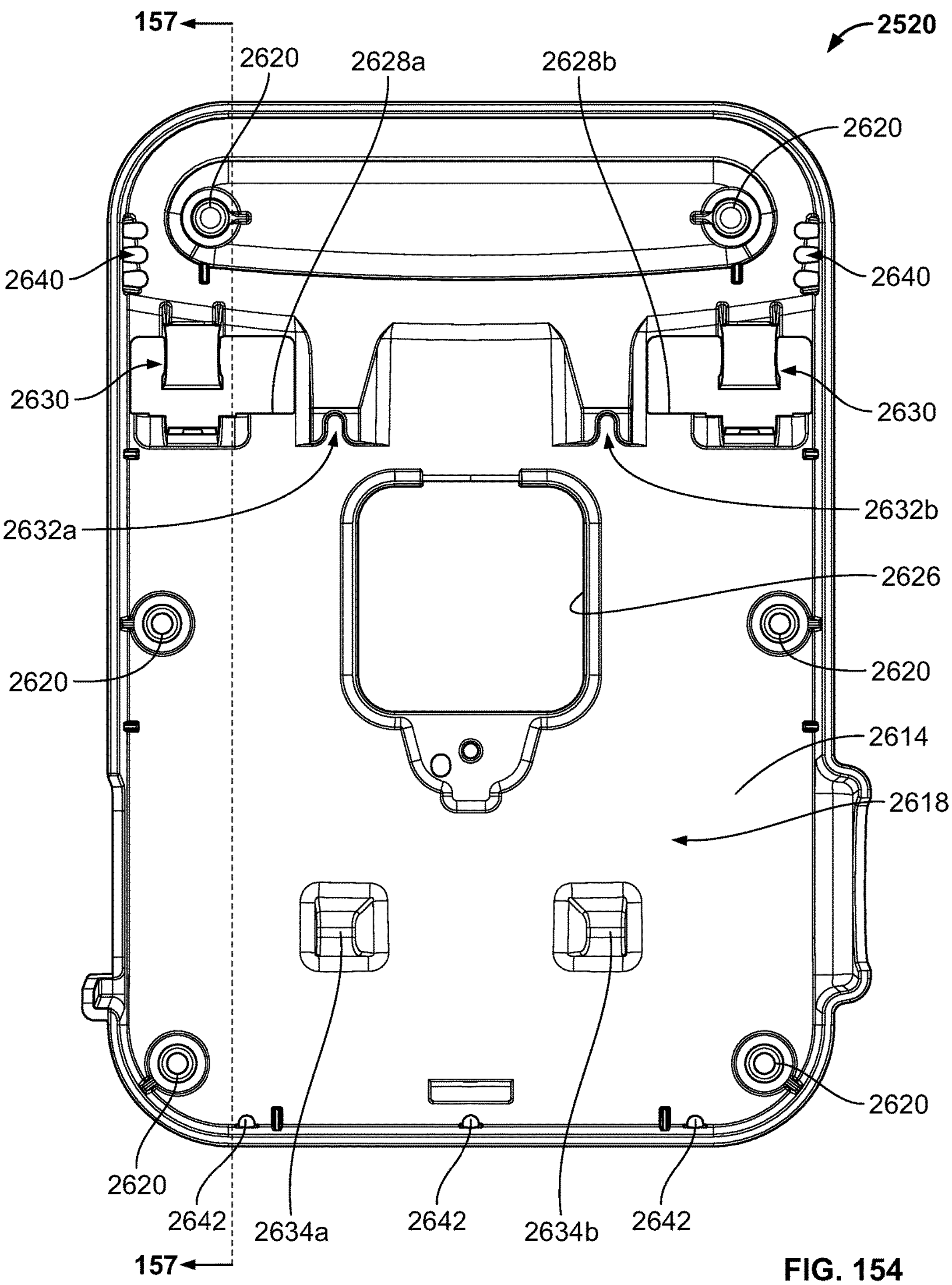
Figure 155:
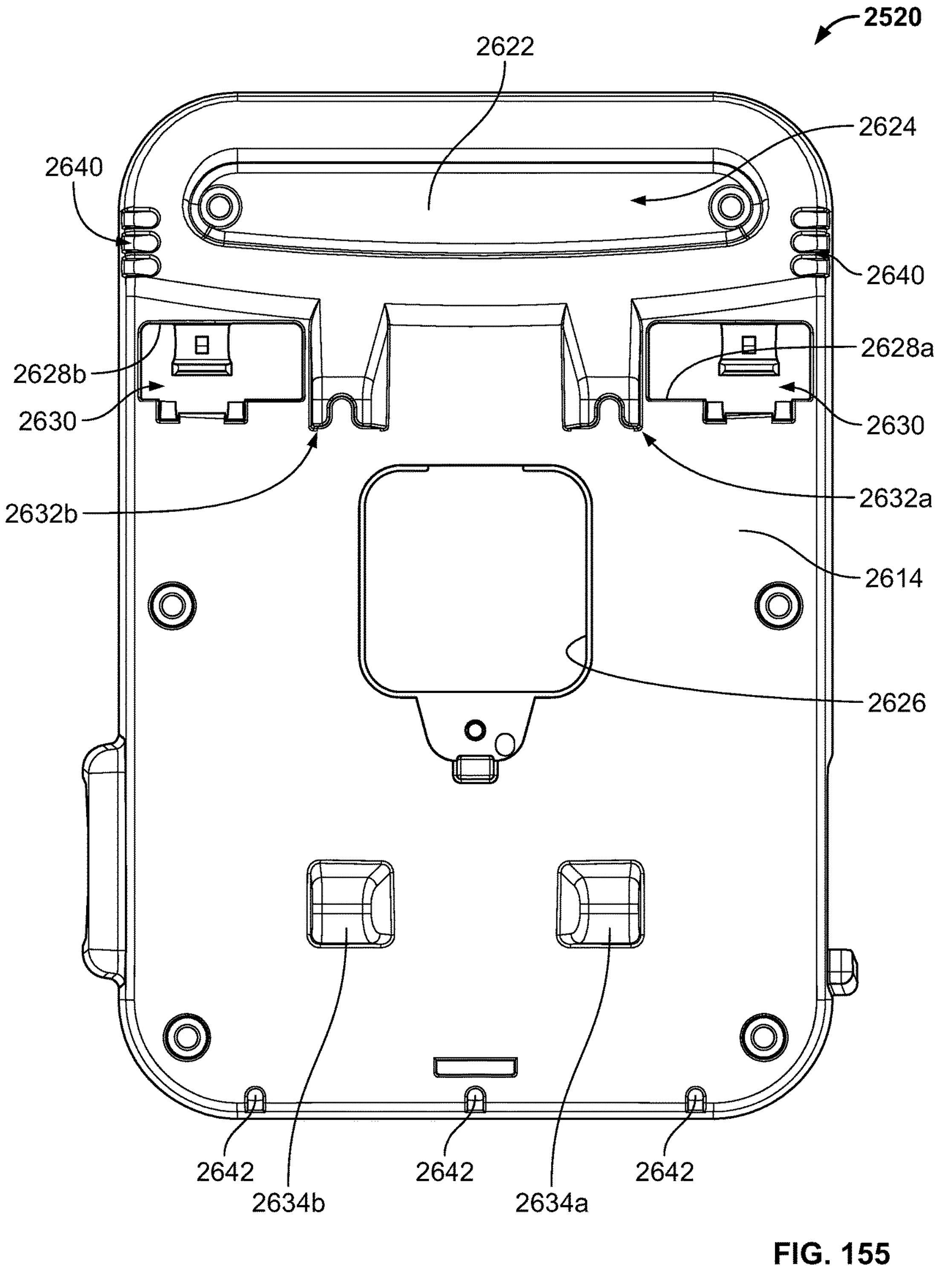
Figure 156:
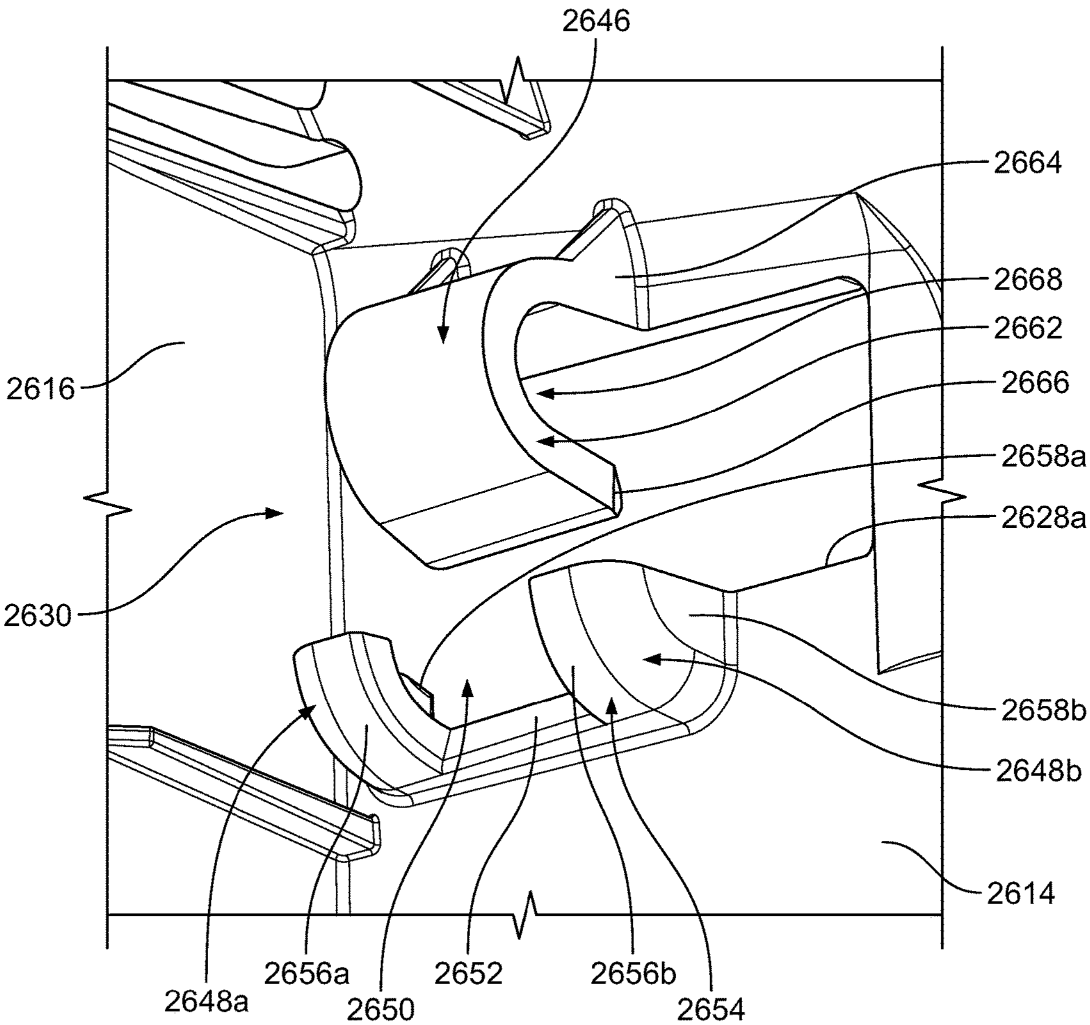
Figure 157:
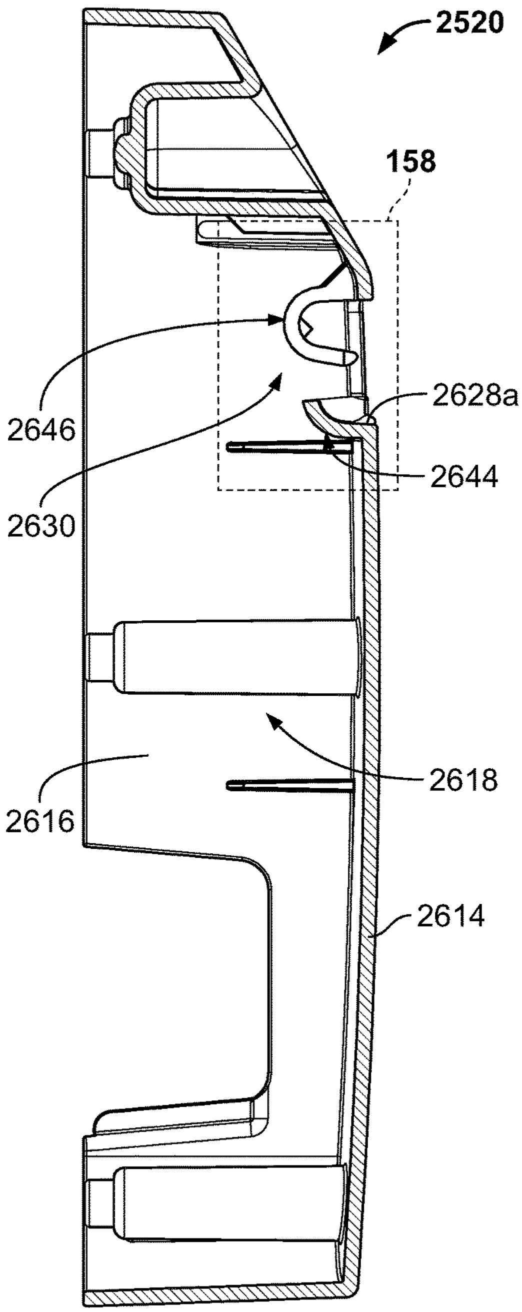
Figure 158:
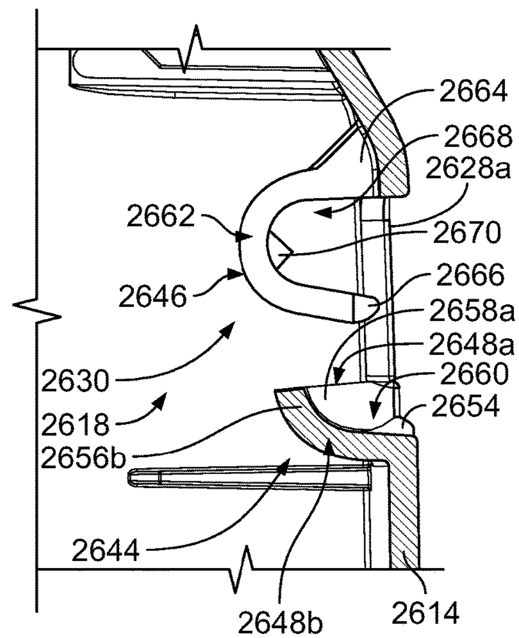
Figure 159:
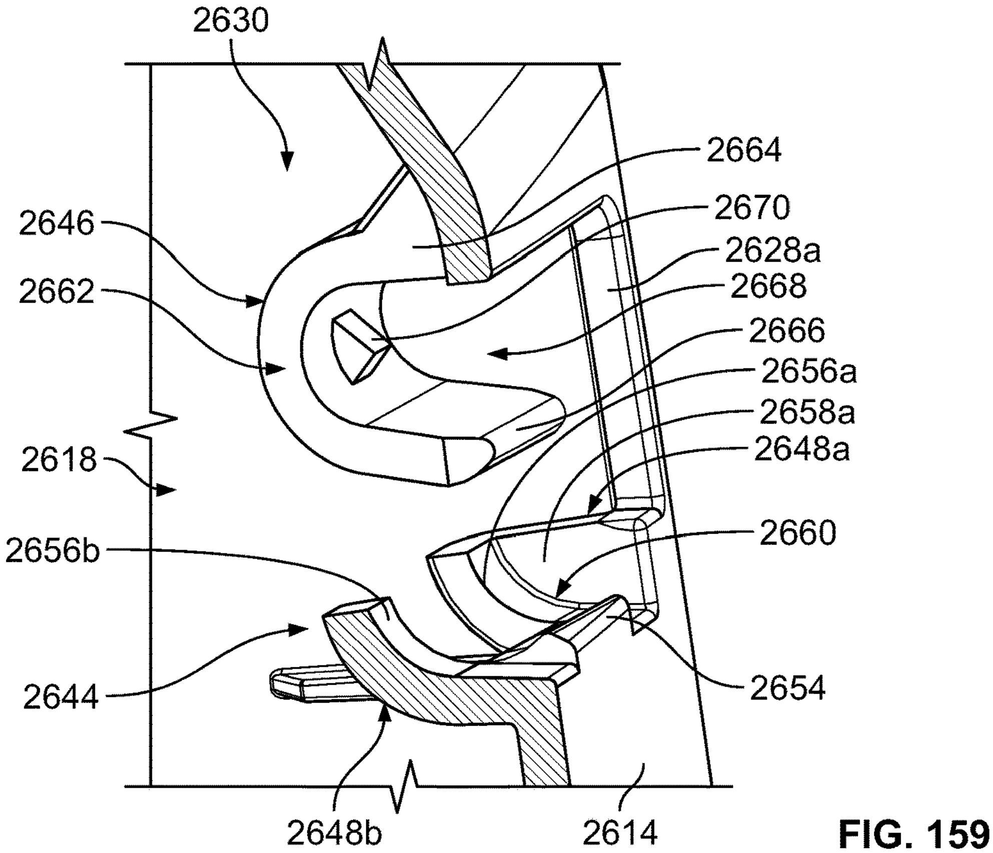
Figure 160:
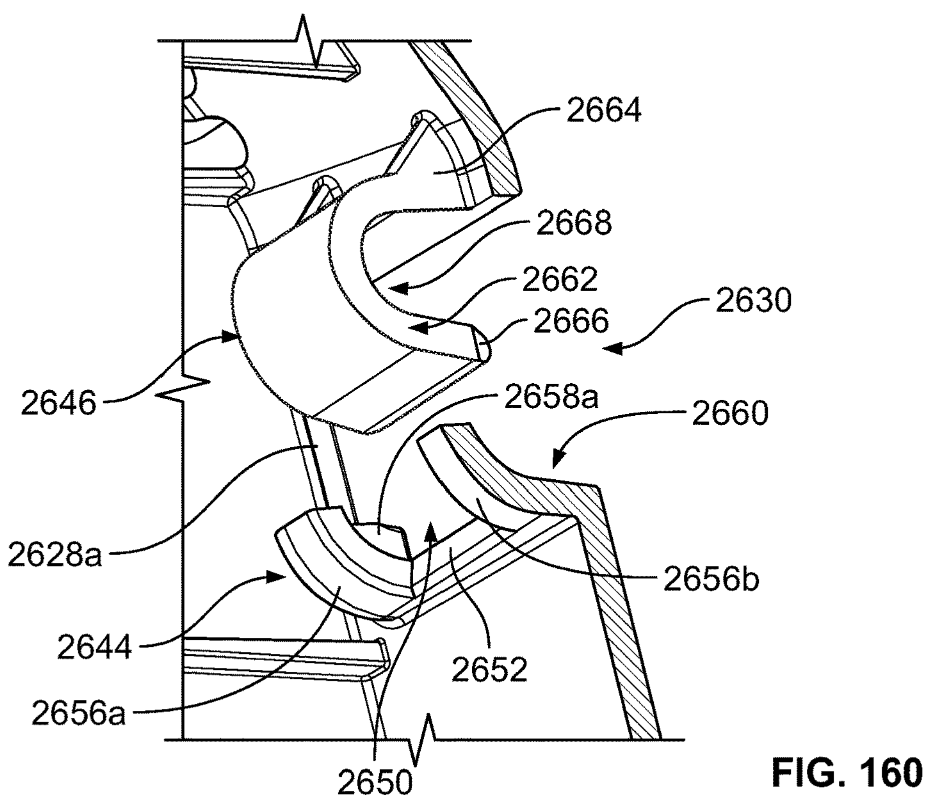
Figure 161:
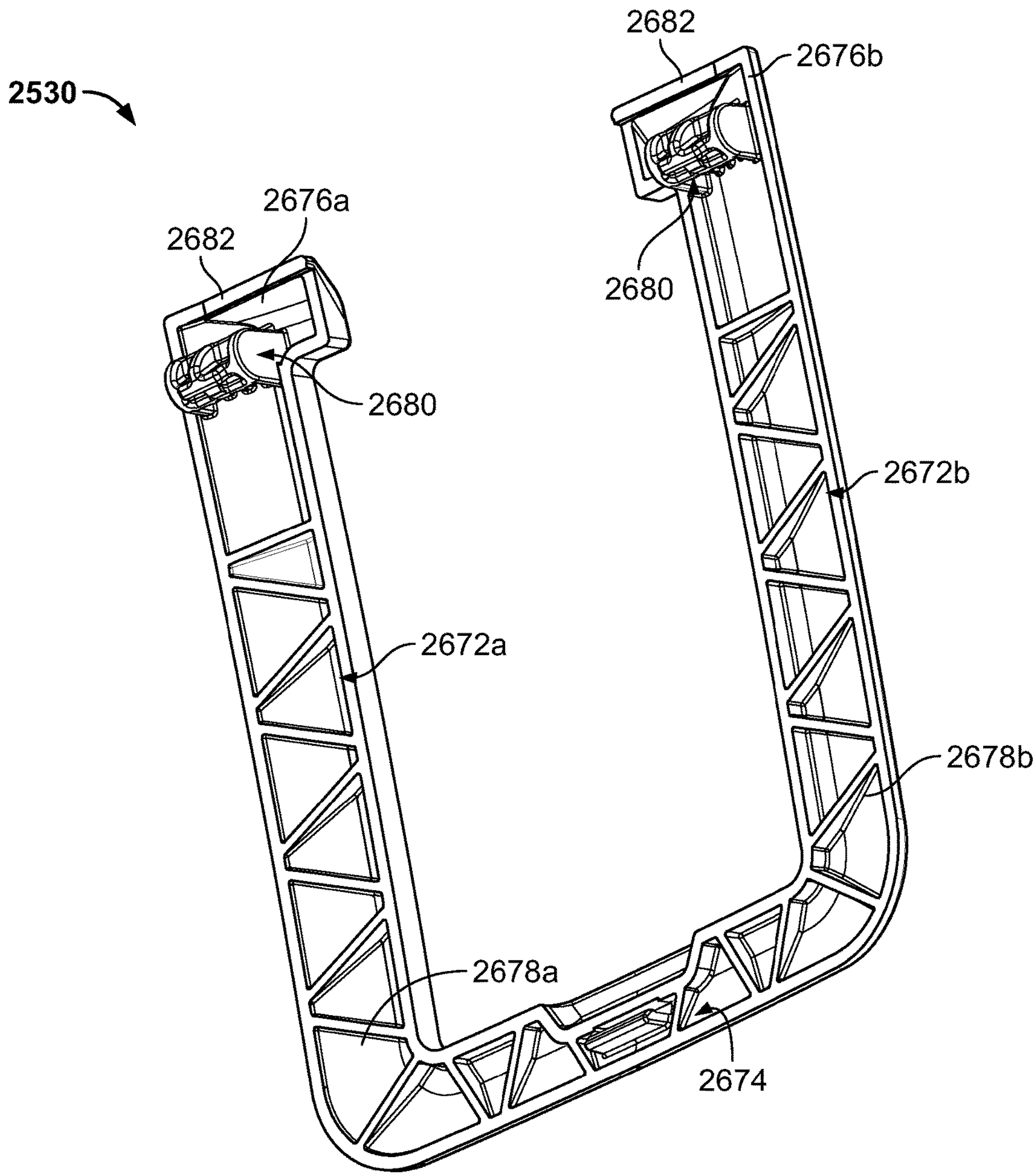
Figure 162:
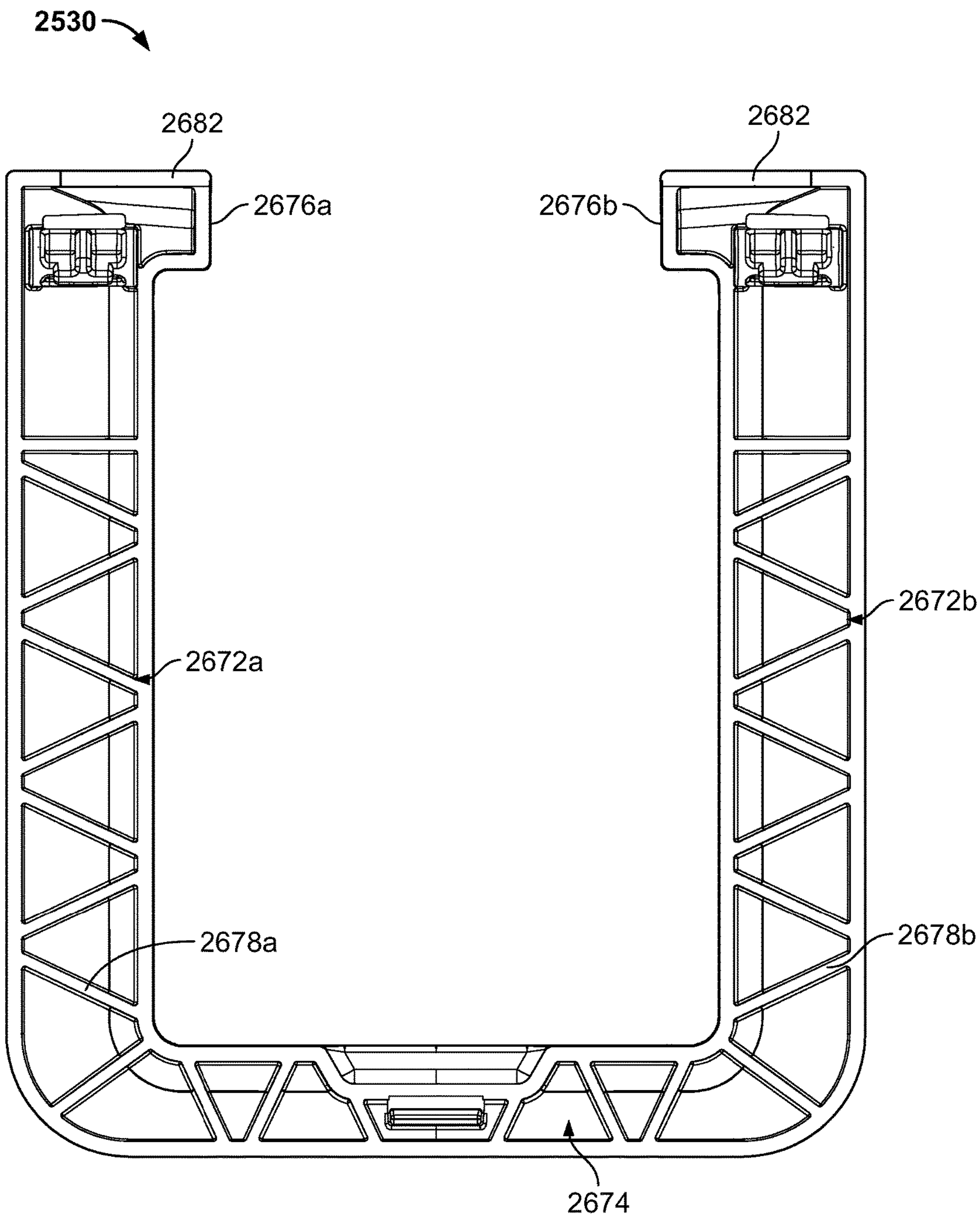
Figure 163:
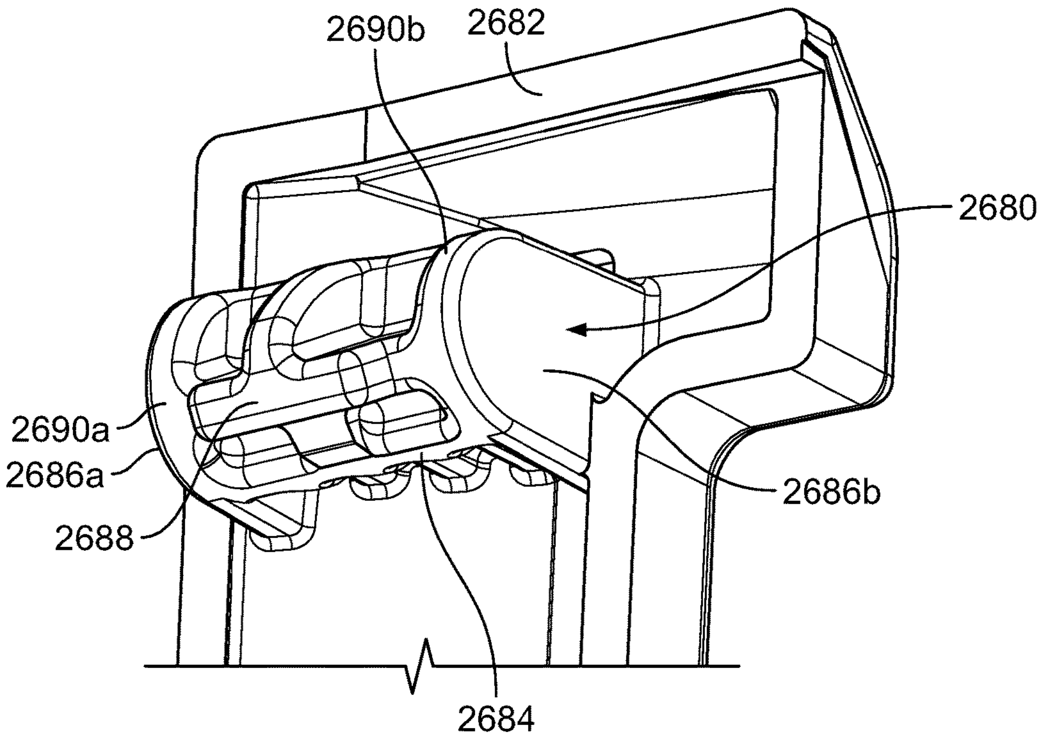
Figure 164:
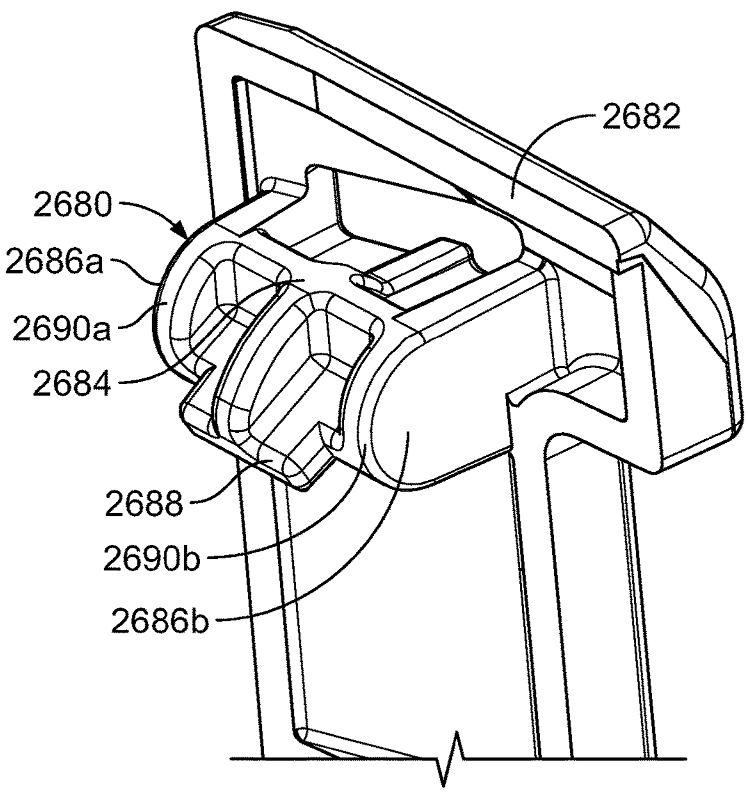
Figure 165:
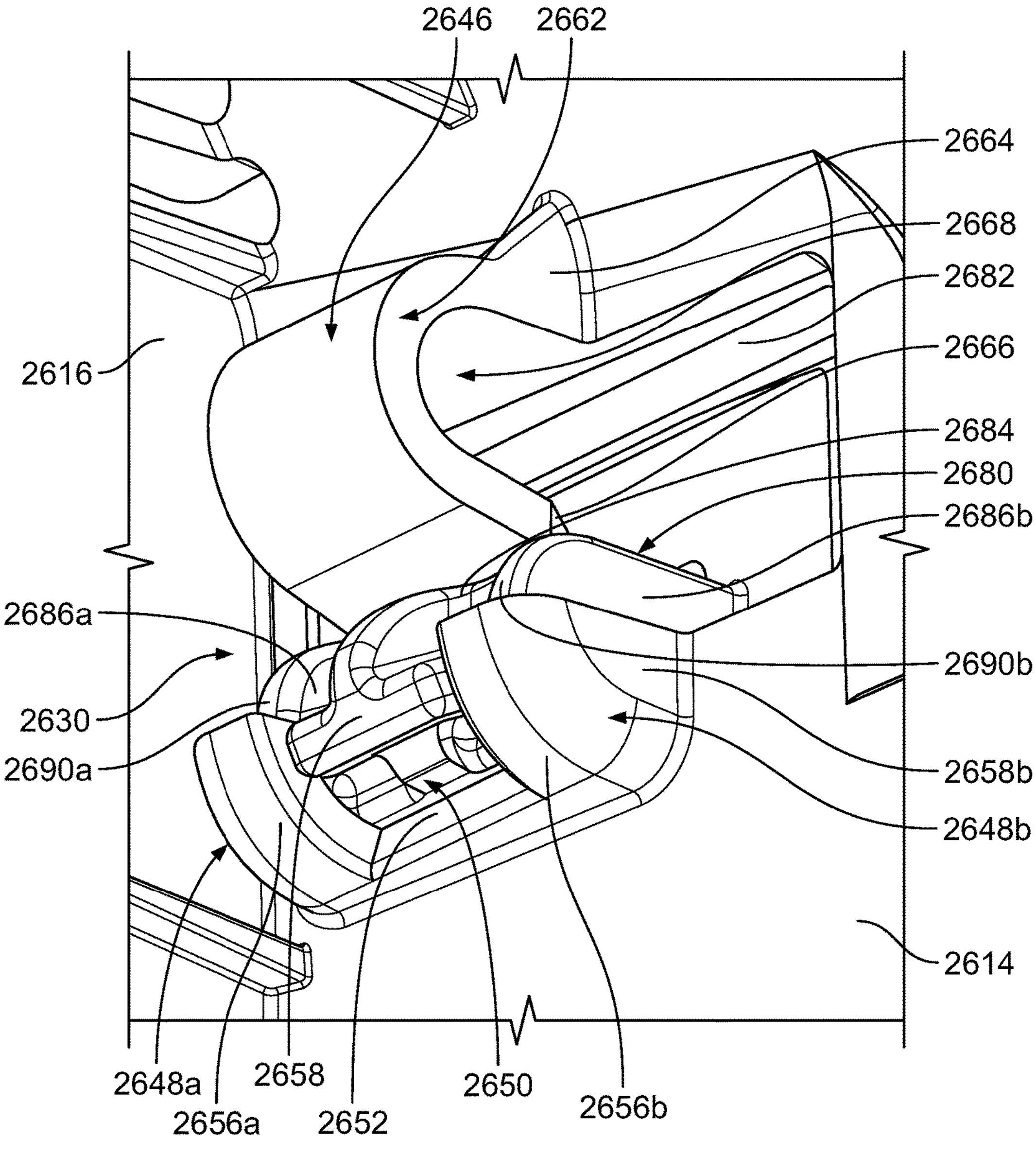
Figure 166:
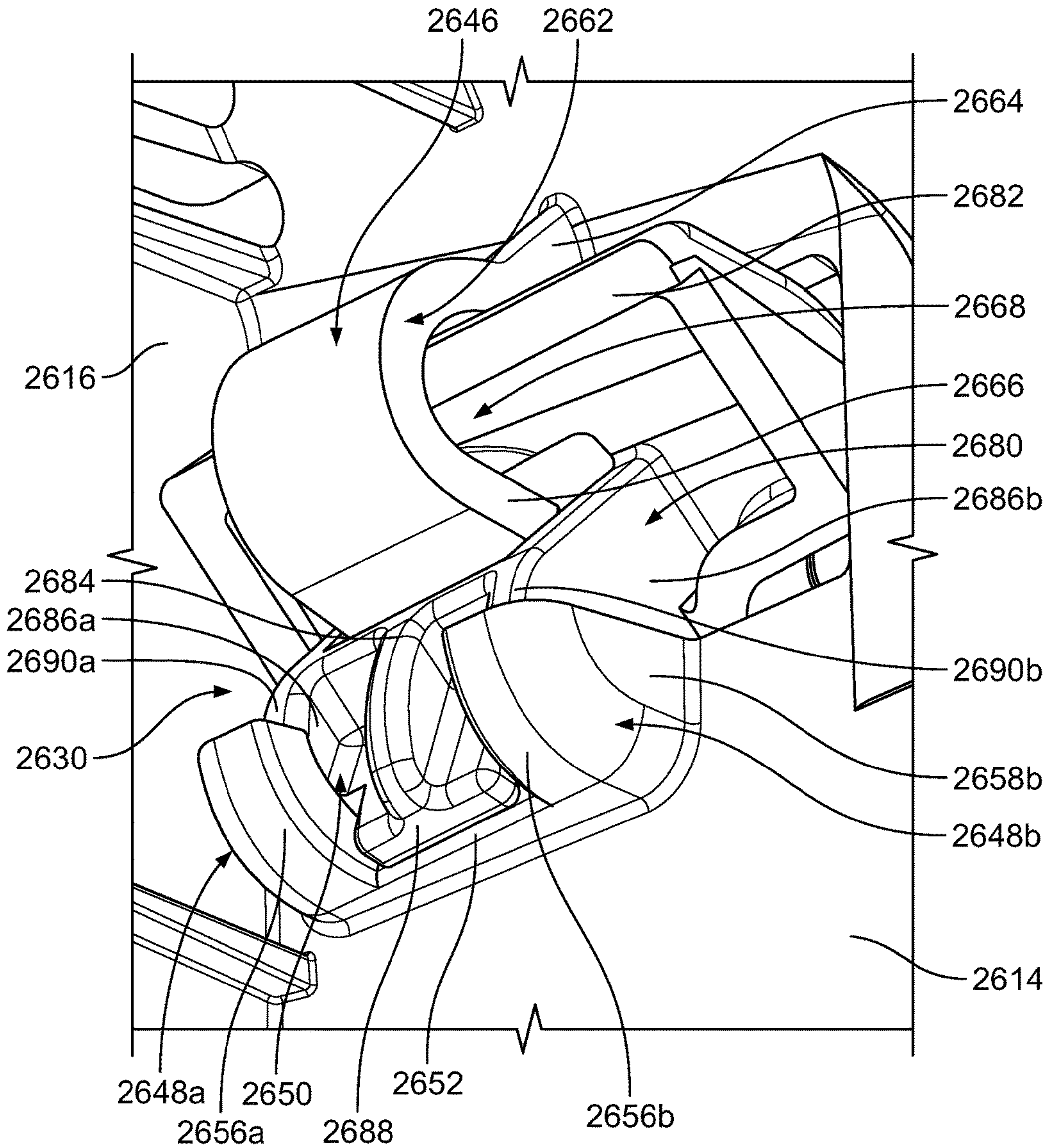
Figure 167:
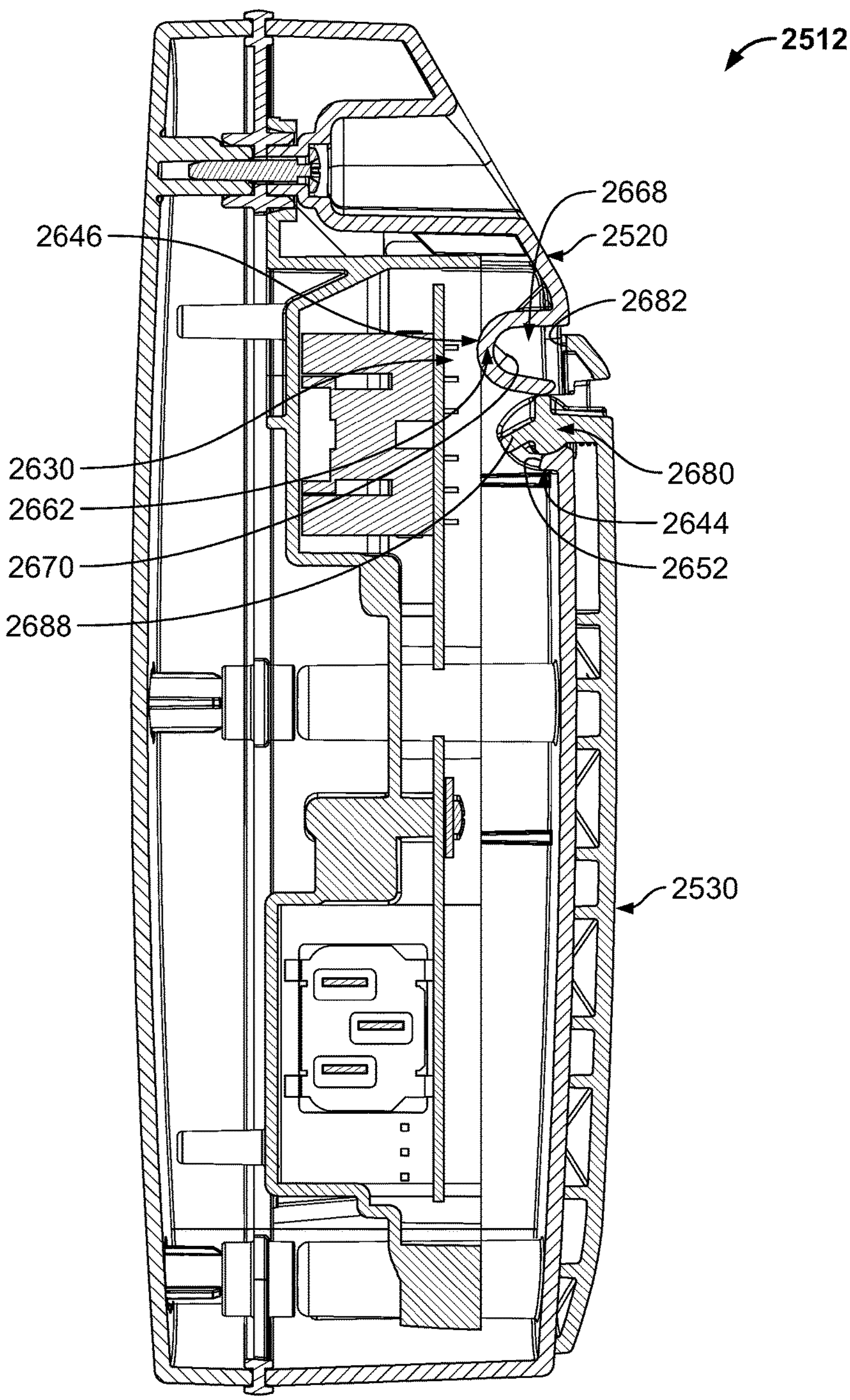
Figure 168:
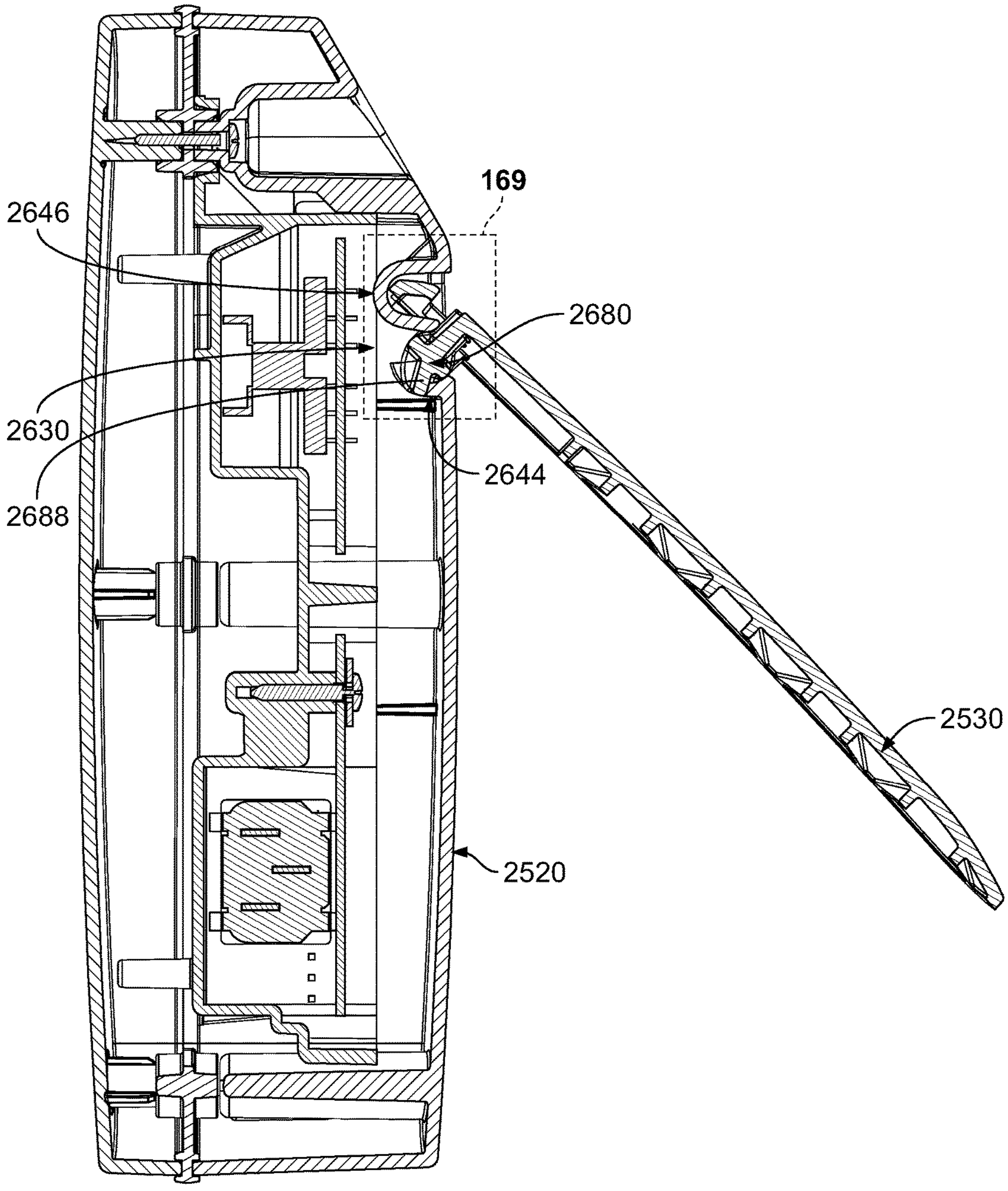
Figure 169:
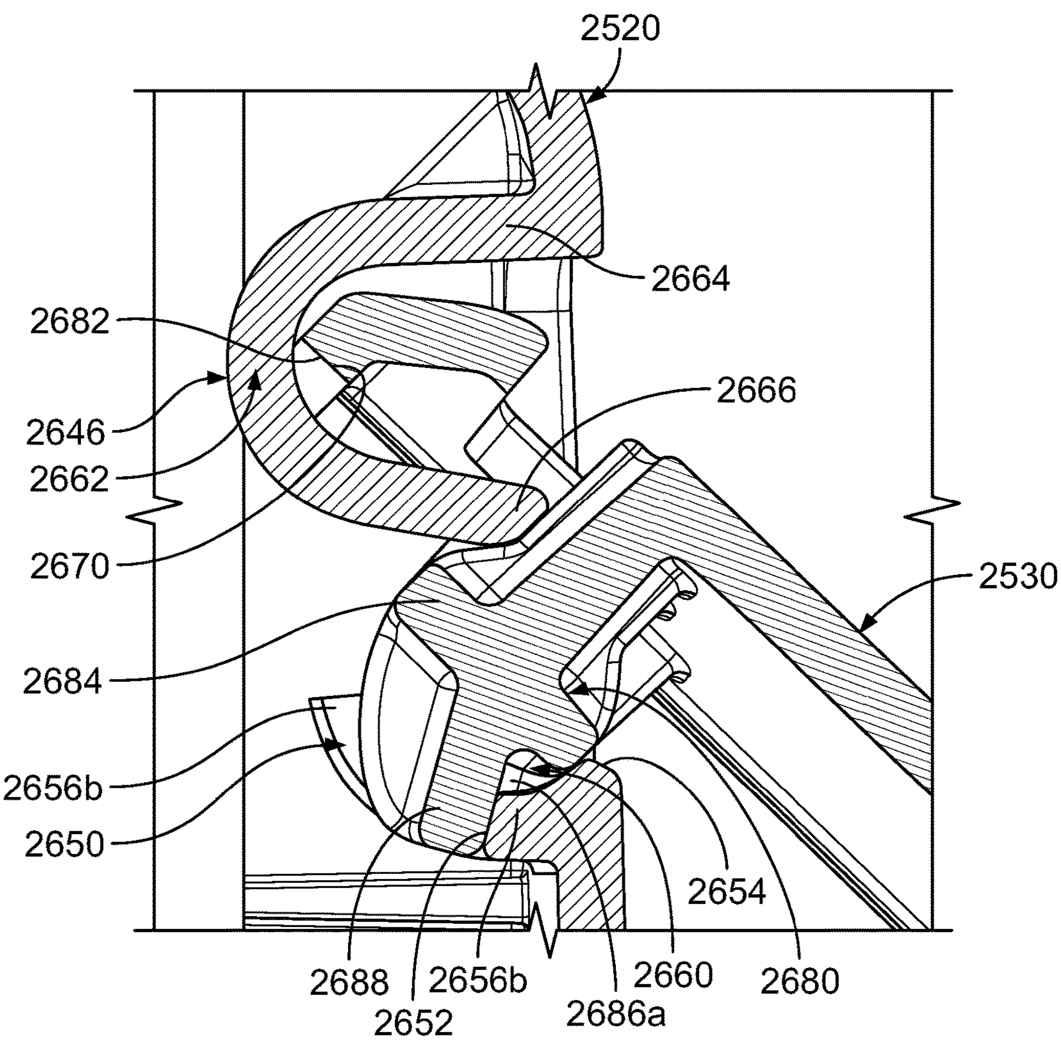
Figure 170:
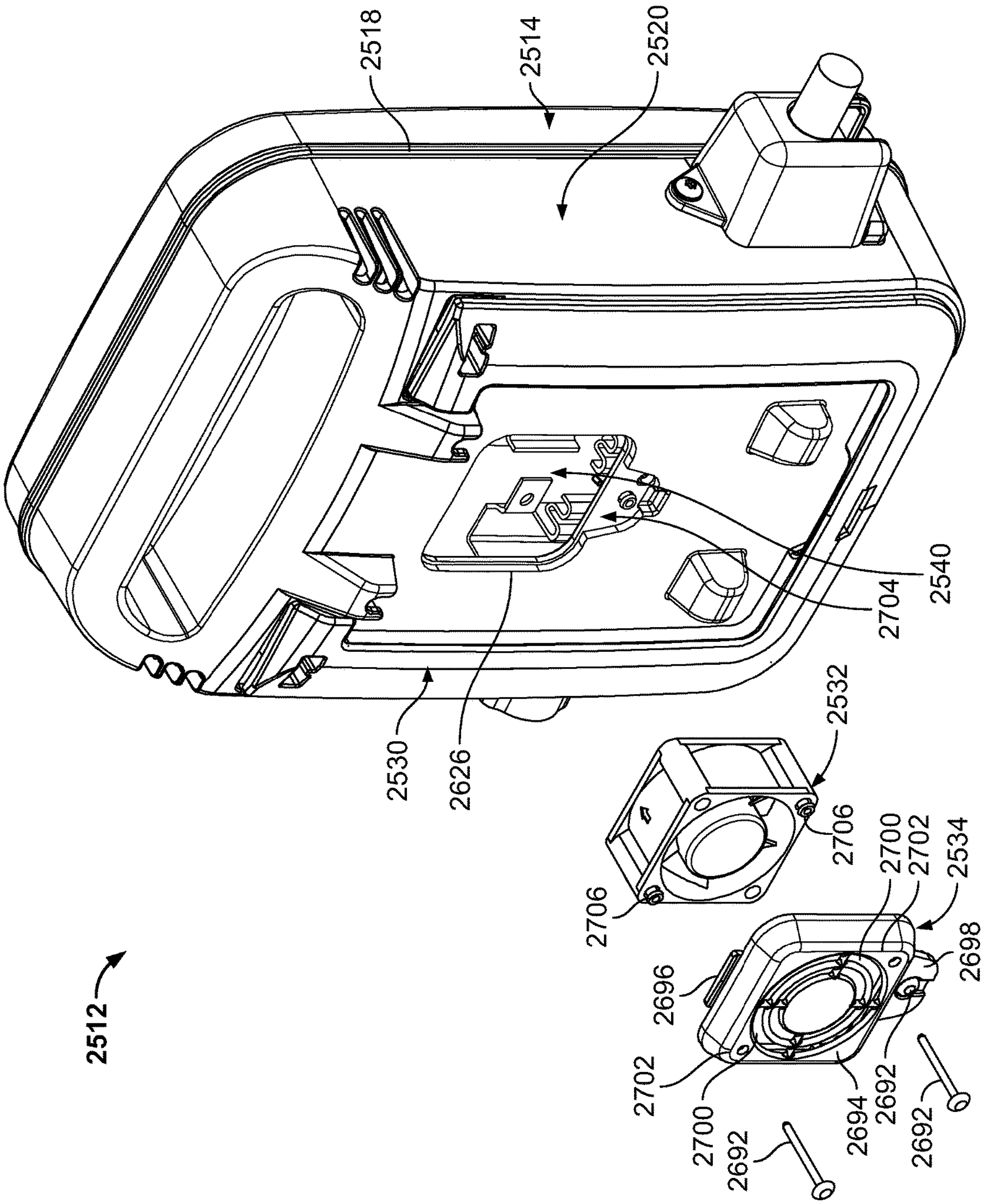
Figure 171:
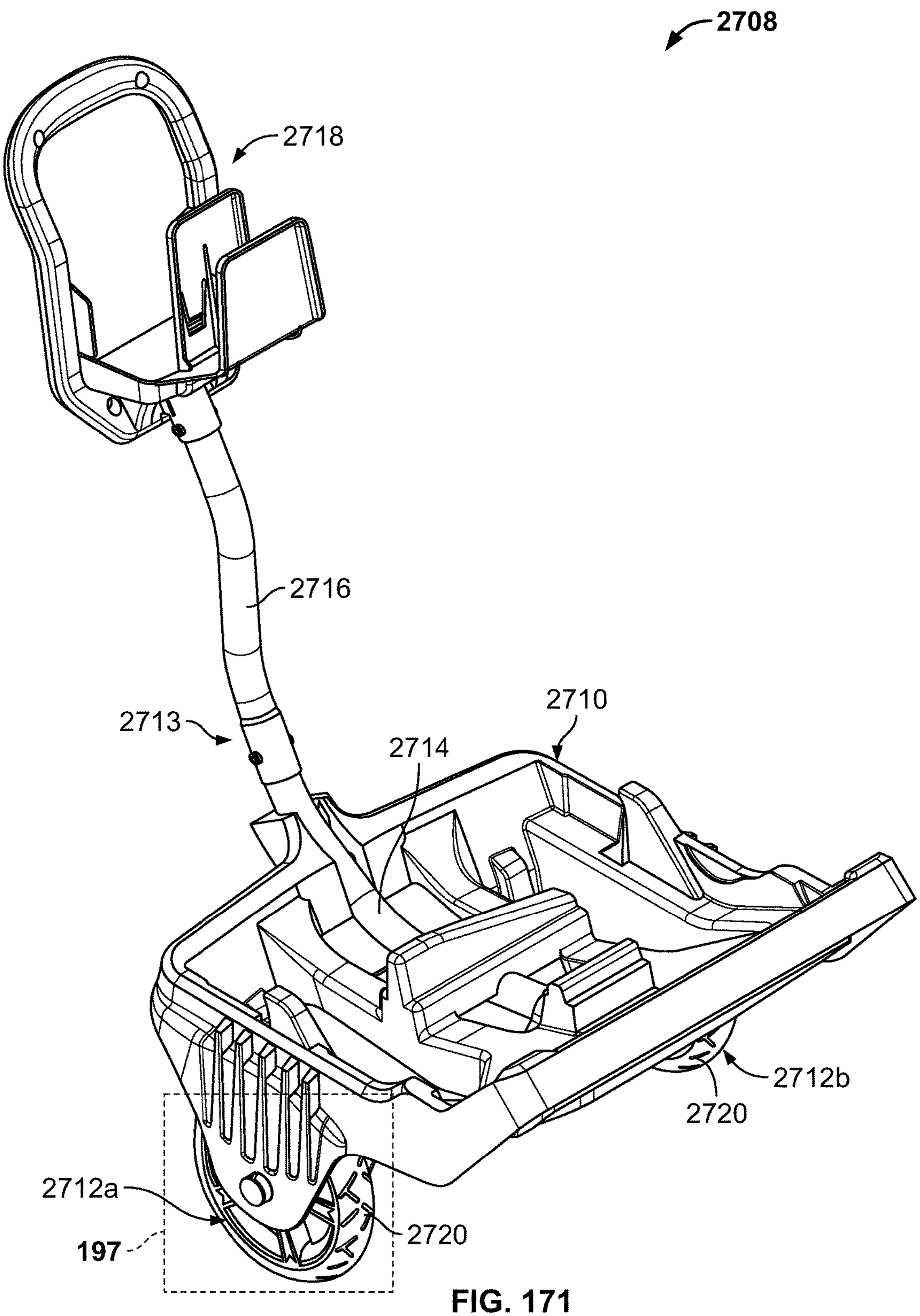
Figure 172:
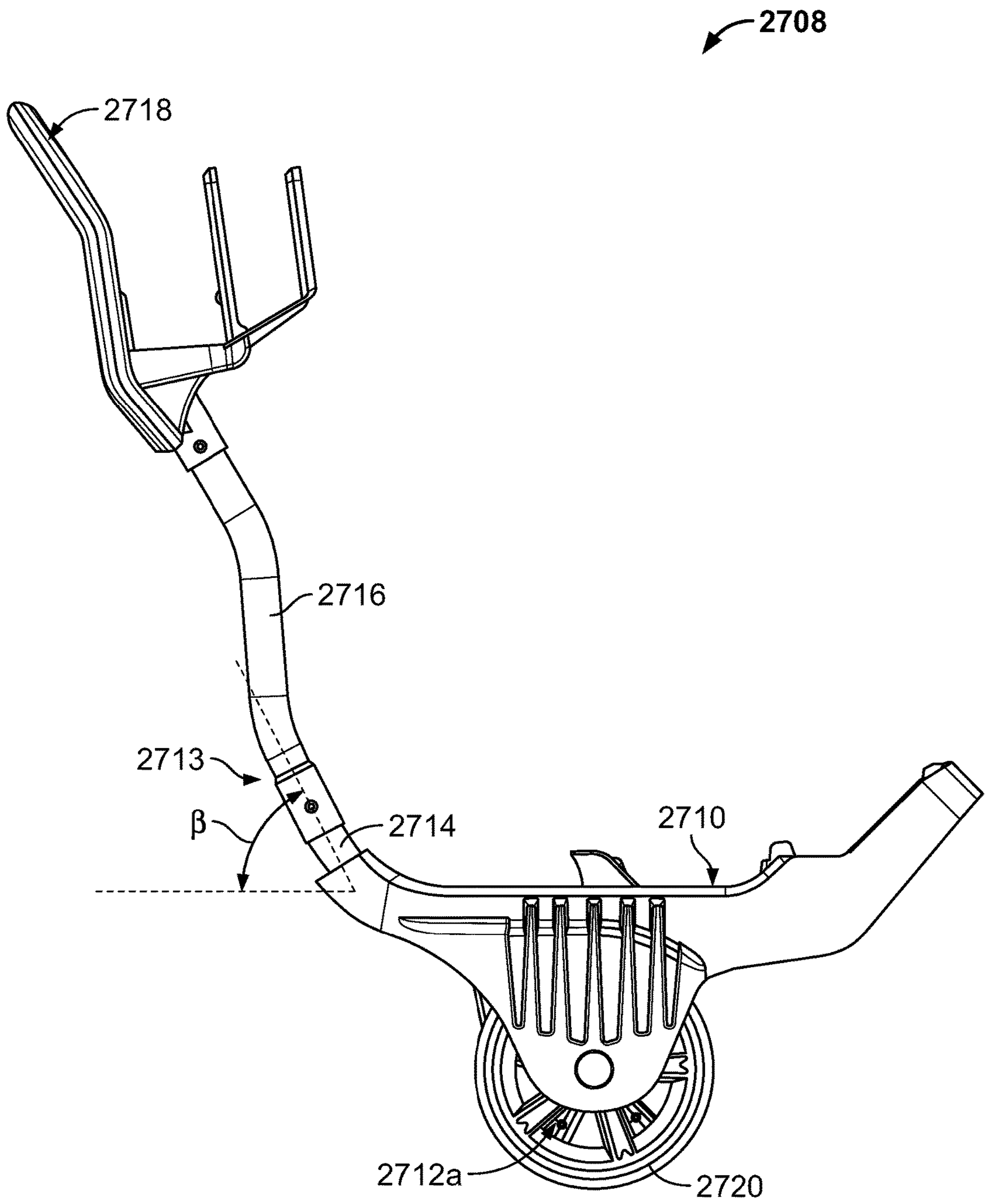
Figure 173:
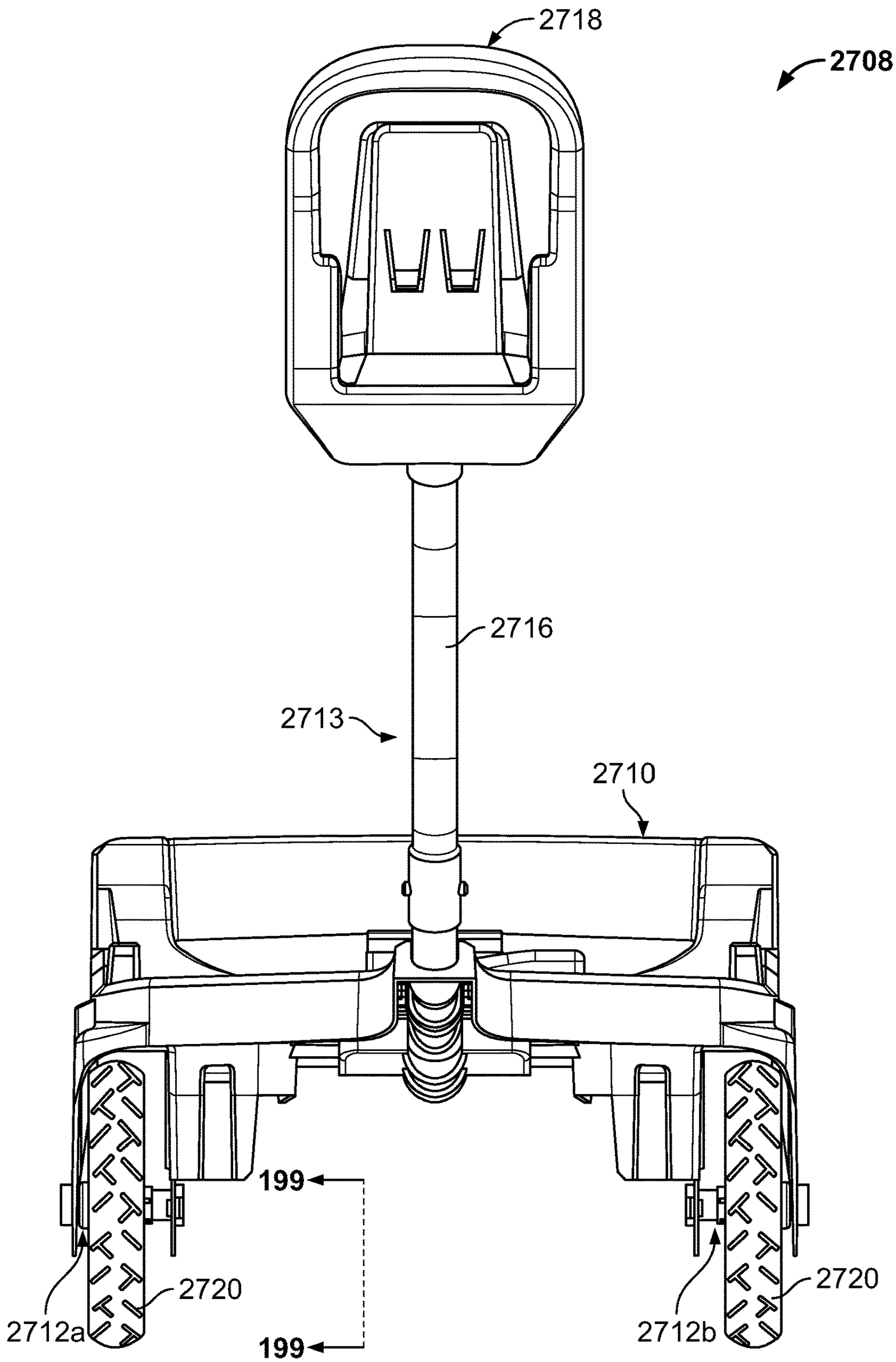
Figure 174:
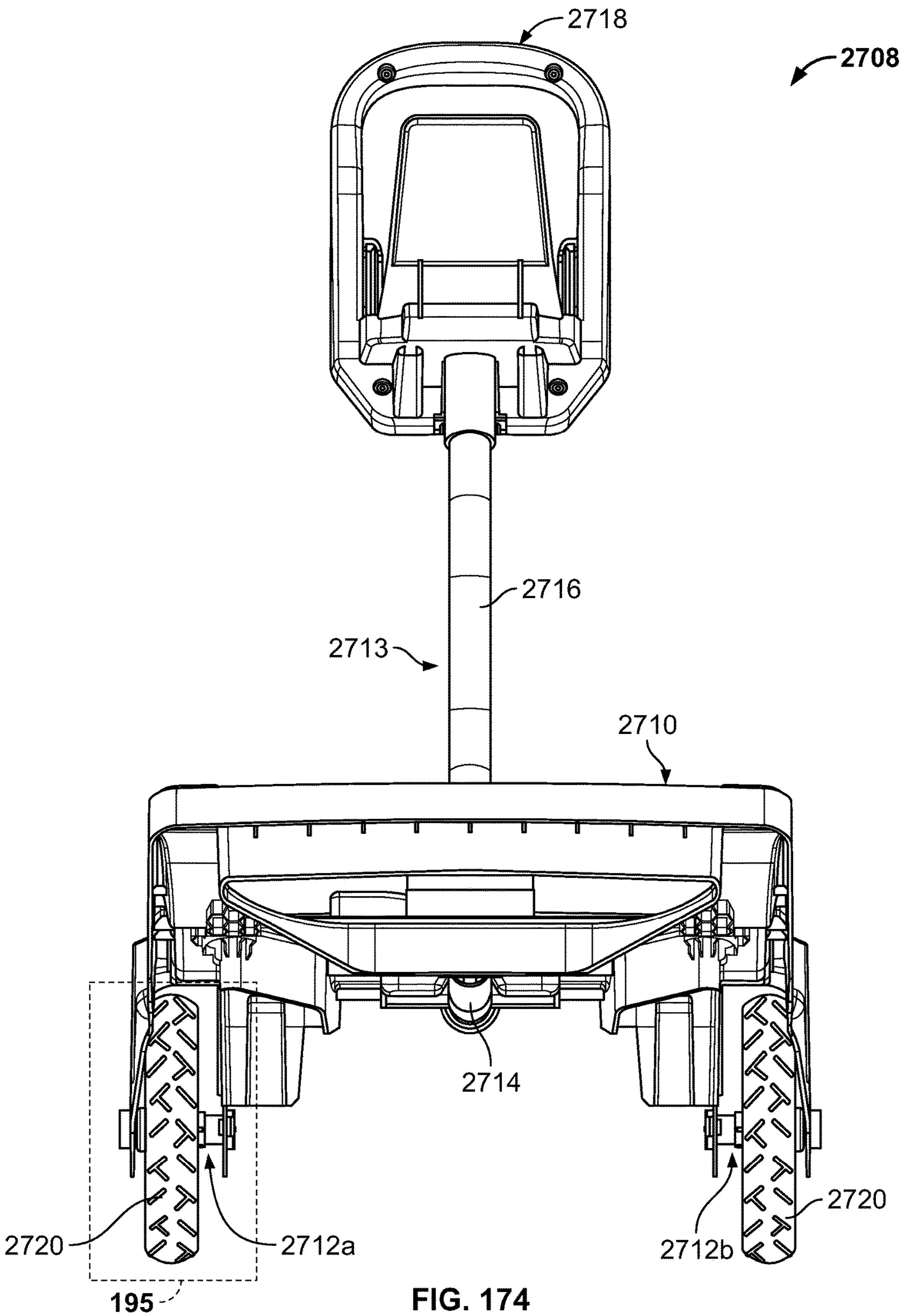
Figure 175:
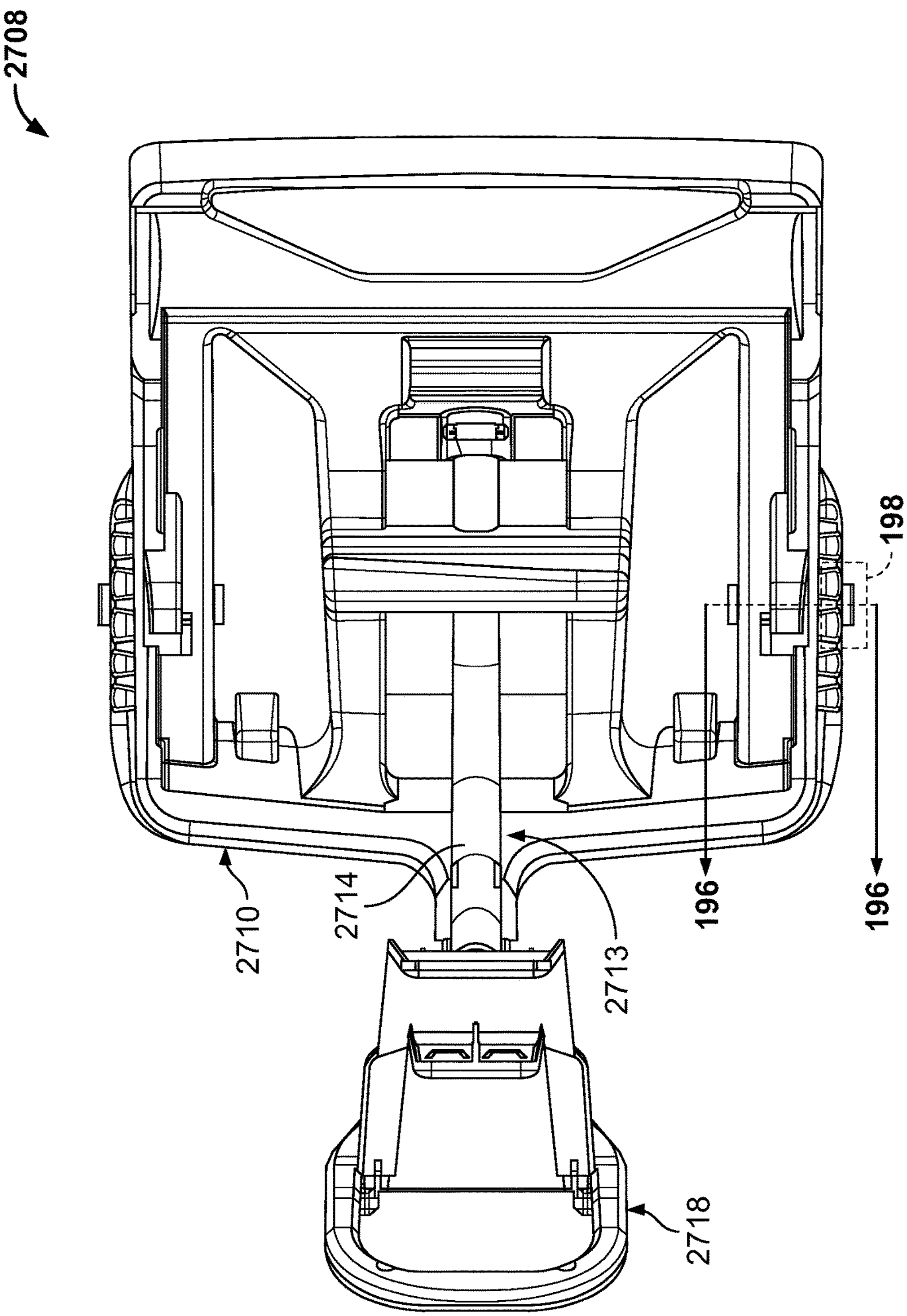
Figure 176:
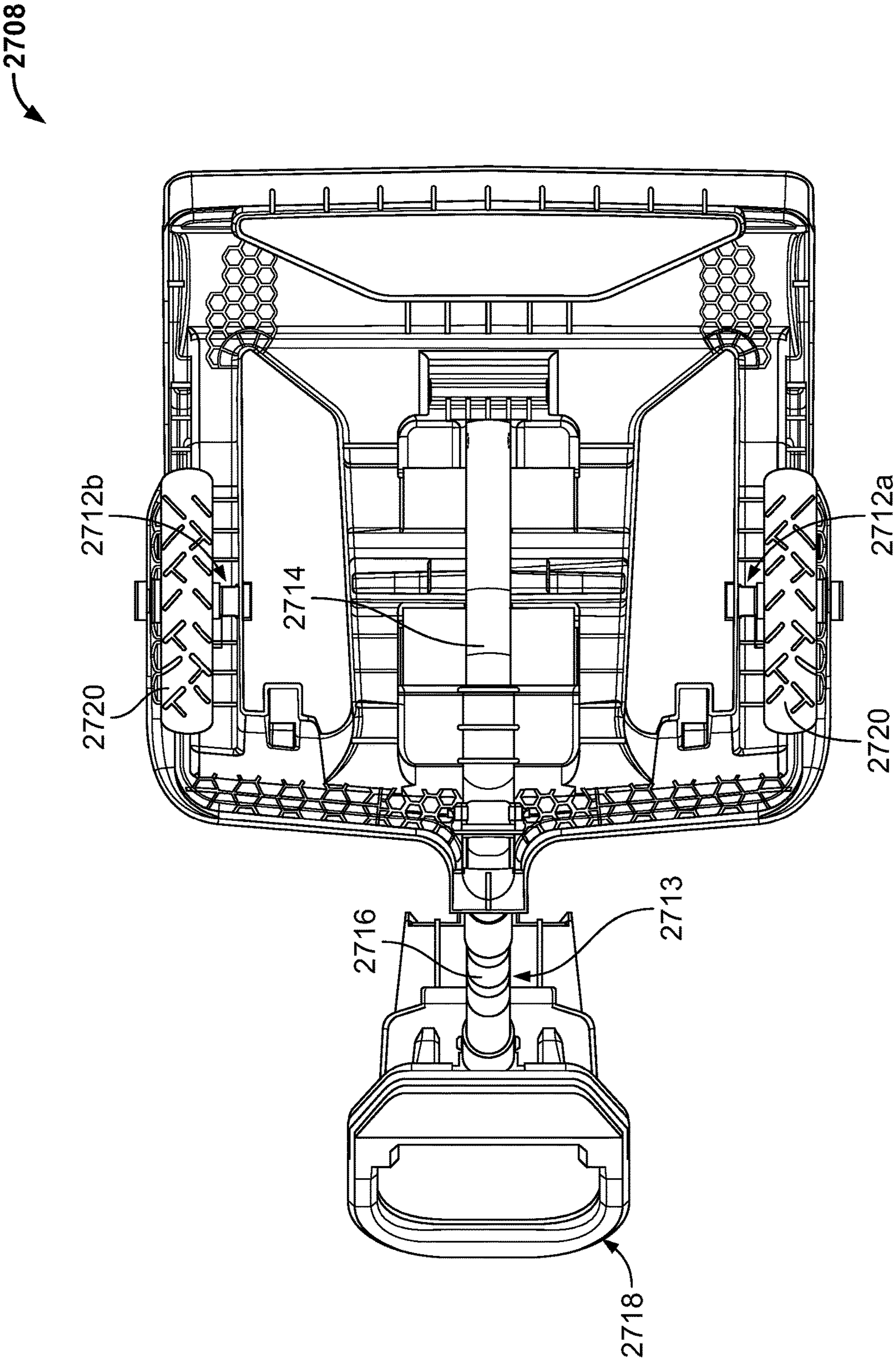
Figure 177:
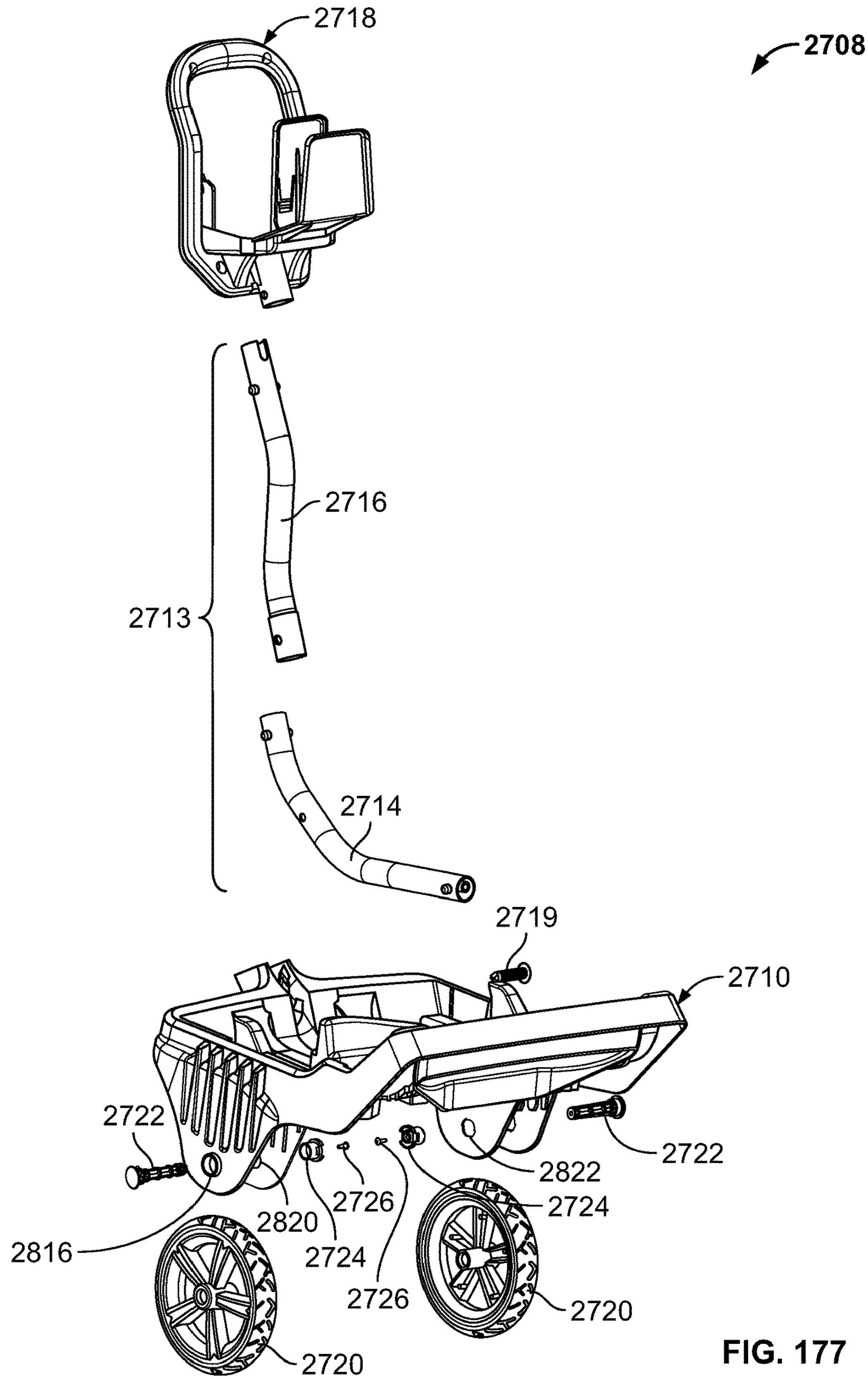
Figure 178:
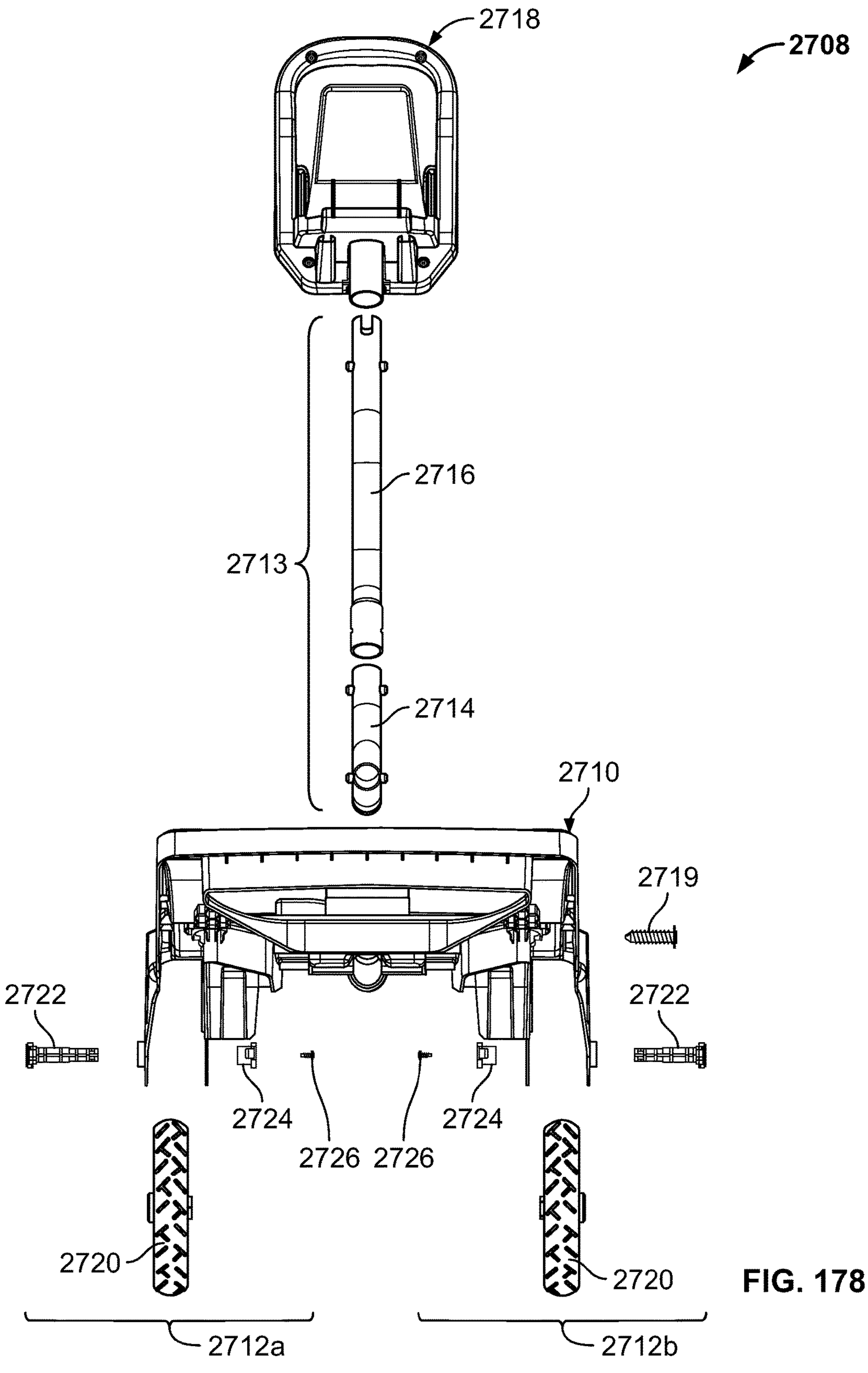
Figure 179:
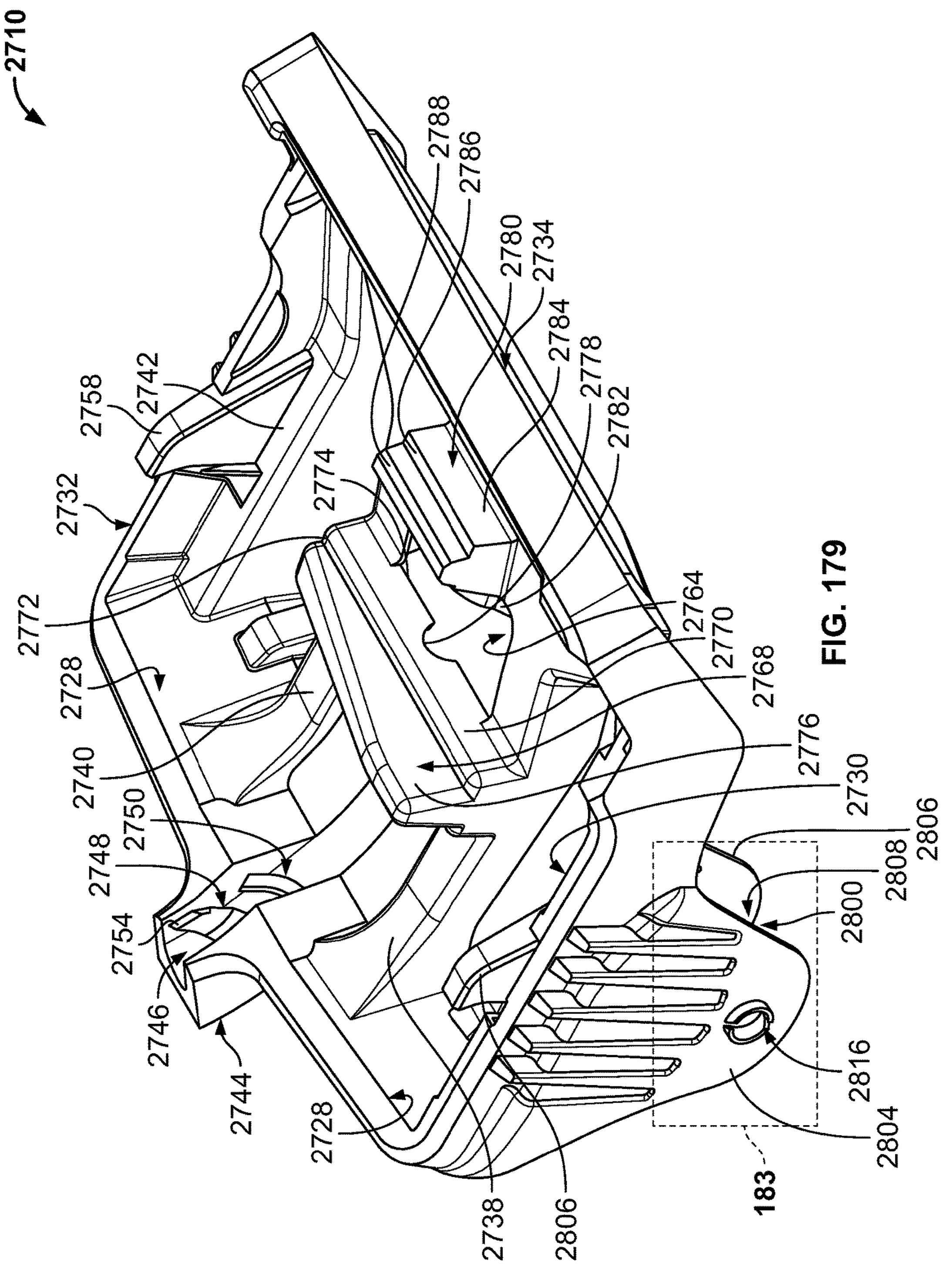
Figure 180:
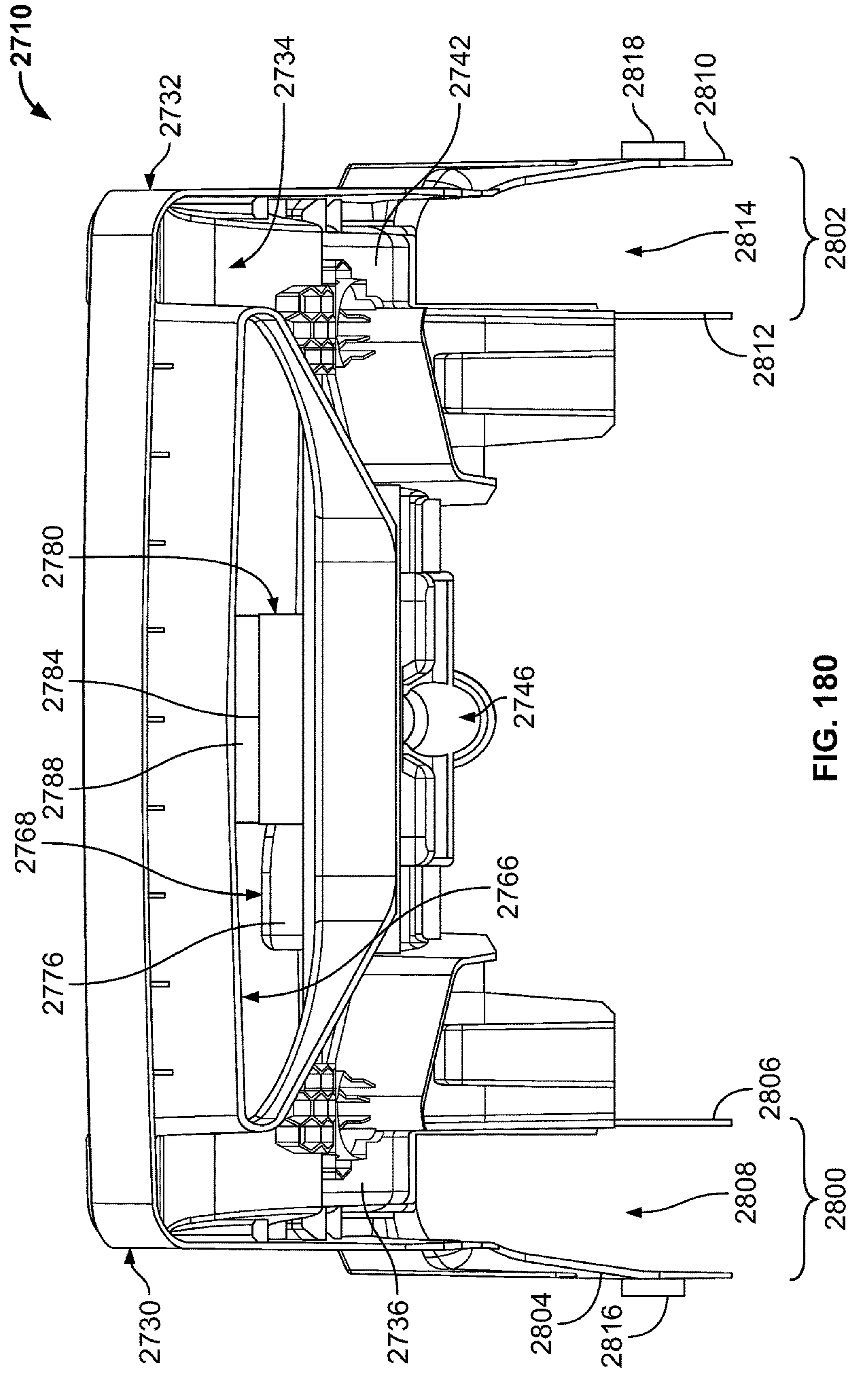
Figure 181:
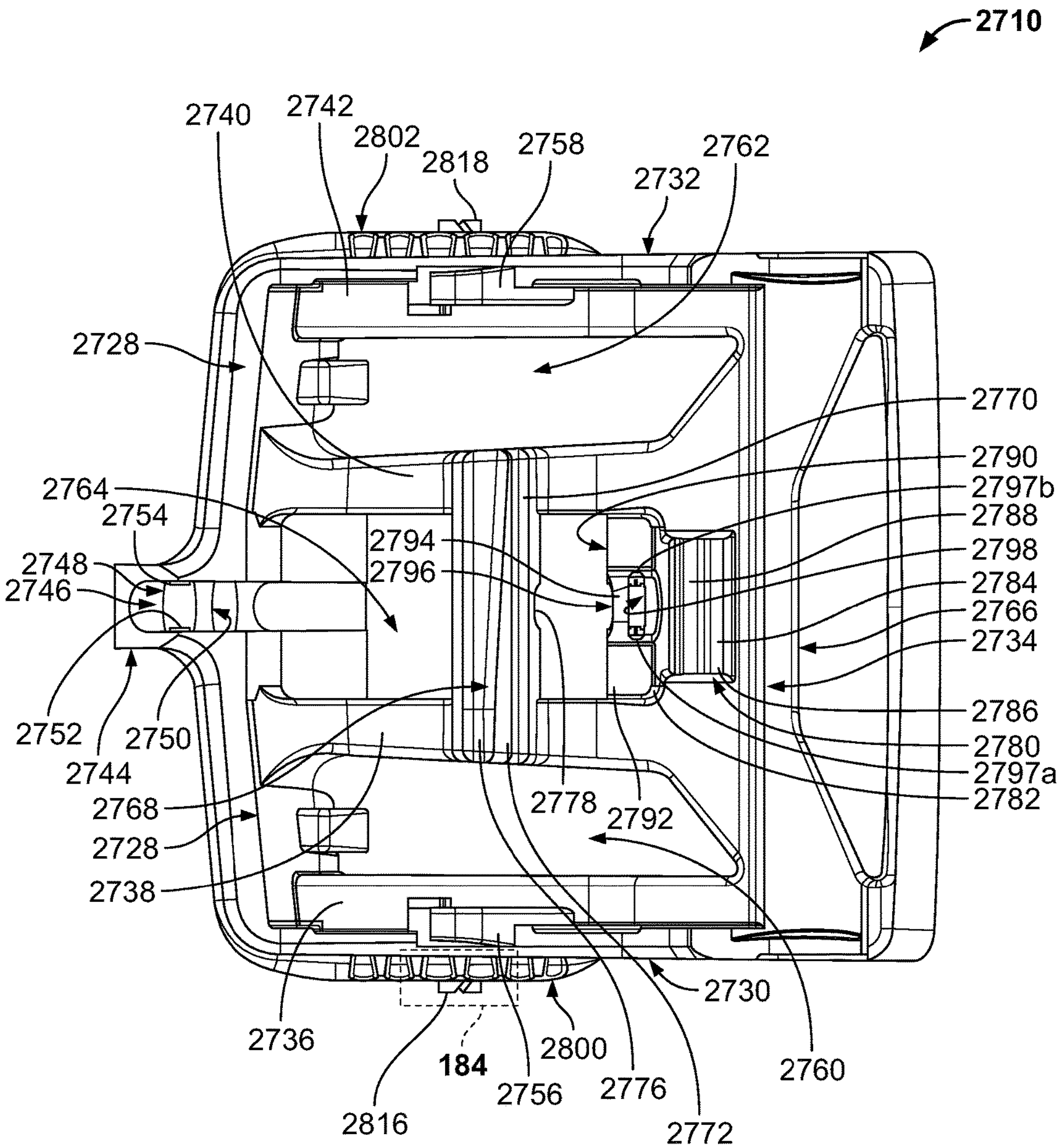
Figure 182:
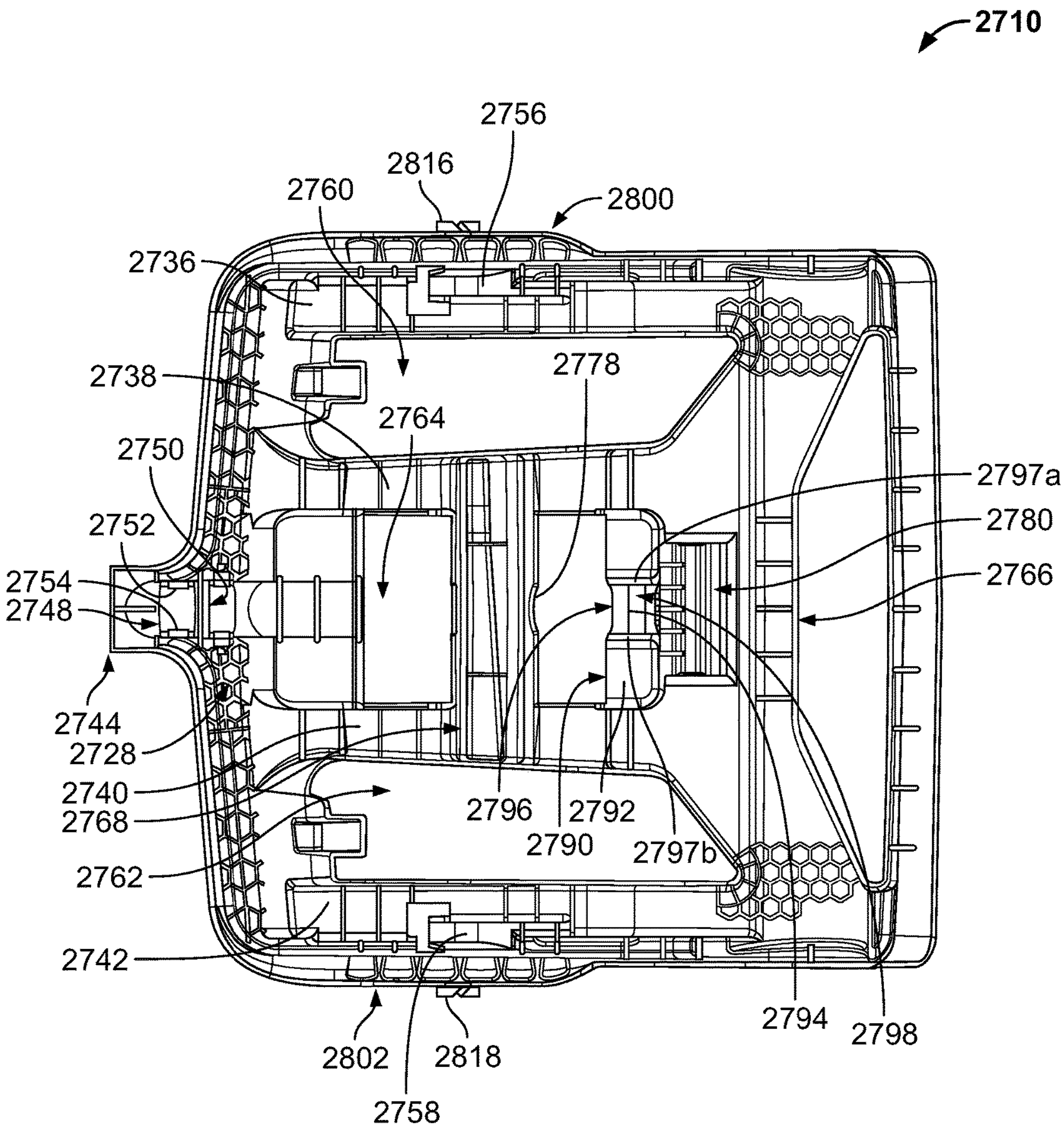
Figure 183:
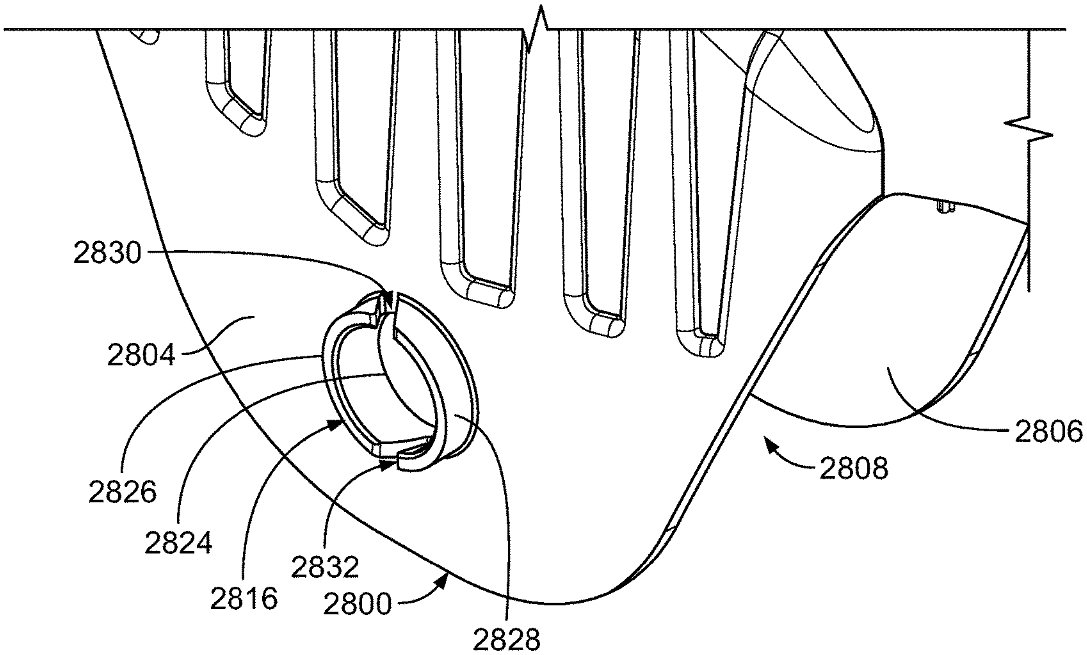
Figure 184:
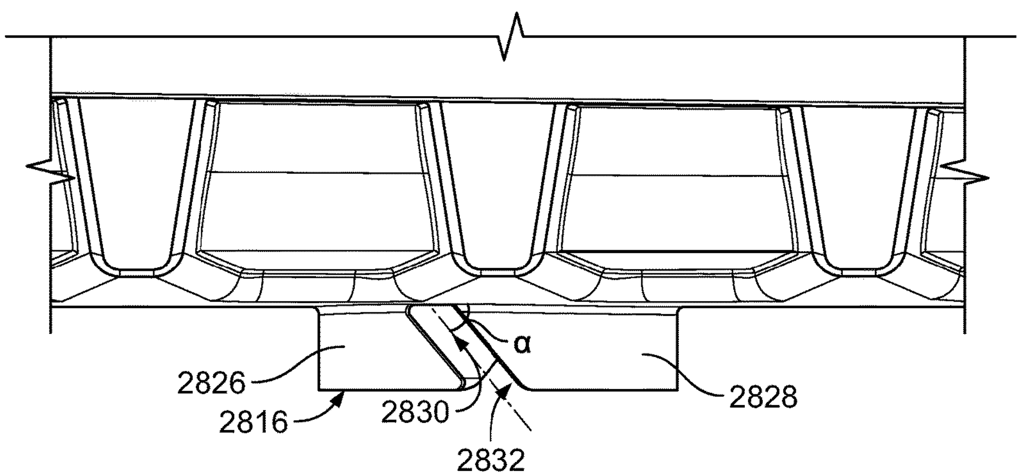
Figure 185:
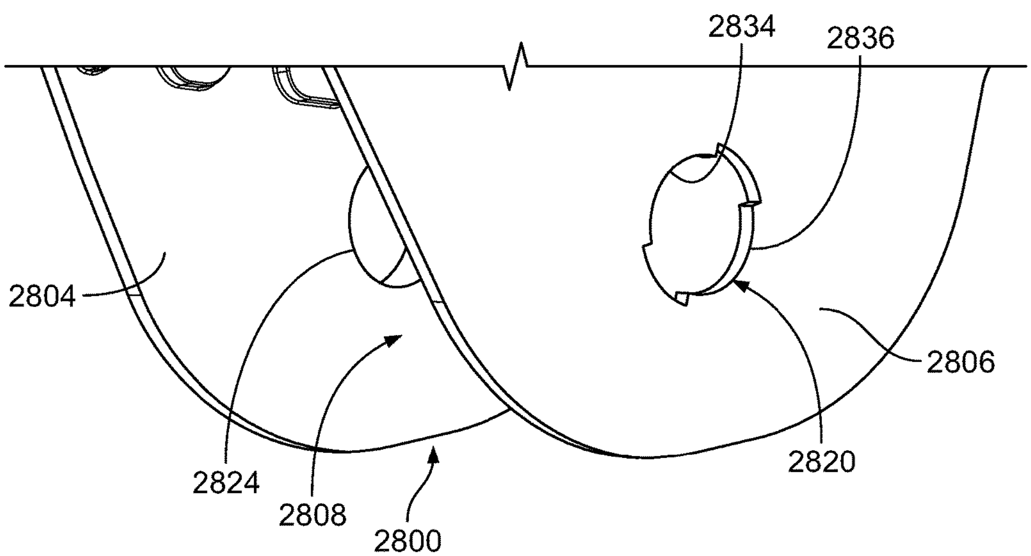
Figure 186:
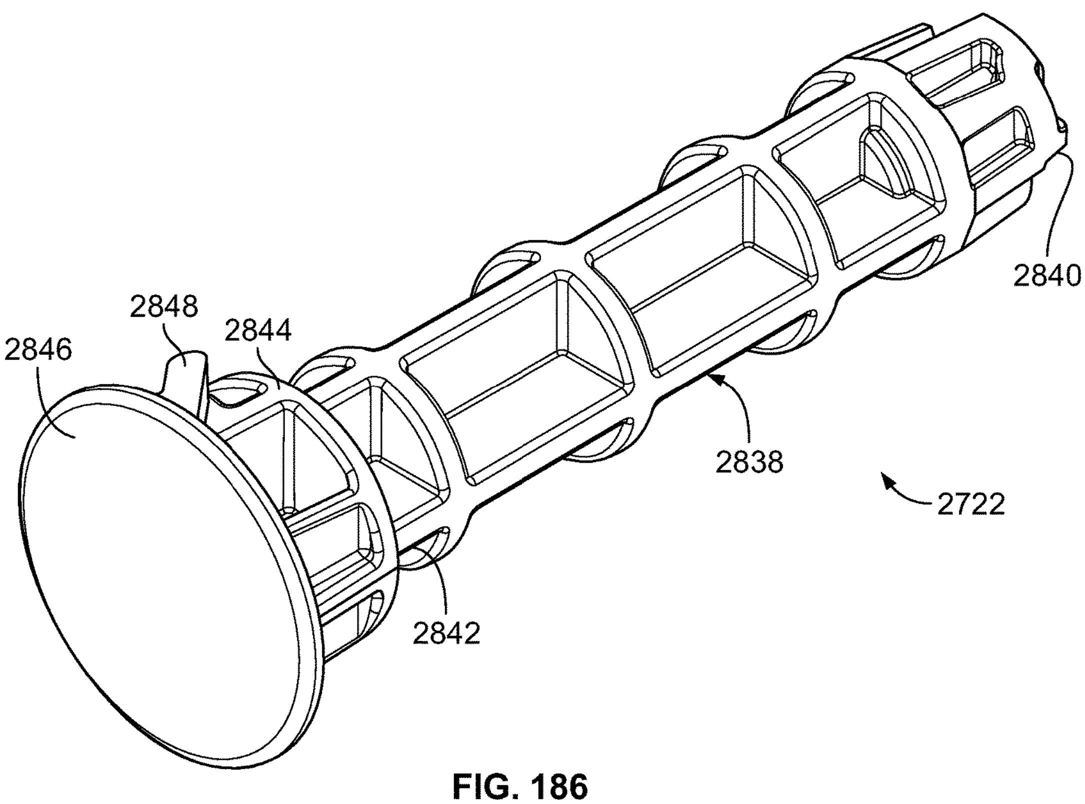
Figure 188:
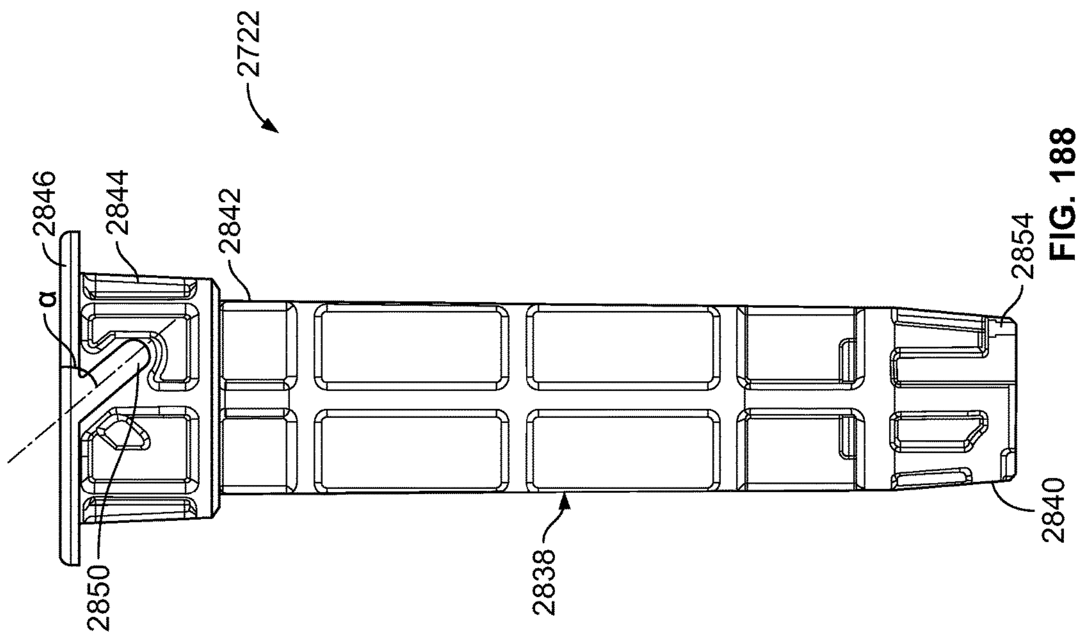
Figure 187:
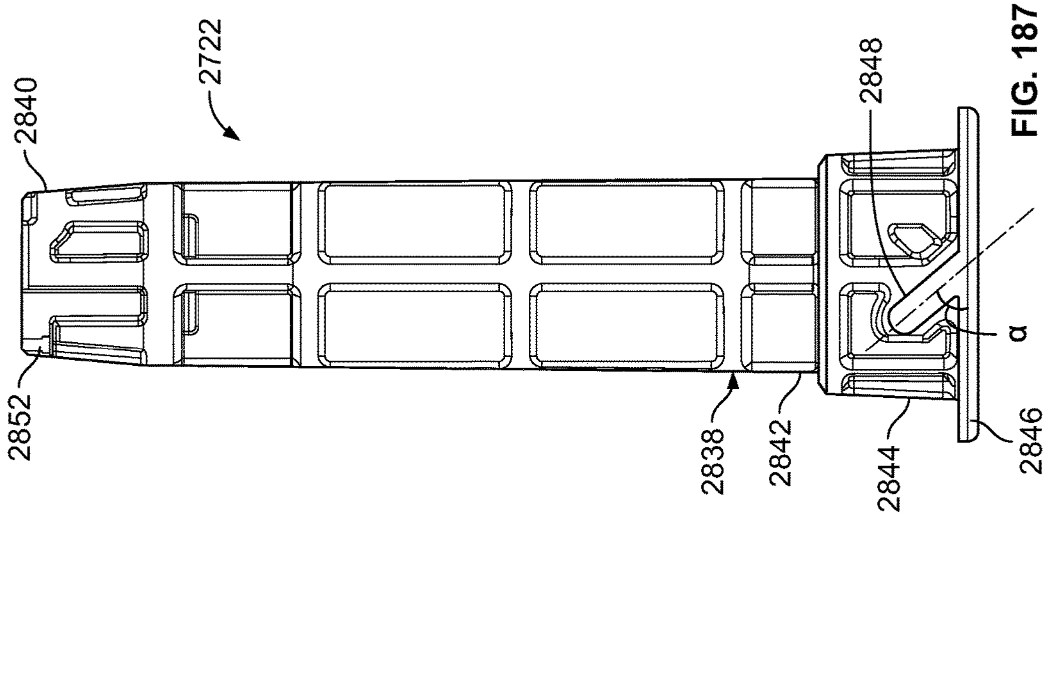
Figure 189:
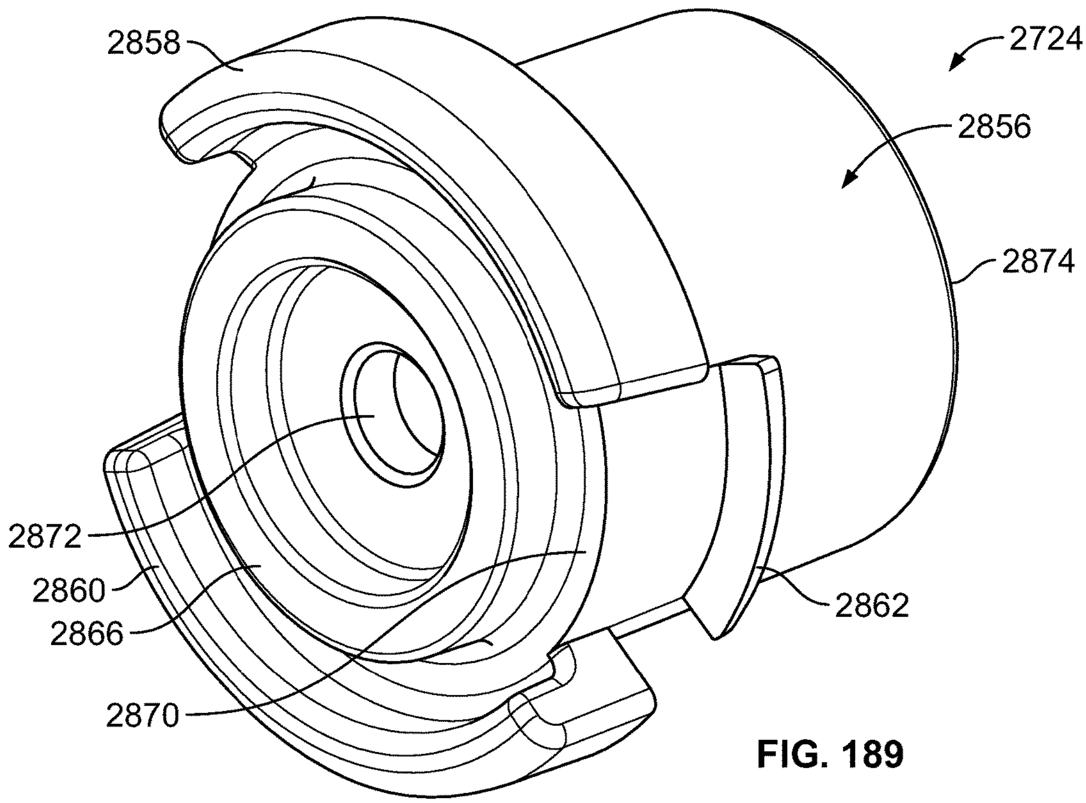
Figure 190:
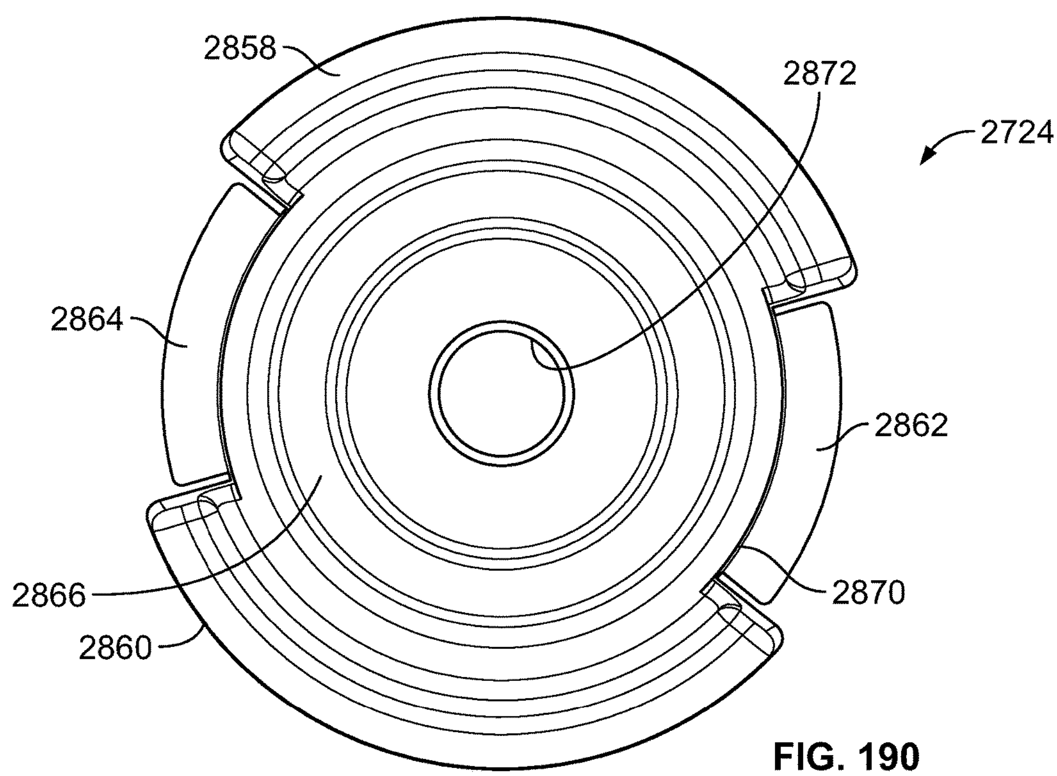
Figure 191:
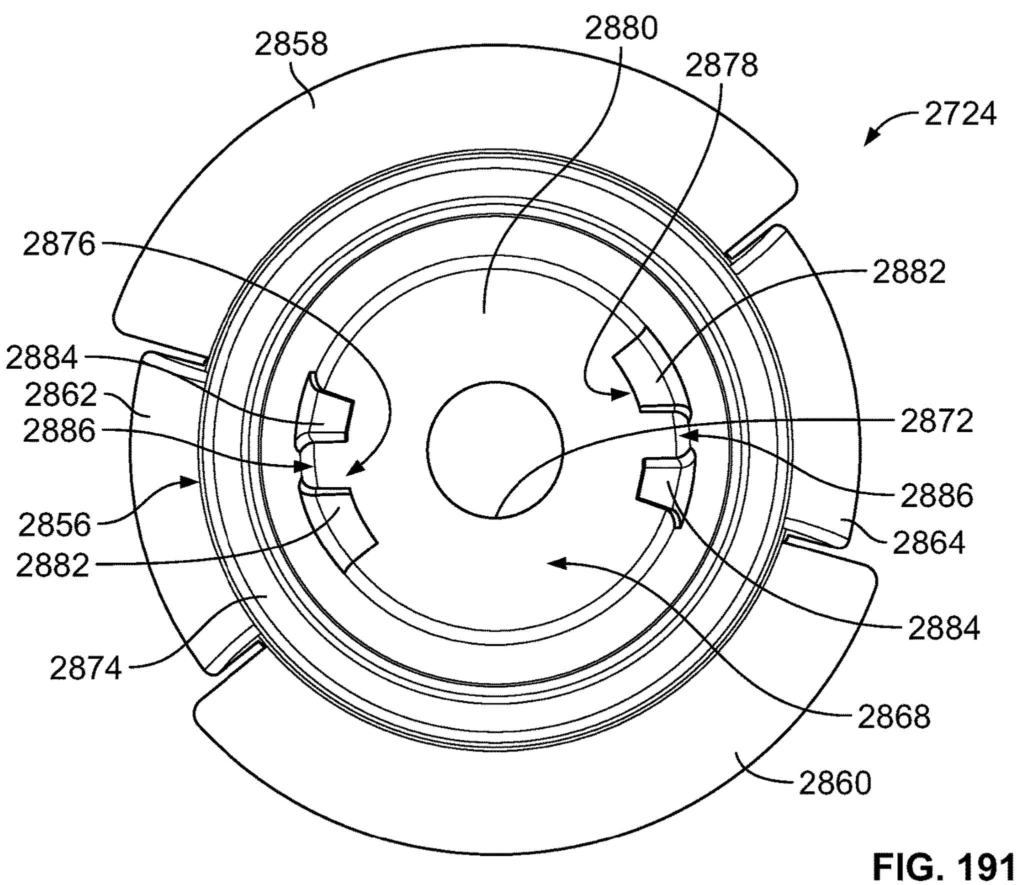
Figure 192:
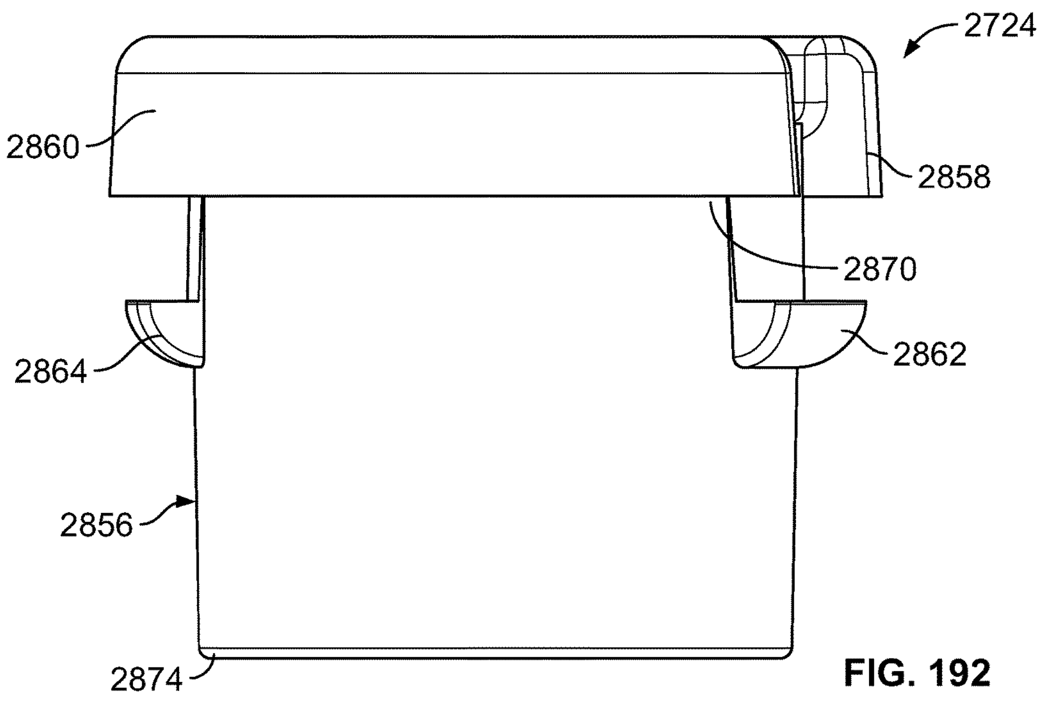
Figure 193:
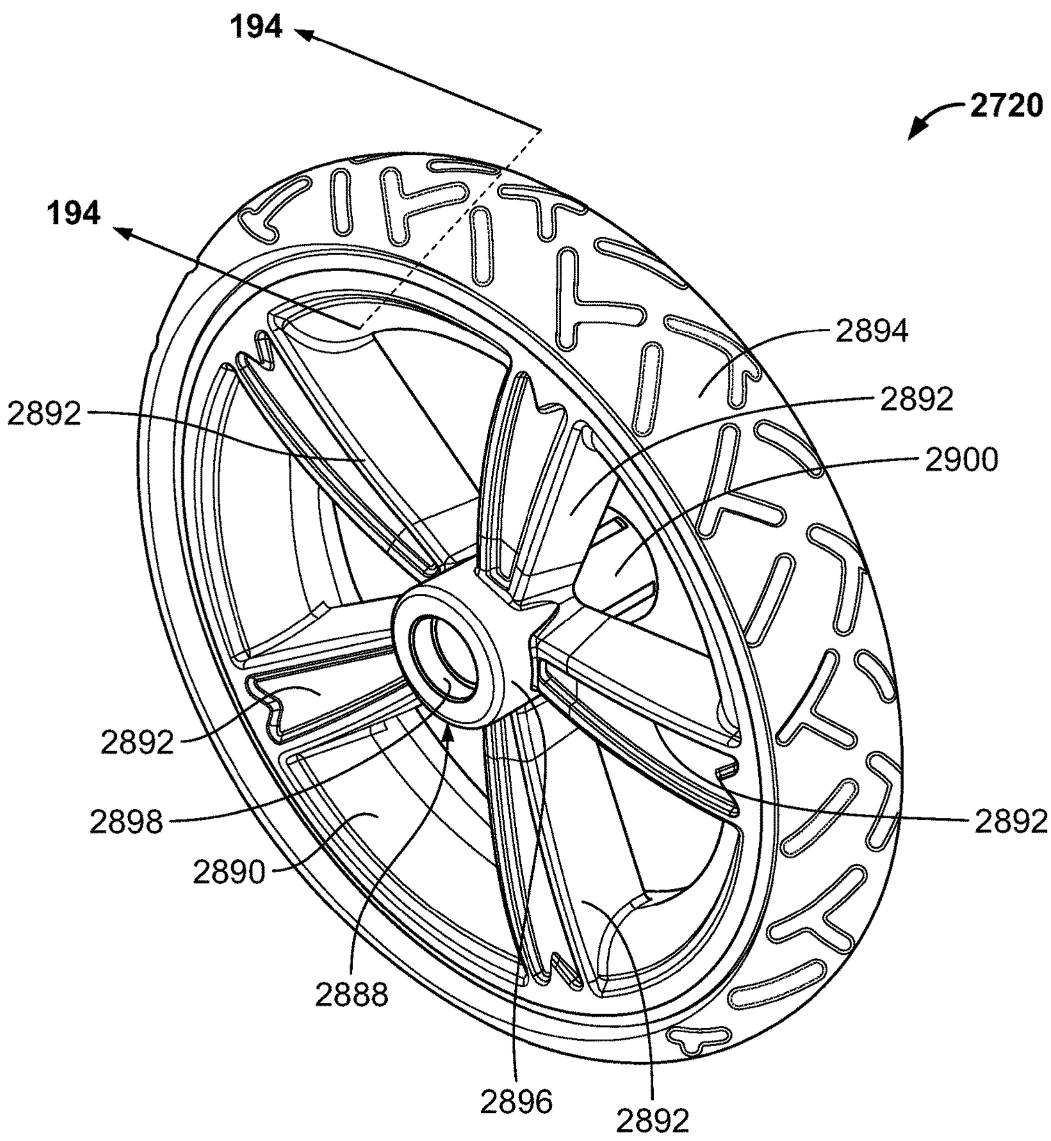
Figure 194:
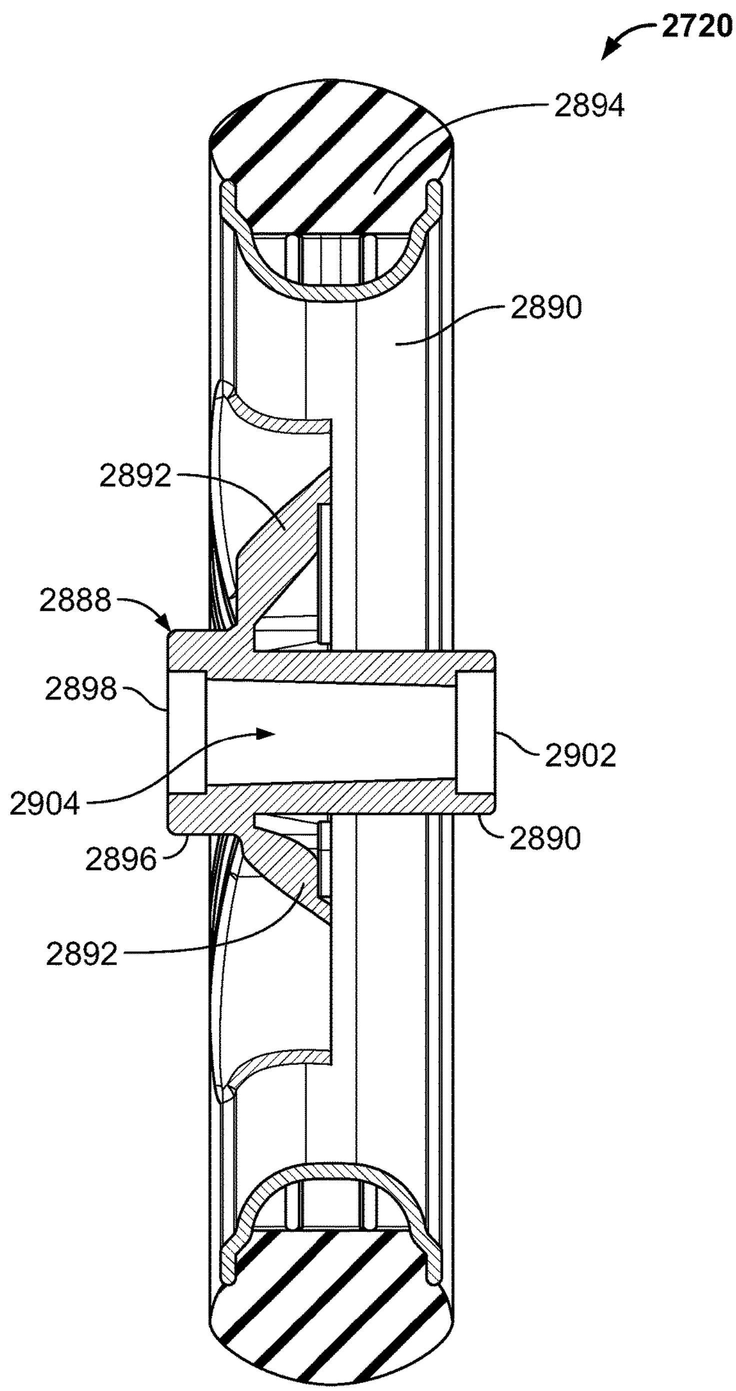
Figure 195:
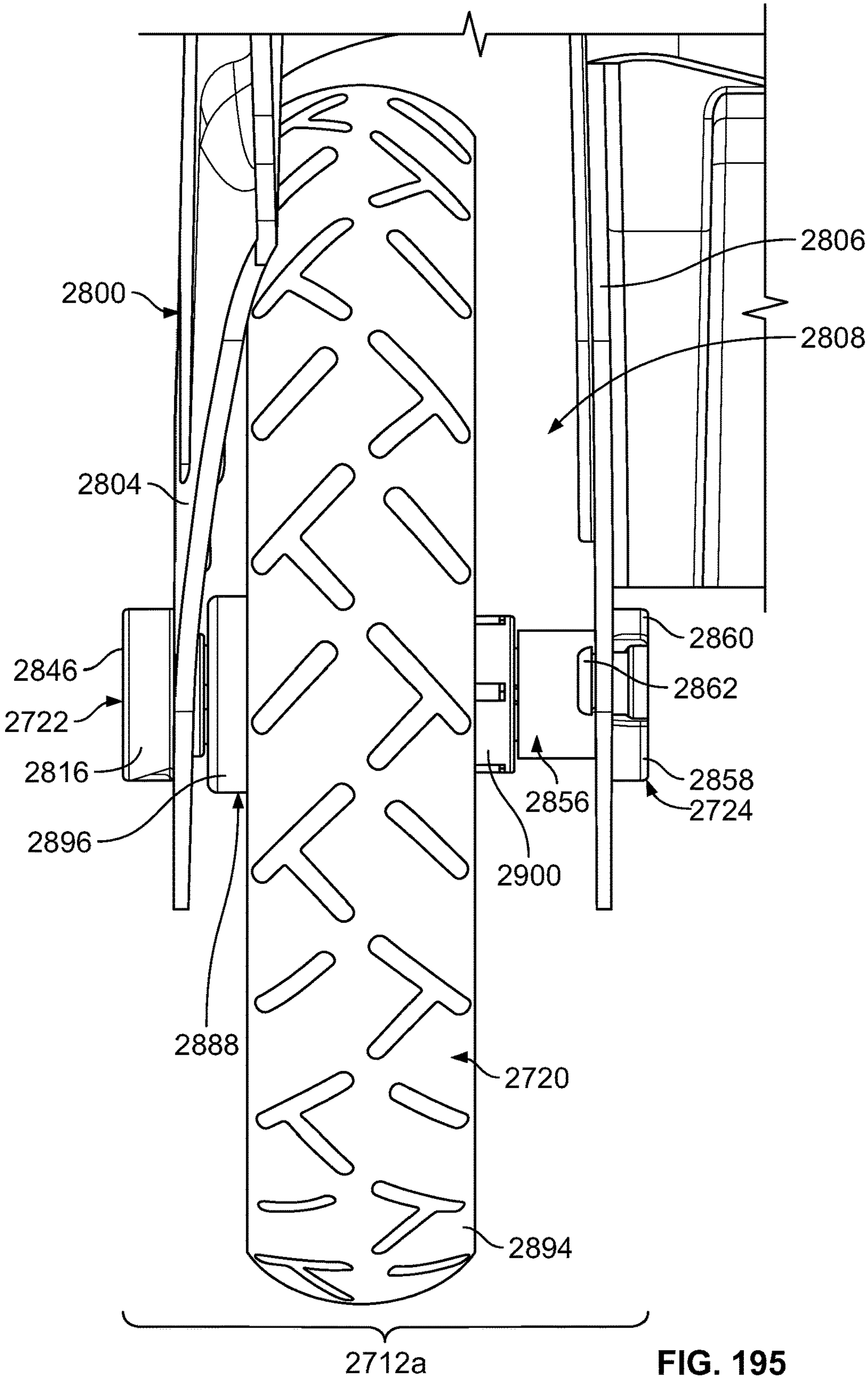
Figure 196:
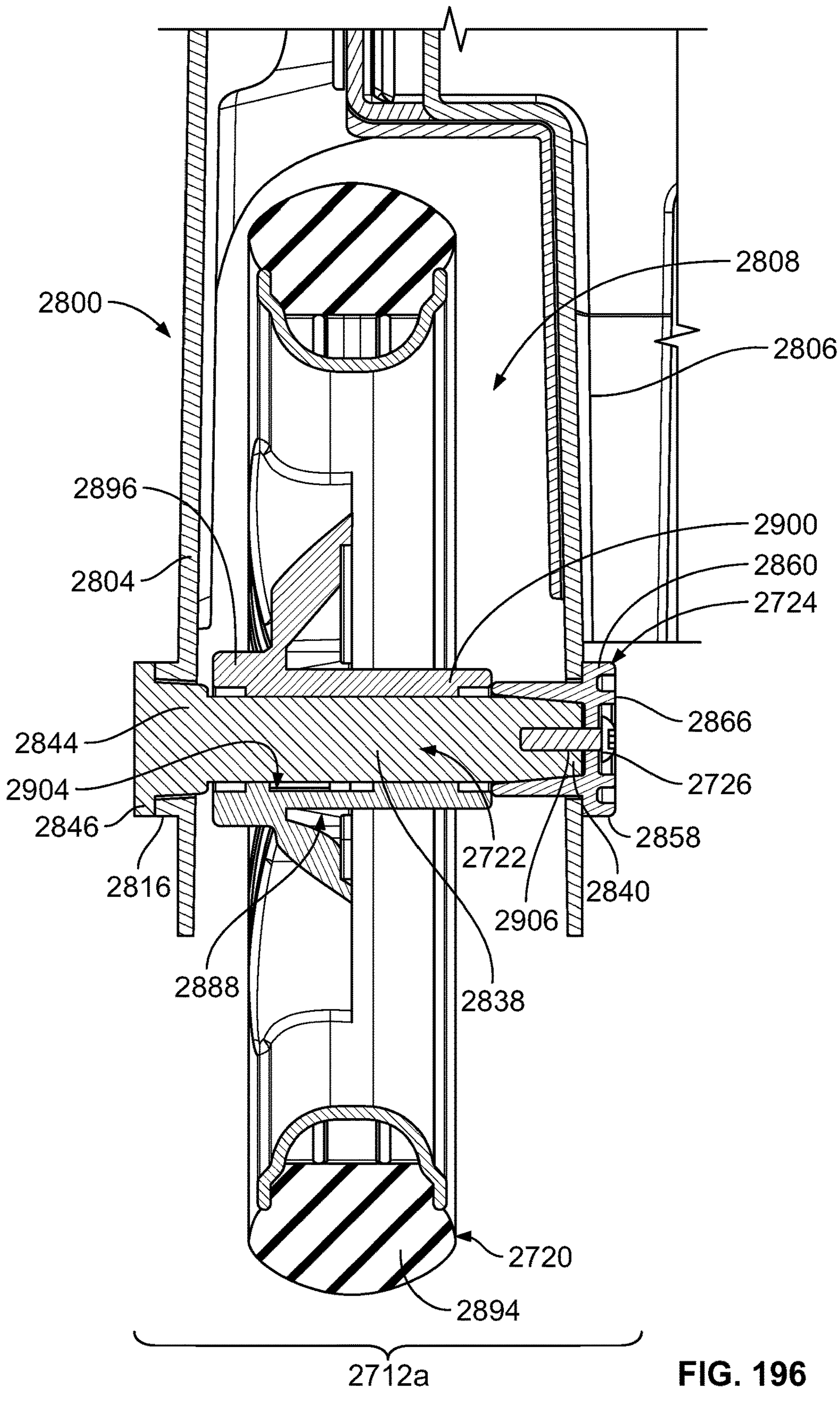
Figure 197:
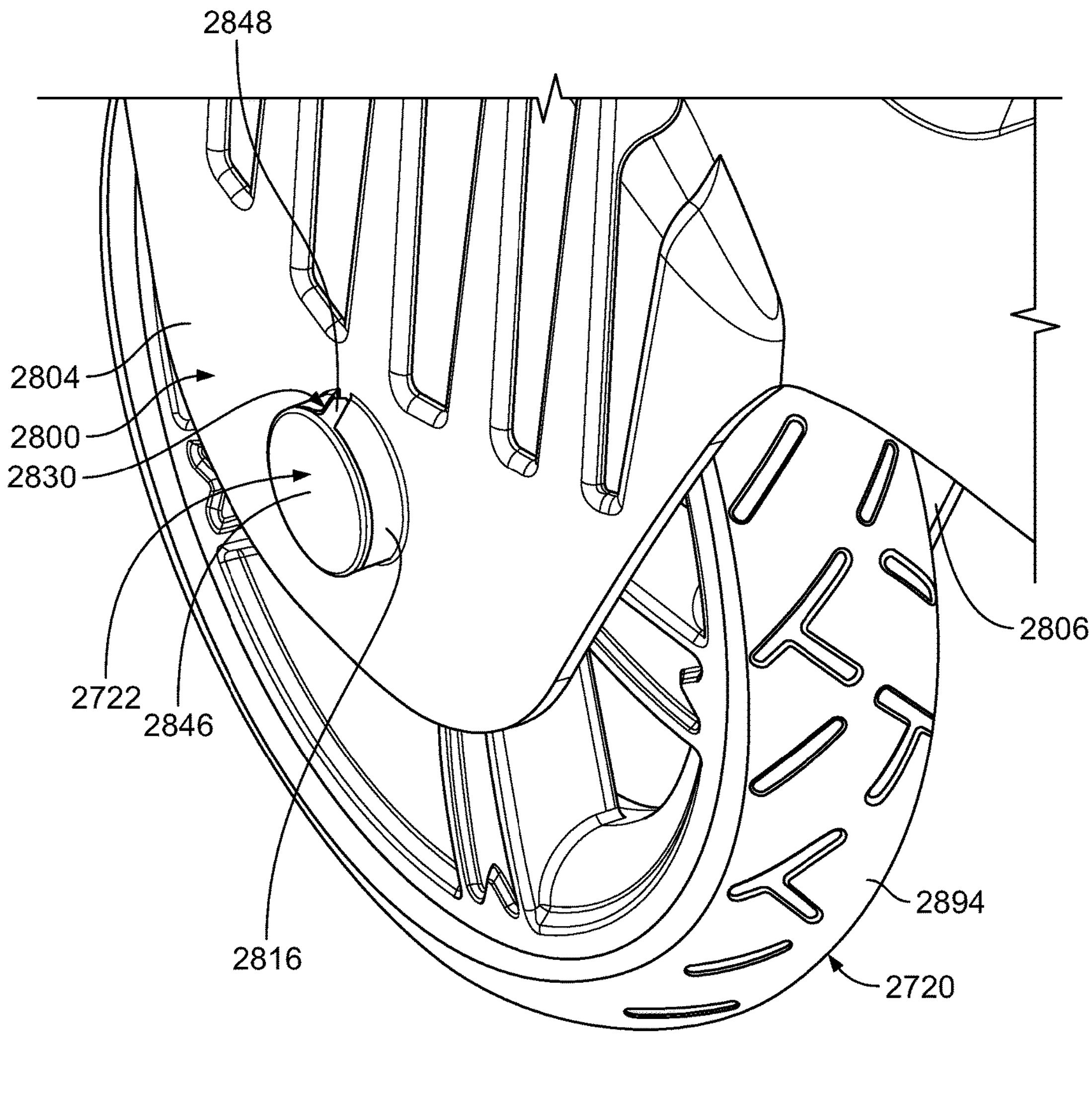
Figure 198:
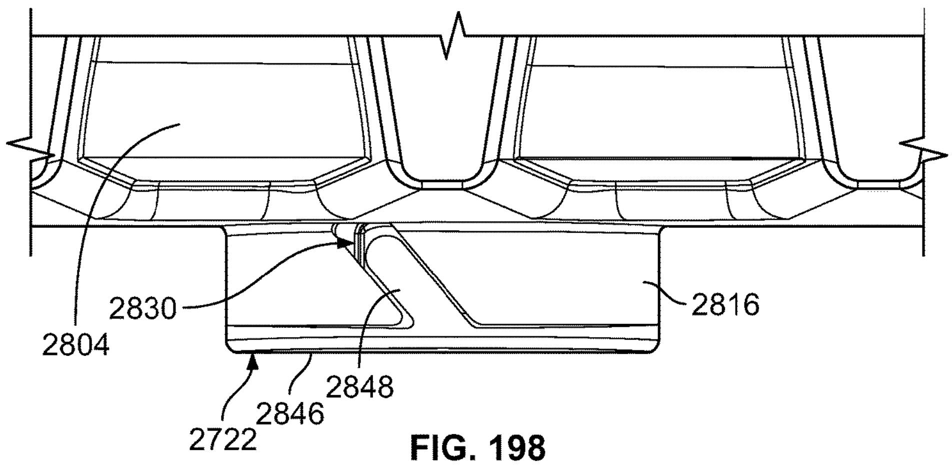
Figure 199:
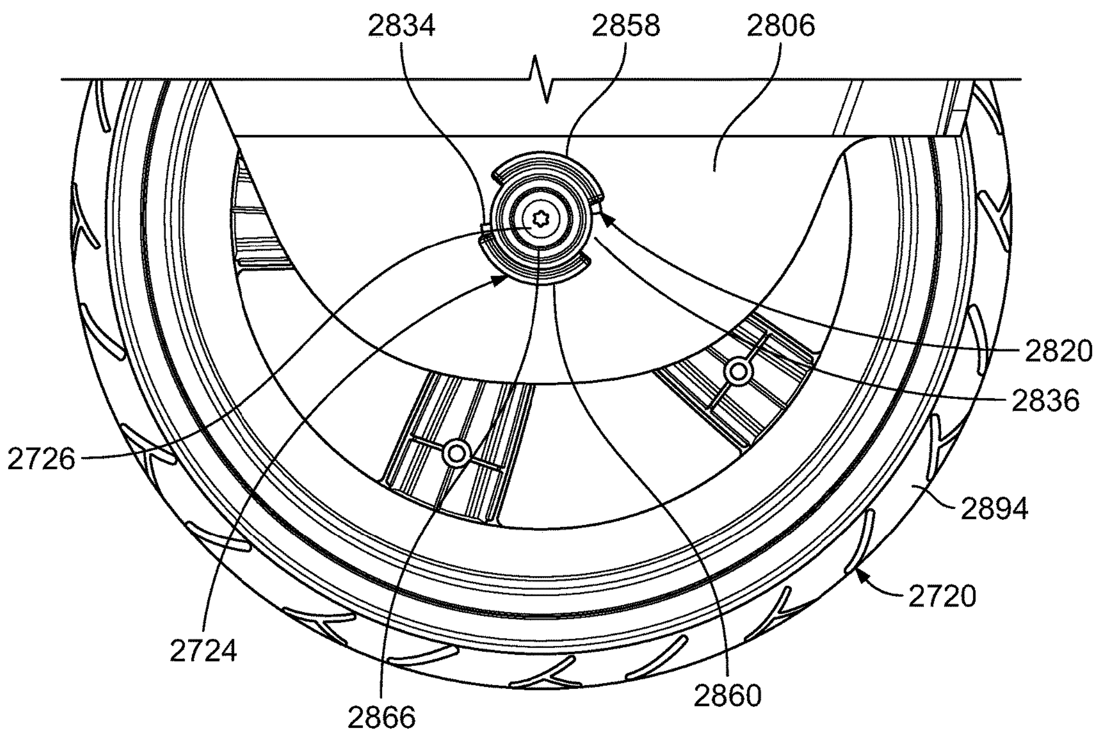
Figure 200:
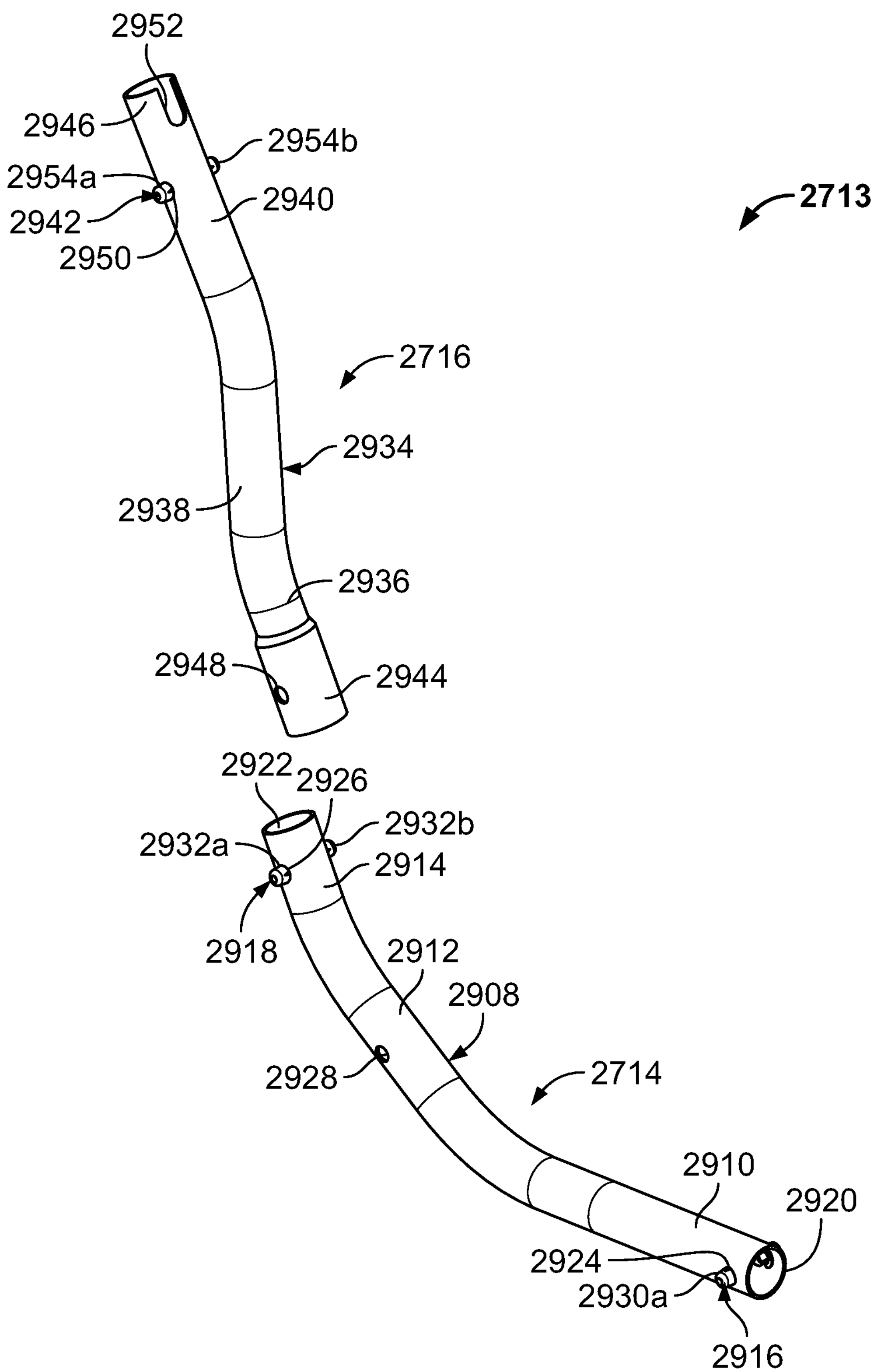
Figure 201:
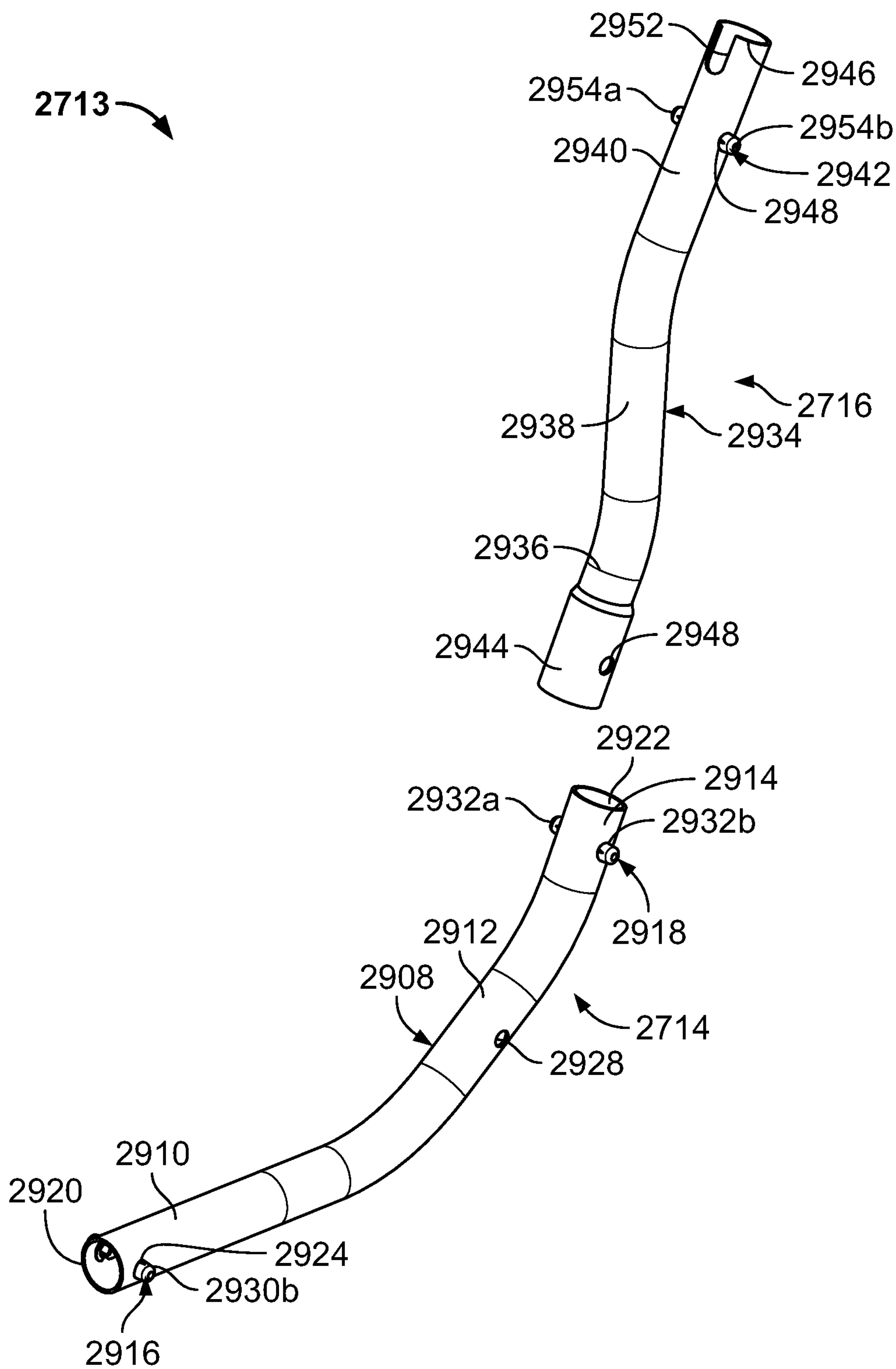
Figure 202:
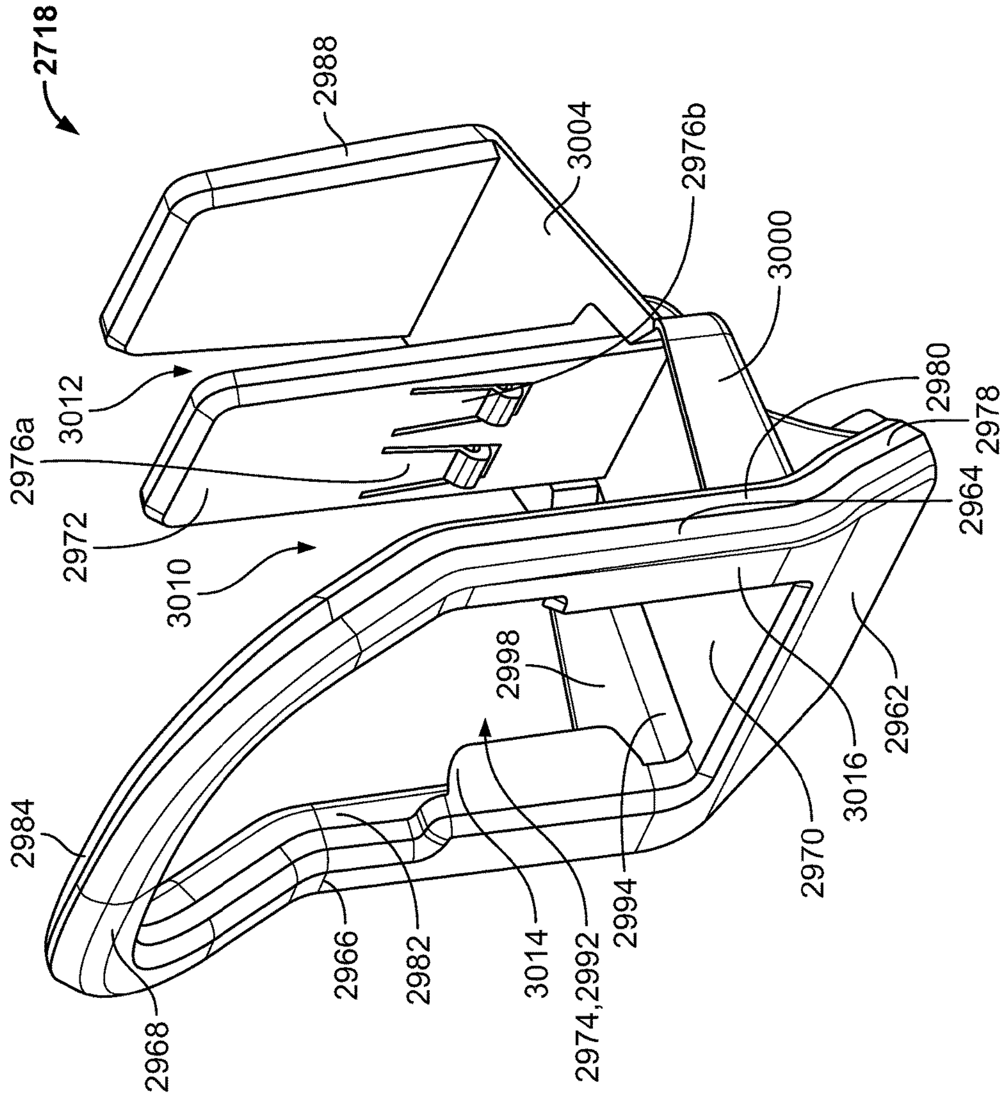
Figure 203:
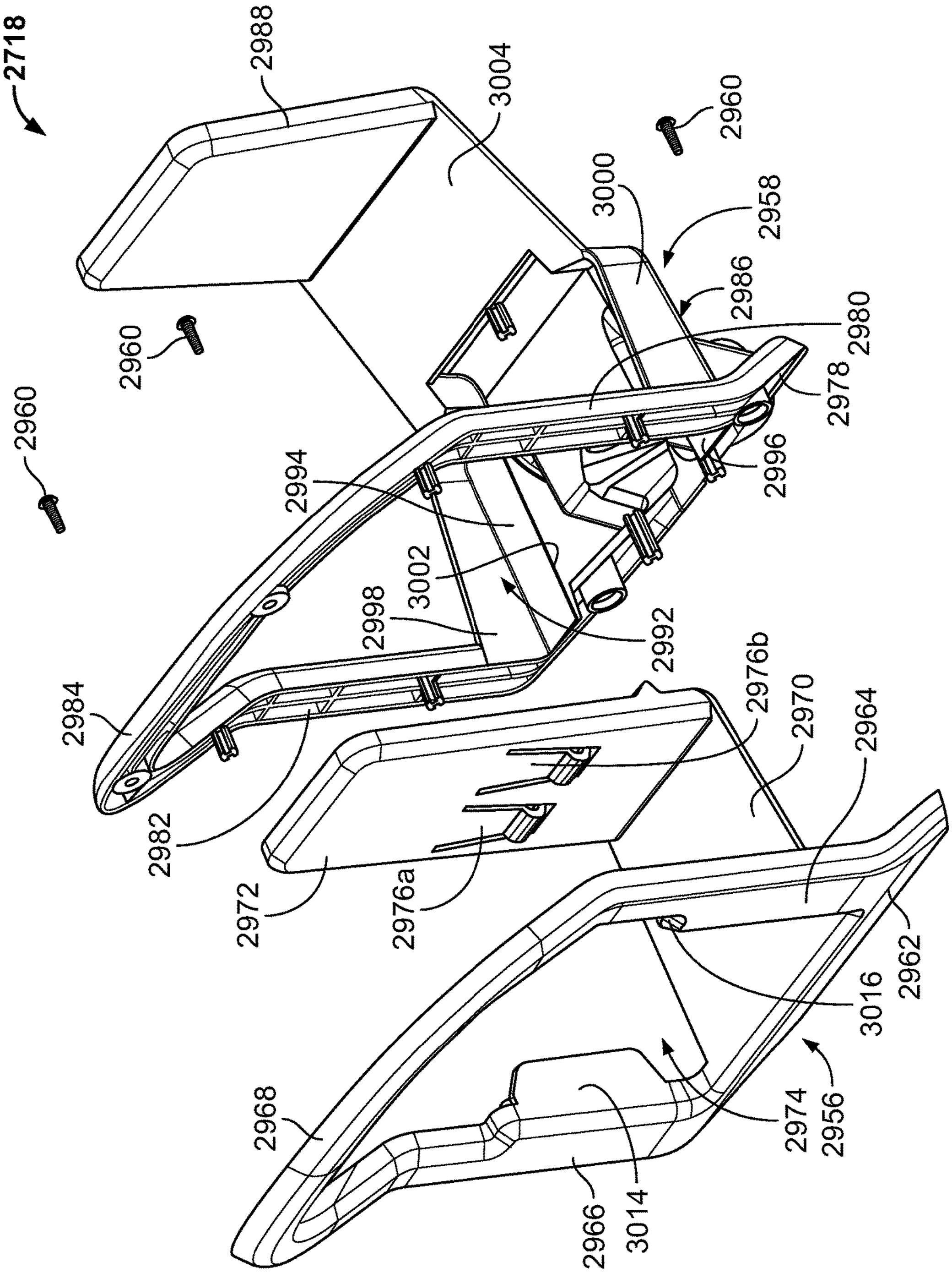
Figure 204:
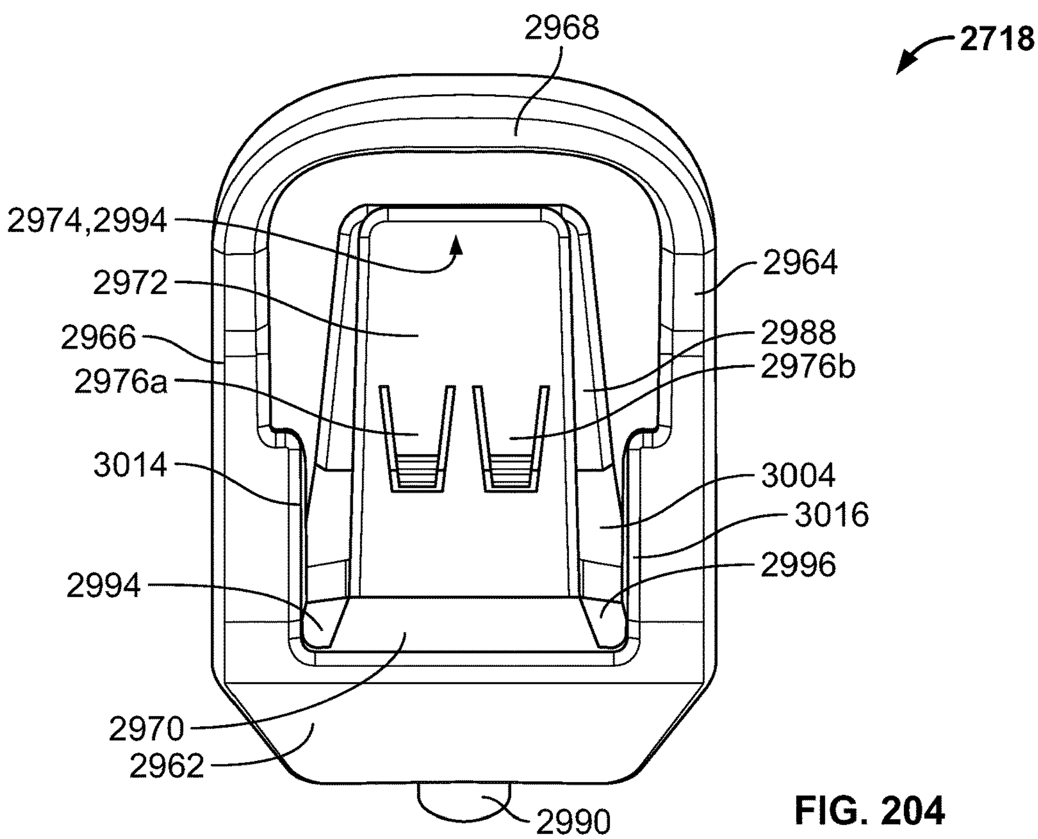
Figure 205:
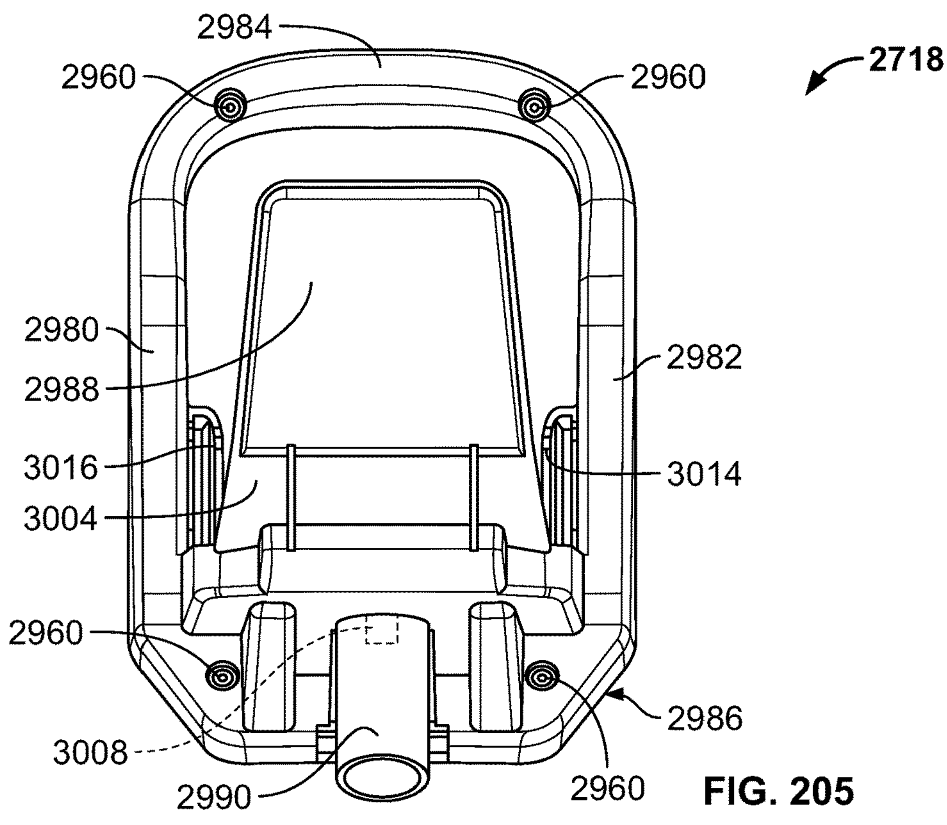
Figure 206:
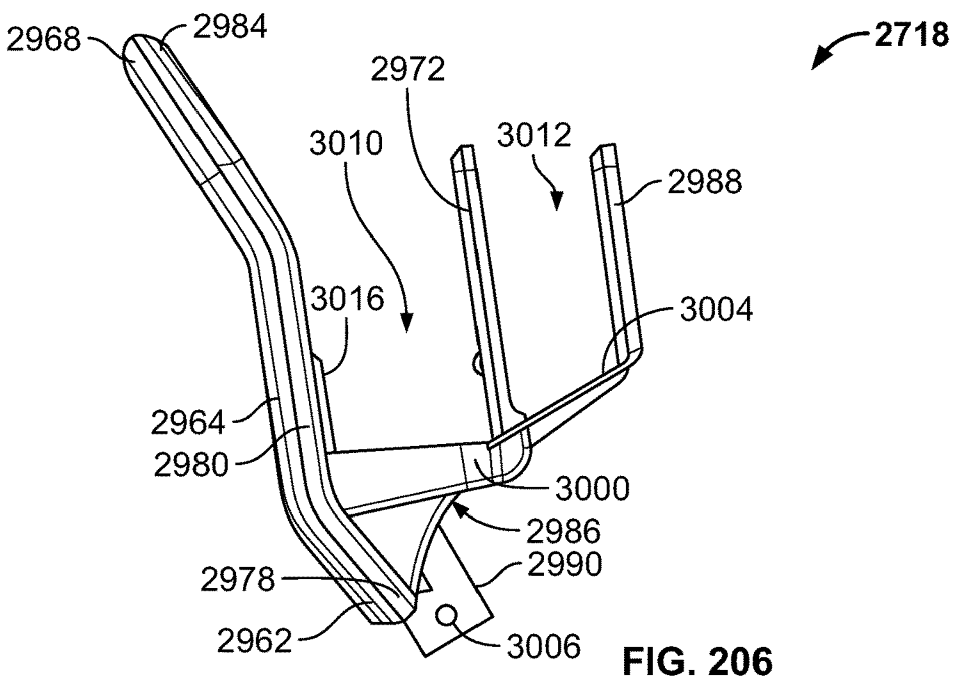
Figure 207:
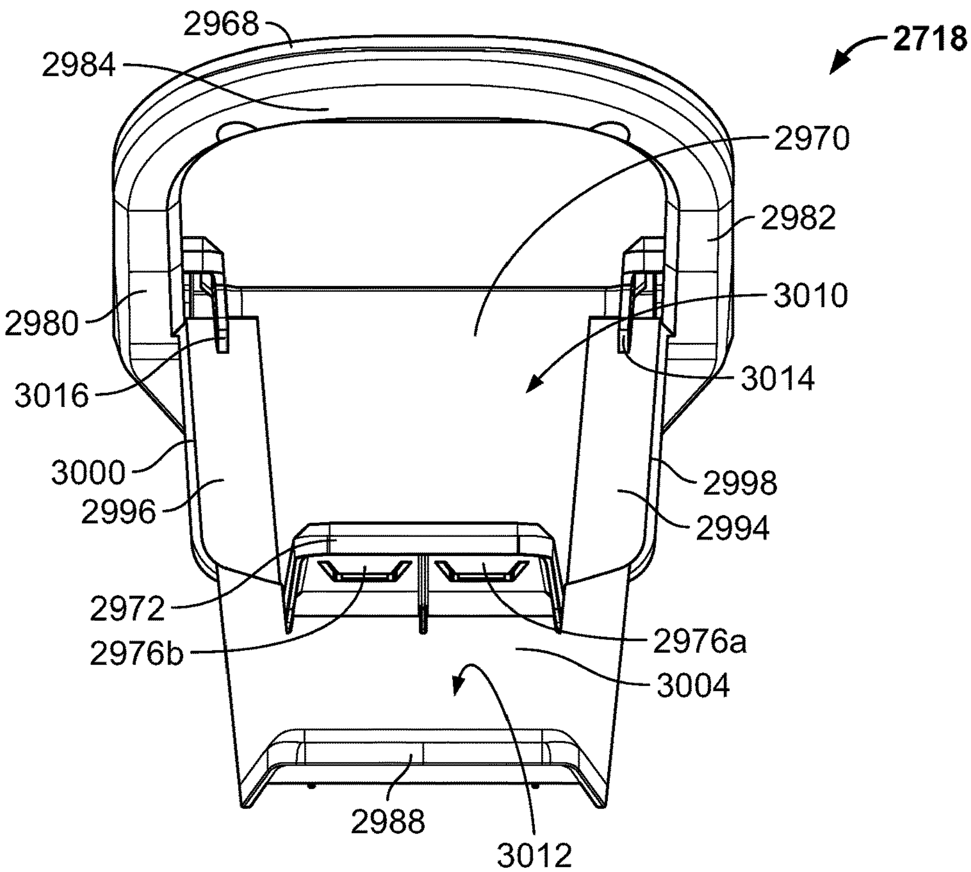
Figure 208:
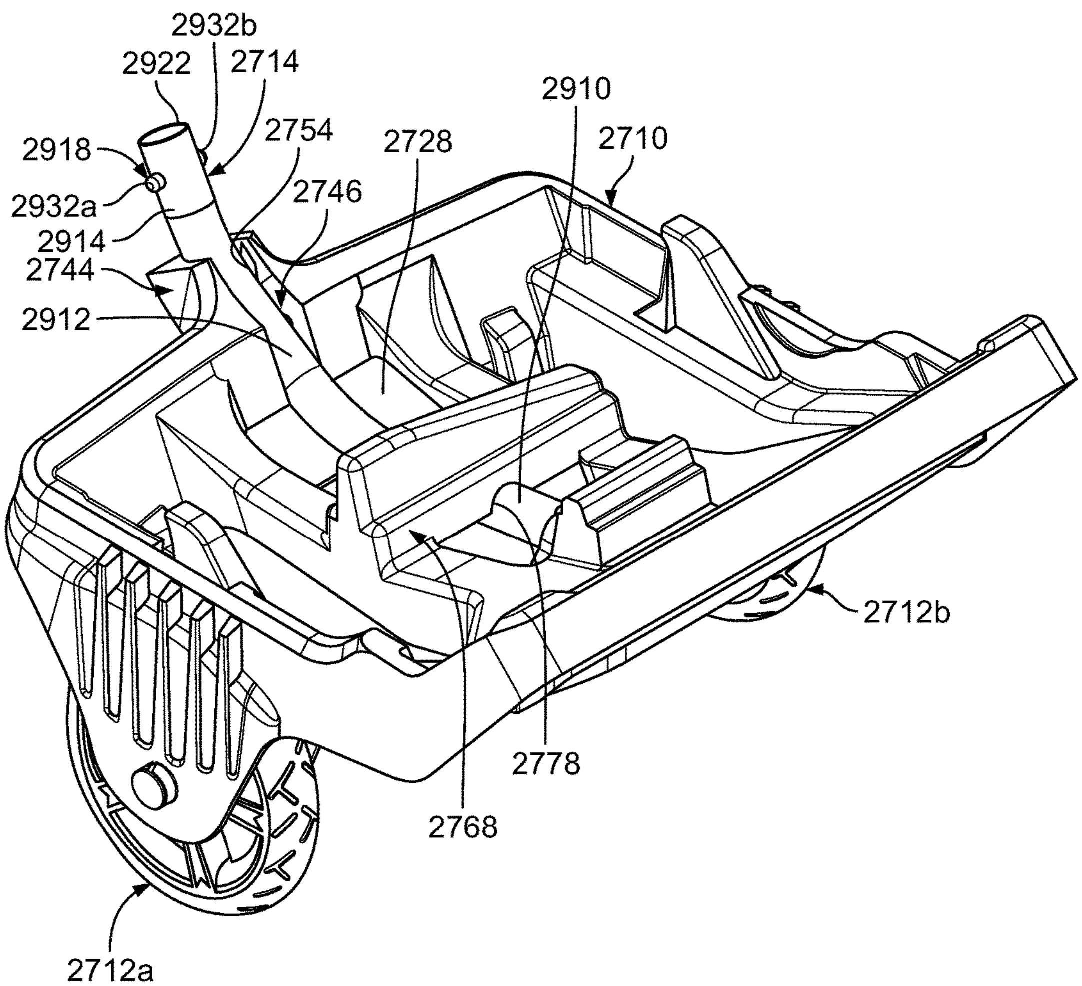
Figure 209:
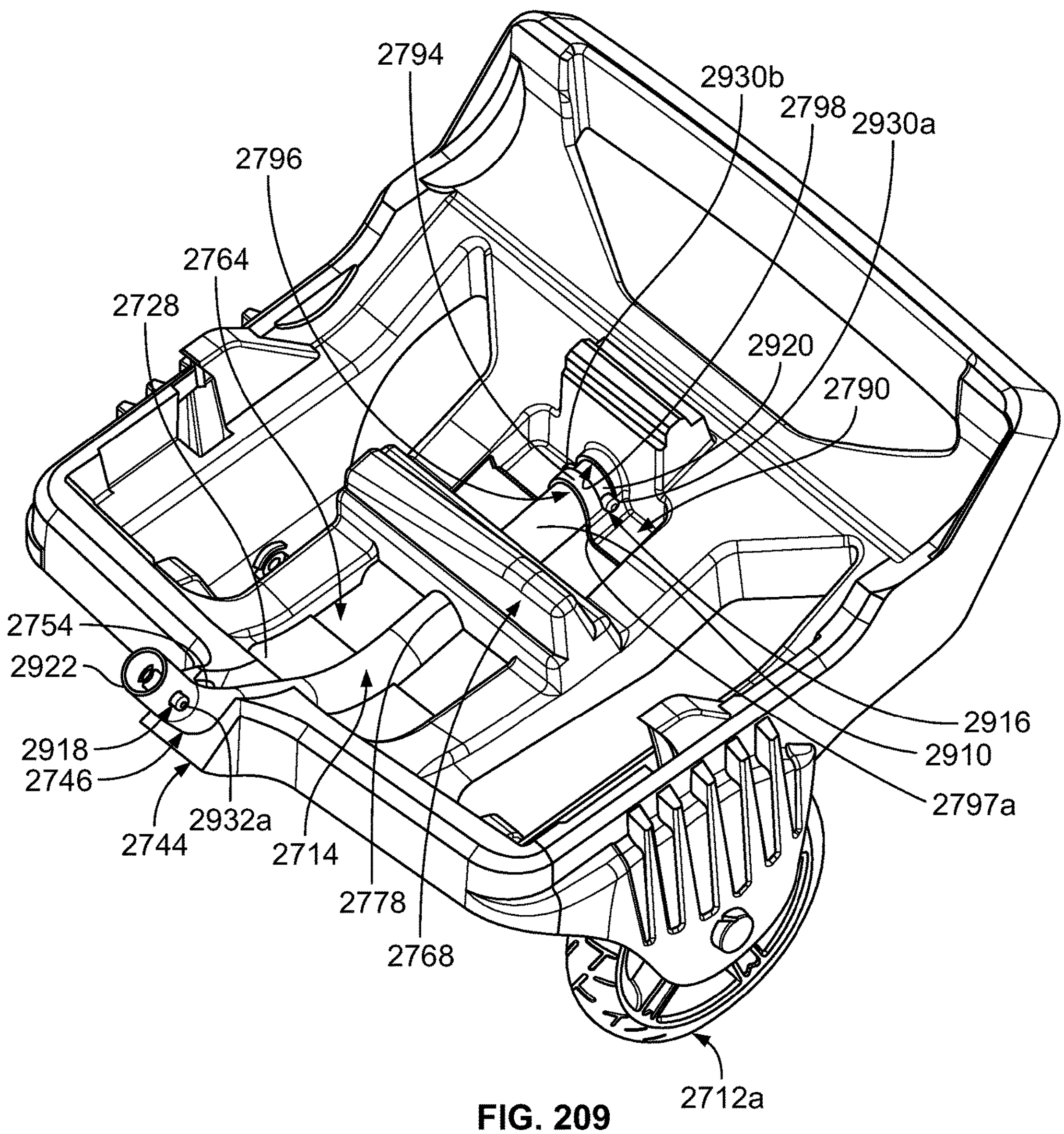
Figure 210:
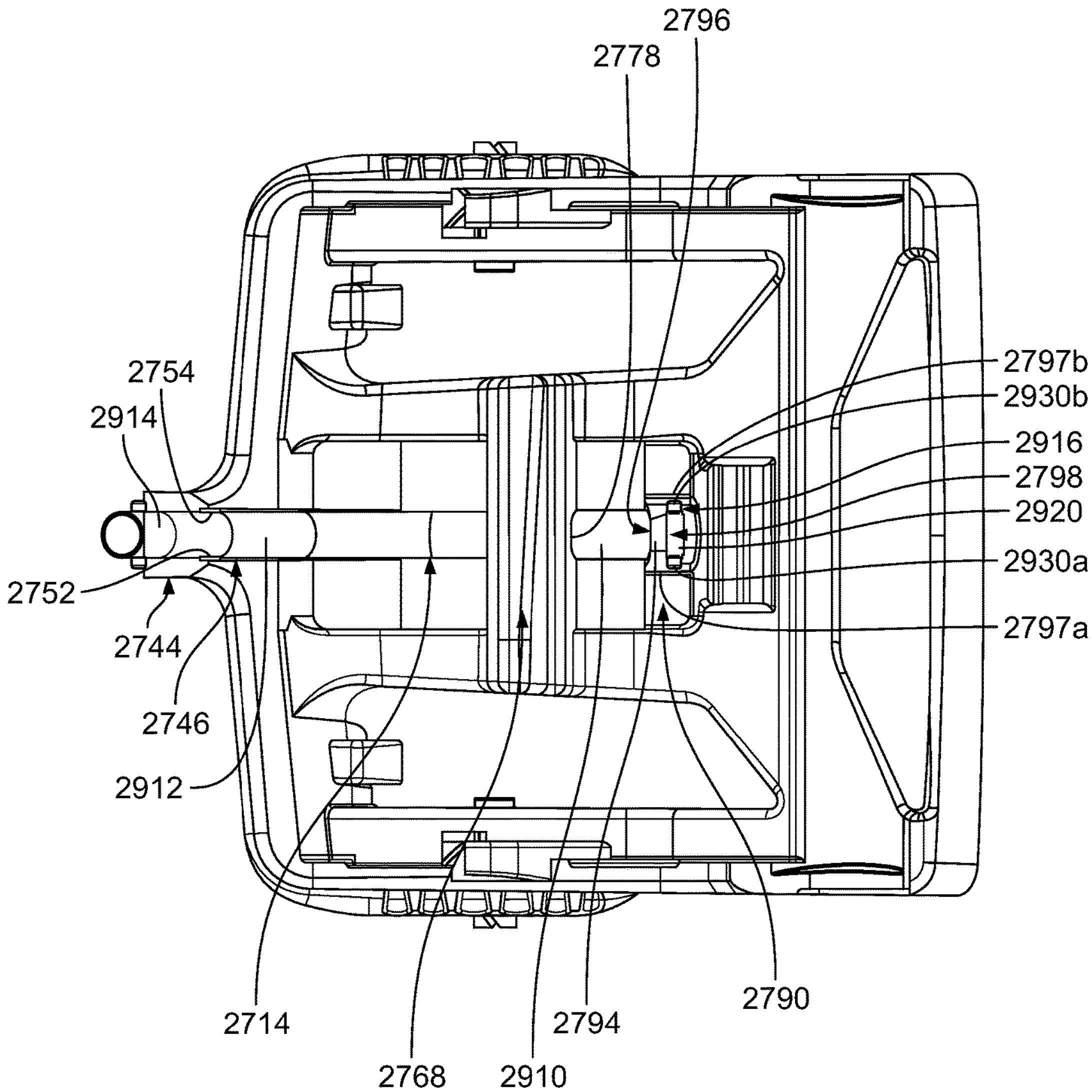
Figure 211:
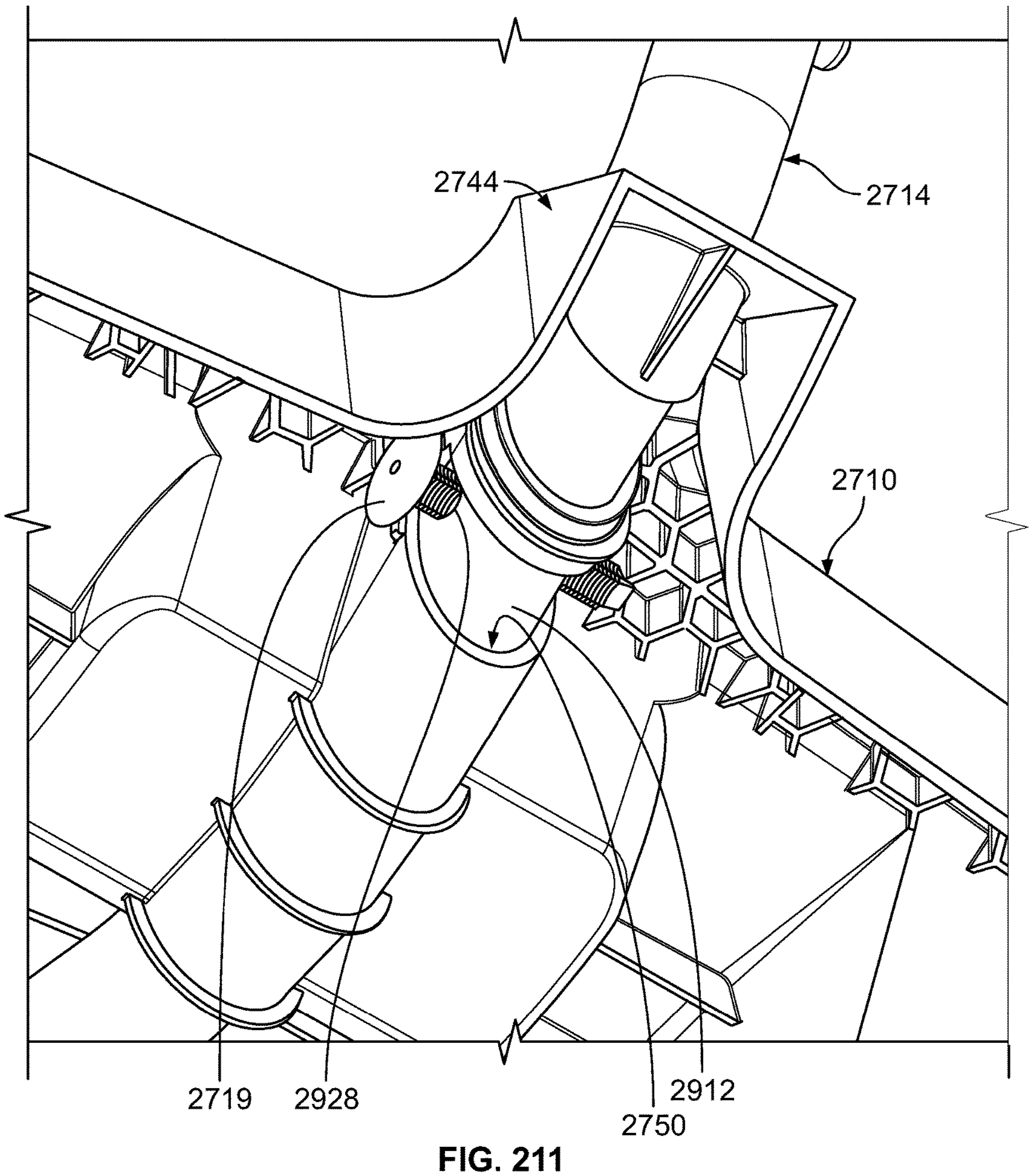
Figure 212:
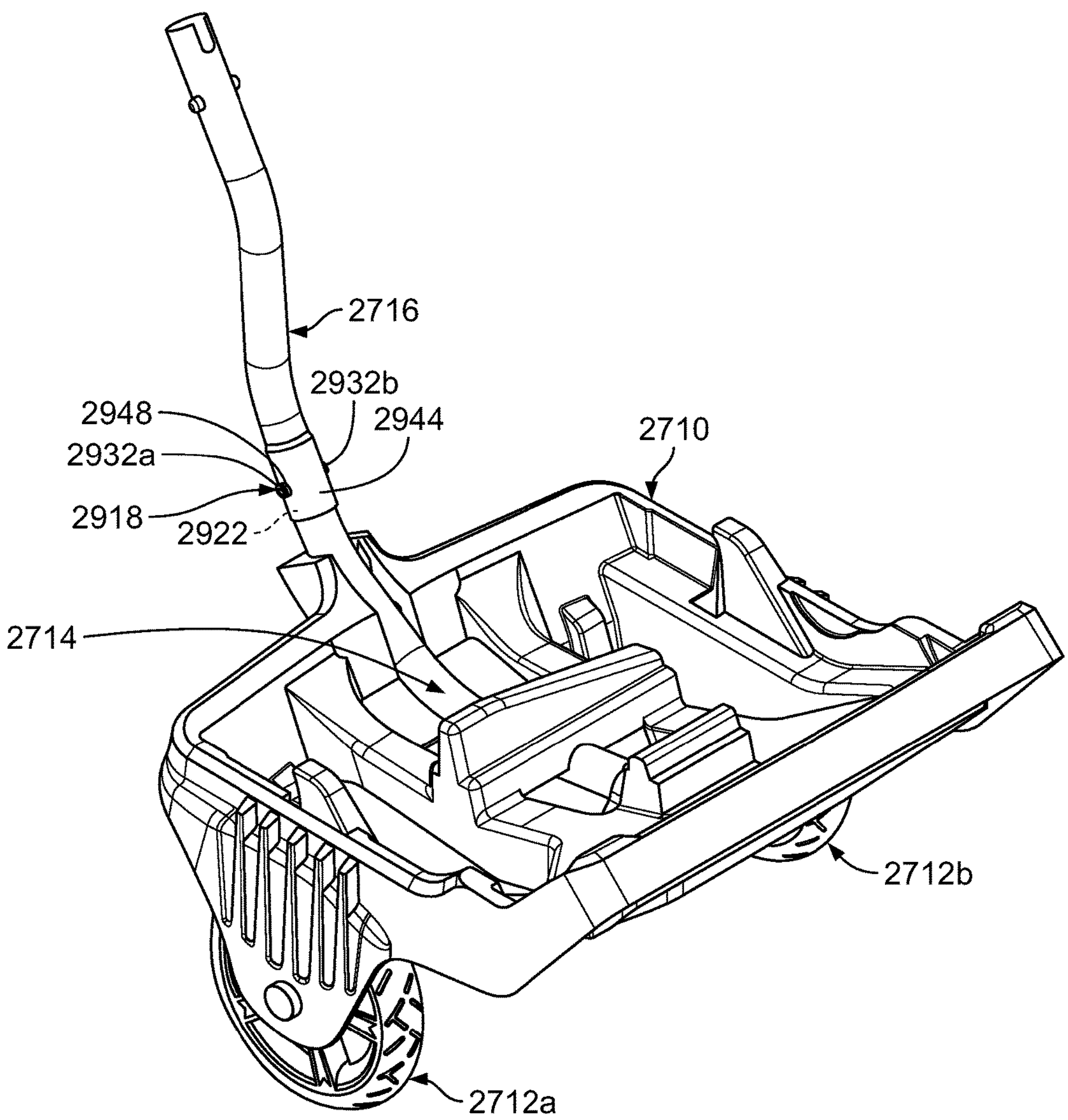
Figure 213:
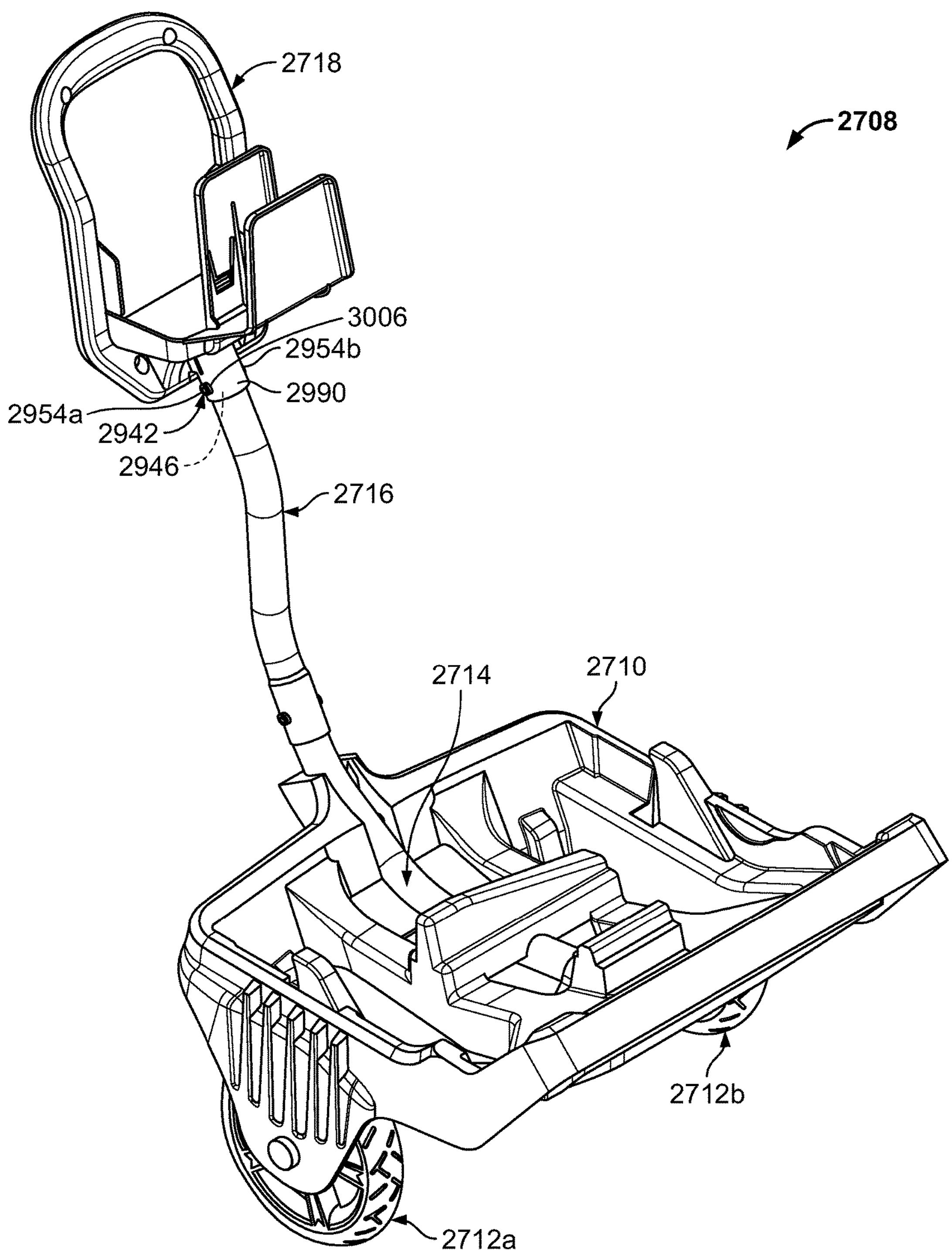

FIG. 118 is an enlarged view of the cage assembly of FIG. 117, including a first connecting edge between the first and second cage halves;

FIG. 119 is an enlarged view of the cage assembly of FIG. 117, including a second connecting edge between the first and second cage halves;

FIG. 120 is a top perspective view of a roller cover of the exemplary roller assembly of FIG. 105;

FIG. 121 is a bottom view of the roller cover of FIG. 120;

FIG. 122 is a top view of the first and second cage halves partially interlocked with the roller cover of FIG. 120;

FIG. 123 is a perspective view of a roller mount of the exemplary roller assembly of FIG. 105;

FIG. 124 is a side view of the roller mount of FIG. 123;

FIG. 125 is a top view of the exemplary roller assembly of FIG. 105 with the roller mount of FIG. 123 engaged therewith;

FIG. 126 is a sectional view of the fourth embodiment pool cleaner taken along line 126-126 of FIG. 56;

FIG. 127 is an enlarged view of Area 127 of FIG. 126;

FIG. 128 is an enlarged view of Area 127 of FIG. 126 with a first alternative embodiment for coupling the hydrocylonic particle separator assembly to the pool cleaner body shown;

FIG. 129 is an enlarged view of Area 127 of FIG. 126 with a second alternative embodiment for coupling the hydrocylonic particle separator assembly to the pool cleaner body shown;

FIG. 130 is an enlarged view of Area 127 of FIG. 126 with a third alternative embodiment for coupling the hydrocylonic particle separator assembly to the pool cleaner body shown;

FIG. 131 is an enlarged view of Area 127 of FIG. 126 with a fourth alternative embodiment for coupling the hydrocylonic particle separator assembly to the pool cleaner body shown;

FIG. 132 is a partially exploded view of the fourth embodiment pool cleaner showing a removable and replaceable skin exploded from the pool cleaner body;

FIG. 133 is a perspective view of the fourth embodiment pool cleaner showing an alternative removable and replaceable skin attached to the pool cleaner body;

FIG. 134 is a front perspective view of a pool cleaner power supply of the present disclosure;

FIG. 135 is a rear perspective view of the pool cleaner power supply of FIG. 134;

FIG. 136 is a front view of the pool cleaner power supply of FIG. 134;

FIG. 137 is a rear view of the pool cleaner power supply of FIG. 134;

FIG. 138 is a left side view of the pool cleaner power supply of FIG. 134;

FIG. 139 is a right side view of the pool cleaner power supply of FIG. 134;

FIG. 140 is a top view of the pool cleaner power supply of FIG. 134;

FIG. 141 is a bottom view of the pool cleaner power supply of FIG. 134;

FIG. 142 is a right side view of the pool cleaner power supply of FIG. 134 with a kickstand in an open position;

FIG. 143 is a top view of the pool cleaner power supply of FIG. 134 with a kickstand in an open position;

FIG. 144 is an exploded view of the pool cleaner power supply of FIG. 134;

FIG. 145 is a front perspective of a potted power converter board assembly of the pool cleaner power supply;

FIG. 146 is a front view of the potted power converter board assembly of FIG. 145;

FIG. 147A is a rear perspective view of the potted power converter board assembly of FIG. 145 shown with potting compound;

FIG. 147B is a rear perspective view of the potted power converter board assembly of FIG. 145 shown without potting compound;

FIG. 148A is a front exploded view of the potted power converter board assembly of FIG. 145;

FIG. 148B is a rear exploded view of the potted power converter board assembly of FIG. 145;

FIG. 149 is an exploded view of an alternative cord cover including seal;

FIG. 150 is a rear view showing a contoured tray and power printed circuit board of the potted power converter board assembly side-by-side;

FIG. 151 is a side view showing the contoured tray and power printed circuit board of the potted power converter board assembly side-by-side;

FIG. 152 is a sectional view of the potted power converter board assembly of FIG. 145 taken along line 152-152 of FIG. 146;

FIG. 153 is a front perspective view of a rear housing of the pool cleaner power supply;

FIG. 154 is a front view of the rear housing of FIG. 153;

FIG. 155 is a rear view of the rear housing of FIG. 153;

FIG. 156 is an enlarged view of Area 156 of FIG. 153;

FIG. 157 is a sectional view of the rear housing of FIG. 153 taken along line 157-157 of FIG. 154;

FIG. 158 is an enlarged view of Area 158 of FIG. 157;

FIG. 159 is an enlarged rear perspective view of Area 158 of FIG. 157;

FIG. 160 is an enlarged front perspective view of Area 158 of FIG. 157;

FIG. 161 is a front perspective view of a kickstand of the pool cleaner power supply;

FIG. 162 is a front view of the kickstand of FIG. 161;

FIG. 163 is a detailed, front bottom perspective view of a locking protrusion of the kickstand;

FIG. 164 is a detailed, front top perspective view of the locking protrusion of the kickstand;

FIG. 165 is a perspective view of the locking protrusion of the kickstand engaged with a kickstand engagement of the rear housing, and in a closed position;

FIG. 166 is a perspective view of the locking protrusion of the kickstand engaged with the kickstand engagement of the rear housing, and in an open position;

FIG. 167 is a sectional view taken along line 167-167 of FIG. 140 showing the kickstand attached to the rear housing and in a closed position;

FIG. 168 is a sectional view taken along line 168-168 of FIG. 143 showing the kickstand attached to the rear housing and in an open position;

FIG. 169 is an enlarged view of Area 169 of FIG. 168;

FIG. 170 is a partially exploded view of the pool cleaner power supply showing a fan and fan cover exploded;

FIG. 171 is a perspective view of a pool cleaner caddy of the present disclosure;

FIG. 172 is a left side view of the pool cleaner caddy of FIG. 171;

FIG. 173 is a rear view of the pool cleaner caddy of FIG. 171;

FIG. 174 is a front view of the pool cleaner caddy of FIG. 171;

FIG. 175 is a top view of the pool cleaner caddy of FIG. 171;

FIG. 176 is a bottom view of the pool cleaner caddy of FIG. 171;

FIG. 177 is an exploded view of the pool cleaner caddy of FIG. 171;

FIG. 178 is a front exploded view of the pool cleaner caddy of FIG. 171;

FIG. 179 is a perspective view of a base of the pool cleaner caddy;

FIG. 180 is a front view of the base of FIG. 178;

FIG. 181 is a top view of the base of FIG. 178;

FIG. 182 is a bottom view of the base of FIG. 178;

FIG. 183 is an enlarged view of Area 183 of FIG. 179;

FIG. 184 is an enlarged view of Area 184 of FIG. 181;

FIG. 185 is a partial perspective view of the inner wall of a left side wheel housing of the base;

FIG. 186 is a perspective view of an axle of the pool cleaner caddy;

FIG. 187 is a top view of the axle of FIG. 186;

FIG. 188 is a bottom view of the axle of FIG. 186;

FIG. 189 is a perspective view of an axle receiver of the pool cleaner caddy;

FIG. 190 is a front view of the axle receiver of FIG. 189;

FIG. 191 is a rear view of the axle receiver of FIG. 189;

FIG. 192 is a side view of the axle receiver of FIG. 189;

FIG. 193 is a perspective view of a wheel of the pool cleaner caddy;

FIG. 194 is a sectional view of the wheel of FIG. 193 taken along line 194-194 of FIG. 193;

FIG. 195 is an enlarged view of Area 195 of FIG. 174;

FIG. 196 is a partial sectional view taken along line 196-196 of FIG. 175;

FIG. 197 is an enlarged view of Area 197 of FIG. 171;

FIG. 198 is an enlarged view of Area 198 of FIG. 175;

FIG. 199 is a partial side view taken in the direction of arrows 199-199 of FIG. 173 showing engagement of the axle receiver with the inner wall of the left side wheel;

FIG. 200 is a front left perspective view of a stem of the pool cleaner caddy;

FIG. 201 is a front right perspective view of the stem;

FIG. 202 is a perspective view of a handle assembly of the pool cleaner caddy;

FIG. 203 is an exploded view of the handle assembly of FIG. 202;

FIG. 204 is a front view of the handle assembly of FIG. 202;

FIG. 205 is a rear view of the handle assembly of FIG. 202;

FIG. 206 is a right side view of the handle assembly of FIG. 202;

FIG. 207 is a top view of the handle assembly of FIG. 202;

FIG. 208 is a front perspective view of the pool cleaner caddy during construction with the lower stem portion, a first wheel assembly, and a second wheel assembly connected to the base;

FIG. 209 is a rear perspective view of the pool cleaner caddy during construction with the lower stem portion, the first wheel assembly, and the second wheel assembly connected to the base;

FIG. 210 is a top view of the pool cleaner caddy during construction with the lower stem portion, a first wheel assembly, and a second wheel assembly connected to the base;

FIG. 211 is a rear bottom detailed perspective view showing the engagement of a ribbed fastener with the lower stem portion and the base;

FIG. 212 is a front perspective view of the pool cleaner caddy during construction with the lower stem portion, a first wheel assembly, and a second wheel assembly connected to the base, and the upper stem portion connected to the lower stem portion; and FIG. 213 is a front perspective view of the pool cleaner caddy during construction with the lower stem portion, a first wheel assembly, and a second wheel assembly connected to the base, the upper stem portion connected to the lower stem portion, and the handle assembly connected to the upper stem portion.

DETAILED DESCRIPTION OF THE PRESENT DISCLOSURE

According to the present disclosure, advantageous apparatus are provided for facilitating maintenance of pool or spa, as well as for facilitating maintenance of a pool or spa cleaning device. More particularly, the present disclosure includes, but is not limited to, discussion of a pool cleaner including a hydrocyclonic particle separator assembly, a quick-release latch for the hydrocyclonic particle separator assembly, and a pool cleaner having six rollers.

Figure 1:
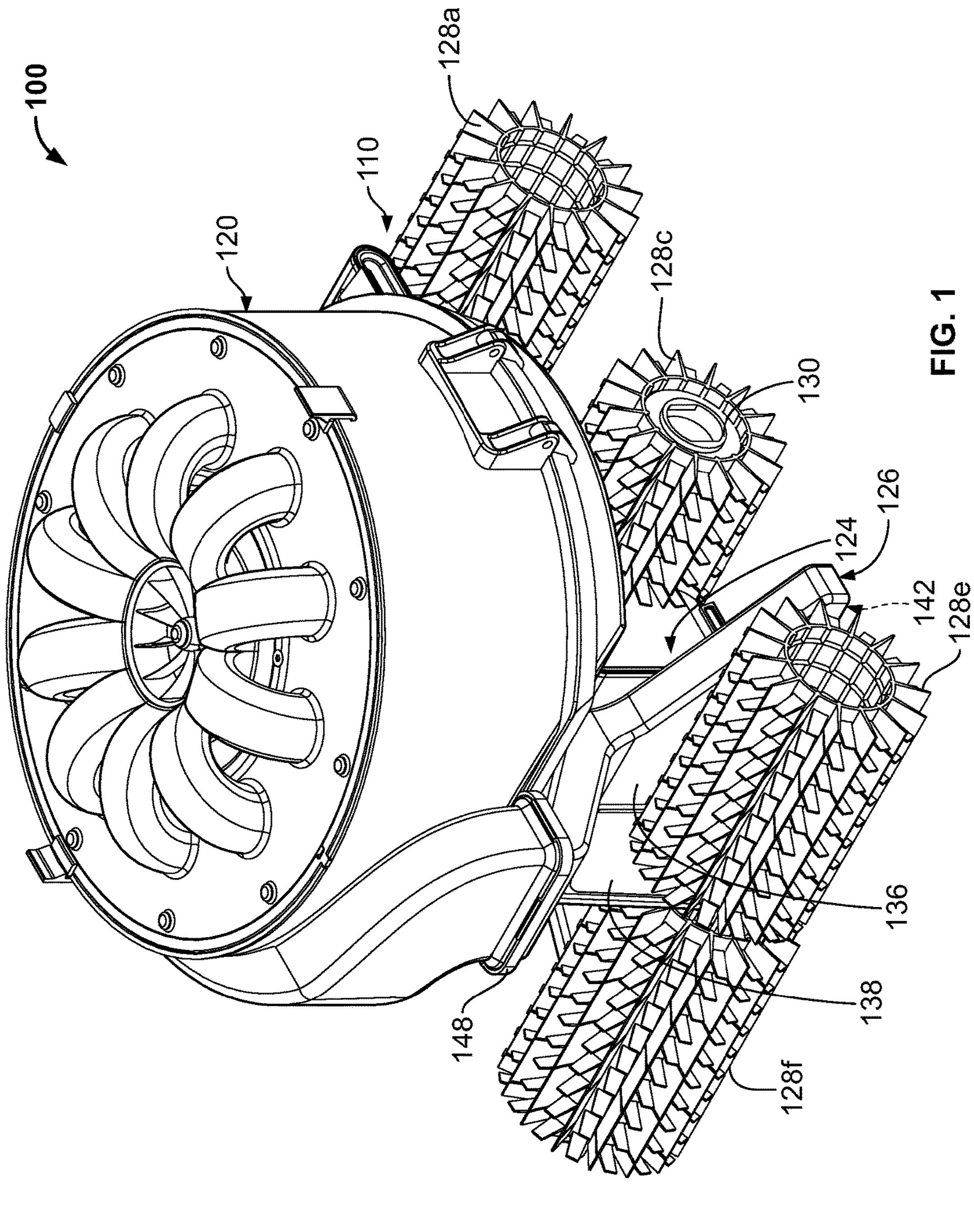
FIG. 1 is a rear perspective view of a first embodiment of a pool cleaner.
Figure 2:
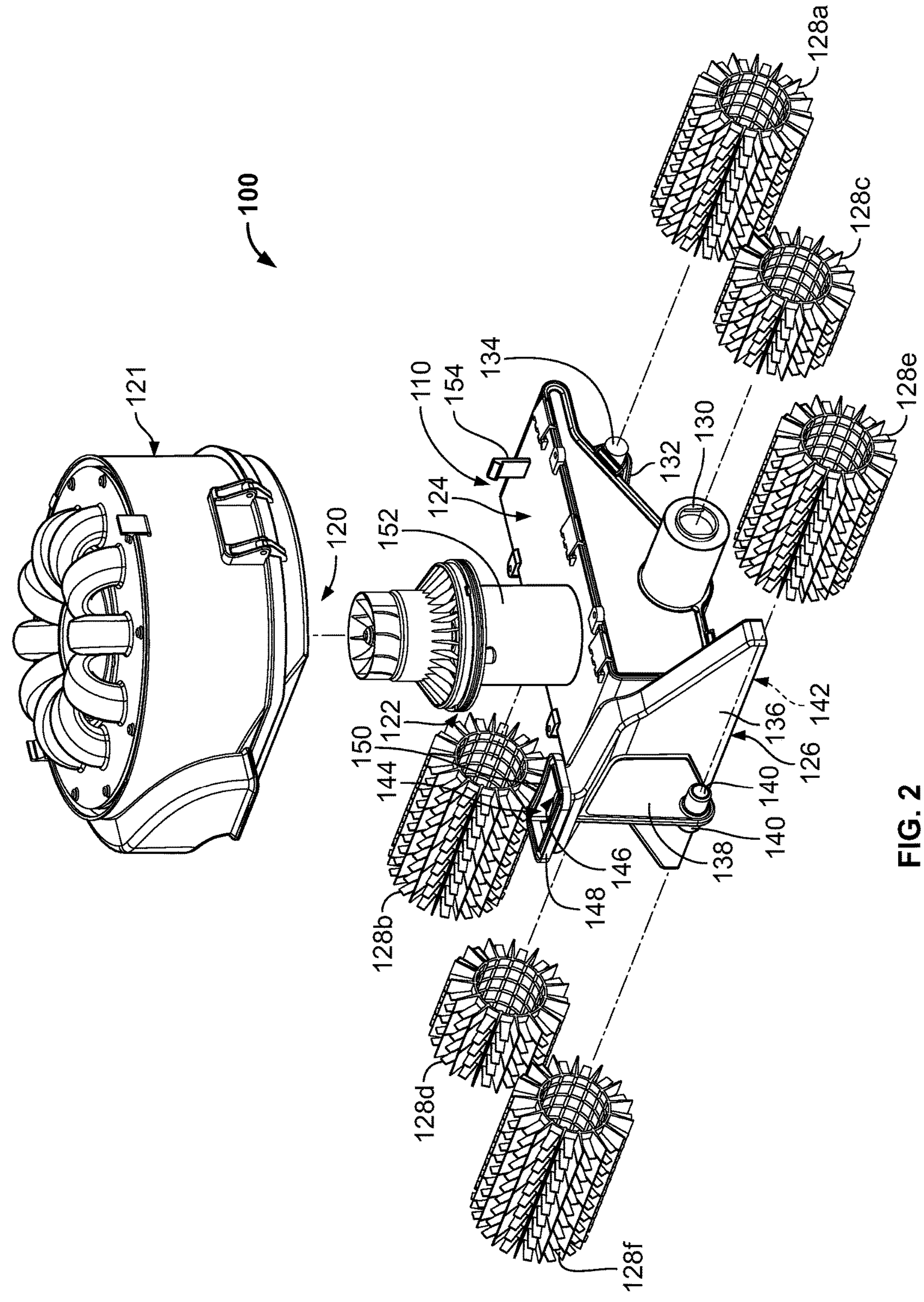
FIG. 2 is a rear perspective exploded view of the pool cleaner of FIG. 1 with a first embodiment of a canister subassembly of a hydrocyclonic particle separator assembly separated from a motor housing thereof.
Figure 3:
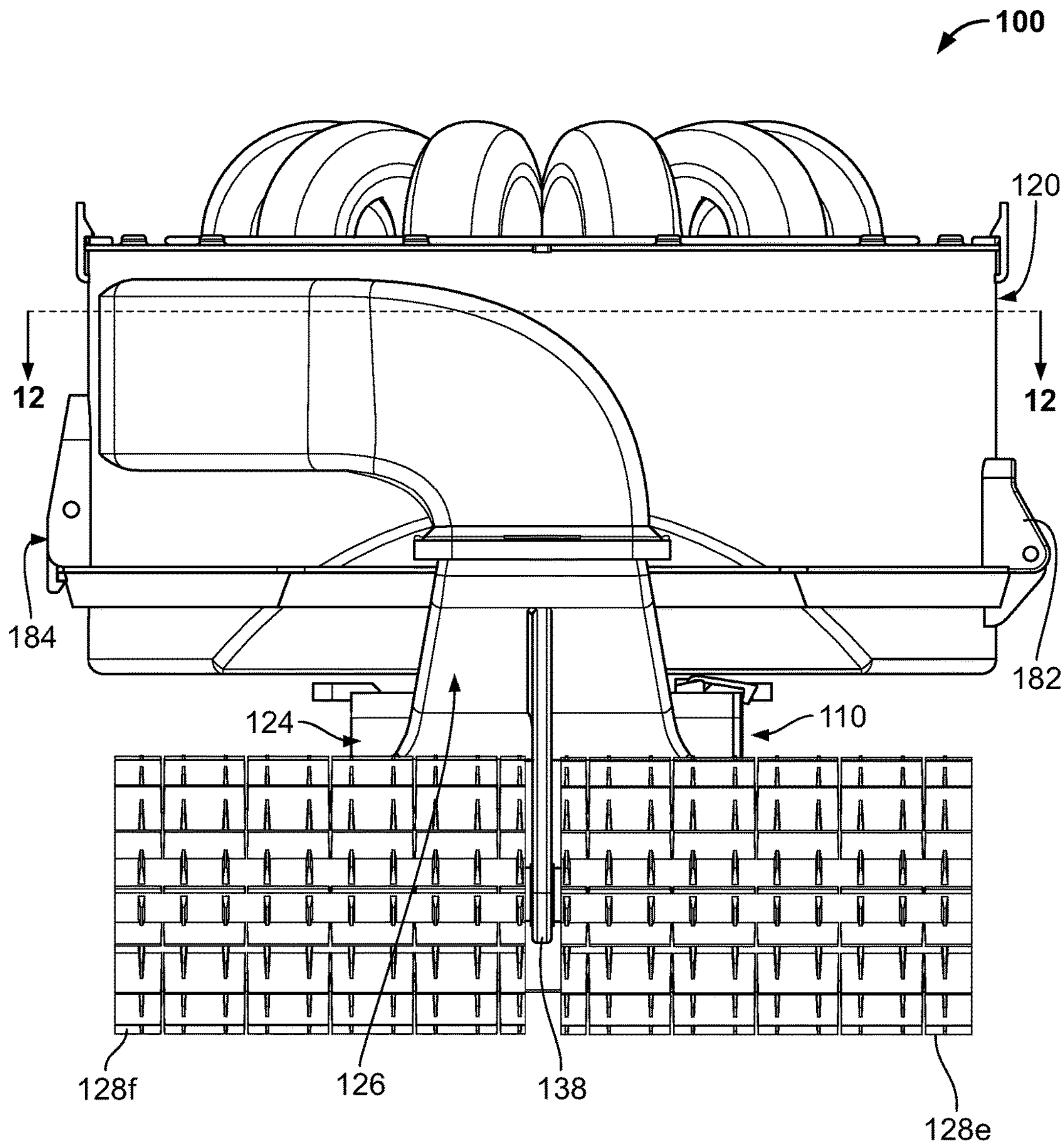
FIG. 3 is a rear elevational view of the pool cleaner of FIG. 1.
Figure 4:
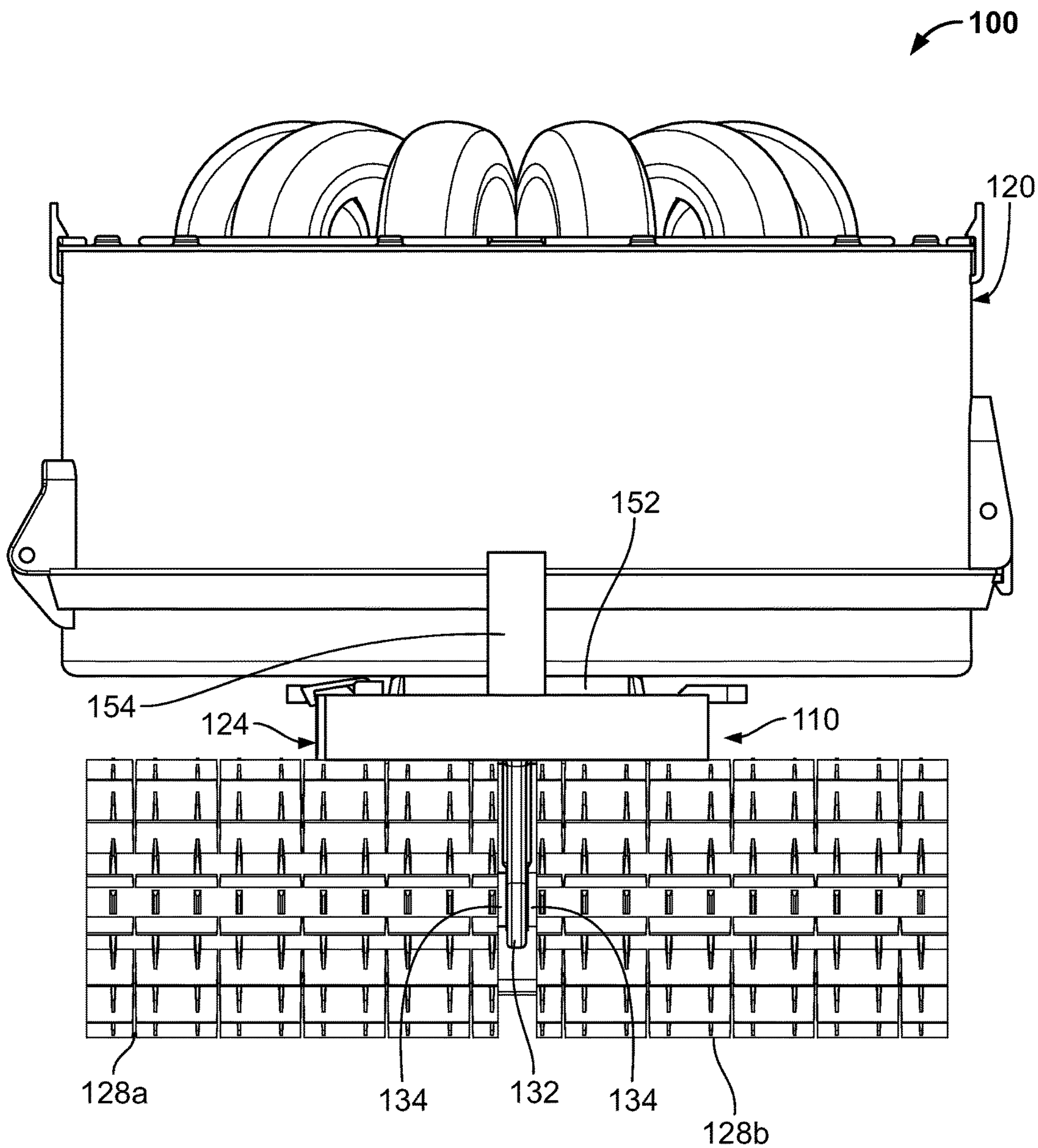
FIG. 4 is a front elevational view of the pool cleaner of FIG. 1.

With initial reference to FIGS. 1-8, a pool cleaner 100 generally includes a drive assembly 110 and a hydrocyclonic particle separator assembly 120 including a canister subassembly 121 and a fluid turbine subassembly 122 (see FIG. 2). In an exemplary embodiment, pool cleaner 100 is an electric pool cleaner that includes six rollers and hydrocyclonic particle separation capability. The motors can be powered by an electric cable (not shown) extending to a power source at the surface (for example), a battery, and/or inductive coupling, for example. The drive assembly 110 includes a motor housing 124, an intake 126, and six brushed rollers 128*a*-128*f*. Two roller drives 130 (see FIGS. 1, 2, 5, and 6) extend from opposite sides of the motor housing 124. Each of the two roller drives 130 are respectively in operative communication with a first and second motor (not shown) positioned within the motor housing 124. A first roller set (rollers 128*a*, 128*c*, and 128*e*) is in mechanical communication with a first one of the roller drives 130 (e.g., on the left side of the cleaner), which is in communication with the first drive motor so each one of the rollers of the first roller set (e.g., roller 128*a*, 128*c*, and 128*e*) turn at the same first rate. A second roller set (rollers 128*b*, 128*d*, and 128*f*) is in mechanical communication with a second one of the roller drives 130 (e.g., on the right side of the cleaner), which is in communication with the second drive motor, so each one of rollers of the second roller set (e.g., roller 128*b*, 128*b*, and 128*f*) turn at the same second rate.

A front support mount 132 extends from a front portion of the motor housing 124, and includes front roller mounts 134. Two of the brushed rollers 128*e*, 128*f* are connected with the front roller mounts 134, and are rotatable therewith. The intake 126 includes a body 136 having a rear support mount 138 extending therefrom. The intake 126 is interconnected with the motor housing 124 by an engagement means 139 (see FIG. 5). The engagement means 139 can be a mating connection, e.g., dovetail connection, between the intake 126 and the motor housing 124, a snap fit connection, or any other connection means known to one of ordinary skill in the art. The rear support mount 138 extends from the body 136 and includes rear roller mounts 140. Two of the brushed rollers 128*a*, 128*b* are connected with the rear roller mounts 140, and are rotatable therewith.

Although electric sources are contemplated, other power sources are also contemplated. For example, the power source can be positive water pressure, as in what is commonly referred to in the pool industry as a "pressure cleaner." As another example, the power source can be negative water pressure, as in what is commonly referred to in the pool industry as a "suction cleaner." Any power source and/or combinations thereof are contemplated.

The intake 126 further includes an inlet opening 142 (see FIG. 8) and an outlet opening 144 (see FIG. 2) defined by the body 136. A channel 146 extends between the inlet opening 142 and the outlet opening 144. A rim 148 extends about the perimeter of the outlet opening 144, and defines a channel 150 that cooperates with a portion of the hydrocyclonic particle separator assembly 120, discussed in greater detail below.

The motor housing 124 further includes a mounting boss 152 and a front latch 154, both extending from a top of the motor housing 124. As shown in FIG. 2, which is a partially exploded view of the cleaner 100, the fluid turbine subassembly 122 of the hydrocyclonic particle separator assembly 120 is mounted to the mounting boss 152 while the canister subassembly 121 is removable therefrom. The mounting boss 152 houses a third motor (not shown) that drives the fluid turbine subassembly 122. The front latch 154 is configured to releasably engage the canister subassembly 121 to secure the hydrocyclonic particle separator assembly 120 to the motor housing 124, this engagement is discussed in greater detail below in connection with FIGS. 13A and 13B.

Figure 9:
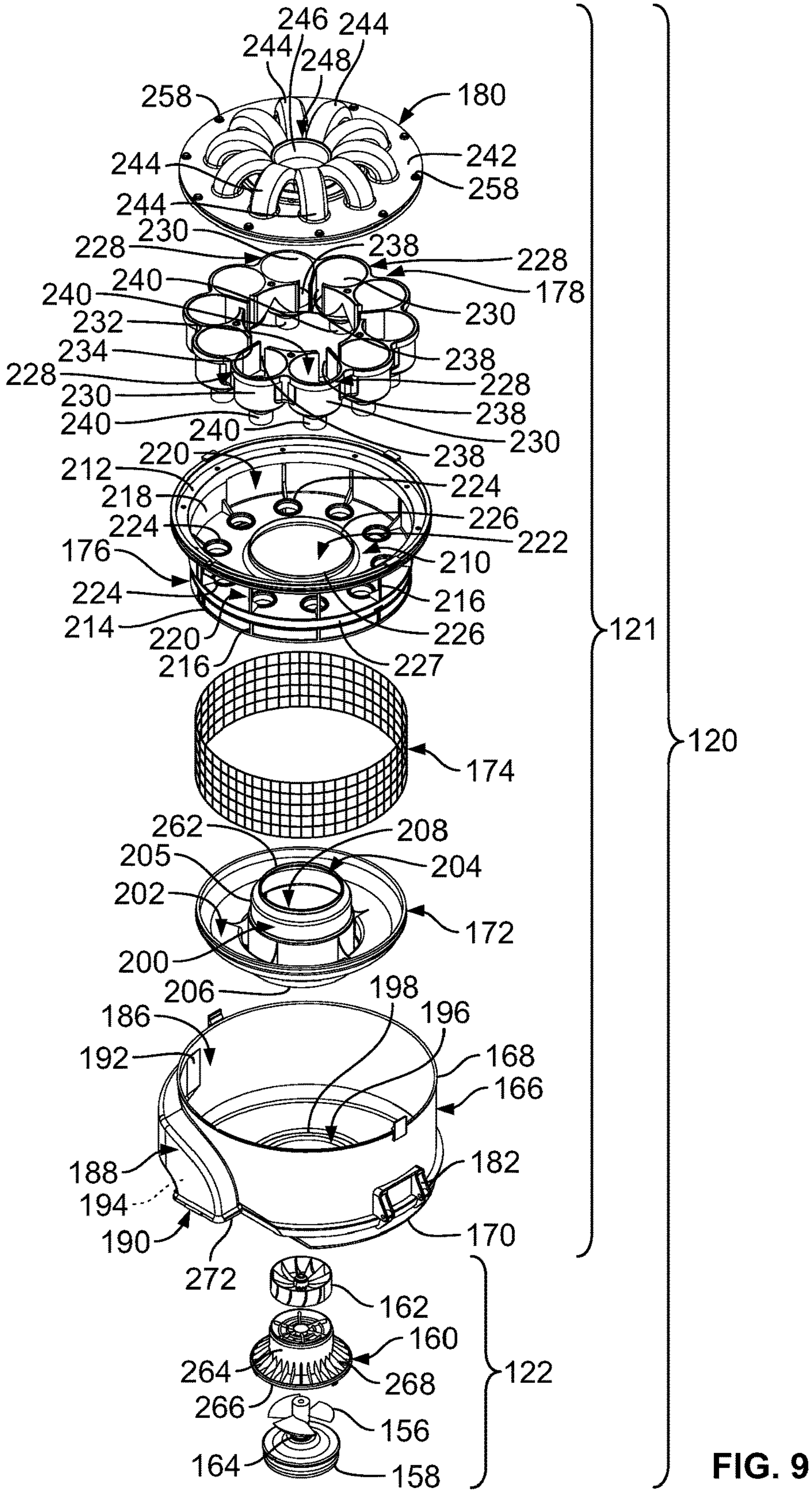
FIG. 9 is an exploded perspective view of the hydrocyclonic particle separator assembly of FIG. 2.

FIG. 9 is an exploded perspective view of the hydrocyclonic particle separator assembly 120 of FIG. 2, including the canister subassembly 121 and the fluid turbine subassembly 122. The fluid turbine subassembly 122 includes an impeller 156, a grommet 158, a finger guard 160, and a diffuser 162. The impeller 156 includes a shaft 164 that extends through the grommet 158 and engages the third motor (not shown), which can be positioned within the mounting boss 152 of the motor housing 124. The finger guard 160 is mounted over the impeller 156, and diverts flow through the hydrocyclonic particle separator assembly 120, which is discussed in greater detail below in connection with FIGS. 10A, 10B, 11, and 12. The diffuser 162 is positioned over the finger guard 160 and utilized to normalize the flow generated by the impeller 156, which is driven by the third motor (not shown). The canister subassembly 121 includes a canister body 166 having a top 168 and a bottom 170, a fine debris container 172, a filtering medium 174 (e.g., a coarsely perforated mesh) mounted to a cyclone manifold 176, a ring of cyclone containers 178, and a top cap 180.

Figure 5:
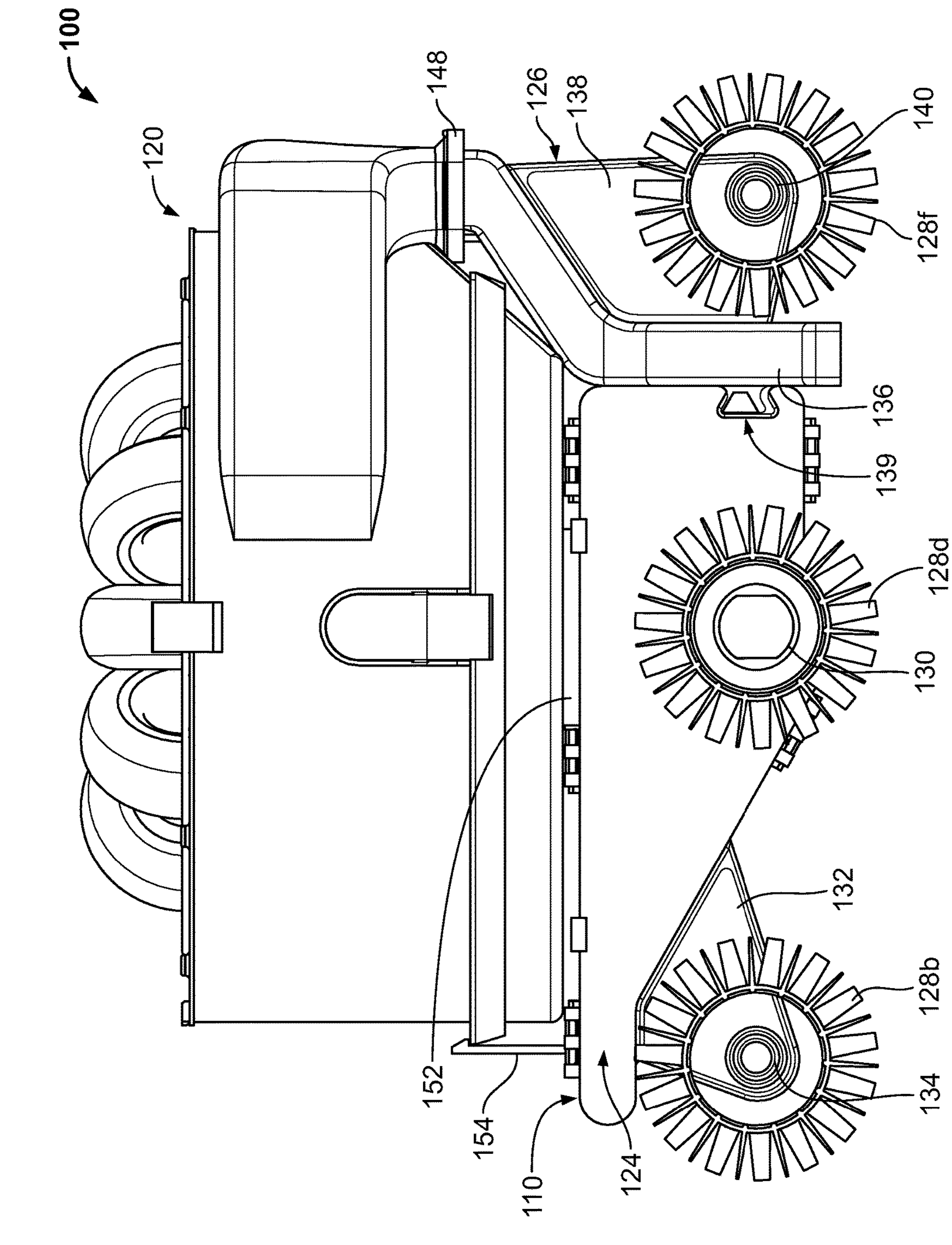
FIG. 5 is a right side elevational view of the pool cleaner of FIG. 1.

As referenced previously, the canister body 166 includes upper and lower portions 168, 170, which are engaged to one another by a hinge 182 and releasably secured to one another by a release means 184 (e.g., a quick-release latch 184) (see, e.g., FIG. 5). The canister body 166 generally defines an inner chamber 186, and includes a canister intake 188 generally positioned on the upper portion 168 of the canister body 166. The canister intake 188 includes an inlet 190, a tangential outlet 192, and a canister intake 194 extending between the inlet 190 and the tangential outlet 192. The tangential outlet 192 is positioned in a wall of the upper portion 168 of the canister body 166 and at a tangent to the canister body 166, such that fluid flowing through the canister intake channel 194 enters the inner chamber 186 of the canister body 166 at a tangent thereto. This configuration results in the generation of a cyclonic flow within the inner chamber 186 of the canister body 166, as fluid tangentially enters the inner chamber 186. The lower portion 170 of the canister body 166 includes a central aperture 196 encircled by a mounting ridge 198, the central aperture 196 receives the fluid turbine subassembly 122 and the mounting boss 152 of the motor housing 124. Accordingly, the fluid turbine subassembly 122 and the mounting boss 152 generally extend through the central aperture 196 and into the inner chamber 186 of the canister body 166.

The fine debris container 172 includes a central hub 200 surrounded by a dish 202 extending radially from the central hub 200. The dish 202 generally has an upwardly-curving shape such that it catches any debris that falls into the dish 202 and can form a static area where falling debris can land. The central hub 200 includes a top opening 204, a top mounting shoulder 205, and a bottom mount 206. A chamber 208 extends between the top opening 204 and the bottom mount 206. The chamber 208 is configured to receive the fluid turbine assembly 124 and the mounting boss 152, which extend through the bottom mount 206 and into the chamber 208. The fine debris container 172 is positioned within the inner chamber 186 of the canister body 166 with the bottom mount 206 of the fine debris container 172 engaging the mounting ridge 198 of the canister body 166.

The cyclone manifold 176 includes a discoid body 210 connected with an upper mounting rim 212 and a lower rim 214 by a plurality of supports 216 and a flow director 218. The upper mounting rim 212, lower rim 214, and the plurality of supports 216 form a plurality of windows 220 that allow fluid to flow from the exterior of the cyclone manifold 176 to the interior thereof. The discoid body 210 includes a central opening 222, a plurality of cyclone container mounts 224, a mounting ring 226 about the central opening 222, and an annular sealing ring 227 about the periphery thereof. The cyclone manifold 176 is positioned over the fine debris container 172 with the mounting rim 226 of the discoid body 210 engaging the top mounting shoulder 205 of the fine debris container's central hub 200 and the annular sealing ring 227 encircling and in engagement with an upper portion of the dish 202. The filtering medium 174 is mounted to the cyclone manifold 176 and extends about the perimeter of the cyclone manifold 176 covering the plurality of windows 220. Accordingly, fluid flowing from the exterior of the cyclone manifold 176 to the interior flows across the filtering medium 174 and the windows 220. The filtering medium 174 is sized such that debris of a first size, e.g., larger debris, cannot pass through the filtering medium 174. Instead, the larger debris contacts the filtering medium 174, or the interior wall of the canister body 166, and is knocked down out of the fluid flow and does not enter the interior of the cyclone manifold 176.

The ring of cyclone containers 178 includes a plurality of individual cyclone containers 228, e.g., ten cyclone containers. It should be noted that for clarity of FIG. 9 only four of the individual cyclone containers 228 are more fully labeled with reference numbers, but one of ordinary skill in the art shall understand that each individual cyclone container 228 can include the same parts and elements. Thus, it should be understood that the description of a single cyclone container 228 holds true for all of the cyclone containers 228 that make up the ring of cyclone containers 178. Each individual cyclone container 228 includes a circular and tapered cyclone container body 230 that defines a cyclone chamber 232 and includes an overflow opening 234, a debris underflow nozzle 236 (see FIG. 10B), and a tangential inlet 238 generally positioned on a radially inward portion of each individual cyclone container 228. Each individual cyclone container 228 also includes a mounting nozzle 240 surrounding the debris underflow nozzle 236 and configured to engage one of the plurality of cyclone container mounts 224 of the cyclone manifold 176. The cyclone manifold 176 can include the same number of cyclone container mounts 224 as there are individual cyclone containers 228. As such, the ring of cyclone containers 178 is positioned within the cyclone manifold 176 and within the filtering medium 174. When the ring of cyclone containers 178 is mounted to the cyclone manifold 176, each debris underflow nozzle 236 and mounting nozzle 240 is positioned within a respective cyclone container mount 224 wherein each extends through the respective cyclone container mount 224 and therefore through the discoid body 210 of the cyclone manifold 176. Accordingly, debris that falls out of the debris-laden water within each individual cyclone container 228, e.g., due to contact with the wall of the cyclone container body 230, can fall through the debris underflow nozzle 236 and into the dish 202 of the fine debris container 172, which is positioned below and adjacent the cyclone manifold 176.

Figure 10A:
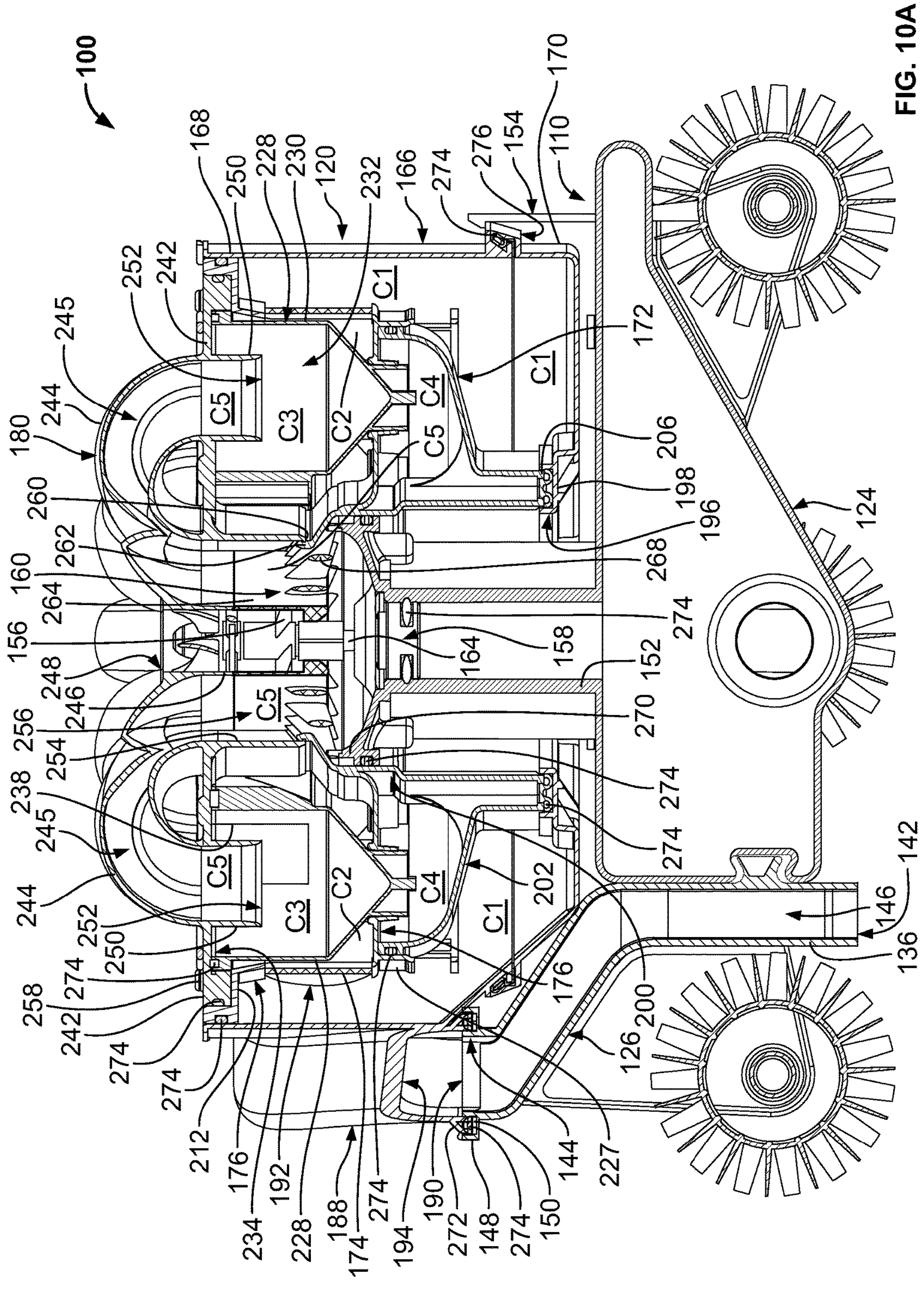
FIG. 10A is a sectional view of the pool cleaner taken along line 10A-10A of FIG. 7 showing, among other things, the chambers of the pool cleaner.

The top cap 180 includes a top plate 242 and a plurality of arched tubes 244, e.g., ten. Each of the plurality of arched tubes 244 extends through the top plate 242 and arch from a radially outward portion of the top plate 242 to a radially central portion where they converge to form a first tubular wall 246 defining an outlet 248. One of ordinary skill in the art would appreciate that the plurality of arched tubes 244 can be replaced with a single open area that is not segmented by arched tubes. Reference is now made to FIG. 10A in further describing the top cap 180, which is a sectional view of the pool cleaner 100 taken along line 10A-10A of FIG. 7. As can be seen from FIG. 10A, each of the arched tubes 244 defines an inner chamber 245 and extends through the top plate 242 to form a vortex finder 250 having an opening 252 to the inner chamber 245. Each of the plurality of arched tubes 244 arches radially inward to converge and form the first tubular wall 246, and further converge to form a second tubular wall 254 that is spaced radially outward from, but concentric with, the first tubular wall 246, e.g., the second tubular wall 254 has a greater radius than the first tubular wall 246. The first and second tubular walls 246, 254 form a tubular chamber 256. The vortex finder opening 252 and the inner chamber 245 of each arched tube 244 is in fluidic communication with the tubular chamber 256, such that fluid can flow from each vortex finder opening 252, across each inner chamber 245, and into the tubular chamber 256 where the individual flows merge. The top cap 180 is placed over the cyclone manifold 176 and in engagement with the upper mounting rim 212 of the cyclone manifold 176 and the overflow opening 234 of each cyclone body 232. The top cap 180 can be secured to the cyclone manifold 176 by a plurality of screws or bolts 258. Additionally, the second tubular wall 254 includes a clasp 260 that releasably engages an upper mounting projection 262 of the fine debris container 172. When the top cap 180 is engaged with the cyclone manifold 176, the vortex finder 250 of each of the plurality of arched tubes 244 is inserted into the overflow opening 234 of a respective cyclone container 228 and positioned within the respective cyclone container body 230.

When the top cap 180 is mounted to the cyclone manifold 176, the tubular chamber 256 of the top cap 180 is positioned adjacent the finger guard 160 of the fluid turbine subassembly 122 so that the fluid flowing through the tubular chamber 256 is directed into the finger guard 160. As shown at least in FIG. 9, the finger guard 160 includes an inner cylindrical wall 264, an outer ring 266 surrounding the inner cylindrical wall 264 and concentric therewith, and a plurality of fins 268 extending between the outer ring 266 and the inner cylindrical wall 264. The finger guard 160 is generally positioned over the impeller 156 and the grommet 158 with the grommet 158 being inserted into the mounting boss 152 of the motor housing 124. The finger guard 160 is mounted to a flange 270 that extends radially from the mounting boss 152.

When the top cap 180, ring of cyclone containers 178, cyclone manifold 176, filtering medium 174, fine debris container 172, and canister body 166 are interconnected they are placed over the fluid turbine assembly 124 and the mounting boss 152 with the inner cylindrical wall 264 of the finger guard 160 abutting the first tubular wall 246 of the top cap 180. Additionally, the inlet 190 of the canister intake 188 is positioned adjacent the outlet opening 144 of the intake 126, with a sealing rim 272 extending radially from the inlet 190 engaged with the channel 150 that encircles the intake outlet 126.

Figure 6:
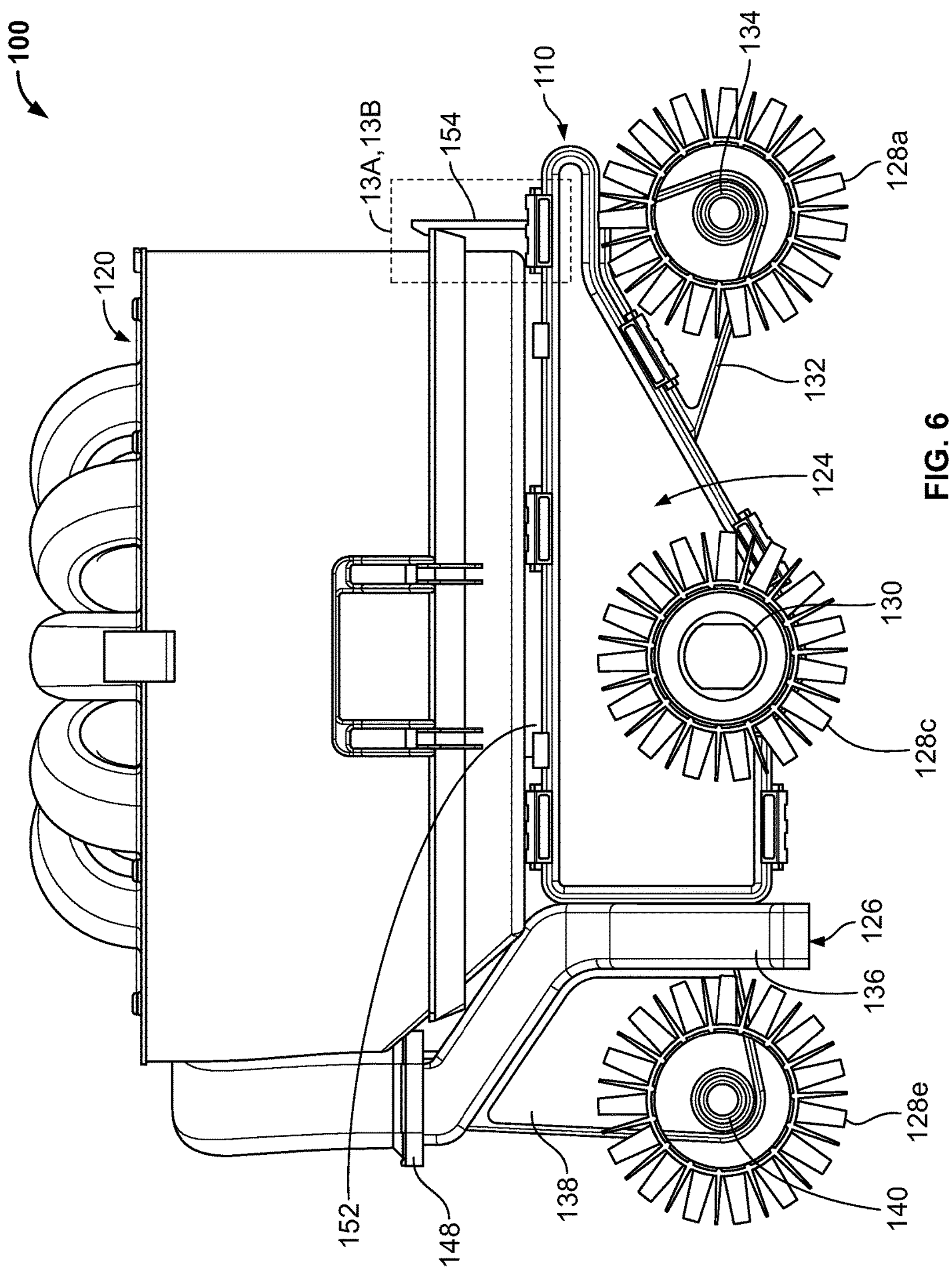
FIG. 6 is a left side elevational view of the pool cleaner of FIG. 1.
Figure 13B:
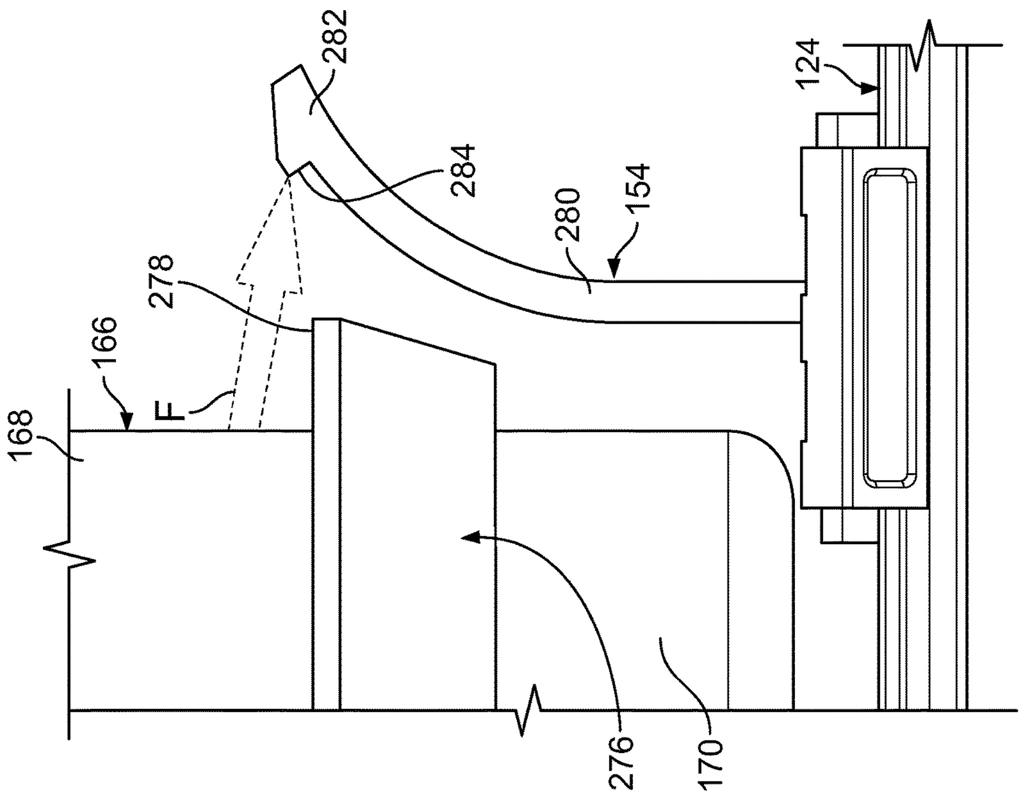
FIG. 13B is an enlarged view of the retention latch of FIG. 13A deformed by a force.
Figure 13A:
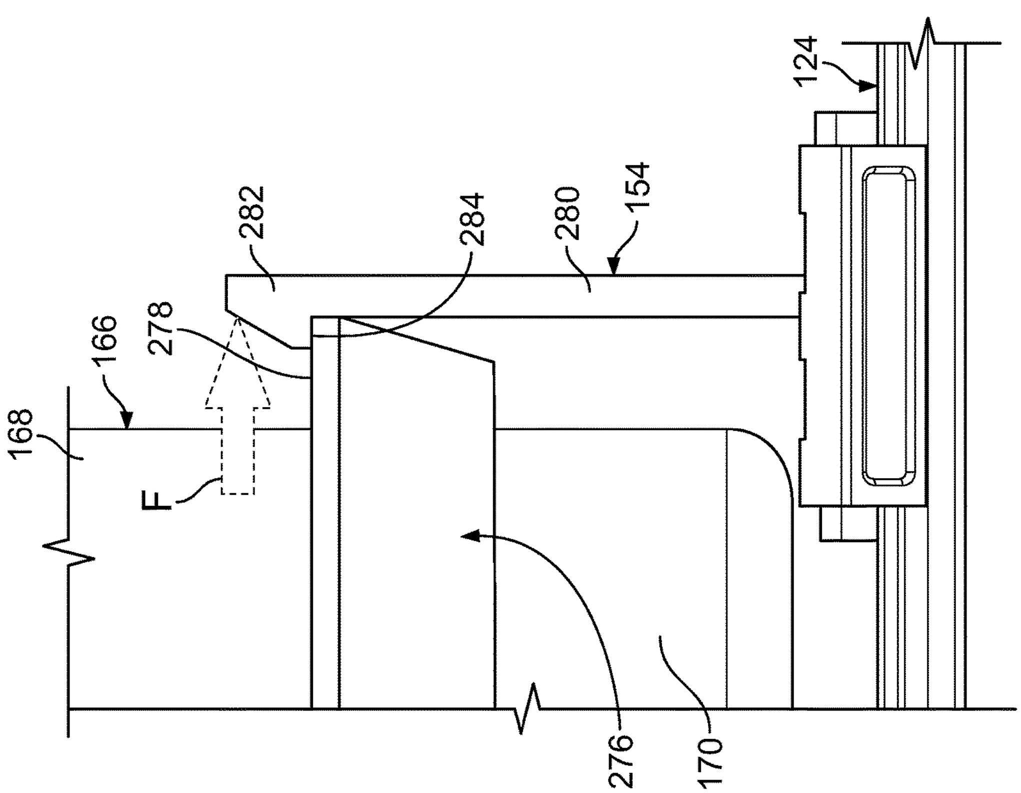
FIG. 13A is an enlarged view of Area 13A, 13B of FIG. 6 showing a first embodiment of a retention latch.

Further, the canister subassembly 121 is secured to the motor housing 124 through the engagement of the front latch 154 with the canister body 166. Reference is made to FIGS. 13A and 13B in discussing this attachment, which are enlarged view of the Area 13A of FIG. 6 showing the front latch 154 in greater detail. Particularly, the canister body 166 includes a locking interface 276 between the upper and lower portions 168, 170 of the canister body 166. The locking interface 276 is generally an annular ring extending about the periphery of the canister body 166, and radially therefrom, that defines an upper ridge 278. The front latch 154 is generally a flag-shaped resiliently flexible member, e.g., a compliant mechanism or a spring-biased component. The front latch 154 includes a body 280 connected with the motor housing 124 and a slanted head 282 forming an engagement surface 284. When the canister subassembly 121 is placed over the mounting boss 152, a downward force thereon results in the locking interface 276 contacting the slanted head 282 of the front latch 154 and forcing the front latch 154 to slightly bend at the body 280 forcing the slanted head 282 forward. Once the canister subassembly 121 is forced completely down, so that the entirety of the locking interface 276 is lower than slanted head 282, the front latch 154 snaps back to its original up-right position and the canister subassembly 121 is removably "locked" in position. In this "locked" position, the engagement surface 284 of the front latch 154 is adjacent and engages the upper ridge 278 of the locking interface 276, such that an attempt to remove the canister subassembly 121 from the motor housing 124 is prevented through the engagement of the engagement surface 284 and the upper ridge 278. Accordingly, in the "locked" position, the canister subassembly 121 can not be removed from the motor housing 124 without first disengaging the front latch 154. To disengage the front latch 154, and, thus, to remove the canister subassembly 121, a user must bias the front latch 154 forward so that there is clearance between the engagement surface 284 and the upper ridge 278. Removal of the canister subassembly 121 from the motor housing 124 is shown in FIG. 13B, which is an enlarged view of the retention latch of FIG. 13A deformed by a force F. As can be seen in FIG. 13B, to remove the canister subassembly 121, a user can exert a force F against the slanted head 282 of the front latch 154, forcing the slanted head 282 forward and bending the body 280. This results in the engagement surface 284 of the front latch 154 disengaging the upper ridge 278 of the locking interface 276, thus providing clearance therebetween and permitting the canister subassembly 121 to be removed from engagement with the motor housing 124.

The hydrocyclonic particle separator assembly 120 can include a plurality of sealing members 274, e.g., O-rings, disposed between adjacent parts to create a fluid-tight seal therebetween. For example, sealing members 274 can be positioned in the channel 150 of the intake 126, in the mounting ridge 198 of the canister body 166, between the annular sealing ring 227 of the cyclone manifold 176 and the dish 202 of the fine debris container 172, between the top plate 242 and the overflow opening 234 of each cyclone body 232, between the top plate 242 and the upper mounting rim 212 of the cyclone manifold 176, between the upper mounting rim 212 of the cyclone manifold 176 and the canister body 166, between the mounting flange 270 of the mounting boss 152 and the central hub 200 of the fine debris container 172, between the grommet 158 and the mounting boss 152, and within the locking interface 276. The sealing members 274 form a generally fluid-tight seal between the various components of the hydrocyclonic particle separator assembly 120 as well as between the hydrocyclonic particle separator assembly 120, the motor housing 124, and the intake 126.

Figure 7:
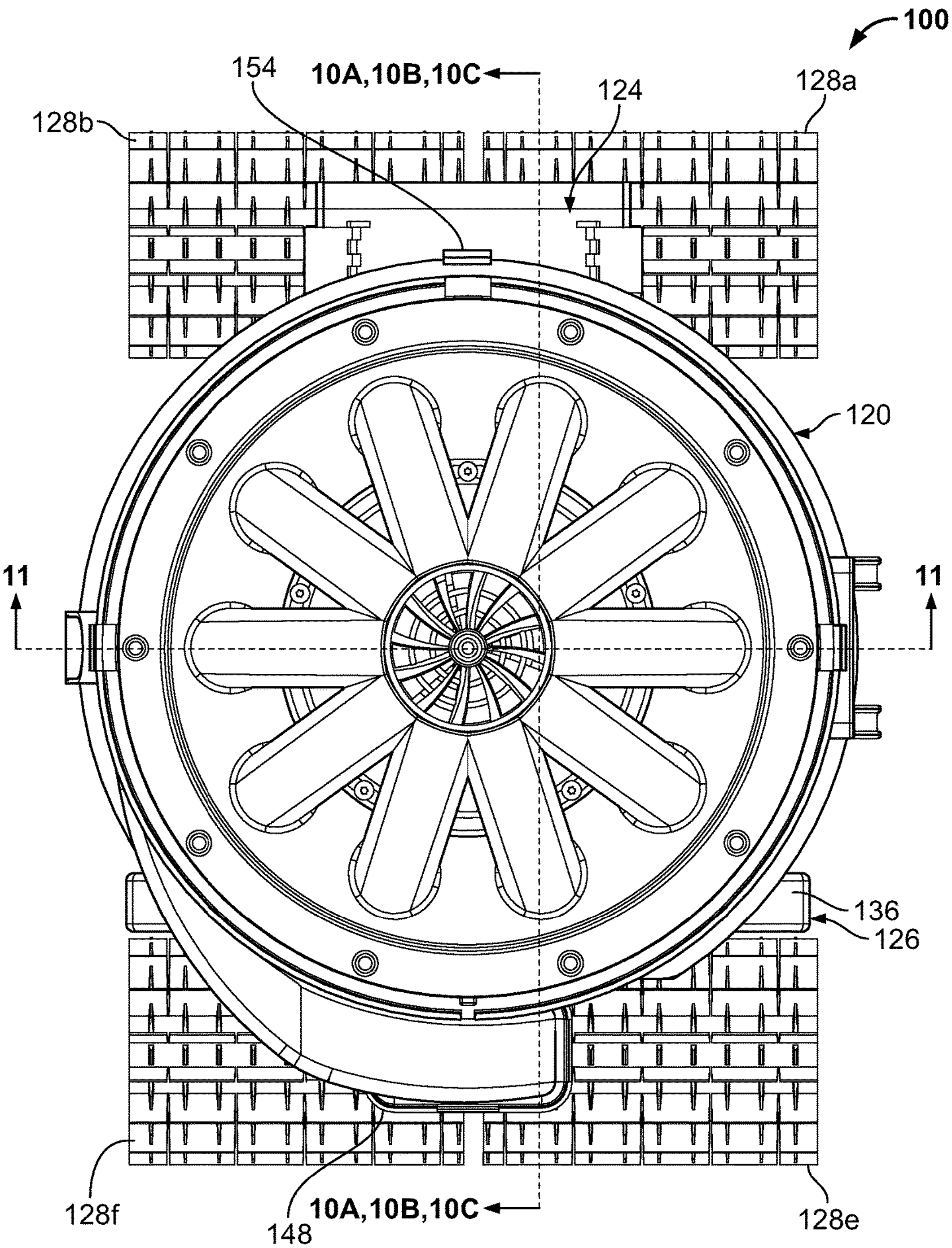
FIG. 7 is a top plan view of the pool cleaner of FIG. 1.
Figure 8:
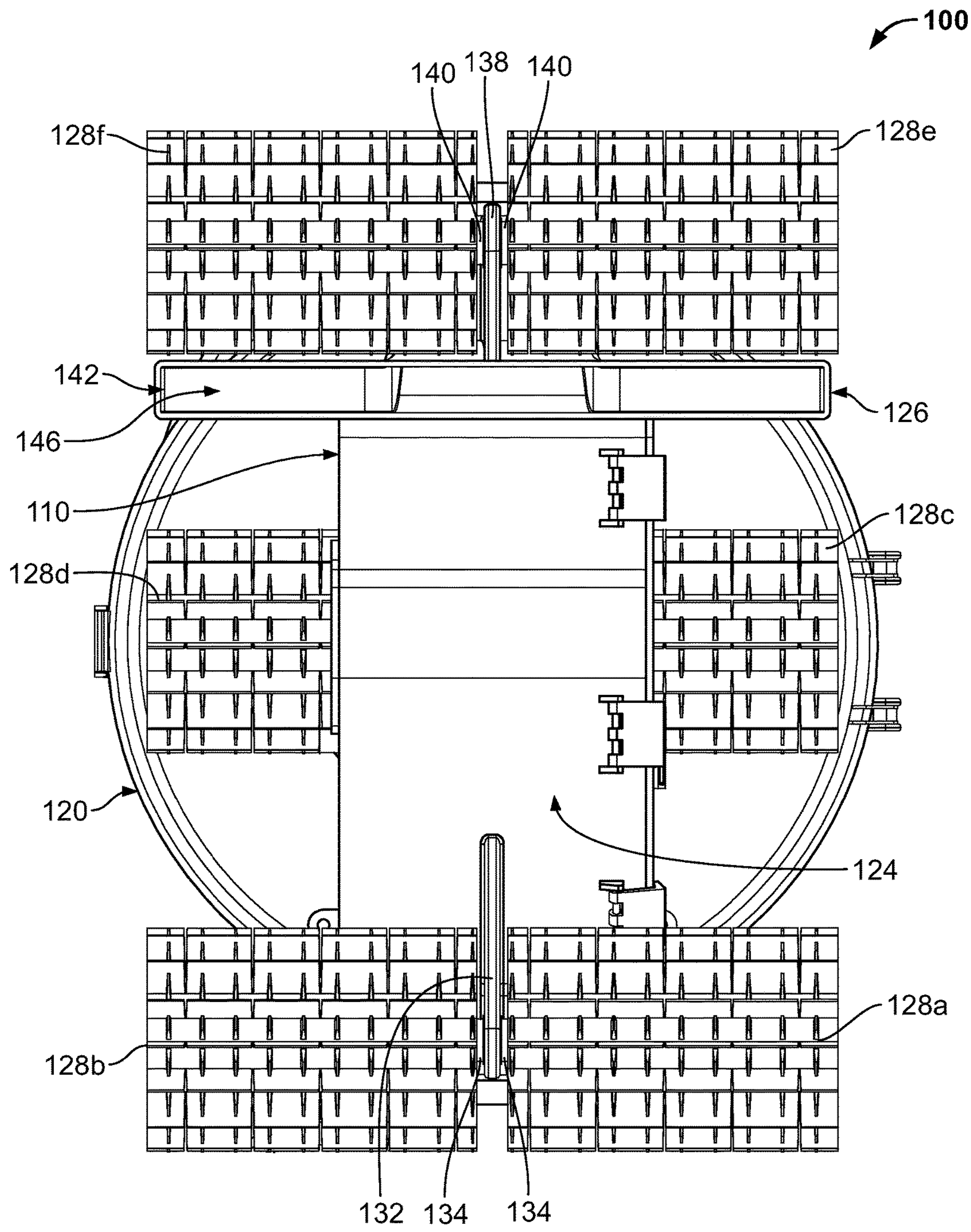
FIG. 8 is a bottom view of the pool cleaner of FIG. 1.
Figure 10B:
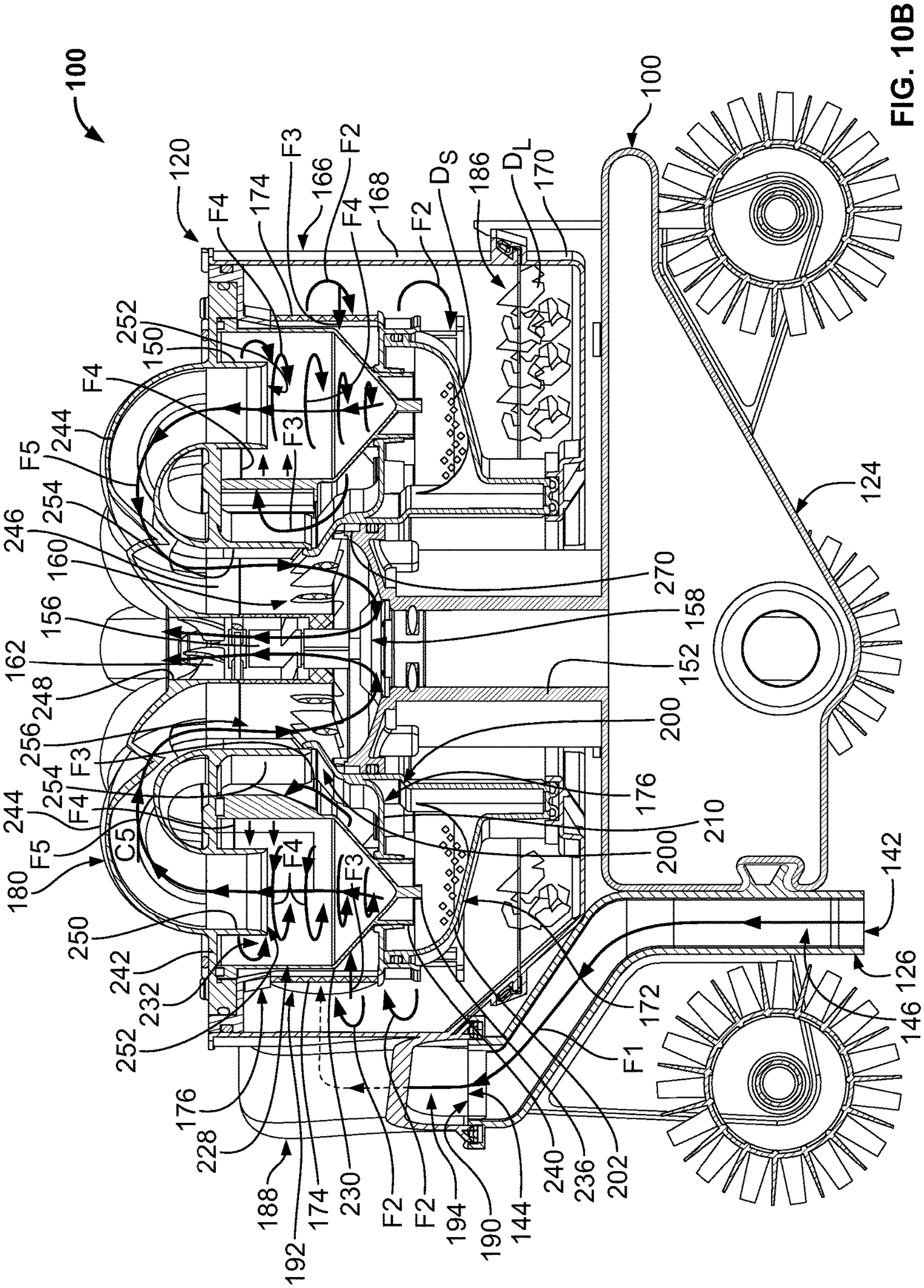
FIG. 10B is a sectional view of the pool cleaner taken along line 10B-10B of FIG. 7 showing, among other things, the flow paths of the pool cleaner.
Figure 10C:
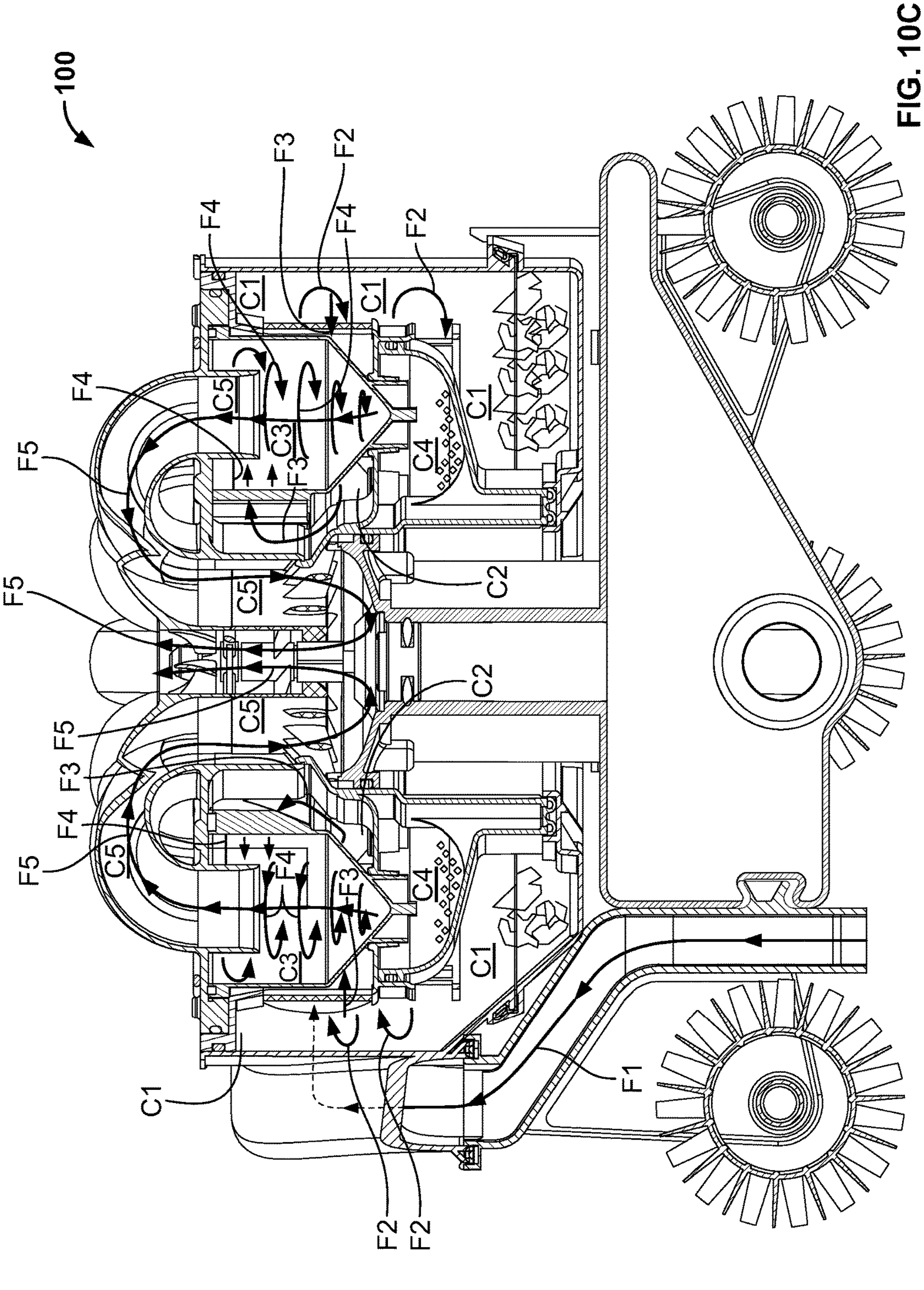
FIG. 10C is a sectional view of the pool cleaner taken along line 10C-10C of FIG. 7 showing, among other things, the chambers and flow paths of the pool cleaner.

When the hydrocyclonic particle separator assembly 120 is fully assembled and attached to the motor housing 124 and intake 126, a plurality of different chambers and flow paths are formed. FIG. 10A is a sectional view of the pool cleaner taken along line 10A-10A of FIG. 7 showing, among other things, reference numbers for the chambers of the pool cleaner, FIG. 10B is a sectional view of the pool cleaner taken along line 10B-10B of FIG. 7 showing, among other things, reference numbers for the flow paths within the pool cleaner, and FIG. 10C is a sectional view of the pool cleaner taken along line 10C-10C of FIG. 7 showing, among other things, reference numbers for certain chambers and flow paths of the pool cleaner. A first chamber C1 is generally formed at the interior of the canister body 166 and as a portion of the inner chamber 186 of the canister body 166. The first chamber C1 is generally delineated as being between the inside of the canister body 166, the outside of the fine debris container 172, the outside of the cyclone manifold 176, and the outside of the filtering medium 174. The first chamber C1 receives debris-laden water having large and small debris contained therein. Flow of the debris-laden water within the first chamber C1 is discussed in greater detail below in connection with the flow paths through the cleaner 100. A second chamber C2 is generally formed at the interior of the cyclone manifold 176, and generally delineated as being between the inside of the filtering medium 174, the inside of the cyclone manifold 176, the outside of the second tubular wall 254 of the top cap 180, the bottom of the top plate 242 of the top cap 180, the central hub 200 of the fine debris container 172, and the exterior cyclone container body 230 of each individual cyclone container 228. The second chamber C2 receives once-filtered debris-laden water from the first chamber C1, e.g., water that has small debris contained therein with the large debris filtered out. A third chamber C3 is generally formed at the cyclone chamber 232 of each individual cyclone container 228. The third chamber C3 is generally delineated as being between the interior of a cyclone container body 230, a vortex finder 250, and the bottom of the top plate 242. As such, the third chamber C3 is at least one third chamber C3 that is preferably comprised of a plurality of smaller, individual, radially-staggered chambers, e.g., each cyclone chamber 232 of each individual cyclone container 228, but for ease/clarity of description is referred to simply as a third chamber C3 and/or as at least one third chamber. The third chamber C3 receives the once-filtered debris-laden water from the second chamber C2. Flow of the once-filtered debris laden water is discussed in greater detail below. A fourth chamber C4 is generally formed at the interior of the dish 202 of the fine debris container 172, and generally delineated as being between the interior of the dish 202, the central hub 200, the bottom of the discoid body 210 of the cyclone manifold 176, the outlet nozzle of each individual cyclone container 228, and the mounting nozzle 240 of each individual cyclone container 228. The fourth chamber C4 is a static flow area that receives small debris that is separated out from the once-filtered debris-laden water that passes through the third chamber C3. The once-filtered debris-laden water is filtered a second time in the third chamber C3, where small debris "falls out" from the water and passes through the debris underflow nozzle 236 of each respective individual cyclone container 228 and into the fourth chamber C4. A fifth chamber C5 extends from the opening 252 of each vortex finder 250 to the central outlet 248 of the top cap 180. The fifth chamber C5 is generally delineated by the interior of the plurality of vortex finders 150, the inner chamber 245 of each of the plurality of arched tubes 244, the tubular chamber formed by the first and second tubular walls 246, 254, the finger guard 160, the mounting flange 270 of the mounting boss 152, the grommet 158, and the interior of the first tubular wall 246. Accordingly, the fifth chamber C5 is a serpentine-like chamber that originates at the opening 252 to each individual vortex finder 250 and extends to the central outlet 248 of the top cap 180, with the impeller 156, finger guard 160, and diffuser 162 being positioned in the fifth chamber C5. The fifth chamber C5 receives twice-filtered water, e.g., water having minimal debris therein, from the third chamber C3, and expels the water from the central outlet 248.

Turning now to a description of the flow paths through the cleaner 100, FIGS. 10B, 10C, 11, and 12 are sectional views of the cleaner 100 that illustrate the flow paths therethrough. A first flow path F1 extends from the inlet opening 142 of the intake 126, across the channel 146, out the outlet opening 144, into the inlet 190 of the canister intake 188, across the canister intake channel 194, and out of the tangential outlet 192 where the fluid enters the canister body 166. Water flowing through the first flow path F1 is unfiltered water that is laden with large and small debris $D_L$, $D_S$.

The second flow path F2 starts at the end of the first flow path F1, e.g., at the tangential outlet 192, entering the inner chamber 186 of the canister body 166 at the tangential outlet 192. The second flow path F2 enters the inner chamber 186 at a tangent to the canister body 166, the inner chamber 186, and the first chamber C1 and is partially directed by the flow director 218 of the cyclone manifold 176 to flow along the inner wall of the canister body 166. The combination of the tangential entrance of the second flow path F2 and the flow director 218 results in the generation of a cyclonic/rotational flow within the first chamber C1 that circles about a central axis A1 of the hydrocyclonic particle separator assembly 120. The cyclonic flow of the second flow path F2 within the first chamber C1 results in large debris particles $D_L$, e.g., debris having an aggregate size (e.g., each dimension) of up to about 1.25 inches, for example, such as, sticks, leaves, grass, coarse sand, fine sand, stones, pebbles, insects, small animals, etc., striking the interior surface of the canister body 166 and the filtering medium 174 and losing velocity, resulting in the large debris particles $D_L$ falling to the bottom of the canister body 166 where they are collected and stored until the canister subassembly 121 is removed from the cleaner 100 and emptied.

A third flow path F3 extends radially inward from the second flow path F2, flowing across the filtering medium 174 and the windows 220 of the cyclone manifold 176 into the second chamber C2. Fluid and smaller debris $D_S$ are contained in the third flow path F3, but the larger debris $D_L$ has been separated out. Accordingly, the fluid in the third flow path F3 is once-filtered fluid. The third flow path F3 connects with a fourth flow path F4 at the tangential inlet 238 to each individual cyclone container 228.

The fourth flow path F4 enters each individual cyclone container 228 at the respective tangential inlet 238 where it proceeds to the respective cyclone chamber 232, e.g., third chamber C3. The placement of the individual cyclone container's tangential inlet 238, e.g., at a tangent to the respective cyclone chamber 232, results in the fourth flow path F4 being a cyclonic/rotational flow within each cyclone chamber 232 about a secondary axis A2 of each individual cyclone container 228. The fourth flow path F4 rotates within each individual cyclone container 228 to separate smaller debris $D_S$, e.g., debris having an aggregate size (e.g., each dimension) of up to about 0.080 inches, for example, such as, coarse sand, fine sand, silt, dirt, insects, etc., based on the ratio of the smaller debris' $D_S$ centripetal force to fluid resistance from the fluid stream of the fourth flow path F4. More specifically, the fourth flow path F4 travels along the interior wall of the respective cyclone container body 230 and travels downward along the cyclone container body 230 toward the debris underflow nozzle 236 where the cyclone container body 230 beings to taper. As the fourth flow path F4 travels toward the tapered end of the cyclone container body 230, the rotational radius of the fourth flow path F4 is reduced. As the rotational radius of the fourth flow path F4 is reduced, the larger and denser particles of the smaller debris particles $D_S$ within the fourth flow path F4 have too much inertia to follow the continually reducing rotational radius of the fourth flow path F4 causing the smaller debris particles $D_S$ to contact the cyclone container body 230 and fall to the bottom where the small debris particles $D_S$ falls through the respective debris underflow nozzle 236 and into the fourth chamber C4 where it is collected and stored by the fine debris container 172 until the canister subassembly 121 is removed from the cleaner 100 and emptied. The fine debris container 172 can include holes or slots in the dish 202 thereof that allow the small debris particles $D_S$ to fall into the lower portion 170 of the canister body 166 or fall out from the fine debris container 172 when the canister body 166 is opened. The result of the above description is that smaller and smaller debris is separated from the fluid flowing in the fourth flow path F4 as the fourth flow path F4 proceeds down the tapered portion of the cyclone container body 230 forming an inner vortex. Additionally, as the fluid within the fourth flow path F4 reaches the bottom of the tapered portion of the cyclone container body 230, and the inner vortex, it slows down causing the fluid therein to be pulled upward through the respective vortex finder 250 as twice-filtered fluid and enter the fifth chamber C5 where it merges with the fifth flow path F5.

The fifth flow path F5 connects with the fourth flow path F4 at the opening 252 to each vortex finder 250 where twice-filtered fluid enters the fifth chamber C5. The fifth flow path F5 extends from the opening 252 of each vortex finder 250, across each inner chamber 245, into and across the tubular chamber 256, across the plurality of fins 268 of the finger guard 160, underneath the inner cylindrical wall 264, through the center of the inner cylindrical wall 264, out from the finger guard 160, through the diffuser 162, through the center of the first annular wall 246 of the top cap 180, and exits through the central outlet 248 of the top cap 180. That is, the fifth flow path F5 completely traverses the fifth chamber C5.

Accordingly, the larger cyclonic/rotational flow of the second flow path F2 flows about the central axis A1, while the smaller cyclonic/rotational flows of the fourth flow path F4 are formed and flow about the secondary axis A2 of each individual cyclone container 228, thus resulting in a plurality of smaller cyclonic/rotational flows within a larger cyclonic/rotational flow.

The flow of fluid through the cleaner 100, e.g., the five flow paths F1, F2, F3, F4, F5, is generated by the impeller 156 that is driven by the third motor (not shown) and positioned inline with the central outlet 248 of the top cap 180. The impeller 156 functions to discharge fluid through the central outlet 248 of the top cap 180, thus pulling fluid in reverse sequence through the cleaner 100. More specifically, the impeller 156 accelerates fluid through the central outlet 248 resulting in fluid being pulled sequentially through the fifth flow path F5, the fourth flow path F4, the third flow path F3, the second flow path F2, and then the first flow path F1 where the debris-laden fluid enters the cleaner 100 at the intake 126 through a suction effect generated at the inlet opening 142 of the intake 126.

As such, debris-laden fluid flowing through the cleaner 100 is filtered twice by particle separation due to the cyclones generated in the first chamber C1 and the third chamber C4. Utilizing the cyclonic flows within the cleaner 100 to separate the particles and drop the particles out of the flow path results in the retention of suction performance throughout the cleaner, as there is no opportunity for the debris particles to clog the filtering elements. This allows for optimum fluid flow performance through entire cleaning cycles, longer cleaner run times between debris removal, and the collection of more debris before needing to empty the canister subassembly 121. As is known in the art, the outward flow of clean fluid results in an opposing force, which, as is also known in the art, can be relied upon in navigation of the pool cleaner for the purpose of forcing a pool cleaner downward against the floor when the pool cleaner is traversing the floor and sideways against a wall, when the pool cleaner is traversing a wall of the pool.

Figure 11:
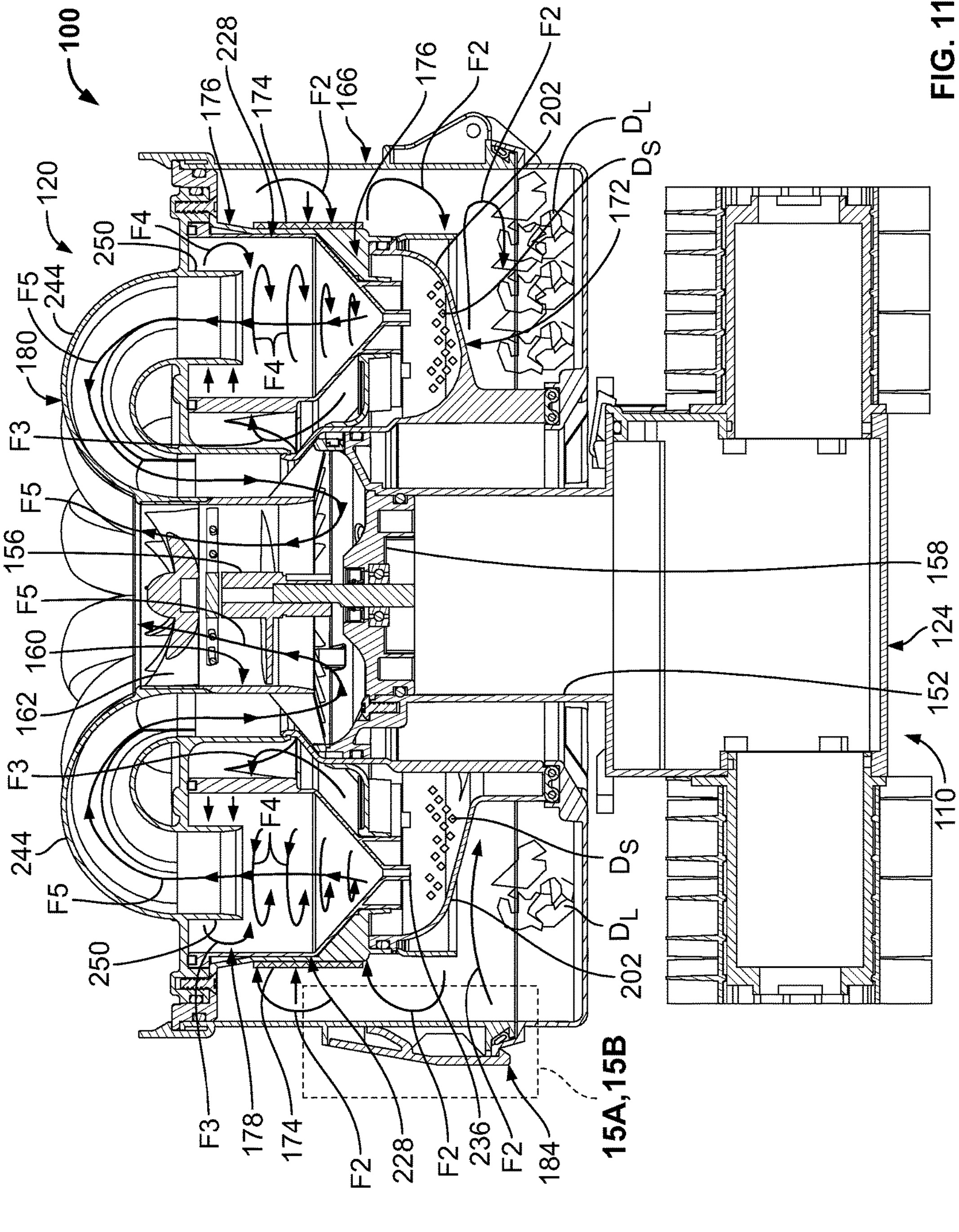
FIG. 11 is a sectional view of the pool cleaner taken along line 11-11 of FIG. 7.
Figure 12:
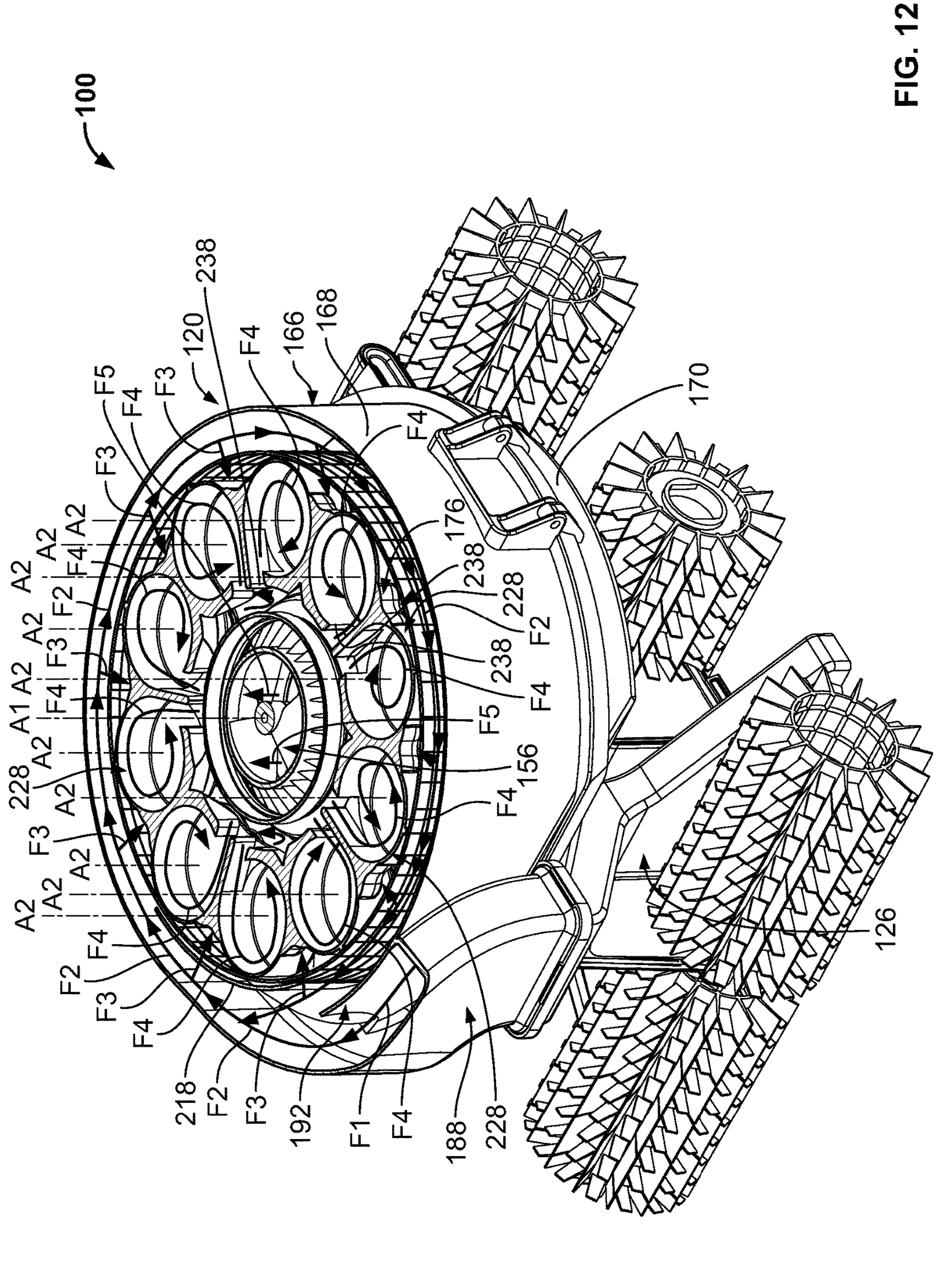
FIG. 12 is a sectional view of the pool cleaner taken along line 12-12 of FIG. 3.
Figure 15B:
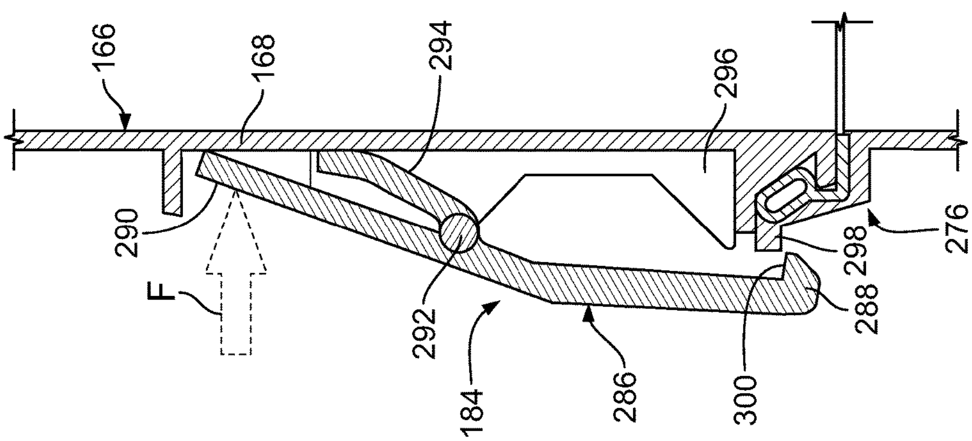
FIG. 15B is an enlarged view of the quick-release latch of FIG. 15A deformed by a force.
Figure 15A:
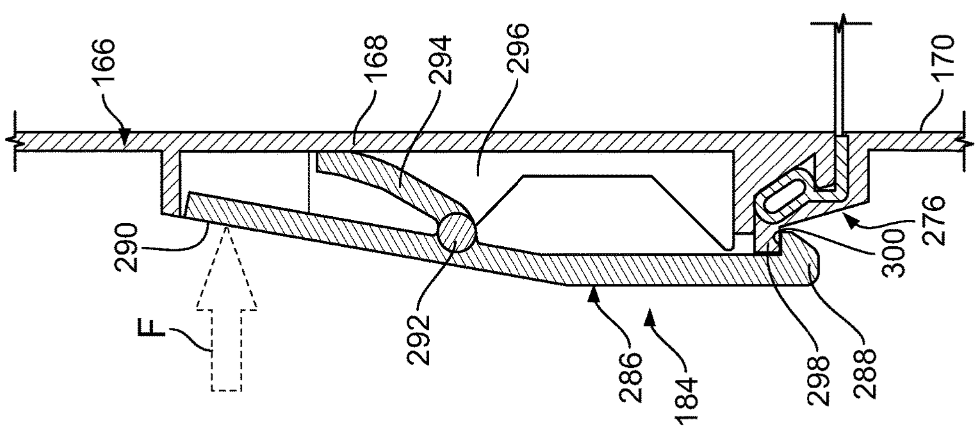
FIG. 15A is an enlarged view of Area 15A, 15B of FIG. 11 showing a first embodiment of a quick-release latch.
Figure 16:
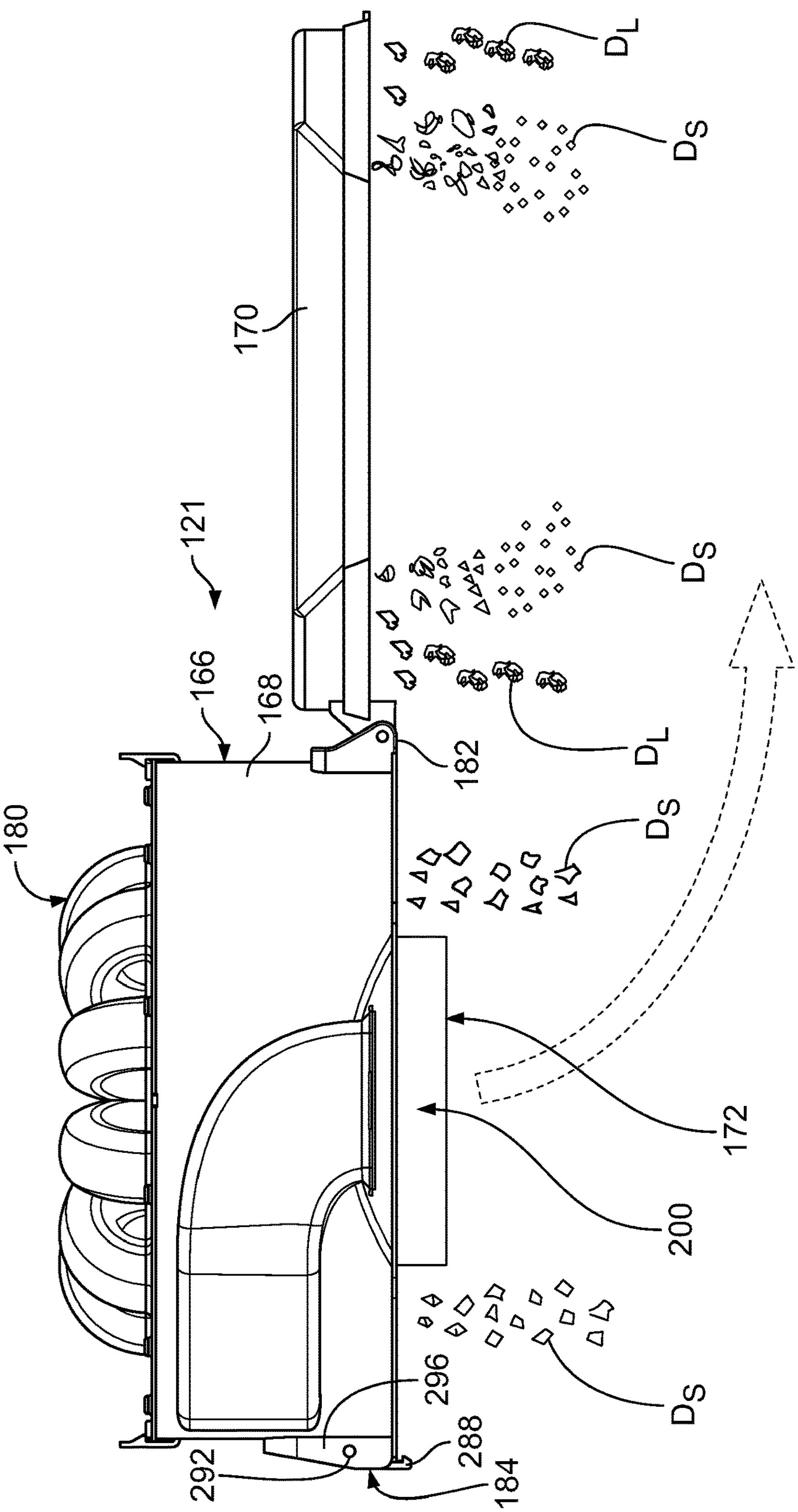
FIG. 16 is front elevational view of a portion of the canister subassembly opened and debris being removed.

Turning now to the release means 184 for disengaging the upper and lower portions 168, 170 of the canister body 166 (e.g., quick-release latch), FIG. 15A is an enlarged view of the Area 15A of FIG. 11 showing the quick-release latch 184 of the present disclosure in greater detail. The quick-release latch 184 includes a generally flag-shaped body 286 having a shaped head 288 at a first end and a user-engageable tab 290 at a second end opposite the first end, a pivot 292 disposed between the shaped head 288 and the user-engageable tab 290, and a spring 294 extending from the body 286. The spring 294 can be a resiliently flexible member integral with the body 286, e.g., a compliant mechanism, or it can be a torsion spring, compression spring, or any other spring mechanism known to one of skill in the art. The body 286 is mounted to a bracket 296 extending from the top portion 168 of the canister body 166 by the pivot 292 such that the body 286 is rotatable about the pivot 292. When the body 286 is interconnected with the bracket 296 the spring 294 is positioned between the body 286 and the canister body 166. The quick-release latch 184 is configured to engage a ridge 298 that extends radially outwardly from the lower portion 170 of the canister body 166. Particularly, the shaped head 288 includes a latching surface 300 that is configured to overlap the ridge 298 when the quick-release latch 184 is in a first position, e.g., a "locked" or "engaged" position. When in the first position, the spring 294 engages the canister body 166 biasing the user-engageable tab 290 away from the canister body 166 and the shaped head 288 toward the canister body 166, e.g., the spring 294 biases the quick-release latch 184 rotationally about the pivot 292. In this first position, the latching surface 300 overlaps the ridge 298 preventing the upper portion 168 and the lower portion 170 of the canister body 166 from being separated. However, a user can apply a force in the direction of arrow F against the user-engageable tab 290 to place the quick-release latch 184 in a second position, e.g., an "unlocked" or "disengaged" position. FIG. 15B is an enlarged view of the quick-release latch 184 in the second position. As can be seen in FIG. 15B, as a force is applied to the user-engageable tab 290 in the direction of arrow F the spring 294 is compressed between the user-engageable tab 290 and the canister body 166, resulting in the user-engageable tab 290 moving toward the canister body 166 and the shaped head 288 away from the canister body 166 and the ridge 298. Movement of the shaped head 288 away from the canister body 166 and the ridge 298 results in clearance between the shaped head 288 (and the latching surface 300) and the ridge 298 so that the upper and lower portions 168, 170 of the canister body 166 can be rotated apart from one another about the hinge 182, as shown in FIG. 16, which is a front elevational view of the canister body 166 opened. Removing the force from the user-engageable tab 290 results in the spring 294 pushing the quick-release latch 184 back into the first position, e.g., the user-engageable tab 290 is rotated away from the canister body 166 and the shaped head 288 is rotated toward the canister body 166.

As can be seen in FIG. 16, when the quick-release latch 184 is moved into the second position, the lower portion 170 and the upper portion 168 of the canister body 166 are permitted to rotate away from one other about the hinge 182. Accordingly, as the lower portion 170 is rotated, any large and small debris $D_L$, $D_S$ retained in the lower portion 170 can fall out or be removed therefrom, and any small debris $D_S$ retained by the fine debris container 172 can fall through the holes/slots thereof or be removed therefrom, as illustrated in FIG. 16. Additionally, the canister subassembly 121 is configured to retain water during cleaning, which can be swirled around the inside of the canister subassembly 121 during cleaning to ensure that all debris is in suspension and thus assist with flushing out the large and small debris $D_L$, $D_S$. This configuration allows a user to remove the debris $D_L$, $D_S$ from the canister body 166 without having to touch the debris $D_L$, $D_S$.

One of ordinary skill in the art should appreciate that the release means 184 could be any suitable means for engaging the upper and lower portions 168, 170 of the canister body 166. For example, the release means 184 could be a mating component arrangement, a sliding spring latch, a rotatable spring latch, or any other known latching assemblies.

Figure 14:
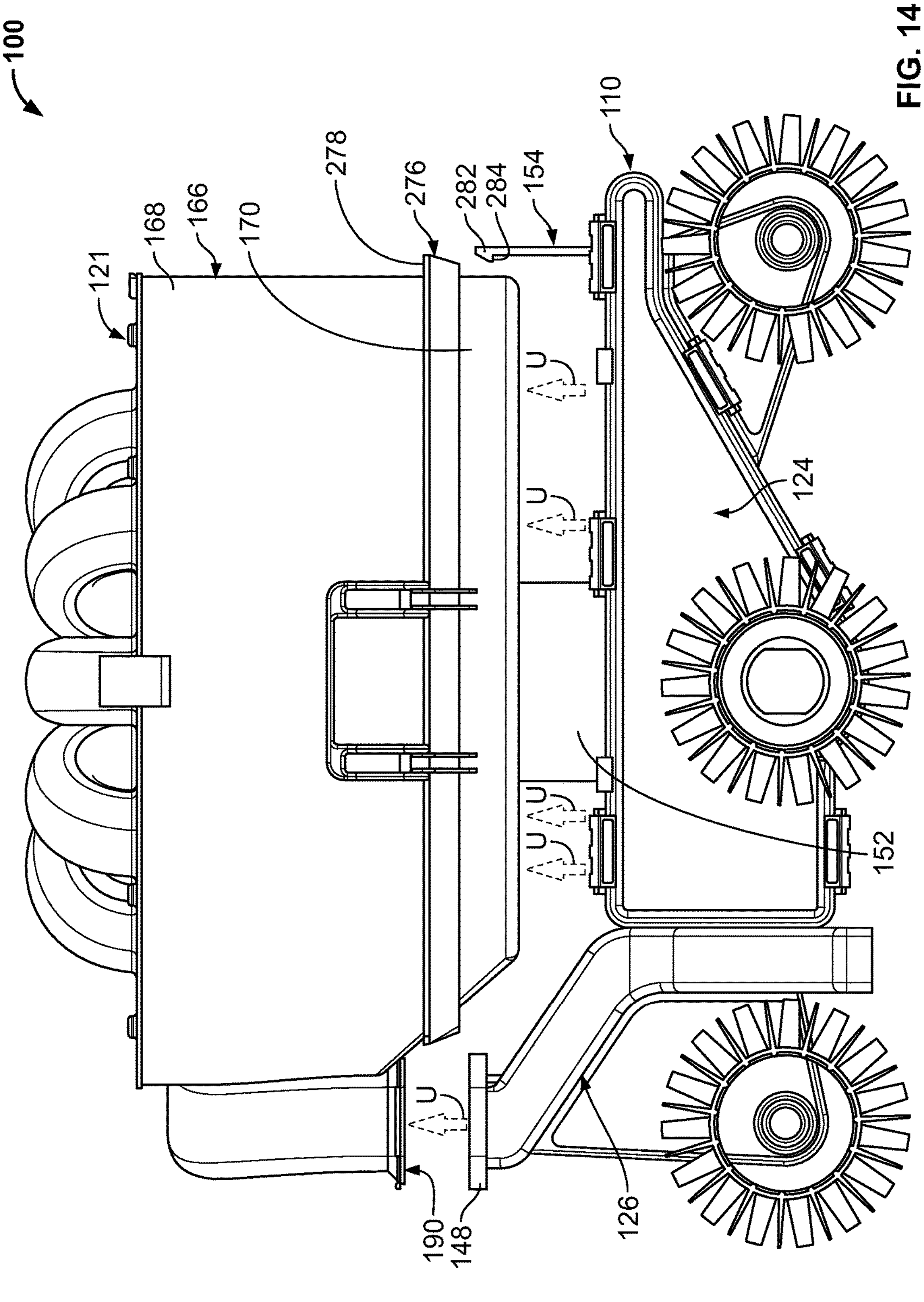
FIG. 14 is a partially exploded view of the cleaner of FIG. 1 showing removal of the canister subassembly from the motor housing.

In operation, to empty the canister body 166 a user would first disconnect the canister subassembly 121 from the motor housing 124 by pressing forward against the front latch 154, as shown in FIG. 13B, to disengage the front latch 154 from the locking interface 276, and then removing the canister subassembly 121 from the motor housing 124 by pulling in the direction of arrows U shown in FIG. 14. Once removed, the user would then press the user-engageable tab 290 of the quick-release latch 184 in the direction of arrow F of FIG. 15A to disengage the shaped head 288 of the quick-release latch 184 from the ridge 298, as shown in FIG. 15B. Upon disengagement of the shaped head 288 from the ridge 298 the upper and lower portions 168, 170 of the canister body 166 are permitted to rotate away from one another about the hinge 182, thus opening the canister subassembly 121. The user would then further separate the upper and lower portions 168, 170, and turn the lower portion 170 upside down allowing the large and small debris $D_L$ and $D_S$ to fall from the lower portion 170, and the small debris $D_S$ to fall from the fine debris container 172, e.g., through the holes/slots thereof. To close the canister subassembly 121 a user would rotate the upper and lower portions 168, 170 toward one another about the hinge 182 until the ridge 298 engages the shaped head 288. Continued force by the user will cause for the ridge 298 to push the shaped head 288 away from the canister body 166, that is, the spring 294 will become compressed, until the canister body 166 is closed with the ridge 298 clearing the shaped head 288. Once the ridge 298 clears the shaped head 288, the shaped head 288 is biased by the spring 294 toward the canister body 166 placing the latching surface 300 adjacent the ridge 298 and thus locking the canister body 166. The user then places the canister subassembly 121 over the mounting boss 152 and aligns the inlet 190 of the canister intake 188 with outlet 144 of the intake 126. Next, the user exerts a downward force on the canister subassembly 121 so that the locking interface 276 contacts the slanted head 282 of the front latch 154 and forces the front latch 154 to slightly bend at the body 280 such that the slanted head 282 is forced forward. Once the canister subassembly 121 is forced completely down so that the entirety of the locking interface 276 is lower than slanted head 282, the front latch 154 snaps back to its original up-right position and the canister subassembly 121 is removably "locked" in position, as shown in FIG. 13B.

In other aspects of the present disclosure, the canister subassembly 121 can be provided with a handle to facilitate handling thereof by a user.

Further discussion shall now be had with respect to example embodiments of a drive system 110. As discussed above with reference to FIG. 2, for example, a first one of the drive rollers 130 is operatively connected to a first drive motor (not shown) inside the motor housing 124 and a first roller set (rollers 128*a*, 128*c*, and 128*e*) for mechanical communication of the driving force thereto, and such that the rollers 128*a*, 128*c*, and 128*e* rotate at the same first rate. As also discussed above with reference to FIG. 2, for example, a second one of the drive rollers 130 is operatively connected to a second drive motor (not shown) inside the motor housing 124 and a second roller set (rollers 128*b*, 128*d*, and 128*f*) for mechanical communication of the driving force thereto, and such that the rollers 128*b*, 128*d*, and 128*f* rotate at the same second rate.

In the disclosure of the embodiments of FIGS. 1-16, gear trains can be provided that are not shown, but can be internal of the other components and/or positioned centrally proximal the ends of the rollers 128*a-f* that are proximate to the motor housing 124. For example, a first gear train can be provided for mechanical linkage and translation of drive from the first roller drive 130 to the rollers 128*a*, 128*c*, and 128*e* of the first roller set, and a second gear train can be provided for mechanical linkage and translation of drive from the second roller drive 130 to the rollers 128*b*, 128*d*, and 128*f* of the second roller set.

Figure 17:
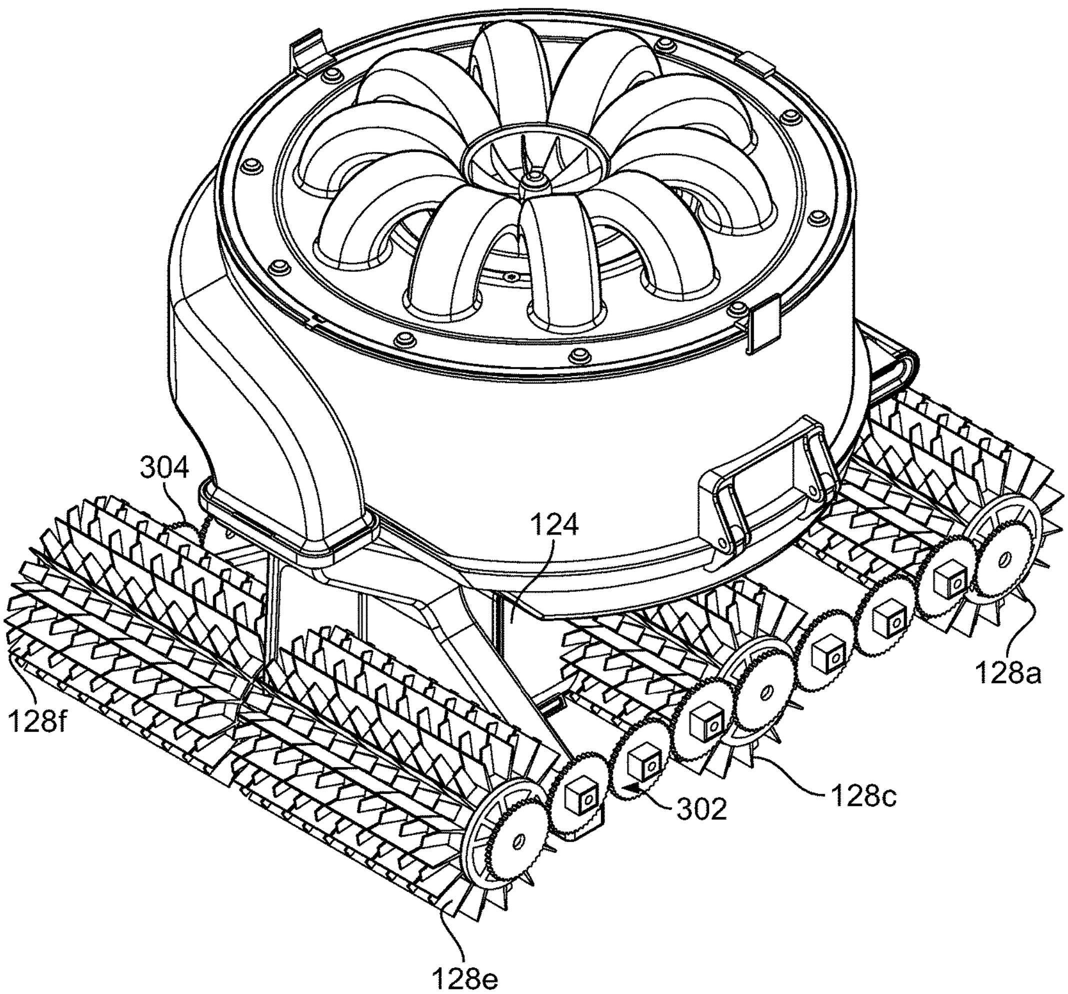
FIG. 17 is a perspective view of a second embodiment of a pool cleaner with gears thereof shown schematically distal of the motor housing.
Figure 18:
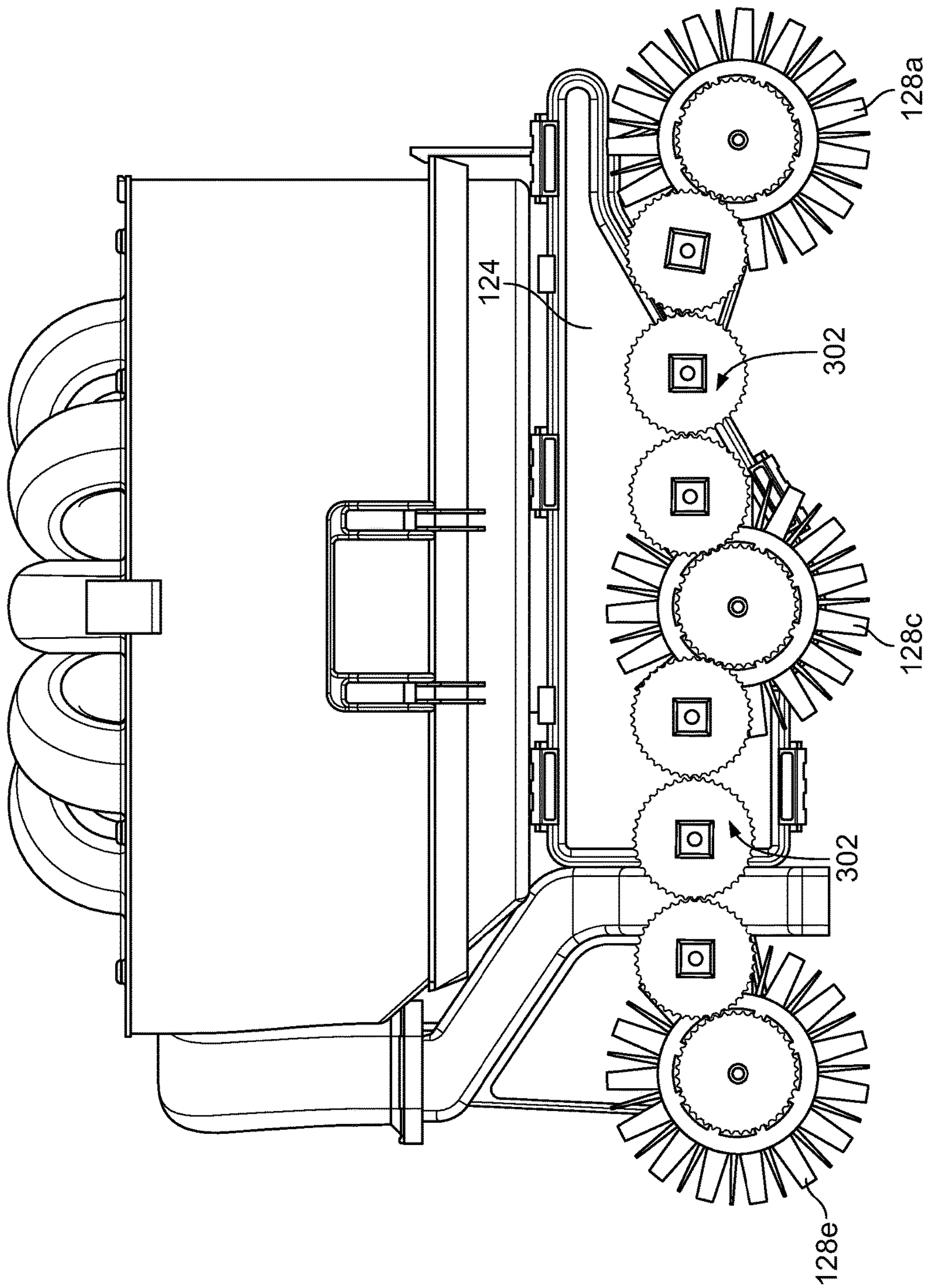
FIG. 18 is a right side elevational view of the pool cleaner of FIG. 17.
Figure 19:
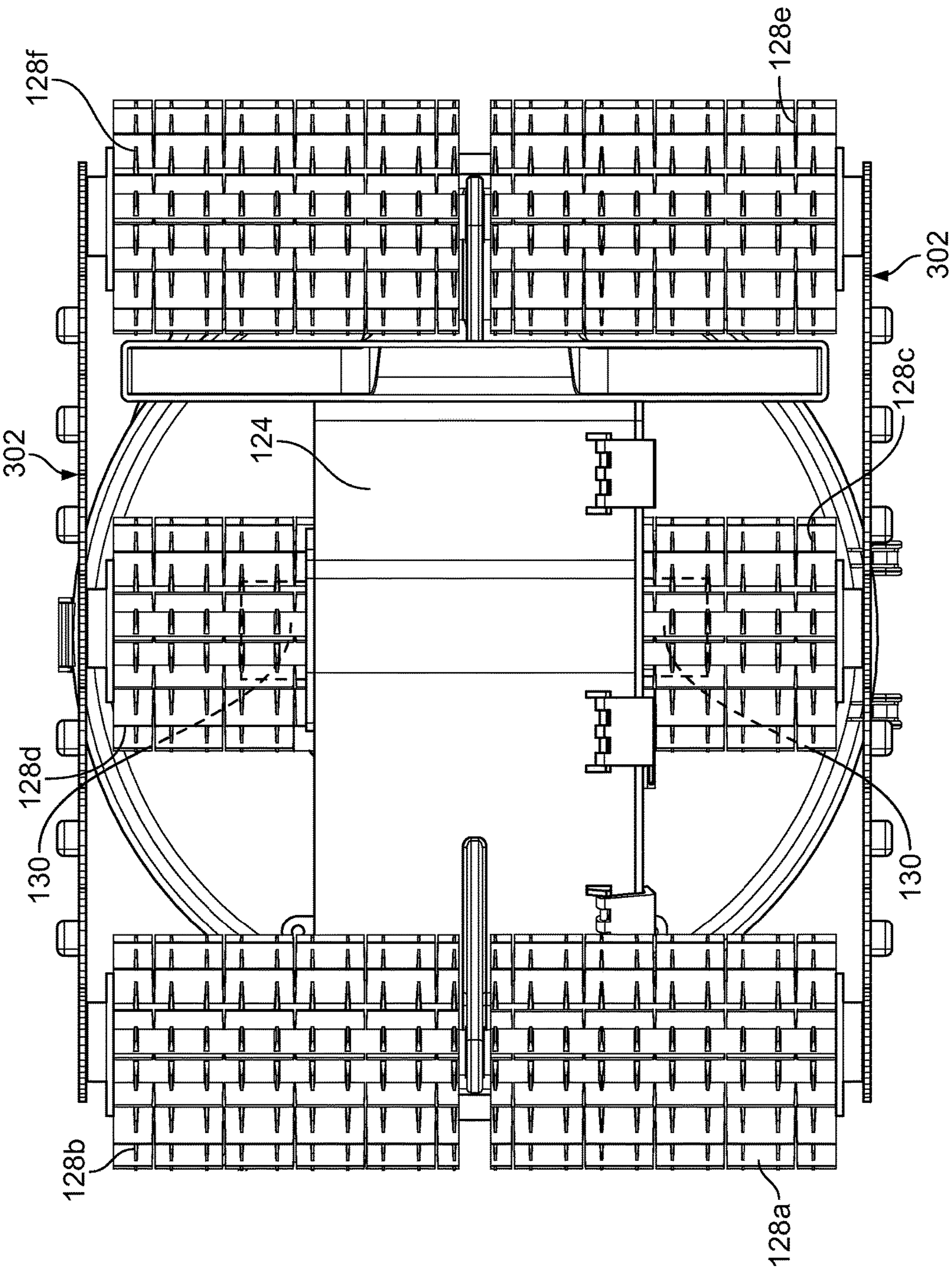
FIG. 19 is a bottom view of the pool cleaner of FIG. 17.
Figure 20:
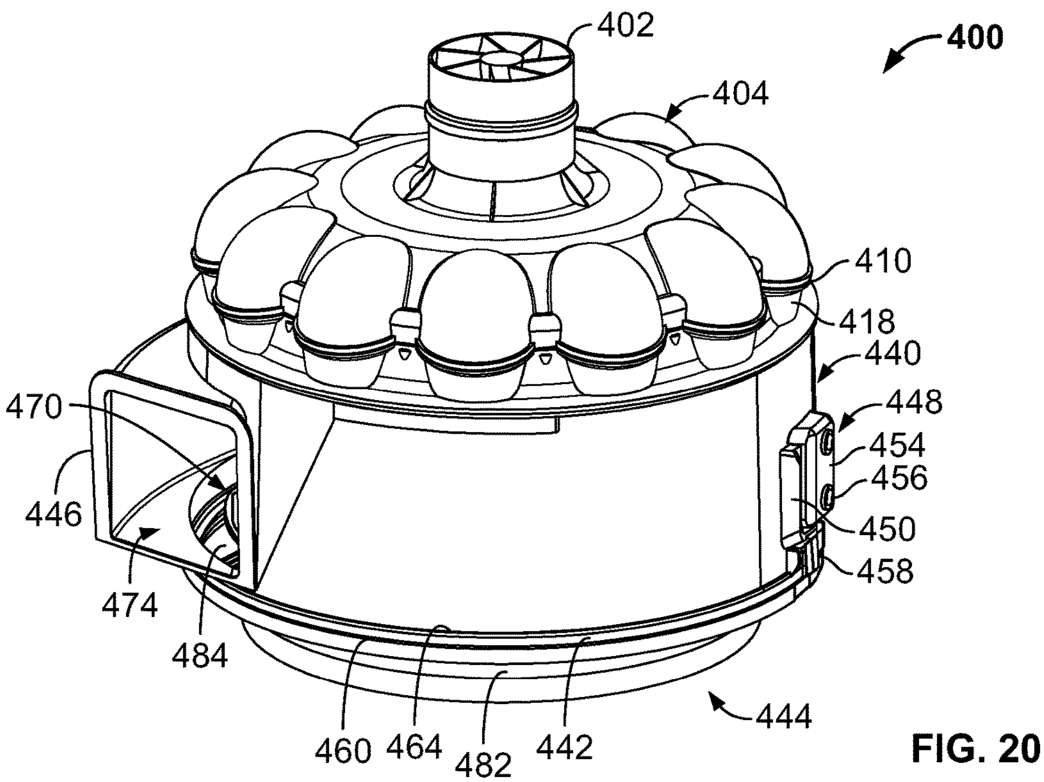
FIG. 20 is a perspective view of a second embodiment of a hydrocyclonic particle separator assembly.
Figure 21:
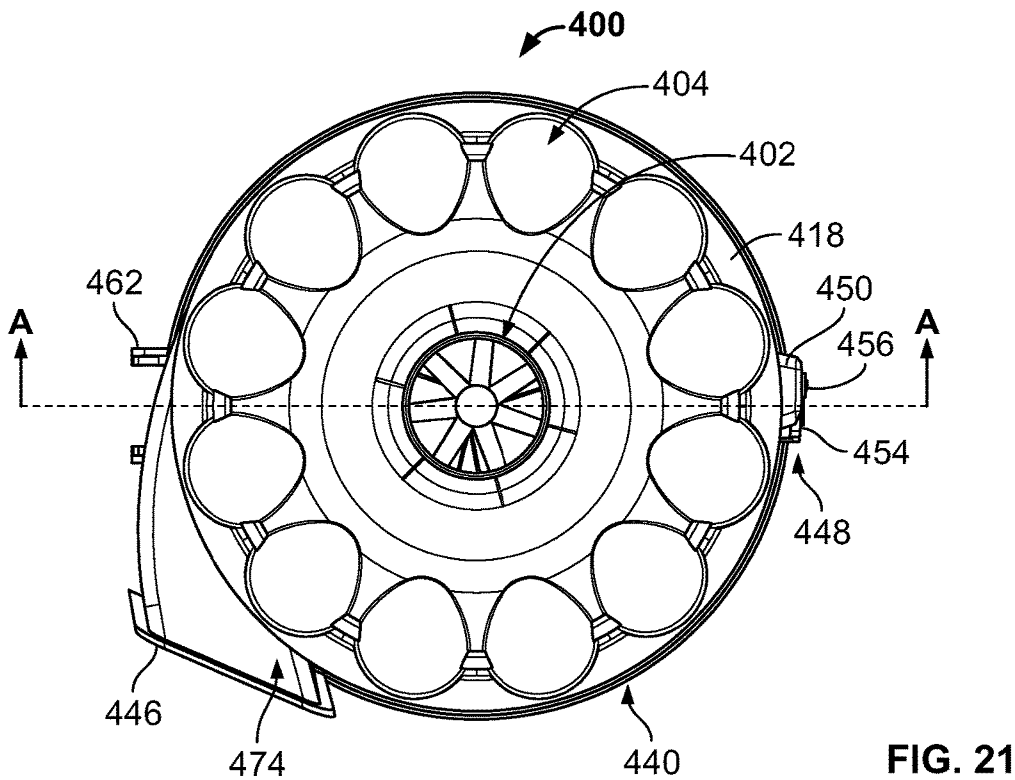
FIG. 21 is a top view of the hydrocyclonic particle separator assembly of FIG. 20.
Figure 22:
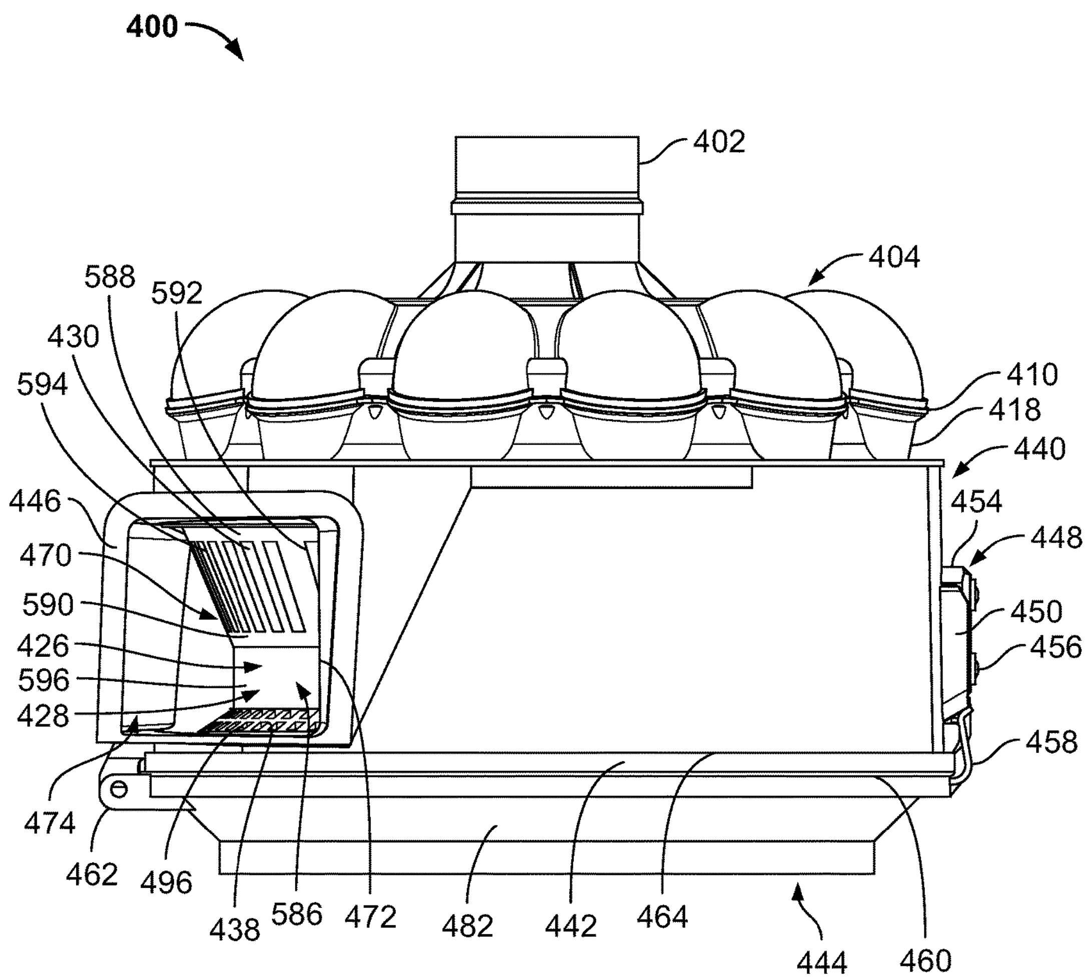
FIG. 22 is a side view of the hydrocyclonic particle separator assembly of FIG. 20.

Referring to FIGS. 17-19, it is not required for the first gear train and/or the second gear train to be positioned internally of other components and/or to be positioned at ends of the rollers 128*a-f* that are proximate the motor housing 124. Indeed, as shown in FIGS. 17-19, an example first gear train 302 and an example second gear train 304 can be positioned external of other components and/or at ends of the rollers 128*a-f* that are distal the motor housing 124.

Although electric sources are contemplated, other power sources are also contemplated. For example, the power source can be positive water pressure, as in what is commonly referred to in the pool industry as a "pressure cleaner." As another example, the power source can negative water pressure, as in what is commonly referred to in the pool industry as a "suction cleaner." Any power source and/or combinations thereof are contemplated.

The first rate and the second rate can be the same or different, depending on the circumstances. For example, where the cleaner desires to move in a straight trajectory, the first rate and the second rate may generally be the same, except whether the pool cleaner detects that other relevant parameters are unequal, such as uneven traction, in which case the first rate and the second rate may be different for a straight trajectory. Where it is desired for the pool cleaner to turn, for example, the first rate and the second rate may be different. Additionally and/or alternatively, the first set of rollers (rollers 128*a*, 128*c*, and 128*e*) can rotate in a first direction, while the second roller set (rollers 128*b*, 128*d*, and 128*f*) can rotate in a second direction opposite the first direction.

With reference to FIGS. 20-28, perspective, top, side, exploded and sectional views of a second embodiment of a hydrocyclonic particle separator assembly 400 are provided. It should be understood that the hydrocyclonic particle separator assembly 400 can be substantially similar in structure and function to the hydrocyclonic particle separator 120 and can be implemented with the pool cleaner 100 when suitable, as understood by one of ordinary skill in the art.

The hydrocyclonic particle separator assembly 400 includes a canister subassembly and a fluid turbine subassembly. In particular, the hydrocyclonic particle separator assembly 400 includes a guard (which can be a diffuser 402 e.g., a stator), a top cap 404, an impeller 406, an impeller skirt 408, an impeller retaining ring 466, a ring 410 of vortex finders 412, a vortex finder gasket 678, a shaft 414, and a ball bearing 416 disposed around the shaft 414. The hydrocyclonic particle separator assembly 400 further includes a cyclone block 418 with a plurality of circumferentially disposed cyclone containers 420, a first gasket 422, a second gasket 424, a filtering assembly 426 including a filtering medium support 428 and a filtering medium 430, and a fine debris container top 432, and a fine debris container 434. The hydrocyclonic particle separator assembly 400 further includes an O-ring 436, a debris separator ring 438, a canister body 440, a gasket 442, a large debris container 444 that defines the bottom of the hydrocyclonic particle separator assembly 400, and a gasket 468 disposed between the large debris container 444 and the fine debris container 434.

The canister body 440 includes an inlet 446 that tangentially introduces fluid into the hydrocyclonic particle separator assembly 400. The canister body 440 further includes a locking assembly 448, the locking assembly 448 including a snap plate 450 disposed on the canister body 440, a snap spring 452, a slide cover 454 and screws 456. The locking assembly 448 can interlock with a complementary extension 458 protruding from a top edge 460 of the large debris container 444. The large debris container 444 includes a hinge 462 connected to a complementary hinge at a bottom edge 464 of the canister body 440. The large debris container 444 can thereby pivot at the hinge 462 between an open and a closed position, and the locking assembly 448 can be used to lock the large debris container 444 relative to the canister body 440 to maintain the large debris container 444 in a closed position.

Figure 29:
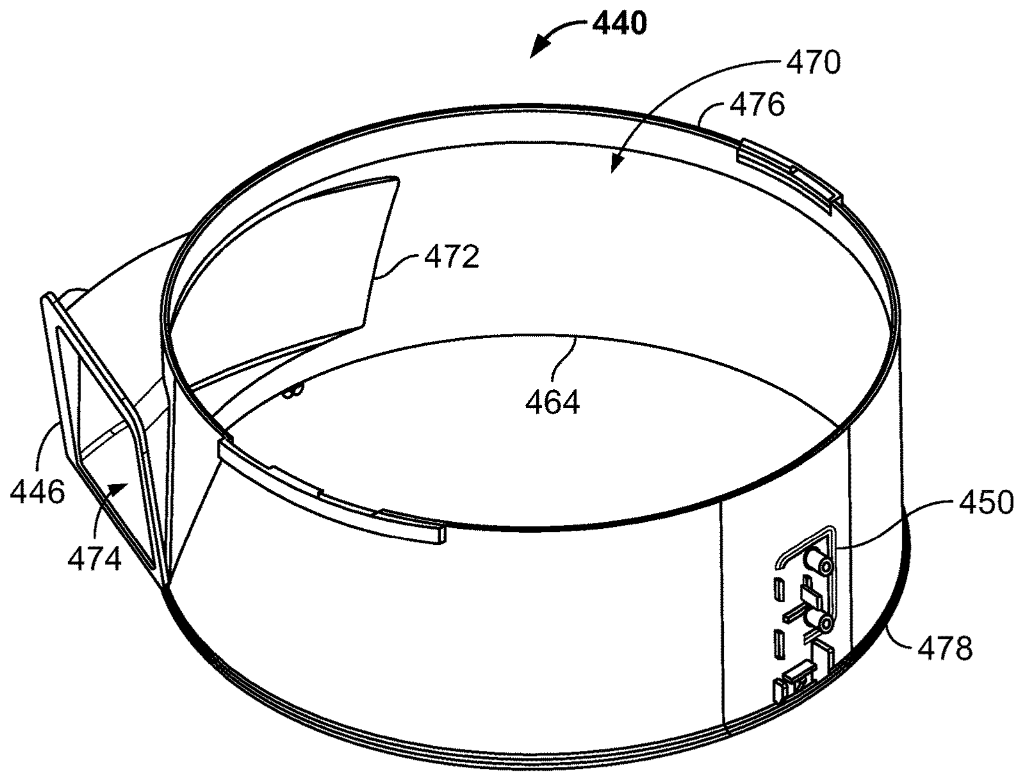
FIG. 29 is a perspective view of a canister body of the hydrocyclonic particle separator assembly of FIG. 20.

The impeller 406 can engaged with the shaft 414 such that rotation of the shaft 414 simultaneously rotates the impeller 406. The shaft 414 can engage the third motor (not shown), which can be positioned within the mounting boss 152 of the motor housing 124 (see, e.g., FIG. 2). The bottom edge 464 of the canister body 440 can be hingedly engaged with the large debris container 444 by the hinge 462 and releasably secured to each other by the locking assembly 448 (e.g., a quick-release latch). The gasket 442 can separate the bottom edge 464 of the canister body 440 from the top edge 460 of the large debris container 444. With additional reference to FIG. 29, the canister body 440 generally defines an inner chamber 470 and includes the intake or inlet 446 positioned such that fluid is introduced tangentially into the inner chamber 470. In particular, the inlet 446 includes a tangential outlet 472 and an intake channel 474 extending between the inlet 446 and the tangential outlet 472. The tangential intake of fluid through the intake channel 474 results in the generation of a first cyclonic flow within the inner chamber 470. The canister body 440 defines a substantially cylindrical configuration with substantially similar top and bottom edge openings 476, 478. In some embodiments, the hydrocyclonic particle separator assembly 400 can include a check valve (not shown) for regulating the amount of fluid flow passing through the hydrocyclonic particle separator assembly 400. In some embodiments, the check valve can be disposed at or near the inlet 446 of the canister body 440.

Figure 30:
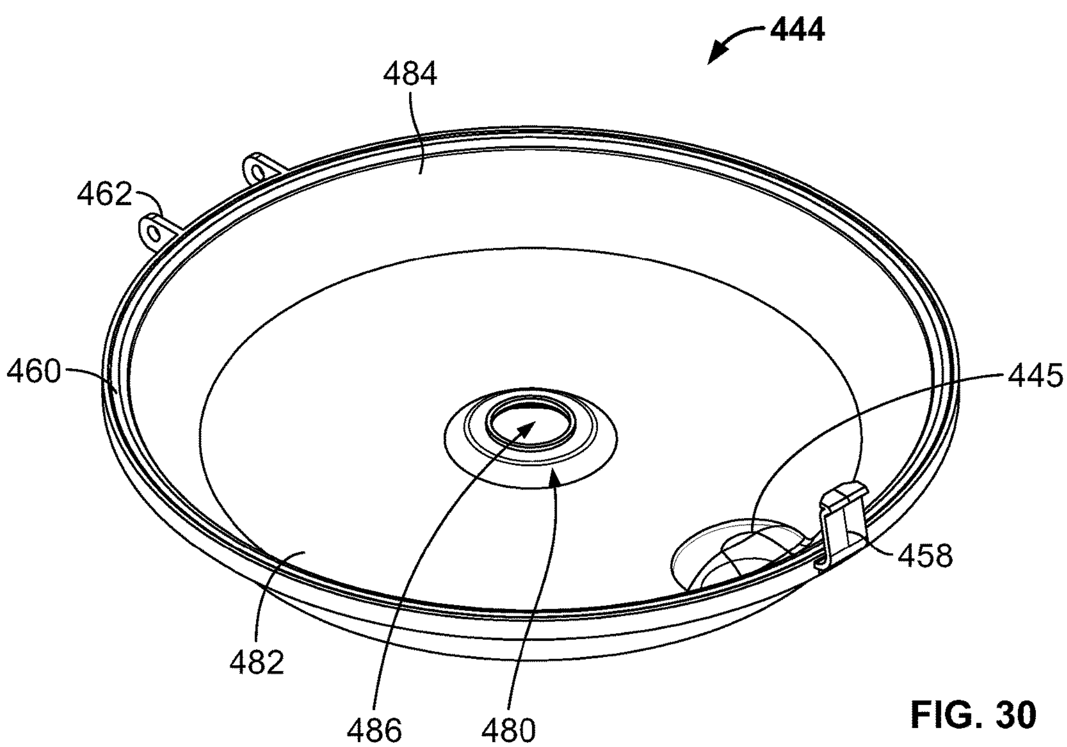
FIG. 30 is a perspective view of a large debris container of the hydrocyclonic particle separator assembly of FIG. 20.

With additional reference to FIG. 30, the large debris container 444 includes a central hub 480 surrounded by a dish 482 extending radially from the central hub 480. In some embodiments, the dish 482 can have an upwardly-curving shape such that the dish 482 catches any debris that falls into the dish 482 and forms a static area where falling debris can land. In some embodiments, the dish 482 can include a substantially planar bottom surface with upwardly angled side walls 484. The central hub 480 includes a top opening 486 through which one end of the shaft 414 can pass to engage the third motor. In some embodiments, the bottom surface of the large debris container 444 can include a honeycomb pattern of ribs 488. The ribs 488 can reduce the overall weight of the large debris container 444 while providing structural support. The entire volume of the dish 482 can be disposed below the canister body 440.

Figure 31:
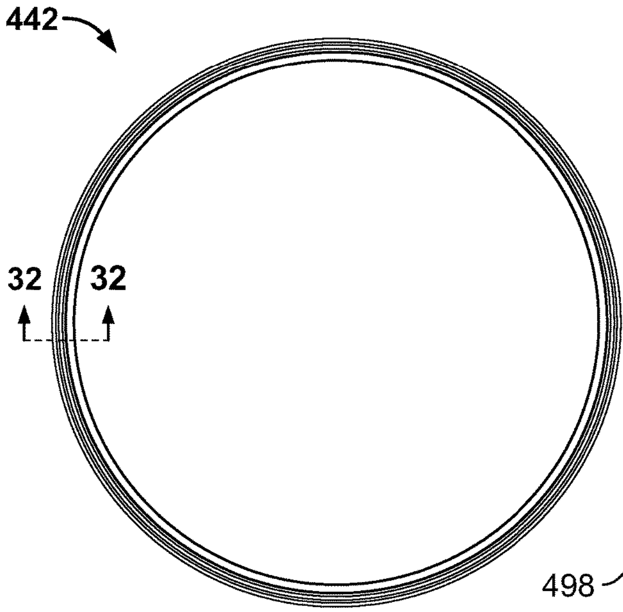
FIG. 31 is a top view of a gasket of the hydrocyclonic particle separator assembly of FIG. 20.
Figure 32:
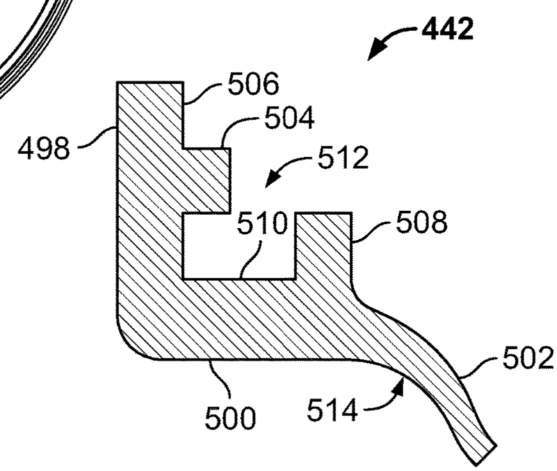
FIG. 32 is a sectional view of the gasket taken along line 32-32 of FIG. 31.

The gasket 442 separates the perimeter of the bottom edge 464 of the canister body 440 from the top edge 460 of the large debris container 444. With reference to FIGS. 31 and 32, the gasket 442 defines a substantially L-shaped cross-section including a vertical portion 498 extending perpendicularly from a horizontal portion 500. The proximal end of the horizontal portion 500 connects to the vertical portion 498 while an opposing distal end of the horizontal portion 500 includes a curved extension 502. The curved extension 502 bends downward and away from the vertical portion 498. The vertical portion 498 includes a perpendicular protrusion 504 extending from an inner surface 506. The horizontal portion 500 includes a perpendicular protrusion 508 extending from an inner surface 510. In some embodiments, the perpendicular protrusion 508 can be located at the distal end of the horizontal portion 500. The perpendicular protrusions 504, 508 form a channel 512 therebetween.

The channel 512 can be configured and dimensioned to receive the bottom edge 464 of the canister body 440. In some embodiments, the perpendicular protrusions 504, 508 create a friction fit between the gasket 442 and the canister body 440, thereby ensuring continued attachment of the gasket 442 relative to the canister body 440. The radius 514 of curvature of the curved extension 502 can be selected to be substantially complementary to the upwardly angled side walls 484 of the large debris container 444. Thus, when the large debris container 444 is positioned in a closed position, the gasket 442 can mate against the upwardly angled side walls 484 of the large debris container 444 to create a water-tight seal between the large debris container 444 and the canister body 440.

The debris separator ring 438 can be in the form of a cylindrical mesh ring including a central opening 490, and defining an outer circumferential edge 492 and an inner circumferential edge 494. The outer circumferential edge 492 can define a cross-sectional width dimensioned smaller than a cross-sectional width of the inner circumferential edge 494. In some embodiments, the cross-sectional width can gradually taper and increase in dimension from the outer circumferential edge 492 to the inner circumferential edge 494. A portion of the debris separator ring 438 extending radially from the outer circumferential edge 492 towards the inner circumferential edge 494 can include a plurality of radial apertures 496 (e.g., one or more rows of apertures 496) formed therein. In some embodiments, the apertures 496 can extend substantially halfway from the outer circumferential edge 492 to the inner circumferential edge 494.

Figure 25:
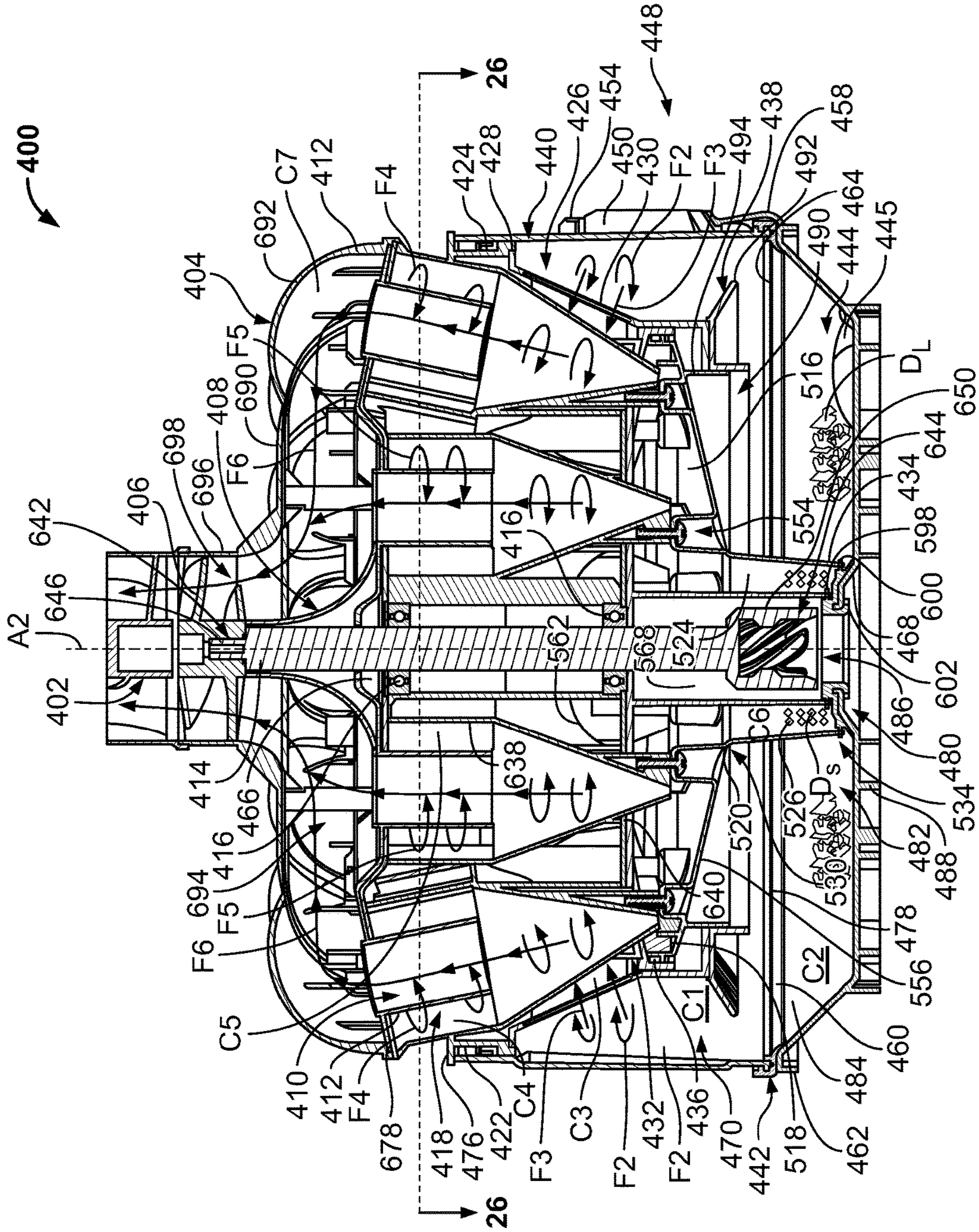
FIG. 25 is a sectional view of the hydrocyclonic particle separator assembly taken along line A-A of FIG. 21.
Figure 26:
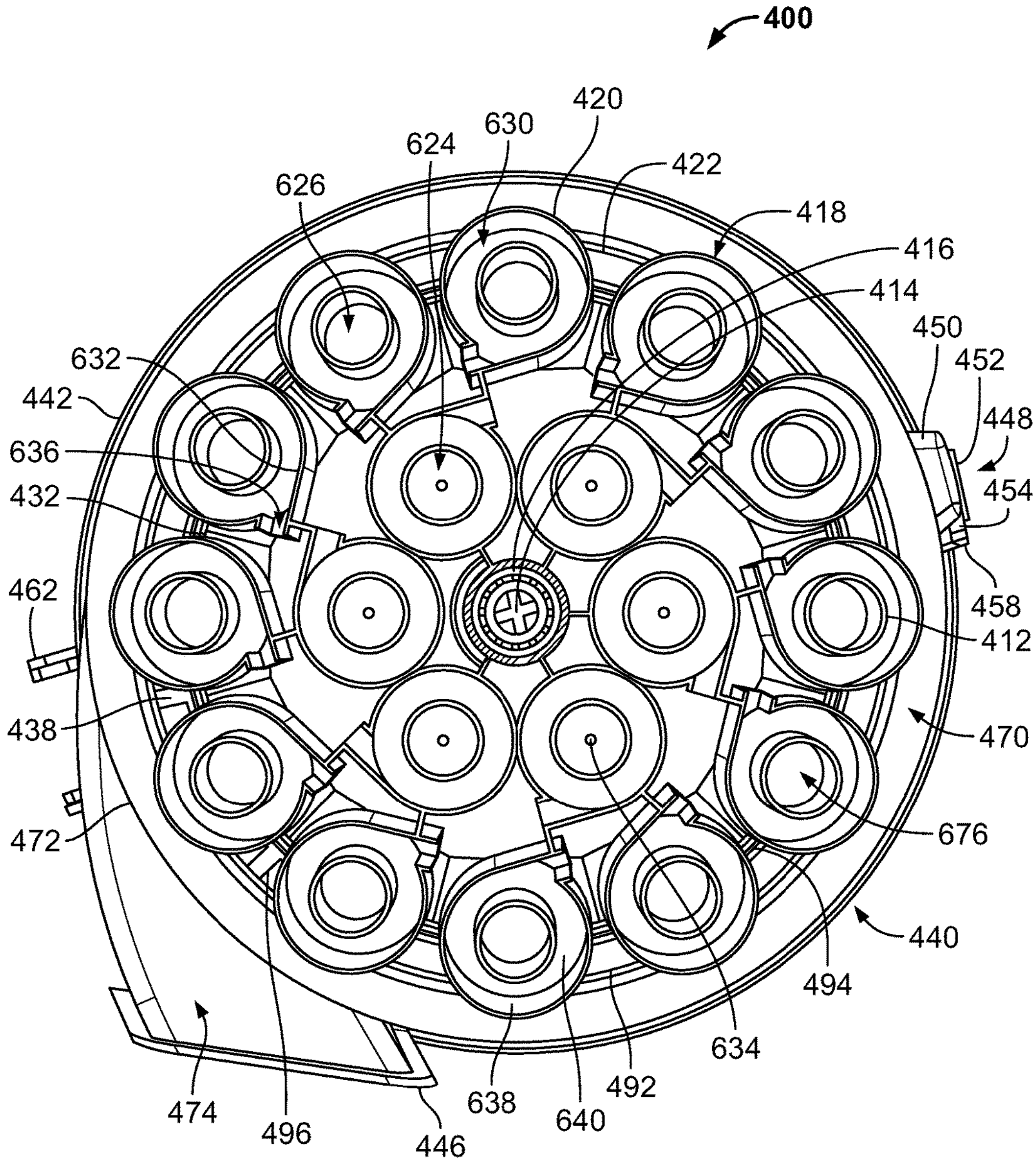
FIG. 26 is a sectional view of the hydrocyclonic particle separator assembly taken along line 26-26 of FIG. 25.
Figure 27:
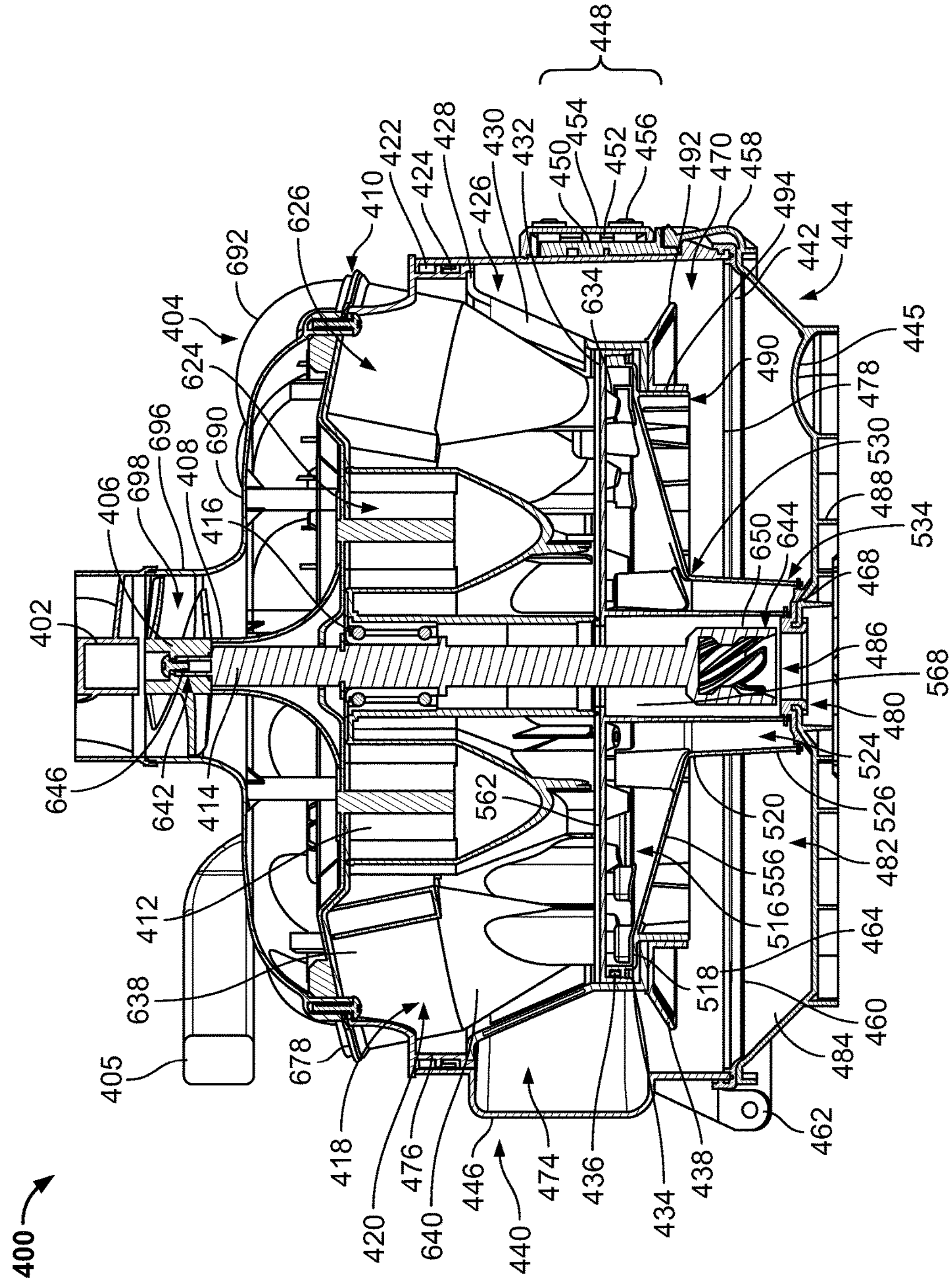
FIG. 27 is a sectional view of the hydrocyclonic particle separator assembly taken along line A-A of FIG. 21 with a canister bottom in a closed configuration.
Figure 28:
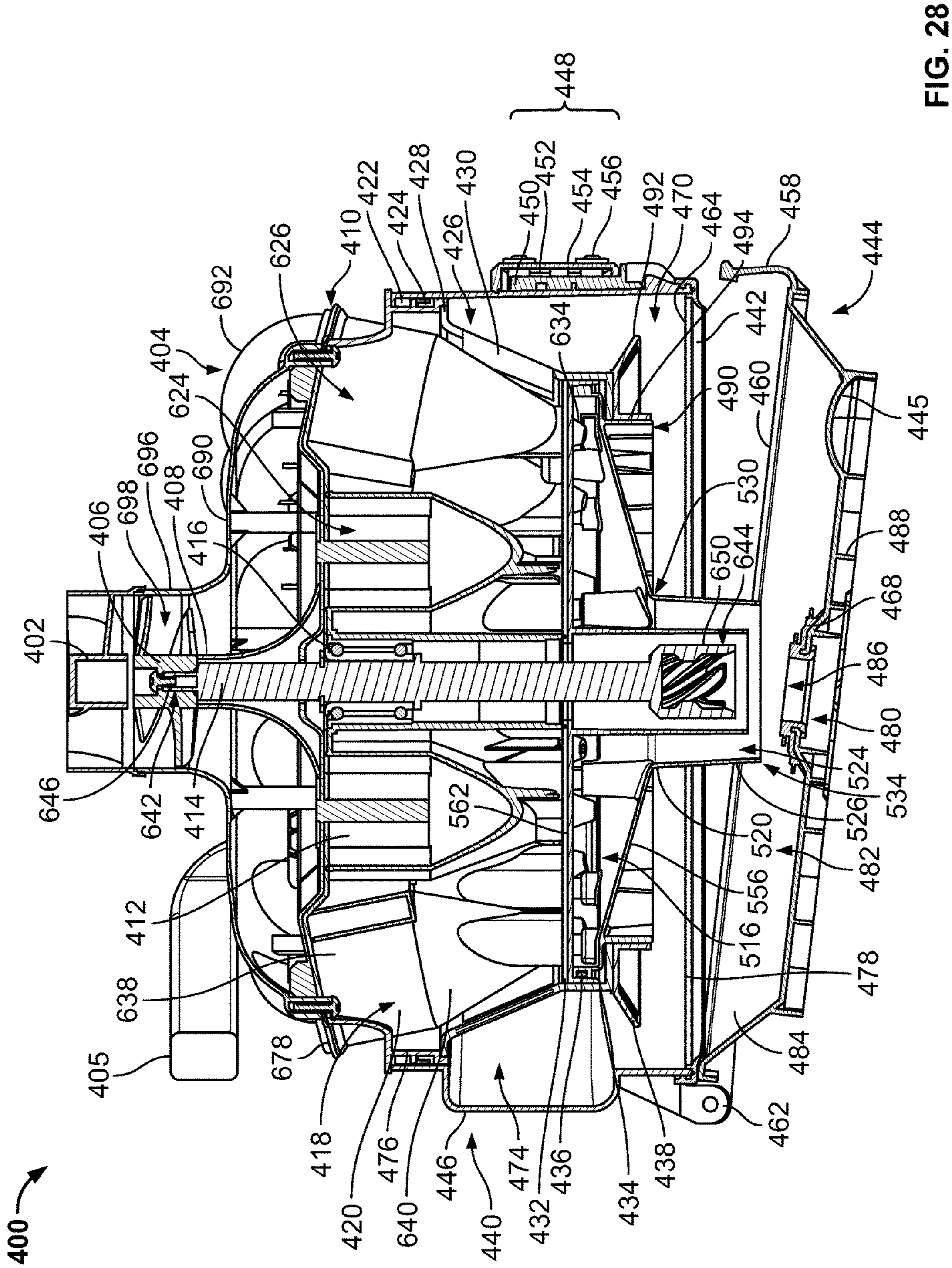
FIG. 28 is a sectional view of the hydrocyclonic particle separator assembly taken along line A-A of FIG. 21 with the canister bottom in an open configuration.

In the assembled configuration of the hydrocyclonic particle separator assembly 400, the debris separator ring 438 can be disposed spaced upward relative to the bottom edge 464 of the canister body and, therefore, spaced upward relative to the large debris container 444 (see, e.g., FIG. 25). The diameter of the outer circumferential edge 492 of the debris separator ring 438 is dimensioned smaller than the diameter of the canister body 440 and the top edge 460 of the large debris container 444. Therefore, during cyclonic separation of the fluid, large debris can pass between the outer circumferential edge 438 and the inner surface of the canister body 440, and further can be collected in the large debris container 444. The apertures 496 in the debris separator ring 438 allow fluid to travel therethrough, thereby not completely isolating the large debris container 444 from the fluid flow, while preventing the large debris from being removed from the large debris container 444 by the fluid flow. In particular, the debris separator ring 438 acts as a barrier for large debris, prevents the large debris collected in the large debris container 444 from reentering the fluid flow, and maintains the large debris collected in the large debris container 444.

Figure 33:
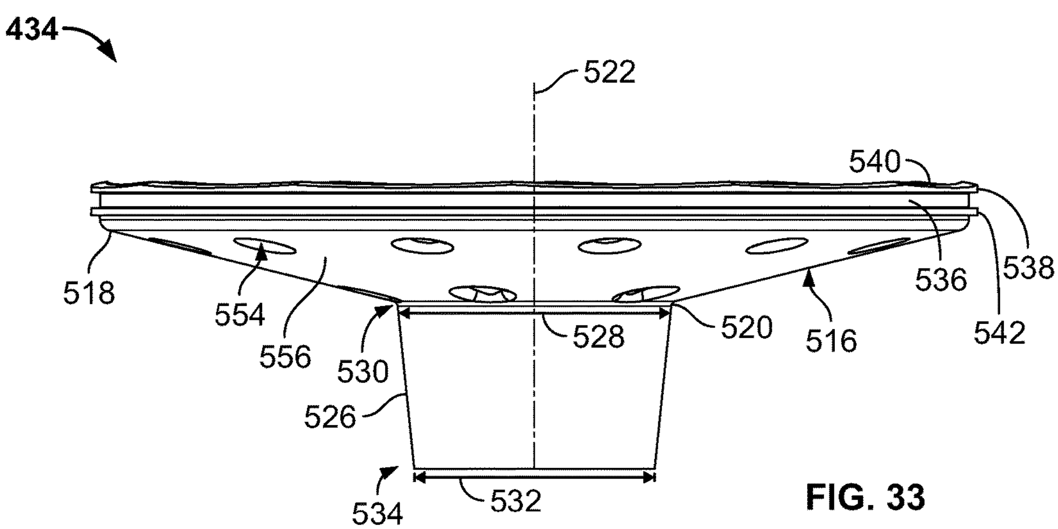
FIG. 33 is a side view of a fine debris container of the hydrocyclonic particle separator assembly of FIG. 20.
Figure 34:
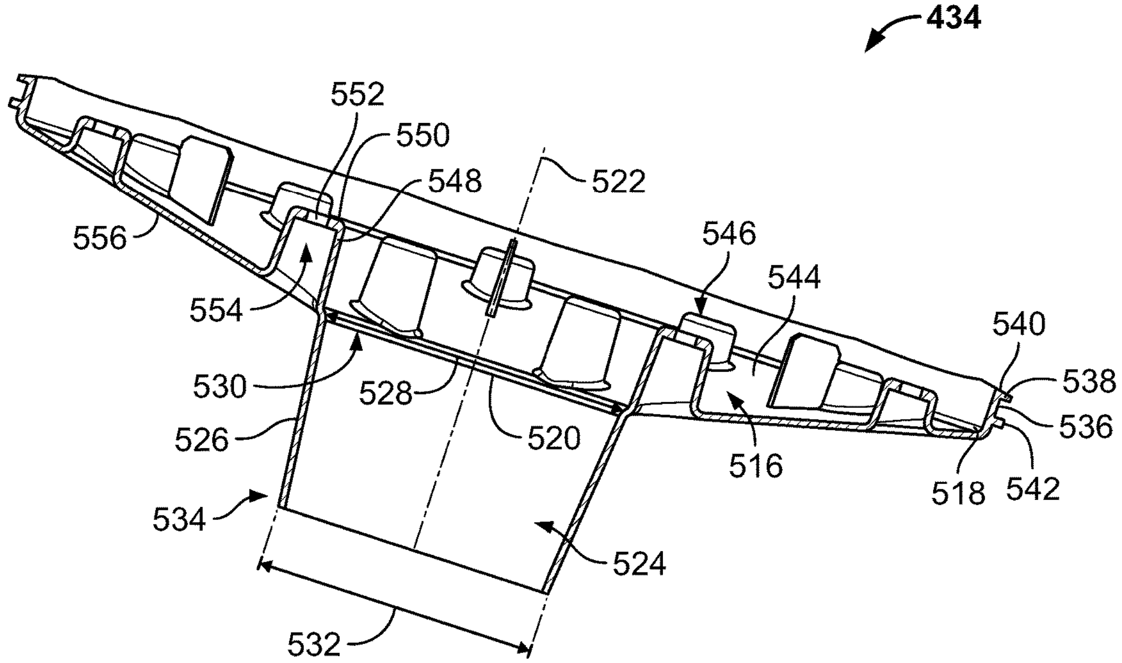
FIG. 34 is a sectional view of the fine debris container of FIG. 33.

With additional reference to FIGS. 33 and 34, side and sectional views of the fine debris container 434 are provided. The fine debris container 434 includes a dish 516 with an outer perimeter 518 and an inner perimeter 520, the surface of the dish 516 sloping downwardly towards a central vertical axis 522. The fine debris container 434 includes a central opening 524 formed at the inner perimeter 520. The central opening 524 extends through a central radial extension 526. The central opening 524 defines a first diameter 528 at or near a proximal end 530 of the central radial extension 526 and defines a second diameter 532 at a distal end 534 of the central radial extension 526. The radial wall of the central radial extension 526 can taper in the direction of the central vertical axis 522 such that the first diameter 528 is dimensioned greater than the second diameter 532. The tapered radial wall of the central radial extension 526 assists in transfer of fine debris from the dish 516 to an area near the distal end 534 of the central radial extension 526.

The fine debris container 434 includes a vertical circumferential flange 536 extending from the outer perimeter 518 of the dish 516. The vertical circumferential flange 536 includes a first horizontal lip 538 extending perpendicularly from a top surface 540 of the vertical circumferential flange 536. The vertical circumferential flange 536 includes a second horizontal lip 542 extending parallel to the first horizontal lip 538 and disposed between the first horizontal lip 538 and the outer perimeter 518. During assembly, the O-ring 436 can be positioned between the first and second horizontal lips 538, 542 to maintain a water-tight seal between the fine debris container 434 and the fine debris container top 432.

The inner surface 544 of the dish 516 includes a plurality of upwardly extending bulbs 546. The bulbs 546 can be radially formed on the inner surface 544. In some embodiments, the fine debris container 434 includes a first row of bulbs 546 radially disposed relative to the central vertical axis 522 near the outer perimeter 518 of the dish 516, and further includes a second row of bulbs 546 radially disposed relative to the central vertical axis 522 near the inner perimeter 520 of the dish 516. Each of the bulbs 546 near the outer perimeter 518 can define a first height relative to the inner surface 544, and each of the bulbs 546 near the inner perimeter 520 can define a second height relative to the inner surface 544, the first height being dimensioned smaller than the second height. Each of the bulbs 546 includes a radial wall 548, a top surface 550 and an opening 552 formed in the top surface 550. Each of the bulbs 546 further includes a cavity 554 formed within the radial wall 548 and connected with the opening 552, the cavity 554 extending to the outer surface 556 of dish 516.

Figure 35:
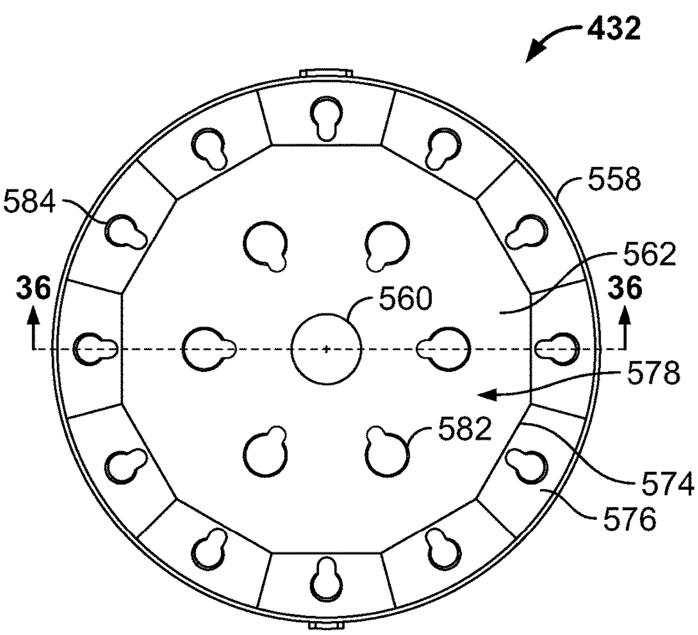
FIG. 35 is a top view of a fine debris container top of the hydrocyclonic particle separator assembly of FIG. 20.
Figure 36:
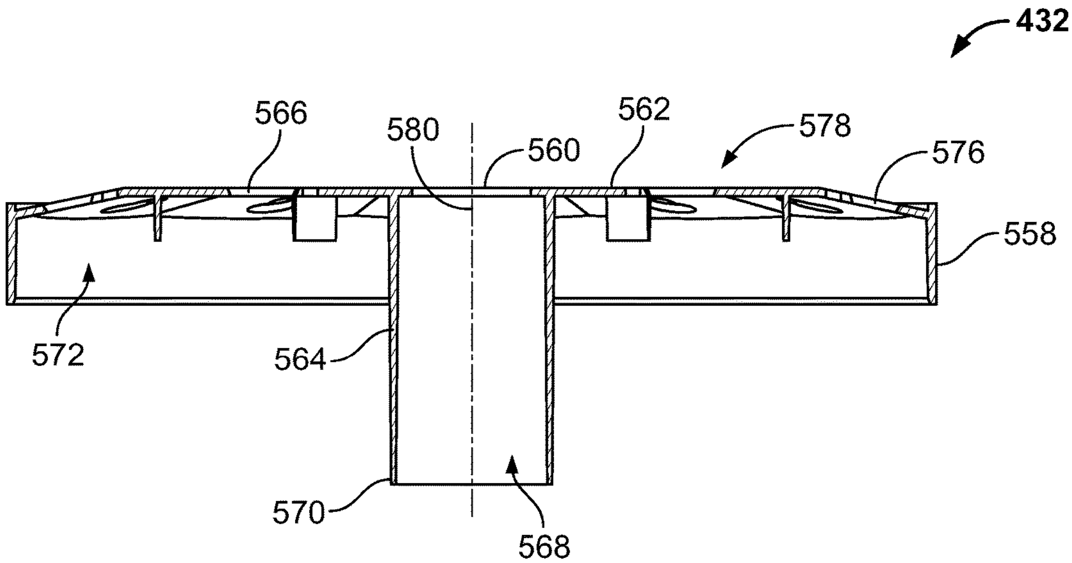
FIG. 36 is a sectional view of the fine debris container top taken along line 36-36 of FIG. 35.

With additional reference to FIGS. 35 and 36, top and sectional views of the fine debris container top 432 are provided. The fine debris container top 432 defines a substantially circular outer perimeter wall 558 and a central opening 560 formed in the top surface 562. The fine debris container top 432 includes a central radial extension 564 protruding from an inner surface 566 of the fine debris container top 432. The central radial extension 564 includes an interior cavity 568 that connects with the central opening 560. The radial wall of the central radial extension 564 can taper gradually such that the thickness of the radial wall is greater near the inner surface 566 than the thickness of the radial wall at a distal end 570 of the central radial extension 564.

The outer perimeter wall 558 can extend downwardly from the top surface 562 to form an enclosed cavity 572 between the outer perimeter wall 558 and the central radial extension 564. The top surface 562 includes a circumferential polygonal edge 574 from which a plurality of plates 576 extend. The plates 576 can be angled downwardly relative to a central portion 578 of the top surface 562 (and a central vertical axis 580) and form the perimeter of the fine debris container top 432. The central portion 578 of the top surface 562 includes a plurality of radial openings 582 formed therein and circumferentially disposed relative to the central vertical axis 580. Each of the plates 576 includes an opening 584 formed therein. The openings 582, 584 can be configured and dimensioned to receive the distal ends of the respective cyclone containers 420.

With reference to FIG. 25, during assembly, the central radial extension 564 of the fine debris container top 432 can be positioned concentrically within the central radial extension 526 of the fine debris container 434. The distal end 570 of the central radial extension 564 and the distal end 534 of the central radial extension 526 can be positioned against the gasket 468 of the large debris container 444 to create a water-tight seal therebetween. As will be discussed in greater detail below, fine debris filtered from the fluid flow during a second cyclonic filtering stage can be deposited in the cavity or chamber formed between the central radial extensions 526, 564 and the gasket 468.

As shown in FIG. 25, the gasket 468 can include first and second radial extensions 598, 600. The first radial extension 598 can seal against the distal end 570 of the central radial extension 564 of the fine debris container top 432. The second radial extension 600 can be positioned against the central hub 480 of the large debris container 444 and seals against the distal end 534 of the central radial extension 526 of the fine debris container 434. The gasket 468 further includes a lower hook section 602 that fits within and hooks around the edge of the top opening 486 of the central hub 480, thereby fixating the gasket 468 to the central hub 480. The gasket 468 thereby forms a water-tight seal between the large debris container 444, the fine debris container 434 and the fine debris container top 432.

It should be understood that when the large debris container 444 is unlatched from the canister body 440 and is in the open position, large debris from the large debris container 444 and fine debris from the cavity or chamber formed between the central radial extensions 526, 564 can be simultaneously emptied. In particular, opening the large debris container 444 releases the seal formed between the gasket 468 and the distal ends 534, 570 of the central radial extensions 526, 564, allowing the fine debris to be simultaneously emptied from the canister body 440.

Figure 37:
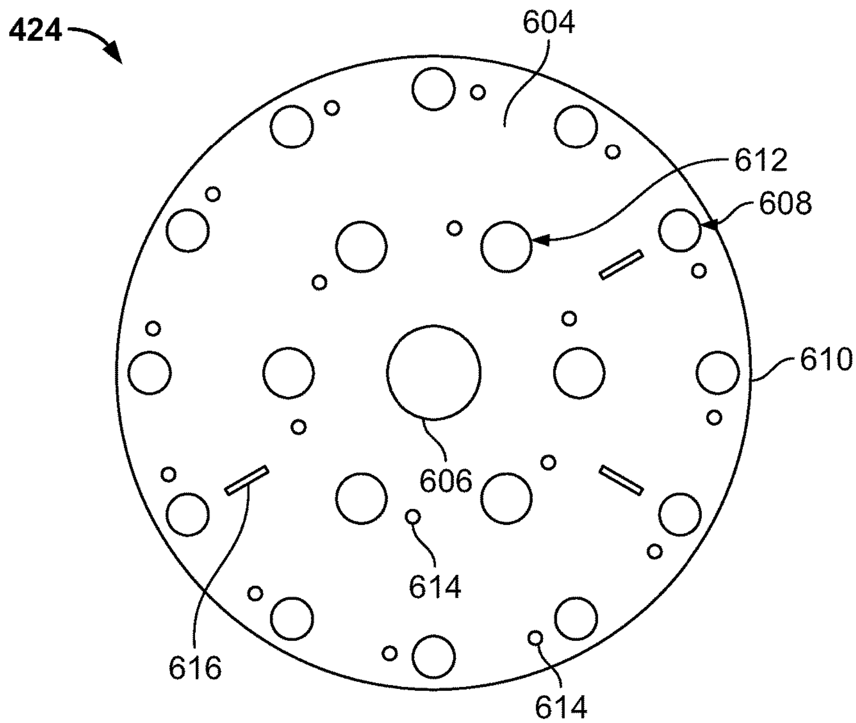
FIG. 37 is a top view of a second gasket of the hydrocyclonic particle separator assembly of FIG. 20.

With additional reference to FIG. 37, a top view of the second gasket 424 is provided. The second gasket 424 can be disposed over the fine debris container top 432. The gasket body 604 of the second gasket 424 can define a substantially planar and disc-like configuration. The gasket body 604 includes a central opening 606, a first set of radial openings 608 spaced from a perimeter edge 610, and a second set of radial openings 612 between the central opening 606 and the first set of radial openings 608. The position of the first and second set of radial openings 608, 612 can correspond to the position of the radial openings 582, 584 of the fine debris container top 432. Each of the openings 608, 612 of the first and second set of radial openings 608, 612 includes a smaller sized opening 614 formed adjacent thereto. In some embodiments, the gasket body 604 can include one or more radial slots 616 aligned with corresponding openings 608 of the first set of radial openings 608.

As noted above, the filtering assembly 426 includes the filtering medium support 428 and the filtering medium 430. The filtering medium support 428 includes a support body 586 defining a frustoconical configuration. The support body 586 includes a top circumferential frame 588 and a bottom circumferential frame 590. A diameter of the top circumferential frame 588 can be dimensioned greater than a diameter of the bottom circumferential frame 590. The support body 586 further includes a plurality of windows 592 formed between the top and bottom circumferential frames 588, 590. In some embodiments, the windows 592 can be dimensioned substantially similarly relative to each other. In some embodiments, one section of the support body 586 can include a plurality of vertical slit windows 594 that are dimensioned smaller than the windows 592. During assembly, the vertical slit windows 594 can be positioned to face the tangential outlet 472 of the canister body 440. The vertical slit windows 594 provide structural support to the filtering assembly 426 against fluid flow entering the canister body 440 through the tangential outlet 472. In some embodiments, the support body 586 can include a circumferential wall 596 extending downwardly from the bottom circumferential frame 590. The diameter of the circumferential wall 596 can be dimensioned such that during assembly, the circumferential wall 596 mates with the debris separator ring 438.

The filtering medium 430 (e.g., a mesh, filter, polymesh, or the like) can be received by the support body 586 such that the filtering medium 430 covers each of the windows 492 and the vertical slit windows 594. In particular, the filtering medium 430 extends the perimeter wall of the filtering assembly 426. As will be discussed in greater detail below, in a first cyclonic separation stage, the filtering assembly 426 can filter out a first debris size, e.g., large debris, from the fluid flow with the large debris dropping into the large debris container 444. In particular, the large debris contacts the filtering medium 430, or the interior wall of the canister body 440, and is knocked down out of the fluid flow and does not enter the interior of the filtering assembly 426. The fluid flow with at least some fine debris can continue through the filtering assembly 426 and into the cyclone block 418.

Figure 38:
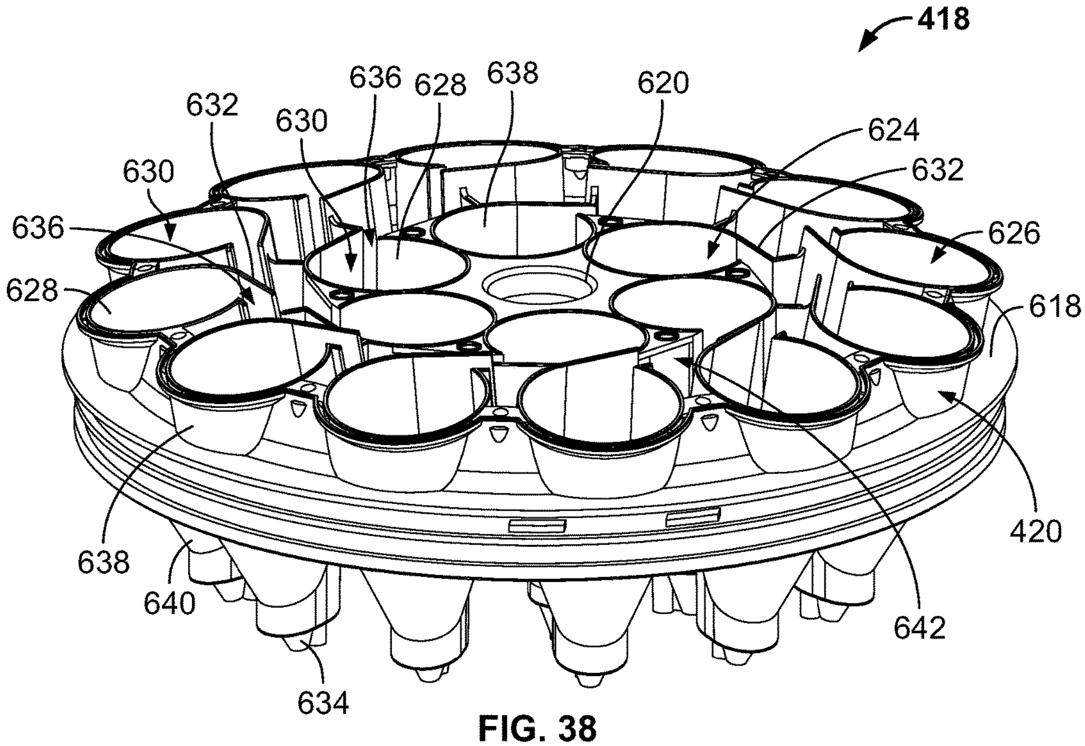
FIG. 38 is a perspective view of a cyclone block of the hydrocyclonic particle separator assembly of FIG. 20.
Figure 39:
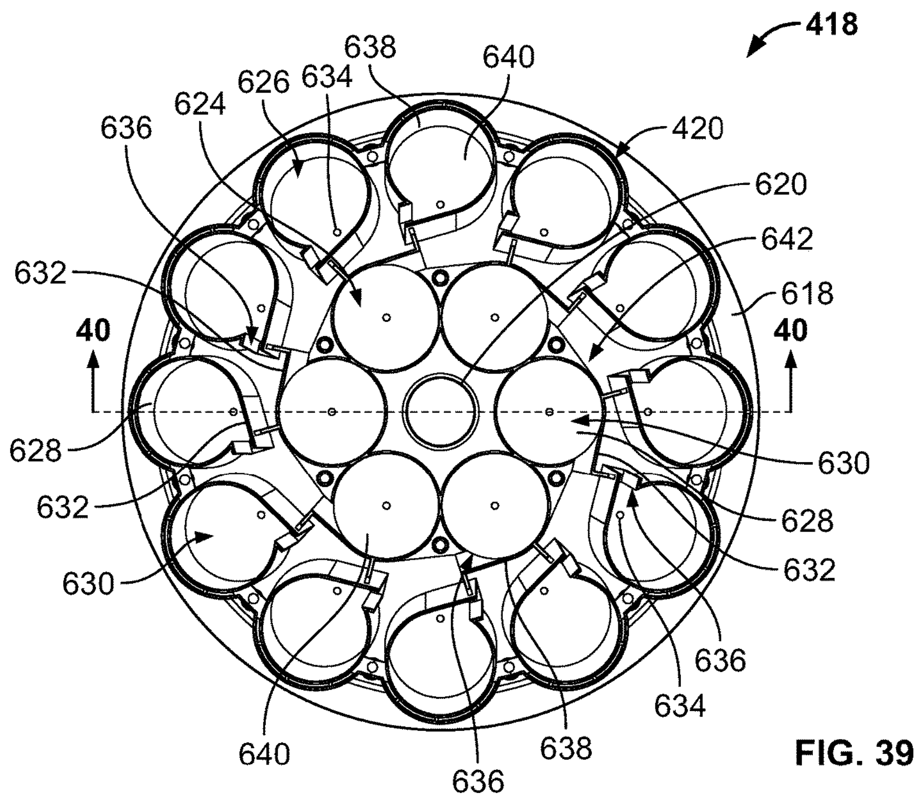
FIG. 39 is a top view of a cyclone block of the hydrocyclonic particle separator assembly of FIG. 20.
Figure 40:
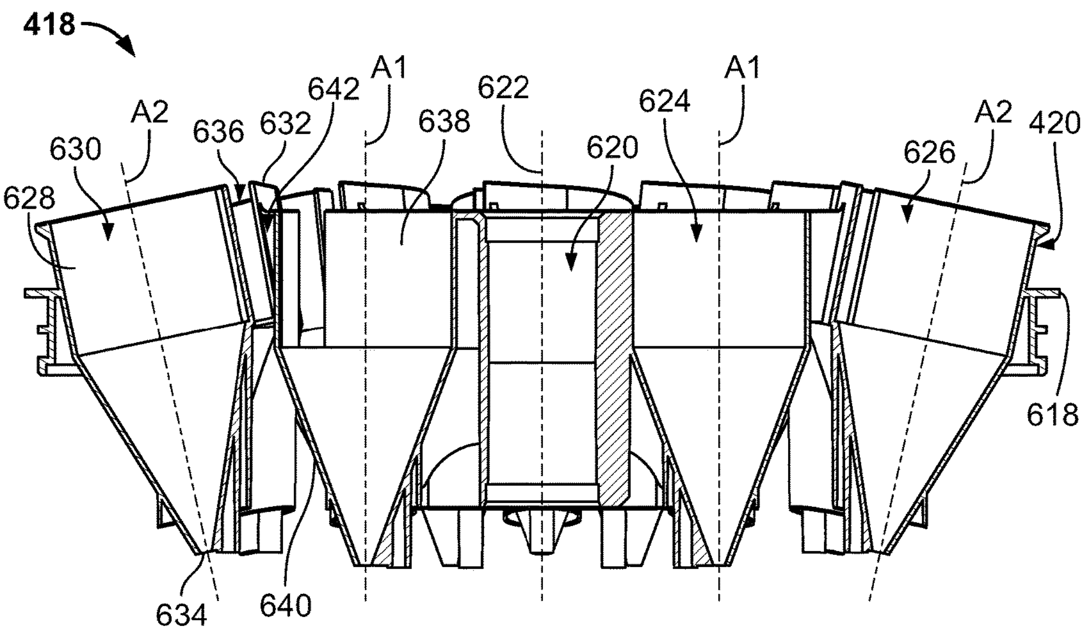
FIG. 40 is a sectional view of the cyclone block taken along line 40-40 of FIG. 39.

With additional reference to FIGS. 38-40, the cyclone block 418 includes a cyclone block body 618 in the form of a cylindrical disc with a central opening 620 formed in the cyclone block body 618. The first gasket 422 can be disposed within grooves on an outer surface of the cyclone block body 618. In some embodiments, the first gasket 422 can define a U-shaped cross-section. The cyclone block body 618 includes a plurality of individual cyclone containers 420 radially disposed relative to a central vertical axis 622. In particular, the cyclone block 418 includes a first set of cyclone containers 624 radially disposed around the central opening 620 and a second set of cyclone containers 626 radially disposed around the first set of cyclone containers 624.

Each of the cyclone containers 420 of the first set of cyclone containers 624 can extend substantially parallel to the central vertical axis 622. Each of the cyclone containers 420 of the second set of cyclone containers 626 can extend in an angled manner relative to the central vertical axis 622 (e.g., angled with a bottom of the cyclone container 626 in the direction of the central vertical axis 622). In particular, a central axis A1 of each of the cyclone containers 420 of the first set of cyclone containers 624 can be substantially parallel to the central vertical axis 622, while a central axis A2 of each of the cyclone containers 420 of the second set of cyclone containers 626 can be angled relative to the central vertical axis 622. In particular, a cylindrical top portion 638 of each of the second set of cyclone containers 626 can be disposed further from the central vertical axis 622 than a debris underflow nozzle 634.

It should be understood that the description of a single cyclone container 420 holds true for all of the cyclone containers 420 that make up the ring of cyclone containers 420 (i.e., the cyclone block 418), unless noted otherwise. Each cyclone container 420 includes a circular tapered container body 628 that defines a cyclone chamber 630 and includes an overflow opening 632, a debris underflow nozzle 634, and a tangential inlet 636 generally positioned on a radially inward portion of each cyclone container 420. Each cyclone container 420 generally includes a cylindrical top portion 638 and a frustoconical bottom portion 640 that tapers downward to the debris underflow nozzle 634. The frustoconical bottom portion 640 aids in maintaining a centrifugal acceleration of the fluid flow as the fluid travels downward along the interior of the frustoconical bottom portion 640 in the direction of the debris underflow nozzle 634. In some embodiments, the tangential inlet 636 of every other cyclone container 420 of the second set of cyclone containers 626 can be in fluid communication with the tangential inlet 636 of a respective cyclone container 420 of the first set of cyclone containers 624 via a passage 642. As will be discussed in greater detail below, fluid passing through the filtering assembly 426 enters the inner chamber 470 of the canister body 440 around the frustoconical bottom portions 640 of the cyclone containers 420 and travels upward into the respective tangential inlets 636 of the cyclone containers 420. Therefore, fluid enters each of the cyclone chambers 630 of the first and second set of cyclone containers 624, 626 substantially simultaneously and forms individual cyclones within the cyclone containers 420. A concentric, dual-cyclone configuration within the cyclone block 418 is thereby formed.

Each of the frustoconical bottom portions 640 can be configured and dimensioned to be partially received within the radial openings 582, 584 of the fine debris container top 432 such that fine debris filtered by the cyclone containers 420 falls through the debris underflow nozzle 634 and into the fine debris container 434. Thus, the fine debris container top 432 maintains the debris underflow nozzles 634 suspended over or spaced from the dish 516 of the fine debris container 434. Accordingly, debris falls out of the debris-laden water within each individual cyclone container 420, e.g., due to contact with the wall of the cyclone container body 628, and falls through the debris underflow nozzle 634 and into the fine debris container 434. During assembly, as shown in FIG. 25, the frustoconical bottom portions 640 of the cyclone containers 420 are positioned within and surrounded by the filtering assembly 426. Thus, the hydrocyclonic particle separator assembly 400 includes a dual cyclone system with the first cyclone occurring between the canister body 440 and the filtering assembly 426, and the second cyclones occurring in each of the cyclone containers 420.

The shaft 414 includes a proximal end 642 and a distal end 644. The proximal end 642 can include a tip 646 configured to mate with a complementary opening 648 of the impeller 406. Thus, rotation of the shaft 414 simultaneously drives rotation of the impeller 406. The tip 646 allows the impeller 406 to be removably attached to the shaft 414. The distal end 644 includes a female member 650 configured to mate with a male member of the third motor (e.g., a spline coupling, or the like). The third motor can thereby drive rotation of the shaft 414. The shaft 414 can pass through the central openings of the components of the hydrocyclonic particle separator assembly 400 with the distal end 644 being positioned over the central hub 480 of the large debris container 444. The male member of the third motor can pass through the opening 468 of the central hub 480 and engages the female member 650 to rotate the shaft 414 within the hydrocyclonic particle separator assembly 400.

Figure 41:
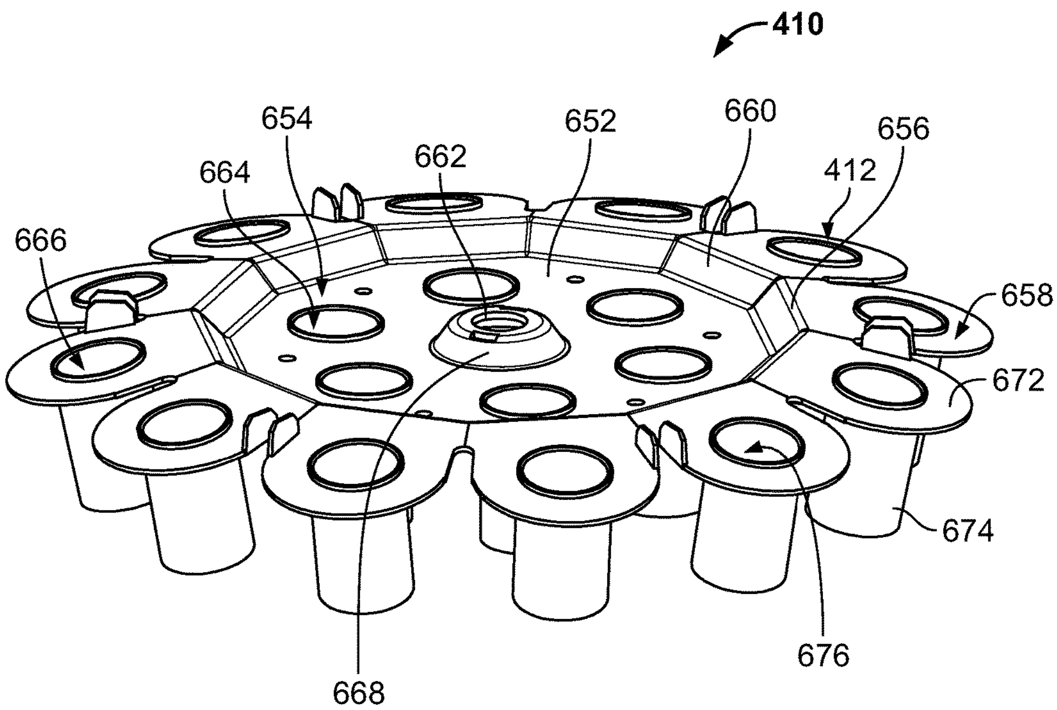
FIG. 41 is a perspective view of a ring of vortex finders of the hydrocyclonic particle separator assembly of FIG. 20.
Figure 42:
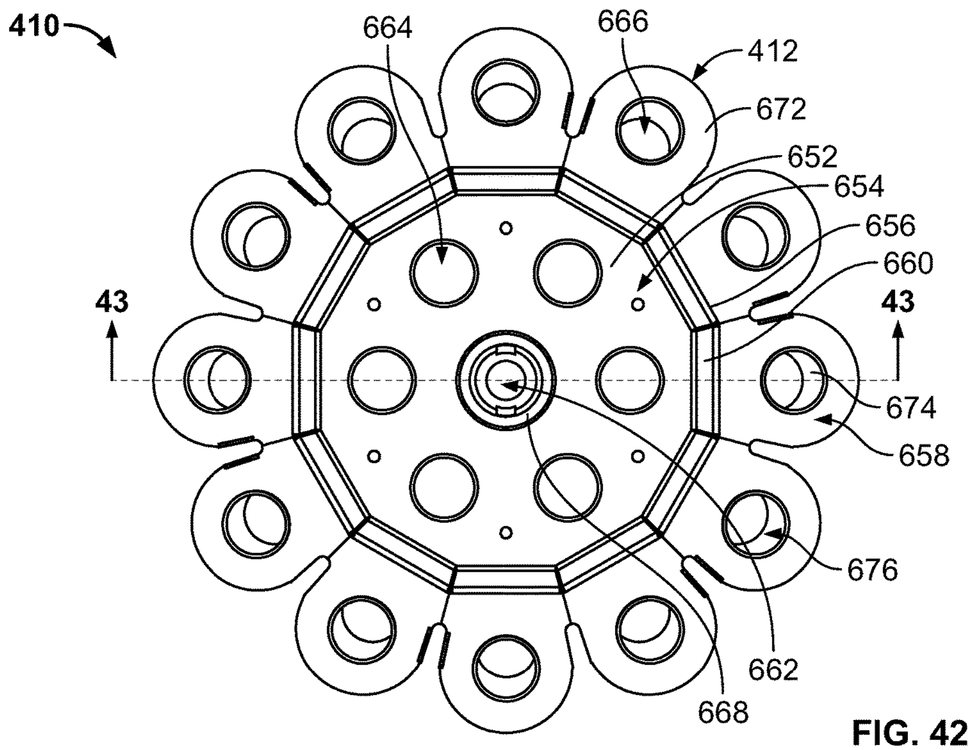
FIG. 42 is a top view of a ring of vortex finders of the hydrocyclonic particle separator assembly of FIG. 20.
Figure 43:
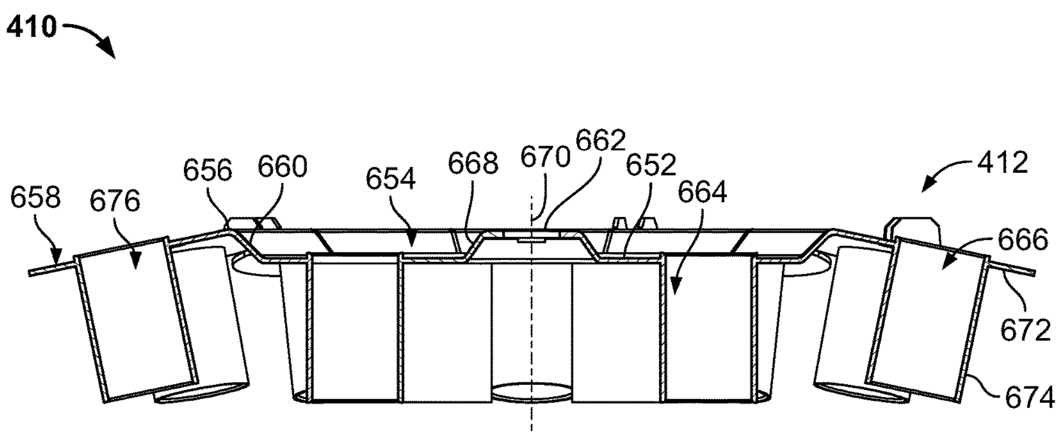
FIG. 43 is a sectional view of the ring of vortex finders taken along line 43-43 of FIG. 42.

With additional reference to FIGS. 41-43, perspective, top and sectional views of the ring 410 of vortex finders 412 are provided. The ring 410 includes a ring body 652 with a central portion 654 with a polygonal perimeter 656, and a plurality of perimeter flaps 658 extending from the polygonal perimeter 656. The central portion 654 can be recessed relative to the perimeter flaps 658, with respective angled wall sections 660 connecting the central portion 654 to the perimeter flaps 658.

The ring body 652 includes a central opening 662, a first set of vortex finders 664 radially disposed around the central opening 662, and a second set of vortex finders 666 radially disposed around the first set of vortex finders 664. The central opening 662 can be formed in a central hub 668 that is raised relative to the recessed central portion 654. Each of the vortex finders 412 of the first set of vortex finders 664 can extend substantially parallel to a central vertical axis 670. Each of the vortex finders 412 of the second set of vortex finders 666 can be angled relative to the central vertical axis 670. In particular, the angle of the second set of vortex finders 666 can be substantially equal to the angle of the cyclone containers 420 of the second set of cyclone containers 626. In some embodiments, the perimeter flaps 658 can be hingedly connected to the angled wall sections 660 such that the angle of each vortex finder 412 can be individually adjusted relative to the central vertical axis 670. During assembly, the vortex finders 412 of the first set of vortex finders 664 can be positioned at least partially into the cyclone containers 420 of the first set of cyclone containers 624, and the vortex finders 412 of the second set of vortex finders 666 can be positioned at least partially into the cyclone containers 420 of the second set of cyclone containers 626.

Each of the vortex finders 412 includes a planar top surface 672 and a cylindrical extension 674 protruding downwardly from the planar top surface 672. Each cylindrical extension 674 includes a uniform channel 676 passing therethrough. When positioned within the respective cyclone containers 420, the vortex finders 412 assist in generating a vortex within the cyclone containers 420 such that debris of a second size (e.g., fine debris) hits the inner walls of the cyclone container 420 and travels downwardly through the frustoconical bottom portion 640, through the debris underflow nozzle 634 and into the fine debris container 434.

Figure 44:
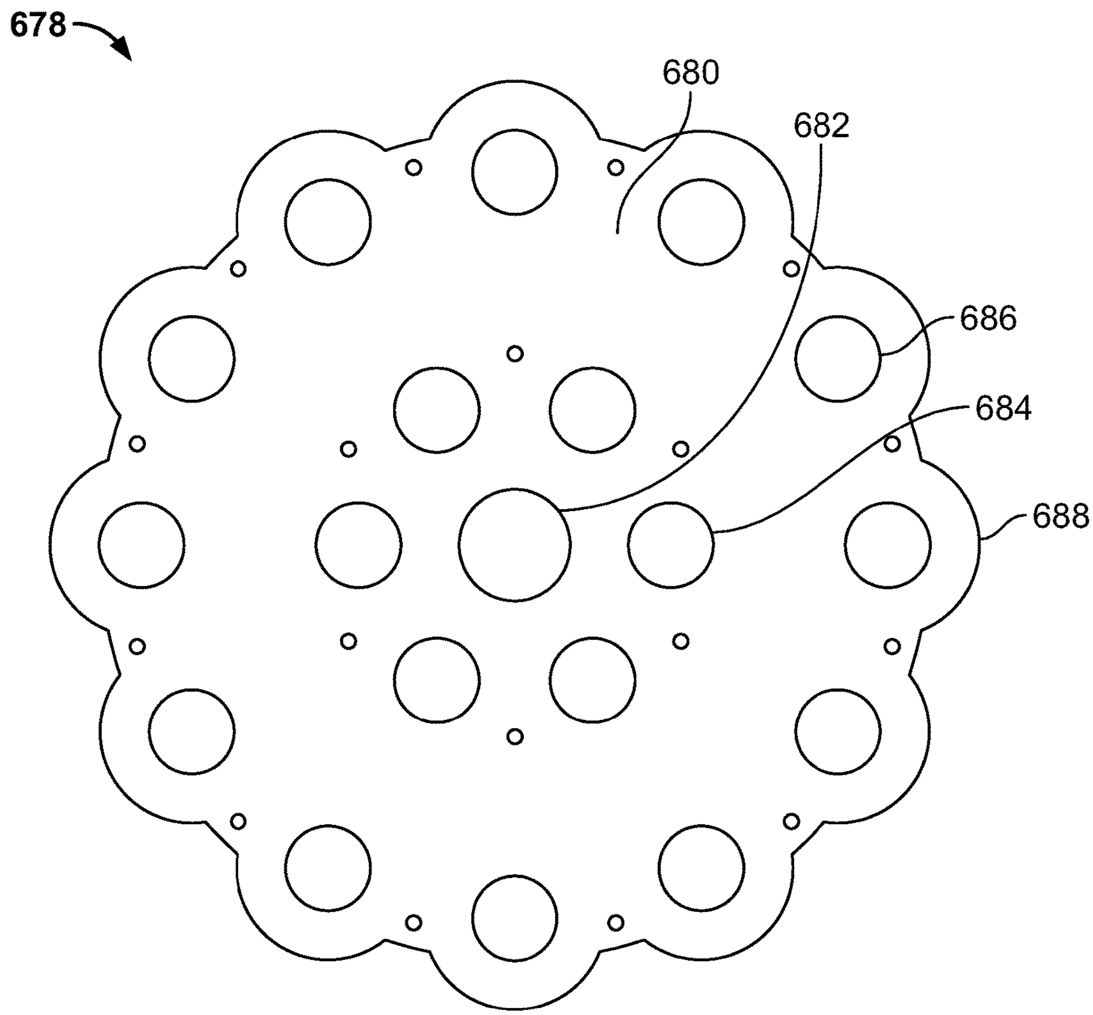
FIG. 44 is a top view of a vortex finder gasket of the hydrocyclonic particle separator assembly of FIG. 20.
Figure 45:
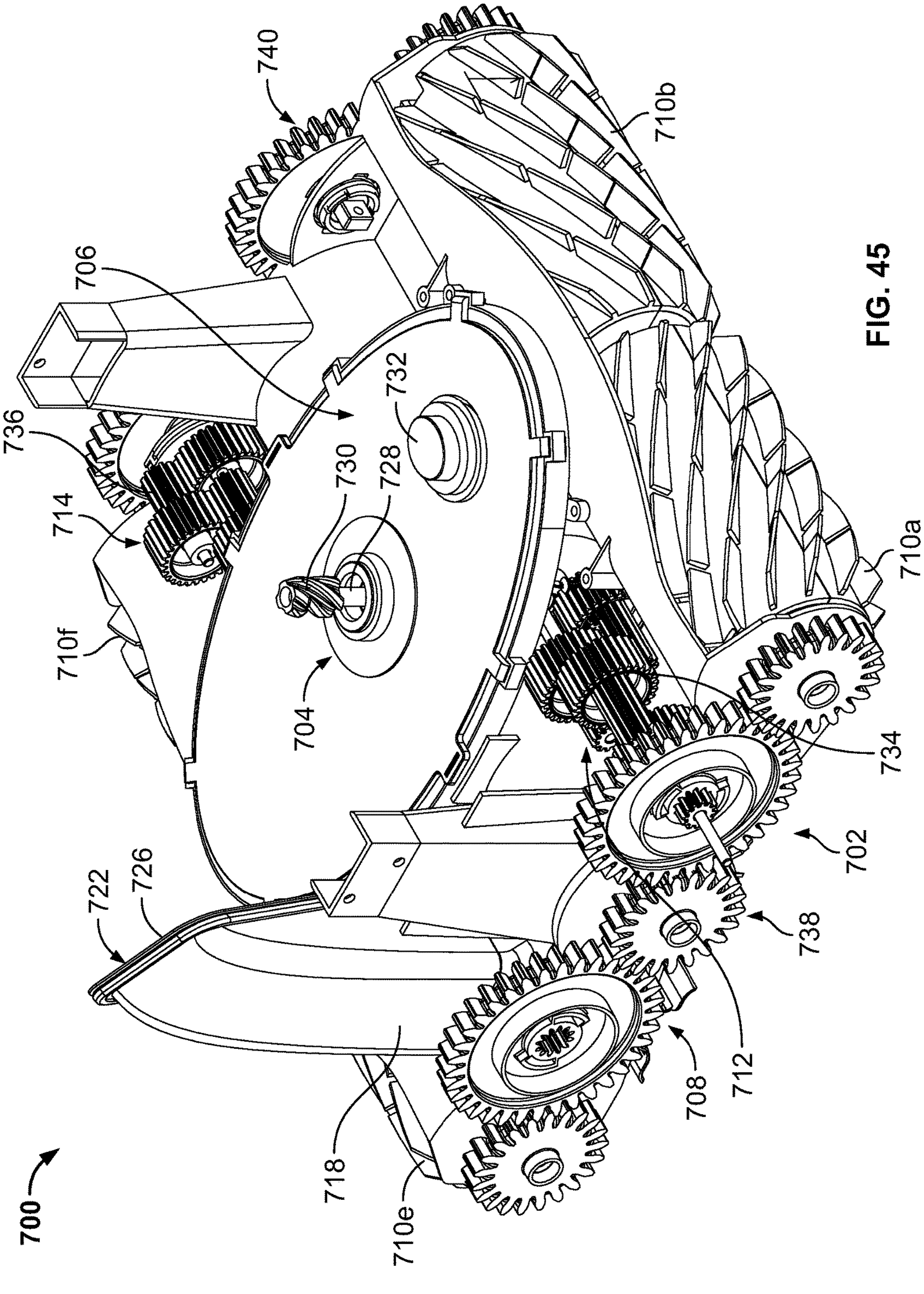
FIG. 45 is a perspective view of a second embodiment of a pool cleaner including a motor assembly and a drive assembly, an outer housing or skin of the pool cleaner having been removed for clarity.
Figure 46:
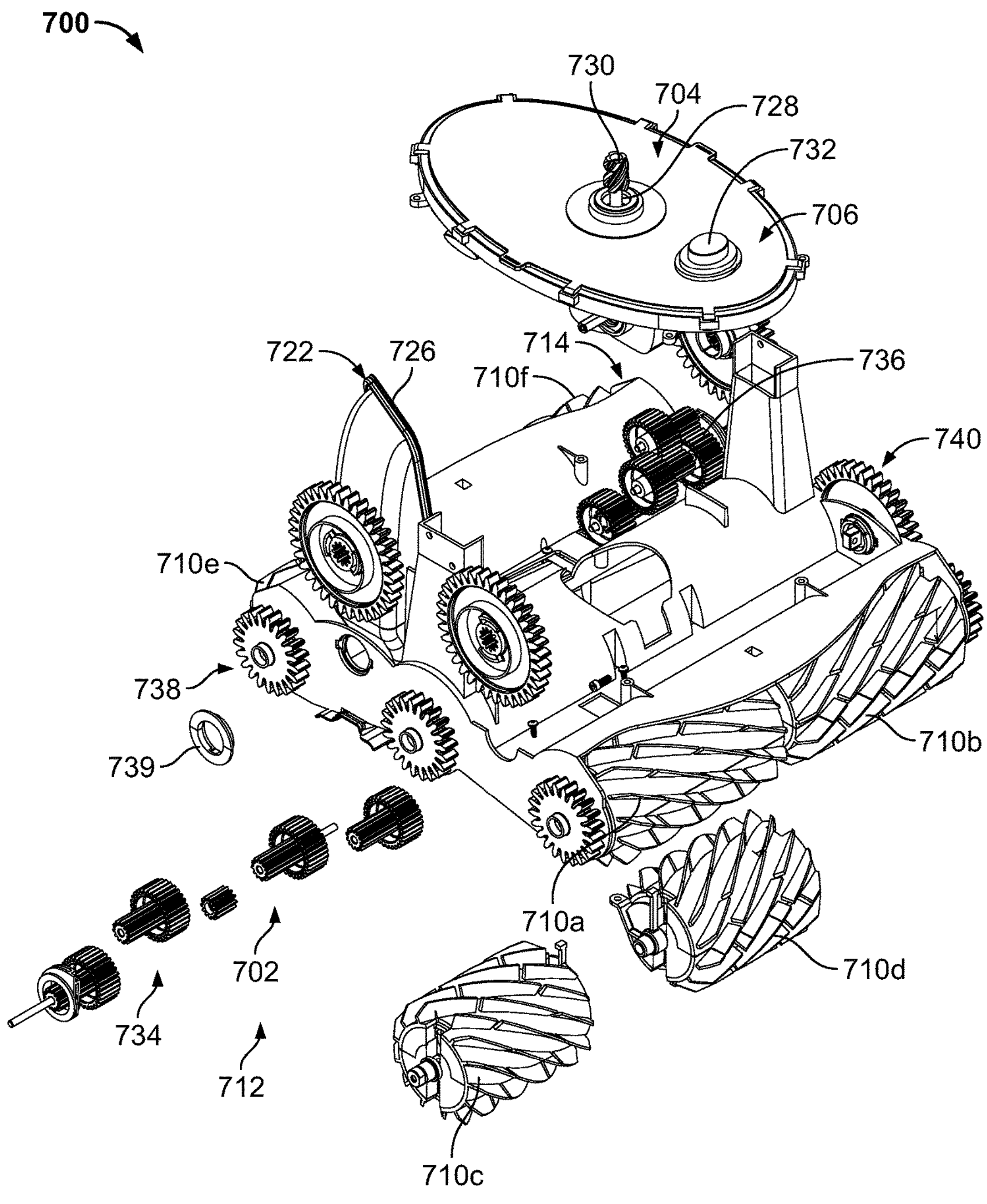
FIG. 46 is a perspective exploded view of the pool cleaner of FIG. 45.
Figure 47:
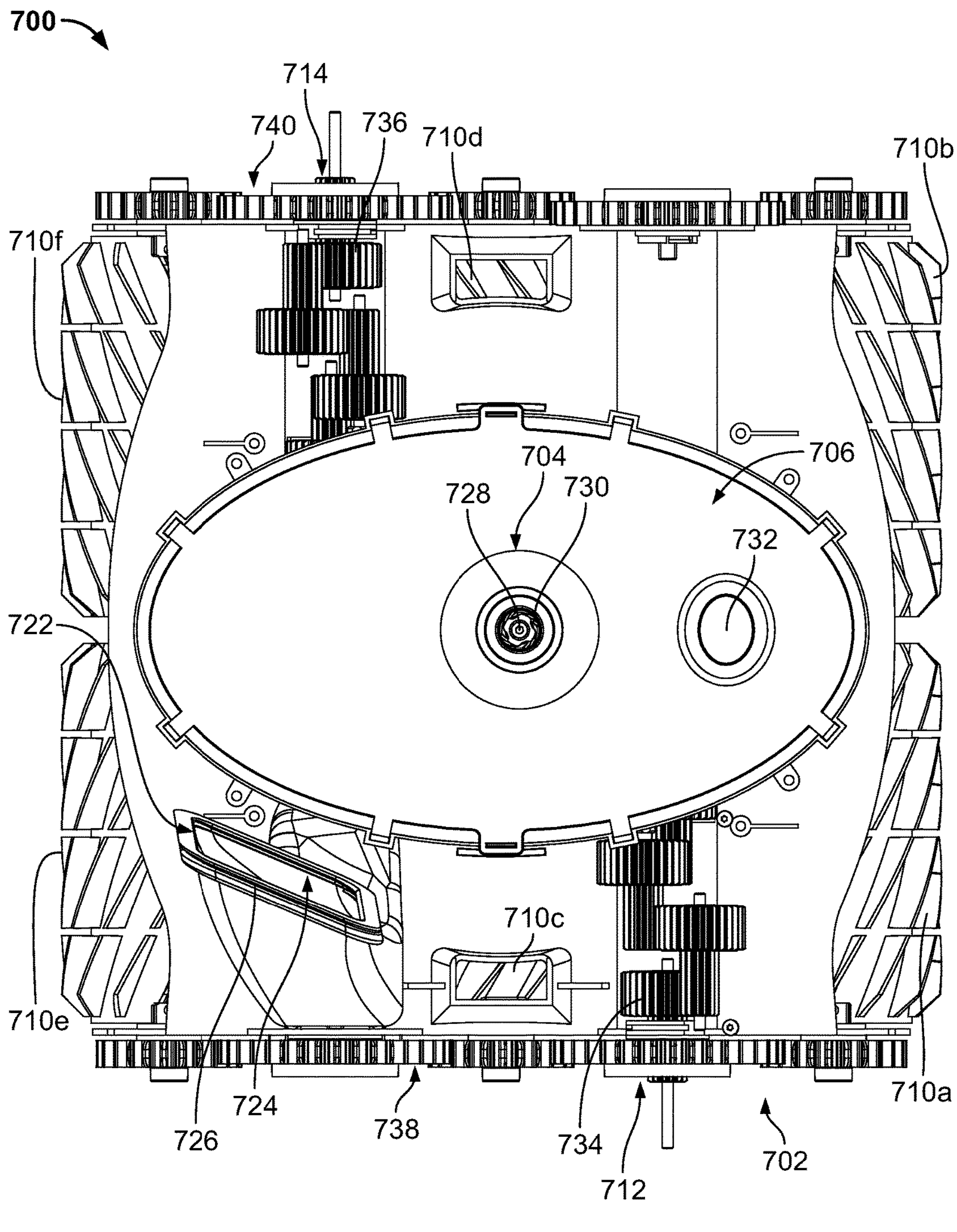
FIG. 47 is a top view of the pool cleaner of FIG. 45.
Figure 48:
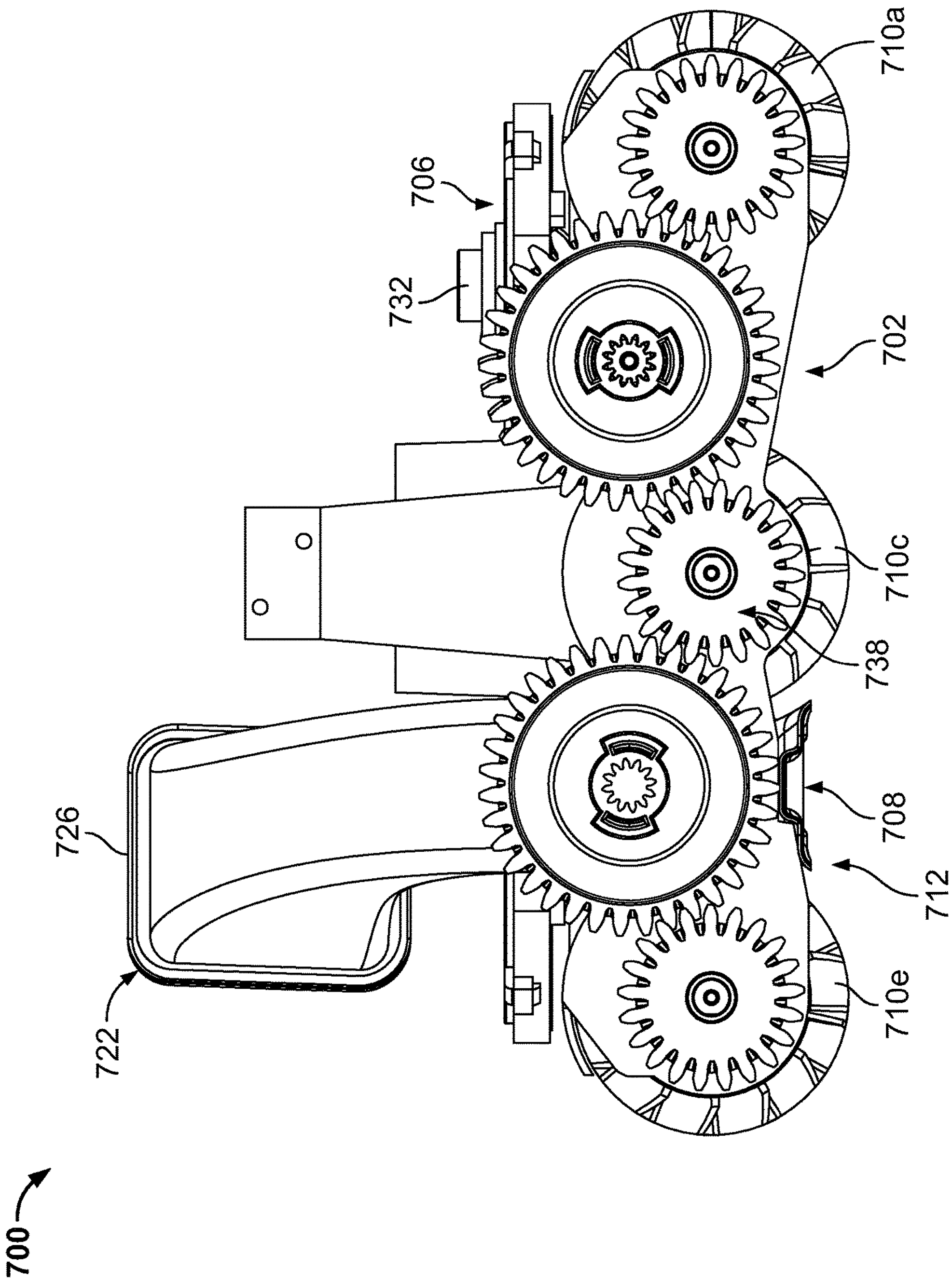
FIG. 48 is a side view of the pool cleaner of FIG. 45.
Figure 49:
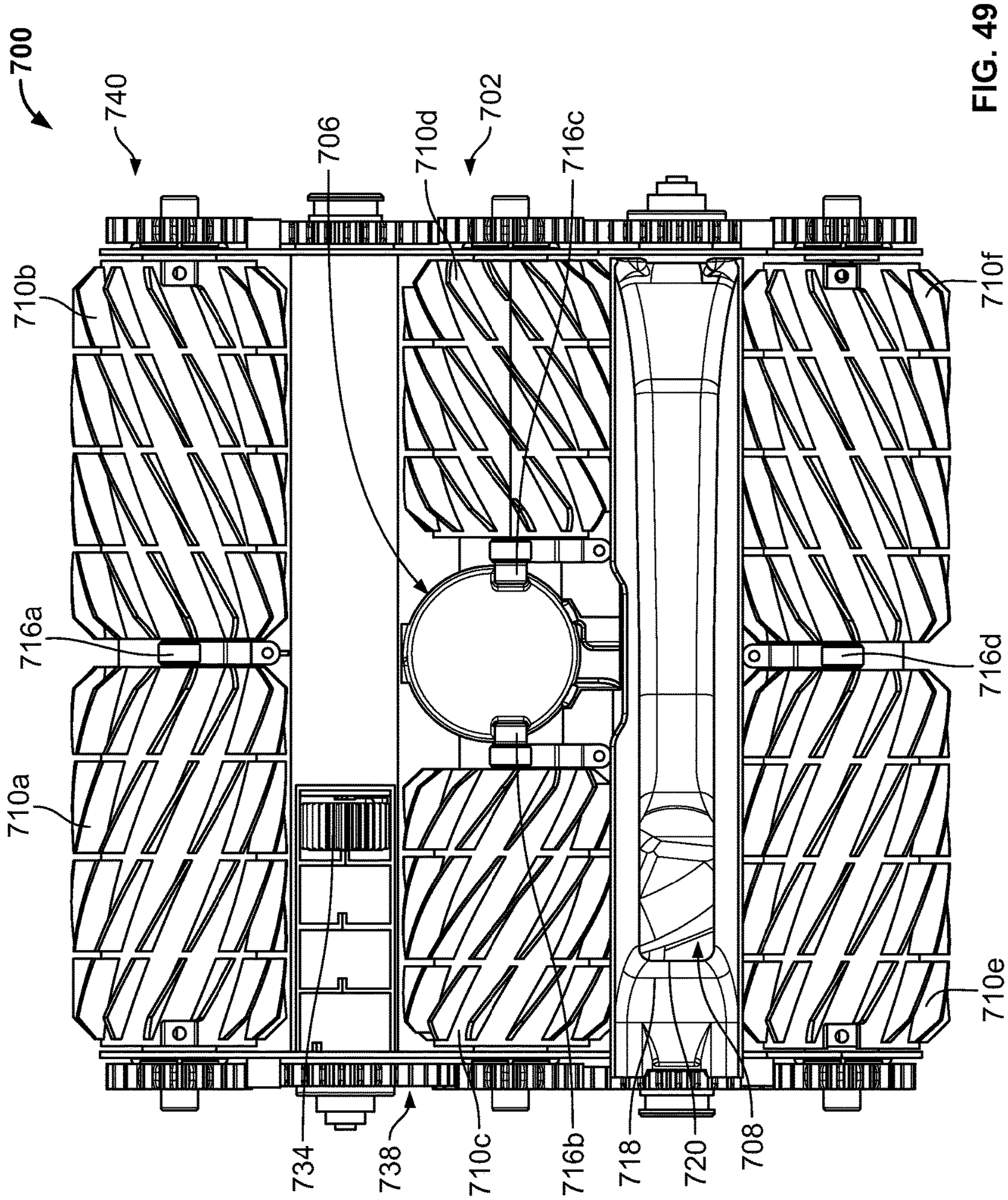
FIG. 49 is a bottom view of the pool cleaner of FIG. 45.

With additional reference to FIG. 44, a top view of the vortex finder gasket 678 is provided. The vortex finder gasket 678 can be substantially disc-shaped and includes a gasket body 680. The gasket body 680 includes a central opening 682, a first set of openings 684 radially disposed around the central opening 682, and a second set of openings 686 radially disposed around the first set of openings 684. The positions of the first and second set of openings 684 can correspond to the vortex finders 412 of the ring 410. During assembly, the respective vortex finders 412 can be inserted through the openings 684, 686 such that the vortex finder gasket 678 is disposed against the bottom surface of the ring body 652. The gasket body 680 includes a plurality of radial protrusions 688 adjacent to the second set of openings 684 that substantially match the configuration of the top surface 672 of the second set of vortex finders 666. The radial protrusions 688 define the perimeter edge of the vortex finder gasket 678.

The top cap 404 includes a top plate 690 with a plurality of rounded lobes 692 extending from the perimeter of the top plate 690. The number of rounded lobes 692 can equal the number of cyclone containers 420 in the second set of cyclone containers 624 and the number of vortex finders 412 in the second set of vortex finders 666. Each of the rounded lobes 692 extends through the top plate 690 and converges at a central cavity 694 within the top cap 404. The cavity 694 forms a tubular wall 696 defining an outlet 698 of the top cap 404. The tubular wall 696 can extend upwardly relative to the surface of the top plate 690. The diffuser 402 can be positioned over the outlet 698 to promote suction of fluid out of the cavity 694. In some embodiments, the top cap 404 can include a handle 405 extending from the top cap 404 to allow for removal of the hydrocyclonic particle separator assembly 400 from the motor housing (see, e.g., FIGS. 27 and 28). In particular, a user can grasp the handle 405 to disengage the hydrocyclonic particle separator assembly 400 from the motor housing.

When assembled, each of the rounded lobes 692 is positioned over the respective vortex finder 412 and cyclone container 420 such that fluid can exit the cyclone container 420 through the respective vortex finder 412, travels into the cavity 694, and out of the outlet 698. Thus, individual fluid cyclonic flows within the cyclone block 418 can merge within the cavity 694 prior to being expelled from the outlet 698. The top cap 404 can be secured to the cyclone block 418 by a plurality of screws or bolts. A plurality of screws of bolts can similarly be used to secure the fine debris container top 432, the fine debris container 434 and the canister body 440. The large debris container 444 can be placed in a closed position by positioning the large debris container 444 against the gasket 442, and the extension 458 of the large debris container 444 can be engaged with the locking assembly 448. In particular, the extension 458 can be flexed outwardly to position the large debris container 444 against the gasket 442, and released to allow a curved hook of the extension 458 to engage a protrusion of the locking assembly 448. The slide cover 454 can be positioned over the snap plate 450 to maintain engagement of the extension 458 with the locking assembly 448.

With reference to FIGS. 45-49, perspective, top, side and bottom views of a second embodiment of an exemplary pool cleaner 700 are provided. The pool cleaner 700 includes an outer housing or skin (not shown) in which one or more components of the pool cleaner 700 can be enclosed. The pool cleaner 700 can be implemented with the hydrocyclonic particle separator assembly 400 discussed above. The pool cleaner 700 generally includes a drive assembly 702 and a motor assembly 704. In an exemplary embodiment, the pool leaner 700 is an electric pool cleaner that includes six rollers and the hydrocyclonic particle separator assembly 400. The motor assembly 704 can be powered by an electric cable (not shown) extending to a power source at the surface of the swimming pool, a battery and/or inductive coupling, for example.

The drive assembly 702 includes a motor housing 706, an intake 708, six brushed rollers 710*a-f*, a first roller drive 712 and a second roller drive 714. The first and second roller drives 712, 714 are positioned on opposite sides of the motor housing 706. Each of the roller drives 712, 714 is respectively in operative communication with a first and second motor (not shown) positioned within the motor housing 706. A first roller set (rollers 710*a*, 710*c*, 710*e*) is in mechanical communication with the first roller drive 712, which is in communication with the first drive motor so that each of the rollers of the first roller set (e.g., rollers 710*a*, 710*c*, 710*e*) turn in the same direction and independently from a second roller set (rollers 710*b*, 710*d*, 710*f*). In some embodiments, each of the rollers of the first roller set (rollers 710*a*, 710*c*, 710*e*) can be independently spun relative to each other. The second roller set (rollers 710*b*, 710*d*, 710*f*) is in mechanical communication with the second roller drive 714, which is in communication with the second drive motor, so each of the rollers of the second roller set (e.g., rollers 710*b*, 710*d*, 710*f*) turn in the same direction and independently from the first roller set (rollers 710*a*, 710*c*, 710*e*). In some embodiments, the rollers of the first roller set can turn at the same rate, and the rollers of the second roller set can turn at the same rate. For purposes of turning the pool cleaner 700, the first set of rollers can be driven to turn in a single direction and the second set of rollers can be driven to turn in an opposing direction, thereby generating a moment for turning the pool cleaner 700. Each of the rollers 710*a-f* can be mounted to roller mounts 716*a-d* of the motor housing 706. Each of the roller drives 712, 714 includes a first drive train 734, 736 disposed underneath the motor housing 706 and a second drive train 738, 740 disposed on the respective sides of the frame of the pool cleaner 700. In some embodiments, one or more split bearings 739 can be used in combination with the first and second drive trains 734, 736, 738, 740.

The intake 708 includes a body 718 extending the width of the pool cleaner 700 between the rollers 710 *c, d* and the rollers 710 *e, f*. The intake 708 includes an inlet opening 720 and an outlet opening 722 defined by the body 718. A channel 724 extends between the inlet opening 720 and the outlet opening 722. A rim 726 extends about the perimeter of the outlet opening 722 and is configured and dimensioned to cooperate with inlet 446 of the canister body 440.

The motor housing 706 includes a motor shaft 728 with a male member 730 that engages the female member 650 of the shaft 414. In particular, the hydrocyclonic particle separator assembly 400 can be mounted over the male member 730 of the motor shaft 728 such that engagement between the motor shaft 728 and the shaft 414 occurs. The motor shaft 728 can thereby drive the hydrocyclonic particle separator assembly 400. A locking interface 732 on the motor housing 706 can detachably interlock relative to a bottom surface of the large debris container 444 to interlock the hydrocyclonic particle separator assembly 400 with the motor housing 706. For example, the bottom surface of the large debris container 444 can include a concave portion 445 configured and dimensioned to receive the locking interface 732 of the motor housing 706.

Figure 50:
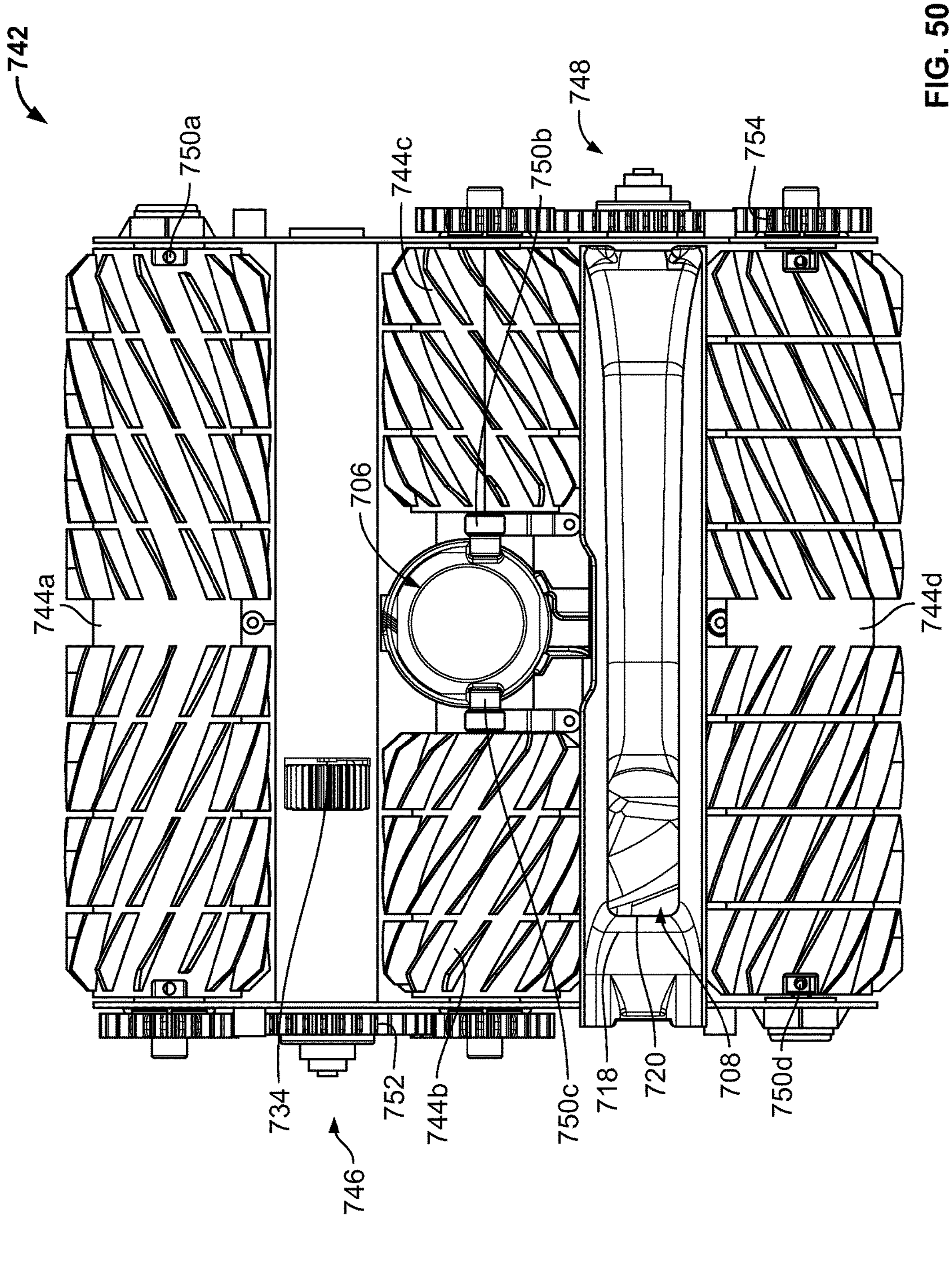
FIG. 50 is a bottom view of a third embodiment of a pool cleaner including a motor assembly and a drive assembly, an outer housing or skin of the pool cleaner having been removed for clarity.

With reference to FIG. 50, a bottom view of a third embodiment of an exemplary pool cleaner 742 is provided. The pool cleaner 742 includes an outer housing or skin (not shown) in which one or more components of the pool cleaner 742 can be enclosed. The pool cleaner 742 can be substantially similar in structure and function to the pool cleaner 742, except for the distinctions noted herein. Therefore, like reference numbers are used for like structures. In particular, rather than including six rollers 710*a-f*, the pool cleaner 742 includes four brushed rollers 744*a-d*. Specifically, the pool cleaner 742 includes a single front roller 744*a* and a single rear roller 744*d*. The pool cleaner 742 includes a first roller drive 746 and a second roller drive 748 positioned on opposite sides of the motor housing 706. Each of the roller drives 746, 748 is in operative communication with respective first and second motors (not shown) positioned within the motor housing 706.

A first roller set (rollers 744*a*, 744*b*) is in mechanical communication with the first roller drive 746, which is in communication with the first drive motor so that each of the rollers of the first roller set (e.g., rollers 744*a*, 744*b*) turn in the same direction and independently from a second roller set (rollers 744*c*, 744*d*). In some embodiments, each of the rollers of the first roller set (744*a*, 744*b*) can be independently spun relative to each other. The second roller set (rollers 744*c*, 744*d*) is in mechanical communication with the second roller drive 748, which is in communication with the second drive motor, so each of the rollers of the second roller set (e.g., 744*c*, 744*d*) turn in the same direction and independently from the first roller set (744*a*, 744*b*). In some embodiments, the rollers of the first roller set can turn at the same rate, and the rollers of the second roller set can turn at the same rate.

During operation, turning capability can be provided by the moment created by the middle split rollers 744*b*, 744*c*. In particular, rotation of the rollers 744*b*, 744*c* in their opposing respective directions creates a moment for rotating the pool cleaner 742. Each of the rollers 744*a-d* can be mounted to roller mounts 750*a-d* of the motor housing 706. Each of the roller drives 746, 748 includes a first drive train 734, 736 disposed underneath the motor housing 706 and a second drive train 752, 754 disposed on the respective sides of the frame of the pool cleaner 742.

When the hydrocyclonic particle separator assembly 400 is fully assembled and attached to the motor housing 706 and intake 708, a plurality of different chambers and flow paths are formed. FIG. 25 is a sectional view of the hydrocyclonic particle separator assembly 400 showing, among other things, reference numbers for the chambers and flow paths within the pool cleaner.

A first chamber C1 is generally formed at the interior of the canister body 440 and as a portion of the inner chamber 470 of the canister body 440. The first chamber C1 is generally delineated as being between the inside of the canister body 440, the outside of the filtering assembly 426, and the outside of the fine debris container 434. The first chamber C1 receives debris-laden water having large and small debris contained therein. Flow of the debris-laden water within the first chamber C1 is discussed in greater detail below. A second chamber C2 is generally formed at the interior of the large debris container 444. The second chamber C2 receives and retains large debris filtered from the water. The third chamber C3 is generally formed between the outer surfaces of the cyclone containers 420 of the cyclone block 418, and is generally delineated as being between the inside of the filtering assembly 426, the outer surfaces of the cyclone containers 420, the ring body 652 of the ring 410 of vortex finders 412, and the fine debris container top 432. The third chamber C3 receives once-filtered debris-laden water from the first chamber C1, e.g., water that has small debris contained therein with the large debris filtered out and retained in the second chamber C2.

Fourth and fifth chambers C4, C5 are generally formed within each of the cyclone containers 420 of the first and second set of cyclone containers 624, 626. In particular, the fourth chamber C4 is formed within the cyclone containers 420 of the second set of cyclone containers 626 and the fifth chamber C4 is formed within the cyclone containers 420 of the first set of cyclone containers 624. As will be discussed in greater detail below, once-filtered debris-laden water can enter the fourth and fifth chambers C4, C5 substantially simultaneously. The fourth and fifth chambers C4, C5 are generally delineated as being within the inner chambers 470 of the cyclone containers 420 between the interior of a cyclone container 440 and a vortex finder 412. The fourth and fifth chambers C4, C5 receive the once-filtered debris-laden water from the third chamber C3.

A sixth chamber C6 is generally formed at the interior of the fine debris container 434, and is generally delineated as being between the central radial extension 526 of the fine debris container 434, the central radial extension 564 of the fine debris container top 432, and the gasket 468. The sixth chamber C6 is a static flow area that receives small debris that is separated out from the once-filtered debris-laden water that passes through the fourth and fifth chambers C4, C5. The once-filtered debris-laden water is filtered a second time in the fourth and fifth chambers C4, C5, where small debris "falls out" from the water and passes through the debris underflow nozzles 634 of each respective individual cyclone container 420 and into the sixth chamber C6.

The seventh chamber C7 extends from the uniform channel 676 of each vortex finder 412 to the central outlet 698 of the top cap 404. The seventh chamber C7 is generally delineated by the interior of the plurality of vortex finders 412, the interior chamber of each rounded lobe 692, the central outlet 698, the parabolically-shaped outer surface of the impeller skirt 408, and the top of the diffuser 402. Accordingly, the seventh chamber C7 is a lobed chamber that originates at the channel 676 of each individual vortex finder 412 and extends to the central outlet 698 of the top cap 404, with the impeller 406, impeller skirt 408 and diffuser 402 being positioned in the seventh chamber C7. The seventh chamber C7 receives the twice-filtered water, e.g., water having minimal debris therein, from the fourth and fifth chambers C4, C5, and expels the filtered water from the central outlet 698.

Turning now to a description of the flow paths through the hydrocyclonic particle separator assembly 400, FIG. 25 is a sectional view of the hydrocyclonic particle separator assembly 400 that illustrates the flow paths therethrough. Although not shown in FIG. 25, it should be understood that the flow path within the intake 708 of the pool cleaner 700, 742 leading to the hydrocyclonic particle separator 400 is substantially similar to the flow paths shown in FIG. 10C. Thus, a first flow path F1 extends from the inlet opening 720 of the intake 708, across the channel 724, out of the outlet opening 722, into the inlet 446 of the canister body 440, across the canister intake channel 474, and out of the tangential outlet 472 where the fluid enters the canister body 440. Water flowing through the first flow path F1 is unfiltered water that is laden with large and small debris $D_L$, $D_S$.

The second flow path F2 starts at the end of the first flow path F1, e.g., at the tangential outlet 472, entering the inner chamber 470 of the canister body 440 at the tangential outlet 472. The second flow path F2 enters the inner chamber 470 at a tangent to the canister body 440, the inner chamber 470, and the first chamber C1 and is directed to flow between the inner wall of the canister body 440 and the filtering assembly 426. The tangential entrance of the second flow path F2 results in the generation of a cyclonic/rotational flow within the first chamber C1 that circles about a central axis A2 of the hydrocyclonic particle separator assembly 400. The cyclonic flow of the second flow path F2 within the first chamber C1 results in large debris particles $D_L$, e.g., debris having an aggregate size (e.g., each dimension) of up to about 1.25 inches, for example, such as, sticks, leaves, grass, coarse sand, fine sand, stones, pebbles, insects, small animals, etc., striking the interior surface of the canister body 440 and the filtering assembly 426 and losing velocity, resulting in the large debris particles $D_L$ falling to the bottom of the canister body 440 and into the large debris container 444 (e.g., the second chamber C2) where they are collected and stored until the hydrocyclonic particle separator assembly 400 is removed from the pool cleaner and emptied.

A third flow path F3 extends radially inward from the second flow path F2, flowing across the filtering medium 430 of the filtering assembly 426 into the third chamber C3. Fluid and smaller debris $D_S$ are contained in the third flow path F3, but the larger debris $D_L$ has been separated out. Accordingly, the fluid in the third flow path F3 is once-filtered fluid. The third flow path F3 enters the third chamber C3 around the outer surface of the frustoconical bottom portions 640 of the cyclone containers 420 and rises upward in the direction of the cylindrical top portions 638 of the cyclone containers 420. As the fluid of the third flow path F3 reaches the tangential inlet 636 of each of the cyclone containers 420, the third flow path F3 connects with fourth and fifth flow paths F4, F5. In particular, the third flow path F3 enters each of the cyclone containers 420 of the first and second set of cyclone containers 624, 626 substantially simultaneously as fluid rises to the level of the tangential inlets 636.

The fourth flow path F4 enters each individual cyclone container 420 of the second set of cyclone containers 626 at the respective tangential inlet 636 where it proceeds to the respective cyclone chamber 630, e.g., the fourth chamber C4. Substantially simultaneously to the fourth flow path F4 entering the cyclone containers 420 of the second set of cyclone containers 626, the fifth flow path F5 enters each individual cyclone container 420 of the first set of cyclone containers 624 at the respective tangential inlet 636 where it proceeds to the respective cyclone chamber 630, e.g., the fifth chamber C5. The placement of the individual cyclone container's tangential inlet 636, e.g., at a tangent to the respective cyclone chamber 630, results in the fourth and fifth flow paths F4, F5 being a cyclonic/rotational flow within each cyclone chamber 630. The fourth and fifth flow paths F4, F5 rotate within each individual cyclone container 440 of the respective second and first set of cyclone containers 626, 624 to separate smaller debris $D_S$, e.g., debris having an aggregate size (e.g., each dimension) of up to about 0.080 inches, for example, such as, coarse sand, fine sand, silt, dirt, insects, etc., based on the ratio of the smaller debris' $D_S$ centripetal force to fluid resistance from the fluid stream of the fourth and fifth flow paths F4, F5. More specifically, the fourth and fifth flow paths F4, F5 travel along the interior wall of the respective cyclone container 420, travels downward along the cyclone container 420 through the frustoconical bottom portion 640 where the cyclone container 420 tapers, and toward the debris underflow nozzle 634.

As the fourth and fifth flow paths F4, F5 travel along the frustoconical bottom portion 640, the rotational radius of the fourth and fifth flow paths F4, F5 is reduced. As the rotational radius of the fourth and fifth flow paths F4, F5 is reduced, the larger and denser particles of the smaller debris particles $D_S$ within the fourth and fifth flow paths F4, F5 have too much inertia to follow the continually reducing rotational radius of the fourth and fifth flow paths F4, F5 causing the smaller debris particles $D_S$ to contact the inner surface of the cyclone container 420 and fall to the bottom where the small debris particles $D_S$ fall through the respective debris underflow nozzles 634 and onto the tapered fine debris container 434. The tapered configuration of the fine debris container 434 causes the small debris particles $D_S$ to slide downward and into the sixth chamber C6 where the small debris particles $D_S$ are collected and stored by the fine debris container 434 until the hydrocyclonic particle separator assembly 400 is removed from the pool cleaner and emptied. Thus, the small debris particles $D_S$ separated from the water in both the first and second set of cyclone containers 624, 626 is collected in the same fine debris container 434 until the pool cleaner is emptied.

The result of the above description is that smaller and smaller debris is separated from the fluid flowing in the fourth and fifth flow paths F4, F5 as these flow paths proceed down the frustoconical bottom portions 640 of the respective cyclone containers 420 forming an inner vortex. Additionally, as the fluid within the fourth and fifth flow paths F4, F5 reaches the bottom of the frustoconical bottom portions 640 and the inner vortex, it slows down causing the fluid therein to be pulled upward through the respective vortex finders 412 as twice-filtered fluid. The twice-filtered fluid enters the seventh chamber C7 where it merges with the sixth flow path F6.

The sixth flow path F6 connects with the fourth and fifth flow paths F4, F5 at the top of the channel 676 of each vortex finder 412 where twice-filtered water enters the seventh chamber C7. The sixth flow path F6 extends from the channel 676 of each vortex finder 412, across each inner lobe 692 of the top cap 404, into the tubular outlet 698, and through the diffuser 402 to exit the hydrocyclonic particle separator assembly 400. That is, the sixth flow path F6 completely traverses the seventh chamber C7.

Accordingly, the larger cyclonic/rotational flow travels about the central axis A2, while the smaller cyclonic/rotational flows are formed and flow about the secondary central axes of the individual cyclone containers 420 of the cyclone block 418, resulting in a plurality of smaller cyclonic/rotational flows within a larger cyclonic/rotational flow. In particular, the hydrocyclonic particle separator assembly 400 includes three levels of cyclonic/rotational flow—around the filtering assembly 426, within the second set of cyclone containers 626, and within the first set of cyclone containers 624.

As such, debris-laden fluid flowing through the pool cleaner is filtered twice by particle separation due to the generated cyclones. Utilizing the cyclonic flows within the pool cleaner to separate the particles and drop the particles out of the flow path results in the retention of suction performance throughout the cleaner, as there is no opportunity for the debris particles to clog the filtering elements. This allows for optimum fluid flow performance through entire cleaning cycles, longer cleaner run times between debris removal, and the collection of more debris before needing to empty the hydrocyclonic particle separator assembly 400. As is known in the art, the outward flow of clean fluid results in an opposing force, which, as is also known in the art, can be relied upon in navigation of the pool cleaner for the purpose of forcing a pool cleaner downward against the floor when the pool cleaner is traversing the floor and sideways against a wall, when the pool cleaner is traversing a wall of the pool.

With reference to FIGS. 51-57, perspective, front, rear, side, top, and bottom views of a fourth embodiment of an exemplary pool cleaner 800 are provided. The pool cleaner 800 generally includes a pool cleaner body 802 and a third embodiment of a hydrocyclonic particle separator assembly 804. The pool cleaner body 802 includes a chassis 806 (see FIG. 57) that many components can be mounted to, which is discussed in greater detail in connection with FIG. 89. The pool cleaner body 802 includes left and right covers 808*a*, 808*b*, a handle 810, a front skin 812, a rear cover 814, and an inlet top 816. The left and right skins 808*a*, 808*b*, front skin 812, and rear cover 814 are connected to the chassis 806 and enclose several components of the pool cleaner 800. The pool cleaner 800 includes six wheels 818*a*-818*f* corresponding to and mechanically engaged with six rollers 820*a*-820*f*. The six wheels 818*a*-818*f* are coaxial with the respective six rollers 820*a*-820*f*.

Figure 54:
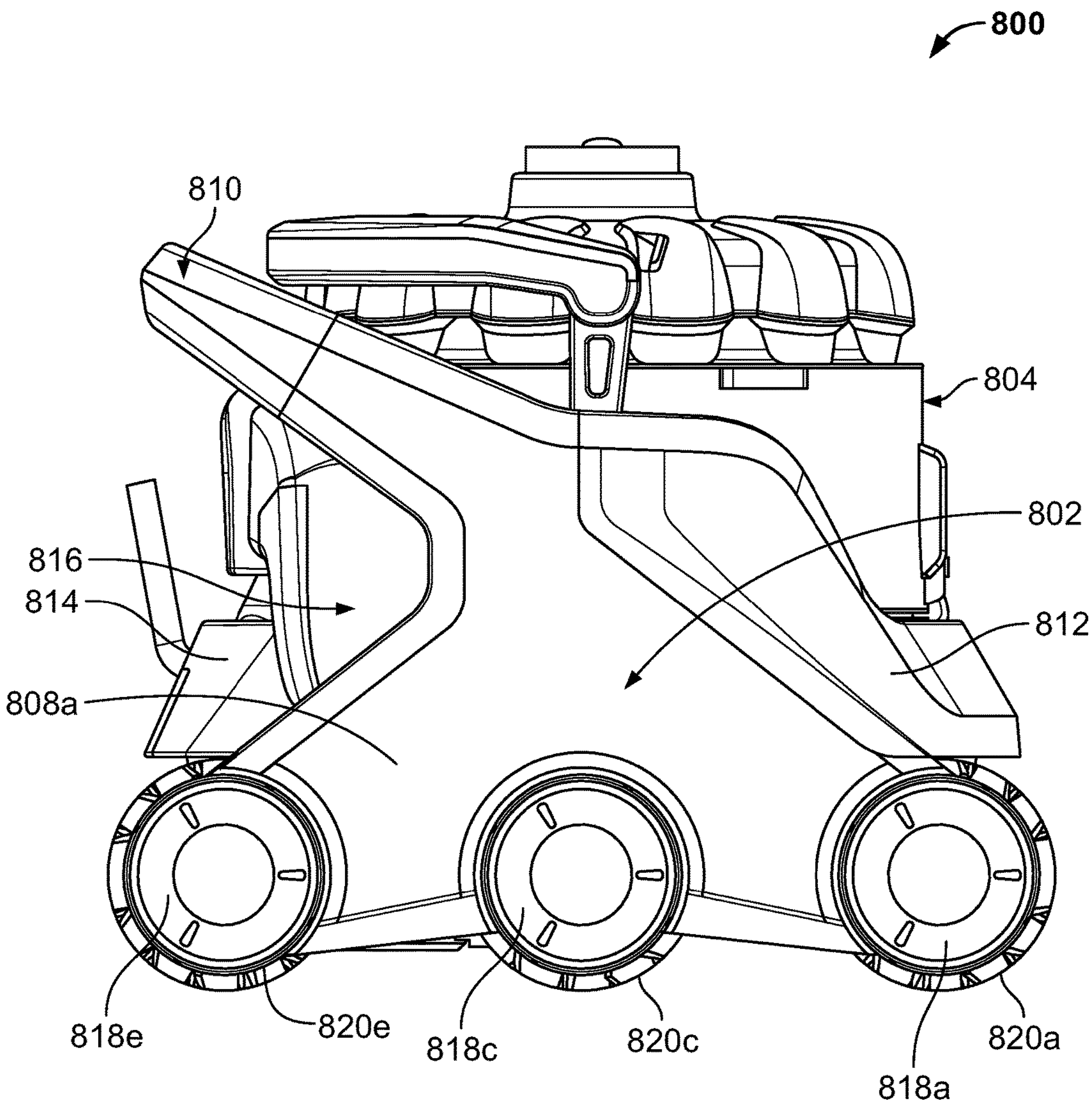
FIG. 54 is a left side view of the fourth embodiment pool cleaner of FIG. 51.
Figure 55:
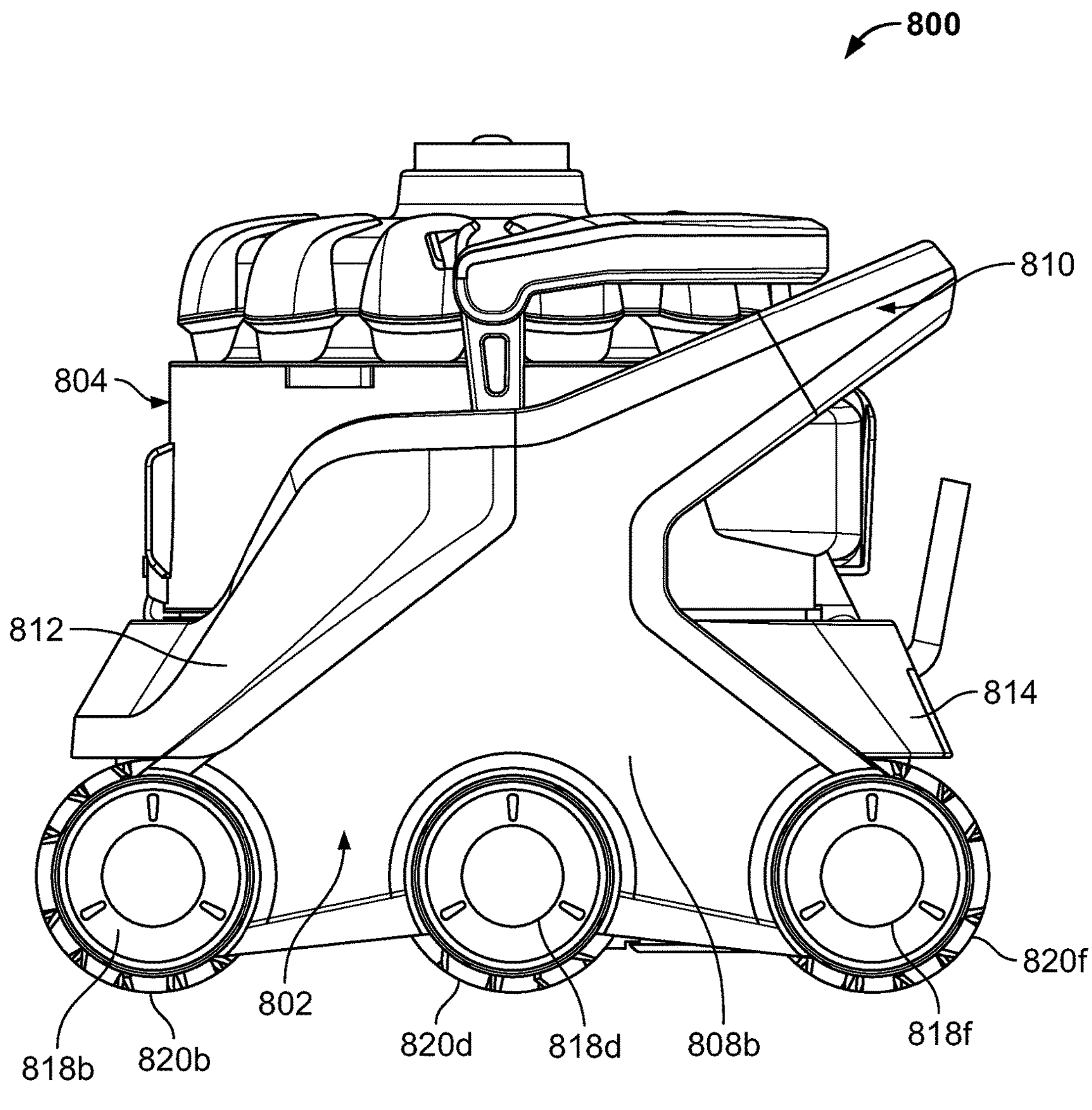
FIG. 55 is a right side view of the fourth embodiment pool cleaner of FIG. 51.

The wheels 818*a*-818*f* are grouped into a first wheel set (e.g., wheels 818*a*, 818*c*, 818*e*) and a second wheel set (e.g., 818*b*, 818*d*, 818*f*). Similarly, the rollers 820*a*-820*f* are grouped into a first roller set (e.g., rollers 820*a*, 820*c*, 820*e*) and a second roller set (e.g., 820*b*, 820*d*, 820*f*). Each of the roller sets are in mechanical communication with a respective drive, which is discussed in greater detail in connection with FIGS. 89-93 As shown in FIGS. 54 and 55, which are side views of the pool cleaner 800, the wheels 818*a*-818*f* are positioned on the outside of the cleaner body 802 and have a diameter that is less than the diameter of the rollers 820*a*-820*f* so that the wheels 818*a*-818*f* do not contact a surface at all times. Instead, the wheels 818*a*-818*f* are configured to contact a pool or spa surface only during particular circumstances such as when the pool cleaner 800 is traversing a concave or convex surface, attempting to climb a wall, at a transition point to a vertical incline, or at any other time where the rollers 820*a*-820*f* may be disengaged from a pool or spa surface.

Figure 57:
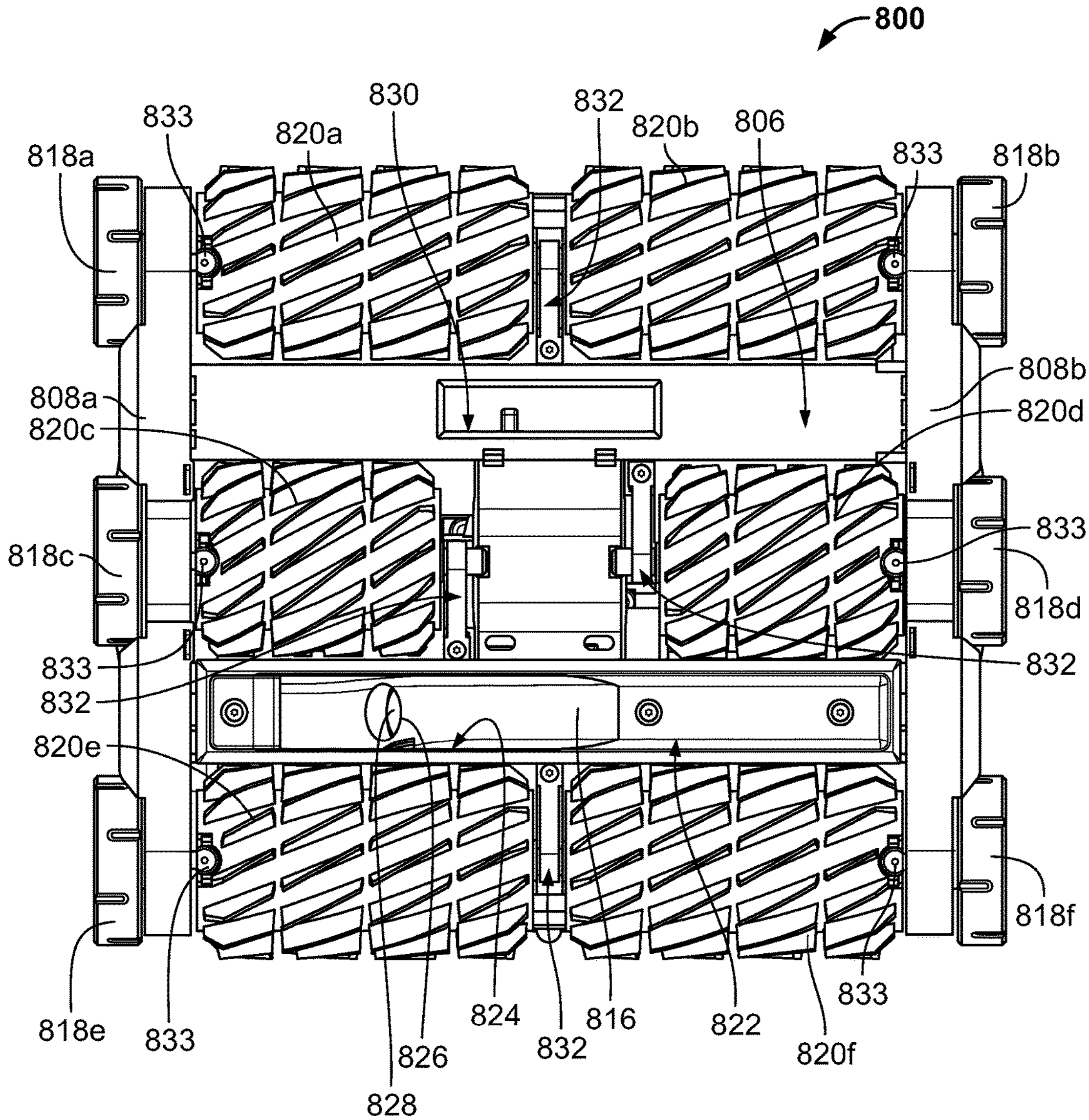
FIG. 57 is a bottom view of the fourth embodiment pool cleaner of FIG. 51.

As shown in FIG. 57, which is a bottom view of the pool cleaner 800, the inlet top 816 is connected with an inlet bottom 822 that extends the width of the pool cleaner 800 between the rollers 820*c*, 820*d* and the rollers 820*e*, 820*f*. The inlet bottom 822 includes an opening 824 that allows water and debris to flow through the inlet bottom 822, across the inlet top 816, and into the hydrocyclonic particle separator assembly 804. The inlet top 816 can also include a debris sensor opening 826 wherein a debris sensor lens 828 can be positioned for monitoring debris as it passes through the inlet top 816. Reference is made to U.S. Patent App. Pub. No. 2016/0244988, published Aug. 25, 2016, which is incorporated by reference herein, describing some example debris sensors and related systems and methods. The chassis 806 also includes a recess 830 that assists in securing the pool cleaner 800 to a caddy which is discussed in detail below in connection with FIGS. 171-213 A plurality of roller latches 832 and roller mounts 833 are provided for securing the rollers 820*a*-820*f* to the chassis 806.

Figure 58:
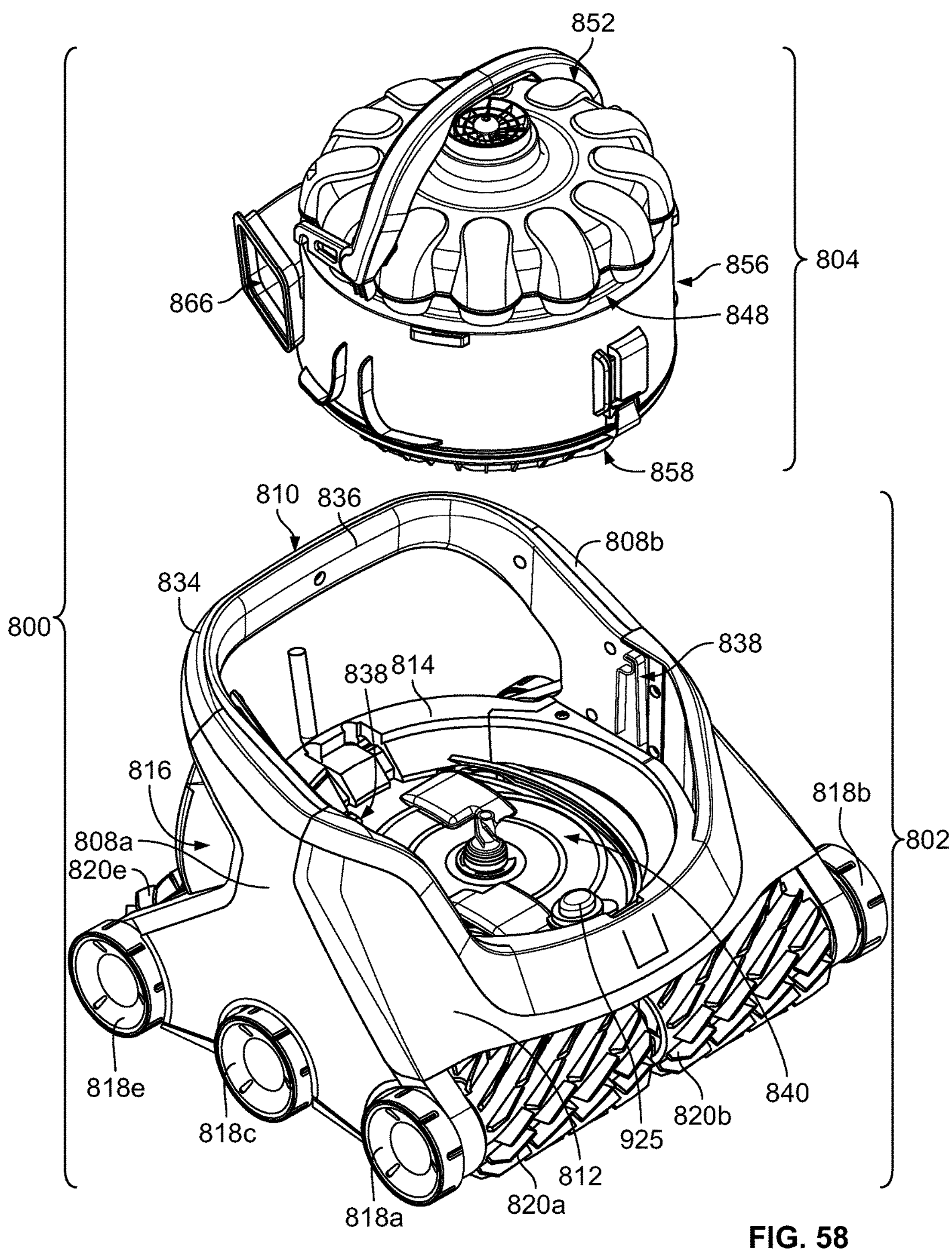
FIG. 58 is a partially exploded view of the fourth embodiment pool cleaner of FIG. 51 showing a third embodiment hydrocyclonic particle separator assembly exploded from a pool cleaner body.
Figure 59A:
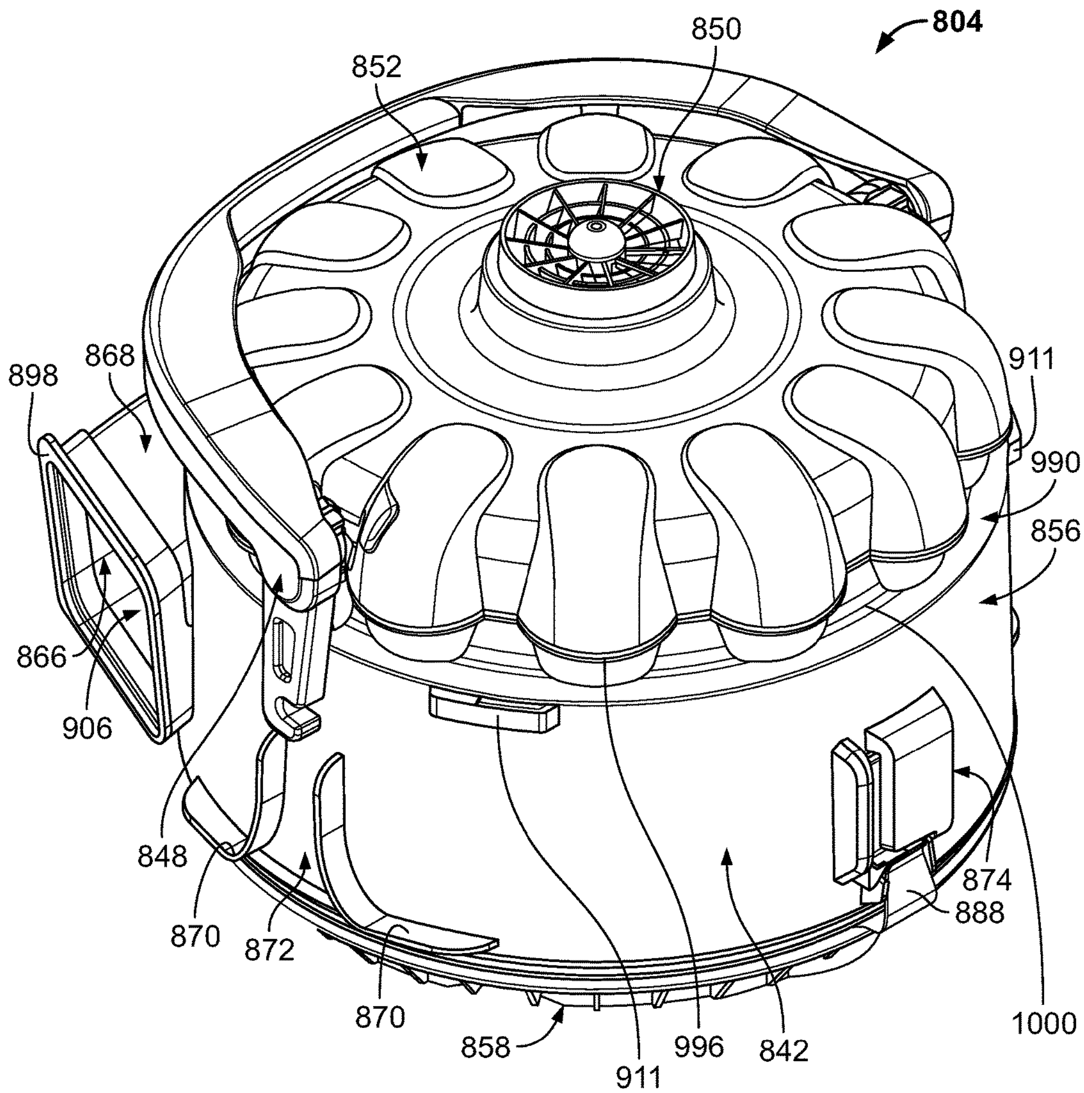
FIG. 59A is a perspective view of the third embodiment hydrocylonic particle separator assembly of FIG. 58 with a handle in a down position.
Figure 59B:
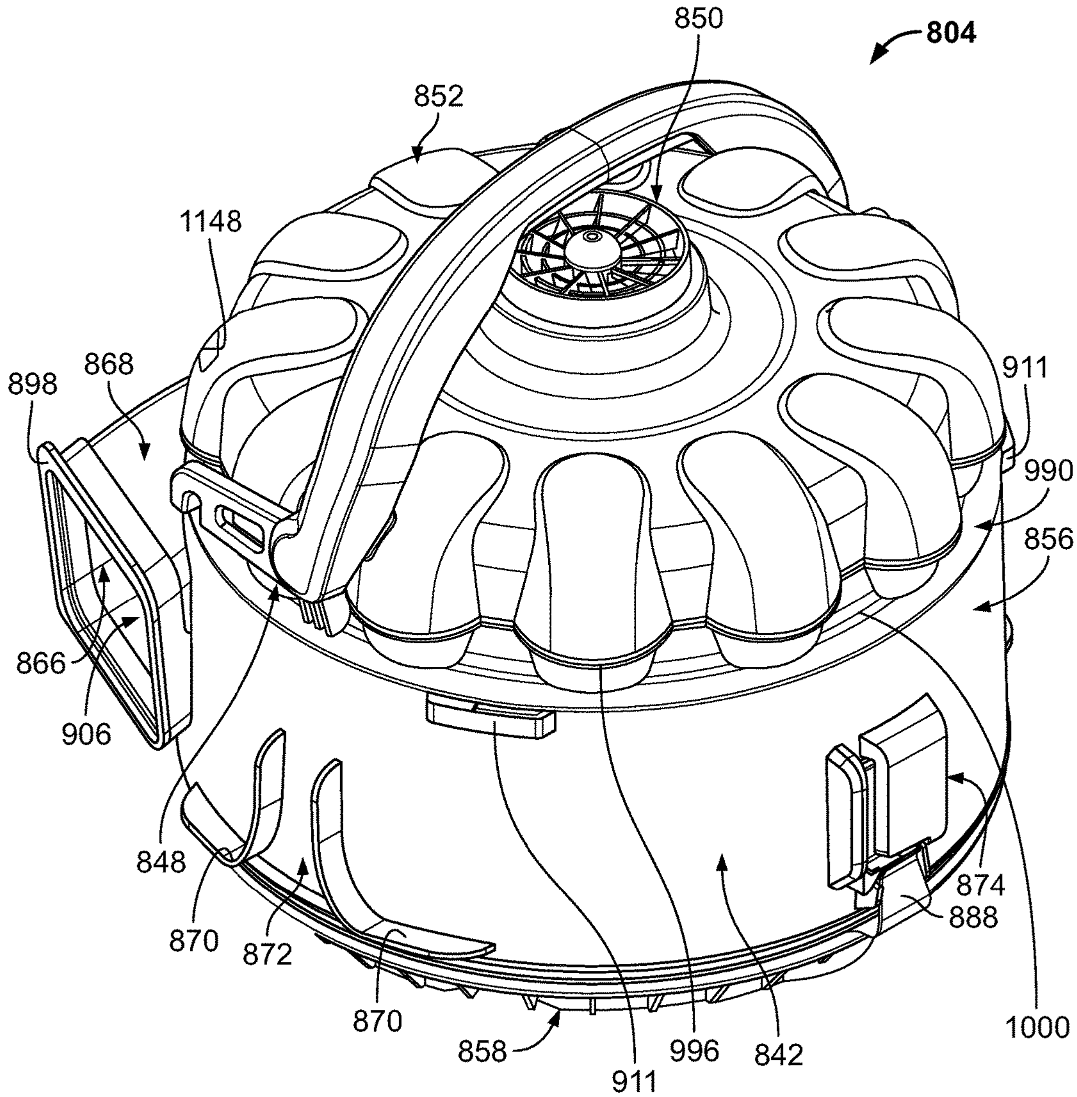
FIG. 59B is a perspective view of the third embodiment hydrocylonic particle separator assembly of FIG. 58 with the handle in an up position.

FIG. 58 is a partially exploded view of the cleaner 800 showing the hydrocylonic particle separator assembly 804 exploded from the pool cleaner body 802. As shown in FIG. 58, the handle 810 is formed of an exterior handle skin 834 mounted to an interior handle structure 836. The interior handle structure 836 is secured to the chassis 806 to form a rigid component that a user can grab to lift the pool cleaner 800. The interior handle structure 836 also includes two catches 838 on lateral sides of the pool cleaner body 802 that are used to secure the separator assembly 804 to the pool cleaner body 802. The pool cleaner 800 additionally includes a motor box 840 that is secured to the chassis 806 and drives the rollers 820*a*-802*f*.

With reference to FIGS. 59A-63, perspective, top, side, and exploded views of the third embodiment hydrocyclonic particle separator assembly 804 are provided. It should be understood that the hydrocyclonic particle separator assembly 804 can be substantially similar in structure and function to the hydrocyclonic particle separators 120 and 400 and can be implemented with the pool cleaner 100 or the pool cleaner 700 when suitable, as understood by one of ordinary skill in the art.

Figure 62:
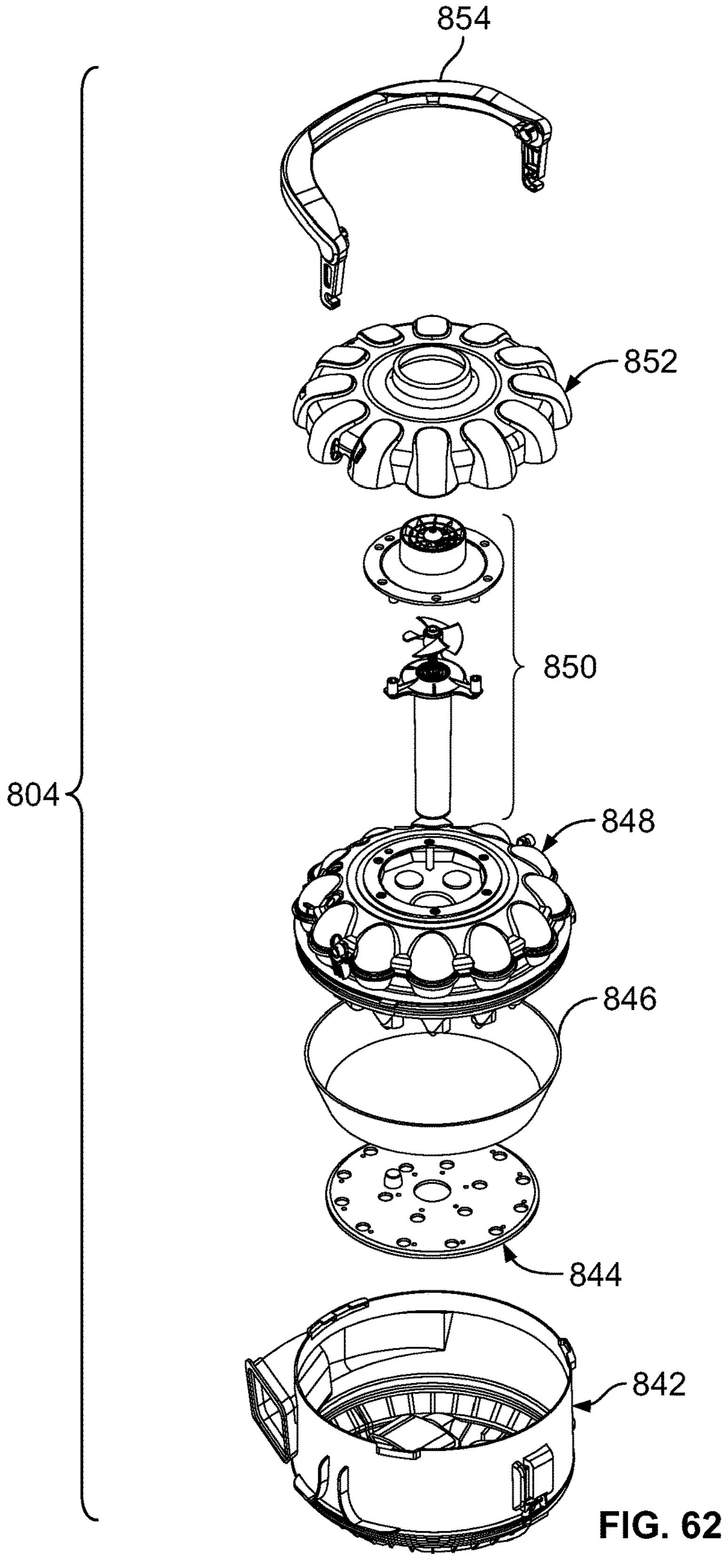
FIG. 62 is a partially exploded view of the third embodiment hydrocylonic particle separator assembly of FIG. 58.

As shown in FIG. 62, which is a partially exploded view of the hydrocyclonic particle separator assembly 804, the hydrocylconic particle separator assembly 804 generally includes a canister body subassembly 842, a fine debris subassembly 844, a filter medium 846, a cyclone block subassembly 848, a removable impeller subassembly 850, a beauty cap 852, and a handle 854.

Figure 63:
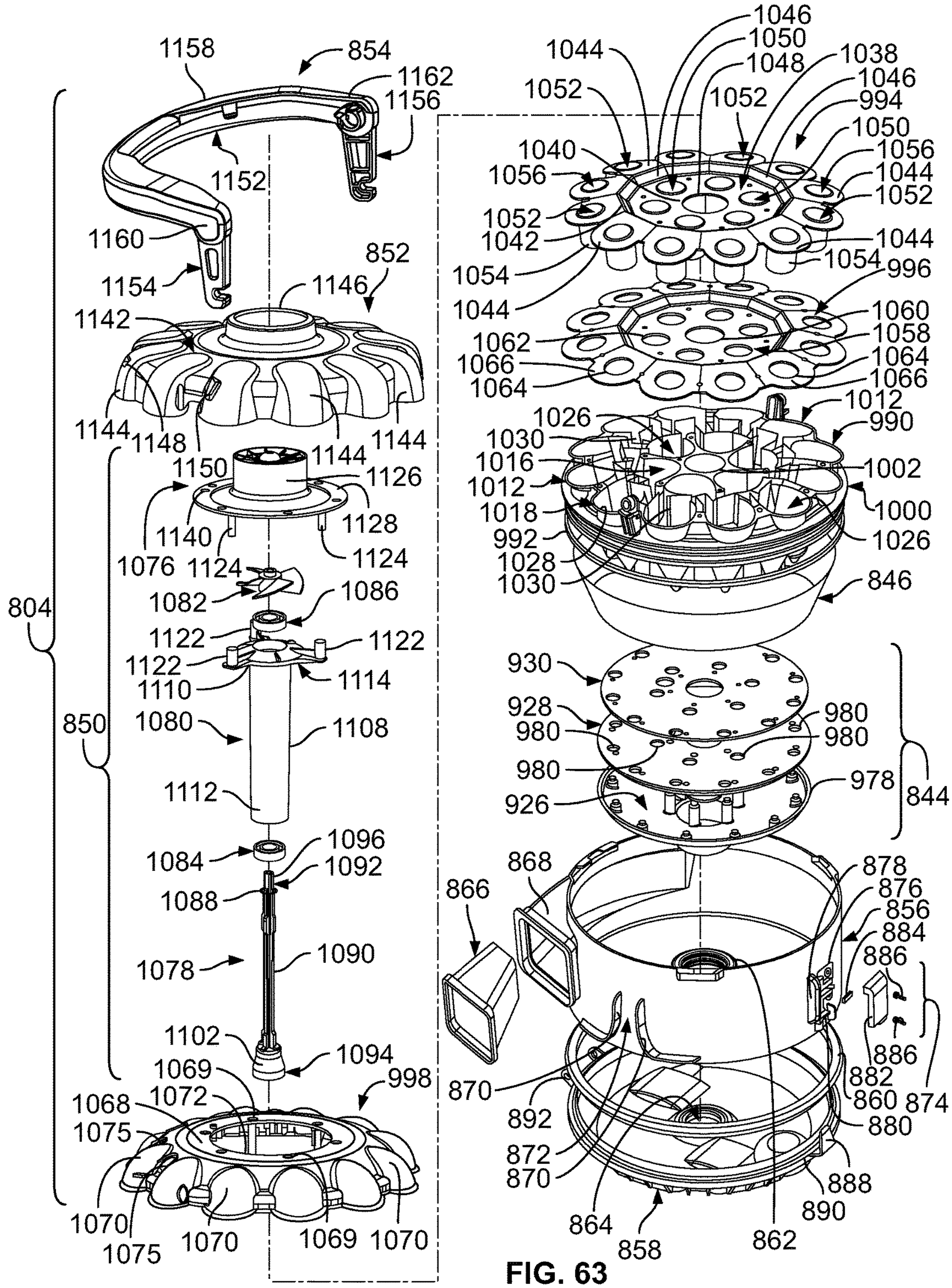
FIG. 63 is an exploded view of the third embodiment hydrocylonic particle separator assembly of FIG. 58.

FIG. 63 is and exploded view of the hydrocyclonic particle separator assembly 804 showing the various subassemblies exploded as well. The canister body subassembly 842 includes a canister body 856, a large debris container 858 that defines the bottom of the hydrocyclonic particle separator assembly 800, a first gasket 860 positioned between the canister body 856 and the large debris container 858, a second gasket 862 positioned about a central opening 864 in the large debris container 858 and between the large debris container 858 and a portion of the fine debris subassembly 844, and a check valve 866. The canister body 856 includes an inlet 868 that tangentially introduces fluid into the hydrocyclonic particle separator assembly 800. Two sets of guide vanes 870 are provided on opposing sides of the canister body 856 exterior. Each set of guide vanes 870 forms a channel 872 therebetween that is used to properly position the hydrocyclonic particle separator assembly 800 when it is being mounted onto the pool cleaner body 802. Specifically, each channel 872 is configured to receive a respective catches 838 of the pool cleaner body 802 such that when a user is placing the hydrocyclonic particle separator assembly 800 on the pool cleaner body 802, the guide vanes 870 will direct the hydrocyclonic particle separator assembly 800 so that the catches 838 are inserted into the channels 872. Thus, the sets of guide vanes 870 prevent the hydrocyclonic particle separator assembly 800 from being incorrectly mounted to the pool cleaner body 802.

Figure 23:
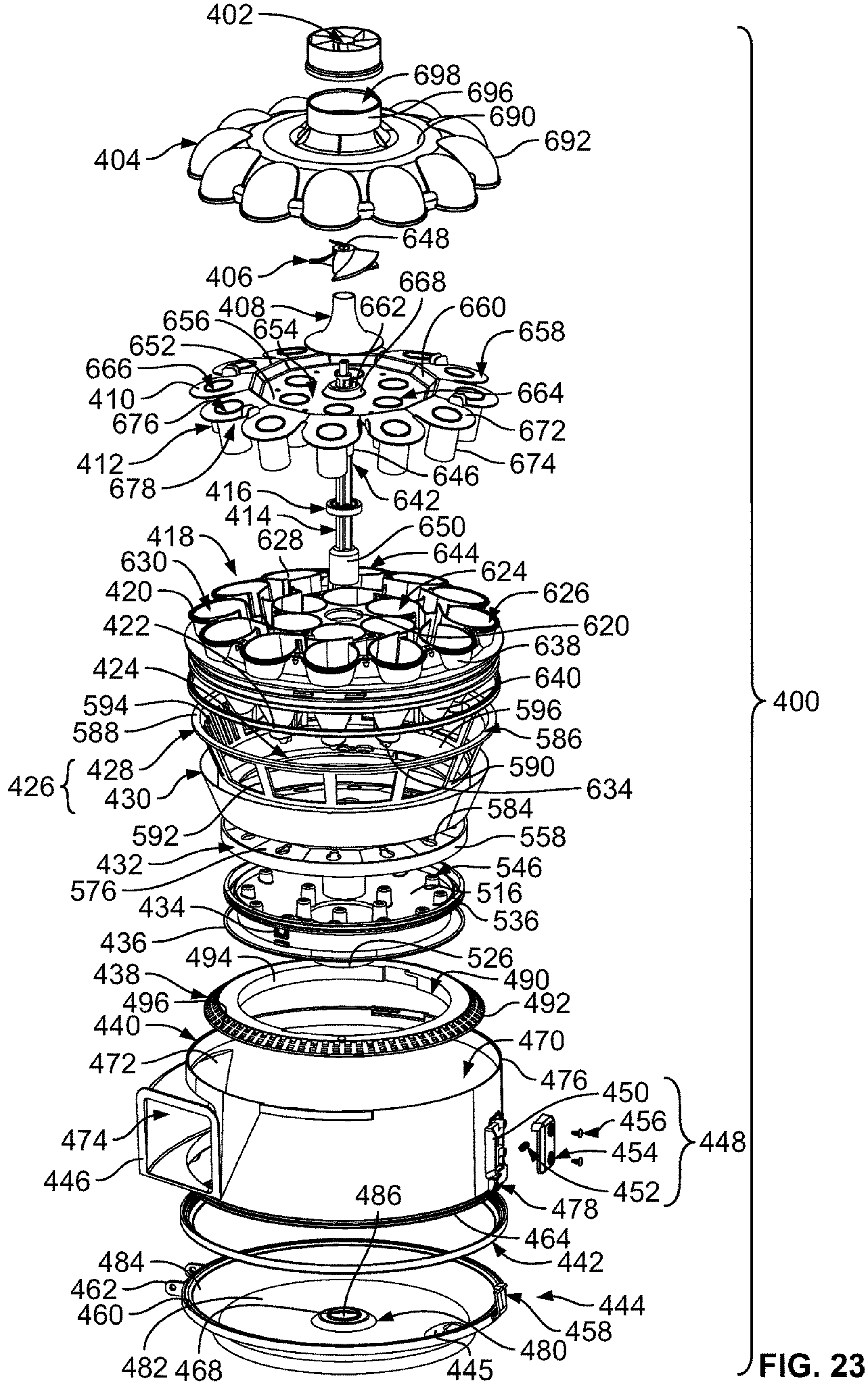
FIG. 23 is an exploded perspective view of the hydrocyclonic particle separator assembly of FIG. 20.
Figure 24:
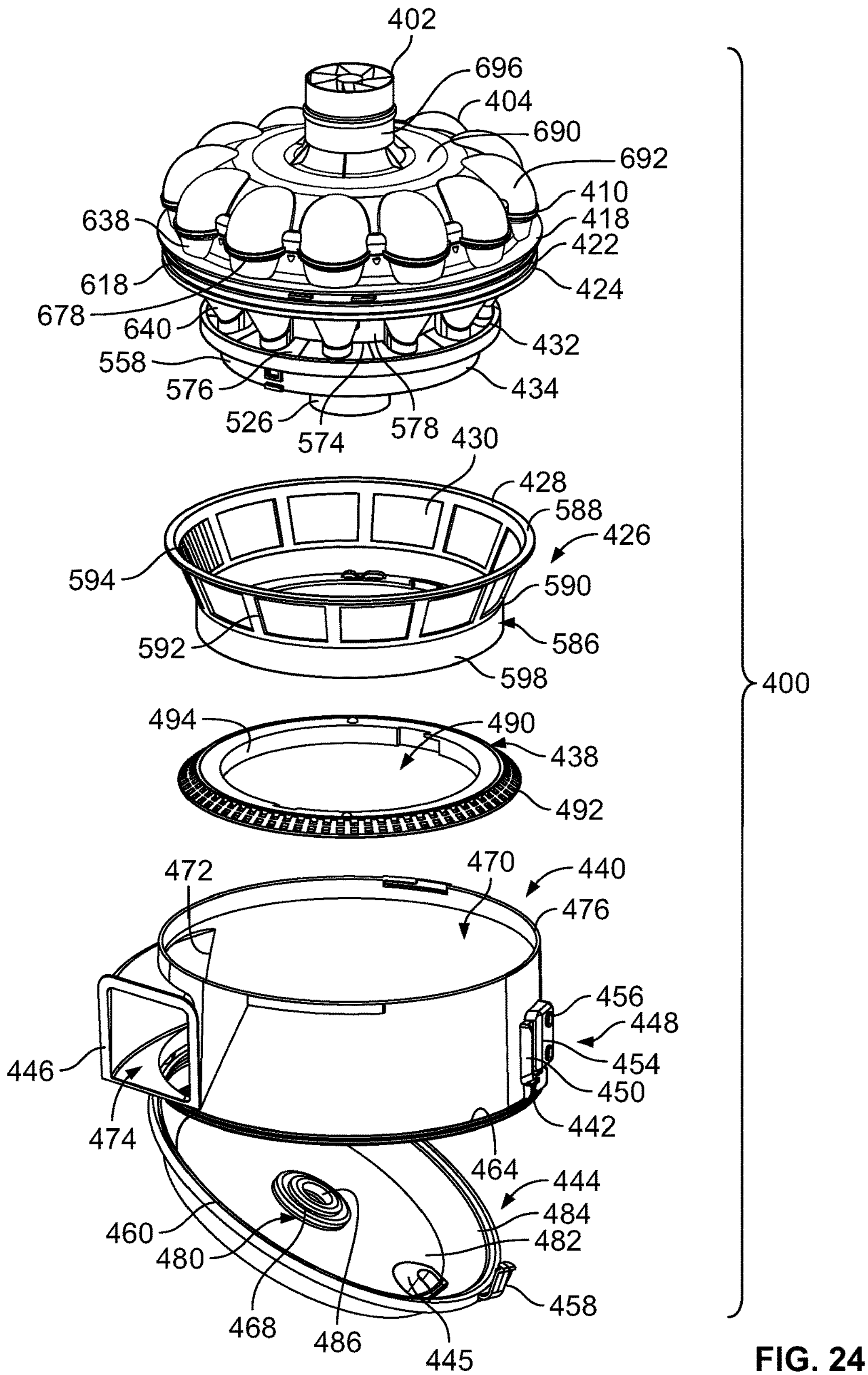
FIG. 24 is a partially exploded perspective view of the hydrocyclonic particle separator assembly of FIG. 20.

The canister body 856 further includes a locking assembly 874 that can be substantially similar to the locking assembly 448 shown in FIG. 23. The locking assembly 874 includes a snap plate 876 disposed on the canister body 856, a slide 878 connected to the snap plate 876 and having a wedge 880, a slide cover 882 that covers a snap spring 884 positioned between the slide 878 and the slide cover 882, and screws 886 that secure the locking assembly 874 to the canister body 856. The locking assembly 874 can interlock with a complementary extension 888 protruding from an upper portion 890 of the large debris container 858. To disengage the locking assembly 874, a user can pinch the slide 878 and the snap plate 876 causing the slide 878 to compress the snap spring 884. By sliding the slide 878, the wedge 880 engages the extension 888 forcing it away from the locking assembly 874 and thus disengaging the extension 888 from the locking assembly 874. Upon release of the slide 878, the snap spring 884 will push the slide 878 back into its original position.

The large debris container 858 includes a hinge 892 connected to a complementary hinge 894 (see FIG. 61) at a bottom portion of the canister body 856. The large debris container 858 can thereby pivot at the hinge 892 between an open and a closed position, and the locking assembly 874 can be used to lock the large debris container 858 relative to the canister body 856 to maintain the large debris container 858 in a closed position.

Figure 64:
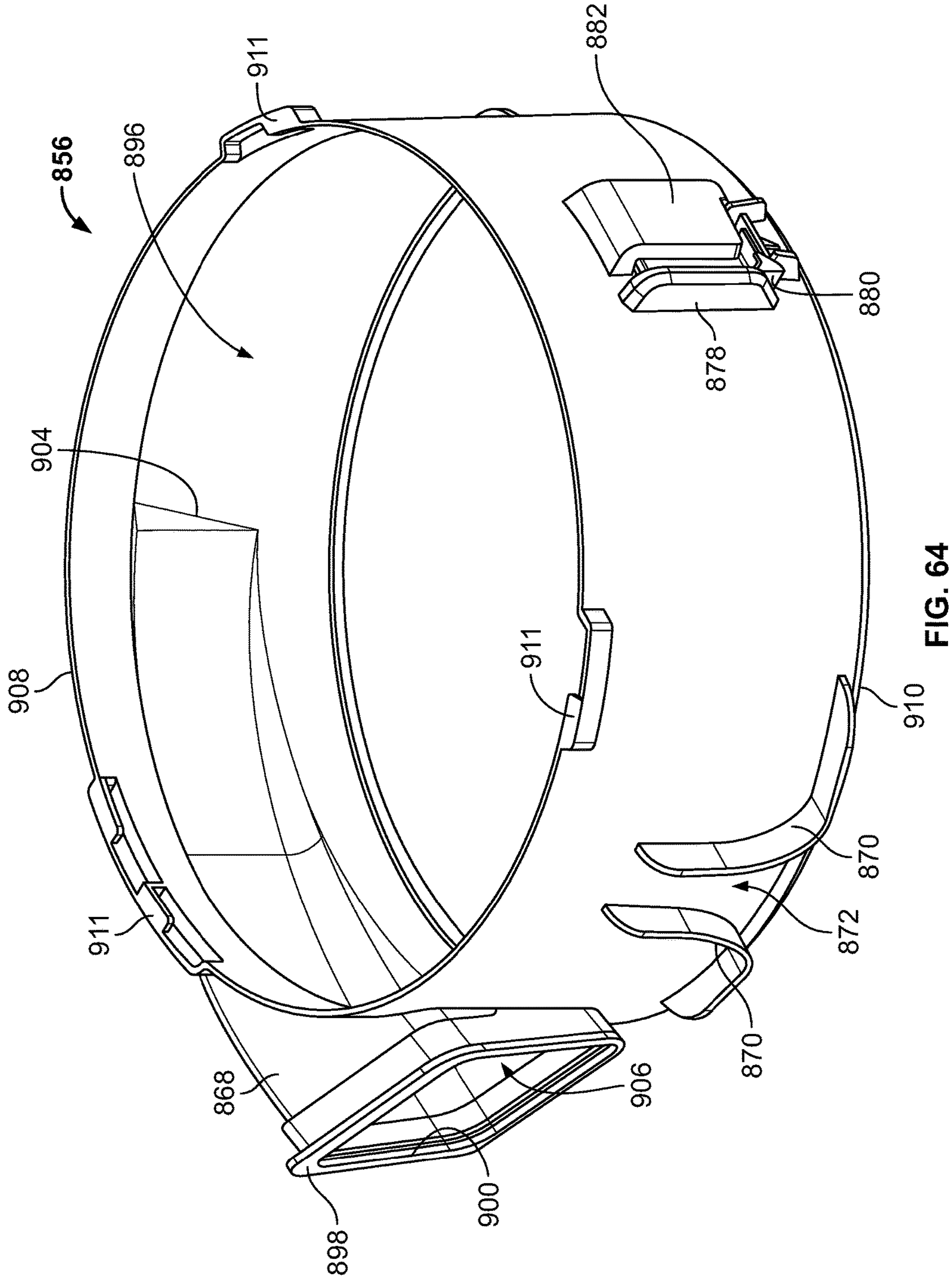
FIG. 64 is a perspective view of a canister body of the third embodiment hydrocylonic particle separator assembly of FIG. 58.
Figure 65:
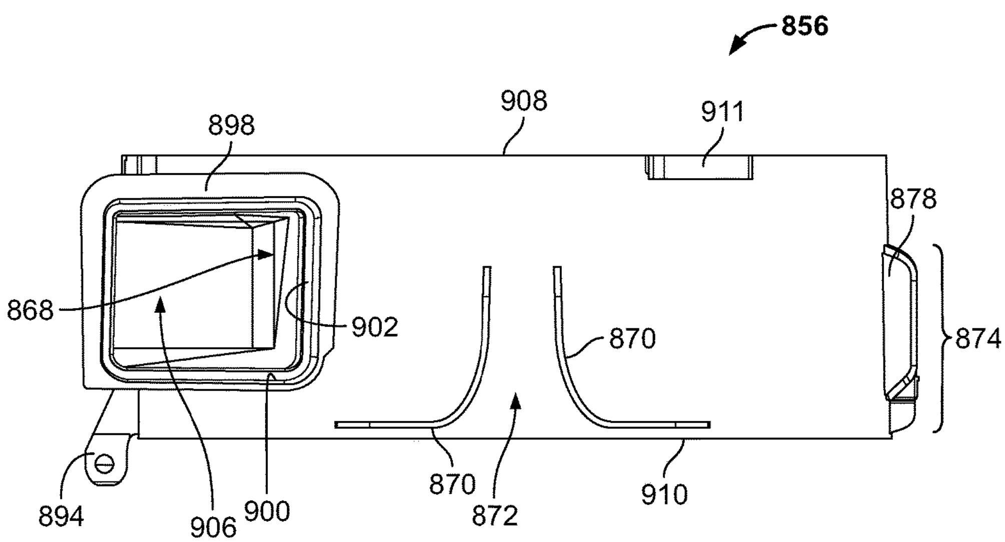
FIG. 65 is a side view of a canister body of FIG. 64.

With additional reference to FIGS. 64 and 65, which are perspective and side view of the canister body 856, the canister body 856 generally defines an inner chamber 896 and includes the intake or inlet 868. The inlet 868 includes a face plate 898 defining an opening and an inner latching shoulder 902 for engaging the check valve 866 and securing the check valve 866 to the canister body 856. The inlet 868 is positioned such that fluid is introduced tangentially into the inner chamber 896. In particular, the inlet 868 includes a tangential outlet 904 and an intake channel 906 extending between the opening 900 and the tangential outlet 904 of the inlet 868. The tangential intake of fluid through the intake channel 906 results in the generation of a first cyclonic flow within the inner chamber 896. The canister body 856 defines a substantially cylindrical configuration with substantially similar top and bottom edges 908, 910 each defining an opening. The top edge 908 can include a plurality of bayonet-lock recesses 911 for securing the cyclone block subassembly 848 with the canister body 856.

Figure 66:
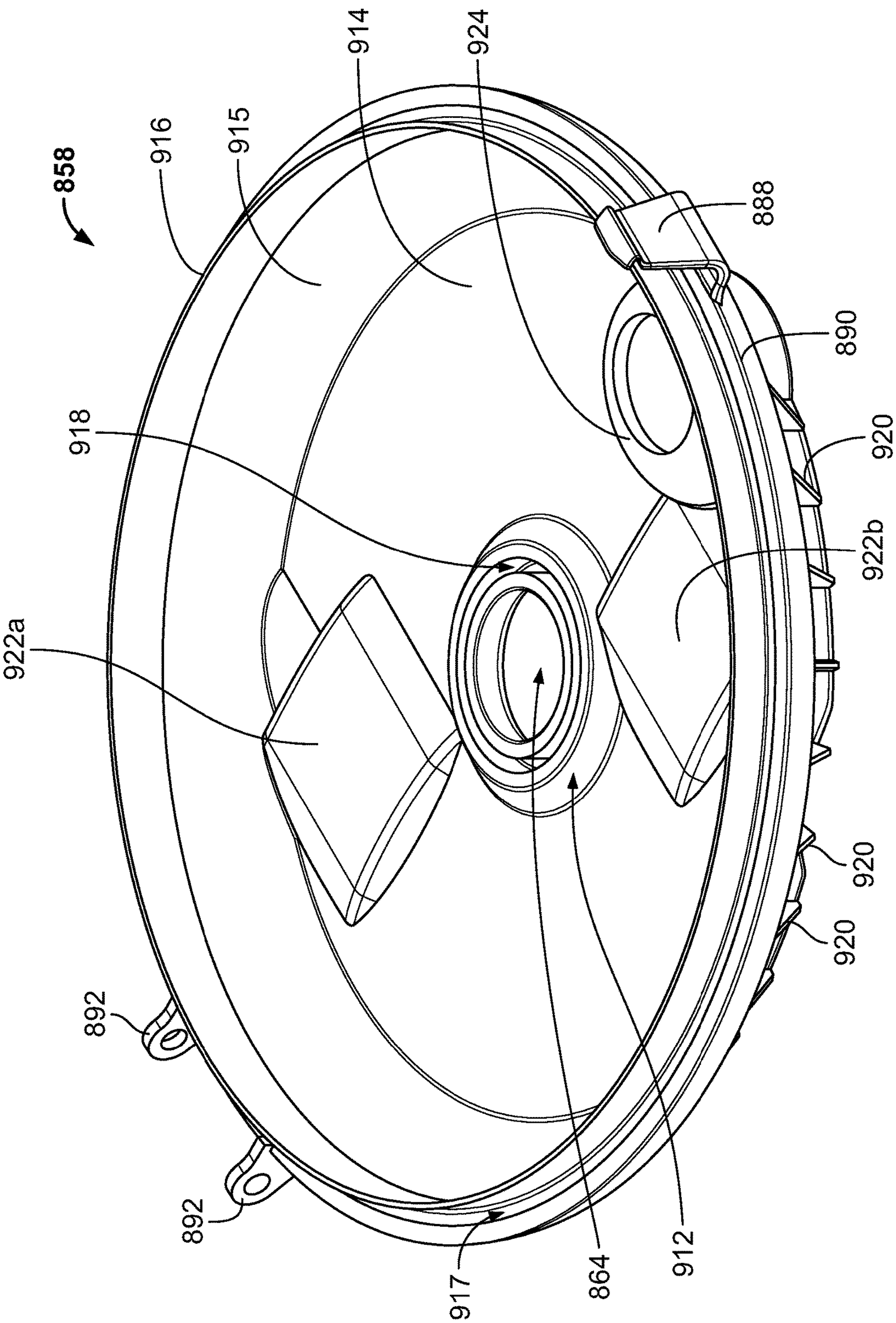
FIG. 66 is a perspective view of a large debris container of the third embodiment hydrocylonic particle separator assembly of FIG. 58.

With additional reference to FIG. 66, which is a perspective view of the large debris container 858, the large debris container 858 includes a central hub 912 surrounded by a dish 914 extending radially rom the central hub 912. In some embodiments, the dish 914 can have an upwardly-curving shape such that the dish 914 catches any debris that falls into the dish 914 and forms a static area where falling debris can land. In some embodiments, the dish 914 can include a substantially planar bottom surface with upwardly angled side walls 915. The dish 914 extends from the central hub 912 to an annular top portion 916. A first annular recess 917 is formed between the annular top portion 916 and the upper portion 890 of the large debris container 858. The first annular recess 917 is configured to receive the first gasket 860, which is discussed in greater detail in connection with FIG. 78E. The central hub 912 includes the central opening 864 through which a motor's rotor can extend to engage the impeller subassembly 850. The central hub 912 also includes a second annular recess 918 surrounding the opening 864 that receives the second gasket 862, which is discussed in greater detail in connection with FIG. 78F. In some embodiments, the bottom surface of the large debris container 858 can include a honeycomb pattern of ribs 920. The ribs 920 can reduce the overall weight of the large debris container 858 while providing structural support. The large debris container 858 can also include a first and second concave recesses 922*a*, 922*b* that accommodate elevated sections of the motor box 840 that may be due to motor placement. Additionally, the large debris container 858 can include a concave portion 924 configured and dimensioned to receive a locking interface 925 (see FIG. 58) of the motor box 840 in order to properly place the hydrocyclonic particle separator assembly 804 on the cleaner body 802 and over an entertainment light lens of the motor box. The entire volume of the dish 914 can be disposed below the canister body 856.

Figure 67:
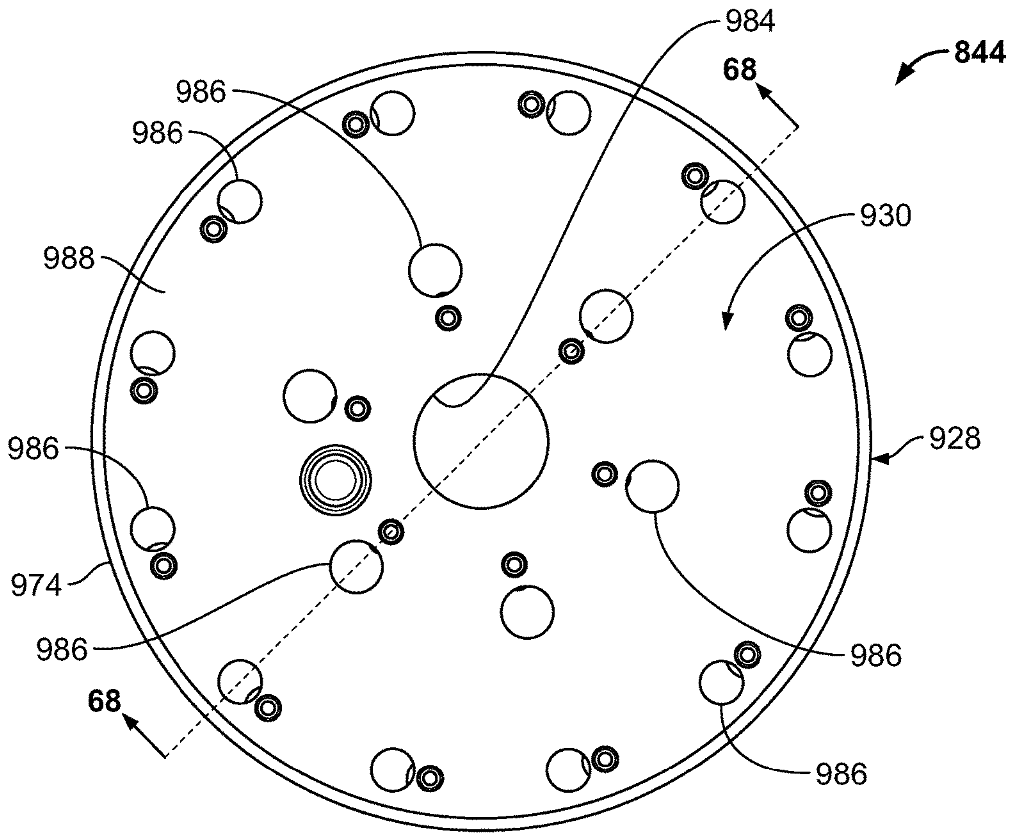
FIG. 67 is a top view of a fine debris subassembly of the third embodiment hydrocylonic particle separator assembly of FIG. 58.

The fine debris subassembly 844 generally includes a fine debris container 926, a fine debris container top 928, a fine debris gasket 930, and an annular gasket 978, as shown in FIG. 62. The fine debris container 926, fine debris container top 928, and fine debris gasket 930 can be substantially similar in construction and function to fine debris container 434, fine debris container top 432, and the second gasket 424 of FIGS. 33-37. With additional reference to FIGS. 67 and 68, a top view of the fine debris subassembly 844 and a sectional view taken along line 68-68 of FIG. 67 are provided. The fine debris container 926 includes a dish 932 with an outer perimeter 934 and an inner perimeter 936, the surface of the dish 932 slopes downwardly towards a central vertical axis 938 where it connects with a central tubular extension 940 at the inner perimeter 936. The tapered dish 932 assists in transferring fine debris from the dish 932 to the central tubular extension 940. The central tubular extension 940 includes a central inner opening 942 formed at the inner perimeter 936. The central inner opening 942 extends through the central tubular extension 940 to a distal end 944. The central tubular extension 940 can be generally cylindrical in some aspects, while in other aspects it can be tapered from the central inner opening 942 to the distal end 944, e.g., toward the central vertical axis 938, such that the central inner opening 942 has a diameter that is greater than the diameter of the central outer opening 942. The tapered radial wall of the central radial extension 526 assists in transfer of fine debris from the dish 516 to an area near the distal end 534 of the central radial extension 526.

The dish 932 includes an inner surface 946 that includes a plurality of upwardly extending bulbs 948. The bulbs 948 can be radially formed on the inner surface 946. In some embodiments, the fine debris container 844 includes a first row of bulbs 948 radially disposed relative to the central vertical axis 938 near the outer perimeter 934 of the dish 932, and further includes a second row of bulbs 948 radially disposed relative to the central vertical axis 938 near the inner perimeter 936 of the dish 932. Each of the bulbs 948 near the outer perimeter 934 can define a first height relative to the inner surface 946, and each of the bulbs 948 near the inner perimeter 936 can define a second height relative to the inner surface 946, the first height being dimensioned smaller than the second height. Each of the bulbs 948 includes a radial wall 950, a top surface 952 and an opening 954 formed in the top surface 952. Each of the bulbs 948 further includes a cavity 956 formed within the radial wall 950 and connected with the opening 954, the cavity 956 extending to an outer surface 958 of the dish 932.

The fine debris container top 928 includes a top circular plate 960, a substantially circular outer perimeter wall 962, and a central opening 964 formed in the top circular plate 960. The fine debris container top 928 includes a central tubular extension 966 protruding from an inner surface 968 of the top circular plate 960 and about the central opening 964. The central tubular extension 966 includes an interior cavity 970 that connects with the central opening 964. In some aspects, the wall that forms the central tubular extension 966 can taper gradually such that the thickness of the wall is greater near the inner surface 968 than the thickness of the radial wall at a distal end 972 of the central tubular extension 966.

The outer perimeter wall 962 can extend downwardly from the top circular plate 960 spaced radially inward from an outer edge 974 of the top circular plate 960. Placement of the outer perimeter wall 962 forms a mounting surface 976 at the outer edge 974 of the top circular plate 960. A gasket 978 can be placed between the mounting surface 976 and the outer perimeter wall 962 of the fine debris container top 928, and the outer perimeter 934 of the fine debris container 926 to form a watertight seal between the fine debris container 926 and the fine debris container top 928. The top circular plate 960 includes a plurality of radially spaced openings 980 formed therein and circumferentially disposed relative to the central vertical axis 938. In some embodiments, a first row of openings 980 can be radially disposed relative to the central vertical axis 938 near the outer edge 974 of the top circular plate 960, and a second row of openings 980 can be radially disposed relative to the central vertical axis 938 closer to the central opening 964. The openings 980 can be configured and dimensioned to receive the distal ends of a portion of the cyclone block subassembly 848, discussed in greater detail below.

Figure 68:
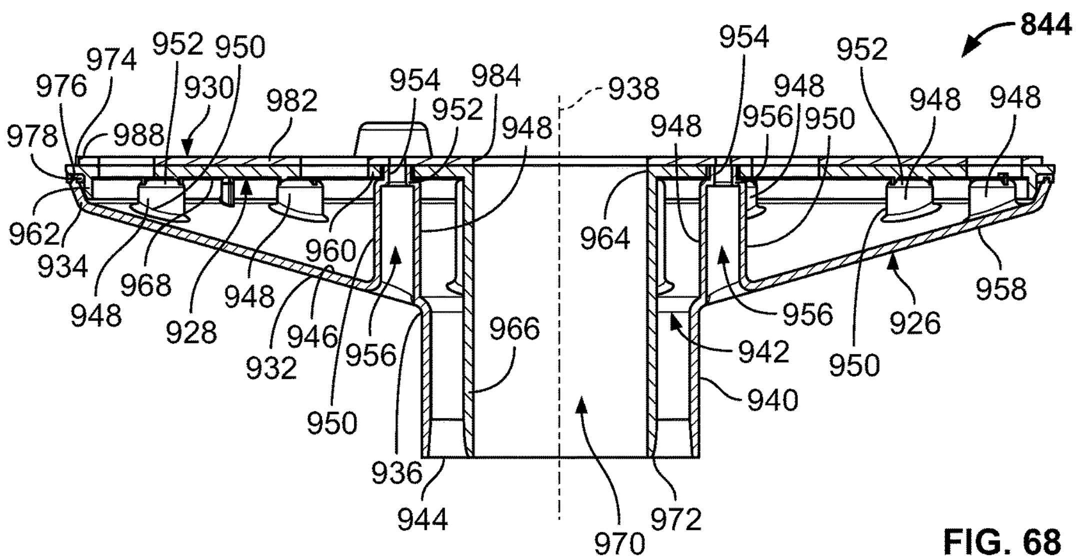
FIG. 68 is a sectional view of the fine debris subassembly of FIG. 67 taken along line 68-68 of FIG. 67.

As shown in FIG. 68, the fine debris subassembly 844 additionally includes the fine debris gasket 930 which can be disposed over the fine debris container top 928. The fine debris gasket 930 includes a gasket body 982 that can be substantially planar and disc-like in configuration. The gasket body 982 includes a central opening 984 and a plurality of radially spaced openings 986 that are configured to match in location to the openings 980 of the fine debris container top 928. Particularly, in some embodiments, a first row of openings 986 can be radially disposed relative to the central vertical axis 938 near an outer perimeter edge 988 of the gasket body 982, and a second row of openings 986 can be radially disposed relative to the central vertical axis 938 closer to the central opening 984.

When assembled, the central tubular extension 966 of the fine debris container top 928 can be positioned concentrically within the central tubular extension 940 of the fine debris container 926. The distal end 972 of the central tubular extension 966 and the distal end 944 of the central radial extension 940 can be positioned against the second gasket 862 that is positioned at the central opening 864 of the large debris container 858 to create a water-tight seal therebetween. The fine debris container 926 can be secured with the fine debris container top by a plurality of screws or bolts that extend through the bulbs 948. As will be discussed in greater detail below, fine debris filtered from the fluid flow during a second cyclonic filtering stage can be deposited in the cavity or chamber formed between the central tubular extensions 940, 966 and the second gasket 862.

It should be understood that when the large debris container 858 is unlatched from the canister body 856 and is in the open position, large debris from the large debris container 858 and fine debris from the cavity or chamber formed between the central tubular extensions 940, 966 can be simultaneously emptied. In particular, opening the large debris container 858 releases the seal formed between the second gasket 862 and the distal ends 944, 972 of the central tubular extensions 940, 966, allowing the fine debris to be simultaneously emptied from the canister body 856.

The filter medium 846 can have a rigid substrate or can be generally a frustoconical shell that can be a mesh, filter, polymesh, or the like. While the filter medium 846 is shown as a solid component herein, this is simply done for ease of illustration, and it should be understood by a person of ordinary skill in the art that the filter medium 846 includes a number of open spaces extending therethrough and is configured to allow water to flow across it. The filter medium 846 is mounted to the fine debris subassembly 844 and the cyclone block subassembly 848, and extends about the perimeter of the fine debris subassembly 844 and the cyclone block subassembly 848. Accordingly, fluid flowing from the exterior of the cyclone block subassembly 848 to the interior flows across the filter medium 846. The filter medium 846 is sized such that debris of a first size, e.g., larger debris, cannot pass through the filtering medium 846. As will be discussed in greater detail below, in a first cyclonic separation stage, the filter medium 846 can filter out a first debris size, e.g., large debris, from the fluid flow with the large debris dropping into the large debris container 858. In particular, the large debris contacts the filter medium 846, or the interior wall of the canister body 856, and is knocked down out of the fluid flow and does not enter the interior of the filtering medium 846. The fluid flow with at least some fine debris can continue through the filtering medium 846 and into the cyclone block subassembly 848. The filter medium 846 can be single filter component mounted to the fine debris subassembly 844 and the cyclone block subassembly 848, or it can be an assembly in accordance with the filtering assembly 426 discussed in connection with FIGS. 23 and 24.

Figure 69:
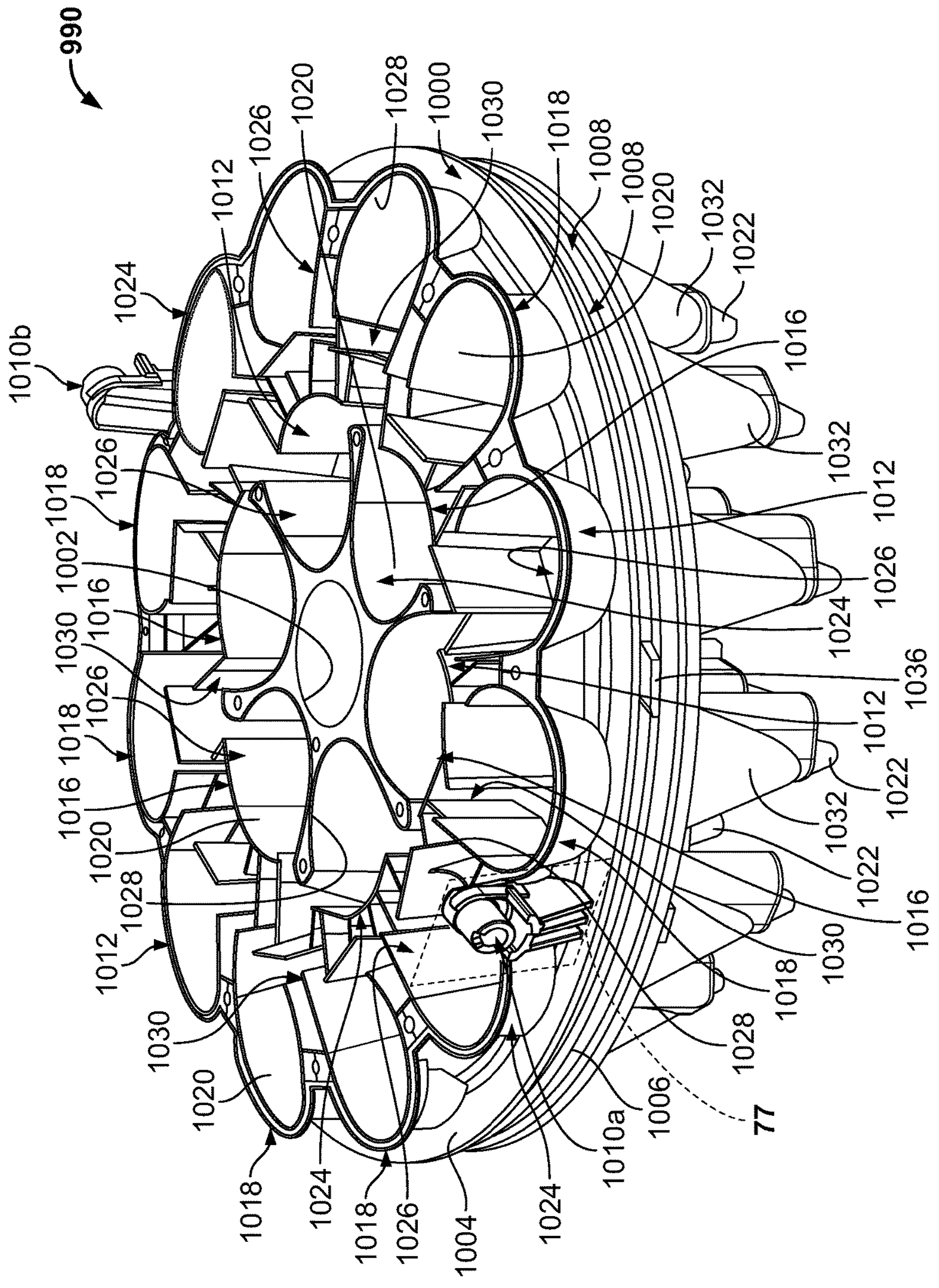
FIG. 69 is a perspective view of a cyclone block of the third embodiment hydrocylonic particle separator assembly of FIG. 58.
Figure 70:
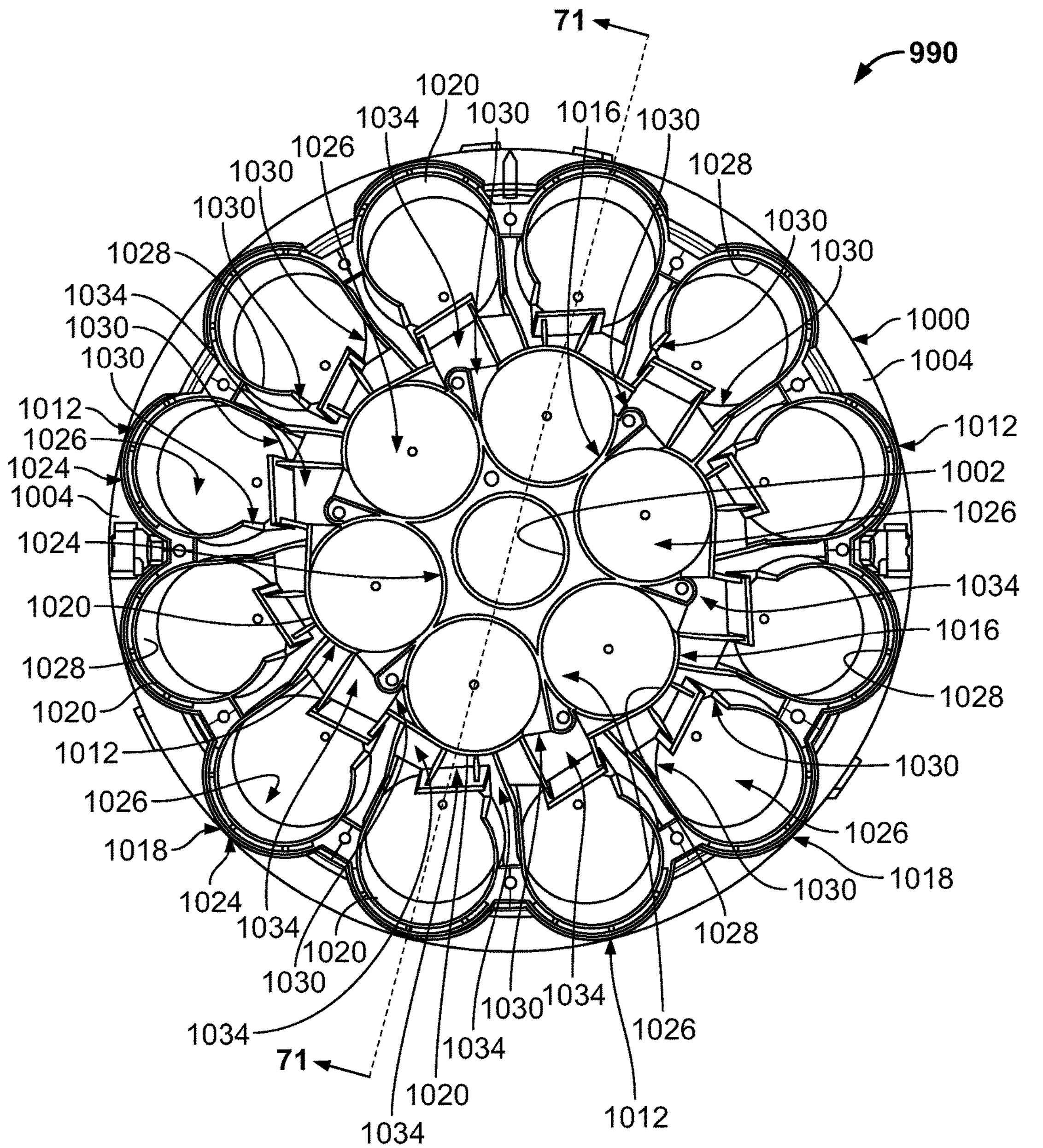
FIG. 70 is a top view of the cyclone block of FIG. 69.
Figure 71:
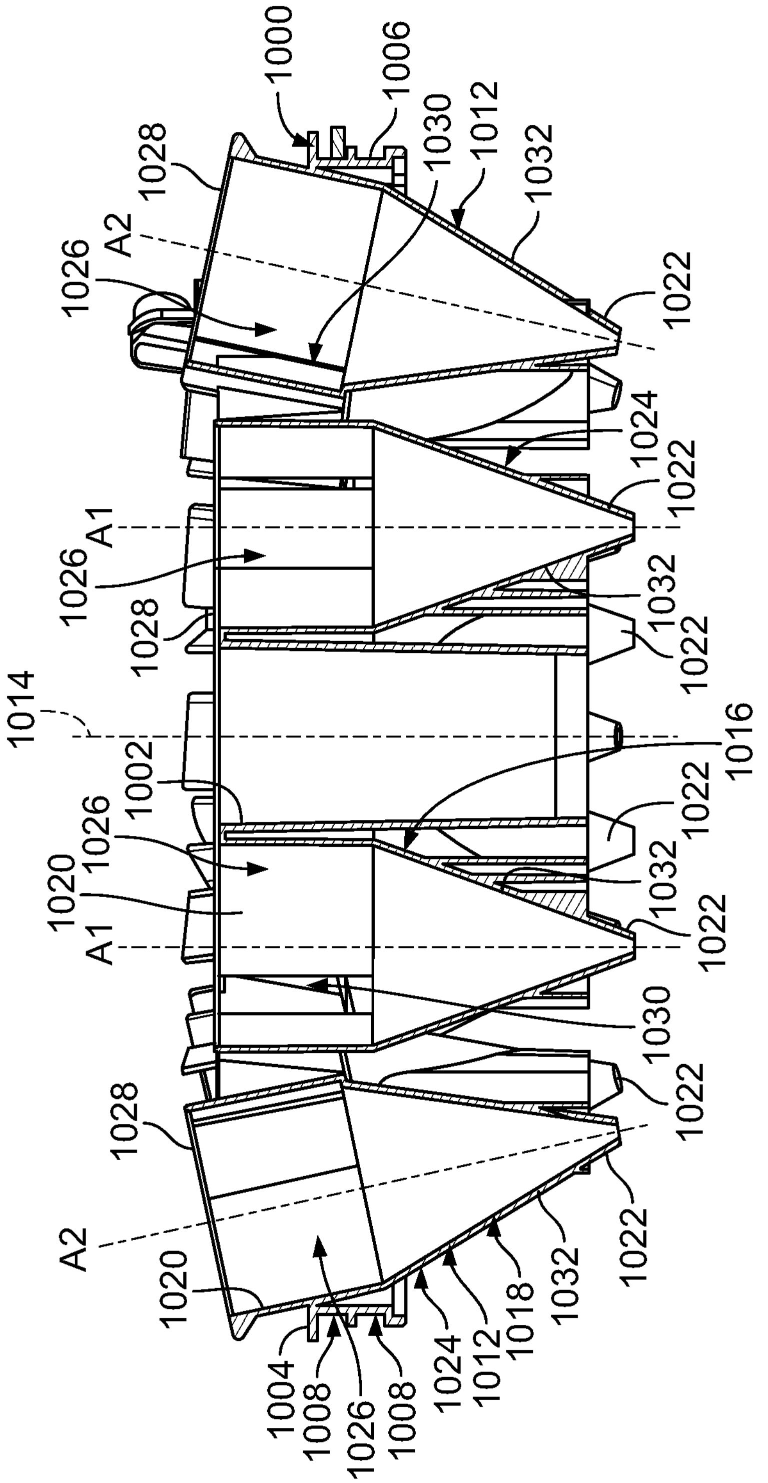
FIG. 71 is a sectional view of the cyclone block of FIG. 69 taken along line 71-71 of FIG. 70.

As illustrated in FIG. 63, the cyclone block subassembly 848 includes a cyclone block 990, a cyclone block gasket 992, a vortex finder ring 994, vortex finder ring gasket 996, and a top cap 998. FIGS. 69 and 70 are, respectively, perspective and top views of the cyclone block 990, while FIG. 71 is a sectional view of the cyclone block 990 taken along line 71-71 of FIG. 70. The cyclone block 990 includes a cyclone block body 1000 in the form of a cylindrical disc with a central opening 1002 formed in the cyclone block body 1000. The cyclone block body 1000 can include an outer ledge 1004 that overhangs a sidewall 1006. The sidewall 1006 can include one or more grooves 1008 that are configured and sized to receive the cyclone block gasket 992 such that the cyclone block gasket 992 is compressed between the sidewall 1006 of the cyclone block body 1000 and the interior of a sidewall of the canister body 856 when the cyclone block subassembly 848 is connected to the canister body 856 (see FIG. 78A, discussed below). In some embodiments, the cyclone block gasket 992 can have a U-shaped cross-section so that it is positioned in more than one groove 1008. The cyclone block body 1000 also includes first and second handle engagement tabs 1010*a*, 1010*b* extending upwardly from the cyclone block body 1000 and positioned diametrically opposed to one another. The first and second handle engagement tabs 1010*a*, 1010*b* are configured to engage and secure the handle 854 to the cyclone block 990 and thus the cyclone block subassembly 848. The cyclone block body 1000 also includes a plurality of individual cyclone containers 1012 radially disposed relative to a central vertical axis 1014. In particular, the cyclone block 990 includes a first set of cyclone containers 1016 radially disposed around the central opening 1002 and a second set of cyclone containers 1018 radially disposed around the first set of cyclone containers 1016.

Each of the cyclone containers 1012 of the first set of cyclone containers 1016 can extend substantially parallel to the central vertical axis 1014. Each of the cyclone containers 1012 of the second set of cyclone containers 1018 can extend in an angled manner relative to the central vertical axis 1014 (e.g., angled with a bottom of the cyclone container 1018 in the direction of the central vertical axis 1014). In particular, a central axis A1 of each of the cyclone containers 1012 of the first set of cyclone containers 1016 can be substantially parallel to the central vertical axis 1014, while a central axis A2 of each of the cyclone containers 1012 of the second set of cyclone containers 1018 can be angled relative to the central vertical axis 1014. Further, a cylindrical top portion 1020 of each of the second set of cyclone containers 1018 can be disposed further from the central vertical axis 1014 than a debris underflow nozzle 1022.

It should be understood that the description of a single cyclone container 1012 holds true for all of the cyclone containers 1012 that make up the first and second rings of cyclone containers 1016, 1018 (i.e., those included in the cyclone block 1000), unless noted otherwise. Each cyclone container 1012 includes a circular tapered container body 1024 that defines a cyclone chamber 1026 and includes an overflow opening 1028, a debris underflow nozzle 1022, and one or more tangential inlets 1030 generally positioned on a radially outward portion of each first set of cyclone containers 1016 and a radially inward portion of each second set of cyclone containers 1018. Each cyclone container 1012 generally includes the cylindrical top portion 1020 and a frustoconical bottom portion 1032 that tapers downward to the debris underflow nozzle 1022. The frustoconical bottom portion 1032 aids in maintaining a centrifugal acceleration of the fluid flow as the fluid travels downward along the interior of the frustoconical bottom portion 1032 in the direction of the debris underflow nozzle 1022. In some embodiments, the tangential inlets 1030 of each cyclone container 1012 of the first set of cyclone containers 1016 can be in fluid communication with the tangential inlets 1030 of an adjacent cyclone container 1012 of the first set of cyclone containers 1016 via a passage 1034. As will be discussed in greater detail below, fluid passing through the filter medium 846 enters the inner chamber 896 of the canister body 856 flows around the frustoconical bottom portions 1032 of the cyclone containers 1012 and travels upward into the respective tangential inlets 1030 of the cyclone containers 1012. Therefore, fluid enters each of the cyclone chambers 1026 of the first and second set of cyclone containers 1016, 1018 substantially simultaneously and forms individual cyclones within the cyclone containers 1012. A concentric, dual-cyclone configuration within the cyclone block 990 is thereby formed.

Figure 78A:
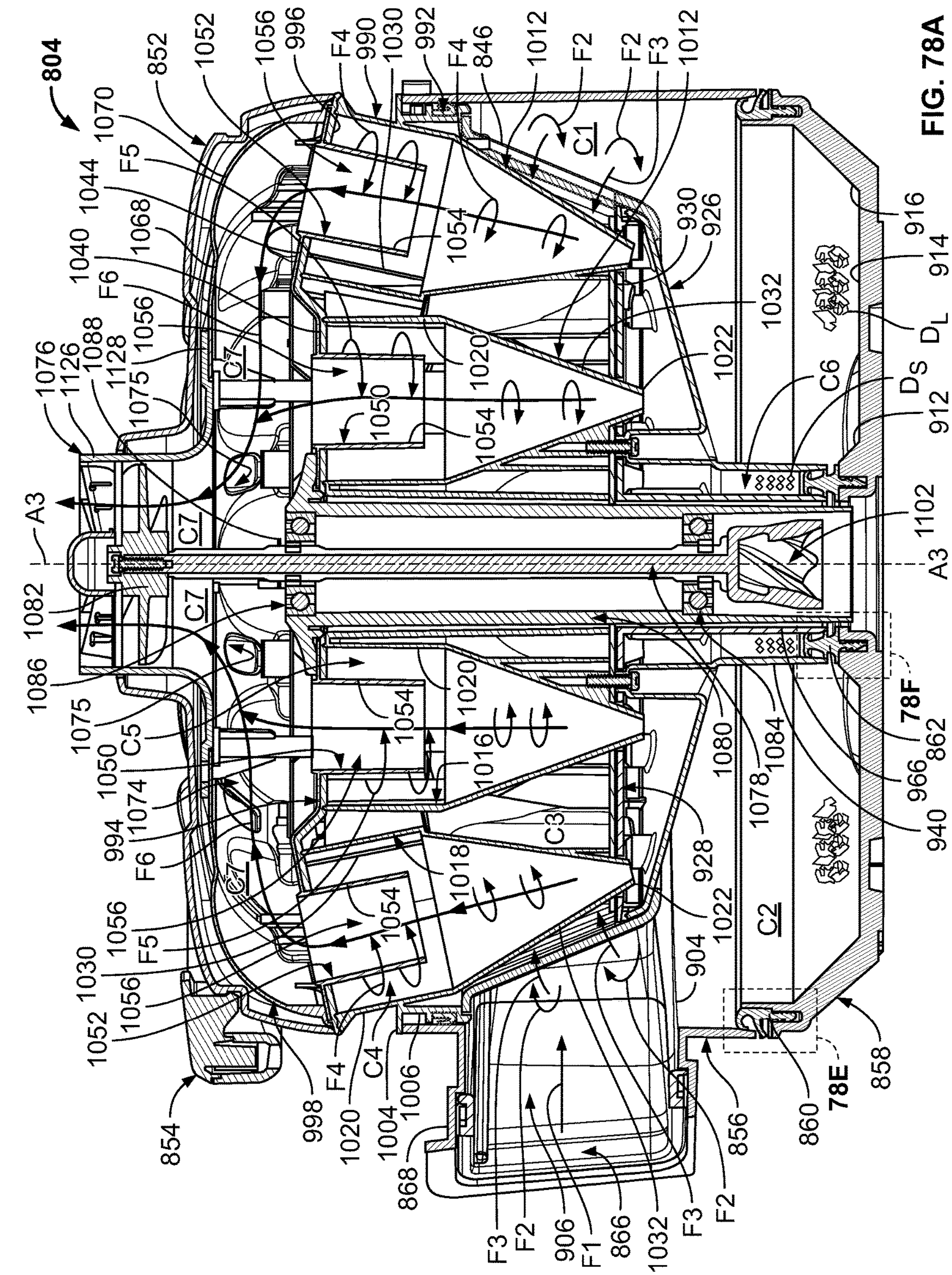
FIG. 78A is a sectional view of the third embodiment hydrocylonic particle separator assembly taken along line 78A-78A of FIG. 60.

Each of the frustoconical bottom portions 1032 can be configured and dimensioned to be partially received within the radially spaced openings 980, 986 of the fine debris container top 928 and the fine debris gasket 930 such that fine debris filtered by the cyclone containers 1012 falls through the debris underflow nozzle 1022 and into the fine debris container 926. Thus, the fine debris container top 928 maintains the debris underflow nozzles 1022 suspended over or spaced from the dish 932 of the fine debris container 928. Accordingly, debris falls out of the debris-laden water within each individual cyclone container 1012, e.g., due to contact with the wall of the cyclone container body 1024, and falls through the debris underflow nozzle 1022 and into the fine debris container 926. When assembled, as shown in FIG. 78A (discussed in greater detail below), the frustoconical bottom portions 1032 of the cyclone containers 1012 are positioned within and surrounded by the filter medium 846. Thus, the hydrocyclonic particle separator assembly 804 includes a dual cyclone system with the first cyclone occurring between the canister body 856 and the filter medium 846, and the second cyclones occurring in each of the cyclone containers 1012.

The cyclone block 990 additionally includes a plurality of bayonet-lock protrusions 1036 extending radially from the sidewall 1006. The bayonet-lock protrusions 1036 can be inserted into and twisted into engagement with the bayonet-lock recesses 911 of the canister body 856 in order to secure the cyclone block 990 to the canister body 856.

As referenced above, the cyclone block subassembly 848 includes a vortex finder ring 994 and a vortex finder ring gasket 996. The vortex finder ring 994 can be substantially similar in construction to the ring 410 illustrated in FIGS. 42 and 43 and described above. Additionally, the vortex finder ring gasket 996 can be substantially similar in construction to the vortex finder gasket 678 illustrated in FIG. 44 and described above. Specifically, the vortex finder ring 994 includes a ring body 1038 with a central portion 1040 with a polygonal perimeter 1042, and a plurality of perimeter flaps 1044 extending from the polygonal perimeter 1042. The central portion 1040 can be recessed relative to the perimeter flaps 1044, with respective angled wall sections 1046 connecting the central portion 1040 to the perimeter flaps 1044.

The ring body 1038 includes a central opening 1048, a first set of vortex finders 1050 radially disposed around the central opening 1048, and a second set of vortex finders 1052 radially disposed around the first set of vortex finders 1050. Each of the first set of vortex finders 1050 can extend substantially parallel to a central vertical axis. Each of the second set of vortex finders 1052 can be angled relative to the central vertical axis. In particular, the angle of the second set of vortex finders 1052 can be substantially equal to the angle of the cyclone containers 1012 of the second set of cyclone containers 1018. In some embodiments, the perimeter flaps 1044 can be hingedly connected to the angled wall sections 1046 such that the angle of each vortex finder 1052 can be individually adjusted relative to the central vertical axis. During assembly, the first set of vortex finders 1050 can be positioned at least partially into the cyclone containers 1012 of the first set of cyclone containers 1016, and the second set of vortex finders 1052 can be positioned at least partially into the cyclone containers 1012 of the second set of cyclone containers 1018.

Each of the vortex finders 1050, 1052 includes a cylindrical extension 1054, with the cylindrical extensions 1054 of the first set of vortex finders 1050 protruding downwardly from the central portion 1040 of the ring body 1038 and the cylindrical extensions 1054 of the second set of vortex finders 1052 protruding downwardly from the respective perimeter flap 1044. Each cylindrical extension 1054 includes a uniform channel 1056 passing therethrough. When the cylindrical extensions 1054 are positioned within the respective cyclone containers 1012, the vortex finders 1050, 1052 assist in generating a vortex within the cyclone containers 1012 such that debris of a second size (e.g., fine debris) hits the inner walls of the cyclone container 1012 and travels downwardly through the frustoconical bottom portion 1032, through the debris underflow nozzle 1022 and into the fine debris container 926.

The vortex finder gasket 996 can be substantially disc-shaped and includes a gasket body 1058. The gasket body 1058 includes a central opening 1060, a first set of openings 1062 radially disposed around the central opening 1060, and a second set of openings 1064 radially disposed around the first set of openings 1062. The positions of the first and second set of openings 1062, 1064 can correspond to the vortex finders 1050, 1052 of the vortex finder ring 994. During assembly, the respective vortex finders 1050, 1052 can be inserted through the openings 1062, 1064 such that the vortex finder gasket 996 is disposed against the bottom surface of the ring body 1038. The gasket body 1058 includes a plurality of curved protrusions 1066 adjacent to the second set of openings 1064 that substantially match the configuration of the perimeter flaps 1044 of the vortex finder ring 994. The curved protrusions 1066 define the perimeter edge of the vortex finder gasket 996.

The top cap 998 includes a top plate 1068 with a plurality of holes 1069 and rounded lobes 1070 extending from the perimeter of the top plate 1068, and an outlet 1072 at the center of the top plate 1068. The number of rounded lobes 1070 can equal the number of cyclone containers 1012 in the second set of cyclone containers 1018 and the number of vortex finders in the second set of vortex finders 1052. Each of the rounded lobes 1070 extends to the top plate 1068 and converge at a central cavity 1074 (see FIGS. 78A and 78C) within the top cap 998. The cavity 1074 is in fluidic communication with the outlet 1072 of the top cap 998. A guard 1076 (which can be a diffuser) of the impeller subassembly 850 can be positioned over the outlet 1072 and secured to the top plate 1068 of the top cap 998 to promote suction of fluid out of the cavity 1074. The top cap 998 can also include a plurality of bypass holes 1075 that extend through the top cap 998 and place the central cavity 1074 of the top cap 998 in fluidic communication with the exterior. The bypass holes 1075 allow for additional flow and therefore additional thrust if the filter medium 846 were to become clogged during a cleaning cycle, thus allowing the cleaner 800 to remain fully functional even if the filter medium 846 was clogged. For example, this allows the cleaner 800 to maintain suction, maintain/increase efficiency, reduce strain on the pump motor, and/or maintain operation. Additionally, the flow through the bypass holes 1075 reduces the overall hydraulic resistance through the cleaner 800 even when the filter medium 846 is clean and unclogged. Thus, the bypass holes 1075 provide for an additional flow through the cleaner 800 when the filter medium 846 is in both a clean and a dirty state. By increasing the flow rate, the pump motor that drives the impeller subassembly 850 does not need to be operated at full power at all times in order for the cleaner 800 to be effective. Instead, the pump motor can be operated at a lower power, but still maintain the required flow/downward force/thrust to effectively clean and climb pool walls, thus extending the operational range of the pump motor. As a result, the pump can be operated in a more efficient operation range, a reduced power consumption, and a with a reduced load on the power supply. This allows, among other things, the cleaner 800 to be effective at climbing a pool wall when in full cycle mode for an extended period of time. Additionally, the changes in pump motor current can be monitored to determine when the hydrocylonic particle separator assembly 804 is sufficiently loaded, and used to signal to a user that the hydrocylonic particle separator assembly 804 is full and needs to be emptied of debris. The cleaner 800 can also be operated in a "boost" mode whereby the pump motor is increased to full power, thus providing additional thrust, which can be used for maneuvering the cleaner 800 when it is stuck or upside down and unable to right itself. The bypass holes 1075 are generally located at a rear portion of the top cap 998 to prevent inflow of air when the pool cleaner 800 breaches a water line. For example, as the pool cleaner 800 climbs a pool wall it may breach the waterline, which would result in the inflow of air if the bypass holes 1075 were also to breach the waterline, e.g., if they were placed on the front of the top cap 998. If air were to be drawn into the cleaner 800 the pumping action through the cleaner 800 could lose prime, resulting in the pool cleaner 800 peeling off the pool wall, becoming unstable, becoming unpredictable, breaking from the cleaning path, or generally giving the impression of a non-intelligent or defective device.

When assembled, the top cap 998 is positioned over all of the vortex finders 1050, 1052 and the cyclone containers 1018 such that fluid can exit the cyclone containers 1018 through the respective vortex finder 1050, 1052, travel into the cavity 1074, out of the outlet 1072, and through the guard 1076. Thus, individual fluid cyclonic flows within the cyclone block 990 can merge within the cavity 1074 prior to being expelled from the outlet 1072. The top cap 998 can be secured to the guard 1076, which in turn can be secured to the cyclone block 990 by a plurality of screws or bolts.

Figure 72:
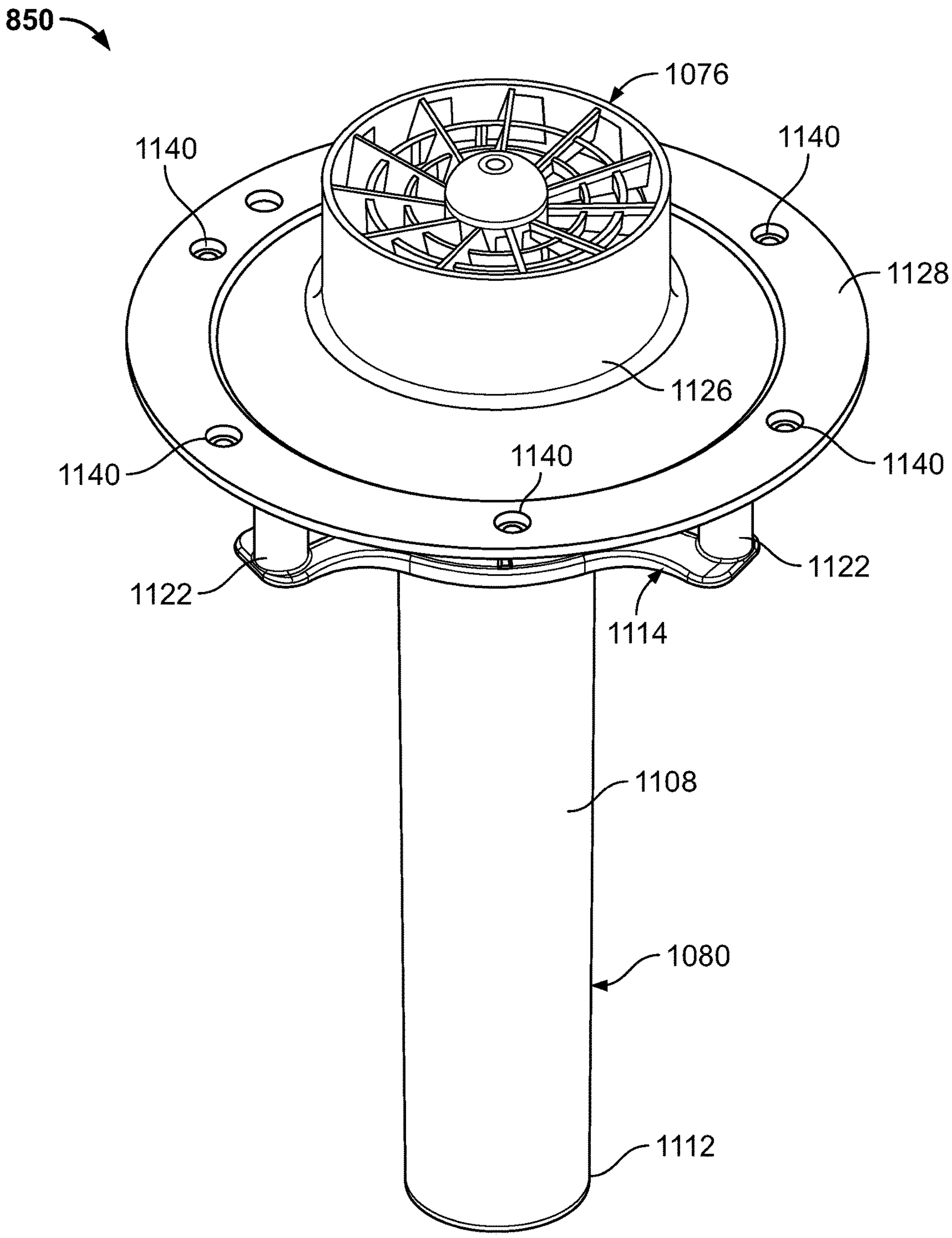
FIG. 72 is a perspective view of an impeller subassembly of the third embodiment hydrocylonic particle separator assembly of FIG. 58.
Figure 73:
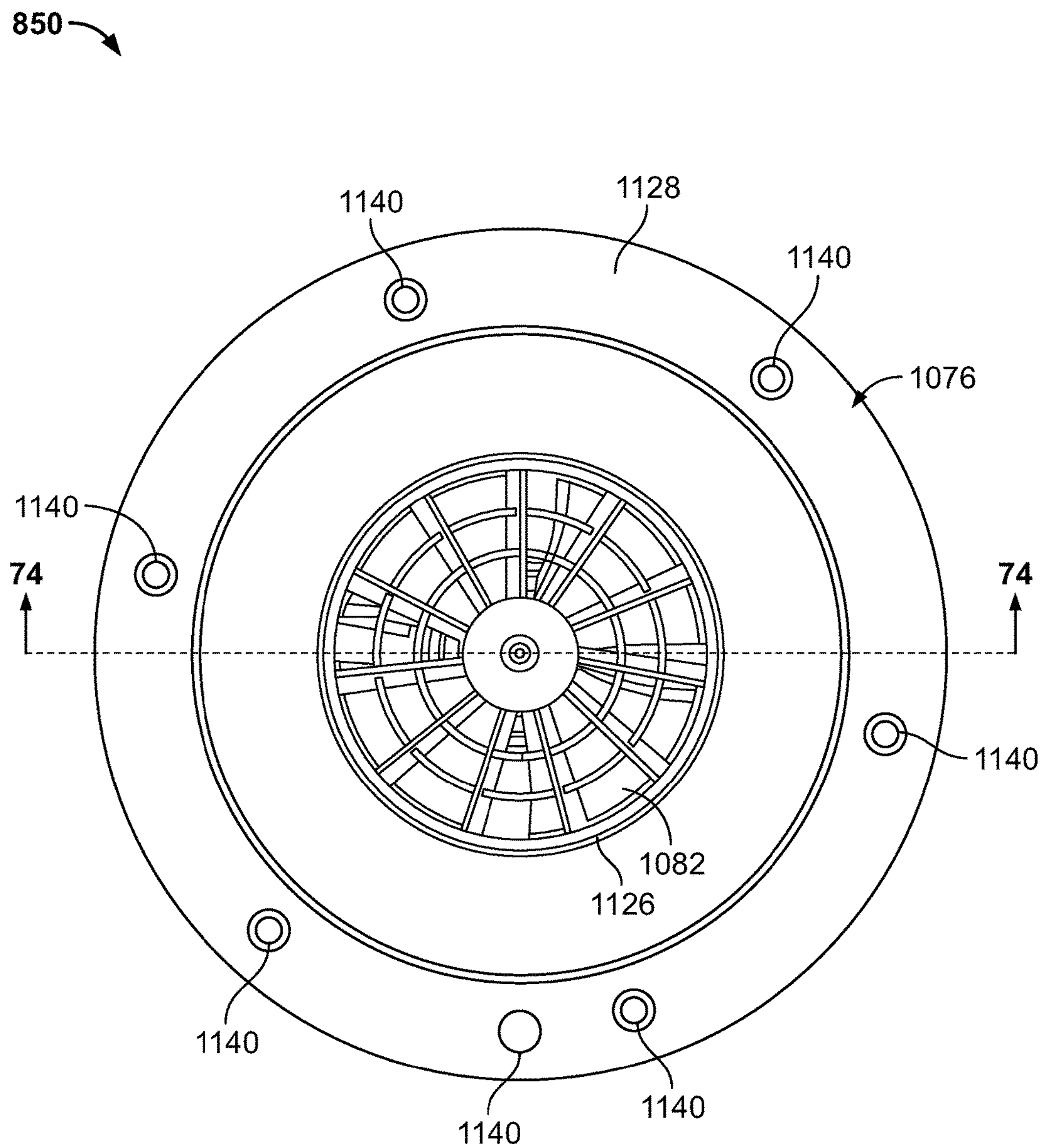
FIG. 73 is a top view of the impeller subassembly of FIG. 72.
Figure 74:
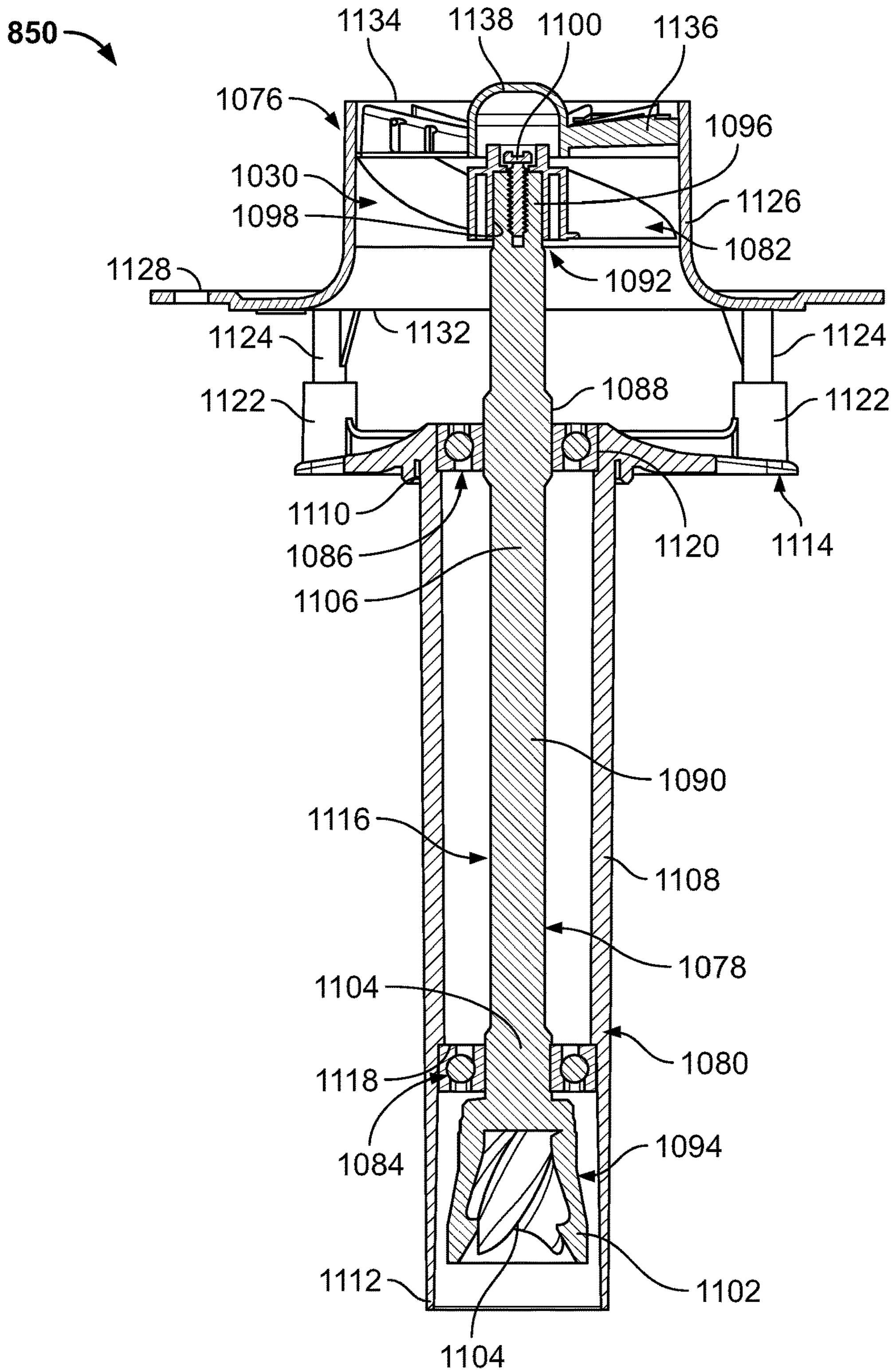
FIG. 74 is a sectional view of the impeller subassembly of FIGS. 72 and 73 taken along line 74-74 of FIG. 73.

As illustrated in FIG. 63, the impeller subassembly 850 includes shaft 1078, a sleeve 1080, an impeller 1082, first and second ball bearings 1084, 1086, a retention ring 1088, and the guard 1076. FIGS. 72 and 73 are, respectively, perspective and top views of the impeller subassembly 850, while FIG. 74 is a sectional view of the impeller subassembly 850 taken along line 74-74 of FIG. 73. The shaft 1078 includes a body 1090, a proximal end 1092 at a first end of the body 1090, and a distal end 1094 at an opposite second end of the body 1090. The proximal end 1092 can include a tip 1096 configured to mate with a complementary opening 1098 of the impeller 1082. Thus, rotation of the shaft 1078 simultaneously drives rotation of the impeller 1082. The tip 1096 allows the impeller 1082 to be removably attached to the shaft 1078 by any suitable fastener, e.g., a screw 1100. The distal end 1094 includes a female member 1102 that defines a keyed inner chamber 1104 configured to mate with a male member of a pump motor (e.g., a spline coupling, a lovejoy connector, or the like). The pump motor can thereby rotationally drive the shaft 1078 and thus the impeller 1082 through the female member 1102. The body 1090 of the shaft 1078 also includes first and second expanded sections 1104, 1106 that have a large diameter than the body 1090 and are configured to engage the first and second ball bearings 1084, 1086, respectively.

The sleeve 1080 includes a tubular body 1108 having a first end 1110 and a second end 1112, and a mounting plate 1114 extending radially from the first end 1110 of the tubular body 1108. The tubular body 1108 is generally hollow and defines an inner cavity 1116. The interior of the tubular body 1108 includes a lower shoulder 1118 and an upper shoulder 1120. The first and second ball bearings 1084, 1086 can be plastic ball bearings and are positioned within the inner cavity 1116 of the tubular body 1108 with the first ball bearing 1084 seated against the lower shoulder 1118 and the second ball bearing 1086 seating against the upper shoulder 1120. The lower and upper shoulders 1118, 1120 prevent the ball bearings 1084, 1086 from unwanted axial movement. Alternatively, the impeller subassembly 850 can include a single ball bearing. The mounting plate 1114 includes three radially spaced hollow mounting bosses 1122. The mounting bosses 1122 are configured to engage mounting protrusions 1124 of the guard 1076.

The guard 1076 includes a shroud 1126 and an annular flange 1128 extending radially from the shroud 1126. The plurality of mounting protrusion 1124 extend perpendicularly from the annular flange 1128 and are spaced and configured to engage the mounting bosses 1122 of the sleeve 1080, thus securing the guard 1076 and the sleeve 1080 together. The shroud 1126 generally defines an inner chamber 1030 that has a bottom opening 1132 (e.g., at the center of the annular flange 1128) and a top opening 1134 that are in fluidic communication. When the impeller subassembly 850 is fully assembled, the impeller 1082 is positioned within the inner chamber 1030 of the guard 1076. The top opening 1134 of the guard 1076 also includes a plurality of ribs 1136 and a central hub 1138 that prevent a user from inserting their fingers into the guard 1076 during operation. The ribs 1136 can be radial fins or guards, annular fins or guards, embossments, a screen, a mesh, etc. The guard 1076 also includes a plurality of holes 1140 in the annular flange 1128. A standard fastener, e.g., bolt or screw, can be inserted through the holes 1140 of the guard 1076 and the holes 1069 of the top cap 998 to secure the guard 1076 to the top cap 998 during installation.

Notably, the example impeller subassembly 850 is a singular unit that contains very few components and can be removed and replaced without disassembling the entire hydrocyclonic particle separator assembly 804. As shown in FIG. 74, when the impeller subassembly 850 is fully constructed, the impeller 1082 is radially spaced from the interior walls of the diffuser's 1076 shroud 1126 as well as axially spaced from the ribs 1136 of the guard 1076. This spacing can be, for example, 0.030 inches, which allows for the impeller subassembly 850 to maintain a clearance without the likelihood of interference. The reduced number of components that make up the impeller subassembly 850, e.g., the "stack-up" of the assembly, along with this spacing, decreases the likelihood of interference. In some embodiments, by lowering the number of components contributing to "stack-up," a manufacturing defect rate can be lowered and any variance between units can be more reliably accounted for.

To install the impeller subassembly 850, a user would take the fully assembled impeller assembly and insert the sleeve 1080 through the outlet 1072 of the top cap 998, the central opening 1048 of the vortex finder ring 994, the central opening 1060 of the vortex finder gasket 996, the central opening 1002 of the cyclone block 990, the central opening 984 of the fine debris gasket 930, the central opening 964 of the fine debris container top 928, and the central opening 864 of the large debris container 858. The user would then align the holes 1140 of the guard 1076 with holes 1069 of the top cap 998 and insert a fastener, e.g., a screw or a bolt, through the holes 1140, 1069 to secure the diffuser 1078 to the top cap 998 and thus securing the impeller subassembly 850 to the cyclone block subassembly 848. When the impeller subassembly 850 is engaged with the cyclone block subassembly 848, the mounting plate 1114 of the sleeve 1080 rests against and engages the central portion 1040 of the vortex finder ring 994. Furthermore, when the hydrocyclonic particle separator assembly 804 is placed on a cleaner body 802, a male member of the pump motor can pass through the second end 1112 of the sleeve 1080 to engage the female member 1102 to rotate the shaft 1078 and thus the impeller 1082 within the hydrocyclonic particle separator assembly 804.

Additionally, the second end 1112 of the sleeve 1080 can also function as the initial impact/engagement point with the pump motor which can have a tapered edge itself. That is, when the hydrocyclonic particle separator assembly 804 is positioned on a cleaner body 802, the second end 1112 of the sleeve 1080 can engage the tapered edge of the pump motor prior to the male member of the drive motor engaging the female member 1102 of the shaft 1078 in order to center the shaft 1078 of the pump motor male member before being locked into place, which maintains the shaft 1078 and pump motor male member in alignment without using the shaft 1078 itself for the alignment. Thus, in some embodiments, the sleeve 1080 can absorb any shock or loading forces from installation of the hydrocyclonic particle separator assembly 804, e.g., if it were to be dropped or misaligned by a user during installation. This eliminates force loading of the shaft 1078 that would have been subsequently transferred to the bearings 1084, 1086 and potentially caused them to prematurely fail. Furthermore, the shaft 1078 of the impeller subassembly 850 is capable of sliding along its central axis within the bearings 1084, 1086 and the sleeve 1080 when it is installed. For example, if the hydrocyclonic particle separator assembly 804 were to be dropped onto the pool cleaner body 802 during installation, the pump motor male member may forcefully contact the female member 1102 of the shaft 1078, causing the shaft 1078 to slide toward the first end 1110 of the sleeve 1080. By configuring the impeller subassembly 850 in such a way that the shaft 1078 can slide axially, the shaft 1078 and the impeller 1082 will transfer the force to the bottom of the guard 1076 and together are capable of absorbing a portion of the force instead of transferring the force to the bearings 1084, 1086, which if done could cause the bearings 1084, 1086 to prematurely fail. The retention ring 1088 prevents the shaft 1078 from sliding too far in the direction toward the second end 1112 of the sleeve 1080. Additionally and/or alternatively, the hydrocyclonic particle separator assembly 804 or the pool cleaner body 802 can be equipped with leaf springs, dampeners, or skid plates to control the rate of insertion of the hydrocyclonic particle separator assembly 804 on to the pool cleaner body 802.

The beauty cap 852 is a removable skin that allows a user to customize their pool cleaner 800, and specifically their hydrocyclonic particle separator assembly 804, as well as provide additional functionality. The beauty cap 852 includes a body 1142 with a plurality of rounded lobes 1144 extending about the perimeter of the body 1142 and a top opening 1146. The shape and configuration of the body 1142 and rounded lobes 1144 of the beauty cap 852 are in substantial alignment with the shape and configuration of the rounded lobes 1070 and top plate 1068 of the top cap 998. Particularly, the beauty cap 852 is placed over the guard 1076 and the top cap 998 and secured to the top cap 998 with the guard 1076 extending through the top opening 1146. The beauty cap 852 can additionally include notches 1148 for engaging a portion of the handle 854, which is discussed in greater detail below. Additionally, the beauty cap 852 includes channels 1150 that allow water to flow to the interior and provide water to the bypass holes 1075 of the top cap 998.

Figure 75A:
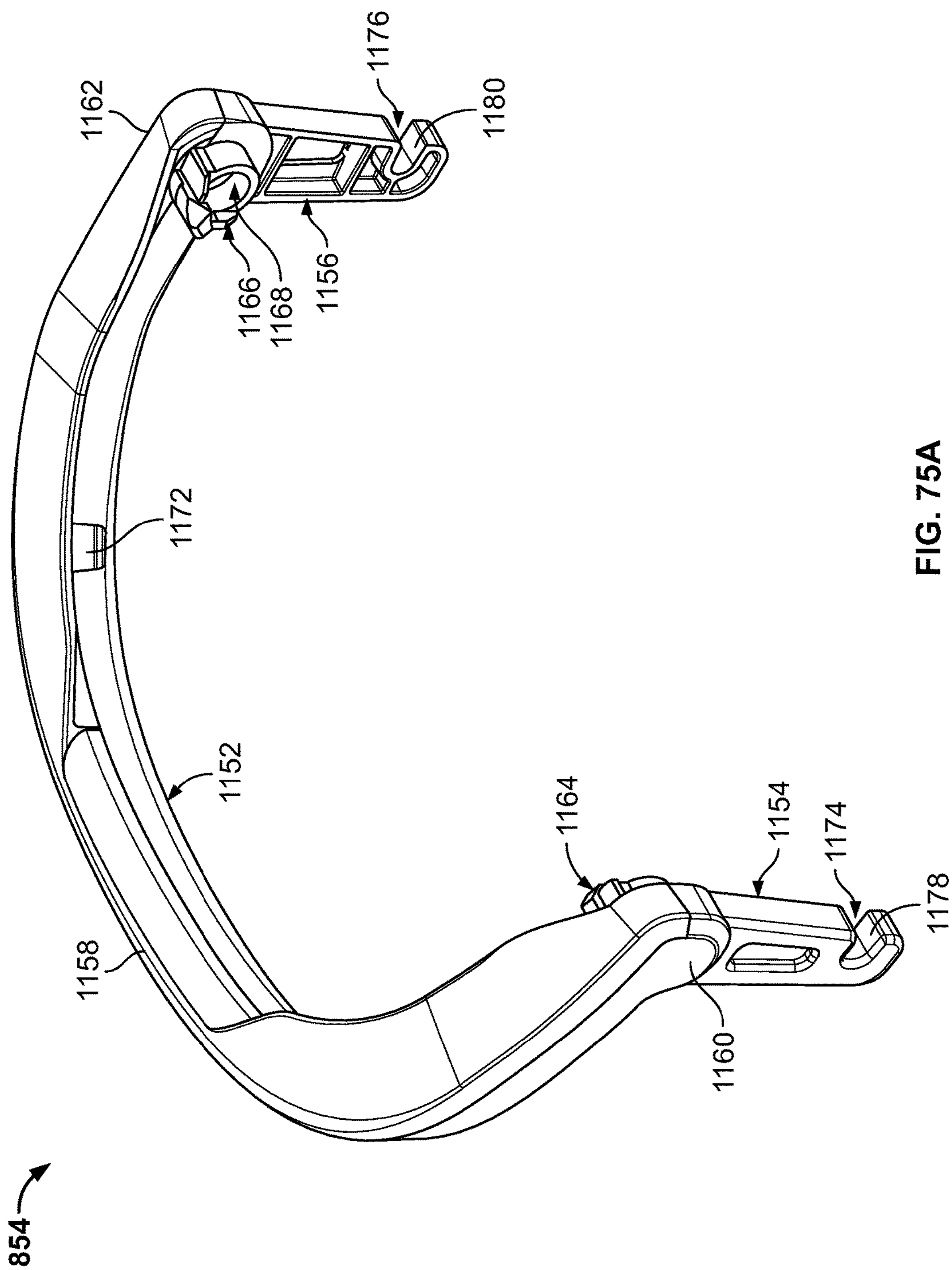
FIG. 75A is a perspective view of the handle of the third embodiment hydrocylonic particle separator assembly.
Figure 76:
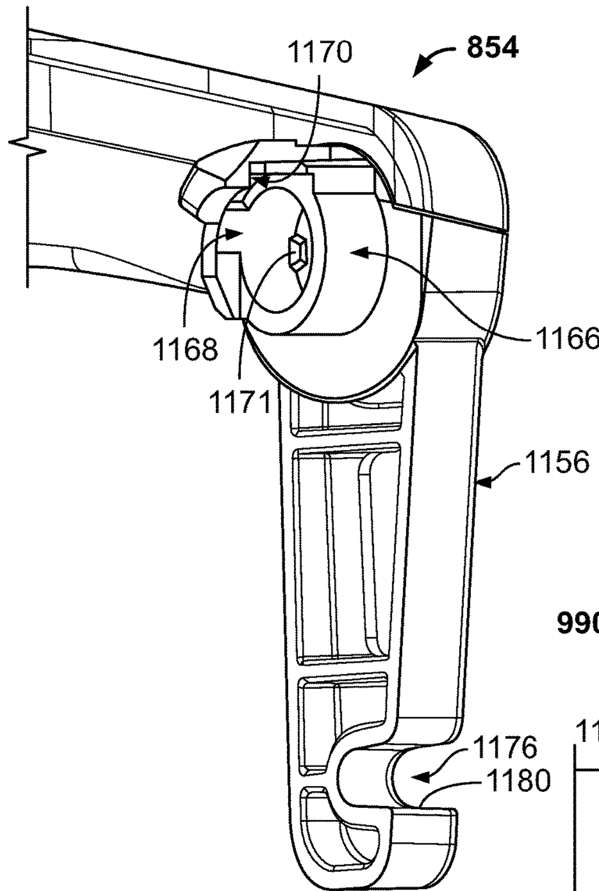
FIG. 76 is an enlarged partial perspective view showing aspects of the handle of FIGS. 75A and 75B.
Figure 77:
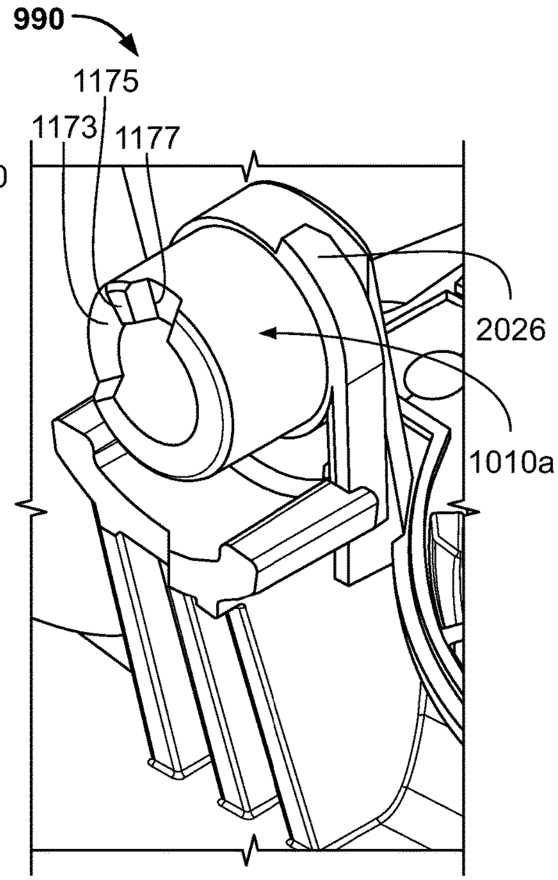
FIG. 77 is an enlarged view of Area 77 of FIG. 69 showing a handle engagement tab in greater detail.

FIGS. 75A and 7B are perspective and front views of the handle 854, respectively. The handle 854 includes a curved body 1152, a first locking hook 1154, and a second locking hook 1156. The body 1152 includes a user-engageable frame 1158 extending between a first end 1160 and a second end 1162. The first and second ends 1158, 1160 each include a respective mounting boss 1164, 1166 that extends inwardly from the frame 1158. The mounting bosses 1164, 1166 are sized and configured to engage the handle engagement tabs 1010*a*, 1010*b* of the cyclone block 990 in order to secure the handle 854 to the cyclone block 990. FIG. 76 is a bottom perspective view of the mounting boss 1166. It should be understood by a person of ordinary skill in the art the a description of mounting boss 1166 holds true for the other mounting boss 1166 and that the mounting bosses 1166 are substantially identical in construction. As shown in FIG. 76, the mounting boss 1166 is generally tubular in shape and defines an interior cavity 1168 that is sized and configured to receive a portion of the handle engagement tab 1010*b* of the cyclone block 990 (see FIG. 69) such that the mounting boss 1166 can rotate about the handle engagement tab 1010*b*. The mounting boss 1166 additional includes a channel 1170 that extends partially around the perimeter of the mounting boss 1166. The channel 1170 is configured to receive a portion of the handle engagement tab 1010*b* in order to prevent the handle 854 from pulling away from the cyclone block 990 when the hydrocyclonic particle separator assembly 804 is carried by the handle 854. Engagement of these components is discussed in greater detail in connection with FIG. 81. Additionally, the interior cavity 1168 includes a protrusion 1171 that is configured to engage the handle engagement tabs 1010*a*, 1010*b*. Specifically, FIG. 77 is an enlarged view of the handle engagement tab 1010*a* of Area 77 of FIG. 69. As illustrated in FIG. 77, the handle engagement tab 1010*a* includes a first detent 1173, an angled protrusion 1175, and a second detent 1177. The protrusion 1171 is configured to be seated in the first detent 1173 when the handle 854 is in a "down" position. When the protrusion 1171 is seated in the first detent 1173, the handle 854 is prevented from inadvertently rotating into an "up" position. For example, when the pool cleaner 800 is in water, the handle 854 may have a tendency to rise due to buoyant forces and rotate into the "up" position. This is prevented by the protrusion 1171 being seated in the first detent 1173 and through engagement of the protrusion 1171 with the angled protrusion 1175. However, a user can rotate the handle 854 into the "up" position causing the protrusion 1171 to traverse the first detent 1173 and engage the angled protrusion 1175. As the user continues to rotate the handle 854 into the "up" position, the protrusion 1171 will further engage the angled protrusion 1175, causing the mounting bosses 1164, 1166 to be pushed outward. Continued rotation of the handle 854 will cause the protrusion 1171 to overcome and be forced past the angled protrusion 1175 and into the second detent 1177 where it will be seated. When the protrusion 1171 is seated in the second detent 1177, the handle 854 is maintained in an "up" position and prevented from inadvertently falling into the "down" position from the "up" position. For example, when the handle 854 is secured in the "up" position a user can place the hydrocyclonic particle separator assembly 804 on the ground and the handle 854 will stay in the "up" position. It should be understood that the above description holds true for both handle engagement tabs 1010*a*, 1010*b*.

The frame 1158 also includes a plurality of locking tabs 1172 on an interior portion thereof. The locking tabs 1172 are sized and configured to releasably engage the notches 1148 of the beauty cap 852 in order to lock the handle 854 in a closed position. The first and second locking hooks 1154, 1156 extend generally perpendicularly and downward from the first and second ends 1160, 1162 of the frame 1158, respectively. The first and second locking hooks 1154, 1156 are generally elongate structures that each include a recess 1174, 1176 at the end that forms an engagement surface 1178, 1180. Each recess 1174, 1176 of the first and second locking hooks 1154, 1156 is configured to receive one of the catches 838 of the pool cleaner body 802 in order to interconnect the hydrocyclonic particle separator assembly 804 with the pool cleaner body 802. Interaction of the first and second locking hooks 1154, 1156 with the structural locking hooks 868 is discussed in greater detail in connection with FIG. 79.

Figure 60A:
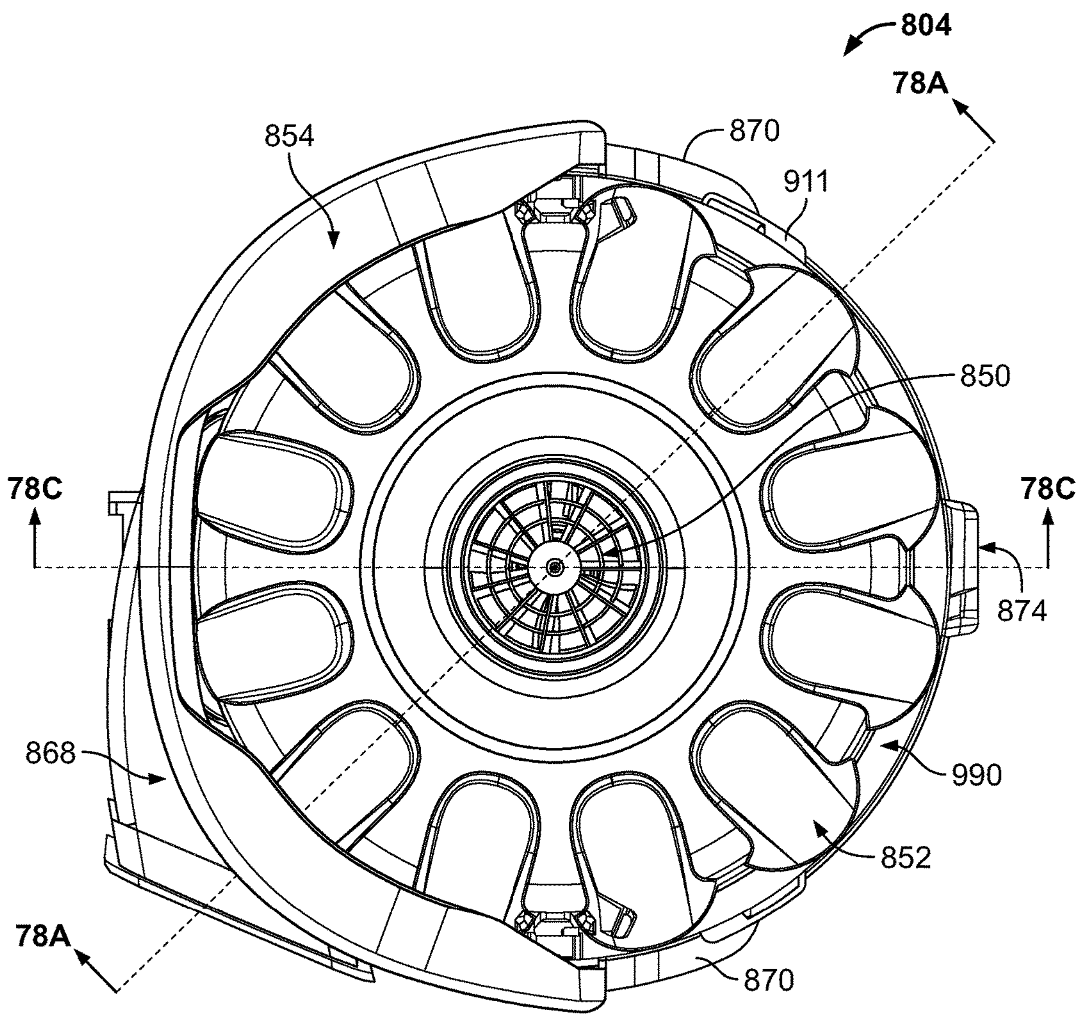
FIG. 60A is a top view of the third embodiment hydrocylonic particle separator assembly of FIG. 58 with the handle in a down position.
Figure 78B:
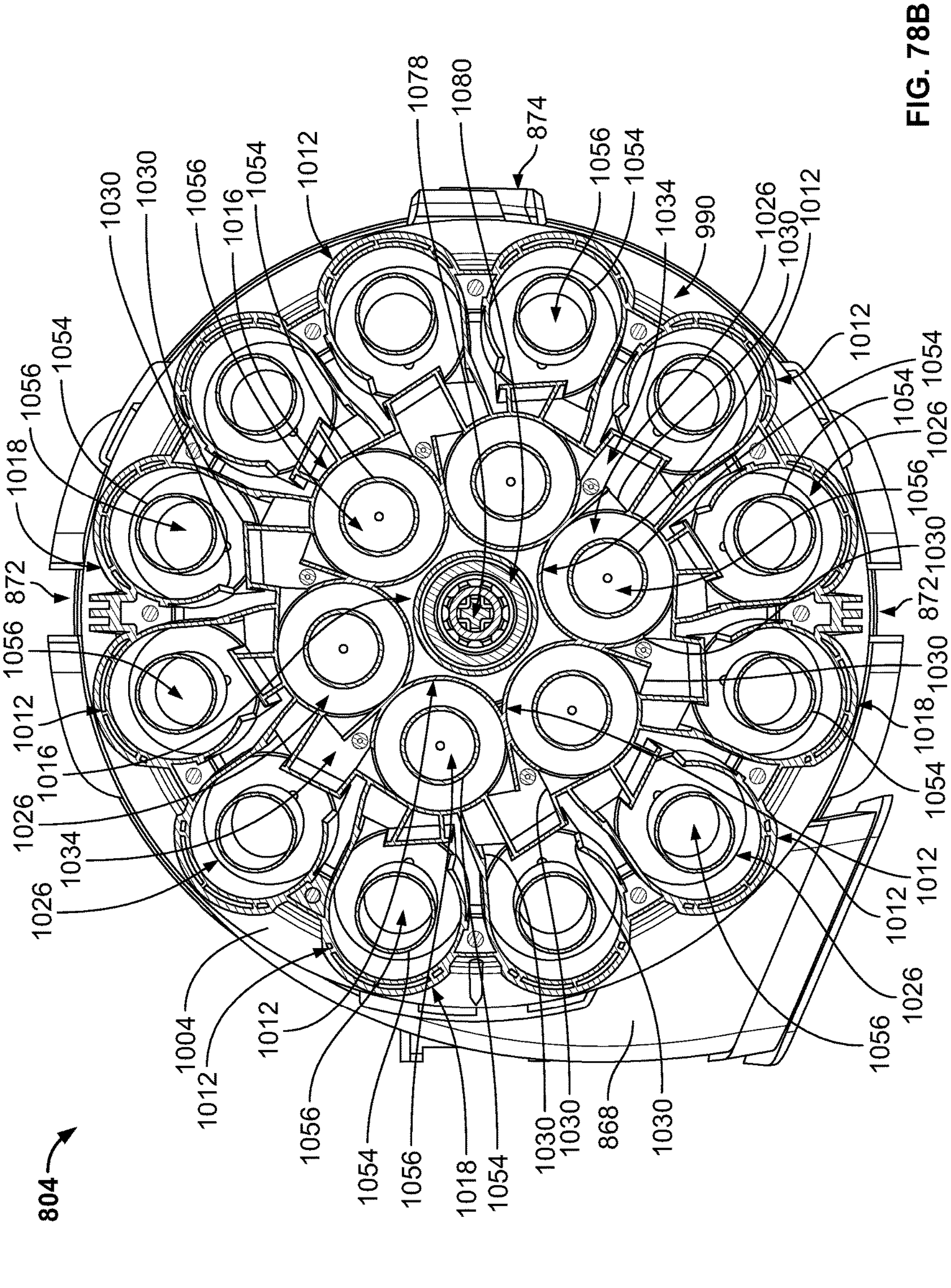
FIG. 78B is a sectional view of the third embodiment hydrocylonic particle separator assembly taken along line 78B-78B of FIG. 61.

When the hydrocyclonic particle separator assembly 804 is fully assembled and attached to the pool cleaner body 802, a plurality of different chambers and flow paths are formed. FIGS. 78A-78F are sectional views of the hydrocyclonic particle separator assembly 804. FIG. 78A is a sectional view of the hydrocyclonic particle separator assembly 804 taken along line 78A-78A of FIG. 60 showing, among other things, reference numbers for the chambers and flow paths within the pool cleaner. FIG. 78B is a sectional view of the hydrocyclonic particle separator assembly 804 taken along line 78B-78B of FIG. 61 showing various elements of the hydrocyclonic particle separator assembly 804.

A first chamber C1 is generally formed at the interior of the canister body 856 and as a portion of the inner chamber 896 of the canister body 856. The first chamber C1 is generally delineated as being between the inside of the canister body 856, the outside of the filter medium 846, and the outside of the fine debris container 926. The first chamber C1 receives debris-laden water having large and small debris contained therein. Flow of the debris-laden water within the first chamber C1 is discussed in greater detail below. A second chamber C2 is generally formed at the interior of the large debris container 858. The second chamber C2 receives and retains large debris filtered from the water. The third chamber C3 is generally formed between the outer surfaces of the cyclone containers 1012 of the cyclone block 990, and is generally delineated as being between the inside of the filter medium 846, the outer surfaces of the cyclone containers 1012, the ring body 1038 of the vortex finder ring 994, and the fine debris container top 928. The third chamber C3 receives once-filtered debris-laden water from the first chamber C1, e.g., water that has small debris contained therein with the large debris filtered out and retained in the second chamber C2.

Fourth and fifth chambers C4, C5 are generally formed within each of the cyclone containers 1012 of the first and second set of cyclone containers 1016, 1018. In particular, the fourth chamber C4 is formed within the cyclone containers 1012 of the second set of cyclone containers 1016 and the fifth chamber C5 is formed within the cyclone containers 1012 of the first set of cyclone containers 1018. As will be discussed in greater detail below, once-filtered debris-laden water can enter the fourth and fifth chambers C4, C5 substantially simultaneously. The fourth and fifth chambers C4, C5 are generally delineated as being within the cyclone chambers 1026 of the cyclone containers 1012 between the interior of a cyclone container 1012 and a vortex finder of the first and second sets of vortex finders 1050, 1052. The fourth and fifth chambers C4, C5 receive the once-filtered debris-laden water from the third chamber C3.

A sixth chamber C6 is generally formed at the interior of the fine debris container 926, and is generally delineated as being between the central tubular extension 940 of the fine debris container 926, the central tubular extension 966 of the fine debris container top 928, and the second gasket 862. The sixth chamber C6 is a static flow area that receives small debris that is separated out from the once-filtered debris-laden water that passes through the fourth and fifth chambers C4, C5. The once-filtered debris-laden water is filtered a second time in the fourth and fifth chambers C4, C5, where small debris "falls out" from the water and passes through the debris underflow nozzles 1022 of each respective individual cyclone container 1012 and into the sixth chamber C6.

The seventh chamber C7 extends from the uniform channel 1056 of each cylindrical extension 1054 of the first and second sets of vortex finders 1050, 1052 to the to opening 1134 of the guard 1076. The seventh chamber C7 is generally delineated by the interior of the plurality of cylindrical extensions 1054 of the first and second sets of vortex finders 1050, 1052, the interior chamber of each rounded lobe 1070, the ring body 1038, the mounting plate 1114 of the sleeve 1080, and the guard 1076. Accordingly, the seventh chamber C7 is a lobed chamber that originates at the channel 1056 of each cylindrical extension 1054 and extends to the opening 1134 of the guard 1076, with the impeller 1082, ribs 1136, and central hub 1138 being positioned in the seventh chamber C7. The seventh chamber C7 receives the twice-filtered water, e.g., water having minimal debris therein, from the fourth and fifth chambers C4, C5, and expels the filtered water from the opening 1134.

Turning now to a description of the flow paths through the hydrocyclonic particle separator assembly 804, FIG. 78A is a sectional view of the hydrocyclonic particle separator assembly 804 that illustrates the flow paths therethrough. Although not shown in FIG. 78A, it should be understood that the flow path within the inlet bottom 822 of the pool cleaner 800 leading to the hydrocyclonic particle separator 804 is substantially similar to the flow paths shown in FIG. 10C. Thus, a first flow path F1 extends from the inlet bottom 822, out of the inlet top 816, into the inlet 868 of the canister body 856, across the canister intake channel 906, and out of the tangential outlet 904 where the fluid enters the canister body 856. Water flowing through the first flow path F1 is unfiltered water that is laden with large and small debris $D_L$, $D_S$.

The second flow path F2 starts at the end of the first flow path F1, e.g., at the tangential outlet 904, entering the cyclone chamber 1026 of the canister body 856 at the tangential outlet 904. The second flow path F2 enters the cyclone chamber 1026 at a tangent to the canister body 856, the cyclone chamber 1026, and the first chamber C1 and is directed to flow between the inner wall of the canister body 856 and the filter medium 846. The tangential entrance of the second flow path F2 results in the generation of a cyclonic/rotational flow within the first chamber C1 that circles about a central axis A2 of the hydrocyclonic particle separator assembly 804. The cyclonic flow of the second flow path F2 within the first chamber C1 results in large debris particles $D_L$, e.g., debris having an aggregate size (e.g., each dimension) of up to about 1.25 inches, for example, such as, sticks, leaves, grass, coarse sand, fine sand, stones, pebbles, insects, small animals, etc., striking the interior surface of the canister body 856 and the filter medium 846 and losing velocity, resulting in the large debris particles $D_L$ falling to the bottom of the canister body 856 and into the large debris container 858 (e.g., the second chamber C2) where they are collected and stored until the hydrocyclonic particle separator assembly 904 is removed from the pool cleaner and emptied.

A third flow path F3 extends radially inward from the second flow path F2, flowing across the filter medium 846 into the third chamber C3. Fluid and smaller debris $D_S$ are contained in the third flow path F3, but the larger debris $D_L$ has been separated out. Accordingly, the fluid in the third flow path F3 is once-filtered fluid. The third flow path F3 enters the third chamber C3 around the outer surface of the frustoconical bottom portions 1032 of the cyclone containers 1012 and rises upward in the direction of the cylindrical top portions 1020 of the cyclone containers 1012. As the fluid of the third flow path F3 reaches the tangential inlet 1030 of each of the cyclone containers 1012, the third flow path F3 connects with fourth and fifth flow paths F4, F5. In particular, the third flow path F3 enters each of the cyclone containers 1012 of the first and second set of cyclone containers 1016, 1018 substantially simultaneously as fluid rises to the level of the tangential inlets 1030.

The fourth flow path F4 enters each individual cyclone container 1012 of the second set of cyclone containers 1018 at the respective tangential inlet 1030 where it proceeds to the respective cyclone chamber 1026, e.g., the fourth chamber C4. Substantially simultaneously to the fourth flow path F4 entering the cyclone containers 1012 of the second set of cyclone containers 1018, the fifth flow path F5 enters each individual cyclone container 1012 of the first set of cyclone containers 1016 at the respective tangential inlet 1030 where it proceeds to the respective cyclone chamber 1026, e.g., the fifth chamber C5. The placement of the individual cyclone container's tangential inlet 1030, e.g., at a tangent to the respective cyclone chamber 1026, results in the fourth and fifth flow paths F4, F5 being a cyclonic/rotational flow within each cyclone chamber 1026. The fourth and fifth flow paths F4, F5 rotate within each individual cyclone container 1012 of the respective second and first set of cyclone containers 1016, 1018 to separate smaller debris $D_S$, e.g., debris having an aggregate size (e.g., each dimension) of up to about 0.080 inches, for example, such as, coarse sand, fine sand, silt, dirt, insects, etc., based on the ratio of the smaller debris' $D_S$ centripetal force to fluid resistance from the fluid stream of the fourth and fifth flow paths F4, F5. More specifically, the fourth and fifth flow paths F4, F5 travel along the interior wall of the respective cyclone container 1012, travels downward along the cyclone container 1012 through the frustoconical bottom portion 1032 where the cyclone container 1012 tapers, and toward the debris underflow nozzle 1022.

As the fourth and fifth flow paths F4, F5 travel along the frustoconical bottom portion 1032, the rotational radius of the fourth and fifth flow paths F4, F5 is reduced. As the rotational radius of the fourth and fifth flow paths F4, F5 is reduced, the larger and denser particles of the smaller debris particles $D_S$ within the fourth and fifth flow paths F4, F5 have too much inertia to follow the continually reducing rotational radius of the fourth and fifth flow paths F4, F5 causing the smaller debris particles $D_S$ to contact the inner surface of the cyclone container 1012 and fall to the bottom where the small debris particles $D_S$ fall through the respective debris underflow nozzles 1022 and onto the tapered fine debris container 926. The tapered configuration of the fine debris container 926 causes the small debris particles $D_S$ to slide downward and into the sixth chamber C6 where the small debris particles $D_S$ are collected and stored by the fine debris container 926 until the hydrocyclonic particle separator assembly 804 is removed from the pool cleaner and emptied. Thus, the small debris particles $D_S$ separated from the water in both the first and second set of cyclone containers 1016, 1018 is collected in the same fine debris container 926 until the pool cleaner is emptied.

The result of the above description is that smaller and smaller debris is separated from the fluid flowing in the fourth and fifth flow paths F4, F5 as these flow paths proceed down the frustoconical bottom portions 1032 of the respective cyclone containers 1012 forming an inner vortex. Additionally, as the fluid within the fourth and fifth flow paths F4, F5 reaches the bottom of the frustoconical bottom portions 1032 and the inner vortex, it slows down and the rotation of the vortex flow is reversed, e.g., from a counter-clockwise flow on the outside to a clockwise flow on the inside, causing the fluid therein to be pulled upward (e.g., in a clockwise flow) through the respective cylindrical extensions 1054 of the first and second sets of vortex finders 1050, 1052 as twice-filtered fluid. The twice-filtered fluid enters the seventh chamber C7 where it merges with the sixth flow path F6.

The sixth flow path F6 connects with the fourth and fifth flow paths F4, F5 at the top of the channel 1056 of each vortex finder cylindrical extension 1054 where twice-filtered water enters the seventh chamber C7. The sixth flow path F6 extends from the channel 1056 of each cylindrical extension 1054, across each rounded lobe 1070 of the top cap 998, and through the guard 1076 to exit the hydrocyclonic particle separator assembly 804. That is, the sixth flow path F6 completely traverses the seventh chamber C7.

Accordingly, the larger cyclonic/rotational flow travels about the central axis A3, while the smaller cyclonic/rotational flows are formed and flow about the secondary central axes of the individual cyclone containers 1012 of the cyclone block 990, resulting in a plurality of smaller cyclonic/rotational flows within a larger cyclonic/rotational flow. In particular, the hydrocyclonic particle separator assembly 804 includes three levels of cyclonic/rotational flow—around the filter medium 846, within the second set of cyclone containers 1016, and within the first set of cyclone containers 1018.

As such, debris-laden fluid flowing through the pool cleaner is filtered twice by particle separation due to the generated cyclones. Utilizing the cyclonic flows within the pool cleaner to separate the particles and drop the particles out of the flow path results in the retention of suction performance throughout the cleaner, as, in preferred embodiments, there is minimized opportunity (if any) for the smaller debris particles to clog the filtering elements. This allows for optimum fluid flow performance through entire cleaning cycles, longer cleaner run times between debris removal, and the collection of more debris before needing to empty the hydrocyclonic particle separator assembly 804. As is known in the art, the outward flow of clean fluid results in an opposing force, which, as is also known in the art, can be relied upon in navigation of the pool cleaner for the purpose of forcing a pool cleaner downward against the floor when the pool cleaner is traversing the floor and sideways against a wall, when the pool cleaner is traversing a wall of the pool.

Figure 78C:
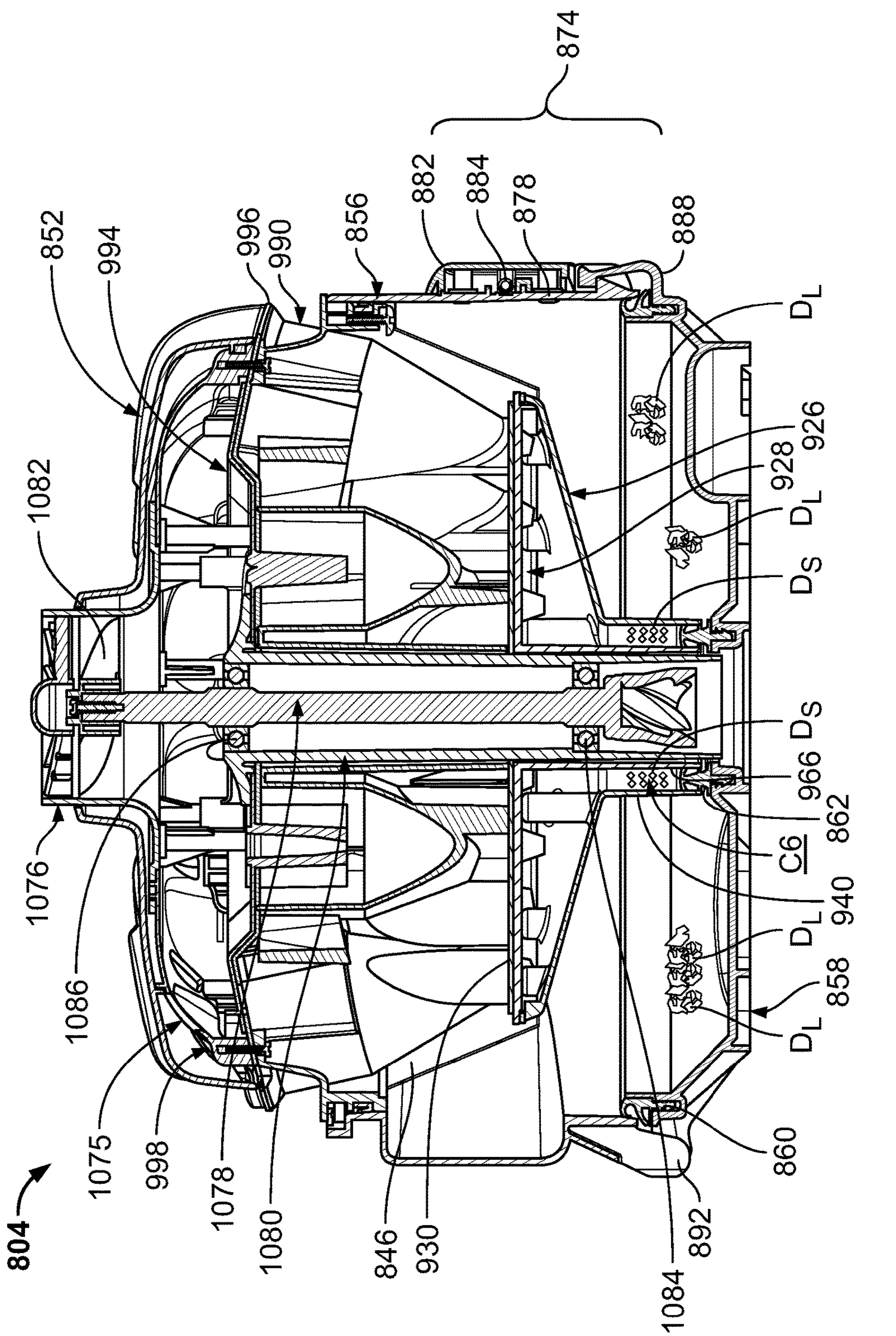
FIG. 78C is a sectional view of the third embodiment hydrocylonic particle separator assembly taken along line 78C-78C of FIG. 60 with the hydrocylonic particle separator assembly in a closed position.
Figure 78D:
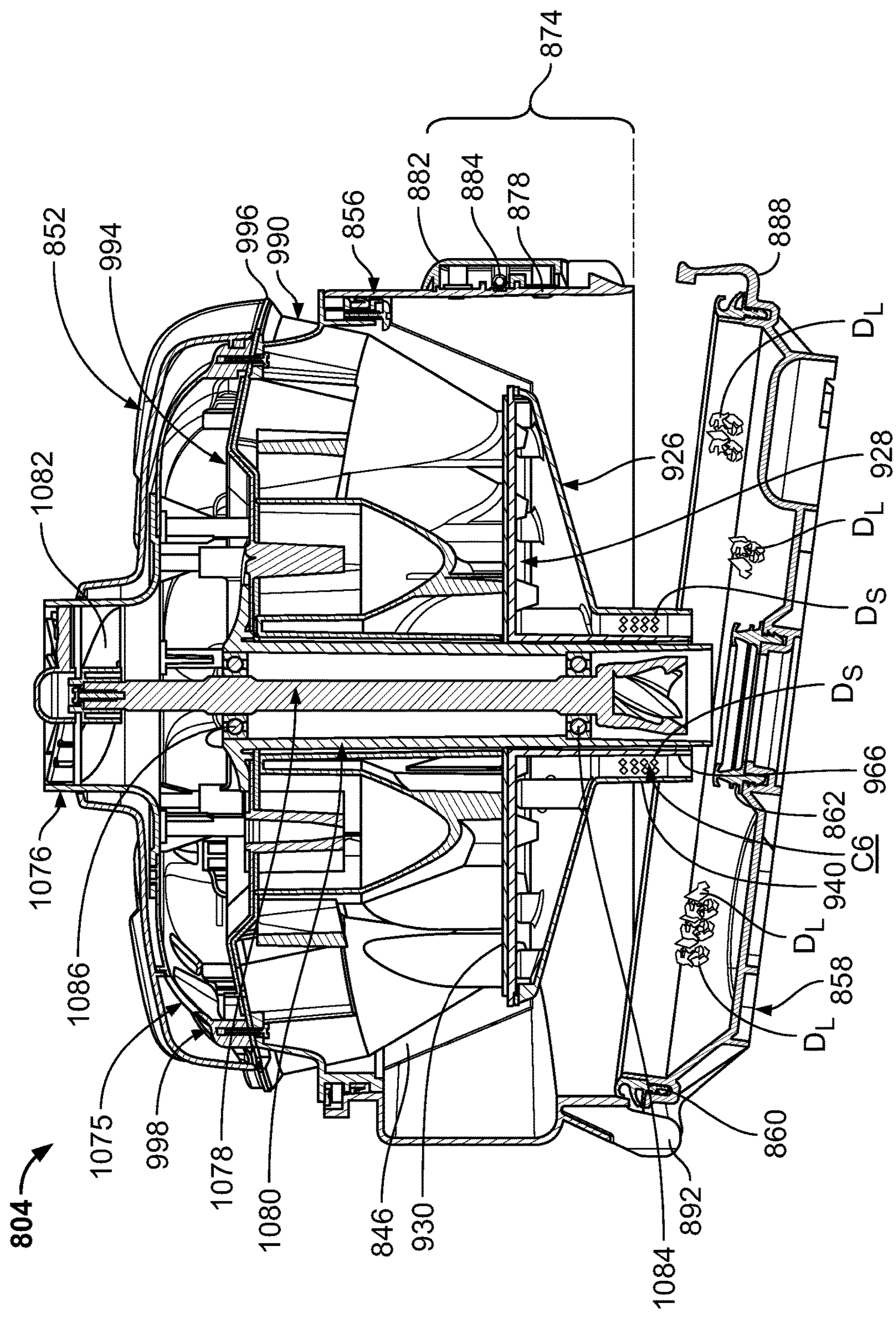
FIG. 78D is a sectional view of the third embodiment hydrocylonic particle separator assembly taken along line 78C-78C of FIG. 60 with the hydrocylonic particle separator assembly in an open position.

FIG. 78C is a sectional view of the hydrocyclonic particle separator assembly 804 taken along line 78C-78C of FIG. 60, showing the hydrocyclonic particle separator assembly 804 closed. As shown in FIG. 78C large debris $D_L$ is collected in the large debris container 858 while small debris $D_S$ is collected in the fine debris container 926 in the sixth chamber C6, as described above. Particularly, small debris $D_S$ is collected between the central tubular extension 940 of the fine debris container 926, the central tubular extension 966 of the fine debris container top 928, and the second gasket 862. FIG. 78D is a sectional view of the hydrocyclonic particle separator assembly 804 of FIG. 78C with the large debris container 858 in an open position. When in the open position, the extension 888 of the large debris container 858 has been disengaged from the locking assembly 874 thus causing the large debris container 858 to rotate about the hinge 892. When in the open position, the large debris $D_L$ can fall out from the large debris container 858, and the small debris $D_S$ can fall out from the sixth chamber C6, as illustrated.

Figure 78E:
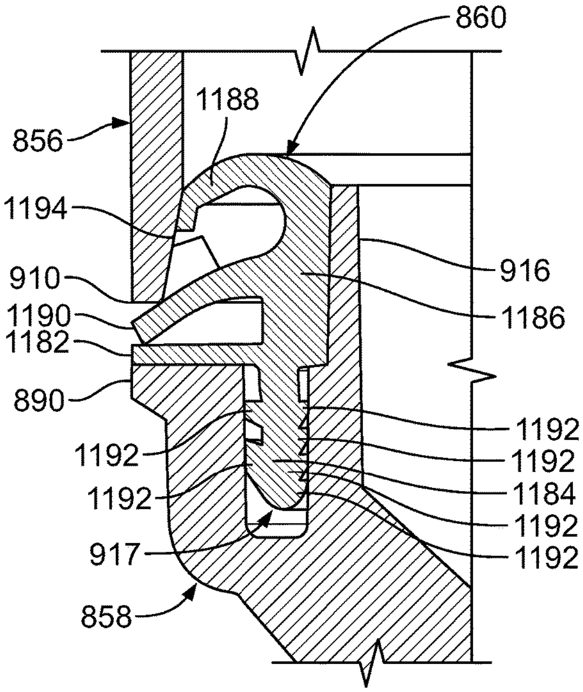
FIG. 78E is an enlarged view of Area 78E of FIG. 78A.

FIG. 78E is an enlarged view of Area 78E identified in FIG. 78A and showing engagement of the first gasket 860 with the canister body 856 and the large debris container 858 when the canister body 856 and the large debris container 858 are engaged, e.g., when the hydrocyclonic particle separator assembly 804 is in a closed configuration. The first gasket 860 separates the perimeter of the bottom edge opening 910 of the canister body 856 from the annular top portion 916 and upper portion 890 of the large debris container 858. The first gasket 860 defines a cross-section that includes a radial body 1182, a bottom toothed portion 1184 extending downwardly from the radial body 1182, a vertical extension 1186 extending upwardly from the radial body 1182, and first and second curved extensions 1188, 1190 that curve radially outward and downward from the vertical extension 1186 toward the radial body 1182. The bottom toothed portion 1184 of the first gasket 860 is positioned within the first annular recess 917 and secured therein by a friction fit and the engagement of teeth 1192 thereof with the walls defining the first annular recess 917, thereby ensuring continued attachment of the first gasket 860 relative to the large debris container 858. When the bottom toothed portion 1184 is engaged with the first annular recess 917, the radial body 1182 is generally seated on the upper portion 890 of the large debris container 858 and the vertical extension 1186 is in contact and flush with the annular top portion 916 of the large debris container 858. As shown in FIG. 78E, when the canister body 856 is closed with the large debris container 858 an inner angled wall 1194 adjacent the bottom edge 910 of the canister body 856 engages and seals with the first and second curved extensions 1188, 1190. Additionally, the first and second curved extensions 1188, 1190 can include a radius of curvature that is complementary to the inner angled wall 1194. This configuration allows the first gasket 860 to maintain a seal between the canister body 856 and the large debris container 858 despite there being vacuum pressure within the hydrocyclonic particle separator assembly 804 that pulls on the first gasket 860. Accordingly, the first gasket 860 functions as both a pressure gasket and a vacuum gasket.

Figure 78F:
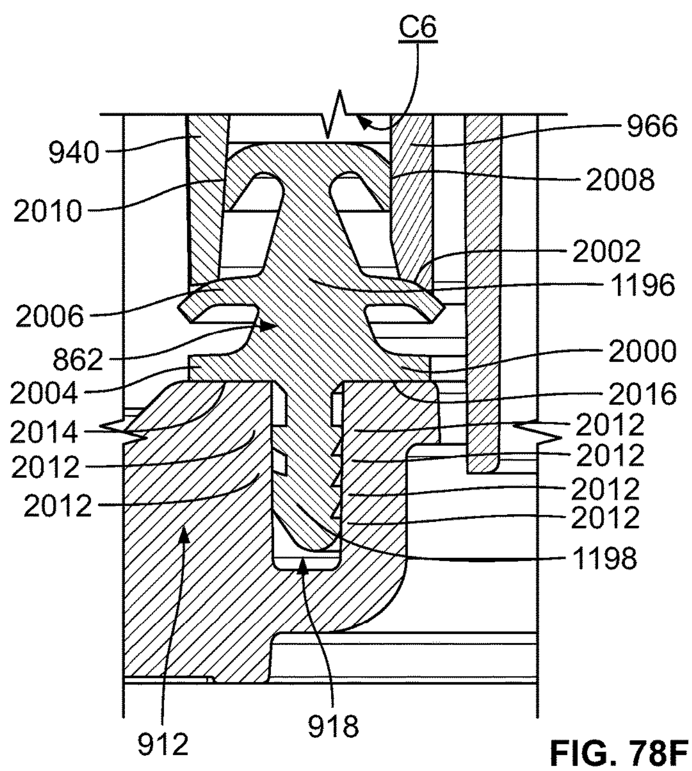
FIG. 78F is an enlarged view of Area 78F of FIG. 78A.

Regarding the second gasket 862, FIG. 78F is an enlarged view of Area 78F identified in FIG. 78A and shows the engagement of the second gasket 862 with the large debris container 858, the central tubular extension 940 of the fine debris container 926, and the central tubular extension 966 of the fine debris container top 928. The second gasket 862 defines a cross-section that includes an annular body 1196, a bottom toothed portion 1198 extending downwardly from the annular body 1196, first and second inwardly extending radial extensions 2000, 2002 extending radially from the annular body 1196, first and second outwardly extending radial extensions 2004, 2006 extending radially from the annular body 1196, a first curved extension 2008 that curves radially inward and downward from the annular body 1196, and a second curved extension 2010 that curves radially outward and downward from the annular body 1196. The bottom toothed portion 1198 of the second gasket 862 is positioned within the second annular recess 918 of the central hub 912 and secured therein by a friction fit and the engagement of teeth 2012 thereof with the walls defining the second annular recess 918, thereby ensuring continued attachment of the second gasket 862 relative to the central hub 912 of the large debris container 858. When the bottom toothed portion 1198 is engaged with the second annular recess 918, the first inwardly extending radial extension 2000 and the first outwardly extending radial extension 2004 are generally seated on shoulders 2014, 2016 of the central hub 912. As shown in FIG. 78F, when the canister body 856 is closed with the large debris container 858, the central tubular extension 940 of the fine debris container 926 and the central tubular extension 966 of the fine debris container top 928 engages and creates a water-tight seal with the second inwardly extending radial extension 2002, the second outwardly extending radial extension 2006, and the first and second curved extensions 2008, 2010. In this configuration, a portion of the annular body 1196 along with the second inwardly extending radial extension 2002, the second outwardly extending radial extension 2006, and the first and second curved extensions 2008, 2010 are positioned between the central tubular extension 940 of the fine debris container 926 and the central tubular extension 966 of the fine debris container top 928, thus sealing the sixth chamber C6, e.g., the fine debris chamber. This maintains pressure separation and prevents fluid from flowing through to the fine debris container 926. Additionally, the second gasket 862 seals the interior of the large debris container 858 from the exterior of the hydrocyclonic particle separator assembly 804.

Figure 75B:
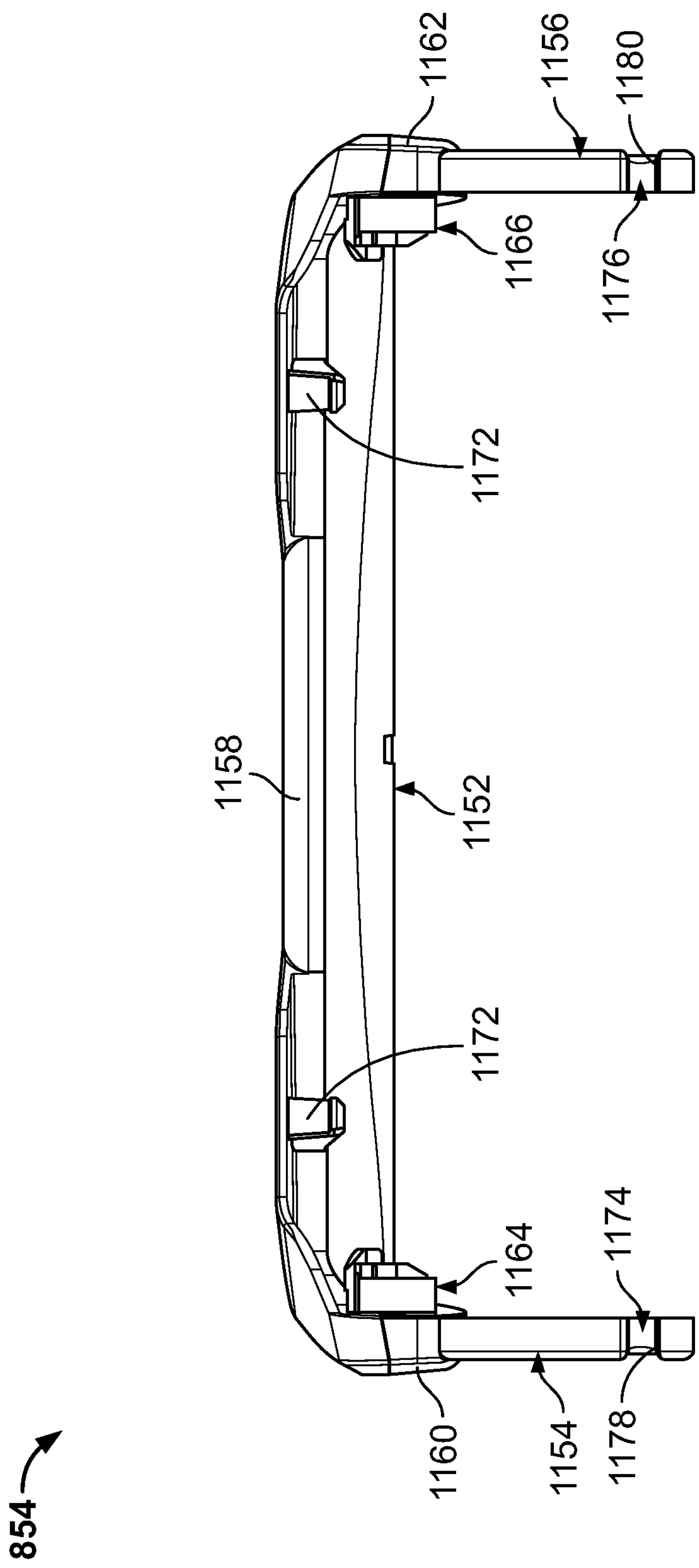
FIG. 75B is a front view of the handle of FIG. 75.
Figure 79:
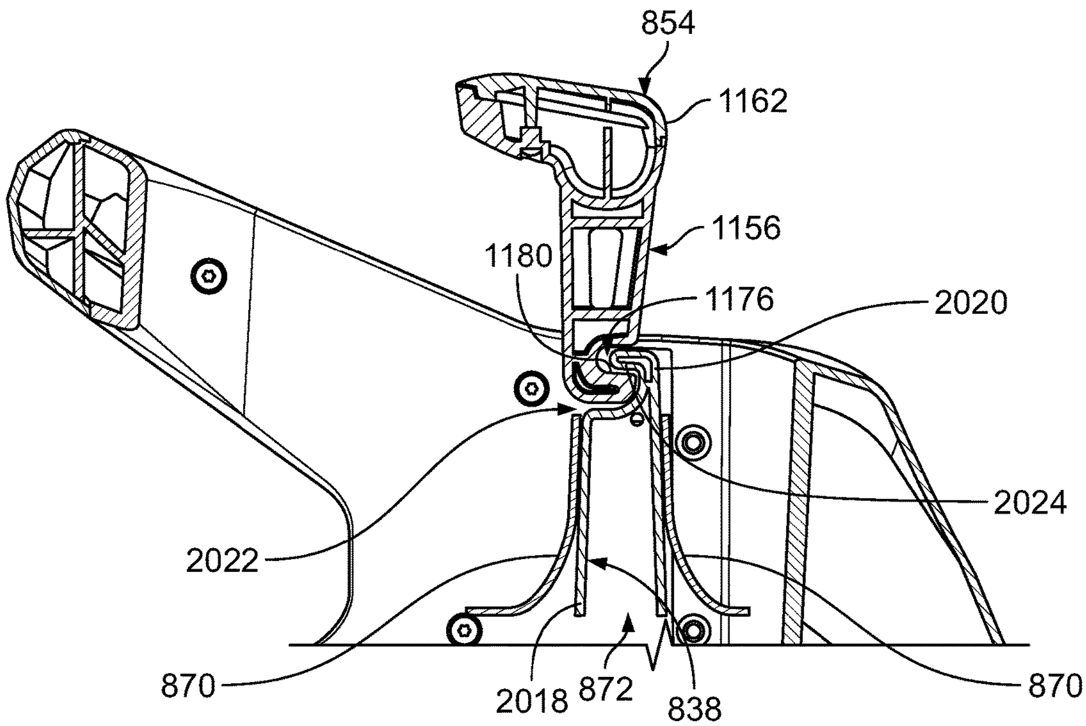
FIG. 79 is a partial sectional view showing engagement of the handle with a pool cleaner body taken along line 79-79 of FIG. 56.

FIG. 79 is a partial sectional view taken along line 79-79 of FIG. 56 showing the engagement of the second locking hook 1156 of the handle 854 with one of the catches 838 of the pool cleaner body 802. It should be understood that the description of the engagement of the second locking hook 1156 with the catch 838 also holds true for the engagement of the first locking hook 1154 with the other of the catches 838 of the pool cleaner body 802. As previously discussed, the handle 854 is rotatably connected to the cyclone block 990 of the hydrocyclonic particle separator assembly 804 through engagement of the handle engagement tabs 1010*a*, 1010*b* of the cyclone block 990 with the mounting bosses 1164, 1166 of the handle 854 (see FIGS. 69 and 75). When the handle engagement tabs 1010*a*, 1010*b* are engaged with the mounting bosses 1164, 1166, the handle 854 can rotate about the engagement tabs 1010*a*, 1010*b*. As discussed in connection with FIGS. 75-77, the first and second locking hooks 1154, 1156 extend perpendicularly from first and second ends 1160, 1162 of the handle frame 1158, and include a recess 1176, 1178 that forms an engagement surface 1178, 1180. The catches 838 of the pool cleaner body 802 are protrusions that extend inward from lateral sides of the pool cleaner body 802. The catches 838 generally include a guide body 2018 and a hook 2020 at a distal end of the guide body 2018. The hook 2020 defines a recess 2022 and an engagement surface 2024. The recesses 1174, 1176 of the first and second locking hooks 1154, 1156 are configured to receive the hooks 2020 of the catches 838, and the recess 2022 of the catches 838 are configured to receive the first and second locking hooks 1154, 1156, such that the engagement surfaces 1178, 1180 of the first and second locking hooks 1154, 1156 are adjacent and in engagement with the engagement surfaces 2024 of the catches 838.

To lock and unlock the handle 854, the handle 854 can be rotated about the engagement tabs 1010*a*, 1010*b* of the cyclone block 990. Rotation of the handle 854 causes the attached locking hooks 1154, 1156 to rotate as well. When the handle 854 is positioned in a vertical up position, the locking hooks 1154, 1156 are in a horizontal position in which they are unlocked. When the handle 854 is positioned in a horizontal down position, e.g., when it is positioned adjacent the beauty cap 852 as shown in FIGS. 59A, 60, 61 and 79, the locking hooks 1154, 1156 are in a locked position where they are in engagement with the catches 838 of the pool cleaner body 802, thus locking the hydrocyclonic particle separator 804 with the pool cleaner body 802. When in the locked position, the engagement surfaces 1178, 1180 of the first and second locking hooks 1154, 1156 are adjacent and in engagement with the engagement surfaces 2024 of the catches 838, and thus the hydrocyclonic particle separator assembly 804 is engaged with the pool cleaner body 804 and vertical separation of the hydrocyclonic particle separator assembly 804 from the pool cleaner body 804 is prevented. Additionally, rotation of the hydrocyclonic particle separator assembly 804 is prevented through placement of the guide body 2018 of the catches 838 within the channel 872 formed between the guide vanes 870. Any attempted rotation of the hydrocyclonic particle separator assembly 804 will be prevented through engagement of the guide body 2018 with the guide vanes 870.

Figure 80:
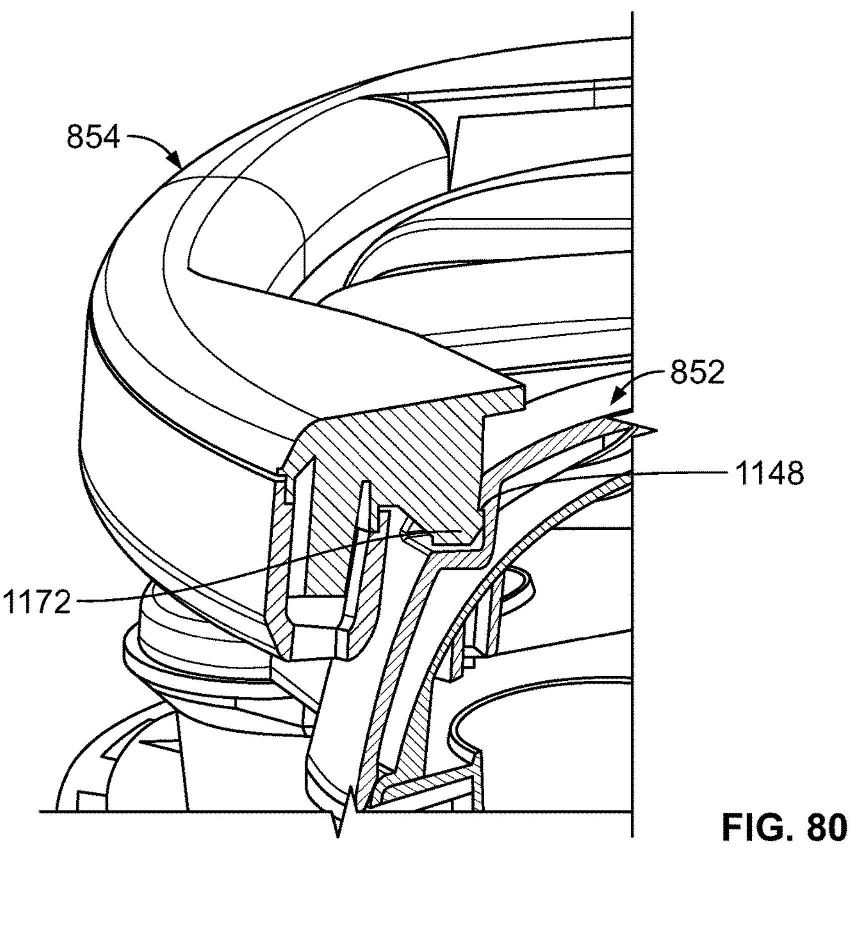
FIG. 80 is a partial sectional view showing engagement of the handle with the hydrocyclonic particle separator assembly taken along line 80-80 of FIG. 56.

When the handle 854 is in the locked position it is also secured to the beauty cap 852, as shown in FIG. 80 which is a partial perspective sectional view taken along line 80-80 of FIG. 56. As previously referenced in connection with FIG. 63, the beauty cap 852 includes notches 1148 that are configured to engage locking tabs 1172 of the handle 854. Particularly, the notches 1148 are generally recesses formed in the beauty cap 852, while the locking tabs 1172 are flexible components that form an engagement ledge. When the handle 854 is rotated into a locked position, the locking tabs 1172 can engage the beauty cap 852 causing them to flex outward until the handle 854 is sufficiently closed, at which point the locking tabs 1172 will return to their original position and be partially inserted into the notches 1148 of the beauty cap 852. Engagement of the locking tabs 1172 with the notches 1148 prevents the handle 854 from inadvertently being transitioned from the locked position to the unlocked position, e.g., if the pool cleaner 800 flips over while operating, etc. The locking tabs 1172 can be disengaged from the notches 1148 simply by pulling the handle 854 upward with sufficient force.

Figure 60B:
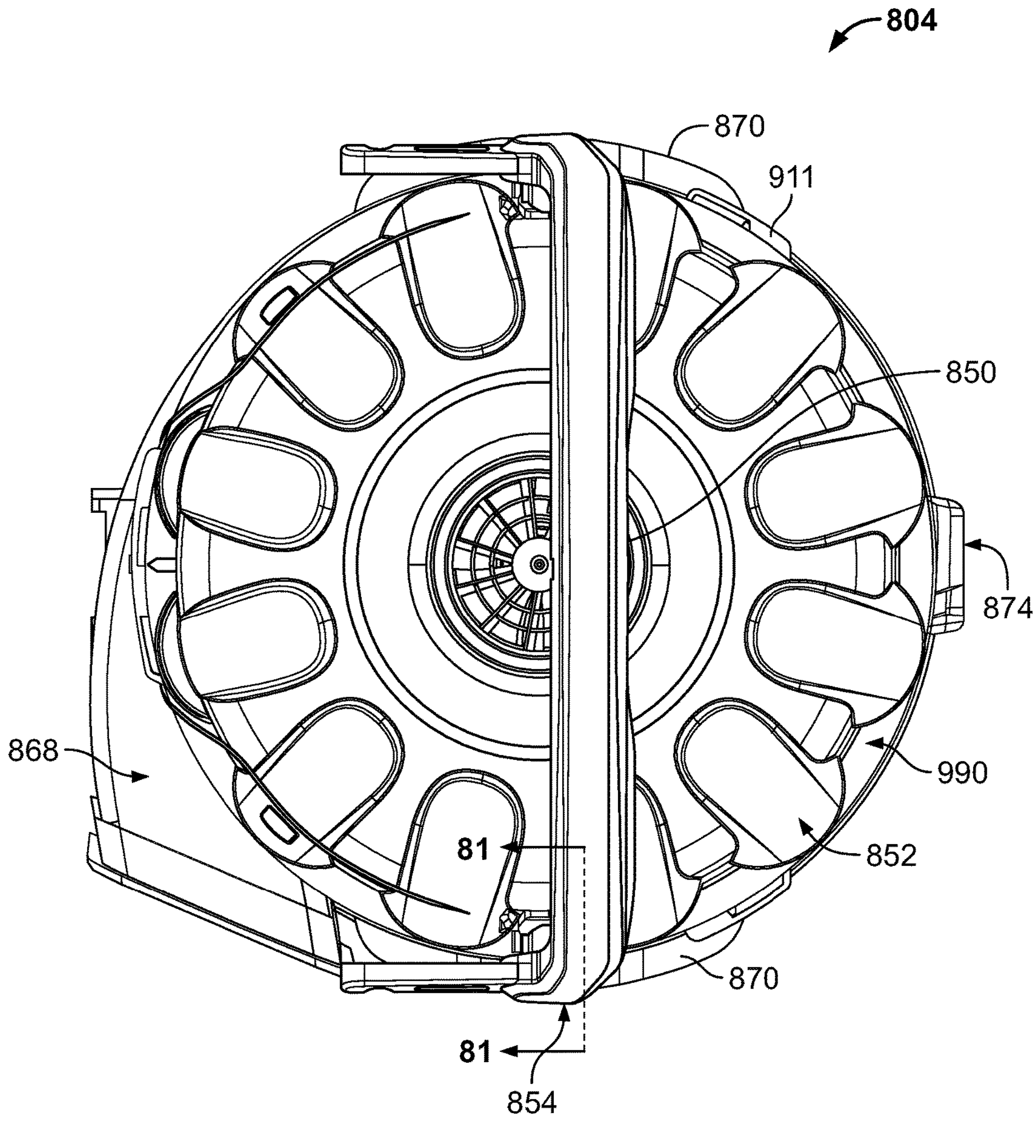
FIG. 60B is a top view of the third embodiment hydrocylonic particle separator assembly of FIG. 58 with the handle in an up position.
Figure 61:
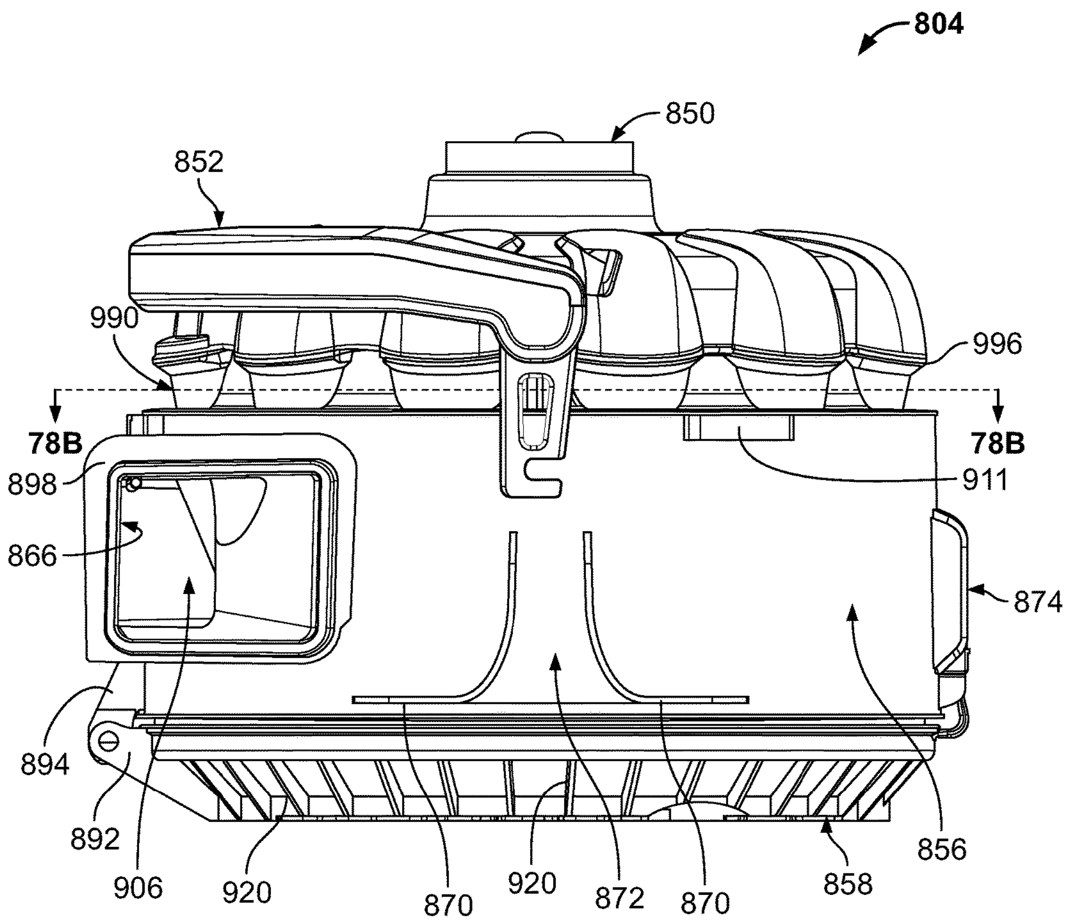
FIG. 61 is a side view of the third embodiment hydrocylonic particle separator assembly of FIG. 58.
Figure 81:
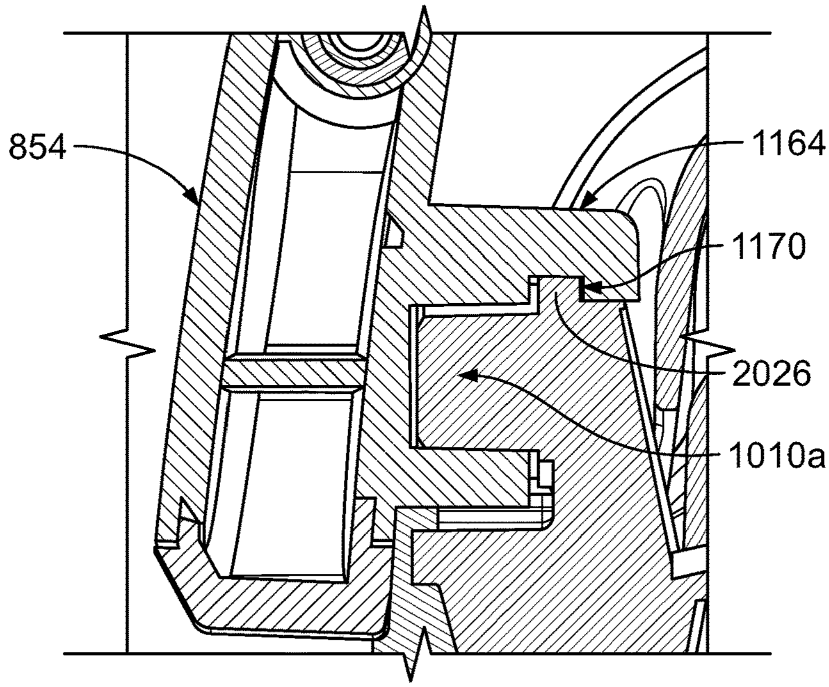
FIG. 81 is a partial sectional view showing engagement of the handle with the hydrocyclonic particle separator assembly with the handle in an up position taken along line 81-81 of FIG. 60B.

FIG. 81 is a partial perspective sectional view taken along line 81-81 of FIG. 60B, and showing the handle 854 in an unlocked position with the channel 1170 of the first mounting boss 1164 engaged with a protrusion 2026 of the first handle engagement tab 1010*a*. Specifically, each of the handle engagement tabs 1010*a*, 1010*b* include a protrusion 2026 that extends partially about the circumference thereof. While FIG. 81 only illustrates the protrusion 2026 for the first handle engagement tab 1010*a*, it should be understood by a person of ordinary skill in the art that the second handle engagement tab 1010*b* also includes a protrusion 2026 extending partially about the circumference thereof. As discussed in connection with FIG. 77, each mounting boss 1164, 1166 includes a channel 1170 that extends partially around the perimeter of the mounting boss 1164, 1166 and that is configured to receive the protrusions 2026 of the handle engagement tabs 1010*a*, 1010*b* in order to prevent the handle 854 from pulling away from the cyclone block 990 when the hydrocyclonic particle separator assembly 804 is carried by the handle 854. Specifically, when the handle 854 is engaged with the cyclone block 990, e.g., through engagement of the first mounting boss 1164 with the first handle engagement tab 1010*a* and engagement of the second mounting boss 1166 with the second handle engagement tab 1010*b*, a user can grab and rotate the handle 854 about the first and second engagement tabs 1010*a*, 1010*b* to place it in a vertical position where the handle 854 can be used to carry the hydrocyclonic particle separator assembly 804. As the handle 854 is rotated, the channels 1170 of the first and second mounting bosses 1164, 1166 will also rotate causing the protrusions 2026 of the first and second handle engagement tabs 1010*a*, 1010*b* to be inserted into the channels 1170. The engagement of the protrusions 2026 with the channels 1170 prevents the handle 854 from disengaging from the cyclone block 990 when the hydrocyclonic particle separator assembly 804 is carried by the handle 854. Particularly, when carried by the handle 854, the weight of the hydrocyclonic particle separator assembly 804 can cause the handle 854 to slightly flex, which could result in the disengagement of the handle 854 from the cyclone block 990. However, this disengagement is prevented because the protrusions 2026 will engage the walls forming the channels 1170 and be unable to disengage. Accordingly, this arrangement secures the handle 854 to the cyclone block 990 when the handle is in an unlocked or upright position.

Figure 82:
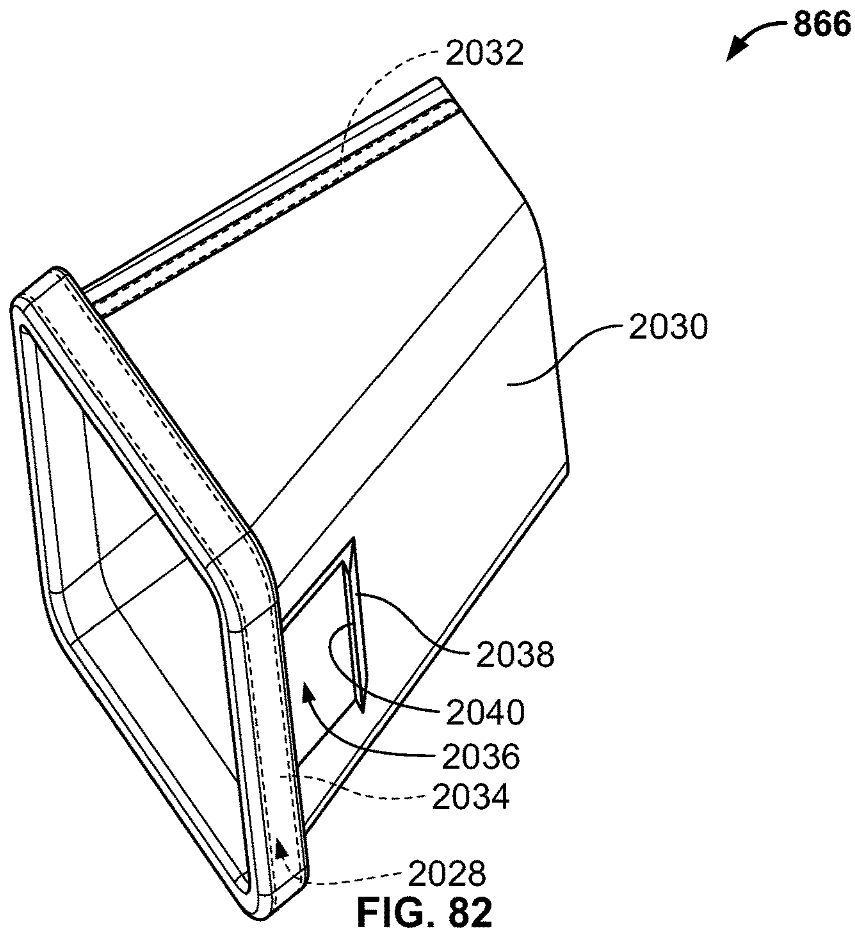
FIG. 82 is a perspective view of a check valve of the third embodiment hydrocylonic particle separator assembly with the check valve in an open position.
Figure 83:
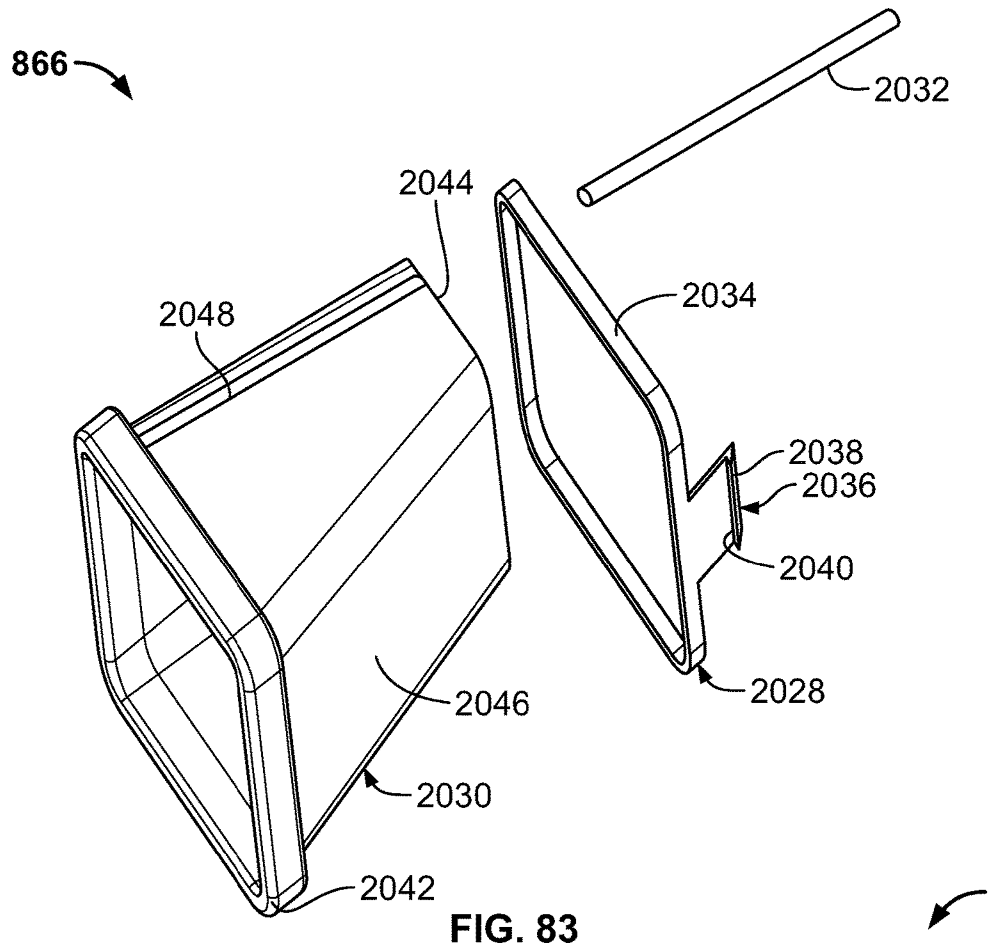
FIG. 83 is an exploded view of the check valve of FIG. 82.
Figure 84:
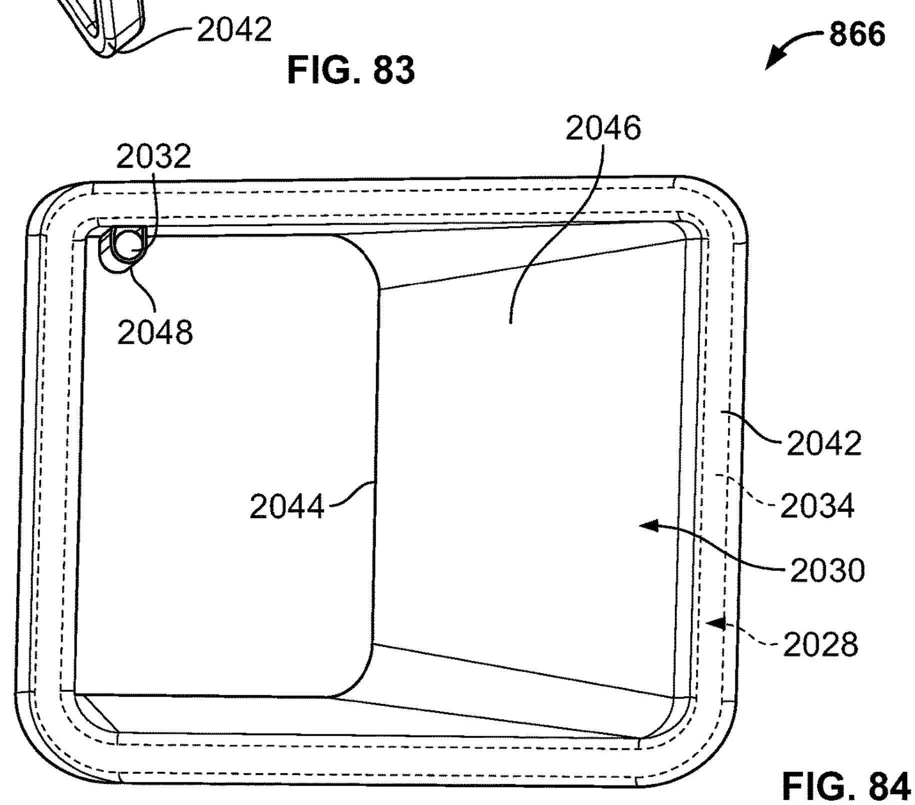
FIG. 84 is a front view of the check valve of FIG. 82 with the check valve in an open position.
Figure 85:
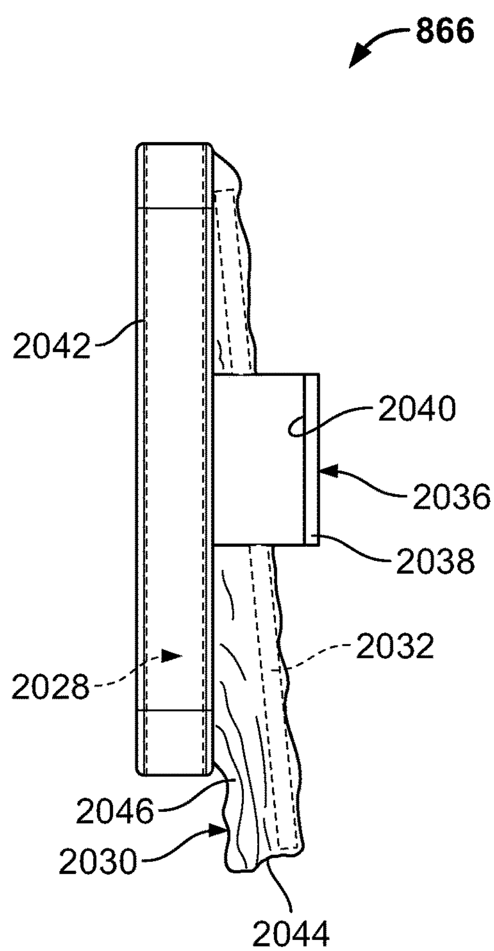
FIG. 85 is a side view of the check valve of FIG. 82 with the check valve in a closed position.

FIGS. 82-85 show the check valve 866 in greater detail. FIGS. 82-84 are respectively perspective, exploded, and front views of the check valve 866 in an open state, while FIG. 85 is a side view of the check valve 866 in a closed position. The check valve 866 includes a frame 2028, a medium 2030, and a rigid rod 2032. The frame 2028 includes rectangular body 2034 and a locking tab 2036 that extends rearward from the rectangular body 2034. The locking tab 2036 is a flexible component that includes an angled protrusion 2038 at a distal end thereof, the angled protrusion 2038 defining an engagement shoulder 2040. The medium 2030 is generally a bag like component that is constructed of a flexible mesh material that allows water to flow therethrough. The medium 2030 includes a proximal end 2042, a distal end 2044, and a body 2046 that extends and tapers from the proximal end 2042 to the distal end 2044. The proximal end 2042 of the medium 2030 can be wrapped around the frame 2028 and sewn so that the frame 2028 is retained by the medium 2030 at the proximal end 2042. Alternatively, the frame 2028 and the proximal end 2052 of the medium 2030 can be overmolded or sonic welded to secure the two components together, or the medium 2030 can be sewn around an O-ring and stretched over the frame 2028, among other alternative means of attachment. The body 2046 of the medium 2030 includes a pocket 2048 at the top thereof that extends along the entire length. The pocket 2048 is sized and configured to receive the rigid rod 2032. The rigid rod 2032 is weighted rigid component that is positioned within the pocket 2048 of the medium 2030, and functions to shut the distal end 2044 of the medium 2030 when there is insufficient flow through the check valve 866 or a backflow through the check valve 866. This is illustrated in FIG. 85, which is a side view showing the check valve 866 in a closed position, e.g., with the distal end 2044 of the medium 2030 shut.

The check valve 866 is removably positionable within the intake channel 906 of the canister body inlet 868, as shown in FIG. 61. As shown in FIG. 65, the inlet 868 includes an inner latching shoulder 902 positioned in the intake channel 906. When a user inserts the check valve 866 into the inlet 868, such that it is positioned within the intake channel 906, the angled protrusion 2038 of the locking tab 2036 engages the inner latching shoulder 902. As the user continues to apply pressure to the check valve 866 during insertion, the inner latching shoulder 902 will cause the locking tab 2036 to flex through engagement with the angled protrusion 2038. Once the check valve 866 is fully inserted and the angled protrusion 2038 is beyond the inner latching shoulder 902, the locking tab 2036 will snap back to its initial configuration and the engagement shoulder 2040 thereof will engage the inner latching shoulder 902. Engagement of the engagement shoulder 2040 with the inner latching shoulder 902 prevents the check valve 866 from being inadvertently removed from the inlet 868, e.g., due to a backflow of water. However, a user can manually remove the check valve 866 by disengaging the engagement shoulder 2040 from the inner latching should 902, and pulling the check valve 866 out from inlet 868.

During operation, the check valve 866 operates to prevent debris from exiting the inlet 868 due to backflow through the inlet 868. During normal operation, water, along with any debris, flows through the check valve 866 from the proximal end 2042 to the distal end 2044 and enters the hydrocylonic particle separator assembly 804 to be filtered. The pressure resulting from this normal direction of flow causes the rigid rod 2032 to be maintained in a horizontal position at the top of the medium 2030, thus allowing for debris to pass through the check valve 866. However, there are times where the hydrocylonic particle separator assembly 804 may experience a rush of backflow through the inlet 868 and the check valve 866. For example, when a user turns the pool cleaner 800 off or disconnects the hydrocyclonic particle separator assembly 804 from the cleaner body 802, water may flow out from the inlet 868. Without the check valve 866, debris that was originally trapped in the hydrocyclonic particle separator assembly 804 would be pulled out of the inlet 868 along with the backflow of water. However, the check valve 866 prevents this from happening. When there is a backflow of water through the inlet 868 and the check valve 866, the pressure from the water will cause the medium 2030 to fold in on itself and thus pull the rigid rod 2032 to a generally vertical position where the entirety thereof is substantially adjacent the frame 2034. The positioning of the rigid rod 2032 adjacent the frame 2034 will cause the medium 2030 to cover the proximal end 2042 thereof and prevent debris from exiting the proximal end 2042 of the medium 2030, but allow water to exit the check valve 866. Accordingly, the check valve 866 prevents debris from exiting the hydrocyclonic particle separator assembly 804 when there is a backflow rush of water. In some embodiments, the check valve 866 can be a check valve that regulates the amount of fluid flow passing through the hydrocyclonic particle separator assembly 804.

Figure 86:
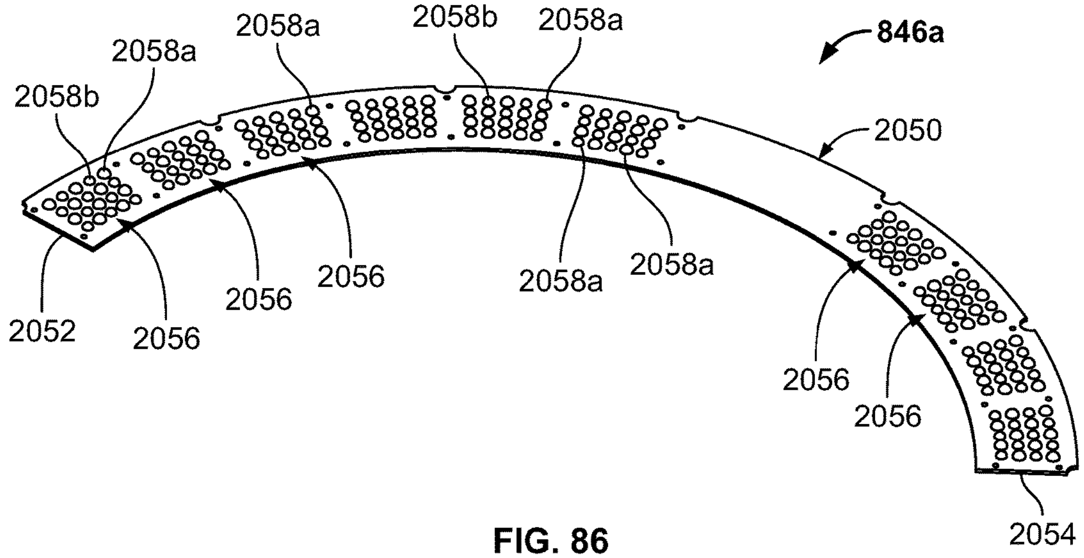
FIG. 86 is a perspective view of an alternative embodiment filter medium of the third embodiment hydrocylonic particle separator assembly.
Figure 87:
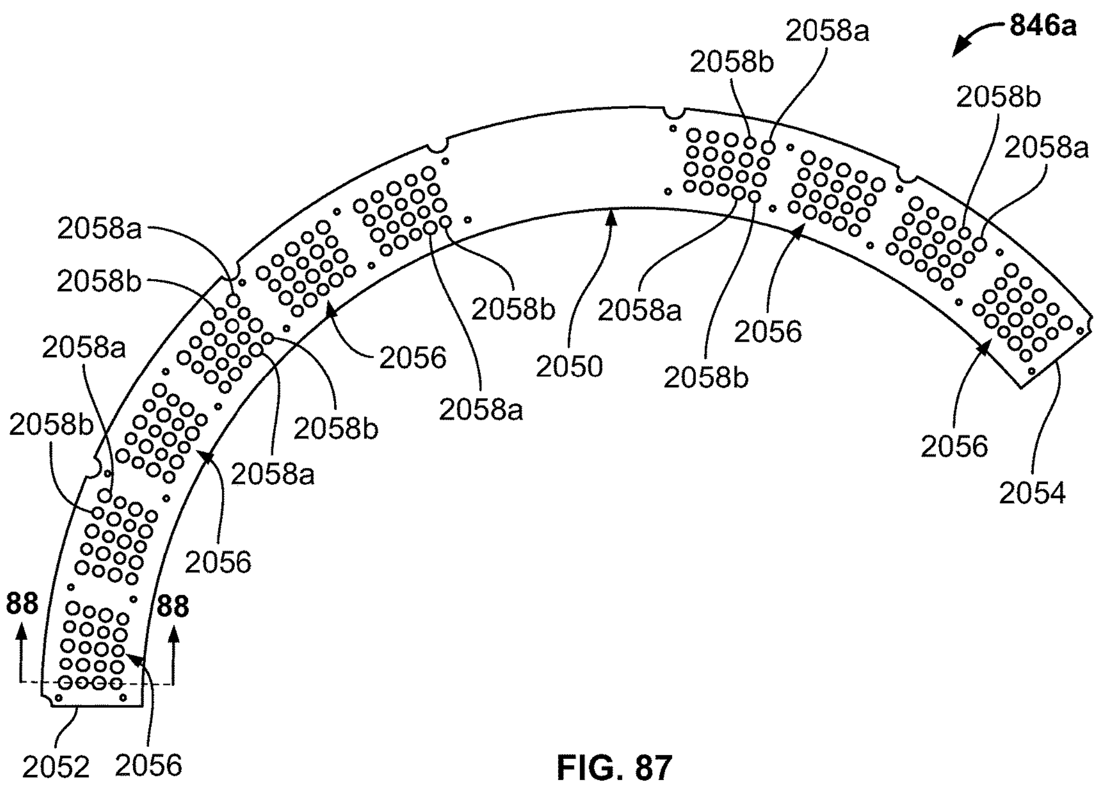
FIG. 87 is a top view of the alternative embodiment filter medium of FIG. 86.
Figure 88:
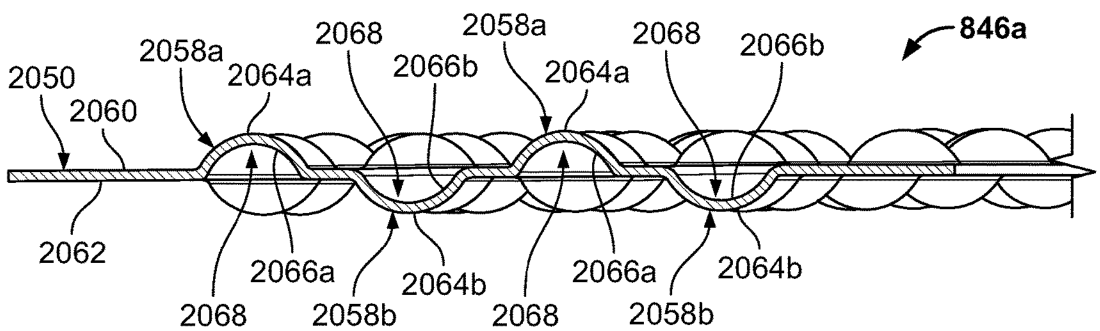
FIG. 88 is a sectional view of the alternative embodiment filter medium of FIG. 86 taken along line 88-88 of FIG. 87.

FIGS. 86-88 are perspective, top, and sectional views of an alternative embodiment filter medium **846*a* that is embossed. While the filter medium 846*a* is shown as a solid component herein, this is simply done for ease of illustration, and it should be understood by a person of ordinary skill in the art that the filter medium 846*a* includes a number of open spaces extending therethrough and is configured to allow water to flow across it. The filter medium 846*a* includes an arcuate body 2050 made of a filter material (e.g., a fabric mesh, a plastic mesh, a molded mesh, a foam, a coarse screening media, etc.). The arcuate body 2050 extends from a first end 2052 to a second end 2054, and includes a plurality of groups of embossed patterns 2056. Each group of embossed patterns 2056 is made up of first and second embossments 2058*a*, 2058*b*** that alternate in direction of depression.

FIG. 88 is a sectional view taken along line 88-88 of FIG. 87 showing the first and second embossments **2058*a*, 2058*b* in greater detail. As shown in FIG. 88, the arcuate body 2050 of the filter medium 846*a* includes a first side 2060 and a second side 2062. The first embossments 2058*a* protrude from the first side 2060 of the arcuate body 2050, while the second embossments 2058*b* protrude from the second side 2062 of the arcuate body 2050. The first and second embossments 2058*a*, 2058*b* are concave protrusions that form a convexity 2064*a*, 2064*b* on one side and a concavity 2066*a*, 2066*b* on the other, thus creating an interrupted surface. That is, the first embossments 2058*a* form a convexity 2064*a* in the first side 2060 of the arcuate body 2050 and a concavity 2066*a* in the second side 2062 of the arcuate body 2050. In contrast, the second embossments form a convexity 2064*b* in the second side 2062 of the arcuate body 2050 and a concavity 2066*b* in the first side 2060 of the arcuate body 2050. Each of the concavities 2066*a*, 2066*b* form a pocket 2068 in the arcuate body 2050. Thus, the first and second embossments 2058*a*, 2058*b* form a serpentine-like pattern in the arcuate body 2050 of the filter medium 846*a*. The pattern generated by the first and second embossments 2058*a*, 2058*b* acts to prevent clogging of the filter medium 846*a* by providing flow channels beneath debris that is stuck to the filter medium 846*a*. That is, even when a piece of debris, e.g., a leaf, is stuck to the filter medium 846*a*, it will be elevated by the convexities 2064*a*, 2064*b*, and water will be able to flow underneath the debris and into the concavities 2066*a*, 2066*b*. This allows the pool cleaner 800 to maintain suction during cleaning operations, even when debris is stuck to the filter medium 846*a*. The embossments 2058*a*, 2058*b* can be any other alteration to the filter medium 846*a* that creates flow paths beneath debris that is trapped on the filter medium 846*a*. For example, the embossments 2058*a*, 2058*b*** can be pleats or texturing, or can be a raised emblem or company name.

The filter medium **846*a* can be an individual component that is mounted to the fine debris subassembly 844 and the cyclone block subassembly 848, and extends about the perimeter of the fine debris subassembly 844 and the cyclone block subassembly 848. Alternatively, the filter medium 846*a* can be mounted to a support structure such as support 428 of FIG. 23**.

Figure 89:
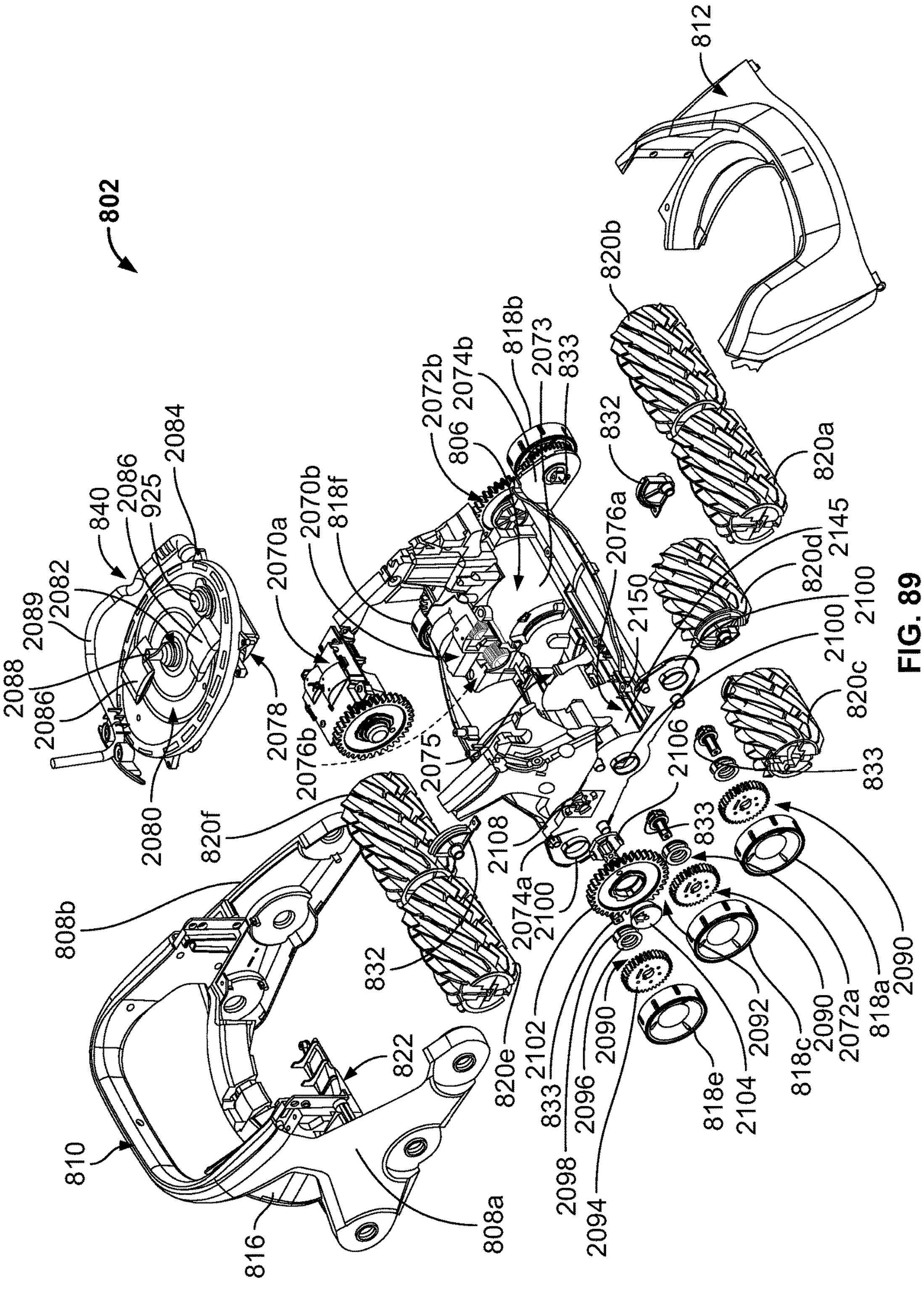
FIG. 89 is an exploded view of a pool cleaner body of a fourth embodiment pool cleaner of the present disclosure.

Turning to FIG. 89, an exploded view of the pool cleaner body 802 is shown. The pool cleaner body 802 includes the chassis 806, the left and right covers 808*a*, 808*b* connected with the handle 810, rear cover 814, inlet top 816, the front skin 812, the wheels 818*a-f*, the rollers 820*a*-820*f*, the roller latches 832, the roller mounts 833, the motor box 840, a first roller drive gear box 2070*a*, a second roller drive gear box 2070*b*, a first roller drive gear train 2072*a*, and a second roller drive gear train 2072*b*. The chassis 806 includes a body 2073, first and second side walls 2074*a*, 2074*b* on opposite sides of the body 2073, a motor box housing 2075 at a generally center location on the top of the chassis 806, and first and second drive gear box housings 2076*a*, 2076*b* on opposite sides of the motor box housing 2075. The motor box 840 includes a body 2078, a top 2080 connected to the body 2078 by an annular snap fit about the entire circumference, first and second drive stepper motors (not shown) positioned in the body 2078, a pump motor 2082, and a power connector 2084 that is in electrical connection with the drive stepper motors and the pump motor 2082. The top 2080 can include first and second protrusions 2086 that accommodate the first and second stepper motors (not shown), and the locking interface 925. The pump motor 2082 includes a male member 2088 that extends through the top 2080 of the motor box 840 and is configured to engage the female member 1102 of the shaft 1078 of the hydrocyclonic particle separator assembly 804. The male member 2088 can be a spline connector, a lovejoy connector, etc. A power and control cable 2089 can be connected to the power connector 2084 to provide power and control commands to the pool cleaner 800. The pump motor 2082 can be a brushless DC outer rotor motor. Alternatively, the pump motor 2082 can be a brushless DC inner rotor motor, a brushless DC motor, a brushed DC motor, an uncommutated DC motor, a permanent magnet DC motor, a wound stator DC motor, an AC polyphase cage rotor motor, an AC polyphaser wound rotor motor, an AC synchronous motor, etc.

The motor box 840 is positioned in the motor box housing 2075 of the chassis 806, while the first and second roller drive gear boxes 2070*a*, 2070*b* are positioned on opposite sides of the motor box 840 in the first and second drive gear box housing 2076*a*, 2076*b*, respectively. Each of the first and second roller drive gear boxes 2070*a*, 2070*b* is respectively in operative communication with a first and second motor (not shown) positioned within the motor box 840. The first and second roller drive gear trains 2072*a*, 2072*b* are positioned on opposite sides of the chassis 806 and in mechanical communication with the first and second roller drive gear boxes 2070*a*, 2070*b*, respectively. A first set of rollers (rollers 820*a*, 820*c*, 820*e*) are in mechanical communication with the first roller drive gear train 2072*a*, which is in mechanical communication with the first roller drive gear box 2070*a* so that each of the rollers of the first roller set (e.g., rollers 820*a*, 820*c*, 820*e*) turn in the same direction and independently from a second set of rollers (rollers 820*b*, 820*d*, 820*f*). In some embodiments, each of the rollers of the first roller set (rollers 820*a*, 820*c*, 820*e*) can be independently spun relative to each other. The second set of rollers (rollers 820*b*, 820*d*, 820*f*) are in mechanical communication with the second roller drive gear train 2072*b*, which is in mechanical communication with the second roller drive gear box 2070*b* so that each of the rollers of the second roller set (e.g., rollers 820*b*, 820*d*, 820*f*) turn in the same direction and independently from the first set of rollers (rollers 820*a*, 820*c*, 820*e*). In some embodiments, the rollers 820*a*, 820*c*, 820*e* of the first roller set can turn at the same rate, and the rollers of the second roller set 820*b*, 820*d*, 820*f* can turn at the same rate, while in other embodiments the rollers 820*a*, 820*c*, 820*e* of the first roller set can turn at a different rate 820*b*, 820*d*, 820*f* than the rollers of the second roller set. For the purposes of turning the pool cleaner 800, the first set of rollers can be driven to turn in a single direction and the second set of rollers can be driven to turn in an opposing direction, thereby generating a moment for turning the pool cleaner 800. Each of the rollers 820*a*-820*f* can be mounted to roller mounts 833 at their exterior, and to roller latches 832 at their interior.

The first and second roller drive gear trains 2072*a*, 2072*b* are substantially identical in construction, but placed on opposite sides of the chassis 806. Accordingly, it should be understood by a person of ordinary skill in the art that any description of the first roller drive gear train 2072*a* will hold true for the second roller drive gear train 2072*b*. The first roller drive gear train 2072*a* generally consists of three drive gear assemblies 2090 and an idler gear assembly 2092.

The drive gear assemblies 2090 include a drive gear 2094, an exterior bushing half 2096, an interior bushing half 2098, and a roller mount 833. The chassis 806 includes three openings 2100 in each of the first and second sidewalls 2074*a*, 2074*b* for engagement of the small gear assemblies 2090 with the chassis 806. Particularly, for each small gear assembly 2090, the interior bushing half 2098 is paired with an exterior bushing half 2096, and the pair is connected and placed within an opening 2100 with the exterior bushing half 2096 positioned at an exterior portion of the respective chassis sidewall 2074*a*, 2074*b* and each interior bushing half 2098 positioned at an interior portion of the respective chassis sidewall 2074*a*, 2074*b*. The openings 2100 can also be keyed, with the interior and exterior bushing halves 2096, 2098 having a matching key to prevent rotation of the bushing halves 2096, 2098 within the opening 2100. Alternatively, the interior and exterior bushing halves 2096, 2098 can be formed as a single component instead of two separate pieces. When configured as a single component, the bushing can be pushed into the opening 2100 from the outside of the chassis 806 causing it to snap into place and secure to the chassis 806. The bushing can then be disengaged from the chassis 806 from the inside of the chassis 806 by a removal tool, e.g., a flathead screwdriver. The roller mount 833 extends through the bushing halves 2074*a*, 2074*b* and can engage a respective roller 820*a*-820*f* at a first end and the drive gear 2094 at a second end. The roller mount 833 is engaged with the drive gear 2094 so that rotation of the drive gear 2094 is transferred to the roller mount 833, which in turn rotates the roller 820*a*-820*f* that it is engaged with. Accordingly, the roller mounts 833 ride on the interior and exterior bushing halves 2096, 2098, and not the chassis sidewalls 2074*a*, 2074*b*. The roller drive gear trains 2072*a*, 2072*b* can be covered by the left and right covers 808*a*, 808*b*.

The idler gear assemblies 2092 include an idler gear 2102, an exterior bushing 2104, and an interior bushing 2106. The chassis 806 includes a keyed opening 2108 in each of the first and second sidewalls 2074*a*, 2074*b* that is positioned between two of the openings 2100 for the drive gear assemblies 2090. For each idler gear assembly 2092, the exterior bushing 2104 is paired with an interior bushing 2106. The interior bushing 2106 is connected to and extends through the keyed opening 2108, and is positioned at an interior portion of the respective chassis sidewall 2074*a*, 2074*b*. The exterior bushing 2104 is positioned at an exterior portion of the respective chassis sidewall 2074*a*, 2074*b*, extends through the center of the idler gear 2102, and is connected with the keyed opening 2108 and the interior bushing 2106. Accordingly, the idler gear 2102 is positioned between the exterior bushing 2104 and the chassis sidewall 2074*a*, 2074*b* such that the idler gear 2102 rides on the exterior bushing 2104. Additionally, the keyed opening 2108 can have two different key arrangements such that the exterior bushing 2104 is configured to engage the first key arrangement and the interior bushing 2106 is configured to engage the second key arrangement. In some embodiments, the key arrangements can be asymmetrical such that the exterior bushing 2104 and the interior bushing 2106 can only engage the key arrangements in a single configuration. Furthermore, the idler gear 2102 can include a plurality of slots, e.g., four, on an interior opening thereof while the exterior bushing 2104 can include a similar slot that permits debris to fall out when the slots of the idler gear 2102 are adjacent the slot of the exterior bushing 2104. The idler gear assembly 2092 is positioned between and engagement with two drive gear assemblies 2094. For the first roller drive gear train 2072*a*, the first roller drive gear box 2070*a* is in engagement with the third drive gear assembly 2094 and one of the two drive gear assemblies 2094 that the idler gear assembly 2092 is engaged with. For the second roller drive gear train 2072*b*, the second roller drive gear box 2070*b* is in engagement with the third drive gear assembly 2094 and one of the two drive gear assemblies 2094 that the idler gear assembly 2092 is engaged with.

Figure 90:
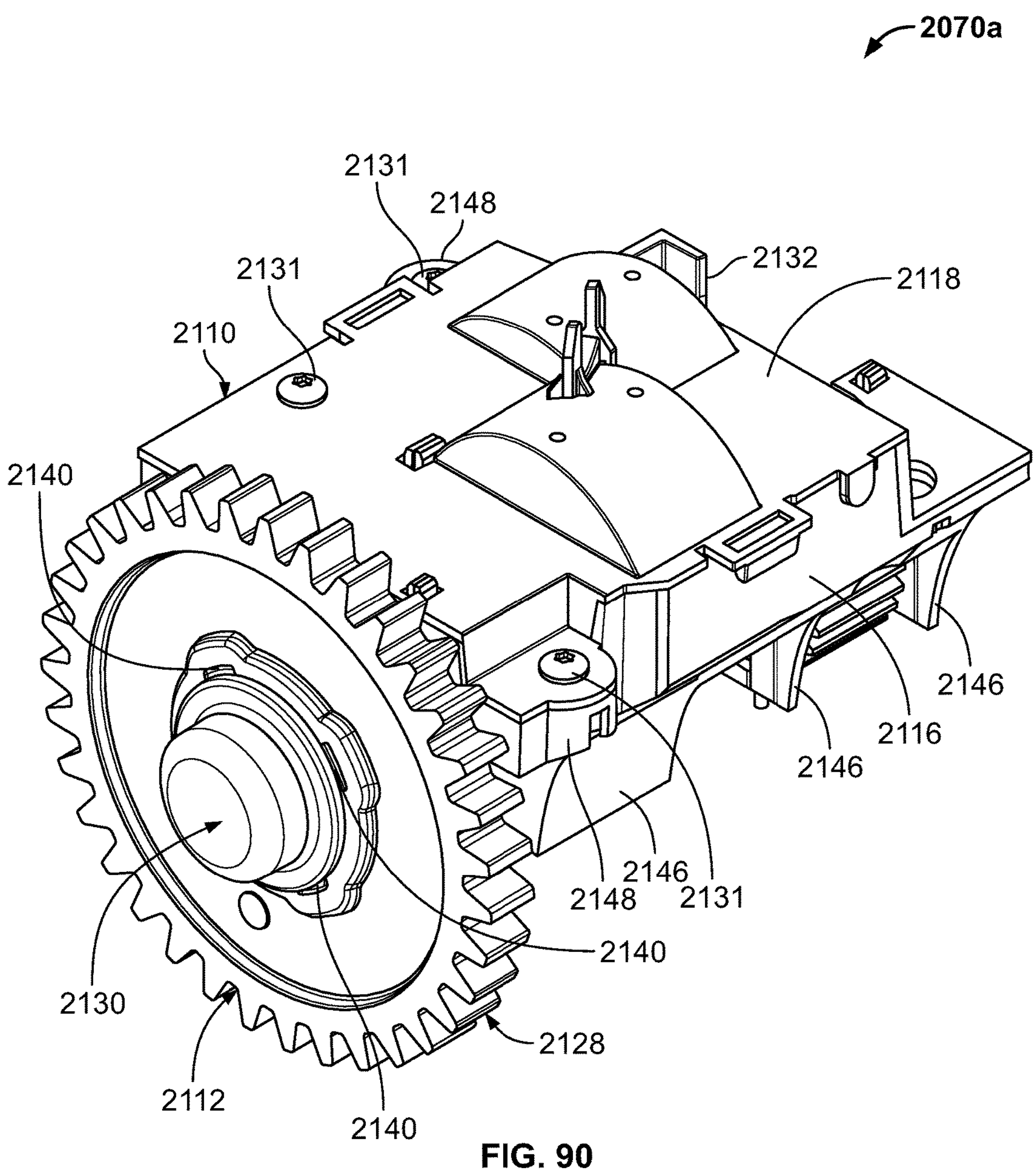
FIG. 90 is a first perspective view of a roller drive gear box of the fourth embodiment pool cleaner.
Figure 91:
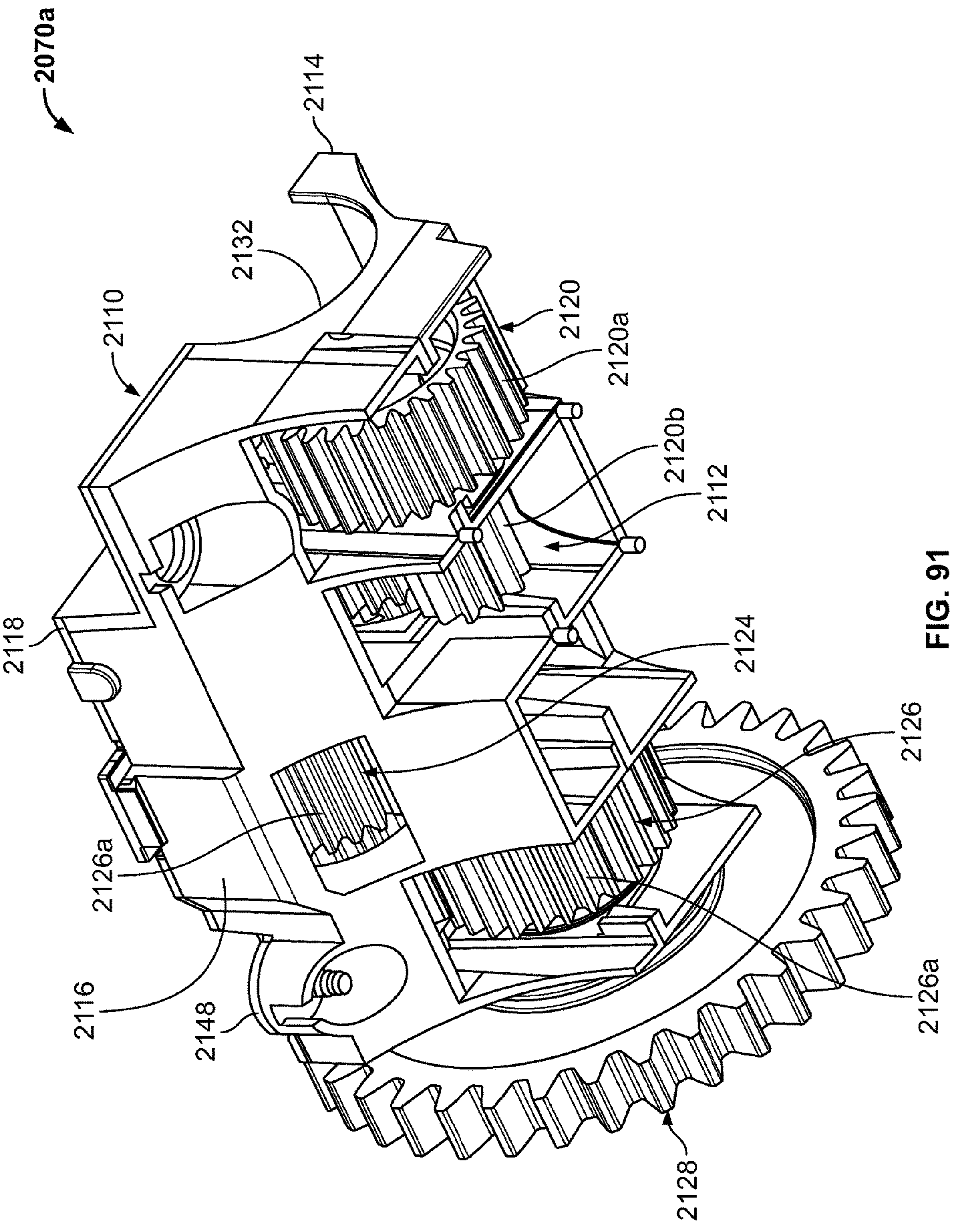
FIG. 91 is a second perspective view of the roller drive gear box of FIG. 90.
Figure 92:
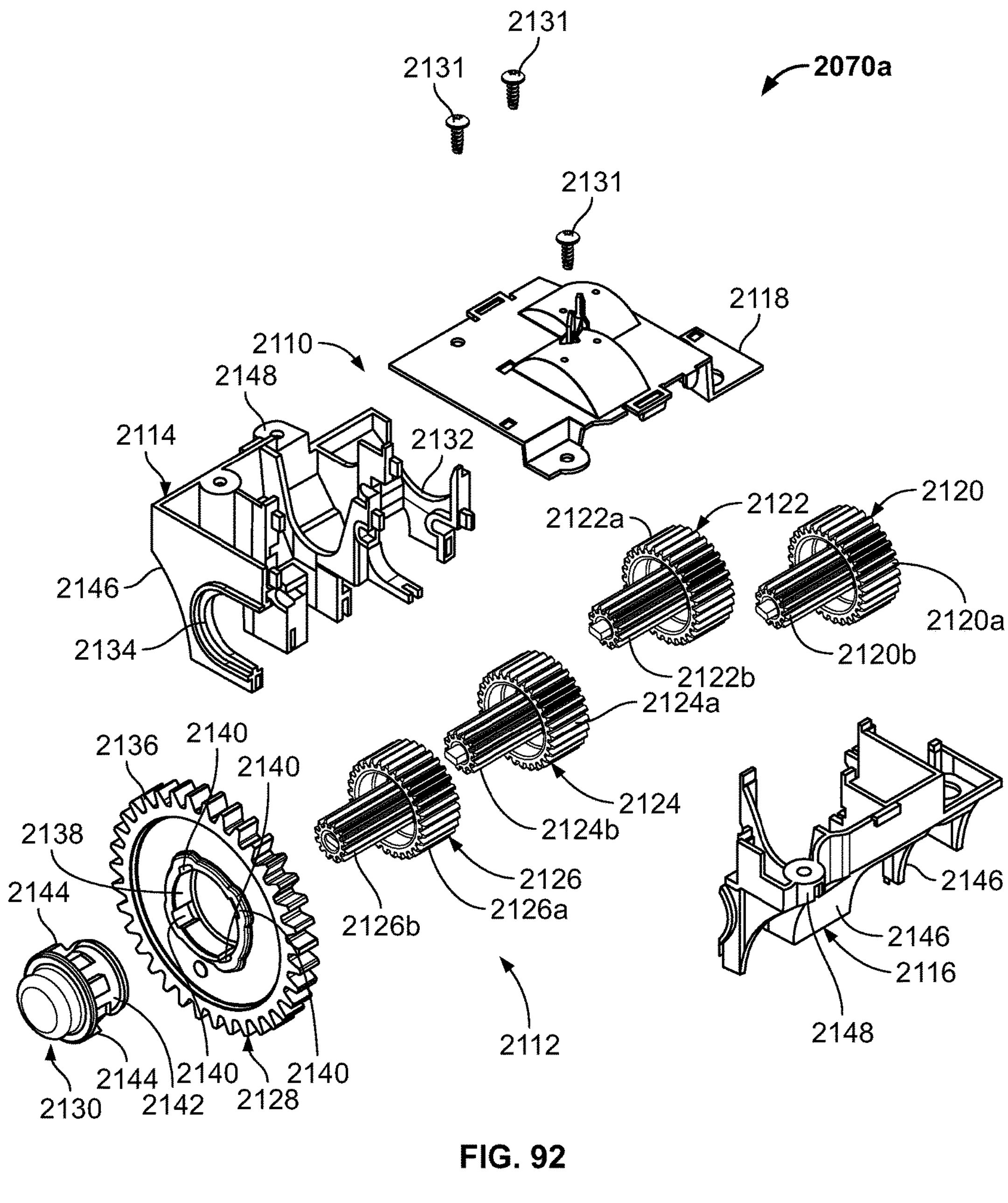
FIG. 92 is an exploded view of the roller drive gear box of FIG. 90.

The first and second roller drive gear trains 2072*a*, 2072*b* are driven by the first and second roller drive gear boxes 2070*a*, 2070*b*, respectively. FIGS. 90-93 show the first roller drive gear box 2070*a* in greater detail. It should be understood by a person of ordinary skill in the art that the second roller drive gear box 2070*b* is substantially similar in construction to that of the first roller drive gear box 2070*a*, and the description of the first roller drive gear box 2070*a* also holds true for the second roller drive gear box 2070*b*. FIGS. 90-92 are top perspective, bottom perspective, and exploded views of the first roller drive gear box 2070*a*. As referenced above, the first roller drive gear box 2070*a* is removably positioned within the first drive gear box housing 2076*a*. The first roller drive gear box 2070*a* generally includes a housing 2110 and a gear stack 2112. The housing 2110 includes a first shell 2114, a second shell 2116, and a lid 2118. The gear stack 2112 includes a first, second, third, and fourth double gears 2120, 2122, 2124, 2126, a drive gear 2128, and an axle 2130. Each double gear 2120, 2122, 2124, 2126 includes a first large diameter gear 2120*a*, 2122*a*, 2124*a*, 2126*a* that is coaxial and rotationally engaged with a small diameter gear 2120*b*, 2122*b*, 2124*b*, 2126*b*.

Figure 93:
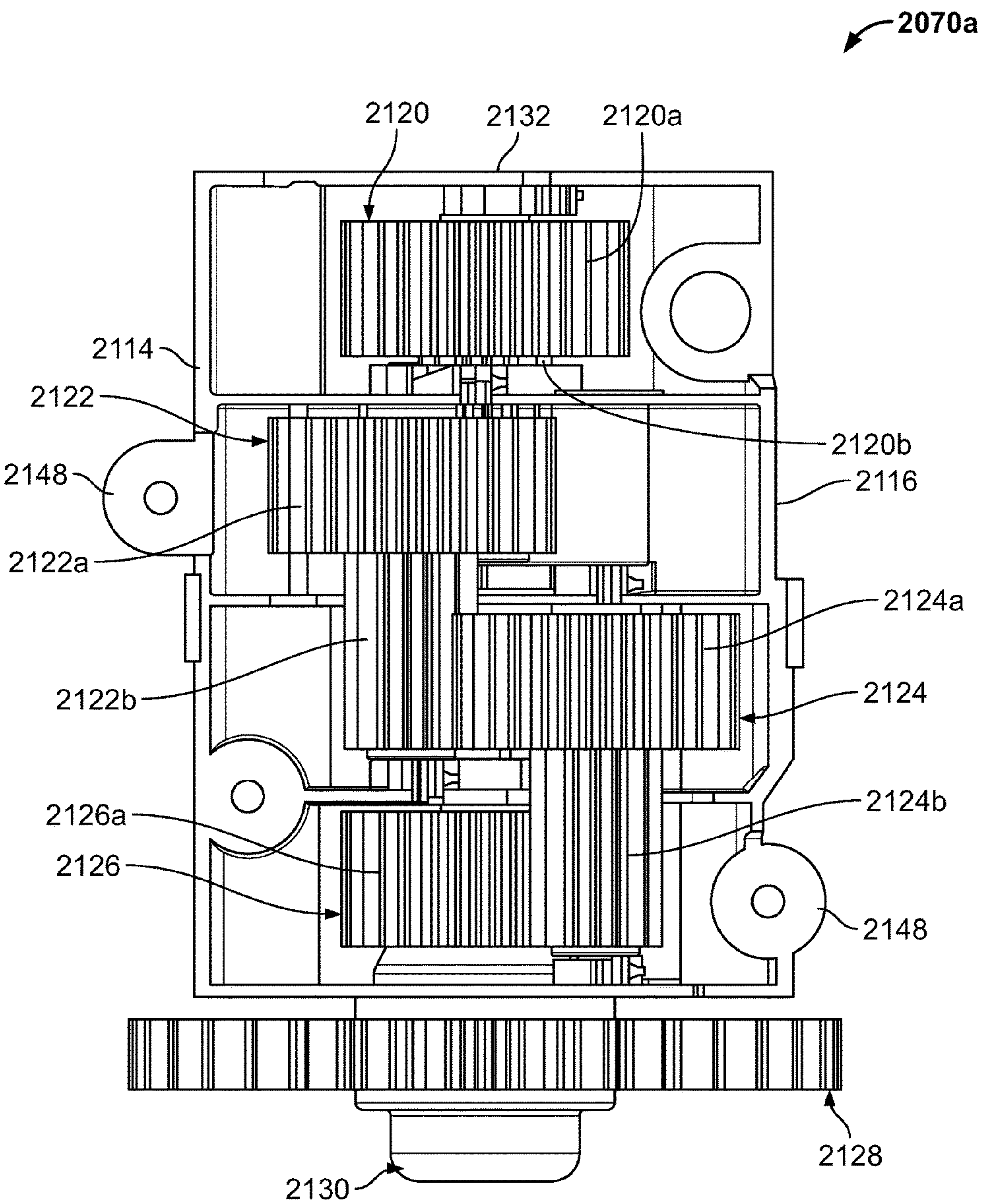
FIG. 93 is a top view of the roller drive gear box of FIG. 90 with a lid removed for clarity.

FIG. 93 is a top view of the first roller drive gear box 2070*a* with the lid 2118 removed showing engagement of the double gears 2120, 2122, 2124, 2126. The double gears 2120, 2122, 2124, 2126 are arranged such that the small diameter gear 2120*a* of the first double gear 2120 engages the large diameter gear 2122*b* of the second double gear 2122, the small diameter gear 2122*a* of the second double gear 2122 engages the large diameter gear 2124*b* of the third double gear 2124, and the small diameter gear 2124*a* of the third double gear 2124 engages the large diameter gear 2126*b* of the fourth double gear 2126. This arrangement transfers rotation of the first double gear 2120 to the fourth double gear 2126. In the present embodiment, the double gears 2120, 2122, 2124, 2126, as well as the small diameter gears 2120*a*, 2122*a*, 2124*a*, 2126*a* and the large diameter gears 2120*b*, 2122*b*, 2124*b*, 2126*b*, have the same gear ratio, whereas in other embodiments they may have different gear ratios in order to manipulate rotational speeds. The large diameter gear 2120*a* of the first double gear 2120 can be in mechanical communication with, and be rotationally driven by, one of the drive motors (not shown) of the motor box 840. The double gears 2120, 2122, 2124, 2126 are secured within the housing 2110 such that they can rotate within the housing 2110, but cannot move laterally, which prevents the double gears 2120, 2122, 2124, 2126 from becoming disengaged from each other. The lid 2118 can be removably engaged with the housing 2110, e.g., with screws 2131, so that a user can access the gear stack 2112 and replace the double gears 2120, 2122, 2124, 2126 if necessary. The housing 2110 additionally includes a proximal opening 2132 and a distal opening 2134. The proximal opening 2132 allows for a shaft of the drive motor to extend into the roller drive gear box 2070*a* and engage the first double gear 2120. The distal opening 2134 allows for the small diameter gear 2126*b* of the fourth double gear 2126 to extend out of the roller drive gear box 2070*a* and engage the axle 2130.

The drive gear 2128 includes a toothed outer diameter 2136 and a central opening 2138 that includes a plurality of notches 2140. The axle 2130 includes a tubular central hub 2142 that includes a plurality of external ridges 2144. The tubular central hub 2142 is configured to be inserted into the central opening 2138 of the drive gear 2128 with the external ridges 2144 engaging the notches 2140 of the drive gear 2128 so that rotation of the axle 2130 is transferred to the drive gear 2128. The tubular central hub 2142 of the axle 2130 is also configured to mechanically engage the small diameter gear 2126*b* of the fourth double gear 2126, e.g., through interior teeth (not shown), such that it is rotationally driven thereby. The tubular central hub 2142 rests in the distal opening 2134 of the housing 2110.

The housing 2110 also includes arcuate sidewalls 2145 that are configured to match the arcuate walls 2146 of the drive gear box housing 2076*a* of the chassis 806 (see FIG. 89). This assists with alignment of the drive gear box 2070*a* with the drive gear box housing 2076*a*. The drive gear box 2070*a* can be removably mounted to the chassis 806. Particularly, the drive gear box 2070*a* can include a plurality of mounting tabs 2148 that are sized and spaced to match a plurality of mounts 2150 on the drive gear box housing 2076*a* of the chassis 806 (see FIG. 89), which can be engaged by a standard fastener, e.g., a screw. This also assists with aligning the drive gear box 2070*a* with the drive gear box housing 2076*a*, 2076*b*.

The first and second drive gear boxes 2070*a*, 2070*b* are modular assemblies that contain the gear stack 2112 that transfers rotation from the drive motors to the first and second roller drive gear trains 2072*a*, 2072*b* in order to rotate the rollers 820*a*-820*f*, as discussed above. The first and second drive gear boxes 2070*a*, 2070*b* can be attached to the respective drive gear box housing 2076*a*, 2076*b*, and removed therefrom in order to be replaced or serviced. This can be done simply by unscrewing the fasteners that secure the drive gear box 2070*a*, 2070*b* to the drive gear box housing 2076*a*, 2076*b* of the chassis 806, and removing the drive gear box 2070*a*, 2070*b* from the drive gear box housing 2076*a*, 2076*b*. The removed drive gear box 2070*a*, 2070*b* can then be serviced, e.g., cleaned or have double gears 2120, 2122, 2124, 2126 replaced, or a new drive gear box 2070*a*, 2070*b* can be installed in place of the removed drive gear box 2070*a*, 2070*b*. By providing the first and second drive gear boxes 2070*a*, 2070*b* as removable modular assemblies, a user is able to extend the life of the drive motors and their pool cleaner since they will be able to replace the drive gear boxes 2070*a*, 2070*b* when needed instead of replacing the entire pool cleaner 800. This also results in a cost savings.

Figure 94:
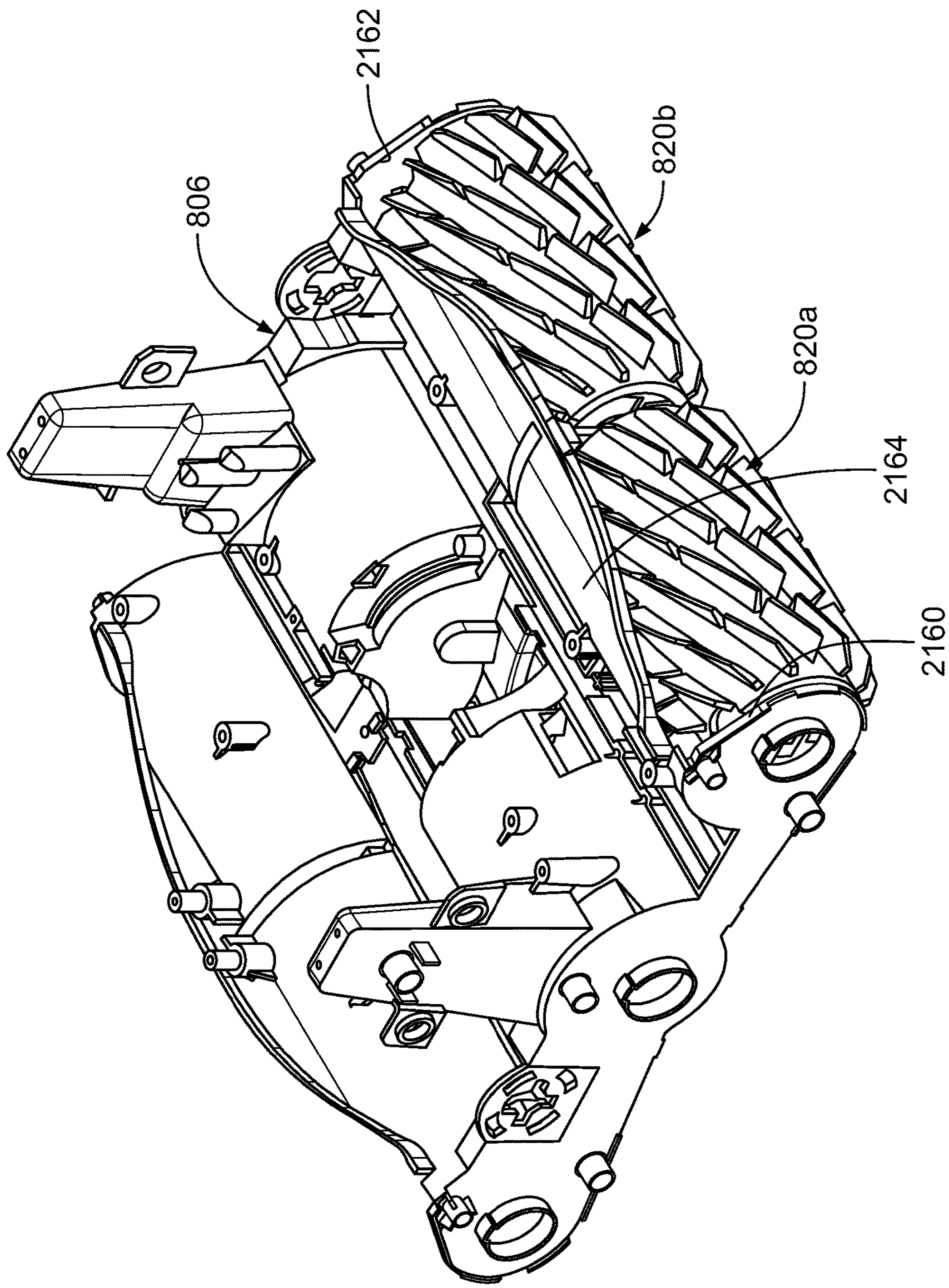
FIG. 94 is a perspective view of a chassis, a first roller, and a second roller of the fourth embodiment pool cleaner, with the first and second rollers attached to the chassis.
Figure 95:
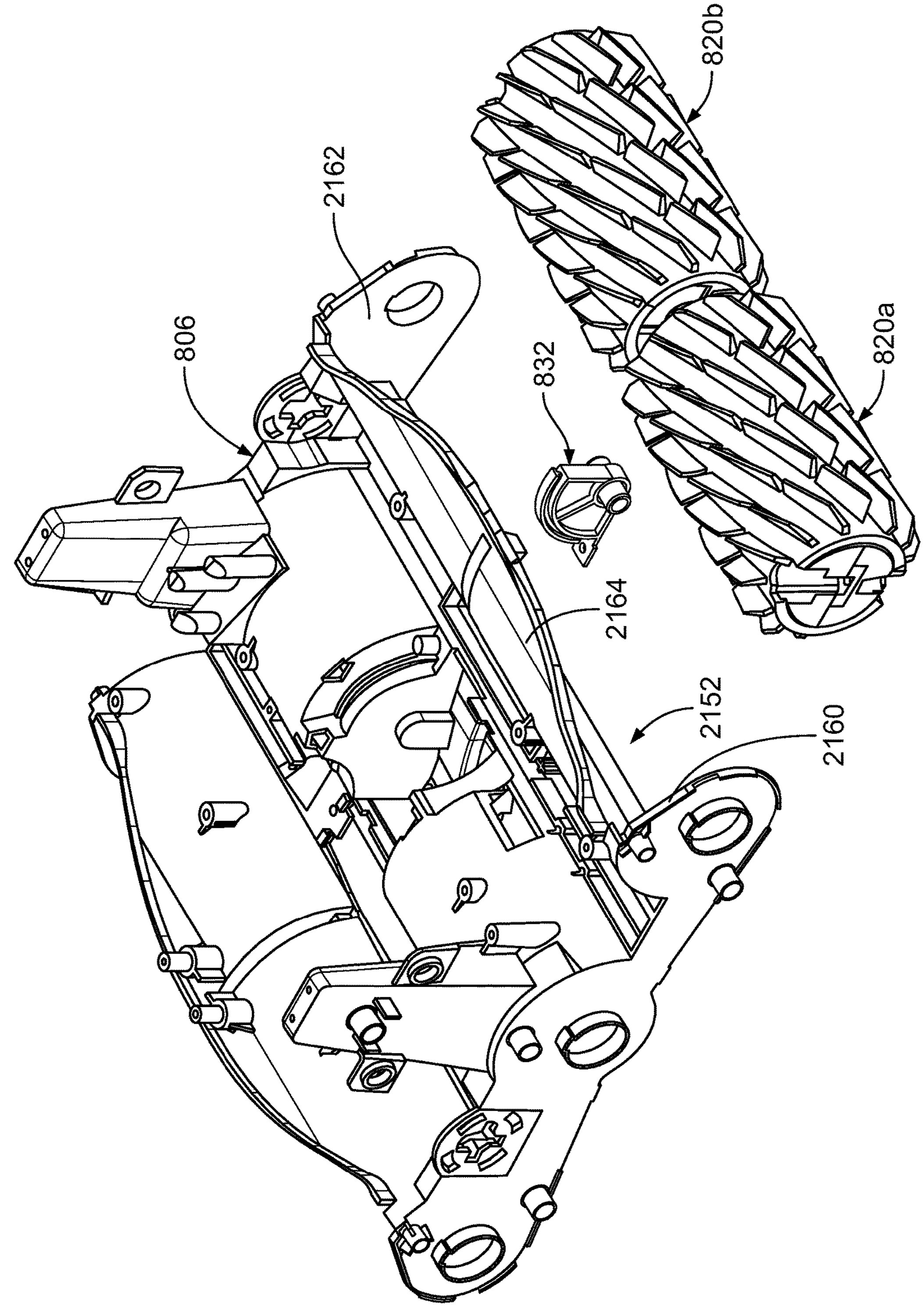
FIG. 95 is an exploded view of the chassis, first roller, and second roller of FIG. 94, and further showing a roller latch utilized to secure the first and second rollers to the chassis.
Figure 96:
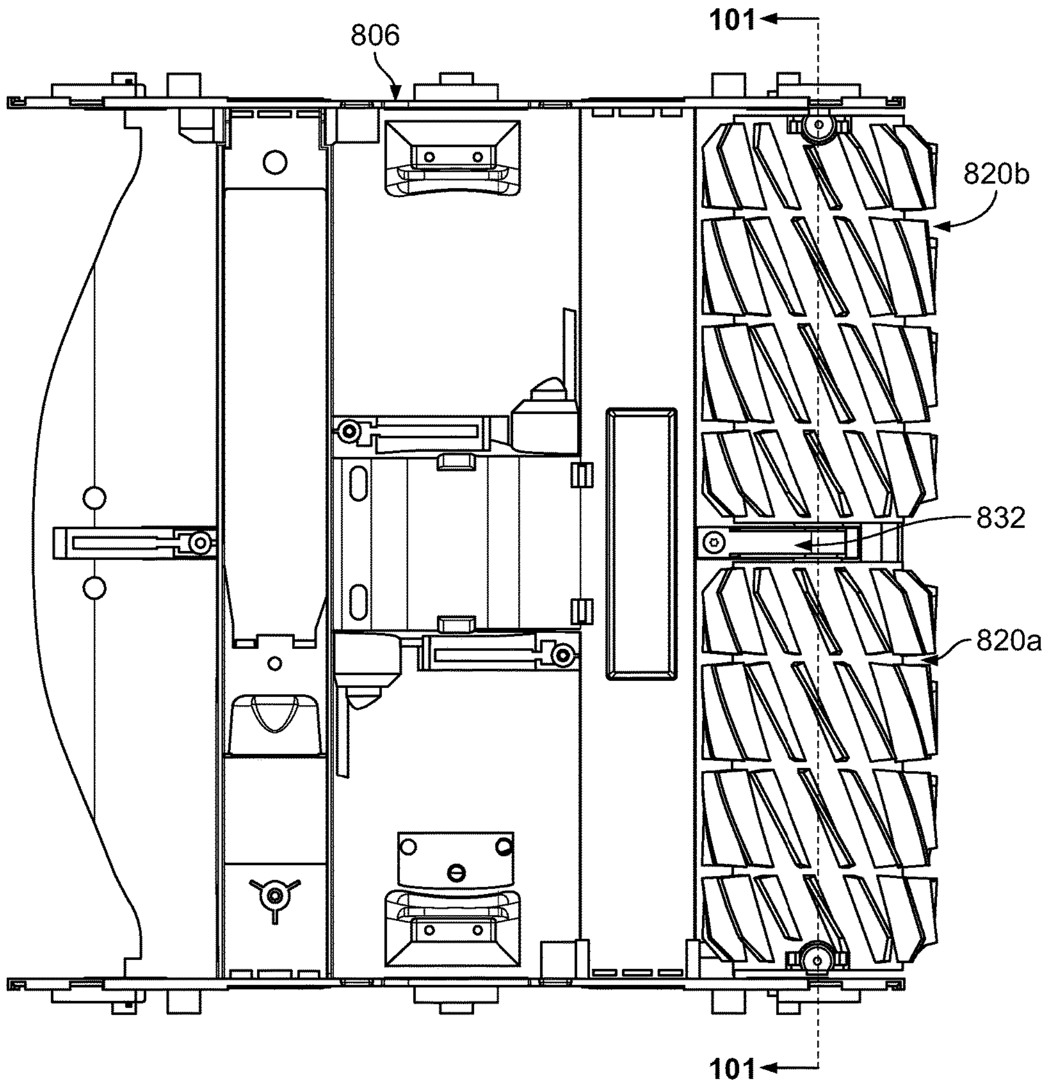
FIG. 96 is a bottom view of the chassis, first roller, and second roller of FIG. 94.
Figure 97:
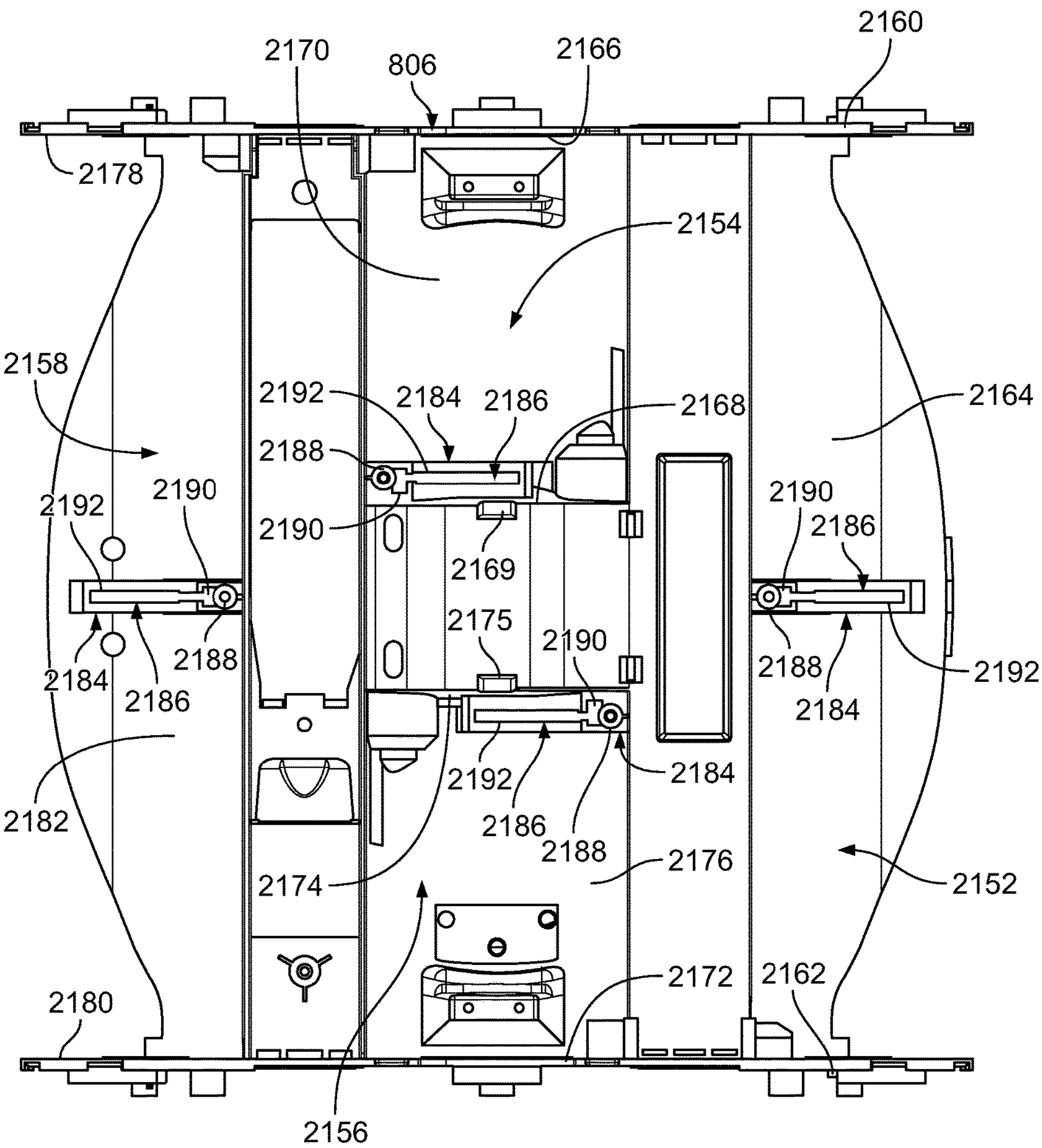
FIG. 97 is a bottom view of the chassis of FIG. 94.

FIGS. 94-104 illustrate a removable roller 820*a*-802*f* functionality of the present disclosure. In connection with FIGS. 94-104, reference is made to the first and second rollers 820*a*, 820*b* for illustrative purposes only, and it should be understood that the description provided in connection with how the first and second rollers 820*a*, 802*b* can be removably engaged with the chassis holds true for the third, fourth, fifth, and sixth rollers 820*c*, 820*d*, 820*e*, 820*f* as well. FIGS. 94-96 are perspective, exploded, and bottom views showing the first and second rollers 820*a*, 820*b* connected to the chassis 806 with a roller latch 832. FIG. 97 is a bottom view of the chassis 806. The chassis 806 includes first, second, third, and fourth roller wells 2152, 2154, 2156, 2158. The first roller well 2152 is defined by a left sidewall 2160, right sidewall 2162, and a curved enclosure 2164 that extends between the left and right sidewalls 2160, 2162. The first roller well 2152 houses the first and second rollers 820*a*, 820*b*. The second roller well 2154 includes a left sidewall 2166, an inner sidewall 2168 having a mount 2169, and a curved enclosure 2170 that extends between the left and inner sidewalls 2166, 2168. The second roller well 2154 houses the third roller 820*c*. The third roller well 2156 includes a right sidewall 2172, an inner sidewall 2174 having a mount 2175, and a curved enclosure 2176 that extends between the right and inner sidewalls 2172, 2174. The third roller well 2156 houses the fourth roller 820*d*. The fourth roller well 2158 is defined by a left sidewall 2178, right sidewall 2180, and a curved enclosure 2182 that extends between the left and right sidewalls 2178, 2180. The fourth roller well 2158 houses the fifth and sixth rollers 820*e*, 820*f*. Each of the roller wells 2152, 2154, 2156, 2158 include a latch receiver 2184. The latch receiver 2184 for the first and fourth roller wells 2152, 2158 is positioned at the middle of the respective curved enclosure 2164, 2182, while the latch receiver 2184 for the second and fourth roller wells 2154, 2156 is positioned adjacent the respective inner sidewall 2168, 2174. Each latch receiver 2184 is generally arcuate in shape and includes a slot 2186 that extends through the respective curved enclosure 2164, 2170, 2176, 2182, and a mounting boss 2188. Each slot 2186 includes an opening 2190 and a track 2192 extending from the opening 2188. The opening 2190 has a greater width than the track 2192.

Figure 98:
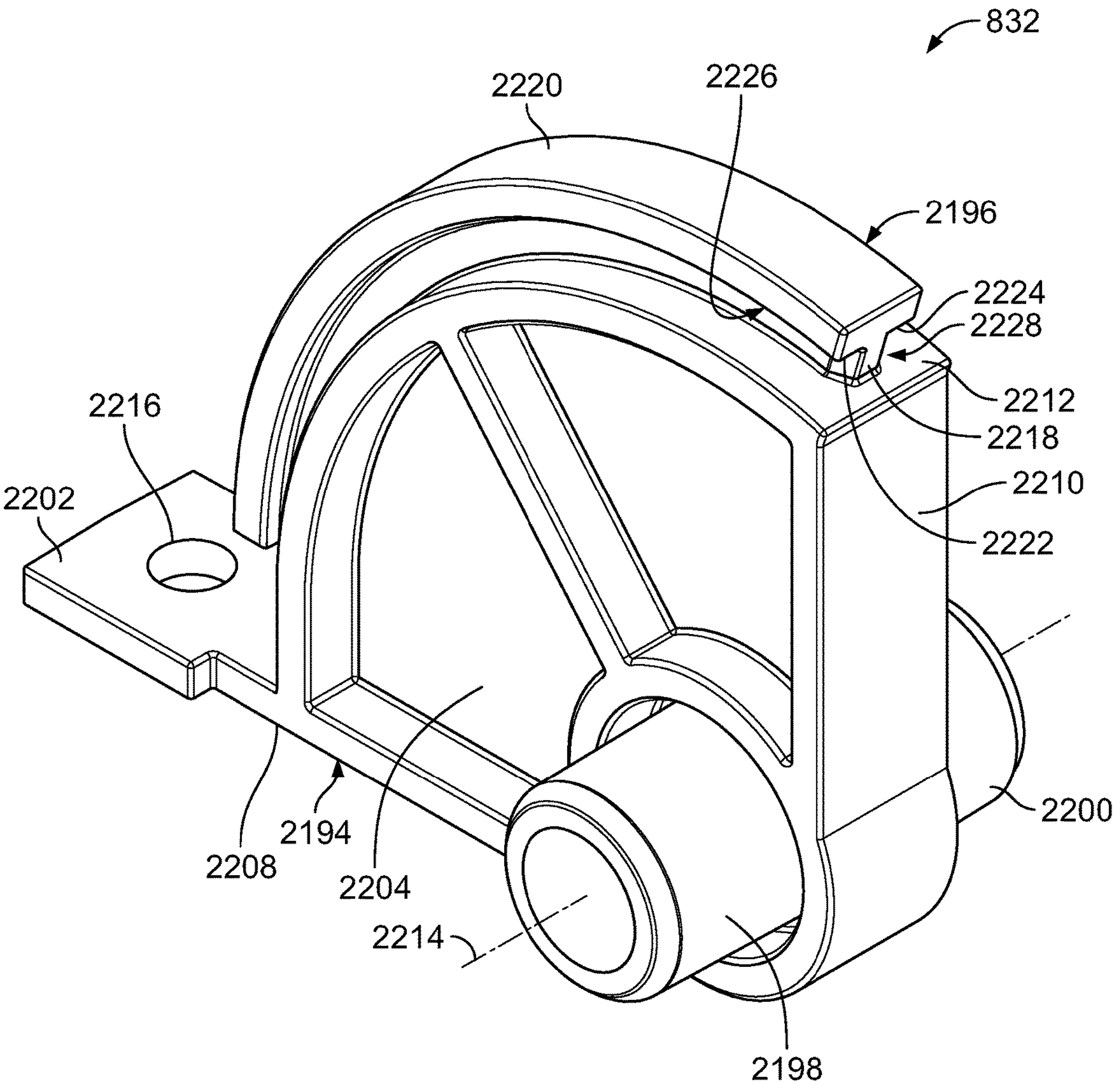
FIG. 98 is a perspective view of the roller latch of FIG. 95.
Figure 99:
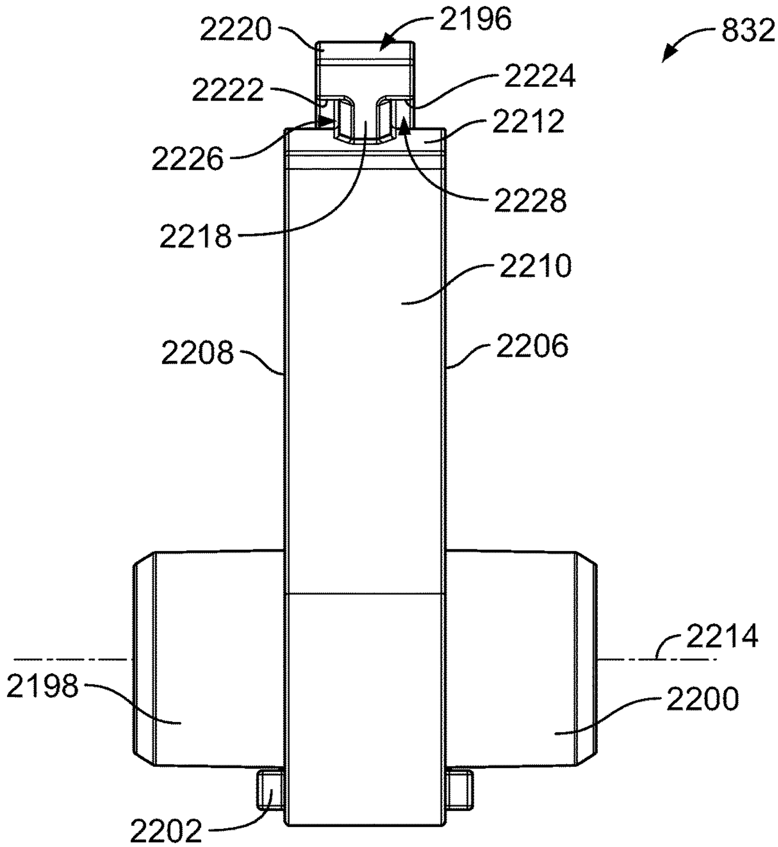
FIG. 99 is a front view of the roller latch of FIG. 98.
Figure 100:
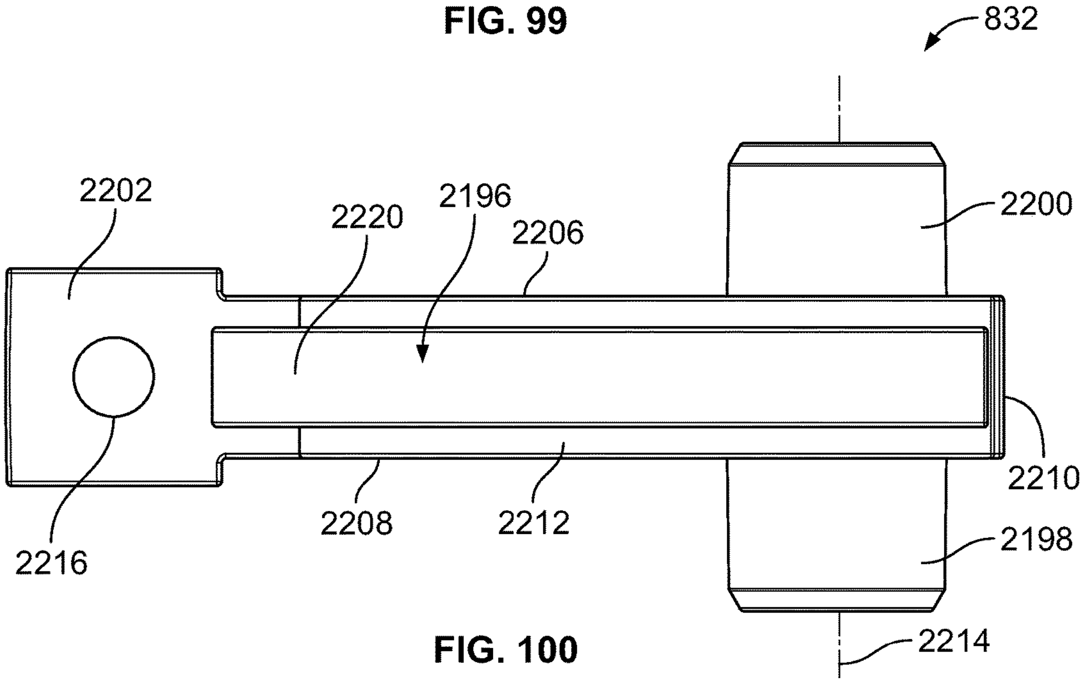
FIG. 100 is a top view of the roller latch of FIG. 98.

FIGS. 98-100 are perspective, front, and top views of the roller latch 832, respectively. The roller latch 832 includes a body 2194, a rider 2196, a first mounting protrusion 2198, a second mounting protrusion 2200, and a locking tab 2202. The body 2194 generally has a quarter-circle shape and includes a first lateral side 2204, a second lateral side 2206, a first transverse side 2208, a second transverse side 2210, and an arcuate transverse side 2212. The first and second transverse sides 2208, 2210 extend between the first and second lateral sides 2204, 2206, and are generally perpendicular to one another. The arcuate transverse side 2212 extends between the first and second lateral sides 2204, 2206, and extends from an end of the first transverse side 2208 to an end of the second transverse side 2210 in an arc. The first and second mounting protrusions 2198, 2200 extend perpendicularly from the first and second lateral sides 2204, 2206, respectively, and are positioned at the radial center of the arcuate transverse side 2212, e.g., the center point that the curvature of the arcuate transverse side 2212 is measured from, which is indicated as the latch axis 2214. The locking tab 2202 extends from and is planar with the first transverse side 2208, and includes a hole 2216 extending through it. The rider 2196 is generally t-shaped and extends from the arcuate transverse side 2212. Particularly, the rider 2196 includes a neck 2218 and a head 2220 that extends laterally beyond the neck 2218 and includes a left shoulder 2222 and a right shoulder 2224. The neck 2218 is connected with the arcuate transverse side 2212, while the head 2220 is displaced from the arcuate transverse side 2212 by the neck 2218. The rider 2196 defines a left channel 2226 and a right channel 2228. The roller latch 832 is generally configured to rotate about the first and second mounting protrusions 2198, 2200 and the latch axis 2214.

Figure 101A:
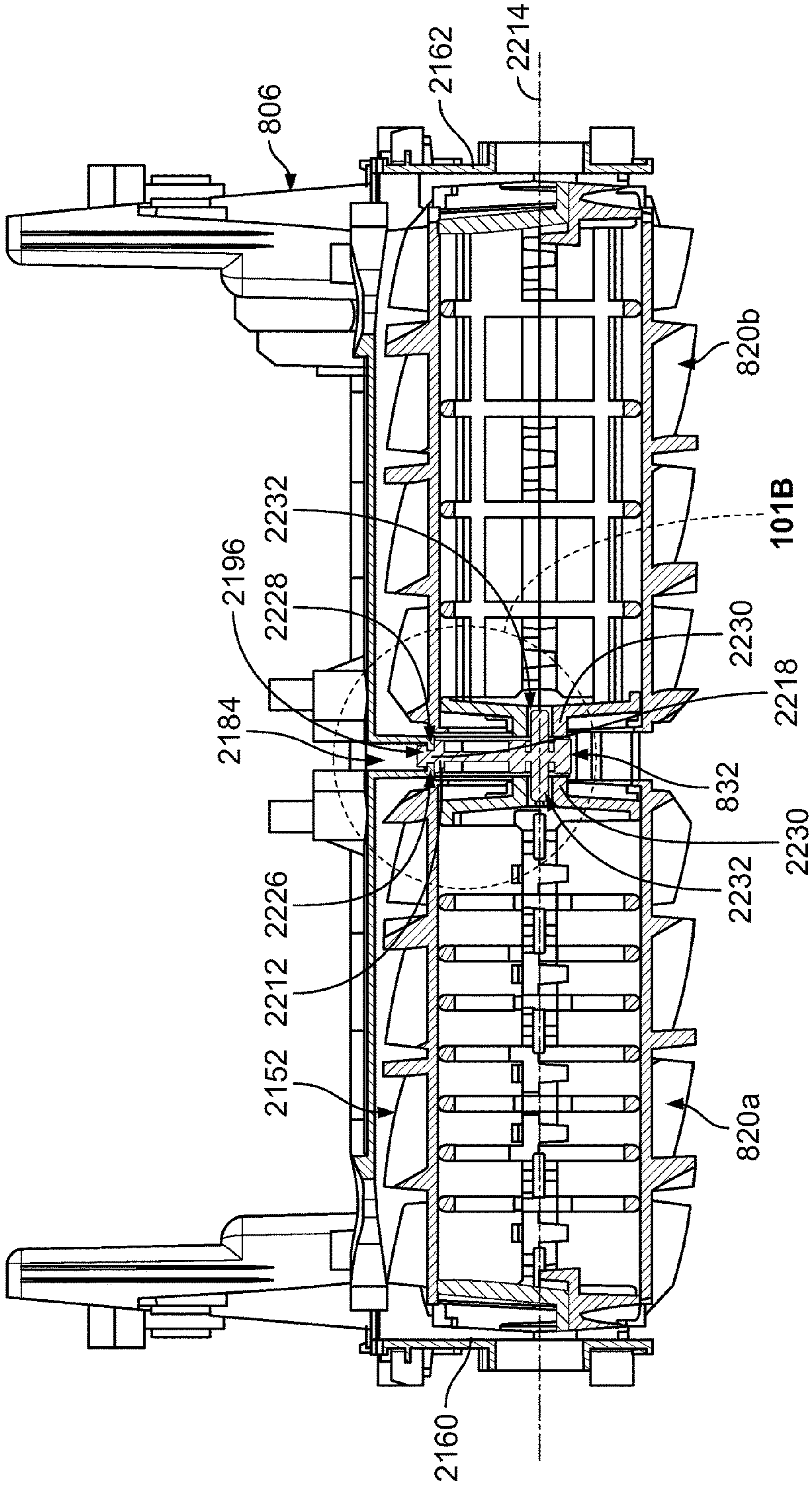
FIG. 101A is a sectional view of the chassis, first roller, and second roller of FIG. 96 taken along line 101-101 of FIG. 96.
Figure 101B:
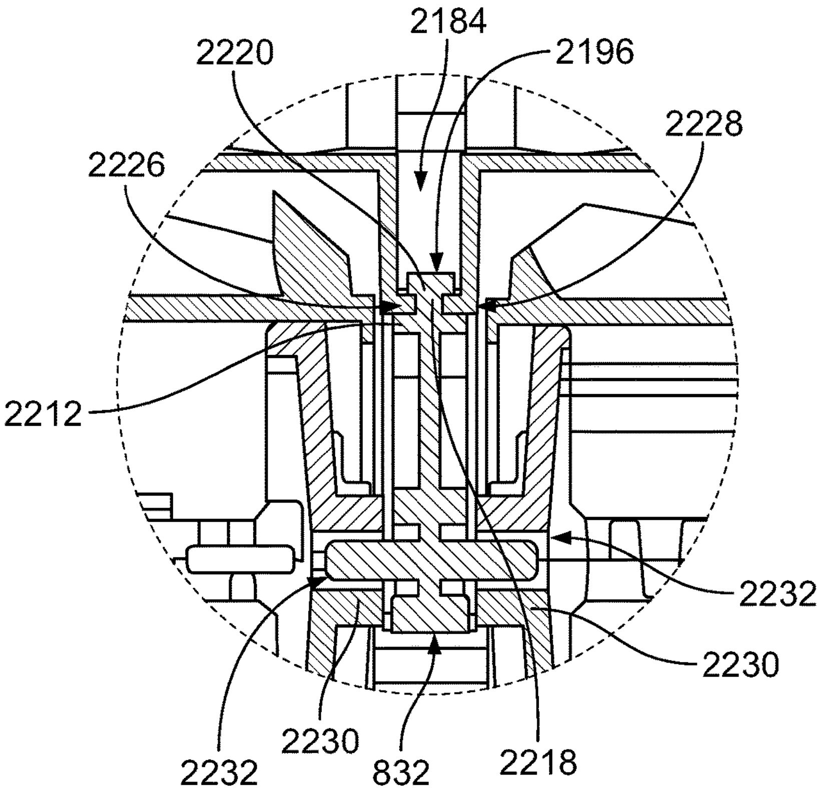
FIG. 101B is a an enlarged view of Area 101B of FIG. 101A.
Figure 102:
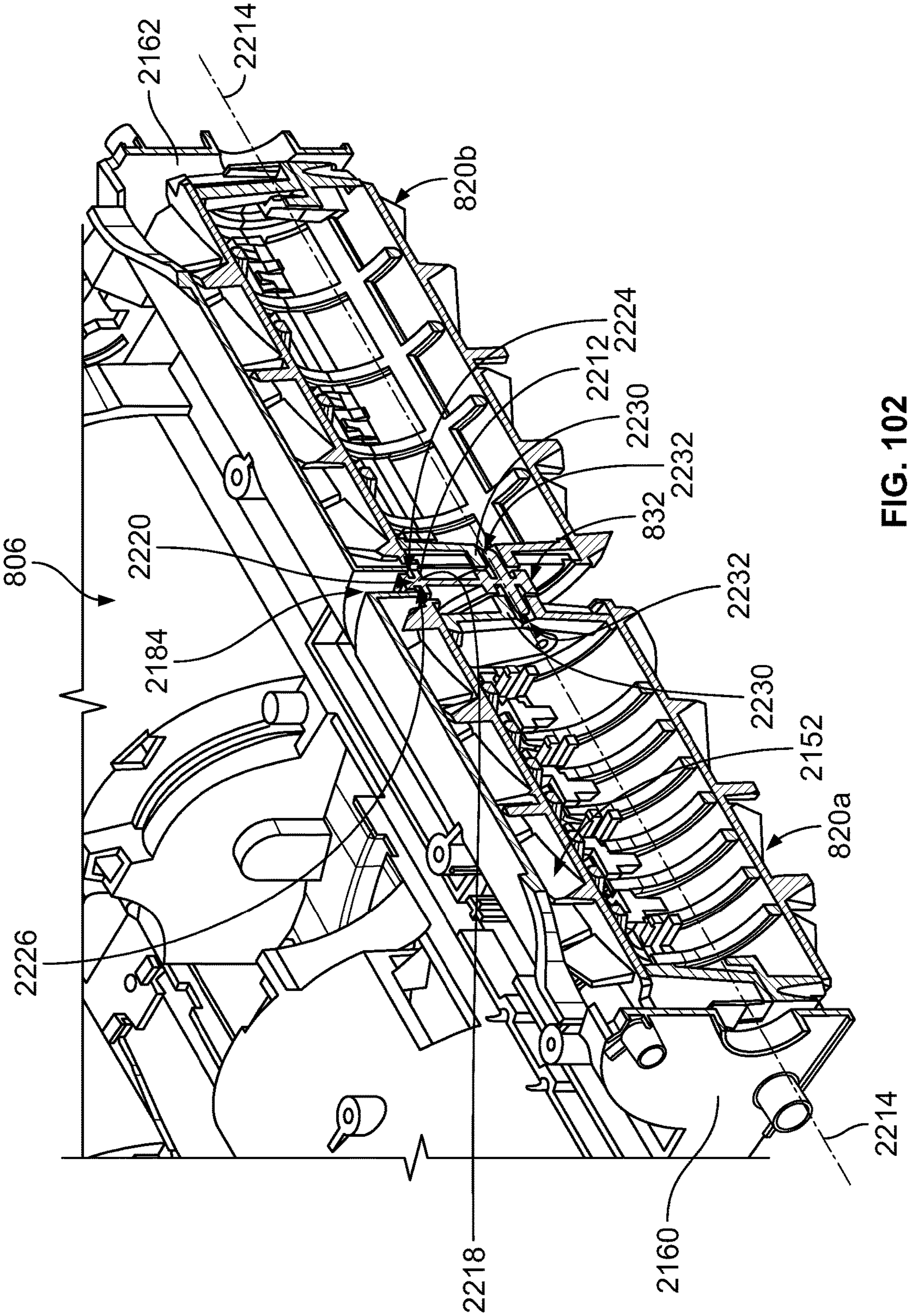
FIG. 102 is a sectional view of the chassis, first roller, and second roller of FIG. 96 taken along line 101-101 of FIG. 96 and shown at a perspective view.

FIG. 101A is a sectional view taken along line 101-101 of FIG. 96. FIG. 101B is an enlarged view of Area 101B of FIG. 101A. FIG. 102 is a perspective view of the sectional view of FIG. 101A. FIGS. 101A, 101B, and 102 illustrate the roller latch 832 engaged with the first and second rollers 820*a*, 820*b* and secured to the chassis 806. While reference is made to the first and second rollers 820*a*, 820*b* in connection with FIGS. 101A, 101B, and 102, it should be understood that the below description holds true for the other rollers (e.g., 820*c*, 820*d*, 820*e*, 820*f*) as well, which are substantially similar in construction. In this regard, it is preliminarily noted that the rollers 820*a*, 820*b* are substantially similar in construction, and the same reference numeral is used for matching components. Construction of the rollers 820*a*, 820*b* is discussed in greater detail in connection with FIGS. 105-125 below.

As shown in FIGS. 101A, 101B, and 102, the rollers 820*a*, 820*b* include a mounting boss 2230 on one side thereof, which defines an inner cavity 2232 that is configured to receive one of the first and second mounting protrusions 2198, 2200 of a roller latch 832. To removably engage the roller 820*a*, 820*b* with the roller latch 832, the first protrusion 2198 or the second protrusion 2200 is inserted into the inner cavity 2232 of the mounting boss 2230 of the respective roller 820*a*, 820*b*, such that the roller 820*a*, 820*b* can rotate about the first or second protrusion 2198, 2200.

For the first and fourth roller wells 2152, 2158, which house two rollers (e.g., rollers 820*a* and 820*b*, or rollers 820*e* and 820*f*) each, the roller latch 832 engages the mounting boss 2230 of both rollers (e.g., rollers 820*a*, 820*b*). Particularly, the first mounting protrusion 2198 engages the inner cavity 2232 of the first roller 820*a* and the second mounting protrusion 2200 engages the inner cavity 2232 of the second roller 820*a*. This allows the two rollers (e.g., rollers 820*a* and 820*b*, or rollers 820*e* and 820*f*) to rotate about the roller latch 832. The other side of the roller 820*a*, 820*b*, 820*e*, 820*f* can be mounted to the chassis 806 with a roller mount 833 (see FIG. 89).

For the second and fourth roller wells 2154, 2156, which house one roller (e.g., roller 820*c* or roller 820*d*) each, the roller latch 832 engages the mounting boss 2230 of that roller (e.g., roller 820*c* or roller 820*d*) and the mount 2169, 2175 of the respective roller well 2154, 2156. Particularly, the first mounting protrusion 2198 engages the inner cavity 2232 of the roller (e.g., roller 820*c* or roller 820*d*) while the second mounting protrusion 2198 is secured in the mount 2169, 2175. This allows the roller (e.g., roller 820*c* or rollers 820*d*) to rotate about the roller latch 832. The other side of the roller 820*c*, 820*d* can be mounted to the chassis 806 with a roller mount 833 (see FIG. 89).

FIGS. 101A, 101B, and 102 also show the roller latch 832 engaged with the latch receiver 2184 of the first roller well 2152. When the roller latch 832 is engaged with a latch receiver 2184, the neck 2218 of the roller latch 832 is positioned within the track 2192 of the latch receiver slot 2186, the head 2220 and the arcuate transverse side 2212 of the roller latch 832 are on opposite sides of the track 2192, and a portion of the latch receiver 2184 is positioned within the left and right channels 2226, 2228 of the roller latch 832. The head 2220 and the arcuate transverse side 2212 of the roller latch 832 are sized to be wider than the width of the track 2192 to prevent removal of the roller latch 832 from the latch receiver 2184 due to axial forces. Specifically, if a roller 820*a*-820*f* is pulled, the shoulders 2222, 2224 of the roller latch 832 will engage a portion of the latch receiver 2184 and prevent removal of the roller 820*a*-820*f*. When the roller latch 832 is engaged with a latch receiver 2184, the locking tab 2202 of the roller latch 832 will be positioned adjacent the mounting boss 2188 of the latch receiver 2184 such that a fastener, e.g., a screw, can be inserted through the hole 2216 of the locking tab 2202 and engaged with the mounting boss 2188 to prevent rotation of the roller latch 832. Thus, when the neck 2218 is positioned within the track 2192, and the locking tab 2202 is engaged with the mounting boss 2188 by a fastener, the roller latch 832 and associated rollers 820*a*-820*f* are fully secured to the chassis 806.

Figure 103:
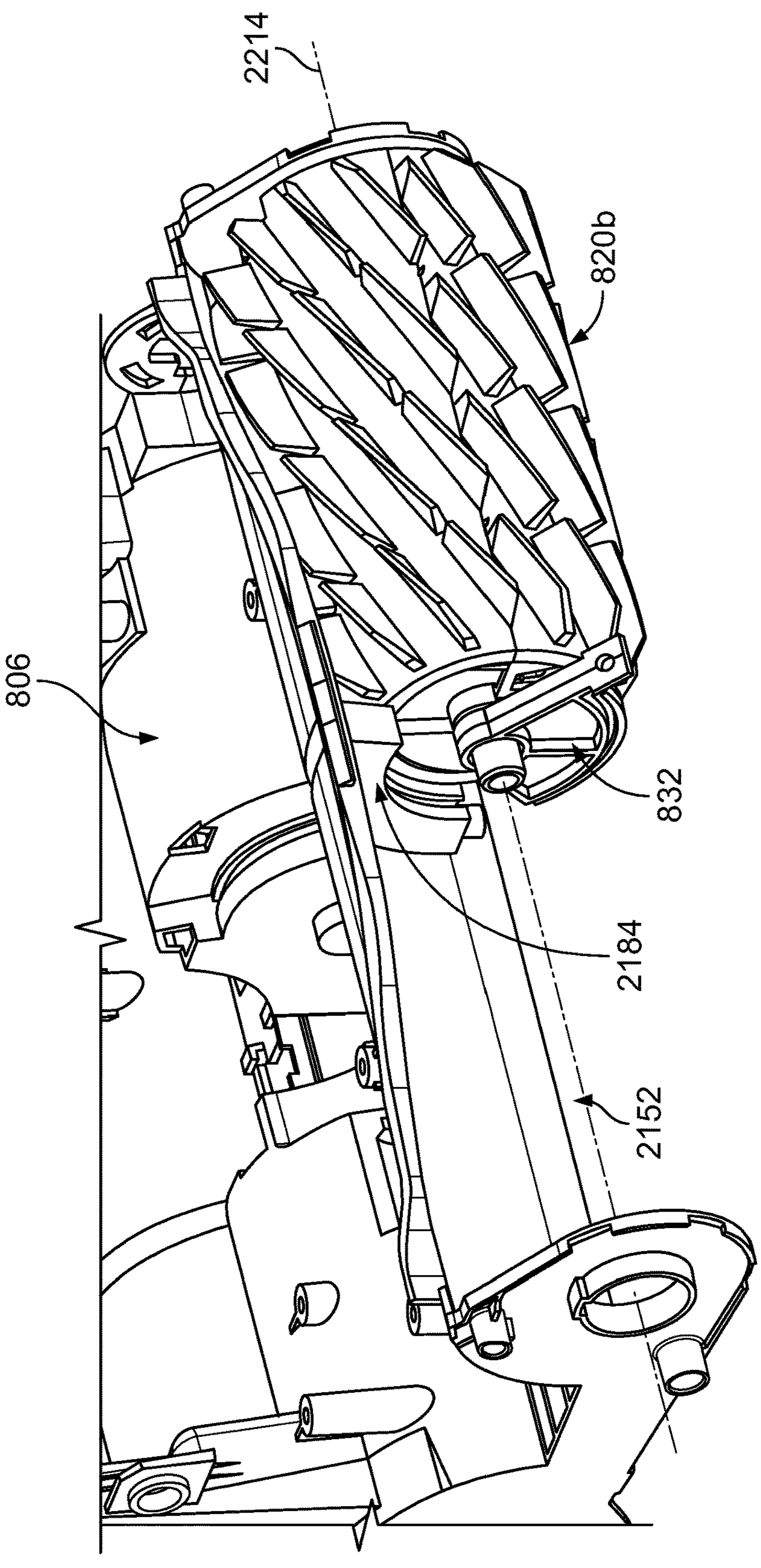
FIG. 103 is a perspective view showing the second roller being installed on the chassis with the roller latch in an unlocked position.
Figure 104:
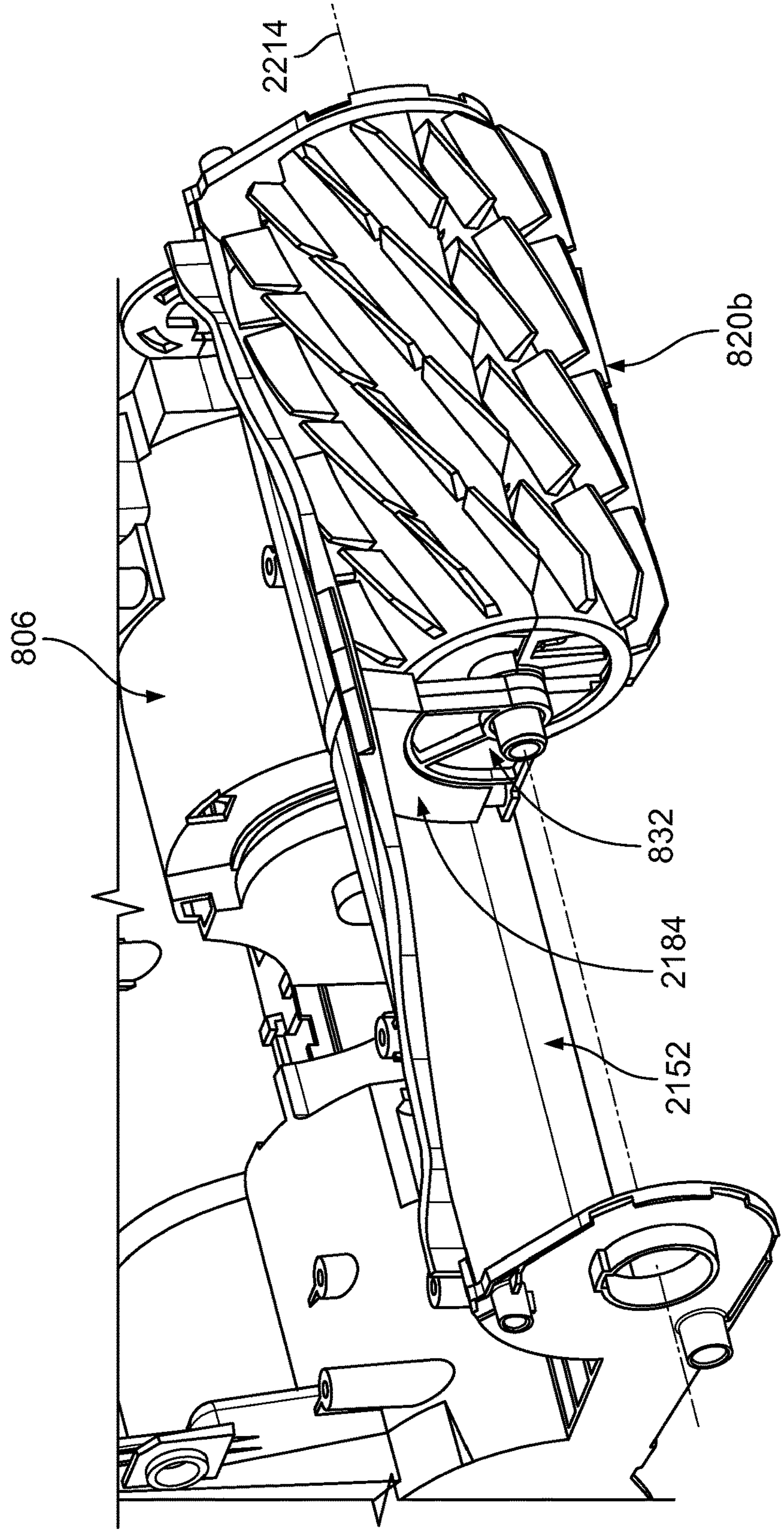
FIG. 104 is a perspective view showing the second roller installed on the chassis with the roller latch in a locked position.

FIGS. 103 and 104 illustrate installation of a roller latch 832 with a latch receiver 2184 of the chassis 806. FIG. 103 is a perspective view showing the second roller 820*b* being installed in the first roller well 2152 with a roller latch 832 engaged with the second roller 820*b*, but disengaged from the latch receiver 2184, e.g., in an unlocked position. FIG. 104 is substantially similar to FIG. 103, but with the roller latch 832 rotated and in engagement with the latch receiver 2184, e.g., in a locked position. Upon connection with the roller(s) 820*a*-820*f*, the roller latch 832 can be engaged with the latch receiver 2184 for the respective roller well 2152, 2154, 2156, 2158. To do so, the rollers 820*a*-820*f* and connected roller latch 832 are first positioned in their respective roller well 2152, 2154, 2156, 2158 (see FIG. 103). The roller latch 832 is then rotated in a first direction about the latch axis 2214 (see FIG. 104). When properly positioned, rotation of the roller latch 832 about the latch axis 2214 causes the rider 2196 to be inserted into the slot 2186. Specifically, rotation causes the head 2220 and neck 2218 of the roller latch rider 2196 to be inserted into the opening 2190 and track 2192 of the latch receiver slot 2186, respectively. The user can continue to rotate the roller latch 832 until the locking tab 2202 of the roller latch 832 is adjacent the mounting boss 2188 of the latch receiver 2184, and a fastener, e.g., a screw, can then be inserted through the hole 2216 of the locking tab 2202 and engaged with the mounting boss 2188 to fully secure the roller latch 832 and all associated rollers 820*a*-820*f* to the chassis 806, as shown in FIG. 104. The roller latch 832 and all associated rollers 820*a*-820*f* can be removed from the chassis 806 by simply removing the fastener and rotating the roller latch 832 about the latch axis 2214 in a second direction that is opposite to the first direction until the rider 2196 is entirely disengaged from the slot 2186.

Figure 106:
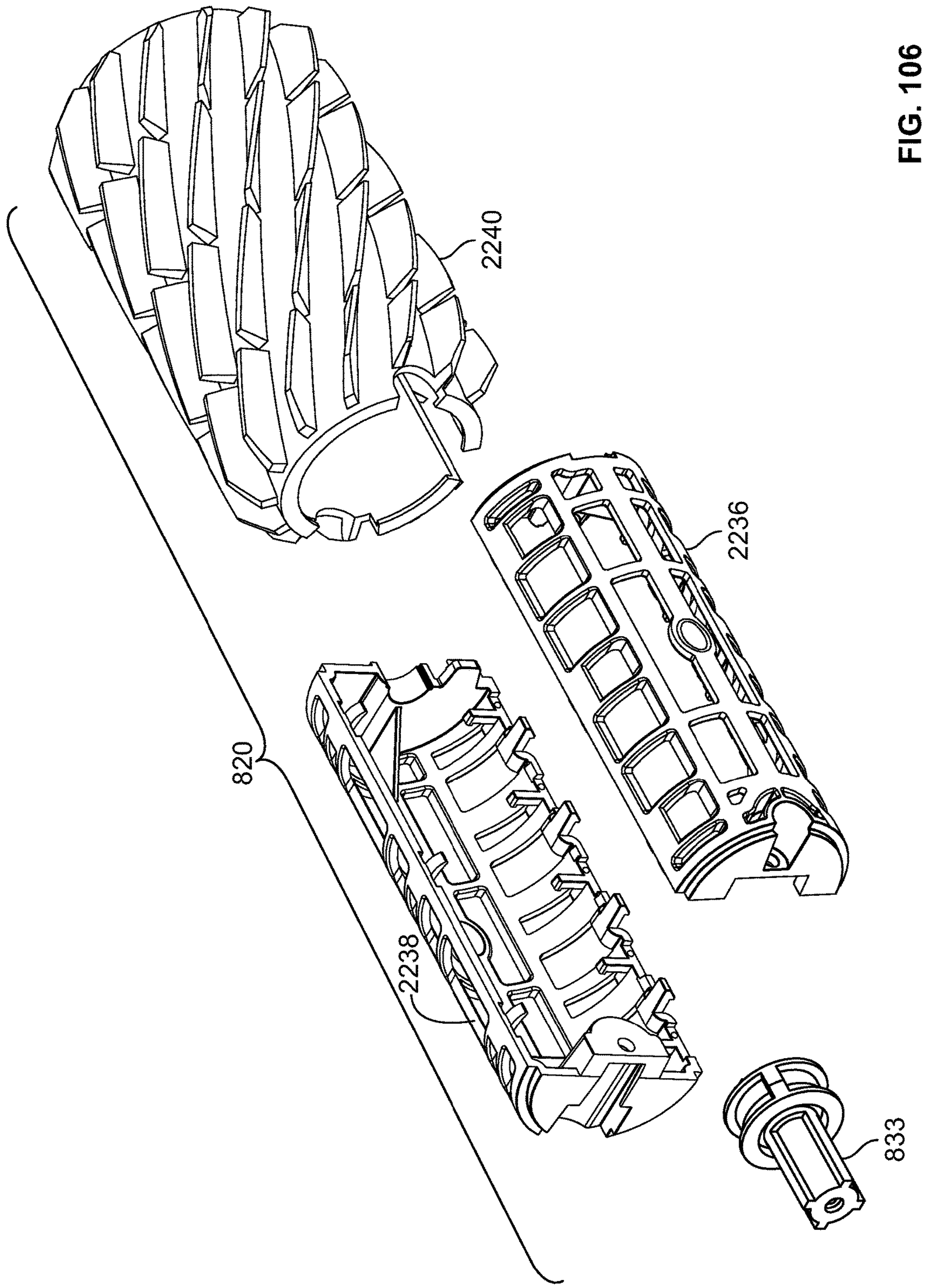
Figure 107:
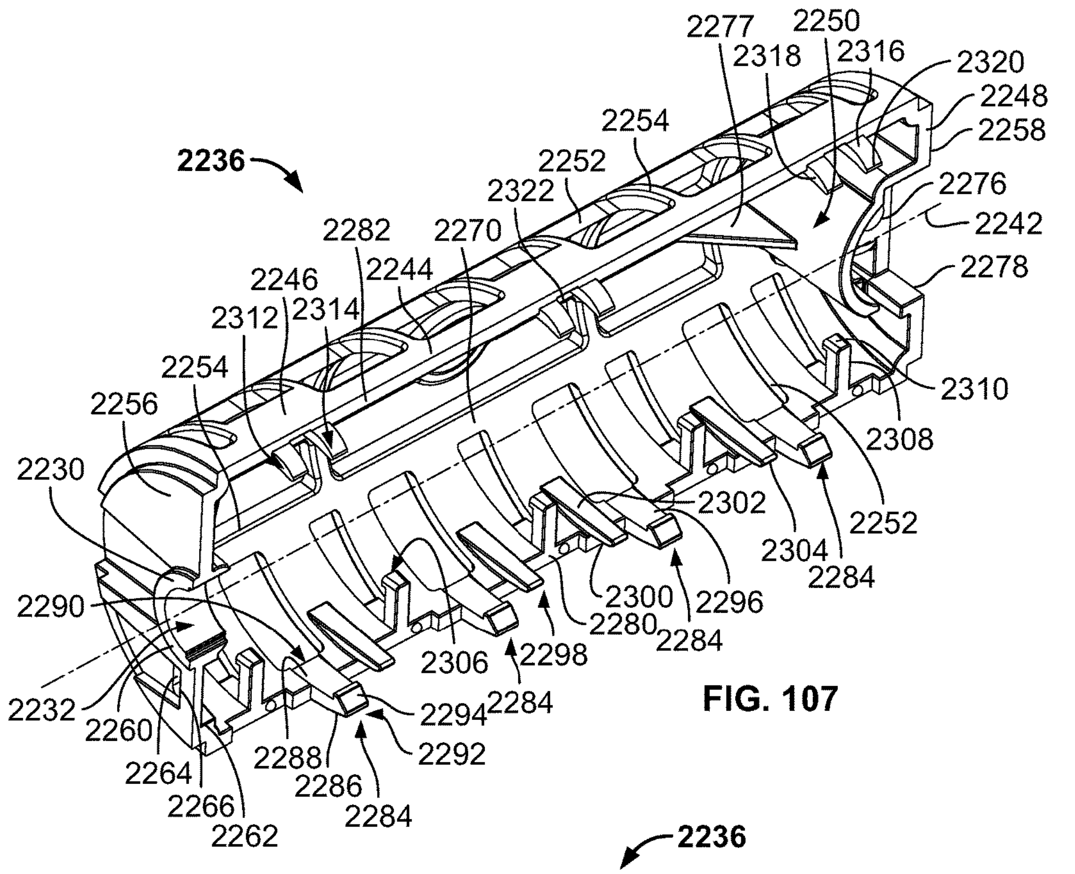
Figure 108:
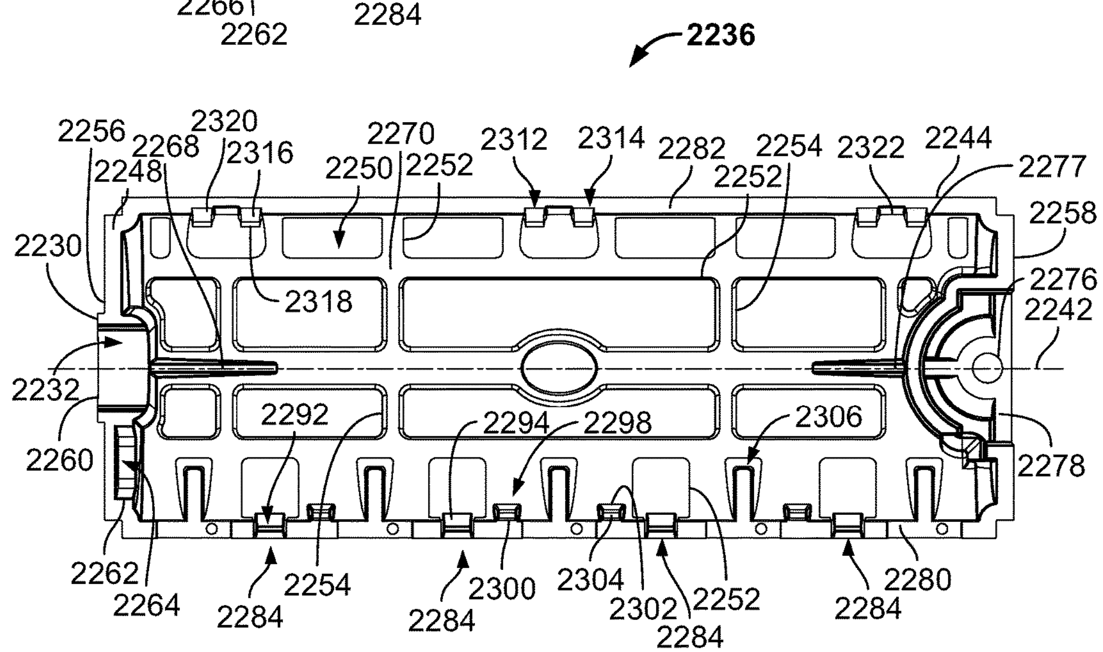
Figure 109:
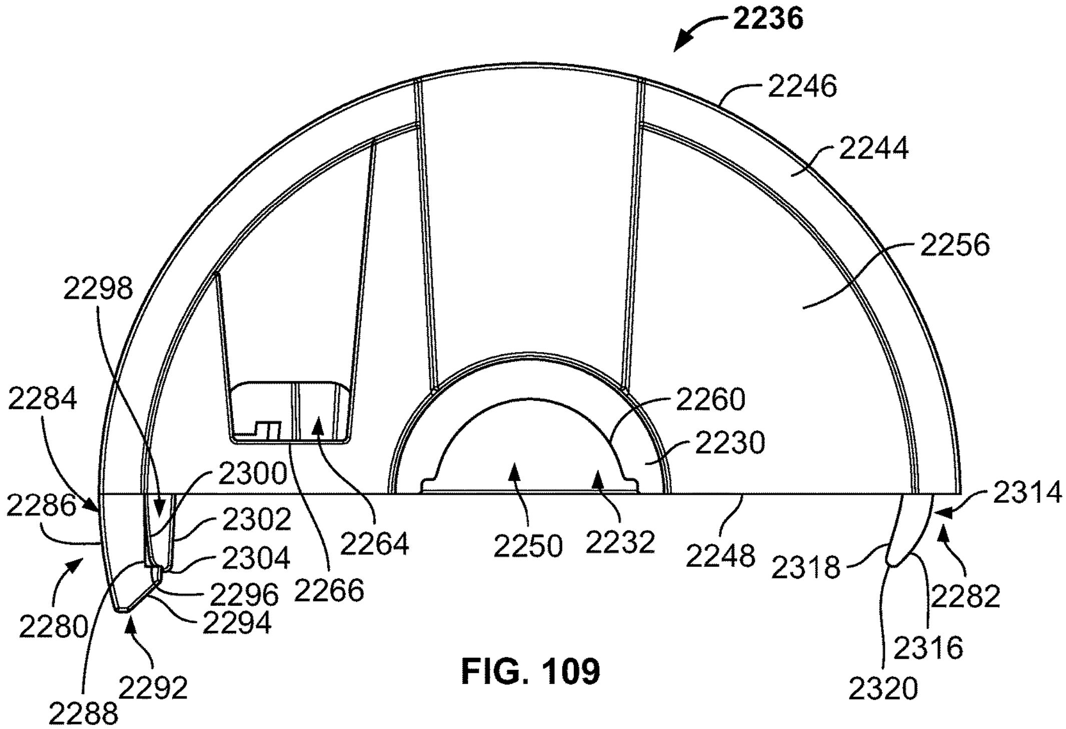
Figure 110:
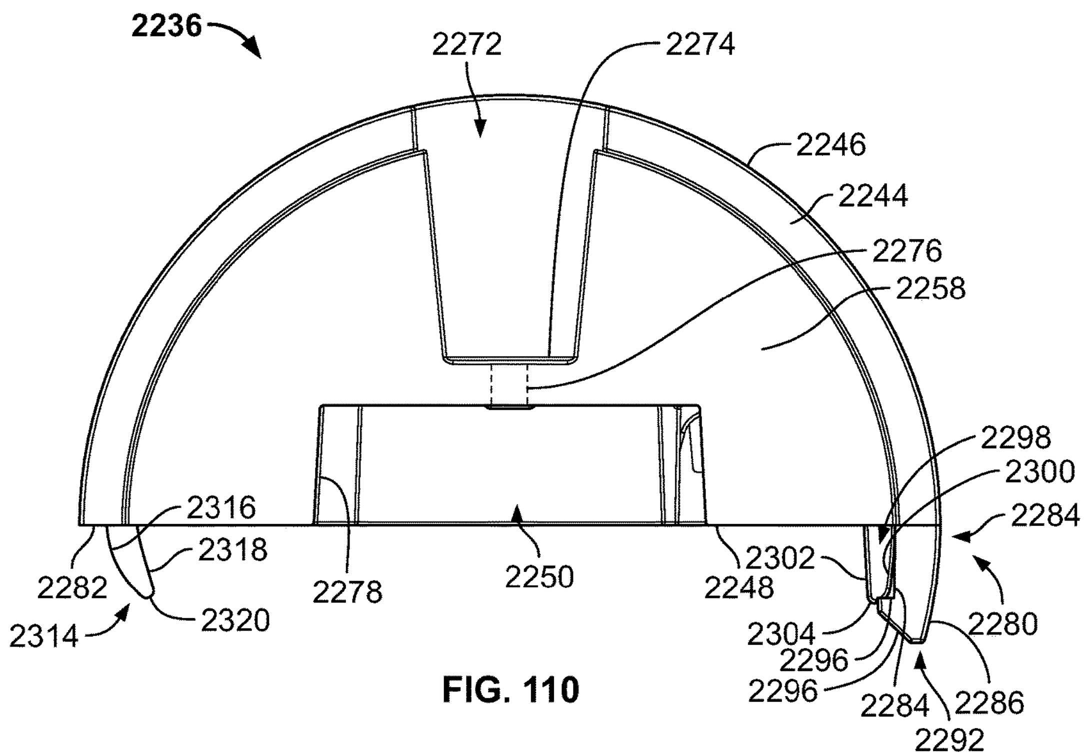
Figure 111:
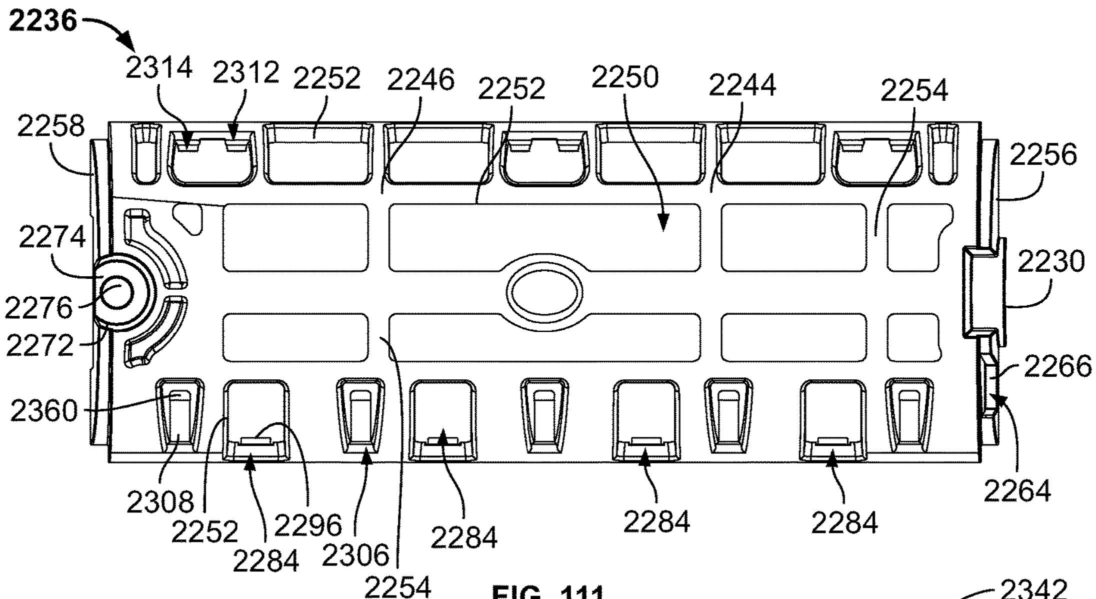
Figure 112:
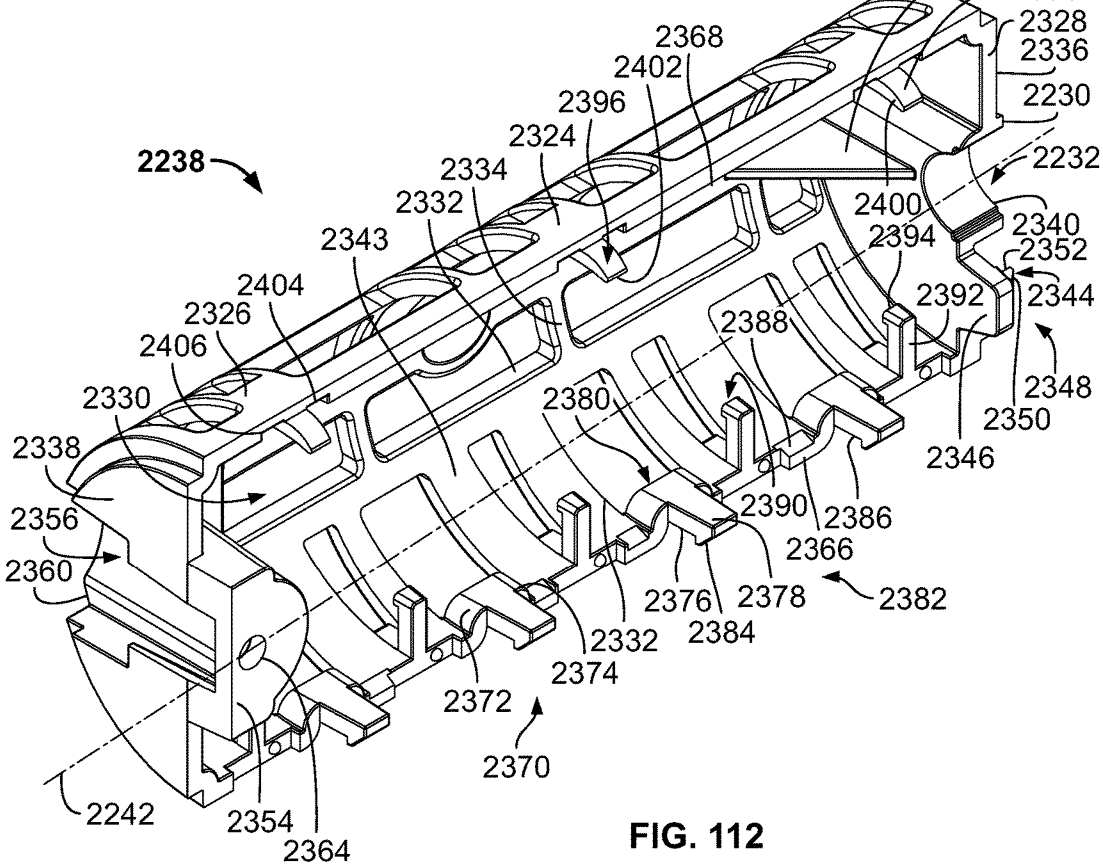
Figure 113:
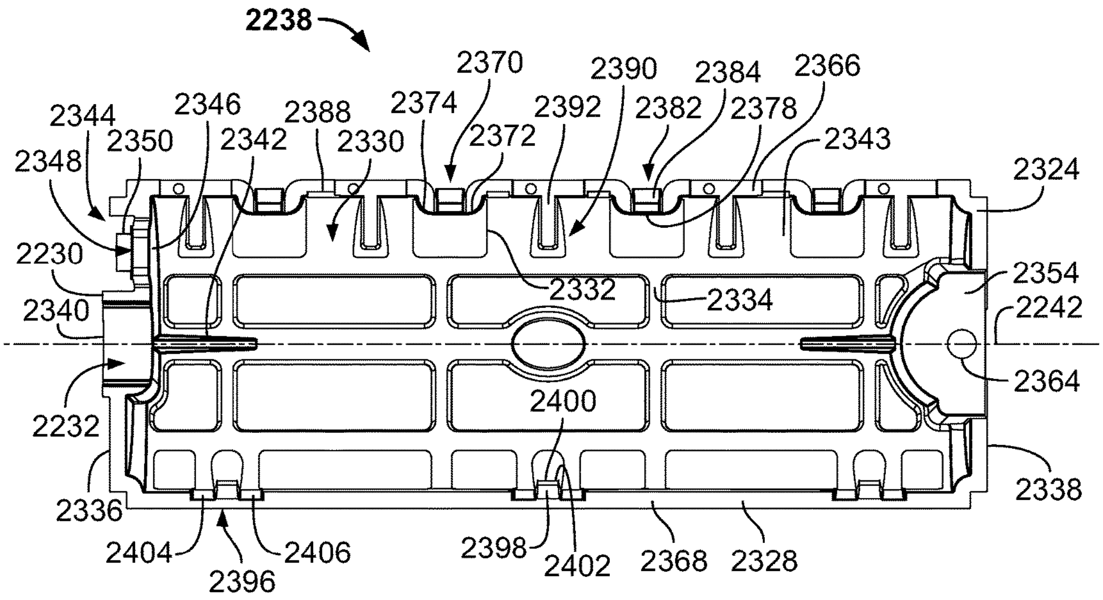
Figure 114:
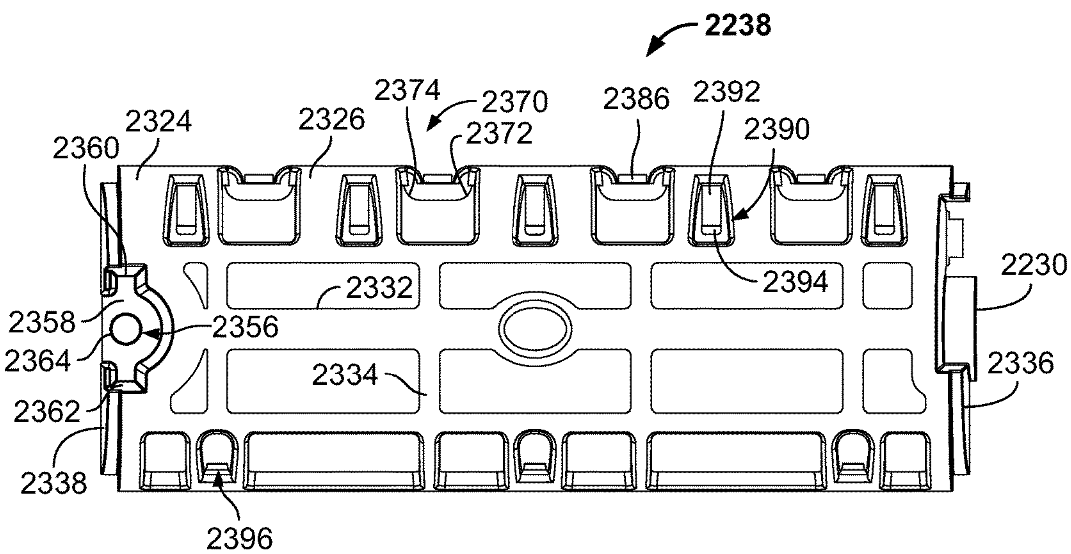
Figure 115:
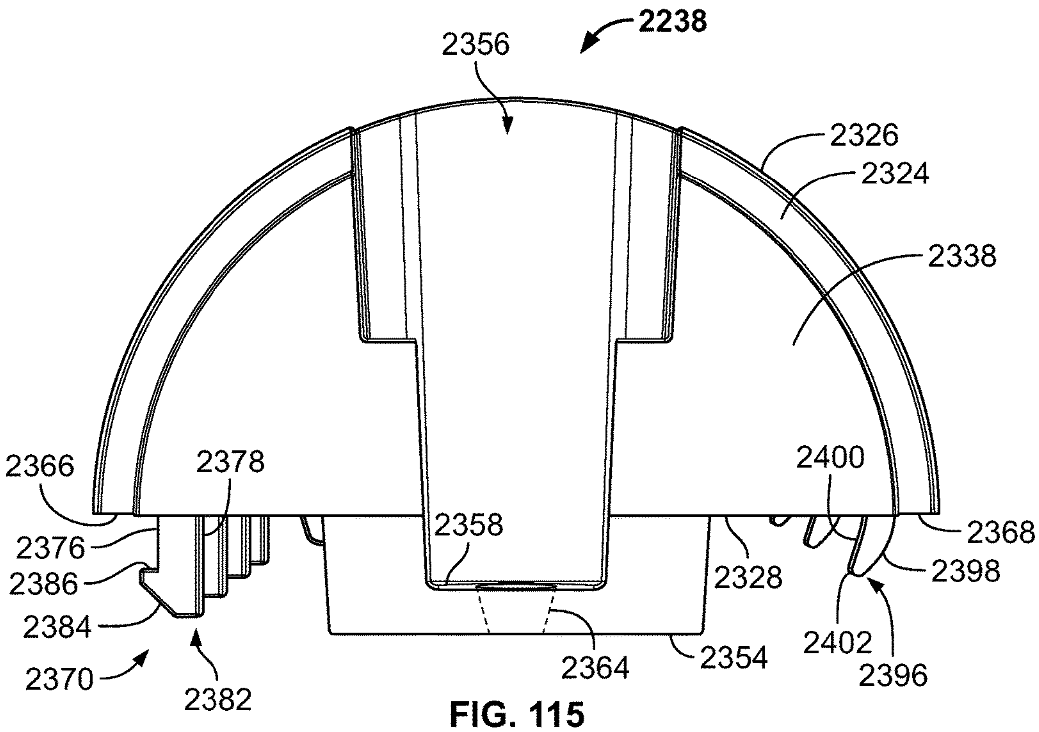
Figure 116:
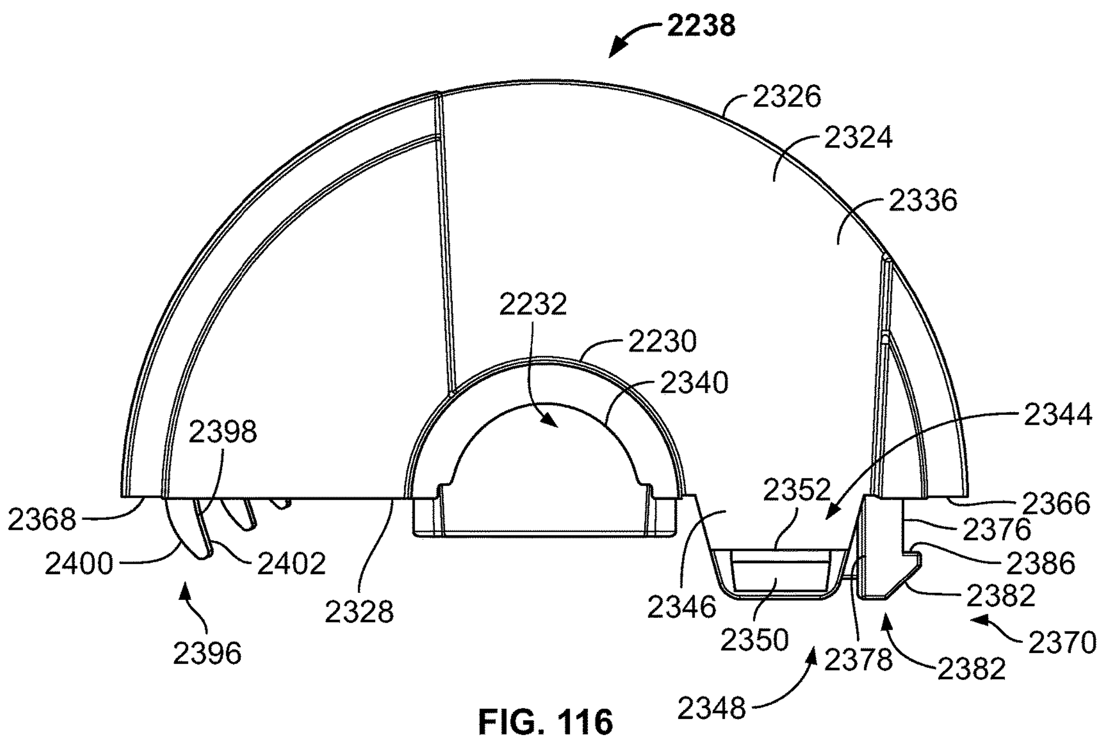

As discussed above, the pool cleaner 800 includes rollers 820*a-f*, each of which is formed as an assembly referred to herein as roller assembly 820. FIGS. 105 and 106 show perspective and exploded views of the roller assembly 820. The roller assembly 820 includes a cage assembly 2234 including a first cage half 2236 and a second cage half 2238, a roller cover 2240 (e.g., a brush) engaged with the cage assembly 2234, and a roller mount 833 engaged with the cage assembly 2234. The roller assembly 820 includes a central longitudinal axis 2242 that defines the axis about which the roller assembly 820 rotates. In some embodiments, the cage assembly 2234 can be fabricated from a plastic material.

FIGS. 107-111 show perspective, bottom, side and top views of the first cage half 2236. The first cage half 2236 includes a body 2244 with a top portion 2246 and a bottom portion 2248. The top portion 2246 defines a substantially curved outer surface with a convex curvature. The bottom portion 2248 defines a substantially flat surface along the perimeter of the bottom portion 2248, and includes a hollow inner cavity 2250 within the perimeter of the bottom portion 2248. The flat surface of the perimeter of the bottom portion 2248 defines a mating surface configured to mate or be positioned adjacent to a complementary mating surface of the second cage half 2238. The first cage half 2236 includes a plurality of openings 2252 of different sizes extending from the top portion 2246 into the inner cavity 2250, and separated by ribs 2254. The openings 2252 reduce the overall weight of the first cage half 2236 and allow for water to pass into and out of the inner cavity 2250 while maintaining the overall convex curvature of the top portion 2246, thereby providing sufficient support to the roller cover 2240.

The first cage half 2236 includes first and second side surfaces 2256, 2258 on opposing sides of the body 2244. The first side surface 2256 includes a central, semicircular hole 2260 raised from the side surface 2256 to form the mounting boss 2230. When the first side surfaces 2256 of the first and second cage halves 2236, 2238 are mated together, the semicircular hole 2260 and a complementary semicircular hole of the second cage half 2238 form the inner cavity 2232 leading into cavity 2260. The inner surface of the hole 2260 includes a supporting rib 2268 connected to the inner surface 2270 of the first cage half 2236. The supporting rib 2268 extends substantially parallel to the central longitudinal axis 2242.

The first side surface 2256 includes a slot 2262 extending substantially perpendicularly from the bottom portion 2248 a partial distance towards the top portion 2246. The slot 2262 is disposed adjacent and offset from the hole 2260. The first side surface 2256 includes an opening 2264 extending substantially perpendicularly to the slot 2262 and extending into the cavity 2250. The intersection between the slot 2262 and opening 2264 forms an edge 2266 on the outer side of the first side surface 2256. As will be discussed in greater detail below, the slot 2262 and edge 2266 form a snap fit interlocking mechanism for providing part of the engagement between the first and second cage halves 2236, 2238.

The second side surface 2258 includes a bore 2272 extending from the top portion 2246 towards the bottom portion 2248. The bore 2272 is tapered such that the diameter of the bore 2272 is greater at the top portion 2246 than at a bottom surface 2274 of the bore 2272. At least a portion of the bore 2272 can be open to the outer edge of the second side surface 2258 such that the bore 2272 is not fully enclosed on all sides. A central opening 2276 extends through the bottom surface 2274 of the bore 2272 and has a diameter dimensioned smaller than the diameter of the bore 2272 at the bottom surface 2274.

The second side surface 2258 includes a cutout 2278 (e.g., a substantially rectangular cutout) extending from the bottom portion 2248 towards the top portion 2246 to offset the bottom surface 2274 of the bore 2272 from a plane defined by the bottom portion 2248. As will be discussed in greater detail below, the cutout 2278 is configured and dimensioned to receive and mate with a complementary extension of the second cage half 2238. The opening 2276 can receive a fastening element (e.g., a screw or bolt) to secure the first and second cage halves 2236, 2238 at the second side surface 2258. The inner surface 2270 includes a supporting rib 2277 connected to the outer wall of the bore 2272 and extending substantially parallel to the central longitudinal axis 2242 in the direction of the supporting rib 2268.

The bottom portion 2248 includes a first connecting edge 2280 and a second connecting edge 2282 on opposing sides of the first cage half 2236. The connecting edges 2280, 2282 are substantially parallel to each other and perpendicular to the bottom portion 2248 of the side surfaces 2256, 2258. The first connecting edge 2280 includes tabs 2284 (e.g., first tabs) spaced from each other and extending away from the bottom portion 2248. Each tab 2284 includes an outer surface 2286 that substantially follows the curvature of the top portion 2246, and an inner surface 2288 that is substantially linear or planar. Each tab 2284 includes a proximal end 2290 and a distal end 2292. The distal end 2292 includes a snap engaging end formed by a tapered inner surface 2294 and an edge 2296. The edge 2296 faces inwardly (e.g., in the direction of the central longitudinal axis 2242).

The first connecting edge 2280 further includes fingers or protrusions 2298 extending from the inner surface 2270 of the first cage half 2236 and away from the bottom portion 2248. Because the protrusions 2298 extend from the inner surface 2270, each protrusion 2298 is inwardly offset from the tabs 2284. Each protrusion 2298 can be disposed spaced from but adjacent to each of the tabs 2284. Each protrusion 2298 includes an outer surface 2300 defining a convex surface and an inner surface 2302 that is substantially linear or planar. The endpoint 2304 of the protrusion 2298 defines a rounded surface to ensure smooth introduction into and mating against the inner surface of the second cage half 2238.

The first connecting edge 2280 includes engagement posts 2306 extending perpendicularly from the inner surface 2270 of the first cage half 2236 immediately adjacent to the first connecting edge 2280. Each engagement post 2306 includes a linear extension 2308 and a perpendicular edge 2310 extending from the distal end of the linear extension 2308. The edge 2310 can extend inwardly towards the top portion 2246. As will be discussed in greater detail below, the engagement posts 2306 can be introduced into openings of the roller cover 2240 to maintain engagement of the roller cover 2240 with the first cage half 2236.

The second connecting edge 2282 includes spaced one or more pairs of fingers or protrusions 2312, 2314 extending from the inner surface 2270 of the first cage half 2236 and away from the bottom portion 2248. Each protrusion 2312, 2314 can be substantially similar to the protrusions 2298, and also includes a curved outer surface 2316, a substantially linear or planar inner surface 2318, and a rounded endpoint 2320. The protrusions 2312, 2314 can be spaced directly on opposite sides of a groove 2322 formed in the inner surface 2270. As will be discussed in greater detail below, each groove 2322 can be configured and dimensioned to at least partially receive the outer surface of a complementary finger or protrusion extending from the second connecting edge of the second cage half 2238.

FIGS. 112-116 show perspective, bottom, top and side views of the second cage half 2238. The second cage half 2238 be substantially similar in structure to the first cage half 2236, except for the distinctions noted herein, such as differing interlocking/engagement elements on the bottom portion and the side surfaces. The second cage half 2238 includes a body 2324 with a top portion 2326 and a bottom portion 2328. The top portion 2326 defines a substantially curved outer surface with a convex curvature that matches the curvature of the top portion 2246 of the first cage half 2236. Thus, when mated together at the bottom portions 2248, 2328, the outer surface of the cage assembly 2234 forms a substantially cylindrical shape.

The bottom portion 2328 defines a substantially flat surface along the perimeter of the bottom portion 2328, and includes a hollow inner cavity 2330 within the perimeter of the bottom portion 2328. The flat surface of the perimeter of the bottom portion 2328 defines a mating surface configured to mate or be positioned adjacent to the mating bottom portion 2248 of the first cage half 2236. Similar to the first cage half 2236, the second cage half 2238 includes a plurality of openings 2332 of different sizes extending from the top portion 2326 into the inner cavity 2330, and separated by ribs 2334.

The second cage half 2238 includes first and second side surfaces 2336, 2338 on opposing sides of the body 2324. The first side surface 2336 includes a central, semicircular hole 2340 raised from the side surface 2336 to form the mounting boss 2230. When the first side surfaces 2256, 2336 of the first and second cage halves 2236, 2238 are mated together, the semicircular holes 2260, 2340 form the inner cavity 2232 leading into the cavity 2330. The inner surface of the hole 2340 includes a supporting rib 2342 connected to the inner surface 2343 of the second cage half 2238. The supporting rib 2342 extends substantially parallel to the central longitudinal axis 2242.

The first side surface 2336 includes a tab 2344 extending from the bottom portion 2328 and away from the top portion 2326. The tab 2344 includes a substantially linear extension 2346 and a snap engaging end 2348 at the distal end of the linear extension 2346. The snap engaging end 2348 includes a tapered outer surface 2350 and an edge 2352. The side walls of the tab 2344 can be tapered to assist with insertion of the tab 2344 into the slot 2262 of the first cage half 2236. In particular, during engagement of the first side surfaces 2256, 2336, the tab 2344 can be inserted into the slot 2262 until the edge 2352 snaps into the opening 2264 and around the edge 2266. The tab 2344 and slot 2262 thereby provide for a snap fit engagement between the first and second cage halves 2236, 2238.

The second side surface 2338 includes an extension 2354 protruding from the bottom portion 2328. The second side surface 2338 includes a bore 2356 extending from the top portion 2326 towards the bottom portion 2328 and into the extension 2354. The bore 2356 can be tapered such that the diameter of the bore 2356 is greater at the top portion 2326 than at a bottom surface 2358 of the bore 2356. At least a portion of the bore 2356 can be open to the outer edge of the second side surface 2338 such that the bore 2356 is not fully enclosed on all sides. The bore 2356 includes grooves 2360, 2362 on opposing sides of the bore 2356 and positioned adjacent to the outer wall of the second side surface 2338. The grooves 2360, 2362 also extend from the top portion 2326 to the bottom surface 2358. The grooves 2360, 2362 provide a guided passage for insertion of the roller mount 833.

A central opening 2364 extends through the bottom surface 2358 of the bore 2356 and has a diameter dimensioned smaller than the diameter of the bore 2356 at the bottom surface 2358. During assembly, the extension 2354 can be mated with the cutout 2278 of the first cage half 2236 until the openings 2276, 2364 are aligned and positioned adjacent to each other. The fastening element (e.g., a screw or bolt) can be passed through the openings 2276, 2364 and into the roller mount 833 to secure the first and second cage halves 2236, 2238 at the second side surfaces 2258, 2338.

The bottom portion 2328 includes a first connecting edge 2366 and a second connecting edge 2368 on opposing sides of the second cage half 2238 configured to mate with first and second connecting edges 2280, 2282 of the first cage half 2236, respectively. The connecting edges 2366, 2368 are substantially parallel to each other and perpendicular to the bottom portion 2328 of the side surfaces 2336, 2338. The first connecting edge 2366 includes tabs 2370 (e.g., second tabs) spaced from each other and extending away from the bottom portion 2328. Each tab 2370 can be inwardly offset from the plane defined by the first connecting edge 2366 (e.g., the outer surface of the second cage half 2238) towards the central longitudinal axis 2242. Rounded flanges 2372, 2374 connect each tab 2370 to the first connecting edge 2366.

Each tab 2370 can be substantially similar to the tabs 2284, except that the snap engaging end is directed outwardly in the opposing direction. In particular, each tab 2370 includes an outer surface 2376 and an inner surface 2378 that are substantially linear or planar. Each tab 2370 includes a proximal end 2380 and a distal end 2382. The distal end 2382 includes a snap engaging end formed by a tapered outer surface 2384 and an edge 2386. The edge 2386 faces outwardly (e.g., in the direction away from the central longitudinal axis 2242). The first connecting edge 2366 includes shoulders or grooves 2388 formed at the edge of the first connecting edge 2366 and extending along the inner surface 2343. The grooves 2388 are disposed adjacent to the tabs 2370. Each groove 2388 can be configured and dimensioned to at least partially receive the outer surface 2300 of the protrusions 2298 of the first cage half 2236.

The first connecting edge 2366 includes engagement posts 2390 extending perpendicularly from the inner surface 2343 of the second cage half 2238 immediately adjacent to the first connecting edge 2366. Each engagement post 2390 includes a linear extension 2392 and a perpendicular edge 2394 extending from the distal end of the linear extension 2392. The edge 2394 can extend inwardly towards the top portion 2326. As will be discussed in greater detail below, the engagement posts 2390 can be introduced into openings of the roller cover 2240 to maintain engagement of the roller cover 2240 with the second cage half 2238.

The second connecting edge 2368 includes fingers or protrusions 2396 (substantially similar to the protrusions 2312, 2314) extending from the inner surface 2343 of the second cage half 2238 and away from the bottom portion 2328. Each protrusion 2396 includes a curved outer surface 2398, a substantially linear or planar inner surface 2400, and a rounded endpoint 2402. The second connecting edge 2368 includes a groove 2404, 2406 formed in the inner surface 2343 immediately adjacent to and on opposite sides of each protrusion 2396. Each groove 2404, 2406 can be configured and dimensioned to at least partially receive the outer surface 2316 of the respective protrusions 2312, 2314 extending from the second connecting edge 2282 of the first cage half 2236.

FIGS. 117-119 show perspective and detailed views of the cage assembly 2234 including the first and second cage halves 2236, 2238 detachably interlocked relative to each other. During assembly, the second connecting edges 2282, 2368 are mated first as shown in FIG. 119. The second connecting edges 2282, 2268 can be positioned adjacent to each other such that the protrusion 2396 of the second cage half 2238 is aligned with the groove 2322 between the protrusions 2312, 2314 of the first cage half 2236. As the first and second cage halves 2236, 2238 are rotated towards each other using the second connecting edges 2282, 2268 as a pivot point, the outer surface 2398 of the protrusion 2396 at least partially enters and engages the groove 2322 of the first cage half 2236. At substantially the same time, the outer surfaces 2316 of the protrusions 2312, 2314 at least partially enter and engage the grooves 2404, 2406 of the second cage half 2238.

After engagement of the second connecting edges 2282, 2368, the first connecting edges 2280, 2366 can be engaged as shown in FIG. 118. As the first connecting edges 2280, 2366 are biased toward each other, the tabs 2284, 2370 at least partially flex and snap around each other to interlock the first and second cage halves 2236, 2238. In particular, the inner surface 2280 of the tab 2284 mates against the outer surface 2376 of the tab 2370. The tabs 2284, 2370 are dimensioned such that the edge 2386 of the tab 2370 snaps around and engages an inner edge of one of the openings 2252 of the first cage half 2236, and the edge 2296 of the tab 2284 snaps around and engages the distal end 2380 of the tab 2370, thereby inhibiting disengagement between the tabs 2284, 2370.

To ensure that the first and second cage halves 2236, 2238 do not disengage from each other during impact to the cage assembly 2234, the protrusions 2298 of the first cage half 2236 engage the inner surface 2343 of the second cage half 2238. In particular, as the tab 2284 slides over and engages the outer surface of the second cage half 2238, the outer surface 2300 of the protrusion 2298 slides into the groove 2388 formed in the inner surface 2343 of the second cage half 2238. The tab 2284 and protrusion 2298 therefore engage the first connecting edge 2366 of the second cage half 2238 from both the outer and inner surface 2343. If the cage assembly 2234 is impacted during use, the protrusion 2298 prevents the tab 2284 from lifting upwardly away from the tab 2370, thereby preventing disengagement between the tabs 2284, 2370. Thus, secure engagement of the first and second cage halves 2236, 2238 is maintained.

The tabs 2284, 2370 can be disengaged manually by flexing the tabs 2284, 2370 away from each other and pivoting the first connecting edges 2280, 2366 away from each other. As noted above, during engagement of the first and second cage halves 2236, 2238, the tab 2344 of the second cage half 2238 snaps into and engages the opening 2264 of the first cage half 2236 to prevent separation of the first side surfaces 2256, 2336. In some embodiments, weights can be inserted into the inner cavity 2250, 2330 between the first and second cage halves 2236, 2238 to control or customize the weight of the swimming pool cleaner 800. The weights can be greater in size than the openings 2254, 2332 such that the weights are maintained within the inner cavity 2250, 2330 while allowing a user to visualize the number of weights in the cage assembly 2234. In one embodiment, the weights can be used to adjust the buoyancy of the swimming pool cleaner 800. In some embodiments, the first and second cage halves 2236, 2238 can be sonic welded, clamped, or can include a living hinge therebetween.

FIGS. 120 and 121 show perspective and bottom views of the exemplary roller cover 2240. The roller cover 2240 can be fabricated from a flexible material (e.g., rubber, silicone, or the like) such that the roller cover 2240 can be rolled around the cage assembly 2234 to provide traction to the swimming pool cleaner 800. The roller cover 2240 includes a body 2408 with a top or outer surface 2410 and a bottom or inner surface 2412. The roller cover 2240 includes a first end 2414 configured to engage with the first cage half 2236 and a second end 2416 on the opposing side of the body 2408 configured to engage with the second cage half 2238.

The roller cover 2240 includes side edges 2418, 2420 extending between the first and second ends 2414, 2416.

The first end 2414 includes a first set of spaced openings 2422 (e.g., substantially square openings) adjacent to the edge of the first end 2414. The openings 2422 can be configured and dimensioned to receive therethrough engagement posts 2306 of the first cage half 2236. The first end 2414 includes a second set of spaced openings 2424 offset further from the edge of the first end 2414 than the openings 2422. Each of the openings 2424 can be positioned substantially between the openings 2422, and is configured and dimensioned to receive therethrough the tabs 2284 and protrusions 2298 of the first cage half 2236.

Similar to the first end 2414, the second end 2416 includes a first set of spaced openings 2426 (e.g., substantially square openings) adjacent to the edge of the second end 2416. The openings 2426 can be configured and dimensioned to receive therethrough engagement posts 2390 of the second cage half 2238. The second end 2416 includes a second set of spaced openings 2428 offset further from the edge of the second end 2416. Each of the openings 2428 can be positioned substantially between the openings 2426, and is configured and dimensioned to receive therethrough the tabs 2370 of the second cage half 2238.

The side edge 2418 can include two cutouts 2430, 2432. The cutout 2430 can be configured and dimensioned complementary to the outer surface of extension 2354 of the second cage half 2238 such that when the roller cover 2240 is rolled over the second cage half 2238, the edges of the cutout 2430 slide over and around the extension 2354. The cutout 2432 can be configured and dimensioned complementary to the outer surface of structure forming the bore 2272 of the first cage half 2236 such that when the roller cover 2240 is rolled over the first cage half 2236, the edges of the cutout 2432 slide over and around the structure forming the bore 2272. The side edge 2420 can be substantially linear (e.g., without cutouts).

The outer surface 2410 of the roller cover 2240 can include a plurality of traction elements 2434 extending therefrom. In some embodiments, the traction elements 2434 can be substantially similar in size and/or shape. In some embodiments, the traction elements 2434 adjacent to the side edges 2418, 2420 can include chamfered corners 2436 to ensure that the roller 820 passes objects in the swimming pool without catching on edges of the objects. In some embodiments, the traction elements 2434 can be of different sizes. In some embodiments, the traction elements 2434 can be in the form of, tapered linear extensions, bristles, or the like. the inner surface 2414 can be substantially flat or planar with no extensions.

FIG. 122 shows a top view of the first and second cage halves 2236, 2238 partially interlocked with the roller cover 2240. During assembly, the engagement posts 2306 of the first cage half 2236 can be passed through the openings 2422, thereby aligning the tabs 2284 and protrusions 2298 with the openings 2424. The engagement posts 2390 of the second cage half 2238 can be passed through the openings 2426, thereby aligning the tabs 2370 with the openings 2428. From the position shown in FIG. 122, the first cage half 2236 can be rolled clockwise such that the top surface or portion 2246 of the first cage half 2236 mates against the bottom surface 2412 of the roller cover 2240. The second cage half 2238 can be rolled counter-clockwise such that the top surface or portion 2326 of the second cage half 2238 mates against the bottom surface 2412 of the roller cover 2240.

Continued rolling of the first and second cage halves 2236, 2238 first interlocks the second connecting edges 2282, 2368, and subsequently interlocks the first connecting edges 2280, 2366 similar to FIGS. 117-119, while stretching the roller cover 2240 over the cage assembly 2234. The roller cover 2240 is thereby mated against the outer surface of the cage assembly 2234 and engagement of the first and second cage halves 2236, 2238 prevents separation of the roller cover 2240 from the cage assembly 2234.

FIGS. 123 and 124 are perspective and side views of an exemplary roller mount 833. The roller mount 833 includes a proximal end 2438 and a distal end 2440. The proximal end 2438 includes a substantially cylindrical extension 2442 with two linear flanges 2444, 2446 extending from opposite sides of the extension 2442. The extension 2442 includes an opening 2448 extending therethrough. In some embodiments, the opening 2448 can include internal threads configured to engage with a fastener. The roller mount 833 extends through the exterior and interior bushing halves 2096, 2098.

The roller mount 833 includes a geared section 2454 that extends from the substantially cylindrical extension 2442 and through the exterior and interior bushing halves 2096, 2098. The geared section 2454 includes a cylindrical body 2456 with linear protrusions 2458 extending parallel to the central longitudinal axis 2242. The distal end 2440 includes a central bore 2460 (e.g., a threaded bore) extending partially into the roller mount 833 along the central longitudinal axis 2242. The geared section 2454 can engage with a complementary opening within components configured to rotate the roller 820, and a fastener can be introduced into the central bore 2460 to maintain engagement of the roller mount 833 with such components.

During assembly, after the roller cover 2240 has been rolled over the first and second cage halves 2236, 2238, and the first and second cage halves 2236, 2238 have been interlocked relative to each other, the roller mount 833 can be engaged with the second side surfaces 2258, 2338 of the first and second halves 2236, 2238. In particular, as shown in FIG. 125, the flanges 2444, 2446 can be slid into the grooves 2360, 2362 of the bore 2356, and the extension 2442 can be slid into the bore 2356 until the extension 2442 and flanges 2444, 2446 abut the bottom surface 2358 of the bore 2356. The flanges 2444, 2446 maintain the roller mount 833 engaged with the second cage half 2238. A fastener (e.g., a screw, bolt, or the like) can be passed through the opening 2276 of the first cage half 2236, through the opening 2364 in the second cage half 2238, and threaded into the opening 2448 of the roller mount 833. Engagement of the fastener with the opening 2448 squeezes the extension 2354 into the cutout 2278 and ensures engagement between the second side surfaces 2258, 2338.

FIGS. 126-131 illustrate alternative embodiments for coupling the hydrocylonic particle separator assembly 804 to the pool cleaner body 802. FIG. 126 is a sectional view taken along line 126-126 of FIG. 56, and FIG. 127 is an enlarged view of Area 127 of FIG. 126. As explained in detail above, the pool cleaner 800 includes a pool cleaner body 802 and a hydrocyclonic particle separator assembly 804. The shaft 1078 of the hydrocyclonic particle separator assembly 804 is rotatably driven by the pump motor 2082 through engagement of the male member 2088 of the pump motor 2082 with the female member 1102 of the shaft 1078. The impeller 1082 is interconnected with the shaft 1078 such that it rotates along with the shaft 1078. As shown in FIGS. 126 and 127, the pump motor 2082 includes a stator 2462 having a plurality of electromagnets and a rotor 2464 having permanent magnets 2466 and a rotor shaft 2468. The male member 2088 is connected to the rotor shaft 2468 such that when power is applied to the pump motor 2082 the electromagnets 2466 and rotor 2464 rotate, which causes the male member 2088 to rotate. In the embodiment of FIGS. 126 and 127, the male member 2088 is an external (e.g., male) spline component, while the female member 1102 of the shaft 1078 is an internal (e.g., female) spline component. In one alternative embodiment, the male member 2088 can be one half of a blender coupler while the female member 1102 is a second half of a blender coupler. In a second alternative embodiment, the male member 2088 can be one half of a lovejoy coupler while the female member 1102 is a second half of a lovejoy coupler.

FIG. 128 is similar to the sectional view of FIG. 127, but with an alternative embodiment for coupling the hydrocyclonic particle separator assembly 804 to the pool cleaner body 802. Specifically, instead of the male member 2088 and the female member 1102, the embodiment of FIG. 128 includes a driving magnetic member 2470 and a driven magnetic member 2472. The driving magnetic member 2470 is implemented in place of the male member 2088 and is connected to the rotor shaft 2468 such that rotation of the rotor shaft 2468 is transferred to the driving magnetic member 2470. The driven magnetic member 2472 is implemented in place of the female member 1102 and is connected to the shaft 1078 such that rotation of the driven magnetic member 2472 is transferred to the shaft 1078 and thus the impeller 1082. The driving magnetic member 2470 and the driven magnetic member 2472 are configured to magnetically engage each other when they are adjacent. Accordingly, when power is applied to the pump motor 2082 the rotor shaft 2468 rotates the driving magnetic member 2008 which causes the driven magnetic member 2472 to rotate due to their magnetic engagement, which in turn causes the shaft 1078 and impeller 1082 to rotate.

FIG. 129 is similar to the sectional view of FIG. 127, but with another alternative embodiment for coupling the hydrocyclonic particle separator assembly 804 to the pool cleaner body 802. Specifically, instead of the male member 2008 and the female member 1102, the embodiment of FIG. 129 includes a rotor 2474 extending from the shaft 1078 and a motor stator 2476 positioned within the motor box 840. As shown in FIG. 129, the rotor 2474 can include a rod 2478 extending from the shaft 1078 and a casing 2480 attached to the end of the rod 2478. The casing 2480 defines an inner chamber 2482 and includes internal permanent magnets 2484. The casing 2480 can extend from the large debris container 858 of the hydrocyclonic particle separator assembly 804 and is configured to be placed over the motor stator 2476 with the motor stator 2476 placed within the inner chamber 2482. The motor stator 2476 includes a plurality of electromagnets that are configured to interact with the internal permanent magnets 2484 of the rotor 2474 and rotationally drive the rotor 2474. When the hydrocyclonic particle separator assembly 804 is placed onto the pool cleaner body 802 the rotor 2474 can extend through an enlarged opening 2486 in the top 2080 of the motor box 840 and surround the motor stator 2476. Power can be supplied to the motor stator 2476 to energize the electromagnets and thus rotatably drive the casing 2480 (and therefore the rotor 2474) through electromagnetic interaction with the permanent magnets 2486. Accordingly, the rotor 2474 and the motor stator 2476 together function as a brushless DC motor.

FIG. 130 is similar to the sectional view of FIG. 127, but with another alternative embodiment for coupling the hydrocyclonic particle separator assembly 804 to the pool cleaner body 802. Specifically, instead of the male member 2088, the female member 1102, and the pump motor 2082, the embodiment of FIG. 130 includes an alternative pump motor 2488 in the second end 1112 of the sleeve 1080, along with an inductive coupling receiver circuit 2492 that is in electrical communication with the alternative pump motor 2488. The alternative pump motor 2488 receives electrical power from the inductive coupling receiver circuit 2492 and rotatably drives the shaft 1078. The motor box 840 includes an inductive coupling transmitter circuit 2494 that can have electrical power supplied thereto, e.g., by the power and control cable 2089 (see FIG. 89). When the inductive coupling receiver circuit 2492 of the hydrocyclonic particle separator assembly 804 is adjacent the inductive coupling transmitter circuit 2494 of the pool cleaner body 802 (e.g., when the hydrocyclonic particle separator assembly 804 is placed onto the pool cleaner body 802) electrical power is inductively transferred from the inductive coupling transmitter circuit 2494 to the inductive coupling receiver circuit 2492, which uses the electrical power to operate the alternative pump motor 2488. Accordingly, electrical power is wirelessly transferred to the alternative pump motor 2488, which uses the power to rotate the shaft 1078 and thus the impeller 1082.

FIG. 131 is similar to the sectional view of FIG. 127, but with another alternative embodiment for coupling the hydrocyclonic particle separator assembly 804 to the pool cleaner body 802. Specifically, instead of the male member 2088, the female member 1102, and the pump motor 2082, the embodiment of FIG. 131 includes an alternative pump motor 2496 placed in the second end 1112 of the sleeve 1080, along with a contact plate 2498 that is in electrical communication with the alternative pump motor 2496. The alternative pump motor 2496 receives electrical power from the conductive contact plate 2498 and rotatably drives the shaft 1078. The motor box 840 includes power circuitry 2500 that is in electrical communication with a plurality of spring-loaded pogo pins 2502 that extend from the motor box 840. The power circuitry 2500 can have electrical power supplied thereto, e.g., by the power and control cable 2089 (see FIG. 89). When the conductive contact plate 2498 of the hydrocyclonic particle separator assembly 804 is in contact with and compresses the spring-loaded pogo pins 2502 of the pool cleaner body 802 (e.g., when the hydrocyclonic particle separator assembly 804 is placed onto the pool cleaner body 802) electrical power is transferred from the spring-loaded pogo pins 2502 to the conductive contact plate 2498, which uses the electrical power to operate the alternative pump motor 2496. Accordingly, electrical power is transferred to the alternative pump motor 2496, which uses the power to rotate the shaft 1078 and thus the impeller 1082.

Figure 51:
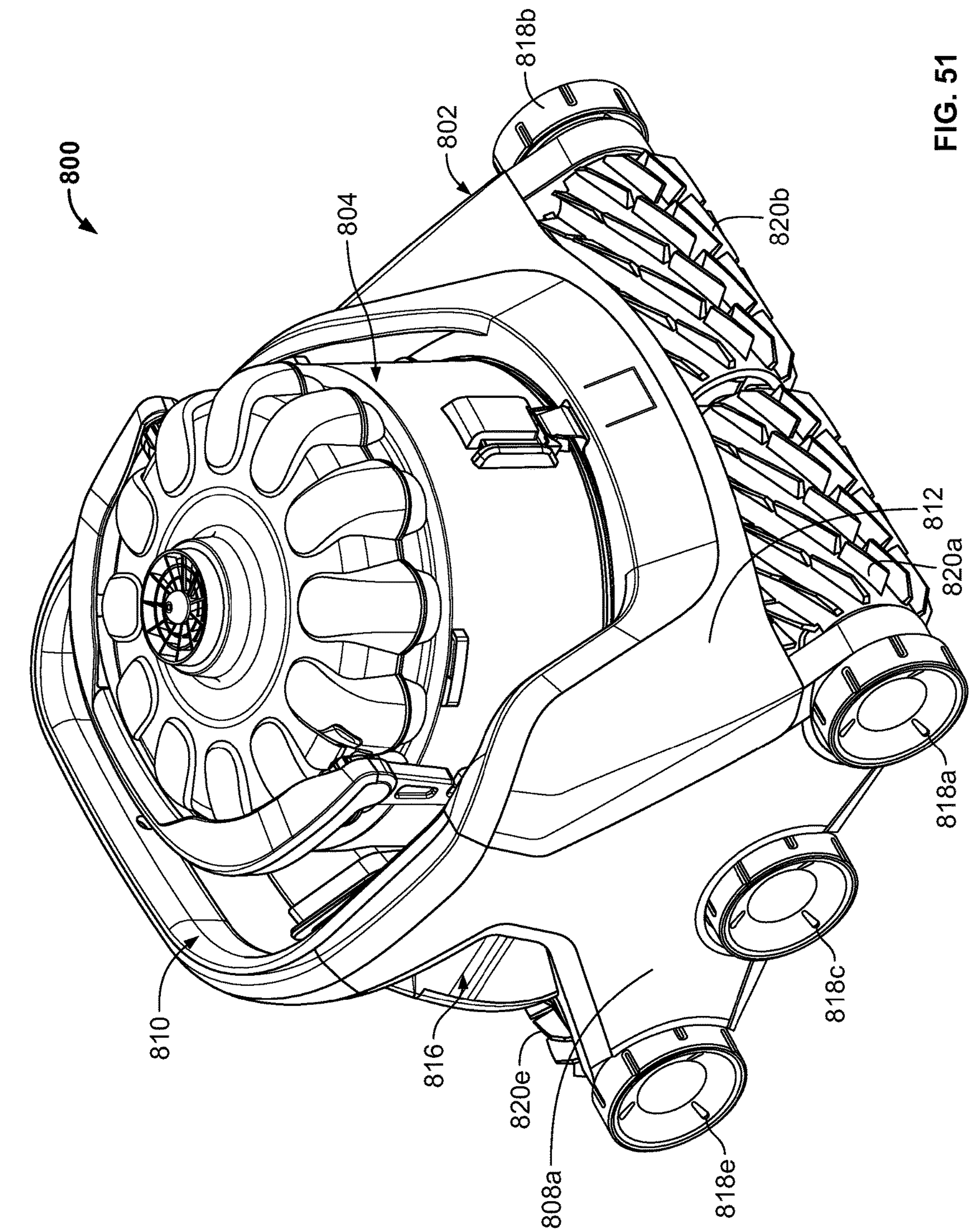
FIG. 51 is a perspective view of a fourth embodiment of a pool cleaner of the present disclosure.
Figure 52:
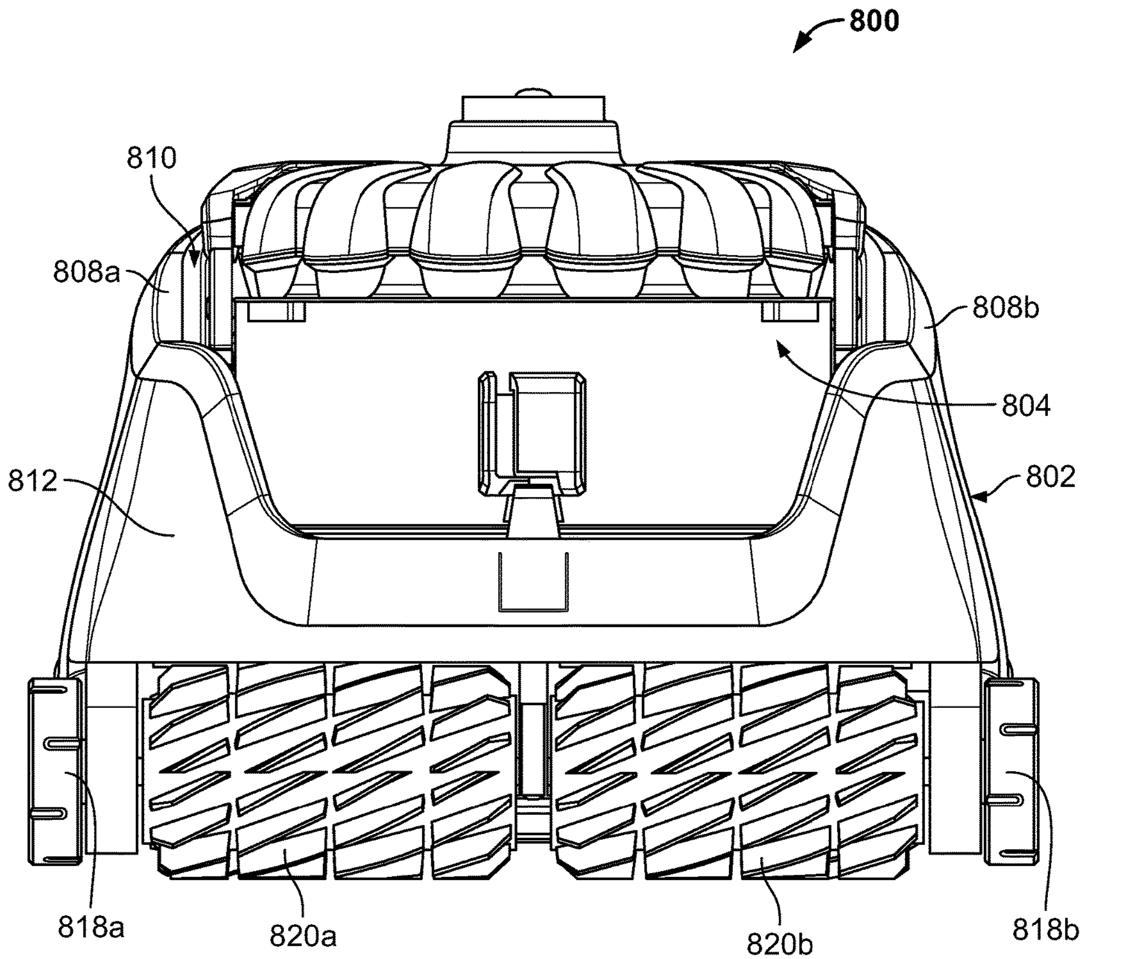
FIG. 52 is a front view of the fourth embodiment pool cleaner of FIG. 51.
Figure 53:
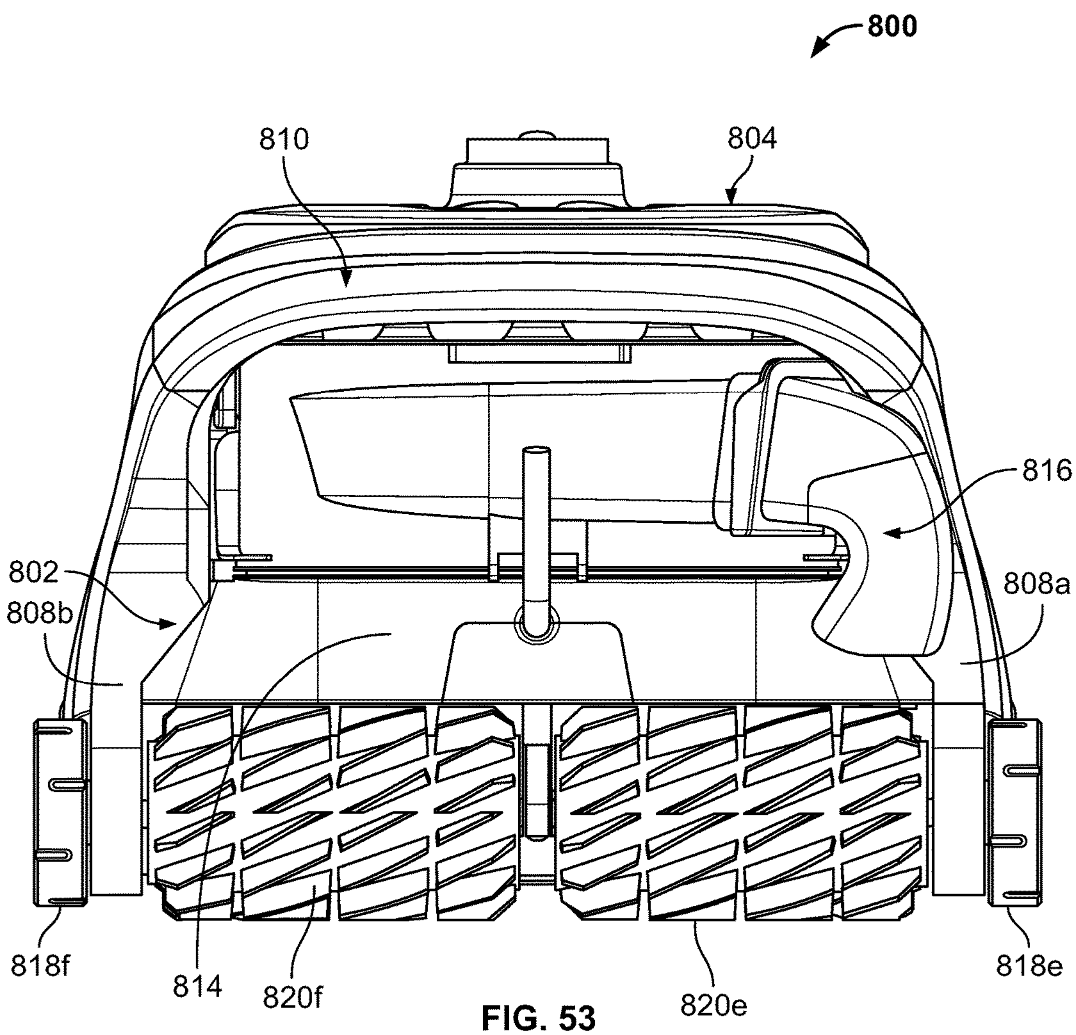
FIG. 53 is a rear view of the fourth embodiment pool cleaner of FIG. 51.

FIGS. 132-133 illustrate the ability of the front skin 812 (having a first ornamental appearance) to be removed and replaced with an alternative skin (having a second ornamental appearance that can be, but is not necessarily, different than the first ornamental appearance). FIG. 132 is a perspective view of the pool cleaner 800 with the front skin 812 removed. As shown in FIG. 132, the front skin 812 is of a first design and includes a plurality of holes 2504 and a plurality of mounting brackets 2506 that allow the front skin 812 to be removably mounted to the chassis 806. When the front skin 812 is mounted to the chassis 806 it generally lies flush with the left and right covers 808*a*, 808*b*, conceals a portion of the chassis 806, and surrounds a portion of the motor box 840, as shown in FIGS. 51 and 58. To remove the front skin 812, a user removes the fasteners (not shown) that secure the front skin 812 to the chassis 806 and disconnects the front skin 812. The front skin 812 can then be replaced by an alternative front skin 2508, as shown in the perspective view of FIG. 133. The alternative front skin 2508 can have a different ornamental appearance than the original front skin 812. For example, the alternative front skin 2508 can have a front bar 2510 that gives the pool cleaner 800 an "X"-shaped profile. As another option, the alternative front skin 2508 can be the same design as the original front skin 812, and can simply be a replacement if the original front skin 812 becomes damaged or can have a different color scheme. The alternative front skin 2508 can be connected to the pool cleaner 800 in the same fashion as that of the original front skin 812, e.g., through fasteners (not shown) that secure it to the chassis 806. The replaceable front skin functionality allows for the pool cleaner 800 to be customized by a user and for the front skin 812 to be replaced if it becomes damaged. It should be understood by one of ordinary skill in the art that the front skin 812 is just one exemplary embodiment of many options.

FIGS. 134-170 illustrate a power supply 2512 and associated elements of the present disclosure. FIGS. 134-141 are respectively front perspective, rear perspective, front, rear, left side, right side, top, and bottom views of the power supply 2512. The power supply 2512 is a switch mode universal power supply that provides power and control commands to a pool cleaner, e.g., the pool cleaners 100, 700, 800 of the present disclosure. The power supply 2512 generally includes a front housing 2514, a user interface 2516, a mid trim 2518, a rear housing 2520, a female power and communication output port 2522, an AC power input connector 2524 having a cover 2526, a kickstand 2530, a fan 2532, and a fan cover 2534. FIGS. 142 and 143 are respectively right side and top views of the power supply 2512 with the kickstand 2530 in an open position. The power supply 2512 can receive power from an AC power source through a conduit 2528 that can be connected to the AC power input connector 2524. The power and control cable 2089 (see FIG. 89) can be connected to the female power and communication output port 2522 so that the pool cleaner 800 can receive power and control commands from the power supply 2512.

FIG. 144 is an exploded view of the power supply 2512 showing additional and internal components. In addition to those components listed above, the power supply 2512 includes a light baffle 2536, a user interface printed circuit board (PCB) 2538, a potted power converter board assembly 2540, a foam filler 2542, and a plurality of fasteners 2544. The user interface 2516 includes a graphic overlay 2546, a graphic overlay adhesive 2548, and an actuator circuit 2550. The graphic overlay 2546 can include a plurality of semi-transparent indicia. The actuator circuit 2550 includes a plurality first, second, and third buttons 2552*a*, 2552*b*, 2552*c*, a connector extension 2554, and a connector 2556. The front housing 2514 can include a user interface recess 2558 that includes a plurality of light openings 2560 and a connector opening 2562. The user interface 2516 can be positioned in the user interface recess 2558 with the connector extension 2554 of the actuator circuit 2550 extending through the connector opening 2562 so that the connector 2556 can engage the user interface PCB 2538, which is generally positioned rearward of the front housing 2514. The actuator circuit 2550 can be secured in the user interface recess 2558 by an adhesive, while the graphic overlay 2546 can be secured in the user interface recess 2558 overlaying the actuator circuit 2550 by the graphic overlay adhesive 2548. The connector 2556 can be interconnected with a user interface port 2564 on the user interface PCB 2538 so that the actuator circuit 2550 can receive low power from the user interface PCB 2538 and can communicate with the user interface PCB 2538. Specifically, the actuator circuit 2550 can send signals to the user interface PCB 2538 when the buttons 2552*a*, 2552*b*, 2552*c* are actuated, and the user interface PCB 2538 can in turn send control commands to the pool cleaner 100, 700, 800.

The user interface PCB 2538 includes a microcontroller 2566, a power converter board connector 2568, and a plurality of light-emitting diodes (LEDs) 2570. The power converter board connector 2568 allows the user interface PCB 2538 to be in communication with, and receive power from a power printed circuit board ("PCB") 2578 (see FIG. 148A) (which can be a high-power PCB) of the potted power converter board assembly 2540. The microcontroller 2566 can monitor the temperature of the power PCB 2578. The microcontroller 2566 can also communicate the temperature of the power PCB 2578 to the associated pool cleaner 100, 700, 800 which modifies operation in response to the monitored temperature. For example, if the cleaner 100, 700, 800 determines that the power PCB 2578 is too hot then the pool cleaner 100, 700, 800 can operate with a reduced power consumption, e.g., the drive motors of the pool cleaner 100, 700, 800 can be operated at a reduced power consumption level, certain modes of operation can be restricted or prevented, e.g., wall climb mode, or the pool cleaner 100, 700, 800 can be shutdown completely if necessary. The user interface PCB 2538 can also include WiFi connectivity so that it can receive instructions over a WiFi network. Additionally, the user interface PCB 2538 can include a real-time clock to maintain pool cleaner schedules.

The light baffle 2536 is positioned over the LEDs 2570 of the user interface PCB 2538 and includes a plurality of apertures 2572 that are arranged to match the arrangement of the LEDs 2570 on the user interface PCB 2538 and the arrangement of the light openings 2560 of the user interface recess 2558. The light baffle 2536 reduces cross talk between the LEDs 2570, and can be made of santoprene. Accordingly, the LEDs 2570 can shine through the apertures 2572 of the light baffle 2536 and the light openings 2560 of the user interface recess 2558 and illuminate the graphic overlay 2546. The light baffle 2536 additionally includes vents.

A user can engage the user interface 2516 and actuate the first, second, and third buttons 2552*a*, 2552*b*, 2552*c* to perform a variety of functions. The first button 2552*a* can be a power button such that a user can press the first button 2552*a* to toggle between a powered state and a standby state. Additionally, a user can press and hold the first button 2552*a* for a predetermined period of time, e.g., three seconds, to start the pool cleaner 100, 700, 800 or shut the pool cleaner 100, 700, 800 off. The second button 2552*b* can be a schedule select button such that a user can press the second button 2552*b* to scroll through schedule settings, e.g., single cycle, continuous cycle, etc. Additionally, a user can press and hold the second button 2552*b* for a predetermined period of time, e.g., two seconds, to dim the LEDs 2570 of the user interface 2516. The third button 2552*c* can be a mode select button such that a user can press the third button 2552*c* to scroll through the different pool cleaner 100, 700, 800 modes of operation, e.g., bottom mode, wall climb mode, etc. Additionally, a user can press and hold the third button 2552*c* for a predetermined period of time, e.g., two seconds, to brighten the LEDs 2570 of the user interface 2516. The user interface 2516 has additional functionality whereby a user can press and hold all three buttons 2552*a*, 2552*b*, 2552*c* for a predetermined period of time, e.g., ten seconds, to perform a factory reset. Additionally, the user can press and hold two of the first, second, and third buttons 2552*a*, 2552*b*, 2552*c*, e.g., the second and third buttons 2552*b*, 2552*c*, for a predetermined period of time, e.g., ten seconds, to reset the WiFi connection of the power supply 2512. The various symbols on the graphic overlay 2546 can be illuminated based on the schedule that is being ran and the mode that the pool cleaner 100, 700, 800 is operating in. Additionally, the user interface 2516 can include indicia on the graphic overlay 2546 that inform a user that the hydrocyclonic particle separator assembly 804 is full and needs to be emptied.

Turning back to FIG. 144, the user interface PCB 2538 can be mounted to the front housing 2514 and the potted power converter board assembly 2540 can have a plurality of stops 2574 that are configured to engage the user interface PCB 2538 and restrict flexion thereof. Particularly, if the power supply 2512 is dropped on its face, e.g., with the user interface 2516 down, the stops 2574 will prevent the user interface PCB 2538 from deflecting and reduce the strain on the user interface PCB 2538. This prevents the user interface PCB 2538 from breaking. The potted power converter board assembly 2540 is retained between the front housing 2514 and the rear housing 2520. The rear housing 2520 can be interconnected with the front housing 2514 by the fasteners 2544 with the mid trim 2518 placed between, and about the perimeters of, the rear housing 2520 and the front housing 2514. The fan 2532 can also be positioned within the rear housing 2520 adjacent the potted power converter board assembly 2540 to cool the potted power converter board assembly 2540 through forced convection. The fan 2532 can be removably secured to the rear housing 2520 by the fan cover 2534. The kickstand 2530 can also be connected to the rear housing 2520 without the use of fasteners. The kickstand 2530 is discussed in greater detail below in connection with FIGS. 161-169.

Turning now to FIGS. 145-151, the potted power converter board assembly 2540 is shown in greater detail. FIGS. 145 and 146 are respectively front perspective and front views of the potted power converter board assembly 2540. FIGS. 147*a* and 147*b* are rear perspective views of the potted power converter board assembly 2540. Specifically, FIG. 147*a* shows the electrical components of the potted power converter board assembly 2540 covered and isolated in a potting compound 2582, while FIG. 147*b* shows the electrical components of the potted power converter board assembly 2540 exposed prior to being encased in the potting compound 2582. FIGS. 148A and 148B are respectively front and rear perspective view of the potted power converter board assembly 2540.

The potted power converter board assembly 2540 includes a contoured tray 2576, a power printed circuit board (PCB) 2578, a heat sink 2580, the female power and communication output port 2522, the AC power input connector 2524, and potting compound 2582 (see FIG. 147A). The contoured tray 2576 includes a body 2584, a sidewall 2586 extending about the perimeter of the body 2584 and including a connector opening 2588 and a port opening 2590, and a plurality mounting brackets 2592. The body 2584 and the sidewall 2586 define an interior cavity 2594 that is configured to receive and house the power PCB 2578. The body 2584 includes a plurality of contours 2596 that form corresponding interior recesses 2598. The interior recesses 2598 form a part of the interior cavity 2594. The contours 2596 and corresponding interior recesses 2598 are positioned and configured to match with the various electronic components 2600, e.g., capacitors, transformers, etc., that are mounted on a first side 2602 of the power PCB 2578. Particularly, the electronic components 2600 mounted on the first side 2602 of the power PCB 2578 create a contoured landscape or skyline, and that contours and corresponding interior recesses 2598 of the contoured tray 2576 are formed to create a matching contoured landscape or skyline such that when the power PCB 2578 is positioned in the contoured tray 2576, the electronic components 2600 thereof match the recesses 2598 and there is a thin consistent space between the electronic components 2600 and the contoured tray 2576 where potting compound 2582 is positioned. This is illustrated in FIGS. 150 and 151, which are side-by-side comparisons of the contoured tray 2576 and the power PCB 2578. Particularly, FIG. 150 is a front view of the contoured tray 2576 and the power PCB 2578 side-by-side, while FIG. 151 is a side view of the contoured tray 2576 and the power PCB 2578 side-by-side. As is shown in FIGS. 150 and 151, the contours 2596, and thus recesses 2598, of the contoured tray 2576 are positioned such that they align with the electronic components 2600 of the power PCB 2578 that protrude from the power PCB 2578.

The female power and communication output port 2522 is interconnected with the power PCB 2578 and includes an overmolded barrier 2604 that is configured to be secured in the port opening 2590 and functions as a dam during potting. The AC power input connector 2524 is configured to be inserted into the connector opening 2588 and in electrical communication with the power PCB 2578. The AC power input connector 2524 can be an IEC C14 female connector. The heat sink 2580 includes a plurality of mounting tabs 2606 and is secured to a second side 2608 of the power PCB 2578 opposite the first side 2602 where the electronic components 2600 are mounted, and transfers heat away from the power PCB 2578. The heat sink 2580 can be a folded sheet metal heat sink.

As referenced above, the power PCB 2578 is secured in the contoured tray 2576 by the potting compound 2582, as shown in FIG. 147A. Particularly, the power PCB 2578 is placed in the contoured tray 2576 with the barrier 2604 secured in the port opening 2590 and the AC power input connector 2524 inserted into the connector opening 2588, as shown in FIG. 147B. Then, the potting compound 2582 is poured over the power PCB 2578 until there is a thin layer covering the second side 2608 of the power PCB 2578 with the majority of the heat sink 2580 left exposed (as shown in FIG. 147A), and allowed to cure. The barrier 2604 acts as a dam and prevents the potting compound 2582 from leaking from the contoured tray 2576. The only components that are not fully encased in potting compound 2582 are user interface low-power wires 2610 and fan low-power wires 2612, e.g., low power components. The user interface low-power wires 2610 are connectable to the power converter board connector 2568, which can be a six pin bus, to provide low power to the user interface PCB 2538. The fan low-power wires 2612 are connected to the fan 2532 to provide low power thereto. As such, all high power components are completely encapsulated by the potting compound 2582, and the high power section of the potted power converter board assembly 2540 is completely isolated. This ensures that the potted power converter board assembly 2540 complies with all UL requirements and standards.

FIG. 152 is a sectional view of the potted power converter board assembly 2540 taken along line 152-152 of FIG. 146. As can be seen in FIG. 152, there is minimal potting compound 2582 on top of the power PCB 2578 and between the electrical components 2590 and the contoured tray 2576. Additionally, this layer of potting compound 2582 has a consistent thickness due to the matching of the contoured tray 2576 with the electrical components 2590 of the power PCB 2578, as discussed above. By maintaining a thin consistent layer of potting compound 2582, as opposed to a thicker inconsistent layer, the potted power converter board assembly 2540 will have unified strain on the power PCB 2578 and electrical components 2590 thereof that prevents pulling away of the electrical components 2590 during thermal expansion of the potted compound 2582. This is of particular significance for electrical components 2590 that are pin mounted, which have less solder per foot print ration in comparison to surface mounted components, and are therefore less robust. Additionally, since the contoured tray 2576 is contoured to match the electrical components 2590 of the power PCB 2578, e.g., instead of being a generic volume such as a cuboid, it limits the amount of potting compound 2582 that is required, which reduces the weight of the potted power converter board assembly 2540. Further, having the high-power components of the potted power converter board assembly 2540 entirely isolated from the low-power components of the user interface 2516 and user interface PCB 2538 allows the user interface 2516 and the user interface PCB 2538 to be modular and replaceable. Particularly, if necessary a user can disconnect the user interface PCB 2538 and the user interface 2516 from the potted power converter board assembly 2540 and replace them. For example, a user may wish to replace the user interface 2516 with a capacitive touch screen if desired.

The power PCB 2578 can also include a secondary low power output. The secondary low power output can include an internal power limit in the form of a positive temperature coefficient ("PTC") thermistor that limits the outside power to the user interface PCB 2538 and drawn from the power PCB 2578. Particularly, the PTC thermistor increases its resistance as its temperature increases and thus limits the power of the user interface PCB 2538. For example, the PTC thermistor can be used to limit the secondary power to a predefined wattage (e.g., to less than or equal to 15 watts).

FIG. 149 is an exploded view of an alternative cord cover that includes a first cord cover half 2593, a second cord cover half 2595, a gasket 2597, and a plurality of fasteners 2599 (e.g., screws). The first cord cover half 2593 includes a base 2593*a*, a body 2593*b*, an opening 2593*c*, and a plurality of mounting brackets 2593*d*. The body 2593*b* is connected to the base 2593*a* at a proximal end thereof, while the opening 2593*c* is generally a half-circle shape and positioned at a distal end of the body 2593*b*. The first cord cover half 2593 is generally shaped and configured to house a portion of a male AC connector 2529 connected to the conduit 2528. The second cord cover half 2595 is similar in construction to the first cord cover half 2593 and includes a base 2595*a*, a body 2595*b*, an opening 2595*c*, and a plurality of mounting brackets 2595*d*. The body 2595*b* is connected to the base 2595*a* at a proximal end thereof, while the opening 2595*c* is generally a half-circle shape and positioned at a distal end of the body 2595*b*. The second cord cover half 2595 is generally shaped and configured to house a portion of the male AC connector 2529 connected to the conduit 2528. The first and second cord cover halves 2593, 2595 are configured to be complementary to one another such that they can be connected with the bases 2593*a*, 2595*a*, the bodies 2593*b*, 2595*b*, and the holes 2593*c*, 2595*c* adjacent to one another, and with the plurality of mounting brackets 2593*d*, 2595*d* overlapping. The first and second cord cover halves 2593, 2595 can be interconnected, e.g., by a snap-fit connection or utilizing locking tabs, with the male AC connector 2529 housed within the bodies 2593*b*, 2595*b* thereof and the conduit 2528 positioned within the openings 2593*c*, 2595*c*.

The gasket 2597 includes an annular body 2597*a* that defines a central opening 2597*b*. The male AC connector 2529 can be inserted into the opening 2597*b* so that the male AC connector 2529 can be connected to the AC power input connector 2524 with the gasket 2597 surrounding the male AC connector 2529. Once the male AC connector 2529 is inserted into the opening 2597*b*, the first and second cord cover halves 2593, 2595 can be connected around the male AC connector 2529 and the conduit 2528, and the male AC connector 2529 can be inserted into the AC power input connector 2524. The gasket 2597 can then be seated in the bases 2593*a*, 2595*a* of the first and second cord cover halves 2593, 2595. The first and second cord cover halves 2593, 2595 can then be secured to, for example, an extended portion of the AC power input connector 2524 that is configured to receive the fasteners 2599. Specifically, the fasteners 2599 can extend through the plurality of mounting brackets 2593*d*, 2595*d* of the first and second cord cover halves 2593, 2595, which are overlapped, and engage the extended portion of the AC power input connector 2524, which can have, for example, complementary threaded holes. Alternatively, instead of the AC power input connector 2524 being extended, the contoured tray 2576 or the rear housing 2520 can be configured to have the first and second cord cover halves 2593, 2595 secured thereto. When the first and second cord cover halves 2593, 2595 are secured to the extended portion of the AC power input connector 2524 by the fasteners 2599, the gasket 2597 is in engagement with a face of the AC power input connector 2524, and is compressed between the face of the AC power input connector 2524 and the bases 2593*a*, 2595*a* of the first and second cord cover halves 2593, 2595. Continued tightening of the fasteners 2599 will further compress the gasket 2597. The gasket 2597 will be compressed between the AC power input connector 2524, the bases 2593*a*, 2595*a*, and the male AC connector 2529, thus generating a water-tight seal that prevents water from entering the AC power input connector 2524.

The potted power converter board assembly 2540 is secured between the front housing 2514 and the rear housing 2520. FIGS. 153-155 are respectively perspective, front, and rear views of the rear housing 2520. The rear housing 2520 includes a rear wall 2614 and a sidewall 2616 extending about the perimeter of the rear wall 2614. The rear wall 2614 and the sidewall 2616 define an internal chamber 2618. A plurality of mounting bosses 2620 extend from the rear wall 2614 into the internal chamber 2618 and are configured to engage the mounting brackets 2592 of the potted power converter board assembly 2540 and secure to the front housing 2514, thus securing the potted power converter board assembly 2540 between the front housing 2514 and the rear housing 2520. The rear wall 2614 includes a handle recess 2622 that is generally positioned at an upper portion of the rear wall 2614 and extends into the internal chamber 2618. The handle recess 2622 defines a handle chamber 2624 that allows a user to insert their hand into and hold the power supply 2512. The rear wall 2614 additionally includes a fan opening 2626, first and second kickstand engagement openings 2628*a*, 2628*b*, first and second kickstand engagements 2630, first and second wall mounts 2632*a*, 2632*b*, and first and second abutments 2634*a*, 2634*b*. The first and second kickstand engagements 2612 are identical in construction and are each positioned adjacent one of the first and second kickstand engagement openings 2628_a_, 2628_b_ and extend into the internal chamber 2618 of the rear housing 608.

The sidewall 2616 includes first and second cutouts 2636, 2638. The first cutout 2636 is configured to receive the female power and communication output port 2522 of the potted power converter board assembly 2540 while the second cutout 2638 is configured to receive the AC power input connector 2524 of the potted power converter board assembly 2540 when the potted power converter board assembly 2540 is secured between the front housing 2514 and the rear housing 2520. In this regard, the rear housing 2520 can be secured to the front housing 2514 by a plurality of fasteners 2544 (see FIG. 144), e.g., screws, that can extend through the plurality of mounting bosses 2620.

The rear housing 2520 also includes a plurality of top vents 2640 and a plurality of bottom drain holes 2642. The top vents 2640 are positioned generally in the sidewall 2616 and on opposite sides of the handle recess 2622 that vent air from the power supply 2512. Particularly, the top vents 2640 are positioned such that they vent air away from the handle recess 2622, and thus away from a user's hand. The drain holes 2642 are generally positioned at a bottom of the rear housing 2520 and allow water to drain from the power supply 2512.

FIGS. 156-160 show one of the kickstand engagements 2630 in greater detail. FIG. 156 is an enlarged view of Area 156 of FIG. 153 showing the kickstand engagement 2630 in greater detail. FIG. 157 is a sectional view of the rear housing 2520 taken along line 157-157 of FIG. 154, and FIG. 158 is an enlarged view of Area 158 of FIG. 157. FIGS. 159 and 160 are respectively rear perspective and front perspective views of the enlarged Area of FIG. 158. As referenced above, the first and second kickstand engagements 2630 are each positioned adjacent one of the first and second kickstand engagement openings 2628_a_, 2628_b_ and extend into the internal chamber 2618 of the rear housing 608. The kickstand engagement 2630 includes a lower abutment 2644 and an upper abutment 2646.

The lower abutment 2644 includes first and second curved supports 2648_a_, 2648_b_ that are positioned on opposite sides of a channel 2650, a stop 2652 extending between the first and second curved supports 2648_a_, 2648_b_, and a protrusion 2654 extending upwardly adjacent the channel 2650 and between the first and second curved supports 2648_a_, 2648_b_. The first and second curved supports 2648_a_, 2648_b_ each include a curved portion 2656_a_, 2656_b_ and a sidewall 2658_a_, 2658_b_ on the opposite side of the channel 2650. The first and second curved supports 2648_a_, 2648_b_ extend inward from the rear wall 2614, e.g., into the inner chamber 2618, and the respective curved portions 2656_a_, 2656_b_ are approximately one-quarter circle curves. The lower abutment 2644 generally defines a support chamber 2660.

The upper abutment 2646 includes a curved body 2662 that curves from an attachment end 2664 to an open end 2666. The curved body 2662 is connected to the rear wall 2614 at the attached end 2664 and curves inward from the rear wall 2614, e.g., into the inner chamber 2618, and back toward to the first kickstand engagement opening 2628_a_. The curved body 2662 defines an engagement chamber 2668 and includes an angled stop 2670 extending from the curved body 2662 into the engagement chamber 2658.

FIGS. 161-164 show the kickstand 2530 in greater detail. FIGS. 161 and 162 are perspective and front views of the kickstand 2530, respectively. The kickstand 2530 includes a first leg 2672_a_, a second leg 2672_b_, and a cross-bar 2674 extending between the first and second legs 2672_a_, 2672_b_ to form a horseshoe-like shape. The first leg 2672_a_ has a first end 2676_a_ and a second end 2678_a_, and the second leg 2672_b_ has a first end 2676_a_ and a second end 2678_b_. The cross-bar 2674 extends between the second ends 2678_a_, 2678_b_ of the first and second legs 2672_a_, 2672_b_. The first and second legs 2672_a_, 2674_b_ each include a locking protrusion 2680 extending from the first end 2676_a_, 2676_b_ thereof. The locking protrusions 2680 are configured to engage the kickstand engagements 2630. Each of the first ends 2676_a_, 2676_b_ of the first and second legs 2672_a_, 2672_b_ also include an engagement surface 2682 that is configured to engage the curved body 2662 of the upper abutments 2646, which is discussed in greater detail below.

FIGS. 163 and 164 are respectively bottom perspective and top perspective views of one of the locking protrusions 2680 showing the locking protrusion 2680 in greater detail. The locking protrusion 2680 includes a body 2684 extending between first and second sidewalls 2686_a_, 2686_b_, and an angled extension 2688 extending from the body 2684 at a downward angle and positioned between the first and second curved sidewalls 2686_a_, 2686_b_. The first and second sidewalls 2686_a_, 2686_b_ each include a curved portion 2690_a_, 2690_b_. The locking protrusion 2680 is configured to fit into the support chamber 2660 of the kickstand engagement's lower abutment 2644, with the angled extension 2688 sized and configured to be positioned within the channel 2650.

FIGS. 165-169 illustrate the engagement of the locking protrusion 2680 with the kickstand engagement 2630 in greater detail. FIG. 165 is a perspective view of the locking protrusion 2680 engaged with the kickstand engagement 2630 in a closed position, e.g., the kickstand 2530 is closed, while FIG. 166 is a perspective view of the locking protrusion 2680 engaged with the kickstand engagement 2630 in an open position, e.g., the kickstand 2530 is open. FIG. 167 is a sectional view taken along line 167-167 of FIG. 140 showing the kickstand 2530 attached to the rear housing 2520 and in a closed position. FIG. 168 is a sectional view taken along line 168-168 of FIG. 143 showing the kickstand 2530 attached to the rear housing 2520 and in an open position. FIG. 169 is an enlarged view of Area 169 of FIG. 168. When the locking protrusion 2680 is engaged with the kickstand engagement 2630, the body 2684 is positioned within the support chamber 2660, the first and second curved sidewalls 2686_a_, 2686_b_ of the locking protrusion 2680 are adjacent the first and second sidewalls 2658_a_, 2658_b_ of the lower abutment 2644, respectively, and the angled extension 2688 is positioned within the channel 2650. In this position, the protrusion 2654 of the lower abutment 2644 engages an underside of the body 2684 of the locking protrusion 2680, and the open end 2666 of the upper abutment 2646 contacts a topside of the body 2684 to prevent the locking protrusion 2654 from being inadvertently pulled out from the lower abutment 2644. The first and second sidewalls 2658_a_, 2658_b_ of the lower abutment 2644 prevent the locking protrusion 2680, and thus the kickstand itself 2530, from shifting laterally. The curvature of the first and second curved sidewalls 2686_a_, 2686_b_ generally matches the curvature of the curved portions 2656_a_, 2656_b_ of the first and second curved supports 2648_a_, 2648_b_. Accordingly, the locking protrusion 2680 can rotate within the lower support chamber 2660 of the lower abutment 2644 with the first and second curved sidewalls 2686_a_, 2686_b_ riding against the curved portions 2656_a_, 2656_b_ and the angled extension 2688 rotating within the channel 2650.

To engage the kickstand 2530 with the rear housing 2520, a user simply inserts the locking protrusions 2680 of the kickstand 2530 into the first and second kickstand engagement openings 2628*a*, 2628*b* and applies pressure causing the locking protrusions 2680 to engage the kickstand engagements 2630. The curved body 2662 engages the protrusion 2654 of the lower abutment 2644 and the open end 2666 of the upper abutment 2646, which causes the curved body 2662 of the upper abutment 2646 to compress and allow the curved body 2662 to enter the support chamber 2660 of the lower abutment 2644. Once the curved body 2662 is positioned within the support chamber 2660, the curved body 2662 decompresses and returns to its original position and engages a top portion of the curved body 2662 to retain the curved body 2662 within the support chamber 2660 and in engagement with the lower abutment 2644, as shown in FIGS. 165 and 167. Thus, the locking protrusions 2680 are engaged with the kickstand engagements 2630. Accordingly, no additional fasteners are required to secure the kickstand 2530 to the rear housing 2520.

Once the kickstand 2530 is secured to the rear housing 2520 and the locking protrusions 2680 are engaged with the kickstand engagements 2630, the kickstand 2530 can be rotated into an open position whereby it is rotated about the locking protrusions 2680, which rotate within the lower abutments 2644. When in an open position, the kickstand 2530 is prevented from opening too far by the kickstand engagements 2630. Specifically, as the kickstand 2530 rotates about the locking protrusions 2680, the angled extension 2688 will rotate across the channel 2650 until it contacts the stop 2652 of the lower abutment 2644 while the engagement surface 2682 of the kickstand 2530 rotates through the engagement chamber 2668 of the upper abutment 2644 until it contacts the angled stop 2670 of the upper abutment 2644. Engagement of the angled extension 2688 with the stop 2652 prevents the locking protrusions 2680 from rotating further. However, continued pressure on the kickstand 2530 in the open direction will result in the engagement surface 2682 of the kickstand 2530 to apply additional pressure against the angled stop 2670. This additional pressure against the angled stop 2670 is transferred through the angled stop 2670 and into the curved body 2662 of the upper abutment 2644, which causes the curved body 2662 to flex. Specifically, curved body 2662 flexes such that the open end 2666 is pressed into contact with a top portion of the body 2684 of the locking protrusion 2680, which acts to further secure the locking protrusions 2680 within the kickstand engagements 2630. This engagement ensures that when the kickstand 2530 is in an open position and the power supply 2512 is resting on the kickstand 2530, the kickstand 2530 will not become detached due to additional force on the kickstand 2530, e.g., a downward force on the power supply 2512.

FIG. 170 is a partially exploded rear perspective view of the power supply 2512 with the fan 2532 and fan cover 2534 exploded. As discussed above in connection with FIG. 153, the rear housing 608 includes a fan opening 2626 that is configured to receive the fan 2532 and be covered by the fan cover 2534. The fan 2532 can be positioned within the fan opening 2626 and in contact with the heatsink 2580 and potting compound 2582 of the potted power converter board assembly 2540 in order to cool the potted power converter board assembly 2540 through forced convection cooling. The fan 2532 is connected to and receives power from the fan low-power wires 2612. The fan 2532 is secured in the fan opening 2626 by the fan cover 2534 and a plurality of fasteners 2692. Particularly, the fan cover 2534 includes a body 2694, a tab 2696, and a mounting bracket 2698. The body 2694 of the fan cover 2534 can include vent openings 2700 and a plurality of mounting holes 2702. When the fan 2532 is positioned within the fan opening 2626, the fan cover 2534 can be positioned over the fan 2532 such that the tab 2696 is inserted into the fan opening 2626 and in engagement with the rear housing 2520, and the mounting bracket 2698 is positioned in a rear recess 2704 on the rear housing 2520 adjacent the fan opening 2626. The fan cover 2534 can be secured to the rear housing 2520 by a fastener 2692 that can extend through the mounting bracket 2698 and engage the rear recess 2704 of the rear housing 2520. The fan cover 2534 can also be secured to the fan 2532 by a plurality of fasteners 2692 that can extend through the mounting holes 2702 of the fan body 2694 and engage mounting supports 2706 of the fan 2532.

The fan 2532 can be removed and replaced by simply removing the fasteners 2692, removing the fan cover 2534, and removing the fan 2532 from the rear housing 2520. The fan low-power wires 2612 can be cut and connected to a replacement fan, which can be inserted into the fan opening 2626 and secured in place by the fan cover 2534. By using forced convection cooling instead of simply relying on heat dissipation through heatsinks, the overall package size of the power supply 2512 can be reduced.

FIGS. 171-213 are directed to a pool cleaner caddy 2708 of the present disclosure. FIGS. 171-177 are respectively perspective, side, rear, front, top, and bottom views of the pool cleaner caddy 2708. The pool cleaner caddy 2708 is generally used to support a pool cleaner, e.g., the pool cleaners 100, 700, 800 of the present disclosure, and a power supply, e.g., power supply 2512 of the present disclosure, so that they can be transported to a desired location. The pool cleaner caddy 2708 generally includes a base 2710, a first wheel assembly 2712*a*, a second wheel assembly 2712*b*, a stem 2713 that can include a lower stem portion 2714 and an upper stem portion 2716, a handle assembly 2718, and a ribbed fastener 2719. FIGS. 177 and 178 are respectively exploded perspective and exploded rear views of the pool cleaner caddy 2708. As shown in FIGS. 177 and 178, the first and second wheel assemblies 2712*a*, 2712*b* each include a wheel 2720, an axle 2722, an axle receiver 2724, and a screw 2726.

FIGS. 179-182 show the base 2710 in greater detail. Particularly, FIGS. 179-182 are respectively perspective, front, top, and bottom views of the base 2710. The base 2710 is generally shaped and sized to support a pool cleaner, e.g., the pool cleaners 100, 700, 800 of the present disclosure, positioned thereon. The base 2710 includes a rear wall 2728, a left side wall 2730, a right side wall 2732, a front curved wall 2734, a left bottom wall 2736, a first center bottom wall 2738, a second center bottom wall 2740, and a right bottom wall 2742. The rear wall 2728 includes an angled extension 2744 and a channel 2746 at a center thereof. The angled extension 2744 extends rearwardly from the rear wall 2728 and the channel 2746 extends longitudinally along the length of the angled extension 2744 and through the rear wall 2728. The channel 2746 includes first and second transverse openings 2748, 2750 and first and second angled locking tabs 2752, 2754 on lateral sides of the first transverse opening 2748. The channel 2746 is sized and configured to receive the lower stem portion 2714. The second transverse opening 2750, and first and second angled locking tabs 2752, 2754 are utilized to lock the lower stem portion 2714 in place, which is discussed in greater detail below.

The left bottom wall 2736 is positioned adjacent the left side wall 2730 and extends from the rear wall 2728 to the front curved wall 2734. The right bottom wall 2742 is positioned adjacent the right side wall 2732 and extends from the rear wall 2728 to the front curved wall 2734. A left catch 2756 extends upward from the left bottom wall 2736 and the left side wall 2730, while a right catch 2758 extends upward from the right bottom wall 2742 and the right side wall 2732. The left and right catches 2756 2758 are curved protrusions that are each configured to engage a wheel of a pool cleaner, e.g., the pool cleaners 100, 700, 800 of the present disclosure, positioned on the pool cleaner caddy 2708 to prevent the pool cleaner from falling off of the pool cleaner caddy 2708. For example, if the pool cleaner caddy 2708 were to be tilted too far forward, the left and right catches 2756 would catch on the wheels, e.g., the rear wheels, of the pool cleaner and prevent the pool cleaner from falling off of the pool cleaner caddy 2708 and being potentially damaged. The first and second center bottom walls 2738, 2740 are positioned on opposite sides of the channel 2746 and extend from the rear wall 2728 to the front curved wall 2734.

The base 2710 additionally includes a left bottom opening 2760 formed between the left bottom wall 2736 and the first center bottom wall 2738, a right bottom opening 2762 formed between the right bottom wall 2742 and the second center bottom wall 2740, and a center bottom opening 2764 formed between the first and second center bottom walls 2738, 2740. The front curved wall 2734 also includes a front opening 2766. The left bottom opening 2760, the right bottom opening 2762, the center bottom opening 2764, and the front opening 2766 allow for water to be drawn from the base 2710.

A center cleaner support 2768 extends between the first and second center bottom walls 2738, 2740 and across the center bottom opening 2764. The center cleaner support 2768 includes an elongated rectangular base 2770 having a top surface 2772 and a bottom surface 2774, and an angled protrusion 2776 extending from the top surface 2772 of the rectangular base 2770. The elongated rectangular base 2770 also includes a semi-circular recess 2778 in the bottom surface 2774 thereof. The angled protrusion 2776 can be sized and configured to be inserted into and close an inlet bottom of a pool cleaner, e.g., the inlet bottom 822 of the pool cleaner 800 (see FIG. 57) of the present disclosure, when the pool cleaner is placed on the base 2710, which prevents animals and insects from entering the pool cleaner. A front cleaner support 2780 is positioned on the base 2710 at a front end 2782 of the center bottom opening 2764, and between the center bottom opening 2764 and the front curved wall 2734. The front cleaner support 2780 includes a support base 2784 having an upper surface 2786, and a projection 2788 extending from the upper surface 2786 of the support base 2784. The front cleaner support 2780 is configured to engage a recess on a pool cleaner, e.g., the recess 830 on the chassis 806 of the pool cleaner 800 (see FIG. 57) of the present disclosure. When the pool cleaner 800 is positioned on the base 2710 it is supported by the center cleaner support 2768 and the front cleaner support 2780, which respectively engage the inlet bottom 822 and the recess 830. The center cleaner support 2768 and the front cleaner support 2780 prevent the pool cleaner 800 from lateral and longitudinal movement and elevate the wheels 818*a*-818*e* of the pool cleaner 800 from the let and right bottom walls 2736, 2742, and the rollers 820*a*-820*e* of the pool cleaner 800 from the front curved wall 2734 and the first and second center bottom walls 2738, 2740. By doing so, permanent deformation of the wheels 818*a*-818*e* and the rollers 820*a*-820*f* due to creep is prevented.

The base 2770 additionally includes a stem locking bracket 2790 positioned at the front end 2782 of the center bottom opening 2764. The stem locking bracket 2790 includes a body 2792 extending between the first and second center bottom walls 2738, 2740, a center arch 2794 that curves upwards from the body 2792 and defines a channel 2796, and angled transitions 2797*a*, 2797*b* connecting the center arch 2794 and the body 2792. The center arch 2794 and the channel 2796 are configured to receive a portion of the lower stem portion 2714. The center arch 2794 also includes a transverse opening 2798 extending across the center arch 2794, which is utilized to lock the lower stem portion 2714 in place, which is discussed in greater detail below.

Also included on the base 2710 are a left side wheel housing 2800 and a right side wheel housing 2802. The left side wheel housing 2800 is positioned adjacent the left side wall 2730, while the right side wheel housing 2802 is positioned adjacent the right side wall 2732. The left side wheel housing 2800 includes an outer wall 2804, an inner wall 2806 spaced from the outer wall 2804, and a wheel chamber 2808 between the outer wall 2804 and the inner wall 2806. Similarly, the right side wheel housing 2802 includes and outer wall 2810, and inner wall 2812 spaced from the outer wall 2810, and a wheel chamber 2814 between the outer wall 2810 and the inner wall 2812. The wheel chambers 2808, 2814 are sized and configured to each receive one of the wheels 2720. The outer walls 2804, 2810 each include an outer mounting boss 2816, 2818, respectively, while the inner walls 2806, 2806 each include a keyed opening 2820, 2822 (see, e.g., FIG. 177), respectively. The outer mounting bosses 2816, 2818 are substantially similar in construction, and accordingly any description of one of the mounting bosses 2816, 2818 should be understood to apply to the other mounting boss 2816, 2818. Likewise, the keyed openings 2820, 2822 are substantially similar in construction, and accordingly any description of one of the keyed openings 2820, 2822 should be understood to apply to the other keyed opening 2820, 2822.

FIG. 183 is an enlarged perspective view of Area 183 of FIG. 179 showing the left side wheel housing 2800 and the mounting boss 2816 in greater detail. FIG. 184 is an enlarged top view of Area 184 of FIG. 181 showing the mounting boss 2816 in greater detail. The mounting boss 2816 includes a central opening 2824 extending through the outer wall 2804, a first half 2826, and a second half 2828. The first half 2826 and the second half 2828 surround the central opening 2824 and are divided by a first angled channel 2830 and a second angled channel 2832. The first and second angled channels 2830, 2832 are formed at an angle α with respect to the outer wall 2804. Angle α can be an angle greater than 0° and less than 90°. In some aspects of the present disclosure the angle α is 40°. FIG. 185 is a perspective view of the left side wheel housing 2800 from a right side thereof showing the keyed opening 2820 in greater detail. The keyed opening 2820 is a generally circular opening that extends through the inner wall 2806 and includes first and second inward extensions 2834, 2836 that extend radially inward.

FIGS. 186-188 are respectively perspective, top, and bottom views of the axle 2722 of the present disclosure. The axle 2722 includes a body 2838 having a distal end 2840 and a proximal end 2842, an enlarged head 2844, and a cap 2846. The enlarged head 2844 is coaxial with and connected to the proximal end 2842 of the body 2838, and has a slightly larger diameter than the body 2838. The cap 2846 is coaxial with and connected to the enlarged head 2844, and has a slightly larger diameter than the enlarged head 2844. The enlarged head 2844 includes first and second angled threads 2848, 2850 that extend from the cap 2846 and along the enlarged head 2844 at an angle α. That is, the first and second angled threads 2848, 2850 are at the same angle α as the first and second angled channels 2830, 2832 of the mounting bosses 2816, 2818. The first and second angled threads 2848, 2850 can be left-handed threads. The first and second angled threads 2848, 2850 are also sized and configured to be inserted into the first and second angled channels 2830, 2832. The body 2838 generally tapers between first and second flat portions that are respectively adjacent the proximal end 2842 and the distal end 2840. The distal end 2840 of the body 2838 includes a plurality of notches 2852, 2854.

FIGS. 189-192 are respectively perspective, front, rear, and side views of the axle receiver 2724 of the present disclosure. The axle receiver 2724 includes a cylindrical body 2856, a first upper radial extension 2858, a second upper radial extension 2860, a first middle radial extension 2862, a second middle radial extension 2864, and an annular boss 2866. The cylindrical body 2856 defines an inner chamber 2868, and includes a proximal end 2870 having a hole 2872 extending through to the inner chamber 2868 and an open distal end 2874. The annular boss 2866 extends from the proximal end 2870 of the cylindrical body 2856 about the hole 2872. The first and second upper radial extensions 2858, 2860 extend radially outward from the proximal end 2870 of the cylindrical body 2856 and are diametrically opposed. The first and second middle radial extensions 2862, 2864 extend radially outward from the cylindrical body 2856, e.g., at a position that is between the proximal end 2870 and the distal end 2874, are diametrically opposed, and are spaced radially from the first and second upper radial extensions 2858, 2860. The cylindrical body 2856 additionally includes first and second locking assemblies 2876, 2878 that are positioned in the inner chamber 2868 on an inner wall 2880 of the proximal end 2870 of the cylindrical body 2856. The first and second locking assemblies 2876, 2878 each include a ramped protrusion 2882, a block protrusion 2884, and an indentation 2886 between the ramped protrusion 2882 and the block protrusion 2884. The first and second locking assemblies 2876, 2878 are configured to engage the notches 2852, 2854 on the distal end 2840 of the axle 2722 and further secure the axle 2722 with the axle receiver 2724. The cylindrical body 2874 is sized and configured to be inserted into the keyed opening 2820 such that when it is inserted it can be rotated so that the first and second middle radial extensions 2862, 2864 overlap the first and second inward extensions 2834, 2836 and the first and second upper radial extensions 2858, 2860 extend beyond the keyed opening 2820 and overlap the inner wall 2806, thus securing the axle receiver 2724 to the inner wall 2806.

FIG. 193 is a perspective view of the wheel 2720 of the present disclosure. The wheel 2720 includes a central hub 2888, a rim 2890, a plurality of spokes 2892 extending from the central hub 2888 to the rim 2890, and a tire 2894. FIG. 194 is a sectional view of the wheel 2720 of FIG. 193 taken along line 194-194. The central hub 2888 is a generally tubular component that includes an outer boss 2896 having an opening 2898, an inner boss 2900 having an opening 2902, and a central chamber 2904 extending across the length of the central hub 2888 and from the opening 2898 of the outer boss 2896 to the opening 2902 of the inner boss 2900. The central chamber 2904 can be tapered to match the taper of the body 2838 of the axle 2722 so that the axle 2722 can only be inserted into the central hub 2888 in a single direction.

FIGS. 195-199 show the first wheel assembly 2712*a* connected with the left side wheel housing 2800 of the base 2710. FIG. 195 is an enlarged view of Area 195 of FIG. 174. FIG. 196 is a partial sectional view taken along line 196-196 of FIG. 175. FIG. 197 is an enlarged perspective view of Area 197 of FIG. 171 showing the connection of the axle 2722 with the outer mounting boss 2816 of the left side wheel housing 2800 outer wall 2804 in greater detail. FIG. 198 is an enlarged view of Area 198 of FIG. 175 showing the connection of the axle 2722 with the outer mounting boss 2816 of the left side wheel housing 2800 outer wall 2804 in greater detail. FIG. 199 is a partial side view in the direction of arrows 199-199 of FIG. 173 showing the connection of the axle receiver 2724 with the inner wall 2806. To connect the first wheel assembly 2712*a* with the left side wheel housing 2800 of the base 2710, a user first places the wheel 2720 in the wheel chamber 2808 of the left side wheel housing 2800. The user then inserts the axle 2722 through the outer mounting boss 2816 of the left side wheel housing 2800 outer wall 2804, and through the opening 2898 of the central hub 2888 outer boss 2896. Next, the user aligns the first and second angled threads 2848, 2850 of the axle 2722 with the first and second angled channels 2830, 2832 of the outer mounting boss 2816 and rotates the axle 2722 counterclockwise to set the first and second angled threads 2848, 2850 in the first and second angled channels 2830, 2832. Engagement of the first and second angled threads 2848, 2850 with the first and second angled channels 2830, 2832 is shown in, for example, FIGS. 197 and 198.

The user then inserts the axle receiver 2724 into the keyed opening 2820 of the inner wall 2806 so that the first and second middle radial extensions 2862, 2864 are inserted through the keyed opening 2820 and the first and second upper radial extensions 2858, 2860 are adjacent the inner wall 2806 (see FIG. 195). In doing so, the user will also ensure that the distal end 2840 of the axle 2722 is inserted into the open distal end 2874 of the axle receiver 2724 and placed in the inner chamber 2862 thereof. Once inserted, the user rotates the axle receiver 2724 to align and overlap the first and second middle radial extensions 2862, 2864 with the first and second inward extensions 2834, 2836 and substantially cover the remainder of the keyed opening 2820 with the first and second upper radial extensions 2858, 2860 (see FIG. 199), thus securing the axle receiver 2724 to the inner wall 2806. The user then engages a screw 2726 with the hole 2872 of the axle receiver 2724 and a hole 2906 in the distal end 2840 of the axle 2722 and tightens the screw 2726. The hole 2872 of the axle receiver 2724 and the hole 2906 of the axle 2722 can be self-threading.

As the user tightens the screw 2726, the axle 2722 and the axle receiver 2724 are drawn together. This additionally causes the notches 2852, 2854 of the axle receiver 2724 to engage the locking assemblies 2876, 2878 of the axle receiver 2724. Particularly, each of the notches 2852, 2854 are rotated along one of the ramped protrusions 2882 and then seated in an indentation 2886 against one of the block protrusions 2884. This causes the distal end 2840 of the axle 2722 to wedge against the interior of the cylindrical body 2856 (e.g., with the inner chamber 2868) of the axle receiver 2724, further securing the axle 2722 and the axle receiver 2724. Additionally, since the first and second angled threads 2848, 2850 of the axle 2722 are angled in the same rotational direction that the screw 2726 is rotated it, e.g., the first and second angled threads 2848, 2850 are left-handed threads while the screw 2726 includes right-handed threads, tightening of the screw 2726 causes the first and second angled threads 2848, 2850 to more tightly engage the first and second angled channels 2830, 2832. When the screw 2726 is fully engaged it is positioned within the annular boss 2866 of the axle receiver 2724.

Furthermore, the first wheel assembly 2712*a* is configured and designed such that if the outer wall 2804 of the left side wheel housing 2800 were to be deflected inward it could not be deflected enough to disengage the first and second angled threads 2848, 2850 from the first and second angled channels 2830, 2832. Particularly, as shown in FIGS. 195 and 196, the width of the outer mounting boss 2816 is greater than the space between the outer wall 2804 and the central hub 2888. Accordingly, if the outer wall 2804 were to deflect inward, e.g., toward the inner wall 2806, it would contact the central hub 2888, which in turn would contact the axle receiver 2724, and be prevented from separating from the axle 2722 prior to the first and second angled threads 2848, 2850 becoming disengaged from the first and second angled channels 2830, 2832. Furthermore and as discussed above, the inner wall 2806 is prevented from deflecting due to engagement with the axle receiver 2724.

It should be understood that the description provided above in connection with the first wheel assembly 2712*a* holds true for the second wheel assembly 2712*b* since the first and second wheel assemblies 2712*a*, 2712*b* have substantially similar constructions, but on opposite sides of the base 2710.

FIGS. 200 and 201 are first and second perspective views of the stem 2713, which can include a lower stem portion 2714 and the upper stem portion 2716. The stem 2713 can be a single component or it can comprise multiple separate pieces, e.g., the lower stem portion 2714 and the upper stem portion 2716, that can be interconnected. The lower stem portion 2714 includes a craned body 2908 having a lower section 2910, a middle section 2912, and an upper section 2914, a first snap lock 2916 (e.g., a button snap), and a second snap lock 2918 (e.g., a button snap). The craned body 2908 is a hollow tubular component that extends from a first end 2920 at the lower section 2910 to a second end 2922 at the upper section 2914. The craned body 2908 generally curves upward from the lower section 2910 to the upper section 2914. The lower section 2910 and the upper section 2914 each include a through-hole 2924, 2926 generally adjacent the first end 2920 and the second end 2922, respectively. The middle section 2912 also includes a through-hole 2928 generally at the center thereof. The first and second snap locks 2916, 2918 can be leaf springs that can be respectively positioned within the first and second ends 2920, 2922 of the craned body 2908. The first snap lock 2916 can include first and second outward protrusions 2930*a*, 2930*b* that can be engaged with and extend out from the through-hole 2924 when the first snap lock 2916 is positioned within the first end 2920 of the craned body 2908. Similarly, the second snap lock 2918 can include first and second outward protrusions 2932*a*, 2932*b* that can be engaged with and extend out from the through-hole 2926 when the second snap lock 2918 is positioned within the second end 2922 of the craned body 2908. The first and second snap locks 2916, 2918 can be compressed by applying pressure to the respective outward protrusions 2930*a*, 2930*b*, 2932*a*, 2932*b* thereof. Upon release of the pressure, the first and second snap locks 2916, 2918 will return to their original positions with the outward protrusions 2930*a*, 2930*b*, 2932*a*, 2932*b* extending out from the through-holes 2924, 2926.

The upper stem portion 2716 includes a kinked body 2934 having a lower section 2936, a middle section 2938, and an upper section 2940, and a third snap lock 2942 (e.g., a button snap). The kinked body 2934 is a hollow tubular component that extends from an enlarged first end 2944 to a second end 2946. The lower section 2936 includes a through-hole 2948 that is positioned at, and extends through, the enlarged first end 2944. The upper section 2940 includes a through-hole 2950 that is positioned offset from the second end 2946, and a key-slot 2952 positioned at the second end 2946. The third snap lock 2942 can include first and second outward protrusions 2954*a*, 2954*b* that can be engaged with and extend out from the through-hole 2950 when the third snap lock 2942 is positioned within the second end 2946 of the kinked body 2934. The third snap lock 2942 is identical in construction to the first and second snap locks 2916, 2918, and can be compressed by applying pressure to the outward protrusions 2954*a*, 2954*b*. Upon release of the pressure, the third snap lock 2942 will return to its original position with the outward protrusions 2954*a*, 2954*b* extending out from the through-hole 2950. The enlarged first end 2944 of the upper stem portion 2716 is sized and configured to be placed over the second end 2922 of the lower stem portion 2714, e.g., the second end 2922 of the lower stem portion 2714 is inserted into the enlarged first end 2944 of the upper stem portion 2716, to engage and depress the first and second protrusions 2932*a*, 2932*b* of the second snap lock 2918. When second end 2922 of the lower stem portion 2714 is inserted into the enlarged first end 2944 of the upper stem portion 2716 and the first and second protrusions 2932*a*, 2932*b* are depressed, the through hole 2948 of the enlarged first end 2944 can be aligned with the first and second protrusions 2932*a*, 2932*b*. Upon alignment, the second snap lock 2918 will snap back to its original position and the first and second protrusions 2932*a*, 2932*b* will extend out from both the through-hole 2926 of the lower stem portion 2714 and the through hole 2948 of the enlarged first end 2944 of the upper stem portion 2716, thus securing the lower stem portion 2714 and the upper stem portion 2716 together.

FIGS. 202-207 show the handle assembly 2718 of the present disclosure in greater detail. Particularly, FIGS. 202-207 are perspective, exploded, front, rear, side, and top views of the handle assembly 2718, respectively. The handle assembly 2718 includes a front shell 2956, a rear shell 2958, and a plurality of screws 2960. The front shell 2956 includes a front bottom support half 2962, first and second front side supports halves 2964, 2966, a front top handle half 2968, a front tray 2970, and a first rear support wall 2972. The first and second front side supports halves 2964, 2966 extend upwardly from opposite sides of the front bottom support half 2962 and connect with the front top handle half 2968, which is tilted slightly forward from the first and second front side support halves 2964, 2966. The front bottom support half 2962, first and second front side support halves 2964, 2966, and front top handle half 2968 define a window 2974. The front tray 2970 extends rearward from the front bottom support half 2962. The first rear support wall 2972 includes first and second flexible locking tabs 2976*a*, 2976*b* and extends upward from the end of the front tray 2970 spaced from the front bottom support half 2962.

The rear shell 2958 includes a rear bottom support half 2978, first and second rear side support halves 2980, 2982, a rear top handle half 2984, a rear base 2986, a second rear support wall 2988, and a mount 2990. The first and second rear side supports halves 2980, 2982 extend upwardly from opposite sides of the rear bottom support half 2978 and connect with the rear top handle half 2984, which is tilted slightly forward from the first and second rear side support halves 2980, 2982. The rear bottom support half 2978, first and second rear side support halves 2980, 2982, and rear top handle half 2984 define a window 2992 and are configured to engage the front bottom support half 2962, first and second front side support halves 2964, 2966, and front top handle half 2968, respectively, to form a complete frame with the two windows 2974, 2992 aligned.

The rear base 2986 extends rearward from the rear bottom support half 2978 and includes a left tray 2994, a right tray 2996, a left sidewall 2998, a right sidewall 3000, and a recess 3002 formed between the left tray 2994 and the right tray 2996. The recess 3002 is sized and configured to receive the front tray 2970 of the front shell 2956, which when connected can form a single surface between the left tray 2994 and right tray 2996 of the rear base 2986 and the front tray 2970 of the front shell 2956. A rear tray 3004 extends rearward from the rear base 2986, and the second rear support wall 2988 extends upward from the end of the rear tray 3004 spaced from the rear base 2986. The mount 2990 extends from the rear base 2986 generally downward and rearward. The mount 2990 is a generally tubular hollow extension that includes a through-hole 3006 and can also include an internal key 3008 that is configured to mate with clearance to the key-slot 2952. The mount 2990 is sized and configured to have the second end 2946 of the upper stem portion 2716 inserted therein and to engage and depress the first and second protrusions 2954*a*, 2954*b* of the third snap lock 2942. When the second end 2946 of the upper stem portion 2716 and the first and second protrusions 2954*a*, 2954*b* are depressed, the internal key 3008 can be aligned with and inserted into the key-slot 2952 while the through-hole 3006 of the mount 2990 can be aligned with the first and second protrusions 2954*a*, 2954*b*. Upon alignment, the third snap lock 2942 will snap back to its original position and the first and second protrusions 2954*a*, 2954*b* will extend out from both the through-hole 2948 of the upper stem portion 2716 and the through hole 3006 of the mount 2990 of the handle assembly 2718, thus securing the handle assembly 2718 and the upper stem portion 2716 together. Additionally, engagement of the internal key 3008 with the key-slot 2952 ensures that the handle assembly 2718 is engaged with the handle assembly 2718 in the proper configuration.

As user can interconnect the front shell 2956 and the rear shell 2958 by inserting the front tray 2970 into the recess 3002 and engaging the front bottom support half 2962, first and second front side support halves 2964, 2966, and front top handle half 2968 with the rear bottom support half 2978, first and second rear side support halves 2980, 2982, and rear top handle half 2984, respectively. The front shell 2956 and the rear shell 2958 can then secured to one another by the screws 2960. When assembled, the handle assembly 2718 defines a power supply housing 3010 and a cable housing 3012. The power supply housing 3010 is sized and configured to receive and hold a power supply, e.g., the power supply 2512 of the present disclosure. When the power supply 2512 is inserted into the power supply housing 3010, it is retained in place by the front tray 2970, the left sidewall 2998, the right sidewall 3000, the rear support wall 2972, and first and second flanges 3014, 3016 that extend rearward from the first and second side support halves 2964, 2966. Additionally, the first and second flexible locking tabs 2976*a*, 2976*b* engage the first and second abutments 2634*a*, 2634*b* of the power supply 2512 to further retain the power supply 2512 to the handle assembly 2718. The handle assembly 2718 is configured such that if the pool cleaner caddy 2708 were to fall over and land on the handle assembly 2718, the handle assembly 2718 would make contact with the ground first and absorb the majority of the impact instead of the power supply 2512. Additionally, the first and second flexible locking tabs 2976*a*, 2976*b* would retain the power supply 2512 unless a sufficient amount of force resulted from the fall, in which case the first and second abutments 2634*a*, 2634*b* of the power supply 2512 would depress the flexible locking tabs 2976*a*, 2976*b* and allow the power supply 2512 to slide out from the handle assembly 2718 in a controlled fashion to reduce impact and potential damage. The cable housing 3012 is configured to receive a pool cleaner power cable, e.g., the power and control cable 2089 of the pool cleaner 800 of the present disclosure, and allow the power cable to be hanged on the rear tray 3004.

FIGS. 208-213 illustrate the pool cleaner caddy 2708 in states of assembly. FIGS. 208-210 are front perspective, rear perspective, and top views, respectively, showing the base 2710 with the first and second wheel assemblies 2712*a*, 2712*b* and the lower stem portion 2714 connected thereto. The first and second wheel assemblies 2712*a*, 2712*b* can be connected to the base 2710 as described above in connection with FIGS. 195-199. The first and second wheel assemblies 2712*a*, 2712*b* can either be attached to the base 2710 prior to any other components, or can be attached last after all other components have been attached. To connect the lower stem portion 2714 to the base 2710, the user inserts the first end 2920 into the center bottom opening 2764 and under the center cleaner support 2768, and aligns the first end 2920 with the channel 2796 of the stem locking bracket 2790, the lower section 2910 with the semi-circular recess 2778 of the center cleaner support 2768, and the middle section 2912 with the angled extension 2744 and channel 2746 of the base 2710. The user then applies pressure to the first end 2920, which can be in the form of pulling on the second end 2922 of the lower stem portion 2714 and using the angled extension 2744 and rear wall 2728 as a fulcrum, to force the first and second protrusions 2930*a*, 2930*b* of the first snap lock 2916 to engage the angled transitions 2797*a*, 2797*b* of the stem locking bracket 2790. This engagement causes the first and second protrusions 2930*a*, 2930*b* to deflect inward, allowing the first end 2920 of the lower stem portion 2714 to be seated in the channel 2796 of the center arch 2794. When the first end 2920 is fully seated in the channel 2796 the first and second protrusions 2930*a*, 2930*b* will be aligned with the transverse opening 2798 and the first snap lock 2916 will return to its original position and the first and second protrusions 2930*a*, 2930*b* will snap into the transverse opening 2798 where they will be in engagement with and secured to the stem locking bracket 2790. This engagement secures the first end 2920 of the lower stem portion 2714 to the stem locking bracket 2790. If a user desires to disconnect the lower stem portion 2714 they would simply depress the first and second protrusions 2930*a*, 2930*b* and pull the first end 2920 of the lower stem portion 2714 out from the stem locking bracket 2790.

Once the first end 2920 is secured to the stem locking bracket 2790, the user can then secure the middle section 2912 within the channel 2746 of the angled extension 2744. To do so, the user simply aligns the middle section 2912 with the channel 2746 and applies pressure until the middle section 2912 overcomes the first and second angled locking tabs 2752, 2754 and is seated in the channel 2746. The first and second angled locking tabs 2752, 2754 secure the middle section 2912 in the channel 2746. FIG. 211 is a perspective view showing connection of the ribbed fastener 2719 with the lower stem portion 2714, which is done once the lower stem portion 2714 is seated in the channel 2746. Particularly, once the lower stem portion 2714 is seated in the channel 2746 a user can insert the ribbed fastener 2719, e.g., a Christmas tree style push rivet, into one side of the second transverse opening 2750, through the through-hole 2928 of the middle section 2912 of the lower stem portion 2714, and out the other side of the second transverse opening 2750. This engagement prevents the lower stem portion 2714 from being removed from the channel 2746, as any attempt to do so will result in the ribbed fastener 2719 engaging the angled extension 2744. To remove the lower stem portion 2714, a user can remove the ribbed fastener 2719 and pull the lower stem portion 2714 out from the channel 2746.

Once the lower stem portion 2714 is connected to the base 2710, the user can connect the upper stem portion 2716 thereto. FIG. 212 is a perspective view showing the upper stem portion 2716 connected to the lower stem portion 2714. To connect upper stem portion 2716 to the lower stem portion 2714, the user places the enlarged first end 2944 of the upper stem portion 2716 over the second end 2922 of the lower stem portion 2714, e.g., inserts the second end 2922 of the lower stem portion 2714 into the enlarged first end 2944 of the upper stem portion 2716, and engages and depresses the first and second protrusions 2932*a*, 2932*b* of the second snap lock 2918. The through hole 2948 of the enlarged first end 2944 is then aligned with the first and second protrusions 2932*a*, 2932*b*, which causes the second snap lock 2918 to snap back to its original position with the first and second protrusions 2932*a*, 2932*b* extending out from the through hole 2948 of the enlarged first end 2944 of the upper stem portion 2716, thus securing the lower stem portion 2714 and the upper stem portion 2716 together. To disconnect the upper stem portion 2716 and the lower stem portion 2714, the user can simply depress the first and second protrusions 2932*a*, 2932*b* and pull the upper stem portion 2716 away from the lower stem portion 2714. As referenced above, the lower stem portion 2714 and the upper stem portion 2716 can be configured as a single stem 2713 that is not divided into multiple components.

Once the upper stem portion 2716 is connected to the lower stem portion 2714, the user can connect the handle assembly 2718 to the upper stem portion 2716. FIG. 213 is a perspective view showing the handle assembly 2718 connected to the upper stem portion 2716. To connect the handle assembly 2718 to the upper stem portion 2716, the user places the mount 2990 of the handle assembly 2718 over the second end 2946 of the upper stem portion 2716, e.g., inserts the second end 2946 of the upper stem portion 2716 into the mount 2990 of the handle assembly 2718, and engages and depresses the first and second protrusions 2954*a*, 2954*b* of the third snap lock 2942. The through hole 3006 of the mount 2990 is then aligned with the first and second protrusions 2954*a*, 2954*b*, which causes the third snap lock 2942 to snap back to its original position with the first and second protrusions 2954*a*, 2954*b* extending out from the through hole 3006 of the mount 2990 of the handle assembly 2718, thus securing the handle assembly 2718 and the upper stem portion 2716. To disconnect the handle assembly 2718 and the upper stem portion 2716, the use can simply depress the first and second protrusions 2954*a*, 2954*b* and pull the handle assembly 2718 away from the upper stem portion 2716.

When the handle assembly 2718 is secured to the upper stem portion 2716, the pool cleaner caddy 2708 is fully constructed and can be utilized by placing the pool cleaner 800 on the base 2710, placing the power and control cable 2089 in the cable housing 3012 of the handle assembly 2718, and placing the supply 2512 in the power supply housing 3010 of the handle assembly 2718. A user can grab the handle assembly 2718 to wheel the pool cleaner caddy 2708, and associated pool cleaner 800 and power supply 2512, to a desired location. The user can also view the power supply 2512 through the windows 2974, 2992 of the handle assembly 2718. When fully constructed, the pool cleaner caddy 2708 is configured so that the upper section 2914 of the lower stem portion 2714 forms an angle β with the base 2710 (see FIG. 172), which can be approximately 42°. The pool cleaner caddy 2708 is additionally configured so that when the power supply 2512 is positioned in the handle assembly 2718, it is viewable by a portion of the population that ranges from the $50^{th}$ percentile of the female population to the $95^{th}$ percentile of the male population standing at arms length from the pool cleaner caddy 2708.

It will be understood that the embodiments of the present disclosure described herein are merely exemplary and that a person skilled in the art may make many variations and modifications without departing from the spirit and the scope of the disclosure. All such variations and modifications, including those discussed above, are intended to be included within the scope of the disclosure.

What is claimed is:

1. A power supply for a pool cleaner, comprising:
- a housing;
- a user interface;
- a low-power user interface printed circuit board, the low-power user interface printed circuit board in electrical communication with the user interface; and
- a potted power converter board assembly, comprising:
  - a tray;
  - a high-power printed circuit board including a plurality of electrical components and low-power user interface wires, the high-power printed circuit board positioned within the tray;
  - an AC power input connector in electrical communication with the high-power printed circuit board and providing a power input to the high-power printed circuit board;
  - a female power and communication output port in electrical communication with the high-power printed circuit board and providing power output from the high-power printed circuit board; and
  - a potting compound positioned within the tray and surrounding the high-power circuit board and the electrical components, the potting compound isolating the high-power circuit board and the electrical components, the low-power user interface wires extending out from the potting compound and in electrical communication with the low-power user interface printed circuit board;
- wherein the low-power user interface wires provide power to the low-power user interface printed circuit board.

2. The power supply of claim 1, wherein the housing includes a front housing and a rear housing, and the low-power user interface printed circuit board and the potted power converter board assembly are positioned between the front housing and the rear housing.

3. The power supply of claim 2, wherein the low-power user interface printed circuit board is mounted to the front housing.

4. The power supply of claim 3, wherein the potted power converter board assembly includes a plurality of stops extending between the tray and the front housing, the plurality of stops restricting flexion of the low-power user interface printed circuit board.

5. The power supply of claim 3, wherein the potted power converter board assembly includes a plurality of mounting brackets and the rear housing includes a plurality of mounting bosses, the potted power converter board assembly being retained by the rear housing with the plurality of mounting brackets engaged with the plurality of mounting bosses of the rear housing.

6. The power supply of claim 1, wherein the high-power printed circuit board includes a first side, a second side, and a heat sink, the plurality of electrical components mounted to the first side and the heat sink mounted to the second side.

7. The power supply of claim 6, wherein the heat sink is a folded sheet metal heat sink.

8. The power supply of claim 1, wherein the user interface is mounted to the housing and the connector extends through a connector opening in the housing to connect to the low-power user interface printed circuit board.

9. The power supply of claim 1, wherein a graphic overlay including a plurality of semi-transparent indicia is positioned over the user interface.

10. The power supply of claim 1, comprising low-power fan wires and a fan, wherein the low-power fan wires are connected to the high-power printed circuit board, extend out from the potting compound, and are connected to the fan to provide low-power to the fan, wherein the fan is positioned adjacent the potting compound and cools the potted power converter board assembly through forced convection.

11. The power supply of claim 10, wherein the housing includes a fan opening and the fan is positioned within the fan opening.

12. The power supply of claim 11, wherein the fan is secured in place by a fan cover that is removably connected to the housing and covers the fan opening.

13. The power supply of claim 1, wherein the tray includes a port opening and the female power and communication output port includes a barrier that is positioned within the port opening and prevents potting compound from leaking out from the tray.

14. The power supply of claim 1, wherein the user interface printed circuit board includes a plurality of light-emitting diodes and the housing includes a plurality of openings that allow the light-emitting diodes to be viewed from the exterior of the housing.

15. The power supply of claim 14, comprising a light baffle that includes a plurality of apertures, the light baffle being positioned over the user interface printed circuit board with the light-emitting diodes positioned within the apertures, wherein the light baffle prevents cross-talk between the light-emitting diodes.

16. The power supply of claim 1, comprising a recessed handle provided in the housing.

17. The power supply of claim 16, comprising a plurality of vents on sides of the housing, the vents positioned to vent hot air away from the handle.

18. The power supply of claim 1, wherein the electrical components of the high-power printed circuit board form a contoured landscape, and the tray includes a plurality of contours defining a plurality of interior recesses, the contours matching the contoured landscape formed by the electrical components of the high-power printed circuit board, wherein when the high-power printed circuit board is positioned within the tray the electrical components are positioned within the interior recesses of the tray.

19. The power supply of claim 18, wherein a substantially uniform space is formed between the plurality of electrical components and the plurality of contours of the contoured tray, the substantially uniform space being filled with potting compound.

20. The power supply of claim 19, wherein the substantially uniform space provides substantially unified strain during thermal expansion of the potting compound.

21. The power supply of claim 1, wherein the high-power printed circuit board limits the power provided to the low-power printed circuit board.

22. The power supply of claim 21, wherein the high-power printed circuit board includes a positive temperature coefficient thermistor that limits the power provided to the low-power printed circuit board to less than or equal to 15 watts.

23. The power supply of claim 1, comprising a control cable extending from a pool cleaner and connected to the female power and communication output port, the control cable providing power and control commands to the pool cleaner.

24. The power supply of claim 23, wherein the high-power printed circuit board includes a thermistor that provides a measurement of the temperature of the high-power printed circuit board, and the pool cleaner adjusts its operation based on the temperature of the high-power printed circuit board.

25. The power supply of claim 24, wherein the pool cleaner reduces the power drawn from the power supply if the temperature monitored by the thermistor is greater than a threshold.

26. The power supply of claim 24, wherein the pool cleaner disables modes of operation if the temperature monitored by the thermistor is greater than a threshold.

27. The power supply of claim 1, wherein the user interface includes a first button, a second button, and a third button.

28. The power supply of claim 27, wherein the first button is a power button, the second button is a schedule select button, and a third button is a mode select button.

29. The power supply of claim 27, wherein when the first button, the second button, and the third button are pressed and held simultaneously for a predetermined period of time a factory reset is performed.

30. The power supply of claim 27, wherein when at least two of the first, second, and third buttons are pressed and held simultaneously for a predetermined period of time a WiFi connection of the power supply is reset.

31. The power supply of claim 1, wherein the user interface includes a power button that when pressed toggles the power supply between a power state and a standby state.

32. The power supply of claim 31, wherein the power button when pressed and held for a predetermined period of time starts a pool cleaner connected to the power supply or shuts-down a pool cleaner connected to the power supply.

33. The power supply of claim 1, wherein the user interface includes a schedule select button that when pressed scrolls through schedule settings.

34. The power supply of claim 33, wherein when the schedule select button is pressed and held for a predetermined period of time the user interface is dimmed.

35. The power supply of claim 1, wherein the user interface includes a mode select button that when pressed scrolls through a plurality of pool cleaner modes.

36. The power supply of claim 35, wherein when the mode select button is pressed and held for a predetermined period of time the user interface is brightened.

37. The power supply of claim 1 in combination with the pool cleaner.

38. A power supply for a pool cleaner, comprising:

a housing;

a user interface including a connector;

a low-power user interface printed circuit board having a microprocessor, a power converter board connector, and a user interface port, the user interface connector connected to the user interface port to communicate with the user interface printed circuit board; and a potted power converter board assembly, comprising:

a high-power printed circuit board including a plurality of electrical components and low-power user interface wires, the electrical components forming a contoured landscape;

a contoured tray having a plurality of contours defining a plurality of interior recesses, the contours matching the contoured landscape formed by the electrical components of the high-power printed circuit board, the high-power printed circuit board being positioned within the tray with the electrical components positioned within the interior recesses of the contoured tray;

an AC power input connector in electrical communication with the high-power printed circuit board and providing a power input to the high-power printed circuit board;

a female power and communication output port in electrical communication with the high-power printed circuit board and providing power output from the high-power printed circuit board; and a potting compound positioned within the tray and surrounding the high-power circuit board and the electrical components, the potting compound isolating the electrical components, the low-power user interface wires extending out from the potting compound and connectable to the power converter board connector, wherein the low-power user interface printed circuit board and the potted power converter board assembly are positioned within the housing.

39. The power supply for a pool cleaner of claim 38, wherein a substantially uniform space is formed between the plurality of electrical components and the plurality of contours of the contoured tray, the substantially uniform space being filled with potting compound.

40. The power supply of claim 39, wherein the substantially uniform space provides substantially unified strain during thermal expansion of the potting compound.

41. The power supply of claim 38, wherein the housing includes a front housing and a rear housing, and the low-power user interface printed circuit board and the potted power converter board assembly are positioned between the front housing and the rear housing.

42. The power supply of claim 41, wherein the low-power user interface printed circuit board is mounted to the front housing.

43. The power supply of claim 42, wherein the potted power converter board assembly includes a plurality of stops extending between the tray and the front housing, the plurality of stops restricting flexion of the low-power user interface printed circuit board.

44. The power supply of claim 42, wherein the potted power converter board assembly includes a plurality of mounting brackets and the rear housing includes a plurality of mounting bosses, the potted power converter board assembly being retained by the rear housing with the plurality of mounting brackets engaged with the plurality of mounting bosses of the rear housing.

45. The power supply of claim 38, wherein the high-power printed circuit board includes a first side, a second side, and a heat sink, the plurality of electrical components mounted to the first side and the heat sink mounted to the second side.

46. The power supply of claim 45, wherein the heat sink is a folded sheet metal heat sink.

47. The power supply of claim 38, wherein the user interface is mounted to the front housing and the connector extends through a connector opening in the front housing to connect to the user interface port of the low-power user interface printed circuit board.

48. The power supply of claim 38, wherein a graphic overlay including a plurality of semi-transparent indicia is positioned over the user interface.

49. The power supply of claim 38, comprising low-power fan wires and a fan, wherein the low-power fan wires are connected to the high-power printed circuit board, extend out from the potting compound, and are connected to the fan to provide low-power to the fan, wherein the fan is positioned adjacent the potting compound and cools the potted power converter board assembly through forced convection.

50. The power supply of claim 49, wherein the housing includes a fan opening and the fan is positioned within the fan opening.

51. The power supply of claim 50, wherein the fan is secured in place by a fan cover that is removably connected to the housing and covers the fan opening.

52. The power supply of claim 38, wherein the contoured tray includes a port opening and the female power and communication output port includes a barrier that is positioned within the port opening and prevents potting compound from leaking out from the tray.

53. The power supply of claim 38, wherein the user interface printed circuit board includes a plurality of light-emitting diodes and the housing includes a plurality of openings that allow the light-emitting diodes to be viewed from the exterior of the housing.

54. The power supply of claim 53, comprising a light baffle that includes a plurality of apertures, the light baffle being positioned over the user interface printed circuit board with the light-emitting diodes positioned within the apertures, wherein the light baffle prevents cross-talk between the light-emitting diodes.

55. The power supply of claim 38, comprising a recessed handle provided in the housing.

56. The power supply of claim 55, comprising a plurality of vents on the sides of the housing, the vents positioned to vent hot air away from the handle.

57. The power supply of claim 38, wherein the high-power printed circuit board limits the power provided to the low-power printed circuit board.

58. The power supply of claim 57, wherein the high-power printed circuit board includes a positive temperature coefficient thermistor that limits the power provided to the low-power printed circuit board to less than or equal to 15 watts.

59. The power supply of claim 38, comprising a control cable extending from a pool cleaner and connected to the female power and communication output port, the control cable providing power and control commands to the pool cleaner.

60. The power supply of claim 59, wherein the high-power printed circuit board includes a thermistor that provides a measurement of the temperature of the high-power printed circuit board, and the pool cleaner adjusts its operation based on the temperature of the high-power printed circuit board.

61. The power supply of claim 60, wherein the pool cleaner draws less power if the temperature monitored by the thermistor is greater than a threshold.

62. The power supply of claim 60, wherein the pool cleaner disables modes of operation if the temperature monitored by the thermistor is greater than a threshold.

63. The power supply of claim 38, wherein the user interface includes a first button, a second button, and a third button.

64. The power supply of claim 63, wherein the first button is a power button, the second button is a schedule select button, and a third button is a mode select button.

65. The power supply of claim 63, wherein when the first button, the second button, and the third button are pressed and held simultaneously for a predetermined period of time a factory reset is performed.

66. The power supply of claim 63, wherein when at least two of the first, second, and third buttons are pressed and held simultaneously for a predetermined period of time a WiFi connection of the power supply is reset.

67. The power supply of claim 38, wherein the user interface includes a power button that when pressed toggles the power supply between a power state and a standby state.

68. The power supply of claim 67, wherein the power button when pressed and held for a predetermined period of time starts a pool cleaner connected to the power supply or shuts-down a pool cleaner connected to the power supply.

69. The power supply of claim 38, wherein the user interface includes a schedule select button that when pressed scrolls through schedule settings.

70. The power supply of claim 69, wherein when the schedule select button is pressed and held for a predetermined period of time the user interface is dimmed.

71. The power supply of claim 38, wherein the user interface includes a mode select button that when pressed scrolls through a plurality of pool cleaner modes.

72. The power supply of claim 71, wherein when the mode select button is pressed and held for a predetermined period of time the user interface is brightened.

73. The power supply of claim 38 in combination with the pool cleaner.

* * * * *